US012813062B2

(12) United States Patent
Lee et al.

(10) Patent No.: US 12,813,062 B2
(45) Date of Patent: Nov. 24, 2026

(54) LIGHT-EMITTING DEVICE AND ELECTRONIC APPARATUS INCLUDING THE SAME

(71) Applicant: Samsung Electronics Co., Ltd., Suwon-si (KR)

(72) Inventors: Sunghun Lee, Suwon-si (KR); Taekjung Kim, Suwon-si (KR); Hyungjun Kim, Suwon-si (KR); Banglin Lee, Suwon-si (KR); Shingo Ishihara, Suwon-si (KR); Yong Joo Lee, Suwon-si (KR); Yasushi Koishikawa, Suwon-si (KR); Youngki Hong, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 372 days.

(21) Appl. No.: 18/390,268

(22) Filed: Dec. 20, 2023

(65) Prior Publication Data

US 2024/0268138 A1 Aug. 8, 2024

(30) Foreign Application Priority Data

Dec. 29, 2022 (KR) ........................ 10-2022-0189755

(51) Int. Cl.
*H10K 50/12* (2023.01)
*H10K 50/15* (2023.01)
(Continued)

(52) U.S. Cl.
CPC ............. *H10K 50/12* (2023.02); *H10K 50/15* (2023.02); *H10K 50/16* (2023.02); *H10K 50/171* (2023.02);
(Continued)

(58) Field of Classification Search
CPC ........ H10K 50/12; H10K 50/15; H10K 50/16; H10K 50/171; H10K 50/181;
(Continued)

(56) References Cited

U.S. PATENT DOCUMENTS 6,720,090 B2 4/2004 Young et al.
8,431,243 B2 4/2013 Kwong et al.
(Continued)

FOREIGN PATENT DOCUMENTS

EP 2465912 A1 6/2012
EP 4203661 A1 6/2023
(Continued)

OTHER PUBLICATIONS

Extended European Search Report issued in EP Patent Application No. 23218966.2, dated Apr. 22, 2024, 6 pp.
(Continued)

*Primary Examiner* — Cuong B Nguyen
(74) *Attorney, Agent, or Firm* — CANTOR COLBURN LLP

(57) ABSTRACT

A light-emitting device and an electronic apparatus including the same. The light-emitting device includes a first electrode, a second electrode facing the first electrode, and an interlayer arranged between the first electrode and the second electrode, the interlayer includes a first emission layer and a second emission layer, the first emission layer includes a first host and a first dopant capable of emitting a first light, the first host includes m1 hosts, m1 is an integer of 1 or more, and when m1 is 2 or more, two or more hosts are present in the first emission layer and are different from the other, the second emission layer includes a second host and a second dopant capable of emitting a second light, the second host includes m2 hosts, m2 is an integer of 1 or more, and when m2 is 2 or more, two or more hosts are present in
(Continued)

the second emission layer and are different from the other, the first dopant includes a first transition metal, the second dopant includes a second transition metal different from the first transition metal, and Expression 1 and Expression 2 are satisfied and provided in the present specification.

20 Claims, 4 Drawing Sheets

(51) Int. Cl.

| | |
|---|---|
| ***H10K 50/16*** | (2023.01) |
| ***H10K 50/17*** | (2023.01) |
| ***H10K 50/18*** | (2023.01) |
| *H10K 101/00* | (2023.01) |
| *H10K 101/10* | (2023.01) |

(52) U.S. Cl.
CPC ....... *H10K 50/181* (2023.02); *H10K 2101/10* (2023.02); *H10K 2101/90* (2023.02)

(58) Field of Classification Search
CPC ........... H10K 2101/10; H10K 2101/90; H10K 2101/40; H10K 50/13; H10K 85/342; H10K 85/346; H10K 2101/30; H10K 59/8051; H10K 59/8052; C09K 11/06
See application file for complete search history.

(56) References Cited

U.S. PATENT DOCUMENTS

| | | | |
|---|---|---|---|
| 9,064,822 | B2 | 6/2015 | Park et al. |
| 9,142,710 | B2 | 9/2015 | Seo et al. |
| 9,685,617 | B2 | 6/2017 | Beers et al. |
| 10,727,430 | B2 | 7/2020 | Kim et al. |
| 2013/0277654 | A1 | 10/2013 | Seo et al. |
| 2015/0228697 | A1 | 8/2015 | Liu et al. |
| 2015/0318506 | A1 | 11/2015 | Zhou et al. |
| 2016/0093814 | A1 | 3/2016 | Hwang et al. |
| 2018/0374409 | A1 | 12/2018 | Lee et al. |
| 2019/0006608 | A1 | 1/2019 | Koo et al. |
| 2019/0157354 | A1 | 5/2019 | Lee et al. |
| 2020/0212319 | A1 | 7/2020 | Choi et al. |
| 2021/0083205 | A1 | 3/2021 | Hwang et al. |
| 2021/0104691 | A1 | 4/2021 | Lee et al. |
| 2022/0344609 | A1 | 10/2022 | Kim et al. |
| 2022/0402952 | A1 | 12/2022 | Kwak et al. |
| 2023/0025356 | A1 | 1/2023 | Lee et al. |
| 2023/0050840 | A1 | 2/2023 | Yi et al. |
| 2023/0054166 | A1 | 2/2023 | Lee et al. |
| 2023/0105127 | A1 | 4/2023 | Kwak et al. |
| 2024/0130217 | A1 | 4/2024 | Kwak et al. |

FOREIGN PATENT DOCUMENTS

| | | | |
|---|---|---|---|
| KR | 100843826 | B1 | 7/2008 |
| KR | 20170037541 | A | 4/2017 |
| KR | 101907750 | B1 | 10/2018 |
| KR | 20220059968 | A | 5/2022 |
| KR | 20220060510 | A | 5/2022 |
| KR | 20220122817 | A | 9/2022 |
| KR | 20220163886 | A | 12/2022 |
| KR | 20240016907 | A | 2/2024 |

OTHER PUBLICATIONS

Office Action dated May 29, 2026, issued in corresponding KR Patent Application No. 10-2022-0189755, with English Abstract, 17 pp.

LIGHT-EMITTING DEVICE AND ELECTRONIC APPARATUS INCLUDING THE SAME

CROSS-REFERENCE TO RELATED APPLICATION

This application claims priority to Korean Patent Application No. 10-2022-0189755, filed on Dec. 29, 2022, in the Korean Intellectual Property Office, and the benefits accruing therefrom under 35 U.S.C. § 119, the disclosure of which in its entirety is herein incorporated by reference.

BACKGROUND

1. Field

One or more embodiments relate to a light-emitting device and an electronic apparatus including the light-emitting device.

2. Description of the Related Art

Organic light-emitting devices are self-emissive devices that may have improved characteristics in terms of viewing angles, response time, luminance, driving voltage, and response speed, and provide full-color images. An organic light-emitting device includes an anode, a cathode, and an organic layer arranged between the anode and the cathode, wherein the organic layer includes an emission layer. A hole transport region may be arranged between the anode and the emission layer, and an electron transport region may be arranged between the emission layer and the cathode. Holes provided from the anode move toward the emission layer through the hole transport region, and electrons provided from the cathode move toward the emission layer through the electron transport region. The holes and the electrons recombine in the emission layer to produce excitons. The excitons may transition from an excited state to a ground state resulting in light emission.

SUMMARY

One or more embodiments include a light-emitting device having improved low gradation image quality characteristics and lateral luminance, and at the same time, having excellent characteristics in terms of luminescence efficiency, lifespan, and/or roll-off ratio, and an electronic apparatus including the same.

Additional aspects will be set forth in part in the description which follows and, in part, will be apparent from the description, or may be learned by practice of the presented embodiments of the disclosure.

According to one or more embodiments, a light-emitting device includes a first electrode, a second electrode facing the first electrode, and an interlayer arranged between the first electrode and the second electrode, wherein the interlayer includes a first emission layer and a second emission layer, the first emission layer includes a first host and a first dopant capable of emitting a first light having a first photoluminescence spectrum, the first host includes m1 hosts, where m1 is an integer of 1 or more, and when m1 is 2 or more, the two or more hosts present in the first emission layer are each different from the other, the second emission layer includes a second host and a second dopant capable of emitting second light having a second photoluminescence spectrum, the second host includes m2 hosts, where m2 is an integer of 1 or more, and when m2 is 2 or more, the two or more hosts present in the second emission layer are each different from the other, the first dopant includes a first transition metal, and the second dopant includes a second transition metal, wherein the first dopant and the second dopant are different from each other, and Expression 1 and Expression 2 are satisfied.

$$PDM(D1) < PDM(D2) \qquad \text{Expression 1}$$

$$PDM(H1) > PDM(H2) \qquad \text{Expression 2}$$

In Expressions 1 and 2,

PDM(D1) is a permanent dipole moment of the first dopant and has a unit of debye, PDM(D2) is a permanent dipole moment of the second dopant and has a unit of debye, $$PDM(H1)$$

is $$\sum_{x=1}^{m1} PDM(Hx) \cdot W(Hx)$$

which is a permanent dipole moment average value of the m1 hosts present in the first host, and has a unit of debye, wherein i) x is a variable of 1 to m1, ii) PDM(Hx) is a permanent dipole moment of an $x^{th}$ host in the first emission layer and has a unit of debye, and iii) W(Hx) is a weight fraction of the $x^{th}$ host relative to a total weight of the first host, and is calculated as (a weight of the $x^{th}$ host in the first emission layer/a total weight of the first host), $$PDM(H2)$$

is $$\sum_{y=1}^{m2} PDM(Hy) \cdot W(Hy)$$

which is a permanent dipole moment average value of the m2 hosts present in the second host, and has a unit of debye, wherein i) y is a variable of 1 to m2, ii) PDM(Hy) is a permanent dipole moment of an $y^{th}$ host in the second emission layer and has a unit of debye, and iii) W(Hy) is a weight fraction of the $y^{th}$ host relative to a total weight of the second host, and is calculated as (a weight of the $y^{th}$ host in the second emission layer/a total weight of the second host), and each of PDM(D1), PDM(D2), PDM(Hx), and PDM(Hy) is calculated based on density functional theory (DFT).

According to one or more embodiments, there is provided an electronic apparatus including the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
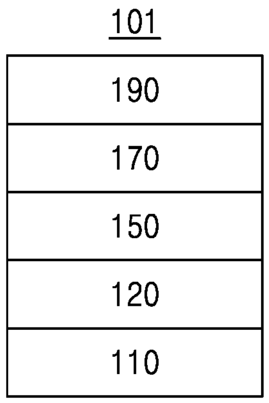
FIG. 1 is a schematic view of a light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A light-emitting device according to an embodiment of the disclosure may include a first electrode, a second electrode facing the first electrode, and an interlayer arranged between the first electrode and the second electrode. The interlayer may include a first emission layer and a second emission layer.

The first emission layer and the second emission layer may be stacked from the first electrode in the order of the first emission layer and the second emission layer or in the order of the second emission layer and the first emission layer.

A surface of the first emission layer and a surface of the second emission layer may be in direct contact with each other. Alternatively, another layer may be additionally arranged between the first emission layer and the second emission layer.

The first emission layer may include a first host and a first dopant capable of emitting a first light having a first photoluminescence spectrum. In this regard, the first host may include m1 hosts, and m1 is an integer of 1 or more. When m1 is 2 or more, the two or more hosts in the first emission layer are each different from the other. For example, when m1 is 2 or more, the first host in the first emission layer is a mixture of different hosts.

A weight of the first host in the first emission layer is greater than a weight of the first dopant. For example, a weight of the first host in the first emission layer may be 60 weight percent (wt %) to 99 wt %, 70 wt % to 97 wt %, or 80 wt % to 96 wt %, based on 100 wt % of the first emission layer.

The second emission layer may include a second host and a second dopant capable of emitting a second light having a second photoluminescence spectrum. In this regard, the second host may include m2 hosts, and m2 may be an integer of 1 or more. When m2 is 2 or more, two or more hosts in the second emission layer are each different from the other. For example, when m2 is 2 or more, the second host in the second emission layer may be a mixture of different hosts.

A weight of the second host in the second emission layer is greater than a weight of the second dopant. For example, a weight of the second host in the second emission layer may be 60 wt % to 99 wt %, 70 wt % to 97 wt %, or 80 wt % to 96 wt %, based on 100 wt % of the second emission layer.

For example, m1 and m2 may each independently be 1, 2, 3, or 4.

In an embodiment, m1 and m2 may each independently be 1 or 2.

When m1 is 2, a weight ratio of two different hosts present in the first emission layer may be 1:9 to 9:1, 2:8 to 8:2, 3:7 to 7:3, or 4:6 to 6:4. Meanwhile, when m2 is 2, a weight ratio of two different hosts present in the second emission layer may be 1:9 to 9:1, 2:8 to 8:2, 3:7 to 7:3, or 4:6 to 6:4. When the weight ratio is satisfied, movement or the transport of holes and electrons in the first emission layer and the second emission layer may be more efficient.

The first dopant may include a first transition metal, and the second dopant may include a second transition metal. For example, the first dopant may be a first transition metal-containing organometallic compound, and the second dopant may be a second transition metal-containing organometallic compound.

The first transition metal and the second transition metal may each independently be iridium, platinum, osmium, rhenium, gold, or palladium.

For example, the first dopant and the second dopant may be different from each other.

In an embodiment, the first transition metal and the second transition metal may be different from each other.

In an embodiment, one of the first transition metal or the second transition metal may be iridium, and the other may be platinum.

In an embodiment, the first transition metal and the second transition metal may be the same, though the first dopant and the second dopant are different from each other.

The light-emitting device may satisfy Expression 1 and Expression 2:

$$PDM(D1) < PDM(D2) \quad \text{Expression 1}$$

$$PDM(H1) > PDM(H2) \quad \text{Expression 2}$$

wherein, in Expression 1,

PDM(D1) is a permanent dipole moment of the first dopant and has a unit of debye.

PDM(D2) is a permanent dipole moment of the second dopant and has a unit of debye.

PDM(H1) in Expression 2 is $$\sum_{x=1}^{m1} PDM(Hx) \cdot W(Hx)$$

which is a permanent dipole moment average value of the m1 hosts present in the first host, and has a unit of debye. In this regard, i) x is a variable of 1 to m1, ii) PDM(Hx) is a permanent dipole moment of an $x^{th}$ host in the first emission layer and has a unit of debye, and iii) W(Hx) is a weight fraction of the $x^{th}$ host relative to a total weight of the first host, and may be calculated as (a weight of the $x^{th}$ host in the first emission layer/a total weight of the first host).

For example, in the emission layer, when m1 is 1, the first host in the first emission layer includes one Host A, and PDM(H1) is equal to a permanent dipole moment value of Host A.

As another example, in the emission layer, when m1 is 2, the first host in the first emission layer includes two different hosts (for example, a mixture of the two different hosts). For example, in the emission layer, when m1 is 2 and the first host in the first emission layer includes Host A and Host B, which are different from each other, PDM(H1) may be calculated as PDM(Host A)–W(Host A)+PDM(Host B)–W (Host B), that is, "(permanent dipole moment of Host A×weight fraction of Host A)+(permanent dipole moment of Host B×weight fraction of Host B)". In this regard, when the first host includes Host A and Host B in a weight ratio of 7:3, PDM(H1) may be calculated as "PDM(Host A)×0.7+PDM (Host B)×0.3".

In Expression 2, PDM(H2) is $$\sum_{y=1}^{m2} PDM(Hy) \cdot W(Hy)$$

which is a permanent dipole moment average value of the m2 hosts present in the second host, and has a unit of debye, wherein i) y is a variable of 1 to m2, ii) PDM(Hy) is a permanent dipole moment of an $y^{th}$ host in the second emission layer and has a unit of debye, and iii) W(Hy) is a weight fraction of the $y^{th}$ host relative to a total weight of the second host, and may be calculated as (a weight of the $y^{th}$ host in the second emission layer/a total weight of the second host).

PDM(H2) is the same as described in connection with PDM(H1).

Each of PDM(D1), PDM(D2), PDM(Hx), and PDM(Hy) is calculated based on the density functional theory (DFT). Any various programs may be used for quantum mechanical calculation based on the DFT, and for example, a Gaussian 16 program may be used.

|A| indicates an absolute value of "A".

In an embodiment, |PDM(D1)–PDM(D2)| of the light-emitting device may be about 1.0 debye to about 9.0 debye, about 3.0 debye to about 6.0 debye, about 3.5 debye to about 6.0 debye, about 4.0 debye to about 6.0 debye, about 3.5 debye to about 5.5 debye, about 4.0 debye to about 5.5 debye, about 3.5 debye to about 5.0 debye, about 4.0 debye to about 5.0 debye, about 3.5 debye to about 4.5 debye, or about 4.0 debye to about 4.5 debye.

In an embodiment, PDM(D1) may be about 0.1 debye to about 4 debye, about 0.5 debye to about 4.0 debye, about 1.0 debye to about 4.0 debye, about 1.5 debye to about 4.0 debye, about 0.5 debye to about 3.5 debye, about 1.0 debye to about 3.5 debye, about 1.5 debye to about 3.5 debye, about 0.5 debye to about 3.0 debye, about 1.0 debye to about 3.0 debye, about 1.5 debye to about 3.0 debye, about 0.5 debye to about 2.5 debye, about 1.0 debye to about 2.5 debye, about 1.5 debye to about 2.5 debye, about 0.5 debye to about 2.0 debye, about 1.0 debye to about 2.0 debye, or about 1.5 debye to about 2.0 debye.

In an embodiment, PDM(D2) may be about 3.0 debye to about 10.0 debye, about 4.0 debye to about 9.0 debye, about 4.5 debye to about 9.0 debye, about 5.0 debye to about 9.0 debye, about 5.5 debye to about 9.0 debye, about 4.0 debye to about 8.5 debye, about 4.5 debye to about 8.5 debye, about 5.0 debye to about 8.5 debye, about 5.5 debye to about 8.5 debye, about 4.0 debye to about 8.0 debye, about 4.5 debye to about 8.0 debye, about 5.0 debye to about 8.0 debye, about 5.5 debye to about 8.0 debye, about 4.0 debye to about 7.5 debye, about 4.5 debye to about 7.5 debye, about 5.0 debye to about 7.5 debye, about 5.5 debye to about 7.5 debye, about 4.0 debye to about 7.0 debye, about 4.5 debye to about 7.0 debye, about 5.0 debye to about 7.0 debye, about 5.5 debye to about 7.0 debye, about 4.0 debye to about 6.5 debye, about 4.5 debye to about 6.5 debye, about 5.0 debye to about 6.5 debye, or about 5.5 debye to about 6.5 debye.

In an embodiment, |PDM(H1)–PDM(H2)| of the light-emitting device may be about 0.01 debye to about 3.99 debye, about 0.01 debye to about 3.50 debye, about 0.01 debye to about 3.00 debye, about 0.01 debye to about 2.50 debye, about 0.01 debye to about 2.00 debye, about 0.01 debye to about 1.50 debye, about 0.05 debye to about 3.99 debye, about 0.05 debye to about 3.50 debye, about 0.05 debye to about 3.00 debye, about 0.05 debye to about 2.50 debye, about 0.05 debye to about 2.00 debye, about 0.05 debye to about 1.50 debye, about 0.1 debye to about 3.99 debye, about 0.1 debye to about 3.50 debye, about 0.1 debye to about 3.00 debye, about 0.1 debye to about 2.50 debye, about 0.1 debye to about 2.00 debye, or about 0.1 debye to about 1.50 debye.

In an embodiment, PDM(H1) may be about 0.5 debye to about 4.0 debye, about 0.5 debye to about 3.5 debye, about 0.5 debye to about 3.0 debye, about 0.5 debye to about 2.5 debye, about 0.5 debye to about 2.0 debye, about 1.0 debye to about 4.0 debye, about 1.0 debye to about 3.5 debye, about 1.0 debye to about 3.0 debye, about 1.0 debye to about 2.5 debye, or about 1.0 debye to about 2.0 debye.

In an embodiment, PDM(H2) may be about 0.01 debye to about 3.00 debye, about 0.01 debye to about 2.50 debye, about 0.01 debye to about 2.00 debye, about 0.01 debye to about 1.50 debye, about 0.1 debye to about 3.00 debye, about 0.1 debye to about 2.50 debye, about 0.1 debye to about 2.00 debye, about 0.1 debye to about 1.50 debye, about 1.0 debye to about 3.00 debye, about 1.0 debye to about 2.50 debye, about 1.0 debye to about 2.00 debye, or about 1.0 debye to about 1.50 debye.

In an embodiment, the light-emitting device may further satisfy Expression 3:

$$FWHM(D1) > FWHM(D2) \quad \text{Expression 3}$$

wherein, in Expression 3,

FWHM(D1) is a full width at half maximum of the first photoluminescence spectrum of the first dopant and has a unit of nanometers (nm), FWHM(D2) is a full width at half maximum of the second photoluminescence spectrum of the second dopant and has a unit of nm, the first photoluminescence spectrum is evaluated relative to a first film including the first dopant, and the second photoluminescence spectrum is evaluated relative to a second film including the second dopant.

In the present specification, the "first film" is a film including the first dopant, and the "second film" is a film including the second dopant. The first film and the second film may be manufactured using various methods, such as a vacuum deposition method, a coating method, and a heating method. The first film and the second film may further include other compounds, for example, a host described in the present specification, in addition to the first dopant and the second dopant. For example, a method of evaluating FWHM(D1) and FWHM(D2) is described with reference to the following Evaluation Example.

In an embodiment, |FWHM(D1)−FWHM(D2)| of the light-emitting device may be 50 nm or less, about 0.1 nm to about 50 nm, about 0.1 nm to about 45 nm, about 0.1 nm to about 40 nm, about 1 nm to about 50 nm, about 1 nm to about 45 nm, about 1 nm to about 40 nm, about 5 nm to about 50 nm, about 5 nm to about 45 nm, about 5 nm to about 40 nm, about 10 nm to about 50 nm, about 10 nm to about 45 nm, or about 10 nm to about 40 nm.

In an embodiment, FWHM(D1) may be about 30 nm to about 100 nm, about 30 nm to about 90 nm, about 30 nm to about 80 nm, about 30 nm to about 70 nm, about 40 nm to about 100 nm, about 40 nm to about 90 nm, about 40 nm to about 80 nm, about 40 nm to about 70 nm, about 50 nm to about 100 nm, about 50 nm to about 90 nm, about 50 nm to about 80 nm, or about 50 nm to about 70 nm.

In an embodiment, FWHM(D2) may be about 10 nm to about 60 nm, about 10 nm to about 50 nm, about 10 nm to about 40 nm, about 15 nm to about 60 nm, about 15 nm to about 50 nm, about 15 nm to about 40 nm, about 20 nm to about 60 nm, about 20 nm to about 50 nm, about 20 nm to about 40 nm, about 25 nm to about 60 nm, about 25 nm to about 50 nm, or about 25 nm to about 40 nm.

Meanwhile, the light-emitting device may further satisfy Expression 4:

$$D_{st}(D1) < D_{st}(D2) \quad \text{Expression 4}$$

wherein, in Expression 4, $D_{st}(D1)$ is $|S_1(D1)-T_1(D1)|$, $D_{st}(D2)$ is $|S_1(D2)-T_1(D2)|$, $S_1(D1)$ is singlet energy of the first dopant and has a unit of eV, $T_1(D1)$ is triplet energy of the first dopant and has a unit of eV, $S_1(D2)$ is singlet energy of the second dopant and has a unit of eV, $T_1(D2)$ is triplet energy of the second dopant and has a unit of eV, and each of $S_1(D1)$, $T_1(D1)$, $S_1(D2)$, and $T_1(D2)$ is calculated based on the DFT.

In an embodiment, $|D_{st}(D1)-D_{st}(D2)|$ may be about 0.1 eV to about 0.5 eV, about 0.1 eV to about 0.4 eV, about 0.1 eV to about 0.3 eV, about 0.2 eV to about 0.5 eV, about 0.2 eV to about 0.4 eV, or about 0.2 eV to about 0.3 eV.

In an embodiment, $D_{st}(D1)$ may be about 0.05 eV to about 0.30 eV, about 0.05 eV to about 0.25 eV, about 0.05 eV to about 0.20 eV, about 0.05 eV to about 0.15 eV, about 0.10 eV to about 0.30 eV, about 0.10 eV to about 0.25 eV, about 0.10 eV to about 0.20 eV, or about 0.10 eV to about 0.15 eV.

In an embodiment, $D_{st}(D2)$ may be about 0.2 eV to about 0.6 eV, about 0.2 eV to about 0.5 eV, about 0.2 eV to about 0.4 eV, about 0.3 eV to about 0.6 eV, about 0.3 eV to about 0.5 eV, or about 0.3 eV to about 0.4 eV.

|λmax(1)−λmax(2)| of the light-emitting device may be 0 nm to about 30 nm. In this regard, λmax(1) is a maximum emission peak wavelength of the first photoluminescence spectrum and has a unit of nm, and λmax(2) is a maximum emission peak wavelength of the second photoluminescence spectrum and has a unit of nm.

In an embodiment, |λmax(1)−λmax(2)| may be 0 nm to about 25 nm, about 0.5 nm to about 25 nm, about 1 nm to about 25 nm, 0 nm to about 20 nm, about 0.5 nm to about 20 nm, about 1 nm to about 20 nm, 0 nm to about 15 nm, about 0.5 nm to about 15 nm, about 1 nm to about 15 nm, 0 nm to about 10 nm, 0 nm to about 8 nm, 0 nm to about 6 nm, 0 nm to about 4 nm, 0 nm to about 2 nm, about 0.5 nm to about 10 nm, about 0.5 nm to about 8 nm, about 0.5 nm to about 6 nm, about 0.5 nm to about 4 nm, about 0.5 nm to about 2 nm, about 1 nm to about 10 nm, about 1 nm to about 8 nm, about 1 nm to about 6 nm, about 1 nm to about 4 nm, or about 1 nm to about 2 nm.

In an embodiment, each of λmax(1) and λmax(2) may be about 510 nm to about 540 nm, about 510 nm to about 535 nm, about 510 nm to about 530 nm, about 515 nm to about 540 nm, about 515 nm to about 535 nm, about 515 nm to about 530 nm, about 520 nm to about 540 nm, about 520 nm to about 535 nm, or about 520 nm to about 530 nm.

In an embodiment, each of λmax(1) and λmax(2) may be about 540 nm to about 570 nm, about 540 nm to about 565 nm, about 540 nm to about 560 nm, about 540 nm to about 555 nm, about 545 nm to about 570 nm, about 545 nm to about 565 nm, about 545 nm to about 560 nm, about 545 nm to about 555 nm, about 550 nm to about 570 nm, about 550 nm to about 565 nm, about 550 nm to about 560 nm, or about 550 nm to about 555 nm.

In an embodiment, λmax(1) may be about 510 nm to about 540 nm, about 510 nm to about 535 nm, about 510 nm to about 530 nm, about 515 nm to about 540 nm, about 515 nm to about 535 nm, about 515 nm to about 530 nm, about 520 nm to about 540 nm, about 520 nm to about 535 nm, or about 520 nm to about 530 nm, and λmax(2) may be 540 nm to about 570 nm, about 540 nm to about 565 nm, about 540 nm to about 560 nm, about 540 nm to about 555 nm, about 545 nm to about 570 nm, about 545 nm to about 565 nm, about 545 nm to about 560 nm, about 545 nm to about 555 nm, about 550 nm to about 570 nm, about 550 nm to about 565 nm, about 550 nm to about 560 nm, or about 550 nm to about 555 nm.

In an embodiment, λmax(1) may be about 540 nm to about 570 nm, about 540 nm to about 565 nm, about 540 nm to about 560 nm, about 540 nm to about 555 nm, about 545 nm to about 570 nm, about 545 nm to about 565 nm, about 545 nm to about 560 nm, about 545 nm to about 555 nm, about 550 nm to about 570 nm, about 550 nm to about 565 nm, about 550 nm to about 560 nm, or about 550 nm to about 555 nm, and λmax(2) may be about 510 nm to about 540 nm, about 510 nm to about 535 nm, about 510 nm to about 530 nm, about 515 nm to about 540 nm, about 515 nm to about 535 nm, about 515 nm to about 530 nm, about 520 nm to about 540 nm, about 520 nm to about 535 nm, or about 520 nm to about 530 nm.

In an embodiment, each of the first light and the second light may be yellow-green light, green light, or blue-green light.

In an embodiment, each of the first light and the second light may be green light.

In an embodiment, each of the first emission layer and the second emission layer may emit yellow-green light, green light, or blue-green light.

In an embodiment, each of the first emission layer and the second emission layer may emit green light.

In an embodiment, the light-emitting device may not emit white light.

The light-emitting device includes a first emission layer including a first dopant and a second emission layer including a second dopant, and the first dopant and the second dopant are different from each other. In other words, the light-emitting device includes the first and second dopants having different photoluminescence spectra. When the light-emitting device simultaneously satisfies Expression 1 and Expression 2, the relation symbol between the permanent dipole moments of the first and second dopants and the relation symbol between the permanent dipole moments of the first host in the first emission layer and the second host in the second emission layer become opposite to each other. By simultaneously satisfying Expression 1 and Expression 2, the light-emitting device may simultaneously have excellent characteristics in terms of luminescence efficiency, power efficiency, lifespan, roll-off ratio, and/or lateral luminance ratio, and excellent low-gradation emission characteristics, for example, a relatively small turn-on time and/or turn-off time when driving a pulse current at a low current density, and thus, may be a high-quality light-emitting device with overall excellent performance. The light-emitting device is to be adapted as a light-emitting device to be mounted on various consumer goods. In addition, by further satisfying Expression 3 and/or Expression 4, the luminescence efficiency, power efficiency, lifespan, roll-off ratio, lateral luminance ratio, and low-gradation emission characteristics of the light-emitting device may be further improved.

The above may be described in more detail in Evaluation Examples provided below.

In an embodiment, the first emission layer and the second emission layer may be in direct contact with each other.

The first emission layer of the light-emitting device may be arranged between the second emission layer and the second electrode. In other words, the first electrode, the second emission layer, the first emission layer, and the second electrode of the light-emitting device may be arranged in this stated order.

In an embodiment, the second emission layer of the light-emitting device may be arranged between the first emission layer and the second electrode. In other words, the first electrode, the first emission layer, the second emission layer, and the second electrode of the light-emitting device may be arranged in this stated order.

In an embodiment, the first transition metal may be platinum, and the second transition metal may be iridium.

In an embodiment, the first dopant may be an organometallic compound including a first transition metal (for example, iridium, platinum, or osmium) and at least one organic ligand bonded to the first transition metal. In an embodiment, the first light may be phosphorescent light.

In an embodiment, the second dopant may be an organometallic compound including a second transition metal (for example, iridium, platinum, or osmium) and at least one organic ligand bonded to the second transition metal. In an embodiment, the second light may be phosphorescent light.

The first dopant may include one first transition metal, and the second dopant may include one second transition metal.

Each of the first dopant and the second dopant may be electrically neutral.

In an embodiment, the first dopant may be a platinum-containing organometallic compound including platinum and a tetradentate ligand bonded to the platinum, and the second dopant may be an iridium-containing organometallic compound including iridium and a first ligand, a second ligand, and a third ligand, bonded to the iridium.

For example, the platinum-containing organometallic compound may be an organometallic compound including a chemical bond between carbon of the tetradentate ligand and the platinum.

In an embodiment, the platinum-containing organometallic compound may be an organometallic compound including a) a chemical bond (for example, a covalent bond) between carbon of the tetradentate ligand and the platinum and b) a chemical bond (for example, a covalent bond) between oxygen (O) of the tetradentate ligand and the platinum. The platinum-containing organometallic compound may be an organometallic compound that further includes a chemical bond (for example, a coordinate bond) between nitrogen of the tetradentate ligand and the platinum.

In an embodiment, the platinum-containing organometallic compound may be an organometallic compound including a) a chemical bond (for example, a covalent bond) between carbon of the tetradentate ligand and the platinum and b) a chemical bond (for example, a covalent bond) between sulfur (S) of the tetradentate ligand and the platinum. The platinum-containing organometallic compound may be an organometallic compound that further includes a chemical bond (for example, a coordinate bond) between nitrogen of the tetradentate ligand and the platinum.

In an embodiment, in the iridium-containing organometallic compound, a) the first ligand, the second ligand, and the third ligand may be identical to each other, b) the first ligand and the second ligand may be identical to each other, and the second ligand and the third ligand may be different from each other, or c) the first ligand, the second ligand, and the third ligand may each be different from the other.

In an embodiment, each of the first ligand, the second ligand, and the third ligand may be:

a bidentate ligand bonded to iridium of the iridium-containing organometallic compound via two nitrogens;

a bidentate ligand bonded to iridium of the iridium-containing organometallic compound via nitrogen and carbon; or a bidentate ligand bonded to iridium of the iridium-containing organometallic compound via two carbons.

In an embodiment, each of the first ligand, the second ligand, and the third ligand may be a bidentate ligand bonded to iridium of the iridium-containing organometallic compound via nitrogen and carbon.

In an embodiment, at least one of the first dopant and the second dopant may include deuterium, a fluoro group, Si, Ge, or any combination thereof.

In an embodiment, at least one of the first dopant and the second dopant may include deuterium.

For example, at least one of the first dopant and the second dopant may include deuterium, a fluoro group, a deuterated $C_1$-$C_{20}$ alkyl group, a fluorinated $C_1$-$C_{20}$ alkyl group, $—Si(Q_3)(Q_4)(Q_5)$, $—Ge(Q_3)(Q_4)(Q_5)$, or any combination thereof, and $Q_3$ to $Q_5$ may each independently be a $C_1$-$C_{20}$ alkyl group or a phenyl group.

In an embodiment, the iridium-containing organometallic compound may include a dibenzofuran group, a dibenzothiophene group, a dibenzoselenophene group, a dibenzosilole group, a dibenzogermole group, a naphthobenzofuran group, a naphthobenzothiophene group, a naphthobenzoselenophene group, a naphthobenzosilole group, a naphthobenzogermole group, a phenanthrobenzofuran group, a phenanthrobenzothiophene group, a phenanthrobenzoselenophene group, a phenanthrobenzosilole group, a phenanthrobenzogermole group, an azadibenzofuran group, an azadibenzothiophene group, an azadibenzoselenophene group, an azadibenzosilole group, an azadibenzogermole group, an azanaphthobenzofuran group, an azanaphthobenzothiophene group, an azanaphthobenzoselenophene group, an azanaphthobenzosilole group, an azanaphthobenzogermole group, an azaphenanthrobenzofuran group, an azaphenanthrobenzothiophene group, an azaphenanthrobenzoselenophene group, an azaphenanthrobenzosilole group, an azaphenanthrobenzogermole group, or any combination thereof, bonded to the iridium via carbon.

For example, the iridium-containing organometallic compound may include a dibenzofuran group, a dibenzothiophene group, a naphthobenzofuran group, a naphthobenzothiophene group, a phenanthrobenzofuran group, a phenanthrobenzothiophene group, an azadibenzofuran group, an azadibenzothiophene group, an azanaphthobenzofuran group, an azanaphthobenzothiophene group, an azaphenanthrobenzofuran group, an azaphenanthrobenzothiophene group, or any combination thereof, bonded to the iridium via carbon.

In an embodiment, the iridium-containing organometallic compound may include a benzimidazole group, a benzoxazole group, a benzthiazole group, a naphthoimidazole group, a naphthoxazole group, a naphthothiazole group, a phenanthroimidazole group, a phenanthroxazole group, a phenanthrothiazole group, a pyridoimidazole group, a pyridoxazole group, a pyridothiazole group, a pyridine group, a pyrimidine group, a pyrazine group, a pyridazine group, a quinoline group, an isoquinoline group, a furopyridine group, a benzofuropyridine group, a thienopyridine group, a benzothienopyridine group, or any combination thereof, bonded to the iridium via nitrogen.

For example, the iridium-containing organometallic compound may include a benzimidazole group, a naphthoimidazole group, a phenanthroimidazole group, a furopyridine group, a benzofuropyridine group, a thienopyridine group, a benzothienopyridine group, or any combination thereof, bonded to the iridium via nitrogen.

In an embodiment, the iridium-containing organometallic compound may include ring $A_3$ bonded to the iridium via nitrogen and ring $A_4$ bonded to the iridium via carbon, ring $A_3$ and ring $A_4$ are bonded together via a single bond, ring $A_3$ may be a benzimidazole group, a benzoxazole group, a benzthiazole group, a naphthoimidazole group, a naphthoxazole group, a naphthothiazole group, a phenanthroimidazole group, a phenanthroxazole group, a phenanthrothiazole group, a pyridoimidazole group, a pyridoxazole group, a pyridothiazole group, a pyridine group, a pyrimidine group, a pyrazine group, a pyridazine group, a quinoline group, an isoquinoline group, a furopyridine group, a benzofuropyridine group, a thienopyridine group, or a benzothienopyridine group, and ring $A_4$ may be a dibenzofuran group, a dibenzothiophene group, a naphthobenzofuran group, a naphthobenzothiophene group, a phenanthrobenzofuran group, a phenanthrobenzothiophene group, an azadibenzofuran group, an azadibenzothiophene group, an azanaphthobenzofuran group, an azanaphthobenzothiophene group, an azaphenanthrobenzofuran group, or an azaphenanthrobenzothiophene group.

In an embodiment, the first dopant and the second dopant may each independently be an organometallic compound represented by Formula 1 or an organometallic compound represented by Formula 2:

Formula 1

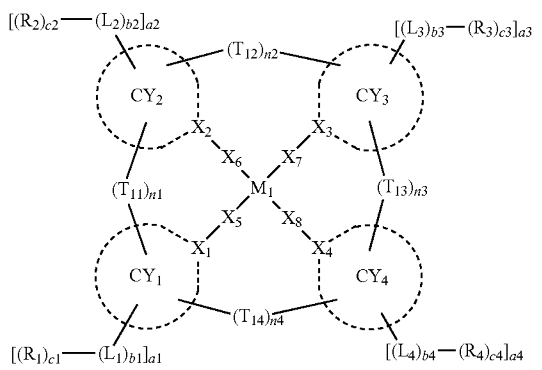

Formula 2

$$M_2(L_{11})_{n11}(L_{12})_{n12}(L_{13})_{n13}.$$

wherein, $M_1$ in Formula 1 is platinum (Pt), and $M_2$ in Formula 2 is iridium (Ir).

In Formula 2, $L_{11}$ may be a ligand represented by Formula 2-1, $L_{12}$ may be a ligand represented by Formula 2-2, and $L_{13}$ may be a ligand represented by Formula 2-1 or 2-2:

Formula 2-1

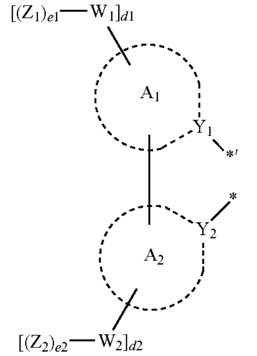

Formula 2-2

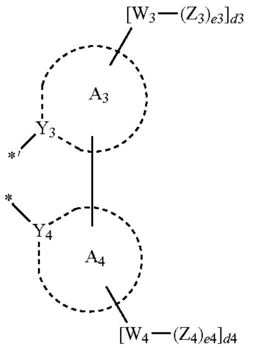

wherein Formulae 2-1 and 2-2 may respectively be the same as those described in the present specification.

$L_{11}$ and $L_{12}$ in Formula 2 may be different from each other.

n11 to n13 in Formula 2 indicate numbers of $L_{11}$ to $L_{13}$, respectively, and may each independently be 0, 1, 2, or 3, wherein n11+n12+n13 may be 3.

In an embodiment, in Formula 2, n11 may be 1, 2, or 3, and n12 and n13 may each independently be 0, 1, or 2.

In an embodiment, in Formula 2, n12 may be 1, 2, or 3, and n11 and n13 may each independently be 0, 1, or 2.

In an embodiment, n11 may be 1, n12 may be 2, and n13 may be 0.

In an embodiment, n11 may be 2, n12 may be 1, and n13 may be 0.

In an embodiment, n11 may be 3, and n12 and n13 may each be 0.

In an embodiment, n12 may be 3, and n11 and n13 may each be 0.

The organometallic compound represented by Formula 2 may be a heteroleptic complex or a homoleptic complex. For example, the organometallic compound represented by Formula 2 may be a heteroleptic complex.

$X_1$ to $X_4$ and $Y_1$ to $Y_4$ in Formulae 1, 2-1, and 2-2 may each independently be C or N.

For example, at least one of $X_1$ to $X_4$ in Formula 1 may be C.

In an embodiment, $X_1$ in Formula 1 may be C.

In an embodiment, in Formula 1, i) $X_1$ and $X_3$ may each be C, and $X_2$ and $X_4$ may each be N, or ii) $X_1$ and $X_4$ may each be C, and $X_2$ and $X_3$ may each be N.

In an embodiment, in Formulae 2-1 and 2-2, $Y_1$ and $Y_3$ may each be N, and $Y_2$ and $Y_4$ may each be C.

$X_5$ to $X_8$ in Formula 1 may each independently be a chemical bond, O, S, N(R'), C(R')(R"), or C(=O), wherein at least one of $X_5$ to $X_8$ may not be a chemical bond. R' and R" may respectively be the same as those described in the present specification.

In an embodiment, $X_5$ in Formula 1 may not be a chemical bond.

In an embodiment, $X_5$ in Formula 1 may be O or S.

In an embodiment, in Formula 1, $X_5$ may be O or S, and $X_6$ to $X_8$ may each be a chemical bond.

In Formula 1, two of a bond between $X_5$ or $X_1$ and $M_1$, a bond between $X_6$ or $X_2$ and $M_1$, a bond between $X_7$ or $X_3$ and $M_1$, and a bond between $X_8$ or $X_4$ and $M_1$ may each be a coordinate bond, and the other two bonds may each be a covalent bond.

For example, a bond between $X_2$ and $M_1$ in Formula 1 may be a coordinate bond.

In an embodiment, in Formula 1, a bond between $X_5$ or $X_1$ and $M_1$ and a bond between $X_3$ and $M_1$ may each be a coordinate bond, and a bond between $X_2$ and $M_1$ and a bond between $X_4$ and $M_1$ may each be a covalent bond.

In an embodiment, in Formula 1, a bond between $X_5$ or $X_1$ and $M_1$ and a bond between $X_3$ and $M_1$ may each be a covalent bond, and a bond between $X_2$ and $M_1$ and a bond between $X_4$ and $M_1$ may each be a coordinate bond.

Ring $CY_1$ to ring $CY_4$ and ring $A_1$ to ring $A_4$ in Formulae 1, 2-1, and 2-2 may each independently be a $C_5$-$C_{30}$ carbocyclic group or a $C_1$-$C_{30}$ heterocyclic group.

For example, each of ring $CY_1$, ring $CY_3$, and ring $CY_4$ in Formula 1 may not be a benzimidazole group.

For example, ring $CY_1$ to ring $CY_4$ and ring $A_1$ to ring $A_4$ in Formulae 1, 2-1, and 2-2 may each independently be i) a first ring, ii) a second ring, iii) a condensed ring in which two or more first rings are condensed with each other, iv) a condensed ring in which two or more second rings are condensed with each other, or v) a condensed ring in which one or more first rings are condensed with one or more second rings, the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

As another example, ring $CY_1$ to ring $CY_4$ and ring $A_1$ to ring $A_4$ in Formulae 1, 2-1, and 2-2 may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluoren-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an isoxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benz imidazole group, a benzoxazole group, a benzisoxazole group, a benzothiazole group, a benzisothiazole group, a benzoxadiazole group, a benzothiadiazole group, a pyridinopyrrole group, a pyridinopyrazole group, a pyridinoimidazole group, a pyridinoxazole group, a pyridinoisoxazole group, a pyridinothiazole group, a pyridinoisothiazole group, a pyridinooxadiazole group, a pyridinothiadiazole group, a pyrimidinopyrrole group, a pyrimidinopyrazole group, a pyrimidinoimidazole group, a pyrimidinoxazole group, a pyrimidinoisoxazole group, a pyrimidinothiazole group, a pyrimidinoisothiazole group, a pyrimidinooxadiazole group, a pyrimidinothiadiazole group, a naphthopyrrole group, a naphthopyrazole group, a naphthoimidazol group, a naphthoxazole group, a naphthoisoxazole group, a naphthothiazole group, a naphthoisothiazole group, a naphthooxadiazole group, a naphthothiadiazole group, a phenanthrenopyrrole group, a phenanthrenopyrazole group, a phenanthrenoimidazole group, a phenanthrenoxazole group, a phenanthrenoisoxazole group, a phenanthrenothiazole group, a phenanthrenoisothiazole group, a phenanthrenooxadiazole group, a phenanthrenothiadiazole group, a furo pyridine group, a benzofuropyridine group, a thienopyridine group, a benzothienopyridine group, a 5,6,7,8-tetrahydroisoquinoline group, a 5,6,7,8-tetrahydroquinoline group, an adamantane group, a norbornane group, a norbornene group, a benzene group condensed with a cyclohexane group, a benzene group condensed with a norbornane group, a pyridine group condensed with a cyclohexane group, or a pyridine group condensed with a norbornane group.

In an embodiment, ring $CY_1$ and ring $CY_3$ in Formula 1 may each independently be:

a benzene group, a naphthalene group, a phenanthrene group, a dibenzofuran group, a dibenzothiophene group, a dibenzoselenophene group, a carbazole group, a fluorene group, or a dibenzosilole group; or a benzene group, a naphthalene group, a phenanthrene group, a dibenzofuran group, a dibenzothiophene group, a dibenzoselenophene group, a carbazole group, a fluorene group, or a dibenzosilole group, each condensed with a cyclohexane group, a cyclohexene group, a norbornane group, a piperidine group, or any combination thereof.

In an embodiment, ring $CY_2$ in Formula 1 may be:

an imidazole group, a benzimidazole group, a pyridine group, a pyrimidine group, a pyridazine group, a pyrazine group, a triazine group, a quinoline group, an isoquinoline group, a quinoxaline group, or a quinazoline group; or an imidazole group, a benzimidazole group, a pyridine group, a pyrimidine group, a pyridazine group, a pyrazine group, a triazine group, a quinoline group, an isoquinoline group, a quinoxaline group, or a quinazoline group, each condensed with a cyclohexane group, a cyclohexene group, a norbornane group, a benzene group, a pyridine group, a pyrimidine group, or any combination thereof.

In an embodiment, ring $CY_4$ in Formula 1 may be:

a pyridine group, a pyrimidine group, a pyridazine group, a pyrazine group, a triazine group, a quinoline group, an isoquinoline group, a quinoxaline group, a quinazoline group, an azadibenzofuran group, an azadibenzothiophene group, an azadibenzoselenophene group, an azacarbazole group, an azafluorene group, or an azadibenzosilole group; or a pyridine group, a pyrimidine group, a pyridazine group, a pyrazine group, a triazine group, a quinoline group, an isoquinoline group, a quinoxaline group, a quinazoline group, an azadibenzofuran group, an azadibenzothiophene group, an azadibenzoselenophene group, an azacarbazole group, an azafluorene group, or an azadibenzosilole group, each condensed with a cyclohexane group, a cyclohexene group, a norbornane group, a benzene group, a pyridine group, a pyrimidine group, or any combination thereof.

Ring $A_1$ and ring $A_3$ in Formulae 2-1 and 2-2 may be different from each other.

In an embodiment, a $Y_1$-containing monocyclic group in ring $A_1$, a $Y_2$-containing monocyclic group in ring $A_2$, and a $Y_4$-containing monocyclic group in ring $A_4$ may each be a 6-membered ring.

In an embodiment, a $Y_3$-containing monocyclic group in ring $A_3$ may be a 6-membered ring.

In an embodiment, a $Y_3$-containing monocyclic group in ring $A_3$ may be a 5-membered ring.

In an embodiment, a $Y_1$-containing monocyclic group in ring $A_1$ may be a 6-membered ring, and a $Y_3$-containing monocyclic group in ring $A_3$ may be a 5-membered ring.

In an embodiment, ring $A_1$ and ring $A_3$ in Formulae 2-1 and 2-2 may each independently be i) Group A, ii) a polycyclic group in which two or more of Group A are condensed with each other, or iii) a polycyclic group in which one or more of Group A and one or more of Group B are condensed with each other, Group A may be a pyridine group, a pyrimidine group, a pyridazine group, a pyrazine group, or a triazine group, and Group B may be a cyclohexane group, a cyclohexene group, a norbornane group, a benzene group, a furan group, a thiophene group, a selenophene group, a pyrrole group, a cyclopentadiene group, or silole group.

In an embodiment, in Formula 2-2, ring $A_3$ may be i) Group C, ii) a polycyclic group in which two or more of Group C are condensed with each other, or iii) a polycyclic group in which one or more of Group C and one or more of Group D are condensed with each other, Group C may be a pyrrole group, a pyrazole group, an imidazole group, a triazole group, an oxazole group, an isoxazole group, a thiazole group, or an isothiazole group, and Group D may be a cyclohexane group, a cyclohexene group, a norbornane group, a benzene group, a furan group, a thiophene group, a selenophene group, a cyclopentadiene group, a silole group, a pyridine group, a pyrimidine group, a pyridazine group, a pyrazine group, or a triazine group.

In an embodiment, ring $A_1$ in Formula 2-1 may be:

a pyridine group, a pyrimidine group, a pyridazine group, or a pyrazine group; or a pyridine group, a pyrimidine group, a pyridazine group, or a pyrazine group, each condensed with a cyclohexane group, a norbornane group, a benzene group, or any combination thereof.

In an embodiment, ring $A_3$ in Formula 2-2 may be:

a pyridine group, a pyrimidine group, a pyridazine group, or a pyrazine group;

a pyridine group, a pyrimidine group, a pyridazine group, or a pyrazine group, each condensed with a cyclohexane group, a norbornane group, a benzene group, or any combination thereof; or an imidazole group, a benzimidazole group, a naphthoimidazole group, a phenanthrenoimidazole group, a pyridoimidazole group, an oxazole group, a benzoxazole group, a naphthoxazole group, a phenanthrenoxazole group, a pyridoxazole group, a thiazole group, a benzothiazole group, a naphthothiazole group, a phenanthrenothiazole group, or a pyridothiazole group.

In an embodiment, ring $A_2$ and ring $A_4$ in Formulae 2-1 and 2-2 may be different from each other.

In an embodiment, ring $A_2$ and ring $A_4$ in Formulae 2-1 and 2-2 may each independently be i) Group E, ii) a polycyclic group in which two or more of Group E are condensed with each other, or iii) a polycyclic group in which one or more of Group E and one or more of Group F are condensed with each other, Group E may be a benzene group, a pyridine group, a pyrimidine group, a pyridazine group, a pyrazine group, or a triazine group, and Group F may be a furan group, a thiophene group, a selenophene group, a pyrrole group, a cyclopentadiene group, a silole group, a pyrazole group, an imidazole group, an oxazole group, a thiazole group, an isoxazole group, or an isothiazole group.

In an embodiment, ring $A_2$ in Formula 2-1 may be a polycyclic group in which two or more of Group E and one or more of Group F are condensed with each other.

In an embodiment, ring $A_4$ in Formula 2-2 may be a polycyclic group in which two or more of Group E and one or more of Group F are condensed with each other.

In an embodiment, ring $A_2$ in Formula 2-1 may be:

a benzene group, a naphthalene group, a phenanthrene group, a dibenzofuran group, a dibenzothiophene group, a dibenzoselenophene group, a carbazole group, a fluorene group, or a dibenzosilole group; or a benzene group, a naphthalene group, a phenanthrene group, a dibenzofuran group, a dibenzothiophene group, a dibenzoselenophene group, a carbazole group, a fluorene group, or a dibenzosilole group, each condensed with a cyclohexane group, a norbornane group, a benzene group, or any combination thereof.

In an embodiment, ring $A_4$ in Formula 2-2 may be:

a benzene group, a naphthalene group, a phenanthrene group, a dibenzofuran group, a dibenzothiophene group, a dibenzoselenophene group, a carbazole group, a fluorene group, a dibenzosilole group, an azadibenzofuran group, an azadibenzothiophene group, an azadibenzoselenophene group, an azacarbazole group, an azafluorene group, or a dibenzosilole group; or a benzene group, a naphthalene group, a phenanthrene group, a dibenzofuran group, a dibenzothiophene group, a dibenzoselenophene group, a carbazole group, a fluorene group, a dibenzosilole group, an azadibenzofuran group, an azadibenzothiophene group, an azadibenzoselenophene group, an azacarbazole group, an azafluorene group, or a dibenzosilole group, each condensed with a benzene group, a pyridine group, a pyrimidine group, a pyridazine group, a pyrazine group, a cyclohexane group, a norbornane group, a furan group, a thiophene group, a selenophene group, a pyrrole group, a cyclopentadiene group, a silole group, a pyrazole group, an imidazole group, an oxazole group, a thiazole group, an isoxazole group, an isothiazole group, or any combination thereof.

$T_{11}$ to $T_{14}$ in Formula 1 may each independently be a single bond, a double bond, $*-N(R_{5a})-*'$, $*-B(R_{5a})-*'$, $*-P(R_{5a})-*'$, $*-C(R_{5a})(R_{5b})-*'$, $*-Si(R_{5a})(R_{5b})-*'$, $*-Ge(R_{5a})(R_{5b})-*'$, $*-S-*'$, $*-Se-*'$, $*-O-*'$, $*-C(=O)-*'$, $*-S(=O)-*'$, $*-S(=O)_2-*'$, $*-C(R_{5a})=*'$, $*=C(R_{5a})-*'$, $*-C(R_{5a})=C(R_{5b})-*'$, $*-C(=S)-*'$, $*-C\equiv C-*'$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

For example, $T_{11}$ and $T_{12}$ in Formula 1 may be a single bond, and $T_{13}$ may be a single bond, $*-N(R_{5a})-*'$, $*-B(R_{5a})-*'$, $*-P(R_{5a})-*'$, $*-C(R_{5a})(R_{5b})-*'$, $*-Si(R_{5a})(R_{5b})-*'$, $*-Ge(R_{5a})(R_{5b})-*'$, $*-S-*'$, or $*-O-*'$.

n1 to n4 in Formula 1 indicate numbers of $T_{11}$ to $T_{14}$, respectively, and may each independently be 0 or 1, wherein three or more of n1 to n4 may each be 1. In other words, the organometallic compound represented by Formula 1 may have a tetradentate ligand.

In Formula 1, when n1 is 0, $T_{11}$ does not exist (that is, ring $CY_1$ and ring $CY_2$ are not linked to each other), when n2 is 0, $T_{12}$ does not exist (that is, ring $CY_2$ and ring $CY_3$ are not linked to each other), when n3 is 0, $T_{13}$ does not exist (that is, ring $CY_3$ and ring $CY_4$ are not linked to each other), and when n4 is 0, $T_{14}$ does not exist (that is, ring $CY_4$ and ring $CY_1$ are not linked to each other).

In an embodiment, in Formula 1, n1 to n3 may each be 1, and n4 may be 0.

$L_1$ to $L_4$ and $W_1$ to $W_4$ in Formulae 1, 2-1, and 2-2 may each independently be a single bond, a $C_1$-$C_{60}$ alkylene group that is unsubstituted or substituted with at least one $R_{10a}$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

For example, $L_1$ to $L_4$ and $W_1$ to $W_4$ in Formulae 1, 2-1, and 2-2 may each independently be:

a single bond; or a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group, each unsubstituted or substituted with at least one $R_{10a}$.

In an embodiment, $L_1$ to $L_4$ and $W_1$ to $W_4$ in Formulae 1, 2-1, and 2-2 may each independently be:

a single bond; or a benzene group, a naphthalene group, a pyridine group, a fluorene group, a carbazole group, a dibenzofuran group, or a dibenzothiophene group, each unsubstituted or substituted with at least one $R_{10a}$.

In an embodiment, $L_1$ to $L_4$ and $W_1$ to $W_4$ in Formulae 1, 2-1, and 2-2 may each independently be:

a single bond; or a $C_1$-$C_{20}$ alkylene group, a benzene group, a naphthalene group, a dibenzofuran group, or a dibenzothiophene group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a phenyl group, a deuterated phenyl group, a fluorinated phenyl group, a ($C_1$-$C_{20}$ alkyl)phenyl group, a naphthyl group, a pyridinyl group, a furanyl group, a thiophenyl group, a benzofuranyl group, a benzothiophenyl group, a dibenzofuranyl group, a dibenzothiophenyl group, or any combination thereof.

b1 to b4 in Formula 1 indicate numbers of $L_1$ to $L_4$, respectively, and may each independently be an integer from 1 to 10. When b1 is 2 or more, two or more $L_1$ may be identical to or different from each other, when b2 is 2 or more, two or more $L_2$ may be identical to or different from each other, when b3 is 2 or more, two or more $L_3$ may be identical to or different from each other, and when b4 is 2 or more, two or more $L_4$ may be identical to or different from each other. For example, b1 to b4 may each independently be 1, 2, or 3.

$R_1$ to $R_4$, $R_{5a}$, $R_{5b}$, R', R'', and $Z_1$ to $Z_4$ in Formulae 1, 2-1, and 2-2 may each independently be hydrogen, deuterium, —F, —Cl, —Br, —I, —$SF_5$, a hydroxyl group, a cyano group, a nitro group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$). $Q_1$ to $Q_9$ may respectively be the same as those described in the present specification.

In Formulae 1, 2-1, and 2-2, $R_1$ to $R_4$, $R_{5a}$, $R_{5b}$, R', R'', and $Z_1$ to $Z_4$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, a $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group (or, a bicyclo[2.2.1]heptyl group), a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl) phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl) cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a deuterated phenyl group, a fluorinated phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, and $Q_1$ to $Q_9$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof.

In an embodiment, $R_1$ to $R_4$, $R_{5a}$, $R_{5b}$, R', R", and $Z_1$ to $Z_4$ in Formulae 1, 2-1, and 2-2 may each independently be:

hydrogen, deuterium, —F, or a cyano group;

a $C_1$-$C_{20}$ alkyl group that is unsubstituted or substituted with deuterium, —F, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl) $C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or any combination thereof;

a $C_3$-$C_{10}$ cycloalkyl group, a $C_1$-$C_{10}$ heterocycloalkyl group, a phenyl group, a biphenyl group, a naphthyl group, a pyridinyl group, a fluorenyl group, a carbazolyl group, a dibenzofuranyl, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl) dibenzothiophenyl group, or any combination thereof; or —Si($Q_3$)($Q_4$)($Q_5$) or —Ge($Q_3$)($Q_4$)($Q_5$).

In an embodiment, in Formula 2-1, each of e1 and d1 may not be 0, and at least one of a plurality of $Z_1$ may be a deuterated $C_1$-$C_{20}$ alkyl group, —Si($Q_3$)($Q_4$)($Q_5$), or —Ge($Q_3$)($Q_4$)($Q_5$). $Q_3$ to $Q_5$ may respectively be the same as those described in the present specification.

For example, $Q_3$ to $Q_5$ may each independently be:

a $C_1$-$C_{60}$ alkyl group that is unsubstituted or substituted with deuterium, a $C_1$-$C_{60}$ alkyl group, a $C_6$-$C_{60}$ aryl group, or any combination thereof; or a $C_6$-$C_{60}$ aryl group that is unsubstituted or substituted with deuterium, a $C_1$-$C_{60}$ alkyl group, a $C_6$-$C_{60}$ aryl group, or any combination thereof.

In an embodiment, $Q_3$ to $Q_5$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In an embodiment, $Q_3$ to $Q_5$ may be identical to each other.

In an embodiment, two or more of $Q_3$ to $Q_5$ may be different from each other.

In an embodiment, the organometallic compound represented by Formula 2 may satisfy at least one of Condition (1) to Condition (8):

Condition (1)

in Formula 2-1, each of e1 and d1 is not 0, and at least one $Z_1$ includes deuterium;

Condition (2)

in Formula 2-1, each of e2 and d2 is not 0, and at least one $Z_2$ includes deuterium;

Condition (3)

in Formula 2-2, each of e3 and d3 is not 0, and at least one $Z_3$ includes deuterium;

Condition (4)

in Formula 2-2, each of e4 and d4 is not 0, and at least one $Z_4$ includes deuterium;

Condition (5)

in Formula 2-1, each of e1 and d1 is not 0, and at least one $Z_1$ includes a fluoro group;

Condition (6)

in Formula 2-1, each of e2 and d2 is not 0, and at least one $Z_2$ includes a fluoro group;

Condition (7)

in Formula 2-2, each of e3 and d3 is not 0, and at least one $Z_3$ includes a fluoro group; and Condition (8)

in Formula 2-2, each of e4 and d4 is not 0, and at least one $Z_4$ includes a fluoro group.

In an embodiment, $R_1$ to $R_4$, $R_{5a}$, $R_{5b}$, R', R", and $Z_1$ to $Z_4$ in Formulae 1, 2-1, and 2-2 may each independently be hydrogen, deuterium, —F, $—CH_3$, $—CD_3$, $—CD_2H$, $—CDH_2$, $—CF_3$, $—CF_2H$, $—CFH_2$, a $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-227, a group represented by one of Formulae 9-201 to 9-227 in which at least one hydrogen is substituted with deuterium, a group represented by one of Formulae 9-201 to 9-227 in which at least one hydrogen is substituted with —F, a group represented by one of Formulae 10-1 to 10-129, a group represented by one of Formulae 10-1 to 10-129 in which at least one hydrogen is substituted with deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen is substituted with deuterium, a group represented by one of Formulae 10-201 to 10-350 in which at least one hydrogen is substituted with —F, —Si($Q_3$)($Q_4$)($Q_5$), or —Ge($Q_3$)($Q_4$)($Q_5$) (wherein $Q_3$ to $Q_5$ are respectively the same as those described in the present specification):

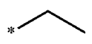

9-1

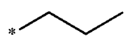

9-2

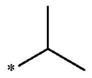

9-3

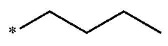

9-4

-continued
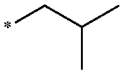
9-5
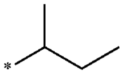
9-6
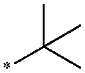
9-7
9-8
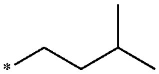
9-9
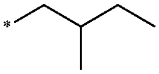
9-10
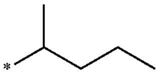
9-11
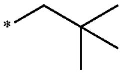
9-12
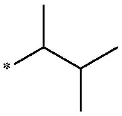
9-13
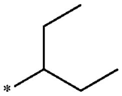
9-14
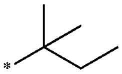
9-15
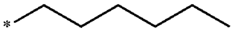
9-16
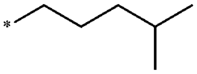
9-17
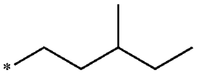
9-18
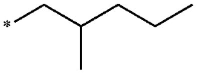
9-19
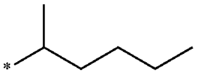
9-20
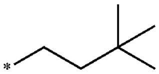
9-21
-continued
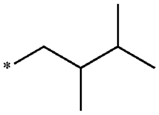
9-22
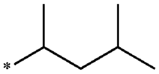
9-23
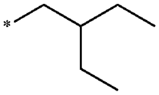
9-24
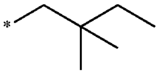
9-25
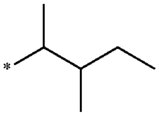
9-26
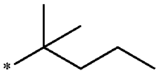
9-27
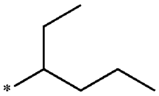
9-28
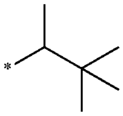
9-29
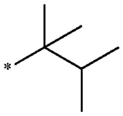
9-30
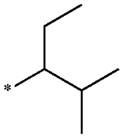
9-31
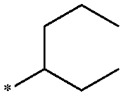
9-32
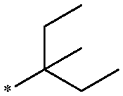
9-33
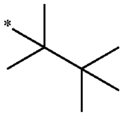
9-34

-continued
9-35
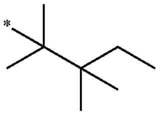
9-36
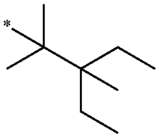
9-37
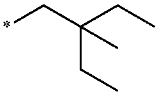
9-38
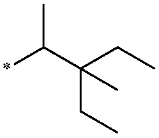
9-39
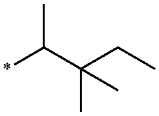
9-201
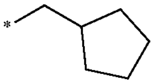
9-202
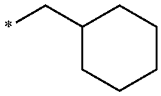
9-203
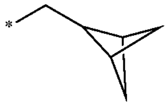
9-204
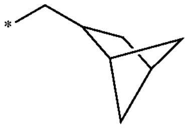
9-205
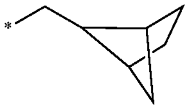
9-206
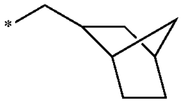
9-207
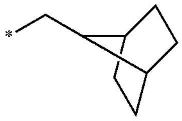
9-208
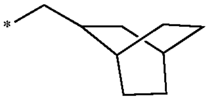
-continued
9-209
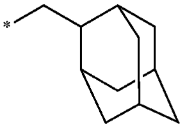
9-210
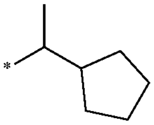
9-211
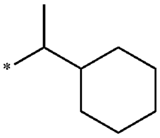
9-212
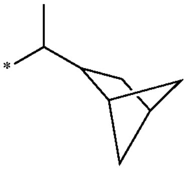
9-213
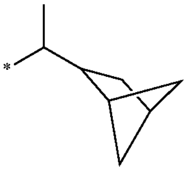
9-214
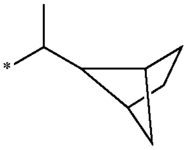
9-215
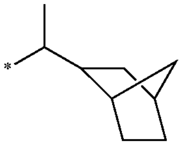
9-216
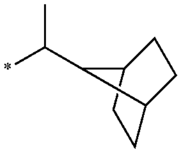
9-217
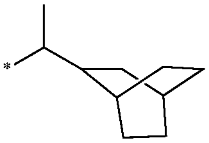
9-218
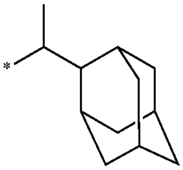

-continued
9-219
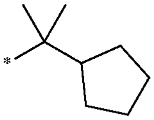
9-220
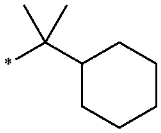
9-221
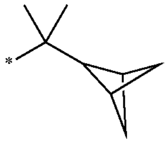
9-222
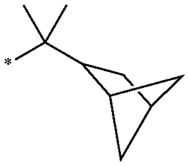
9-223
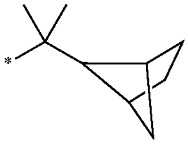
9-224
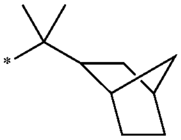
9-225
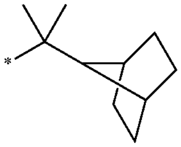
9-226
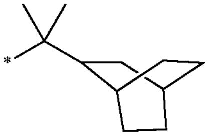
9-227
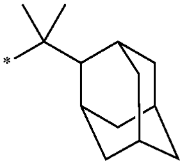
10-1
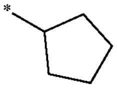
10-2
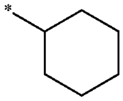
-continued
10-3
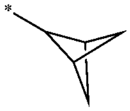
10-4
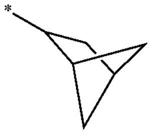
10-5
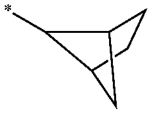
10-6
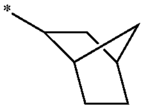
10-7
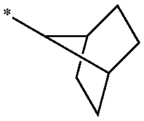
10-8
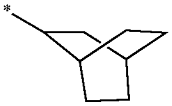
10-9
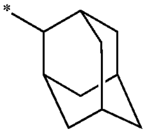
10-10
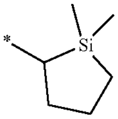
10-11
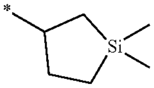
10-12
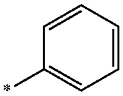
10-13
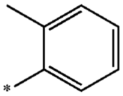
10-14
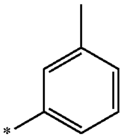

-continued
10-15
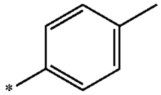
10-16
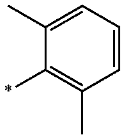
10-17
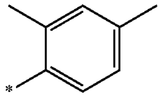
10-18
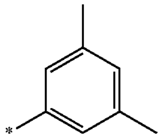
10-19
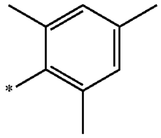
10-20
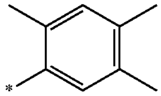
10-21
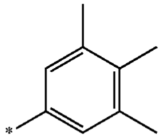
10-22
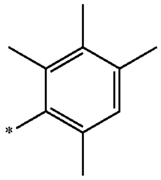
10-23
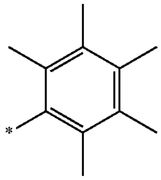
10-24
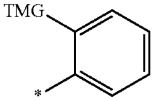
10-25
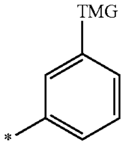
-continued
10-26
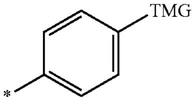
10-27
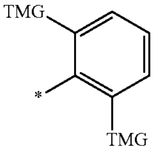
10-28
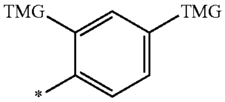
10-29
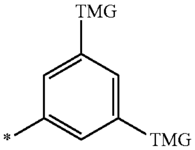
10-30
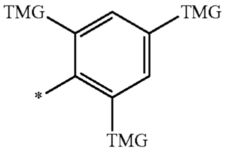
10-31
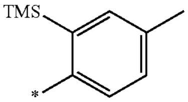
10-32
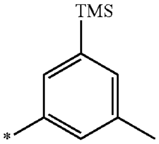
10-33
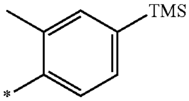
10-34
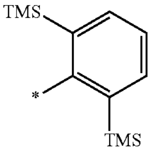
10-35
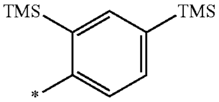
10-36
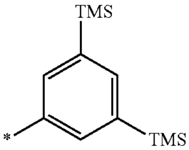

-continued
10-37
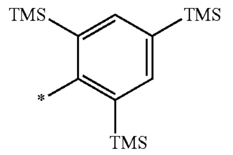
10-38
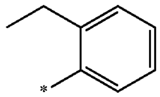
10-39
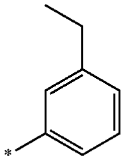
10-40
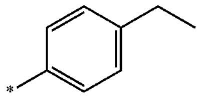
10-41
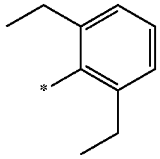
10-42
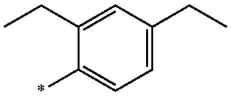
10-43
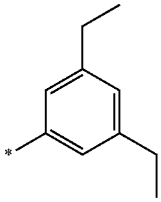
10-44
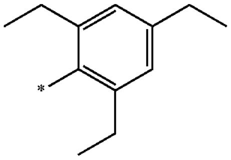
10-45
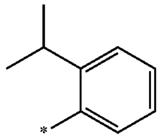
10-46
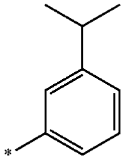
-continued
10-47
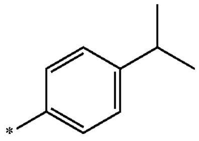
10-48
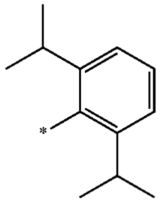
10-49
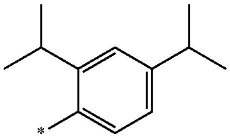
10-50
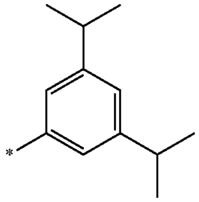
10-51
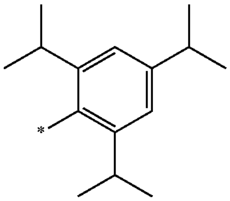
10-52
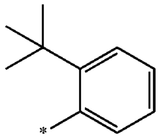
10-53
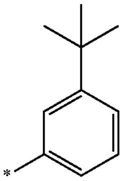
10-54
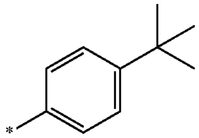

-continued
10-55
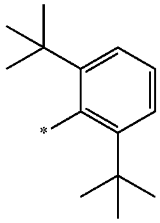
10-56
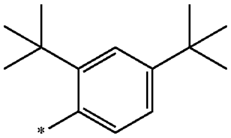
10-57
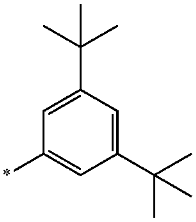
10-58
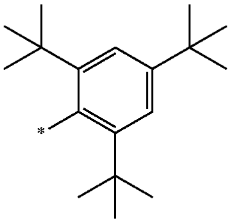
10-59
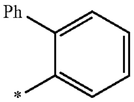
10-60
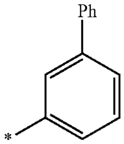
10-61
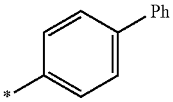
10-62
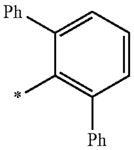
10-63
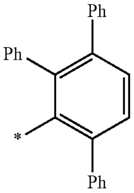
-continued
10-64
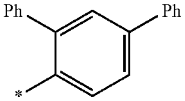
10-65
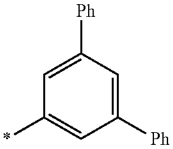
10-66
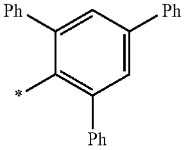
10-67
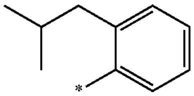
10-68
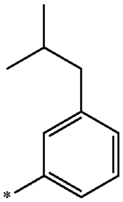
10-69
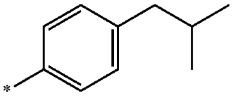
10-70
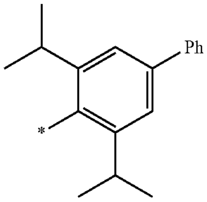
10-71
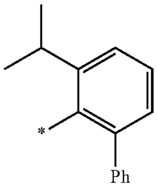
10-72
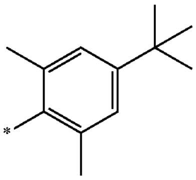
10-73
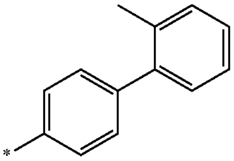

-continued
10-74
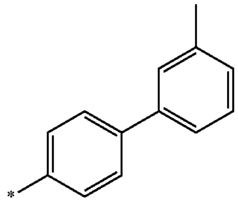
10-75
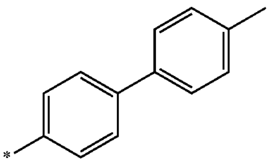
10-76
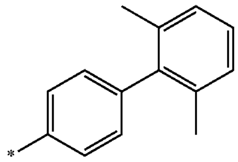
10-77
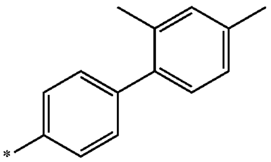
10-78
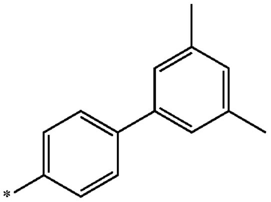
10-79
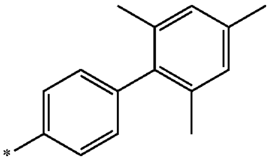
10-80
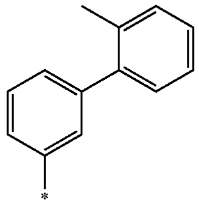
10-81
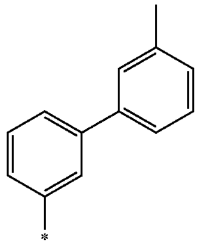
-continued
10-82
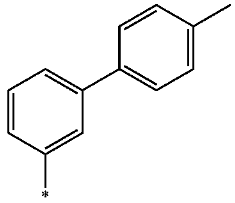
10-83
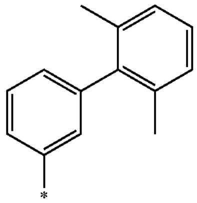
10-84
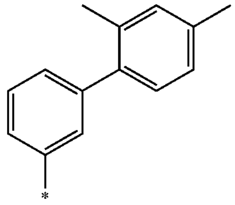
10-85
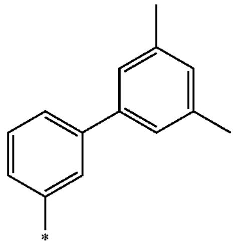
10-86
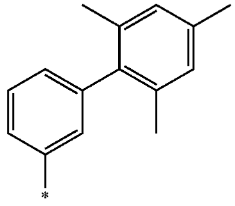
10-87
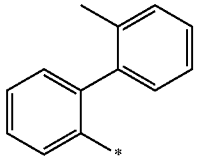
10-88
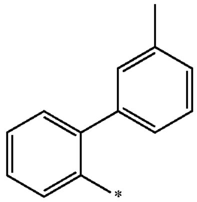

-continued
10-89
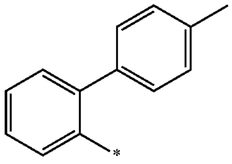
10-90
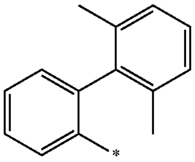
10-91
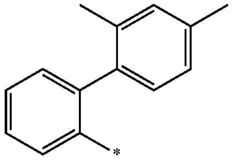
10-92
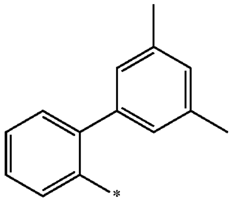
10-93
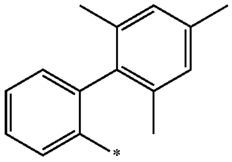
10-94
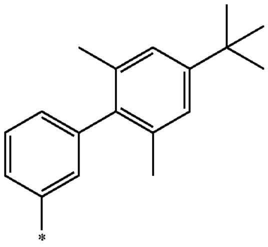
10-95
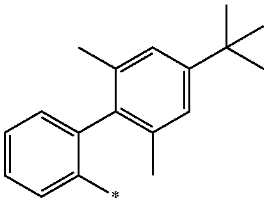
10-96
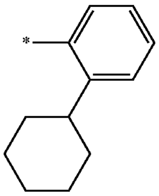
-continued
10-97
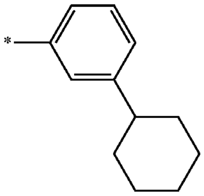
10-98
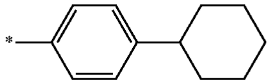
10-99
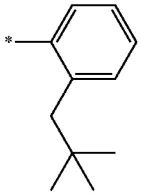
10-100
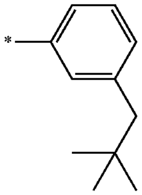
10-101
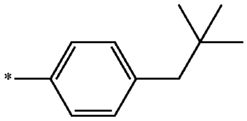
10-102
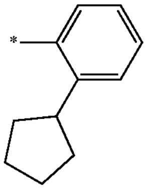
10-103
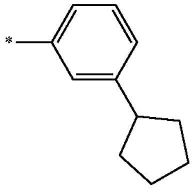
10-104
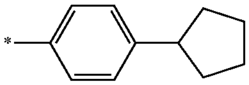
10-105
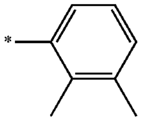
10-106
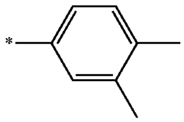

-continued
10-107
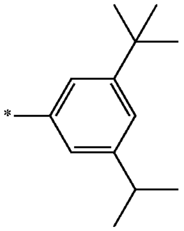
10-108
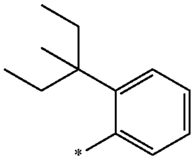
10-109
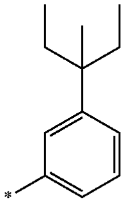
10-110
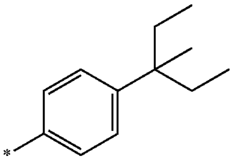
10-111
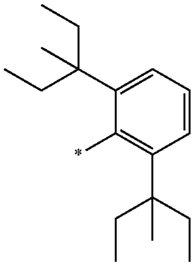
10-112
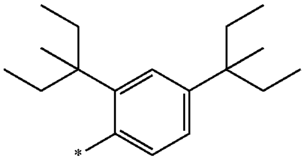
10-113
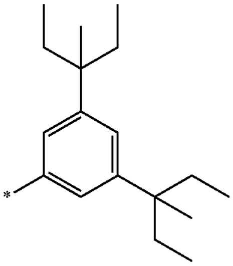
-continued
10-114
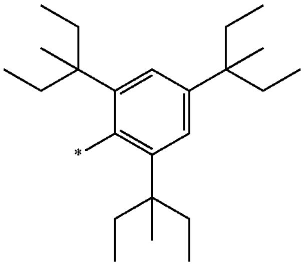
10-115
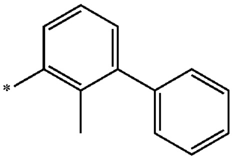
10-116
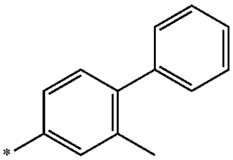
10-117
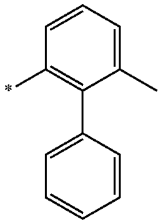
10-118
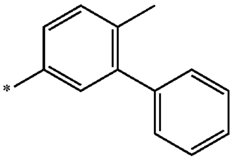
10-119
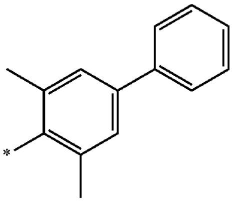
10-120
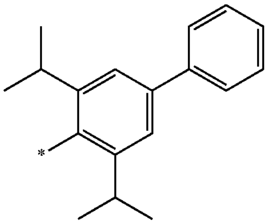
10-121
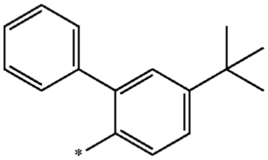

-continued
10-122
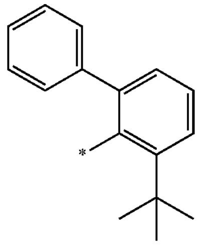
10-123
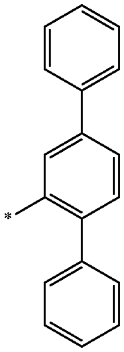
10-124
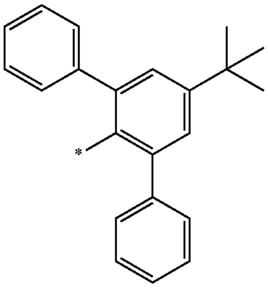
10-125
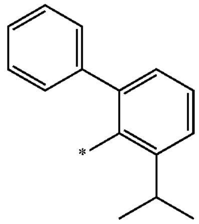
10-126
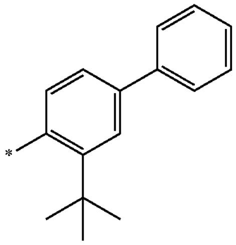
10-127
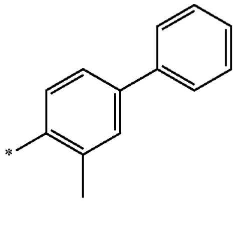
-continued
10-128
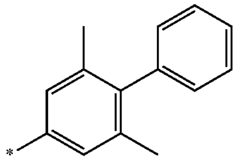
10-129
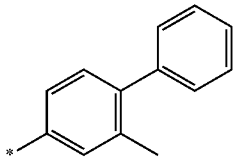
10-201
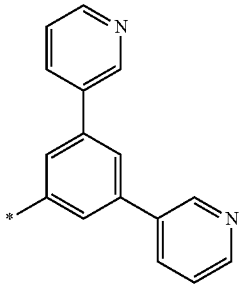
10-202
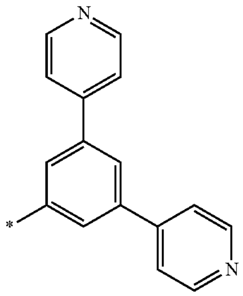
10-203
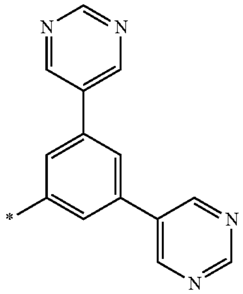

-continued
10-204
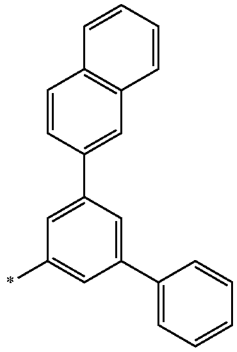
10-205
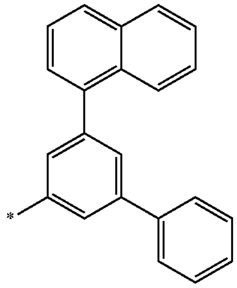
10-206
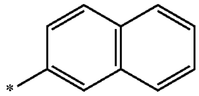
10-207
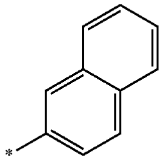
10-208
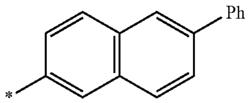
10-209
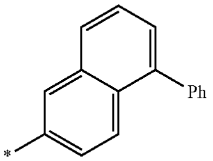
10-210
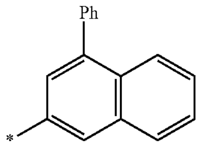
10-211
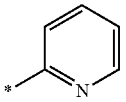
10-212
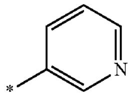
-continued
10-213
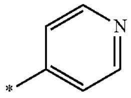
10-214
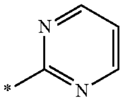
10-215
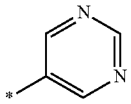
10-216
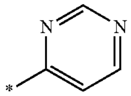
10-217
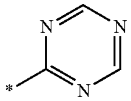
10-218
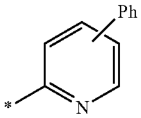
10-219
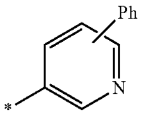
10-220
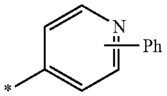
10-221
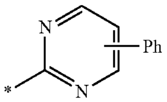
10-222
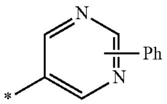
10-223
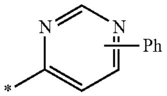
10-224
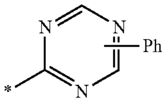
10-225
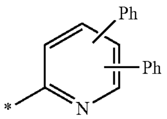

-continued
10-226
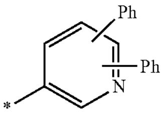
10-227
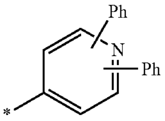
10-228
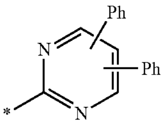
10-229
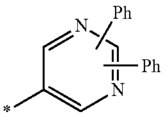
10-230
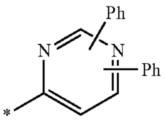
10-231
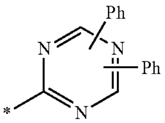
10-232
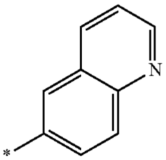
10-233
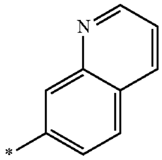
10-234
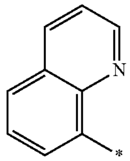
10-235
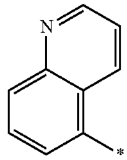
-continued
10-236
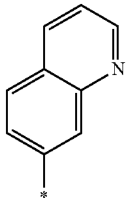
10-237
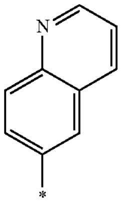
10-238
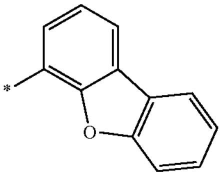
10-239
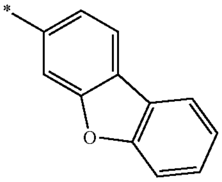
10-240
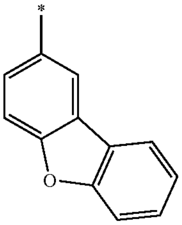
10-241
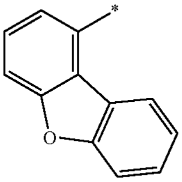
10-242
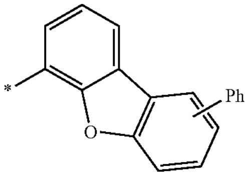
10-243
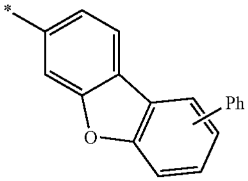

-continued
10-244
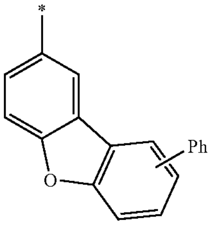
10-245
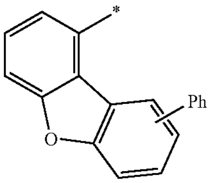
10-246
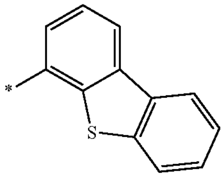
10-247
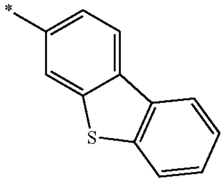
10-248
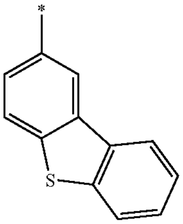
10-249
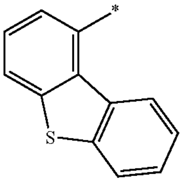
10-250
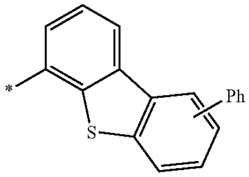
10-251
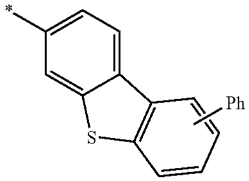
-continued
10-252
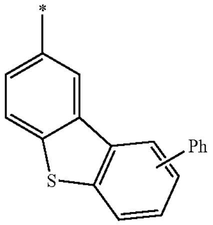
10-253
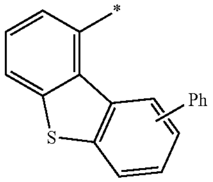
10-254
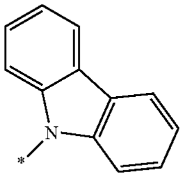
10-255
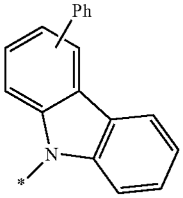
10-256
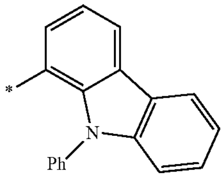
10-257
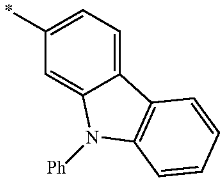
10-258
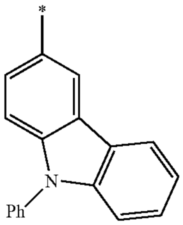
10-259
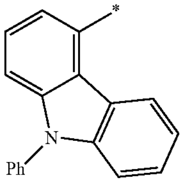

-continued
10-260
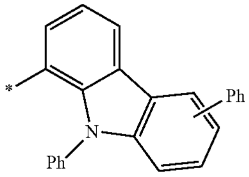
10-261
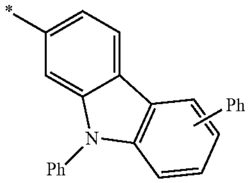
10-262
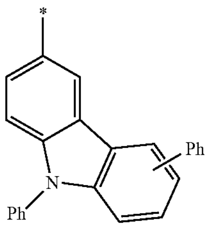
10-263
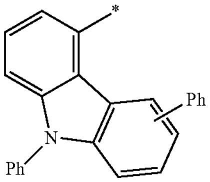
10-264
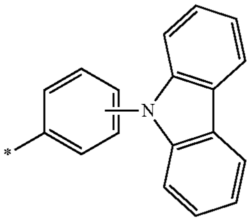
10-265
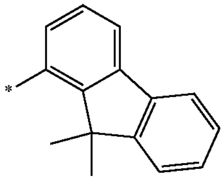
10-266
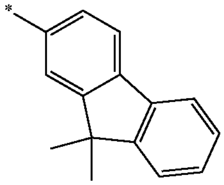
-continued
10-267
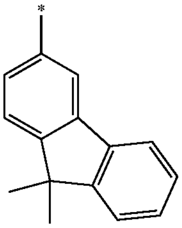
10-268
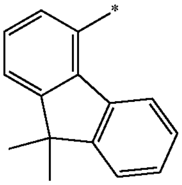
10-269
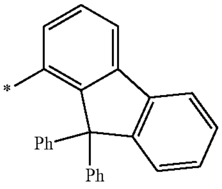
10-270
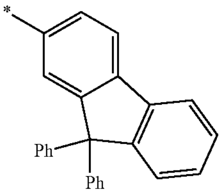
10-271
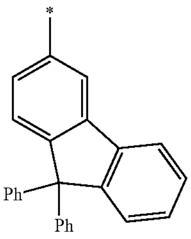
10-272
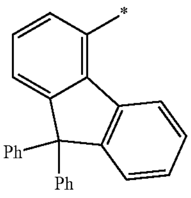
10-273
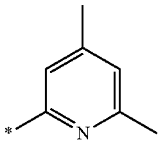
10-274
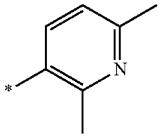

-continued
10-275
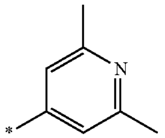
10-276
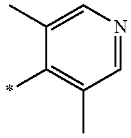
10-277
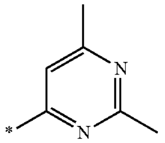
10-278
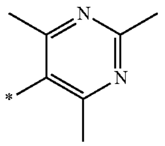
10-279
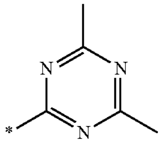
10-280
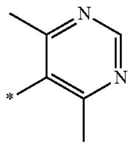
10-281
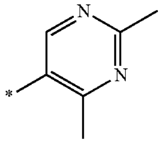
10-282
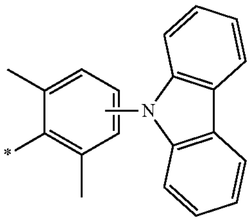
10-283
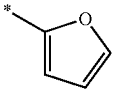
10-284
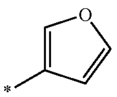
10-285
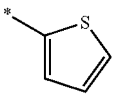
-continued
10-286
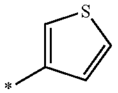
10-287
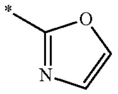
10-288
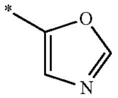
10-289
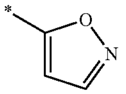
10-290
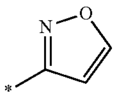
10-291
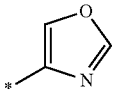
10-292
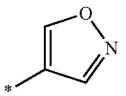
10-293
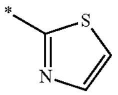
10-294
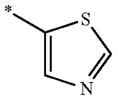
10-295
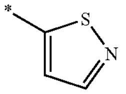
10-296
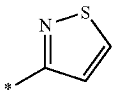
10-297
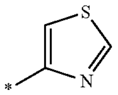
10-298
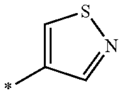
10-299
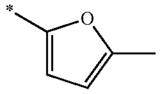
10-300
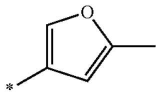

-continued
10-301
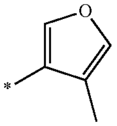
10-302
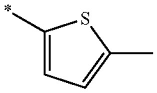
10-303
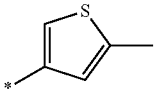
10-304
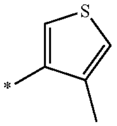
10-305
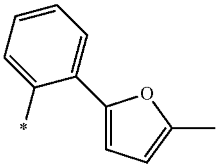
10-306
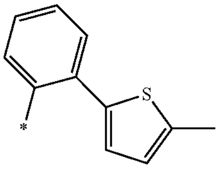
10-307
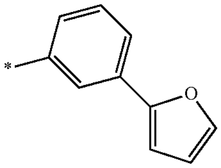
10-308
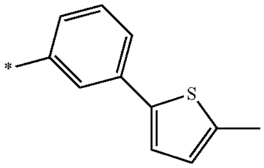
10-309
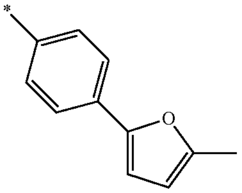
10-310
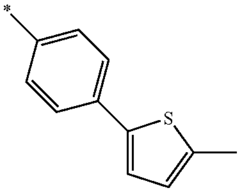
-continued
10-311
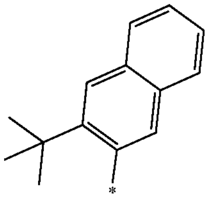
10-312
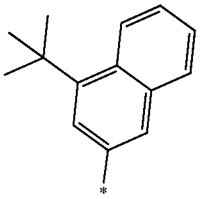
10-313
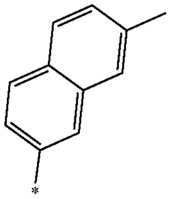
10-314
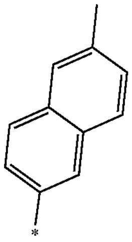
10-315
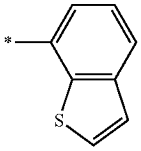
10-316
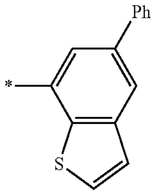
10-317
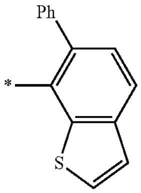
10-318
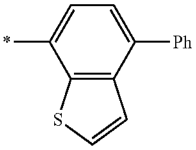

-continued
10-319
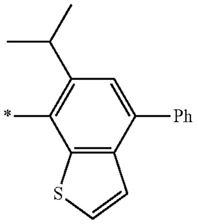
10-320
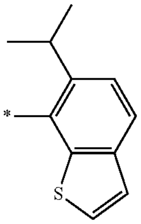
10-321
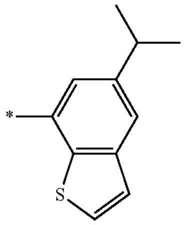
10-322
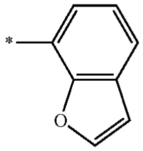
10-323
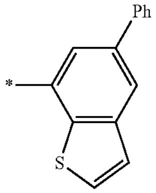
10-324
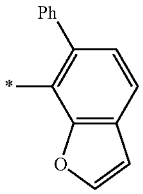
10-325
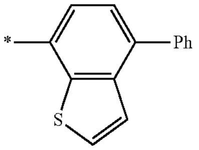
-continued
10-326
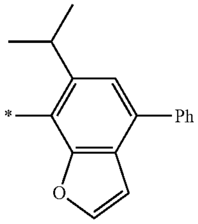
10-327
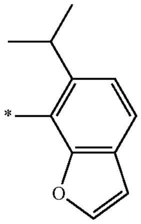
10-328
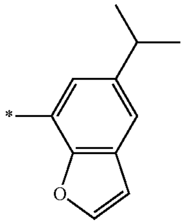
10-329
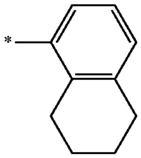
10-330
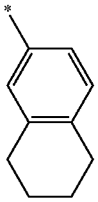
10-331
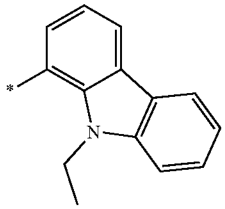
10-332
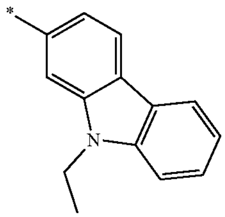

-continued 10-333

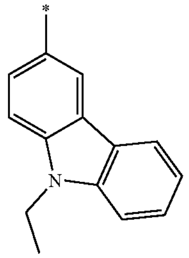

10-334

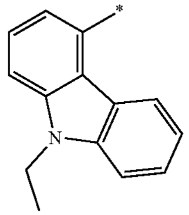

10-335

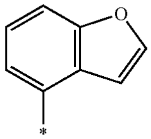

10-336

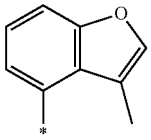

10-337

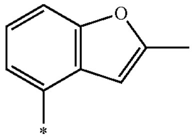

10-338

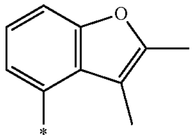

10-339

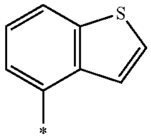

10-340

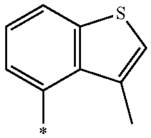

10-341

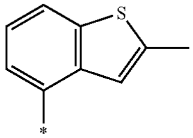

-continued 10-342

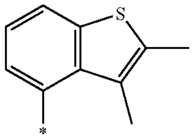

10-343

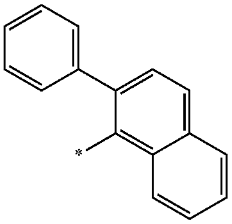

10-344

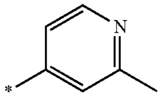

10-345

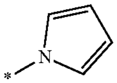

10-346

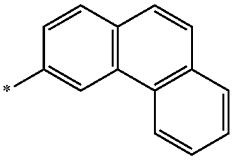

10-347

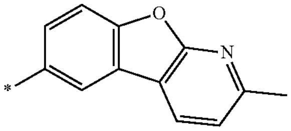

10-348

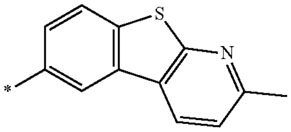

10-349

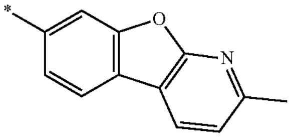

10-350

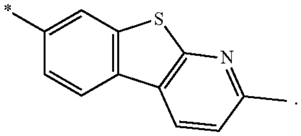

In Formulae 9-1 to 9-39, 9-201 to 9-227, 10-1 to 10-129, and 10-201 to 10-350, * indicates a binding site to a neighboring atom, Ph is a phenyl group, TMS is a trimethylsilyl group, and TMG is a trimethylgermyl group.

The "group represented by one of Formulae 9-1 to 9-39 in which at least one hydrogen is substituted with deuterium" and the "group represented by one of Formulae 9-201 to 9-227 in which at least one hydrogen is substituted with deuterium" may each be, for example, a group represented by one of Formulae 9-501 to 9-514 and 9-601 to 9-636:

9-501
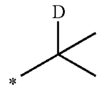
9-502
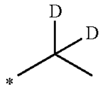
9-503
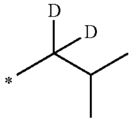
9-504
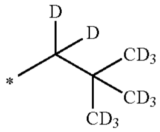
9-505
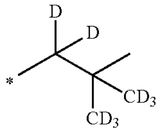
9-506
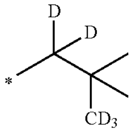
9-507
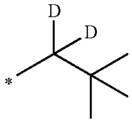
9-508
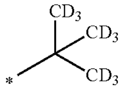
9-509
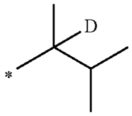
9-510
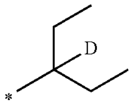
9-511
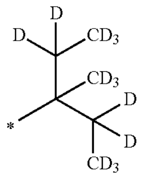
9-512
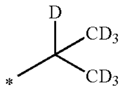
-continued
9-513
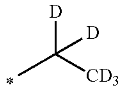
9-514
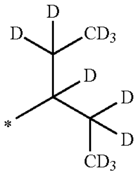
9-601
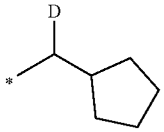
9-602
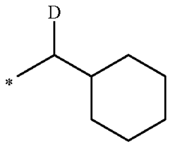
9-603
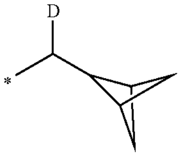
9-604
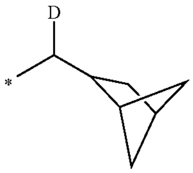
9-605
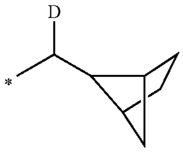
9-606
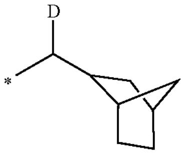
9-607
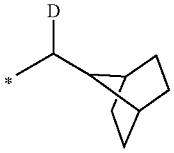
9-608
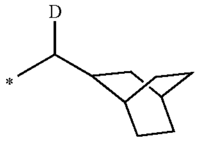

-continued
9-609
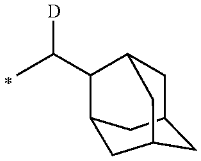
9-610
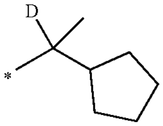
9-611
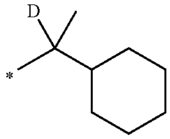
9-612
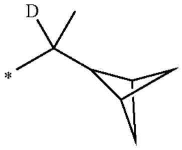
9-613
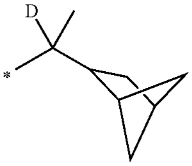
9-614
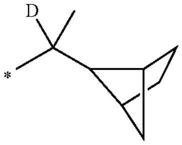
9-615
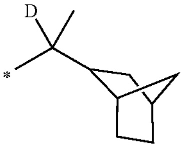
9-616
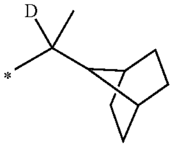
9-617
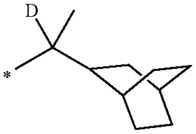
9-618
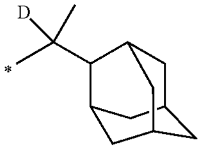
-continued
9-619
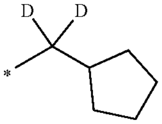
9-620
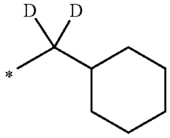
9-621
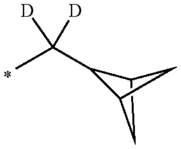
9-622
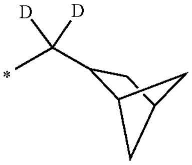
9-623
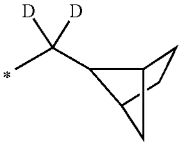
9-624
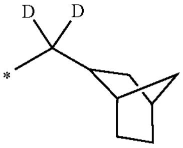
9-625
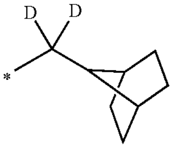
9-626
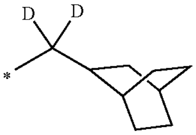
9-627
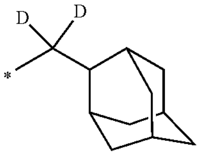
9-628
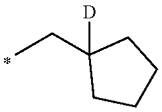

-continued 9-629

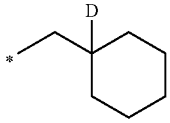

9-630

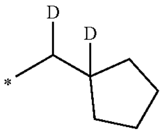

9-631

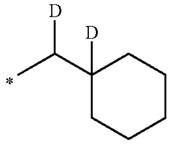

9-632

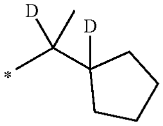

9-633

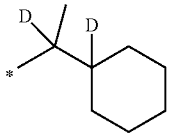

9-634

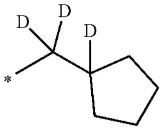

9-635

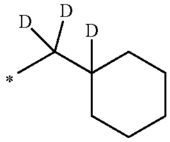

9-636

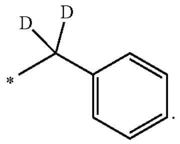

The "group represented by one of Formulae 9-1 to 9-39 in which at least one hydrogen is substituted with —F" and the "group represented by one of Formulae 9-201 to 9-227 in which at least one hydrogen is substituted with —F" may each be, for example, a group represented by one of Formulae 9-701 to 9-710:

9-701

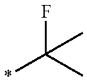

9-702

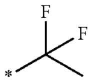

-continued 9-703

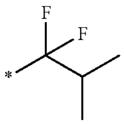

9-704

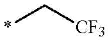

9-705

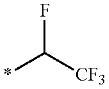

9-706

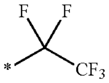

9-707

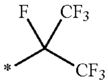

9-708

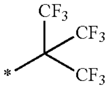

9-709

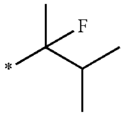

9-710

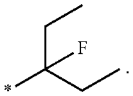

The "group represented by one of Formulae 10-1 to 10-129 in which at least one hydrogen is substituted with deuterium" and the "group represented by one of Formulae 10-201 to 10-350 in which at least one hydrogen is substituted with deuterium" may be, for example, a group represented by one of Formulae 10-501 to 10-553:

10-501

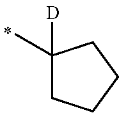

10-502

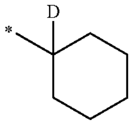

10-503

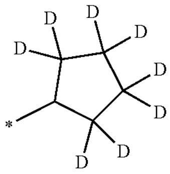

-continued
10-504
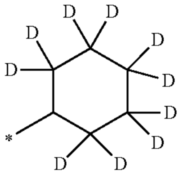
10-505
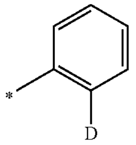
10-506
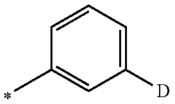
10-507
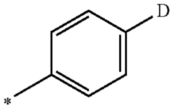
10-508
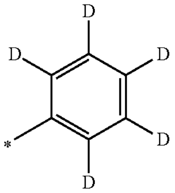
10-509
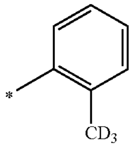
10-510
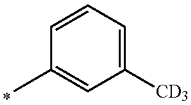
10-511
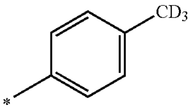
10-512
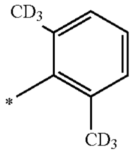
10-513
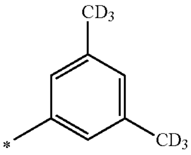
-continued
10-514
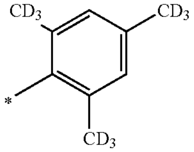
10-515
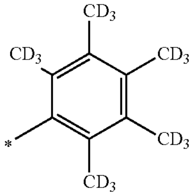
10-516
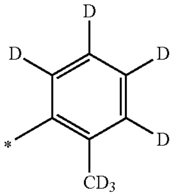
10-517
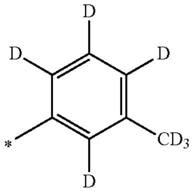
10-518
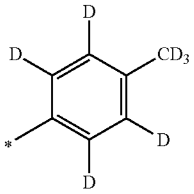
10-519
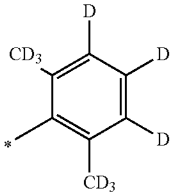
10-520
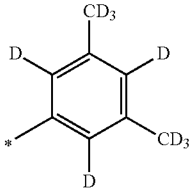
10-521
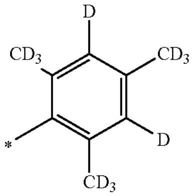

-continued
10-522
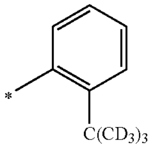
10-523
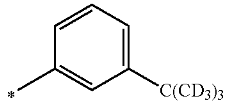
10-524
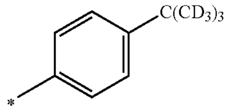
10-525
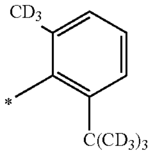
10-526
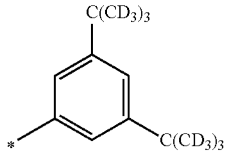
10-527
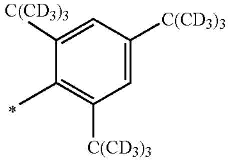
10-528
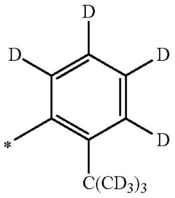
10-529
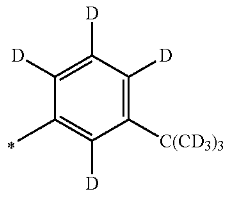
10-530
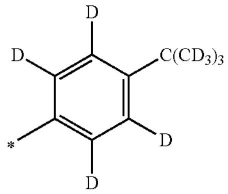
-continued
10-531
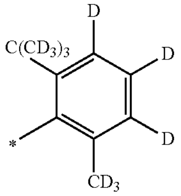
10-532
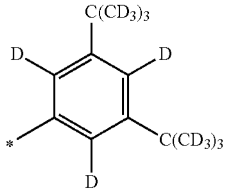
10-533
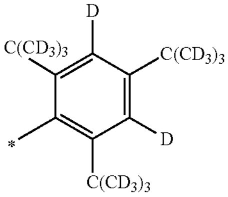
10-534
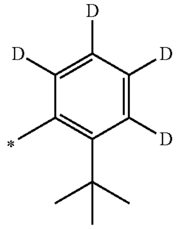
10-535
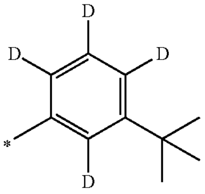
10-536
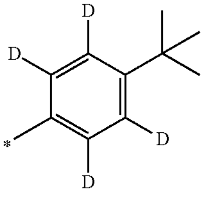
10-537
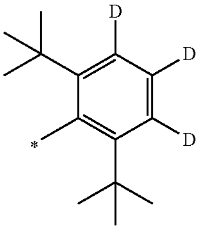

-continued
10-538
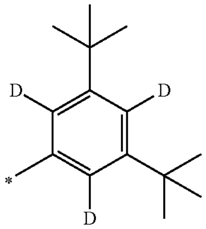
10-540
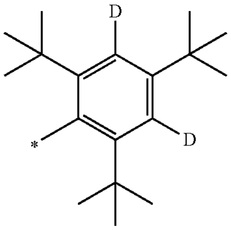
10-541
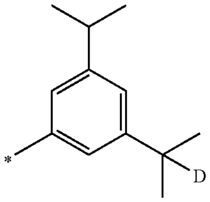
10-542
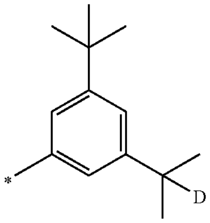
10-543
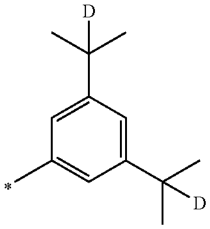
10-544
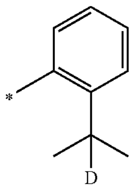
10-545
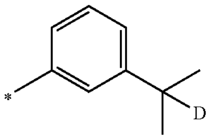
-continued
10-546
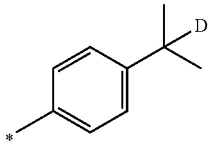
10-547
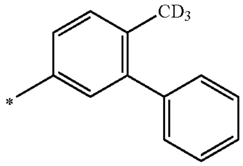
10-548
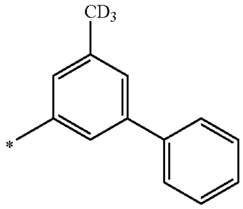
10-549
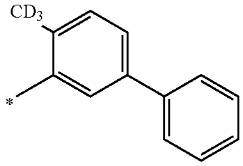
10-550
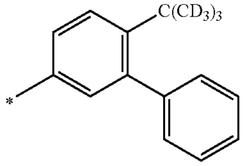
10-551
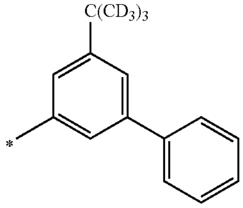
10-552
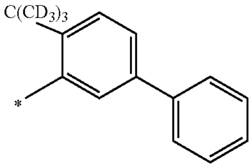
10-553
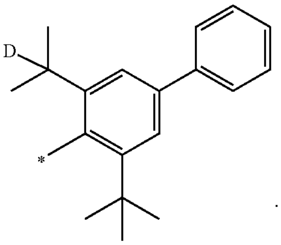
The "group represented by one of Formulae 10-1 to 10-129 in which at least one hydrogen is substituted with —F" and the "group represented by one of Formulae 10-201 to 10-350 in which at least one hydrogen is substituted with —F" may be, for example, a group represented by one of Formulae 10-601 to 10-617:

10-601
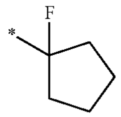

10-602
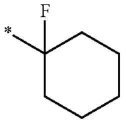

10-603
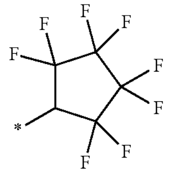

10-604
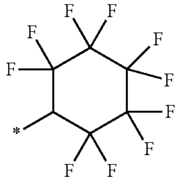

10-605
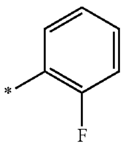

10-606
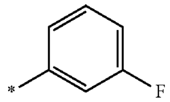

10-607
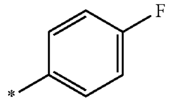

10-608
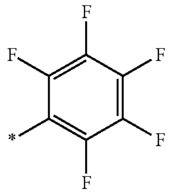

10-609
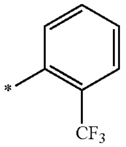

10-610
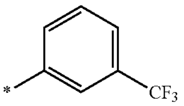

-continued 10-611
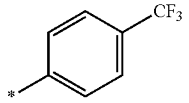

10-612
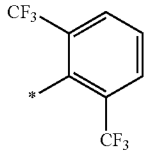

10-613
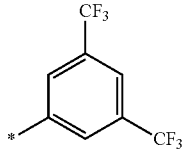

10-614
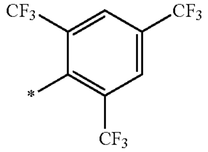

10-615
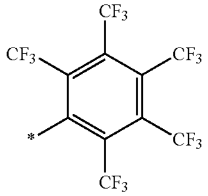

10-616
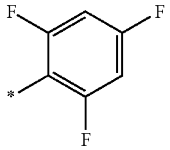

10-617
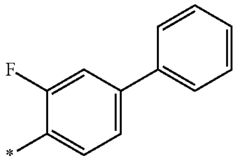

c1 to c4, a1 to a4, e1 to e4, and d1 to d4 in Formulae 1, 2-1, and 2-2 indicate numbers of $R_1$ to $R_4$, a group represented by *-$[(L_1)_{b1}$-$(R_1)_{c1}]$, a group represented by *-$[(L_2)_{b2}$-$(R_2)_{c2}]$, a group represented by *-$[(L_3)_{b3}$-$(R_3)_{c3}]$, a group represented by *-$[(L_4)_{b4}$-$(R_4)_{c4}]$, $Z_1$ to $Z_4$, a group represented by *—$[W_1$—$(Z_1)_{e1}]$, a group represented by *—$[W_2$—$(Z_2)_{e2}]$, a group represented by *—$[W_3$—$(Z_3)_{e3}]$, and a group represented by *—$[W_4$—$(Z_4)_{e4}]$, respectively, and may each independently be an integer from 0 to 20. When c1 is 2 or more, two or more $R_1$ may be identical to or different from each other, when c2 is 2 or more, two or more $R_2$ may be identical to or different from each other, when c3 is 2 or more, two or more $R_3$ may be identical to or different from each other, when c4 is 2 or more, two or more $R_4$ may be identical to or different from each other, when a1 is 2 or more, two or more groups represented by *-$[(L_1)_{b1}$-$(R_1)_{c1}]$ may be identical to or different from each other, when a2 is 2 or more, two or more groups represented by

*-[$(L_2)_{b2}$-$(R_2)_{c2}$] may be identical to or different from each other, when a3 is 2 or more, two or more groups represented by *-[$(L_3)_{b3}$-$(R_3)_{c3}$] may be identical to or different from each other, when a4 is 2 or more, two or more groups represented by *-[$(L_4)_{b4}$-$(R_1)_{c4}$] may be identical to or different from each other, when e1 is 2 or more, two or more $Z_1$ may be identical to or different from each other, when e2 is 2 or more, two or more $Z_2$ may be identical to or different from each other, when e3 is 2 or more, two or more $Z_3$ may be identical to or different from each other, when e4 is 2 or more, two or more $Z_4$ may be identical to or different from each other, when d1 is 2 or more, two or more groups represented by *—[$W_1$—$(Z_1)_{e1}$] may be identical to or different from each other, when d2 is 2 or more, two or more groups represented by *—[$W_2$—$(Z_2)_{e2}$] may be identical to or different from each other, when d3 is 2 or more, two or more groups represented by *—[$W_3$—$(Z_3)_{e3}$] may be identical to or different from each other, and when d4 is 2 or more, two or more groups represented by *—[$W_4$—$(Z_4)_{e1}$] may be identical to or different from each other. For example, c1 to c4, a1 to a4, e1 to e4, and d1 to d4 in Formulae 1, 2-1, and 2-2 may each independently be 0, 1, 2, or 3.

In an embodiment, each of the first dopant and the second dopant may not be tris[2-phenylpyridine]iridium.

In an embodiment, a case where, in Formula 2-1, $Y_1$ is N, ring $A_1$ is a pyridine group, $Y_2$ is C, ring $A_2$ is a benzene group, and each of d1 and d2 is 0 may be excluded.

In Formulae 1, 2-1, and 2-2, at least one of i) two or more of a plurality of $R_1$, ii) two or more of a plurality of $R_2$, iii) two or more of a plurality of $R_3$, iv) two or more of a plurality of $R_4$, v) $R_{5a}$ and $R_{5b}$, vi) two or more of a plurality of $Z_1$, vii) two or more of a plurality of $Z_2$, viii) two or more of a plurality of $Z_3$, ix) two or more of a plurality of $Z_4$, x) two or more of $R_1$ to $R_4$, $R_{5a}$, and $R_{5b}$, and xi) two or more of $Z_1$ to $Z_4$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

For example, in Formulae 1, 2-1, and 2-2, i) two or more of a plurality of $R_1$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of a plurality of $R_2$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iii) two or more of a plurality of $R_3$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iv) two or more of a plurality of $R_4$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, v) $R_{5a}$ and $R_{5b}$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, vi) two or more of a plurality of $Z_1$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, vii) two or more of a plurality of $Z_2$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, viii) two or more of a plurality of $Z_3$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ix) two or more of a plurality of $Z_4$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, x) two or more of $R_1$ to $R_4$, $R_{5a}$, and $R_{5b}$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and/or xi) two or more of $Z_1$ to $Z_4$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

$R_{10a}$ may be the same as described in connection with $R_1$.

* and *' as used herein each indicate a binding site to a neighboring atom, unless otherwise stated.

In an embodiment, in Formula 1, n1 may not be 0, n4 may be 0, and a group represented by

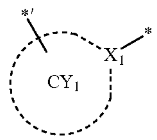

may be a group represented by one of Formulae CY1(1) to CY1(23):

CY1(1)

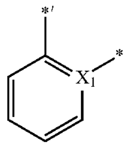

CY1(2)

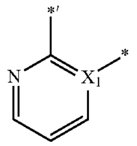

CY1(3)

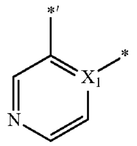

CY1(4)

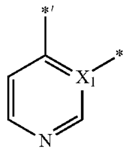

-continued
CY1(5)
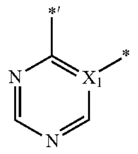
CY1(6)
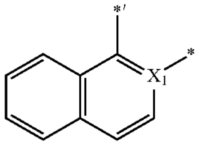
CY1(7)
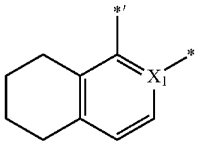
CY1(8)
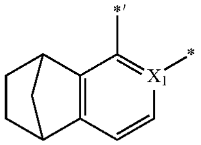
CY1(9)
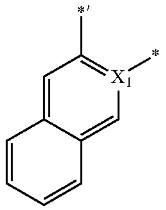
CY1(10)
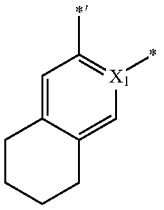
CY1(11)
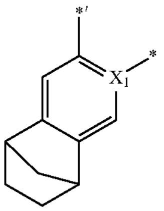
CY1(12)
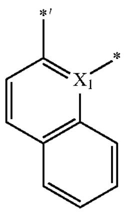
-continued
CY1(13)
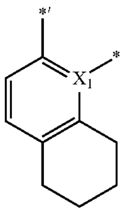
CY1(14)
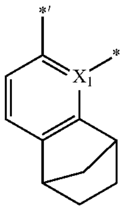
CY1(15)
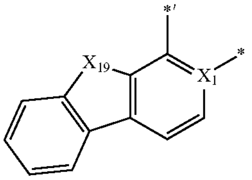
CY1(16)
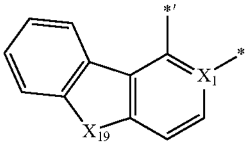
CY1(17)
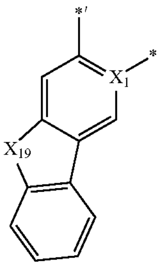
CY1(18)
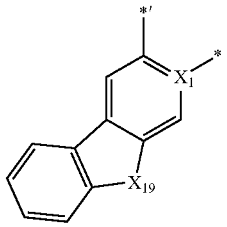
CY1(19)
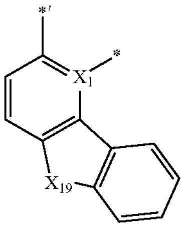

-continued

CY1(20)

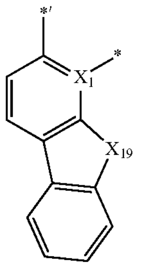

CY1(21)

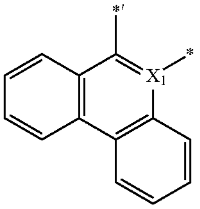

CY1(22)

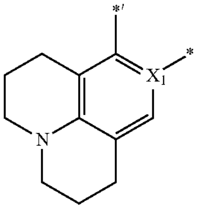

CY1(23)

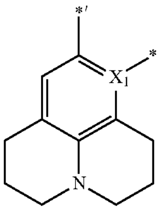

wherein, in Formulae CY1(1) to CY1(23), $X_1$ may be the same as described in the present specification, $X_{19}$ may be O, S, Se, $N(R_{19a})$, $C(R_{19a})(R_{19b})$, or $Si(R_{19a})(R_{19b})$, $R_{19a}$ and $R_{19b}$ may each be the same as described in connection with $R_1$,

*' may indicate a binding site to $X_5$ or $M_1$ in Formula 1, and

*' may indicate a binding site to $T_{11}$ in Formula 1.

In an embodiment, in Formula 1, n1 may be 1, n4 may be 0, and a group represented by

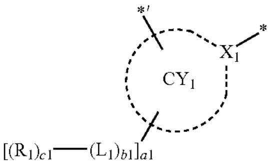

may be a group represented by one of Formulae CY1-1 to CY1-18:

CY1-1

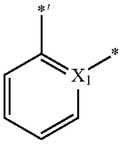

CY1-2

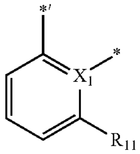

CY1-3

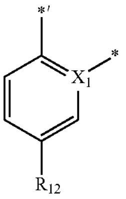

CY1-4

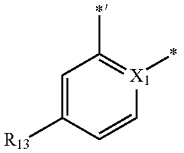

CY1-5

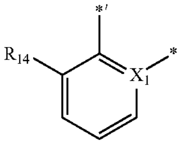

CY1-6

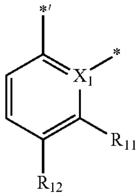

CY1-7

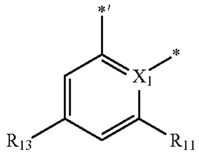

CY1-8

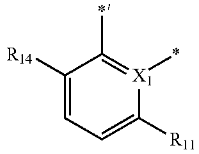

CY1-9

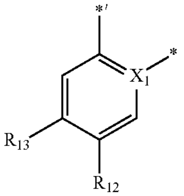

-continued

CY1-10

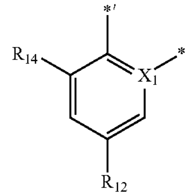

CY1-11

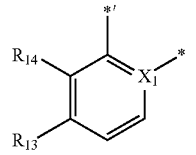

CY1-12

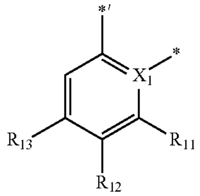

CY1-13

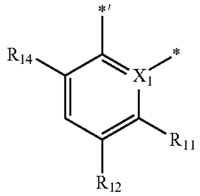

CY1-14

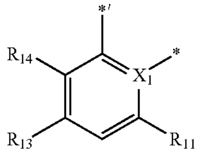

CY1-15

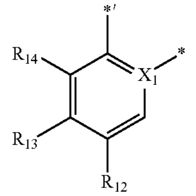

CY1-16

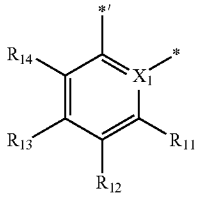

CY1-17

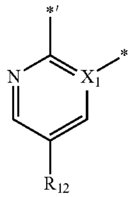

-continued

CY1-18

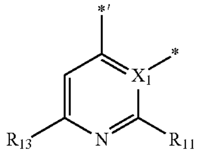

wherein, in Formulae CY1-1 to CY1-18, $X_1$ may be the same as described in the present specification, $R_{11}$ to $R_{14}$ may each be the same as described in connection with $R_1$, wherein each of $R_{11}$ to $R_{14}$ is not hydrogen,

* may indicate a binding site to $X_5$ or $M_1$ in Formula 1, and

*' may indicate a binding site to $T_{11}$ in Formula 1.

In an embodiment, in Formula 1, n1 and n2 may each be 1, and ring $CY_2$ may be a group represented by Formula CY2A or CY2B:

CY2A

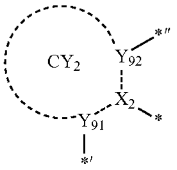

CY2B

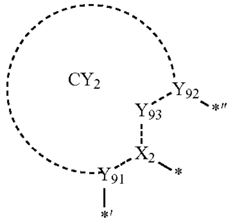

wherein, in Formulae CY2A and CY2B, $X_2$ and ring $CY_2$ may respectively be the same as those described in the present specification, $Y_{91}$ and $Y_{92}$ may each independently be N, C, or Si, and $Y_{93}$ may be O, S, N, C, or Si, a bond between $X_2$ and $Y_{91}$, a bond between $X_2$ and $Y_{92}$, a bond between $X_2$ and $Y_{93}$, and a bond between $Y_{92}$ and $Y_{93}$ in Formulae CY2A and CY2B may each be a chemical bond,

*' may indicate a binding site to $T_{11}$ in Formula 1,

* may indicate a binding site to $X_6$ or $M_1$ in Formula 1, and

*" may indicate a binding site to $T_{12}$ in Formula 1.

In an embodiment, in Formula 1, each of n1 and n2 may not be 0, and a group represented by

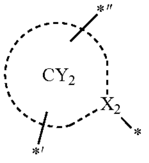

may be a group represented by one of Formulae CY2(1) to CY2(21):

-continued
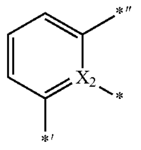
CY2(1)
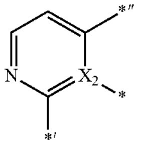
CY2(2)
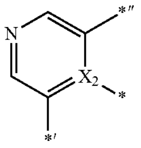
CY2(3)
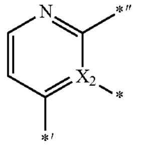
CY2(4)
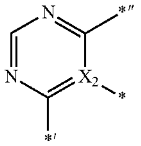
CY2(5)
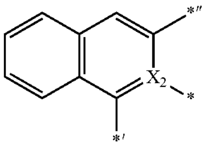
CY2(6)
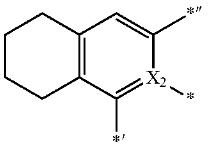
CY2(7)
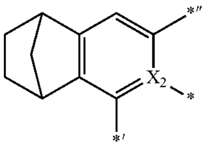
CY2(8)
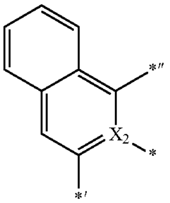
CY2(9)
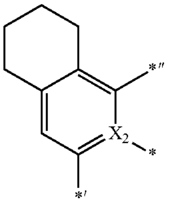
CY2(10)
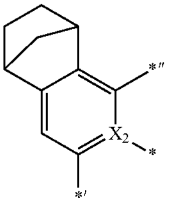
CY2(11)
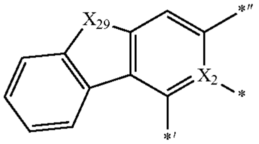
CY2(12)
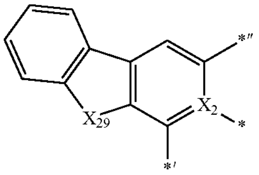
CY2(13)
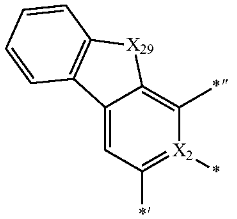
CY2(14)
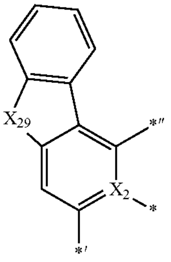
CY2(15)
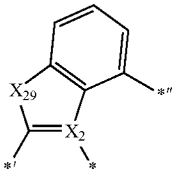
CY2(16)
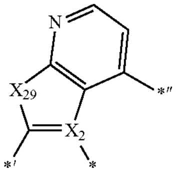
CY2(17)

-continued

CY2(18)

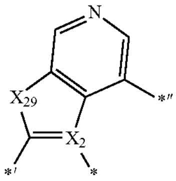

CY2(19)

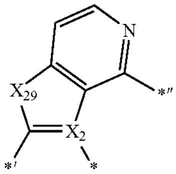

CY2(20)

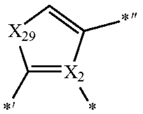

CY2(21)

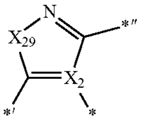

wherein, in Formulae CY2(1) to CY2(21), $X_2$ may be the same as described in the present specification, $X_{29}$ may be O, S, N-[$(L_2)_{b2}$-$(R_2)_{c2}$], $C(R_{29a})(R_{29b})$, or $Si(R_{29a})(R_{29b})$, $L_2$, b2, $R_2$, and c2 may respectively be the same as those described in the present specification, $R_{29a}$ and $R_{29b}$ may each be the same as described in connection with $R_2$,

*' may indicate a binding site to $T_{11}$ in Formula 1,

* may indicate a binding site to $X_6$ or $M_1$ in Formula 1, and

*" may indicate a binding site to $T_{12}$ in Formula 1.

In an embodiment, in Formula 1, each of n1 and n2 may be 1, and a group represented by

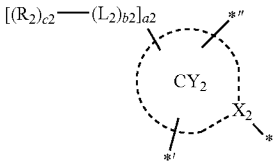

may be a group represented by one of Formulae CY2-1 to CY2-16:

CY2-1

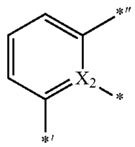

-continued

CY2-2

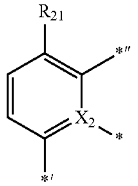

CY2-3

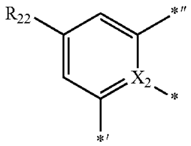

CY2-4

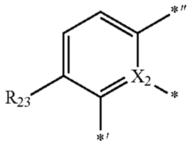

CY2-5

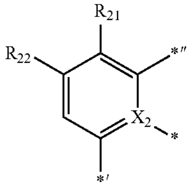

CY2-6

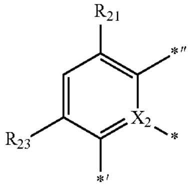

CY2-7

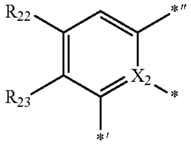

CY2-8

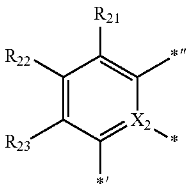

CY2-9

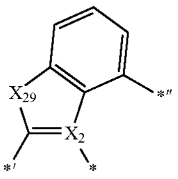

CY2-10

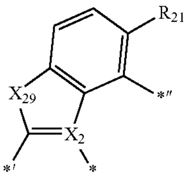

-continued

CY2-11

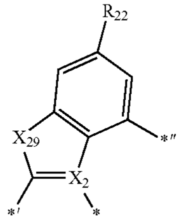

CY2-12

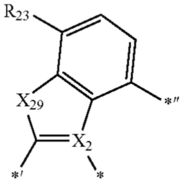

CY2-13

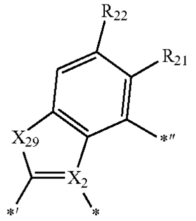

CY2-14

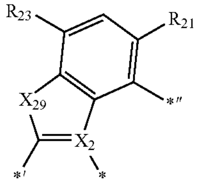

CY2-15

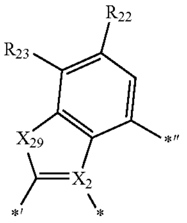

CY2-16

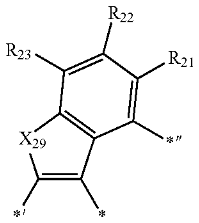

wherein, in Formulae CY2-1 to CY2-16, $X_2$ may be the same as described in the present specification, $X_{29}$ may be O, S, N-[$(L_2)_{b2}$-$(R_2)_{c2}$], $C(R_{29a})(R_{29b})$, or $Si(R_{29a})(R_{29b})$, $L_2$, b2, $R_2$, and c2 may respectively be the same as those described in the present specification, $R_{21}$ to $R_{23}$, $R_{29a}$, and $R_{29b}$ may each be the same as described in connection with $R_2$, wherein each of $R_{21}$ to $R_{23}$ is not hydrogen,

*' may indicate a binding site to $T_{11}$ in Formula 1,

* may indicate a binding site to $X_6$ or $M_1$ in Formula 1, and

*" may indicate a binding site to $T_{12}$ in Formula 1.

In an embodiment, in Formula 1, each of n1 and n2 may be 1, a group represented by

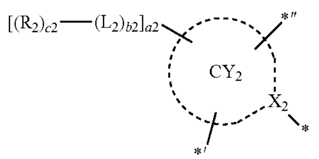

may be a group represented by one of Formulae CY2-9 to CY2-16, $X_{29}$ in Formulae CY2-9 to CY2-16 may be N-[$(L_2)_{b2}$-$(R_2)_{c2}$], $L_2$ may be a benzene group that is unsubstituted or substituted with at least one $R_{10a}$, b2 may be 1 or 2, c2 may be 1 or 2, and when c2 is 1, $R_2$ may be a phenyl group that is unsubstituted or substituted with deuterium, a $C_1$-$C_{20}$ alkyl group, a phenyl group, a deuterated phenyl group, a ($C_1$-$C_{20}$ alkyl)phenyl group, or any combination thereof, and when c2 is 2, a) one of two $R_2$ may be a phenyl group that is unsubstituted or substituted with deuterium, a $C_1$-$C_{20}$ alkyl group, a phenyl group, a deuterated phenyl group, a ($C_1$-$C_{20}$ alkyl)phenyl group, or any combination thereof, and b) the other $R_2$ may be a $C_4$-$C_{20}$ alkyl group or a deuterated $C_1$-$C_{20}$ alkyl group, each unsubstituted or substituted with a $C_3$-$C_{10}$ cycloalkyl group.

In an embodiment in Formula 1, each of n2 and n3 may not be 0, and a group represented by

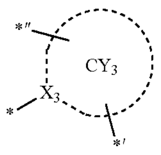

may be a group represented by one of Formulae CY3(1) to CY3(15):

CY3(1)

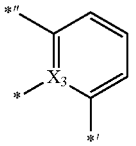

CY3(2)

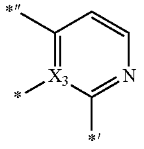

CY3(3)

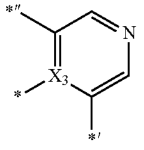

-continued

CY3(4)

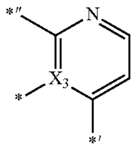

CY3(5)

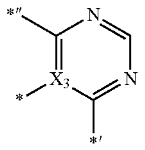

CY3(6)

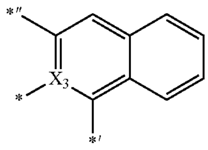

CY3(7)

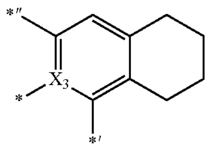

CY3(8)

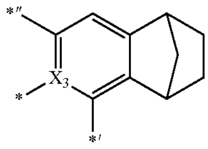

CY3(9)

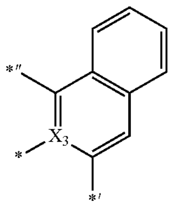

CY3(10)

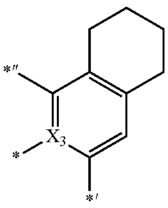

CY3(11)

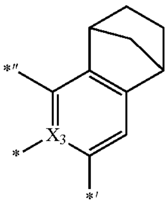

CY3(12)

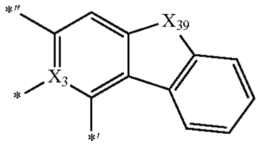

-continued

CY3(13)

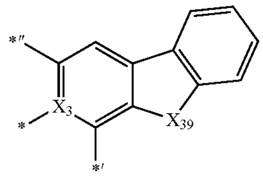

CY3(14)

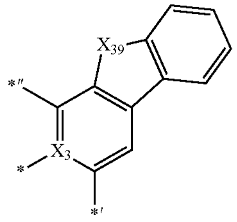

CY3(15)

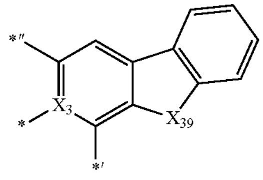

wherein, in Formulae CY3(1) to CY3(15), $X_3$ may be the same as described in the present specification, $X_{39}$ may be O, S, $N(Z_{39a})$, $C(R_{39a})(R_{39b})$, or $Si(R_{39a})(R_{39b})$, $R_{39a}$ and $R_{39b}$ may each be the same as described in connection with $R_3$,

*" may indicate a binding site to $T_{12}$ in Formula 1,

* may indicate a binding site to $X_7$ or $M_1$ in Formula 1, and

*' may indicate a binding site to $T_{13}$ in Formula 1.

In an embodiment, in Formula 1, each of n2 and n3 may be 1, and a group represented by

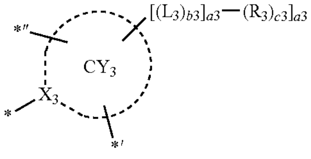

may be represented by one of Formulae CY3-1 to CY3-13:

CY3-1

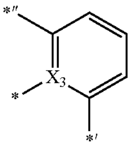

CY3-2

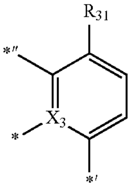

-continued

CY3-3

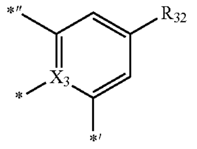

CY3-4

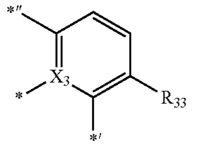

CY3-5

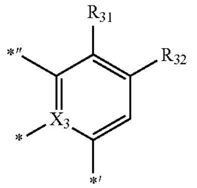

CY3-6

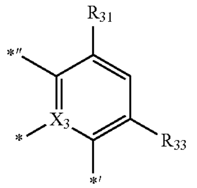

CY3-7

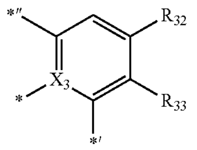

CY3-8

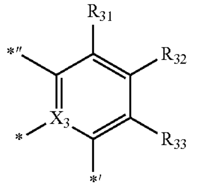

CY3-8

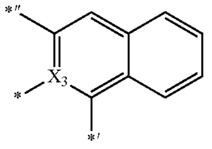

CY3-9

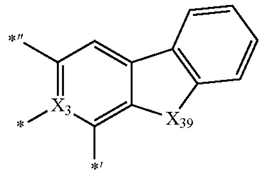

CY3-10

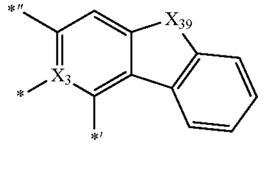

-continued

CY3-11

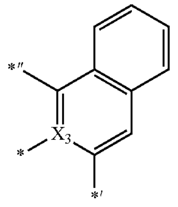

CY3-12

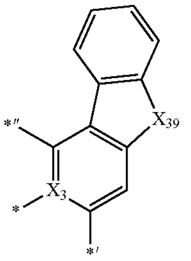

CY3-13

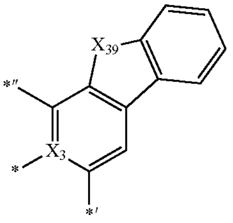

wherein, in Formulae CY3-1 to CY3-13, $X_3$ may be the same as described in the present specification, $X_{39}$ may be O, S, N-[$(L_3)_{b3}$-$(R_3)_{c3}$], C($R_{39a}$)($R_{39b}$), or Si($R_{39a}$)($R_{39b}$), $L_3$, b3, $R_3$, and c3 may respectively be the same as those described in the present specification, $R_{31}$ to $R_{33}$, $R_{39a}$, and $R_{39b}$ may each be the same as described in connection with $R_3$, wherein each of $R_{31}$ to $R_{33}$ is not hydrogen,

*" may indicate a binding site to $T_{12}$ in Formula 1,

* may indicate a binding site to $X_7$ or $M_1$ in Formula 1, and

*' may indicate a binding site to $T_{13}$ in Formula 1.

In an embodiment, in Formula 1, n3 may not be 0, n4 may be 0, and a group represented by

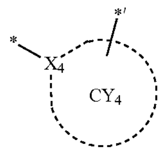

may be represented by one of Formulae CY4(1) to CY4(20):

CY4(1)

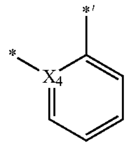

-continued
CY4(2)
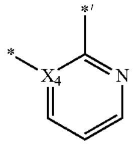
CY4(3)
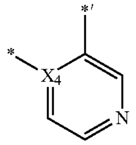
CY4(4)
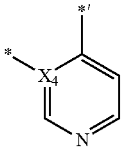
CY4(5)
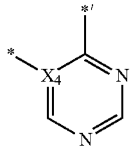
CY4(6)
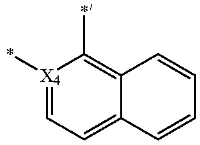
CY4(7)
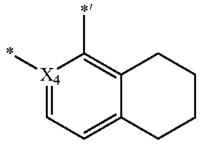
CY4(8)
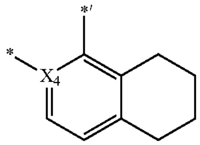
CY4(9)
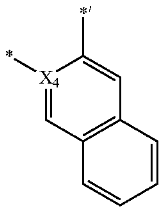
CY4(10)
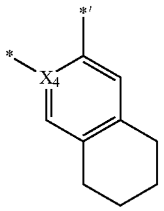
-continued
CY4(11)
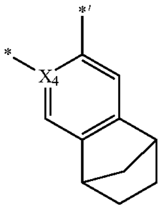
CY4(12)
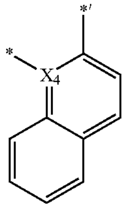
CY4(13)
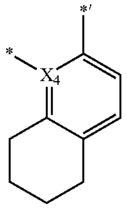
CY4(14)
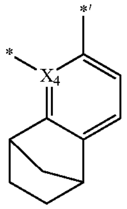
CY(15)
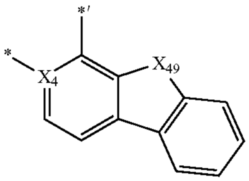
CY4(16)
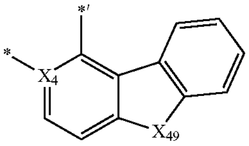
CY4(17)
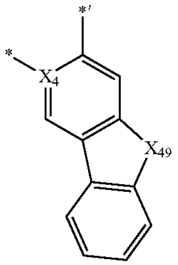

-continued

CY4(18)

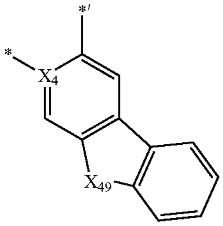

CY4(19)

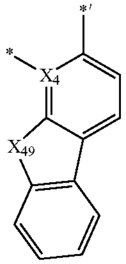

CY4(20)

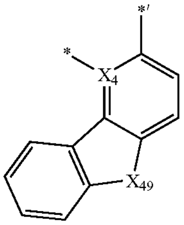

wherein, in Formulae CY4(1) to CY4(20), $X_4$ may be the same as described in the present specification, $X_{49}$ may be O, S, $N(R_{49a})$, $C(R_{49a})(R_{49b})$, or $Si(R_{49a})(R_{49b})$, $R_{49a}$ and $R_{49b}$ may each be the same as described in connection with $R_4$,

*' may indicate a binding site to $T_{13}$ in Formula 1, and

* may indicate a binding site to $X_8$ or $M_1$ in Formula 1.

In an embodiment, in Formula 1, n3 may be 1, n4 may be 0, and a group represented by

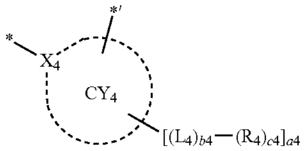

may be a group represented by one of Formulae CY4-1 to CY4-16:

CY4-1

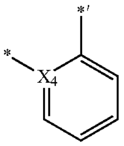

-continued

CY4-2

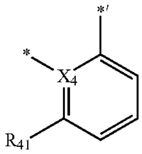

CY4-3

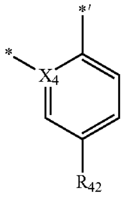

CY4-4

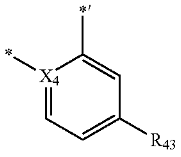

CY4-5

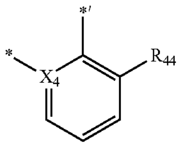

CY4-6

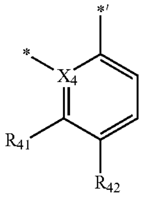

CY4-7

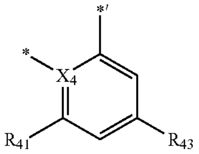

CY4-8

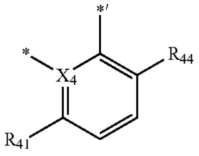

CY4-9

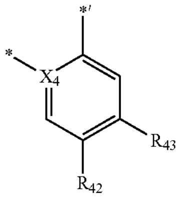

-continued

CY4-10

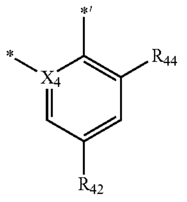

CY4-11

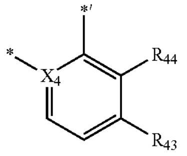

CY4-12

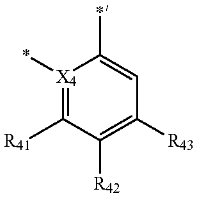

CY4-13

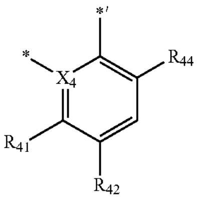

CY4-14

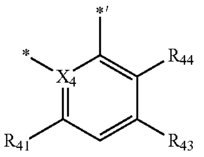

CY4-15

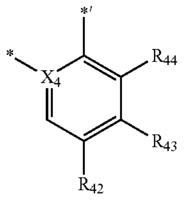

CY4-16

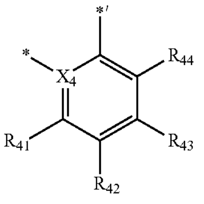

wherein, in Formulae CY4-1 to CY4-16, $X_4$ may be the same as described in the present specification, $R_{41}$ to $R_{44}$ may each be the same as described in connection with $R_4$, wherein each of $R_{41}$ to $R_{44}$ is not hydrogen,

*' may indicate a binding site to $T_{13}$ in Formula 1, and

* may indicate a binding site to $X_8$ or $M_1$ in Formula 1.

In an embodiment, the organometallic compound represented by Formula 1 may be a compound represented by one of Formulae 1-1 to 1-3:

1-1

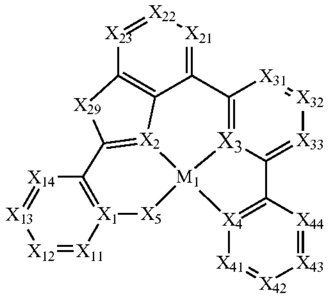

1-2

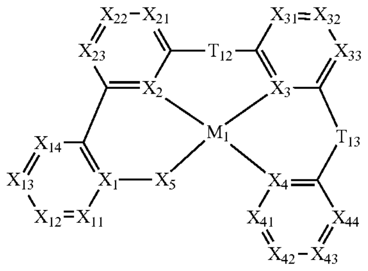

1-3

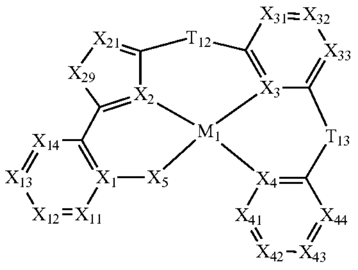

wherein, in Formulae 1-1 to 1-3, $M_1$, $X_1$ to $X_5$, $T_{12}$, and $T_{13}$ may respectively be the same as those described in the present specification, $X_{11}$ may be N or $C(R_{11})$, $X_{12}$ may be N or $C(R_{12})$, $X_{13}$ may be N or $C(R_{13})$, and $X_{14}$ may be N or $C(R_{14})$, $R_1$ to $R_{14}$ may each be the same as described in connection with $R_1$, or two or more of $R_1$ to $R_{14}$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{21}$ may be N or $C(R_{21})$, $X_{22}$ may be N or $C(R_{22})$, and $X_{23}$ may be N or $C(R_{23})$, $X_{29}$ may be O, S, $N-[(L_2)_{b2}-(R_2)_{c2}]$, $C(R_{29a})(R_{29b})$, or $Si(R_{29a})(R_{29b})$, $L_2$, b2, $R_2$, and c2 may respectively be the same as those described in the present specification, $R_{21}$ to $R_{23}$, $R_{29a}$, and $R_{29b}$ may each be the same as described in connection with $R_2$, or two or more of $R_{21}$ to $R_{23}$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{31}$ may be N or $C(R_{31})$, $X_{32}$ may be N or $C(R_{32})$, and $X_{33}$ may be N or $C(R_{33})$, $R_{31}$ to $R_{33}$ may each be the same as described in connection with $R_3$, or two or more of $R_{31}$ to $R_{33}$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{41}$ may be N or $C(R_{41})$, $X_{42}$ may be N or $C(R_{42})$, $X_{43}$ may be N or $C(R_{43})$, and $X_{44}$ may be N or $C(R_{44})$, $R_{41}$ to $R_{44}$ may each be the same as described in connection with $R_4$, or two or more of $R_{41}$ to $R_{44}$ may optionally be bonded to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

In an embodiment, $Y_1$ in Formula 2-1 may be N, and a group represented by

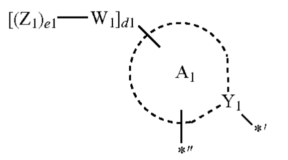

in Formula 2-1 may be a group represented by one of Formulae A1-1 to A1-3:

A1-1

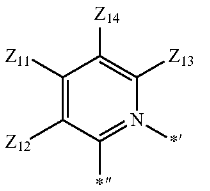

A1-2

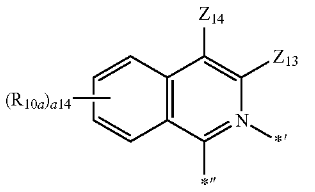

A1-3

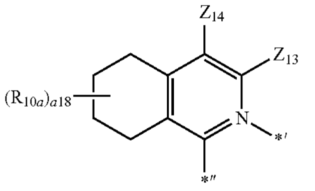

wherein, in Formulae A1-1 to A1-3, $Z_{11}$ to $Z_{14}$ may each be the same as described in connection with $Z_1$, $R_{10a}$ may be the same as described in the present specification, a14 may be an integer from 0 to 4, a18 may be an integer from 0 to 8,

*' may indicate a binding site to $M_2$ in Formula 2, and

*" may indicate a binding site to ring $A_2$.

For example, at least one of $Z_{11}$, $Z_{12}$, and $Z_{14}$ (for example, $Z_{14}$) in Formulae A1-1 to A1-3 may be:

a $C_1$-$C_{20}$ alkyl group that is unsubstituted or substituted with deuterium, —F, a phenyl group, or any combination thereof;

—$Si(Q_3)(Q_4)(Q_5)$; or

—$Ge(Q_3)(Q_4)(Q_5)$.

In an embodiment, $Y_3$ in Formula 2-2 may be N, and a group represented by

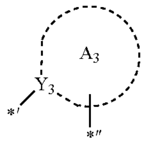

in Formula 2-2 may be a group represented by one of Formulae NR1 to NR48:

NR1

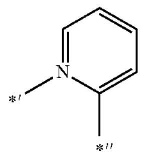

NR2

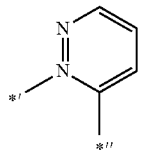

NR3

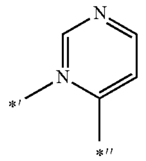

NR4

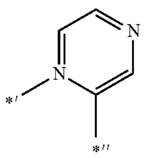

NR5

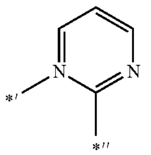

NR6

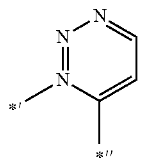

-continued
NR7
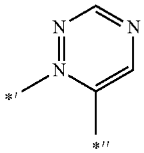
NR8
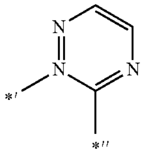
NR9
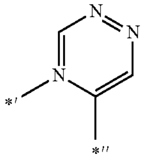
RN10
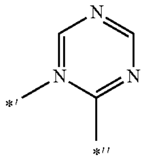
NR11
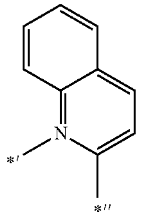
NR12
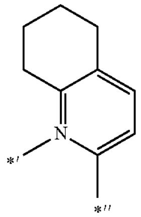
NR13
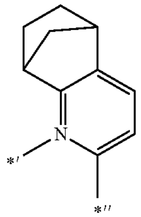
NR14
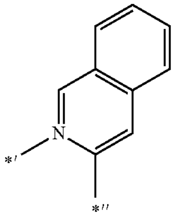
-continued
NR15
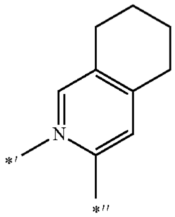
NR16
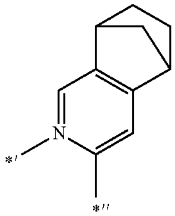
NR17
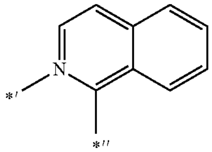
NR18
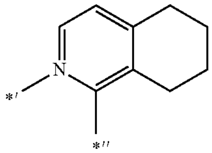
NR19
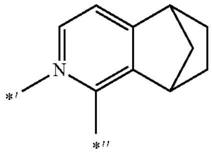
NR20
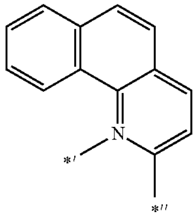
NR21
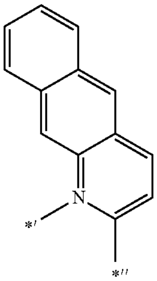

-continued
NR22
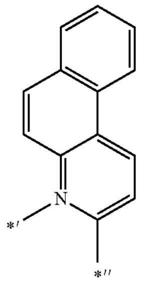
NR23
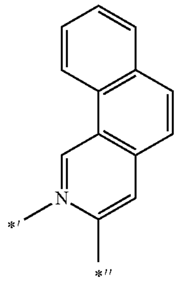
NR24
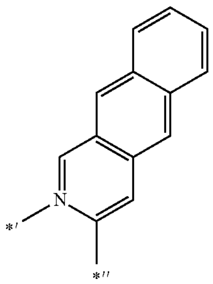
NR25
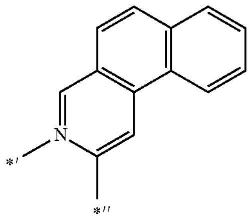
NR26
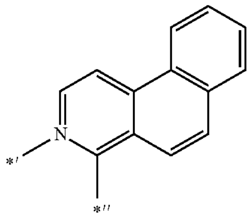
NR27
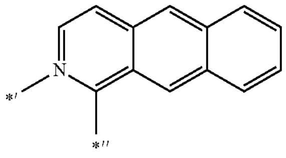
-continued
NR28
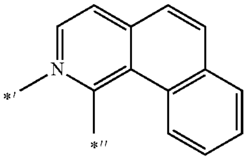
NR29
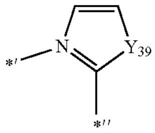
NR30
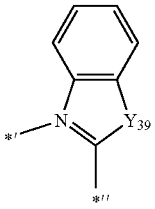
NR31
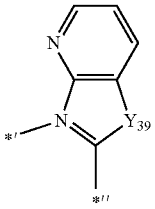
NR32
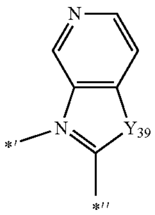
NR33
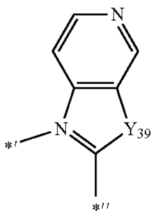
NR34
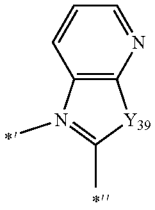

-continued
NR35
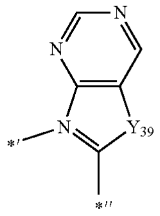
NR36
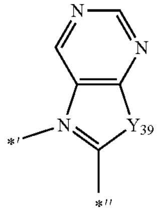
NR37
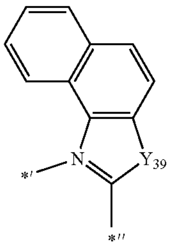
NR38
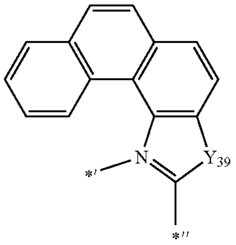
NR39
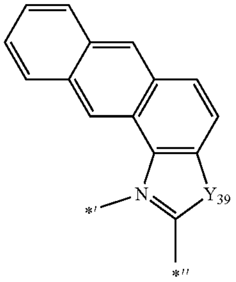
NR40
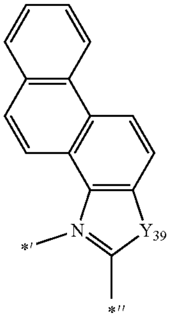
-continued
NR41
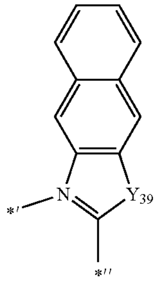
NR42
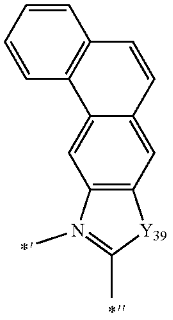
NR43
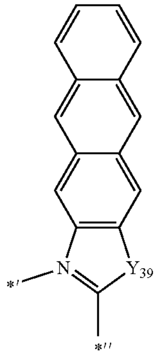
NR44
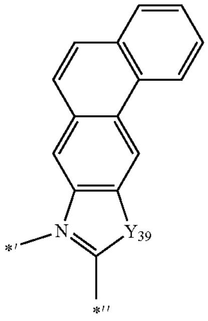
NR45
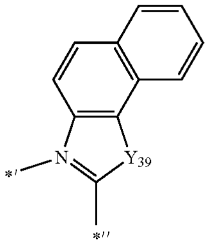

-continued

NR46

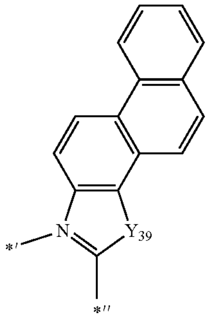

NR47

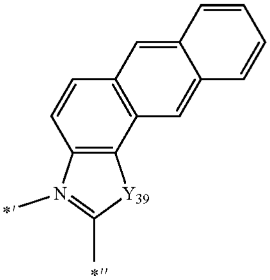

NR48

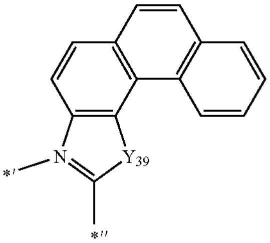

wherein, in Formulae NR1 to NR48, $Y_{39}$ may be O, S, Se, N—[$W_3$—$(Z_3)_{e3}$], C($Z_{39a}$)($Z_{39b}$), or Si($Z_{39a}$)($Z_{39b}$), $W_3$, $Z_3$, and e3 may respectively be the same as those described in the present specification, and $Z_{39a}$ and $Z_{39b}$ may each be the same as described in connection with $Z_3$,

*' may indicate a binding site to $M_2$ in Formula 2, and *" may indicate a binding site to ring $A_4$.

In an embodiment, each of $Y_2$ and $Y_4$ in Formulae 2-1 and 2-2 may be C, and a group represented by

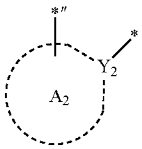

in Formula 2-1 and a group represented by

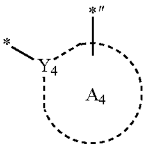

in Formula 2-2 may each independently be a group represented by one of Formulae CR1 to CR29:

CR1

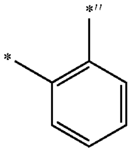

CR2

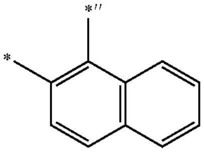

CR3

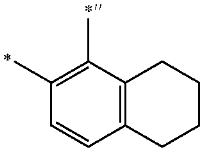

CR4

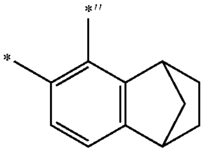

CR5

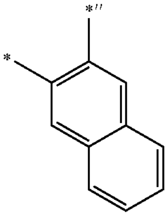

CR6

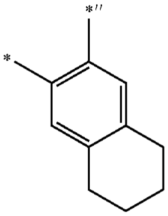

CR7

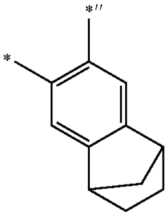

-continued
CR8
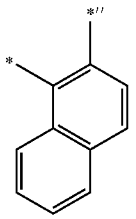
CR9
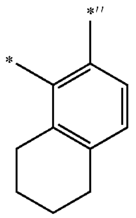
CR10
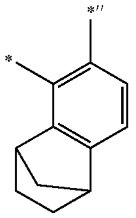
CR11
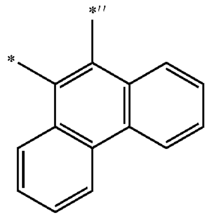
CR12
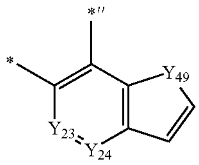
CR13
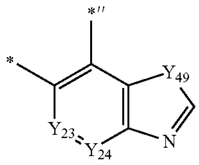
CR14
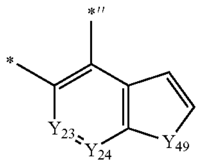
CR15
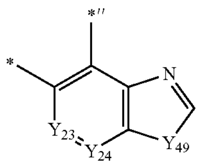
-continued
CR16
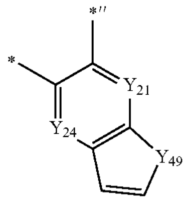
CR17
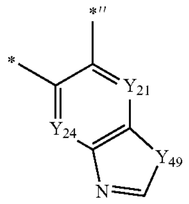
CR18
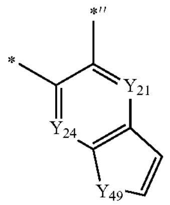
CR19
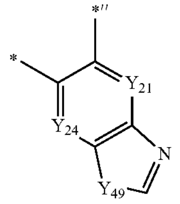
CR20
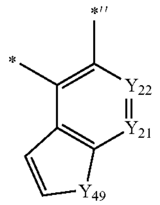
CR21
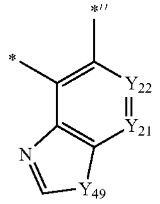
CR22
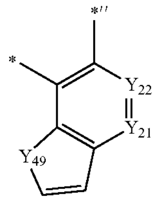

-continued

CR23

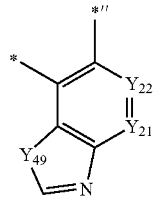

CR24

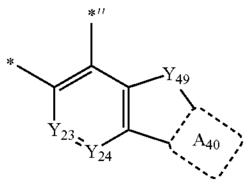

CR25

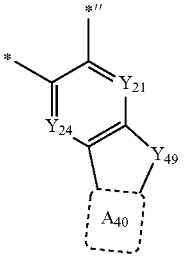

CR26

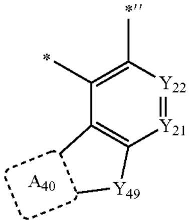

CR27

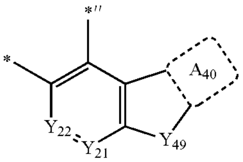

CR28

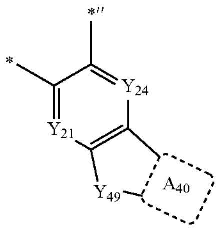

CR29

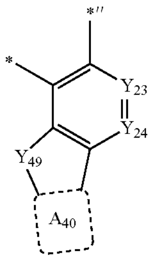

wherein, in Formulae CR1 to CR29, $Y_{49}$ may be O, S, Se, N—[$W_2$—$(Z_2)_{e2}$], N—[$W_4$—$(Z_4)_{e4}$], C($Z_{29a}$)($Z_{29b}$), C($Z_{49a}$)($Z_{49b}$), Si($Z_{29a}$)($Z_{29b}$), or Si($Z_{49a}$)($Z_{49b}$), $W_2$, $W_4$, $Z_2$, $Z_4$, e2, and e4 may respectively be the same as those described in the present specification, $Z_{29a}$ and $Z_{29b}$ may each be the same as described in connection with $Z_2$, and $Z_{49a}$ and $Z_{49b}$ may each be the same as described in connection with $Z_4$, $Y_{21}$ to $Y_{24}$ may each independently be N or C, ring $A_{40}$ may be a $C_5$-$C_{30}$ carbocyclic group or a $C_1$-$C_{30}$ heterocyclic group (for example, a benzene group, a naphthalene group, an anthracene group, a phenanthrene group, a pyridine group, a pyrimidine group, a pyrazine group, a pyridazine group, a quinoline group, an isoquinoline group, a benzoquinoline group, a benzoisoquinoline group, a quinoxaline group, a benzoquinoxaline group, a quinazoline group, or a benzoquinazoline group),

* may indicate a binding site to $M_2$ in Formula 2, and

*" may indicate a binding site to ring $A_1$ or ring $A_3$.

In an embodiment, a group represented by

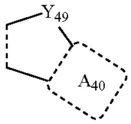

in Formulae CR24 to CR29 may be a group represented by one of Formulae CR(1) to CR(13):

CR(1)

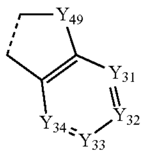

CR(2)

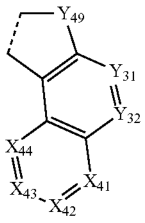

CR(3)

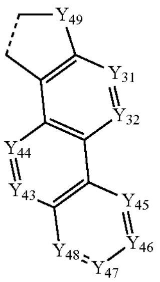

-continued

CR(4)

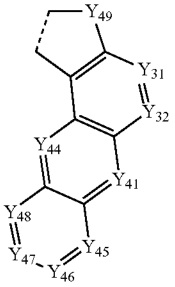

CR(5)

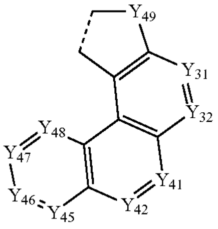

CR(6)

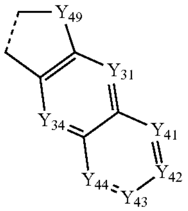

CR(7)

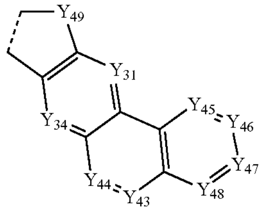

CR(8)

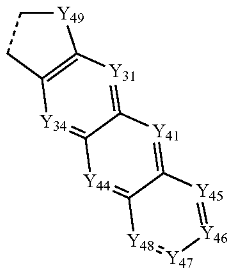

CR(9)

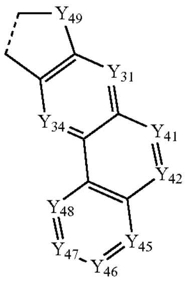

-continued

CR(10)

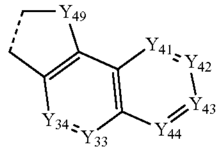

CR(11)

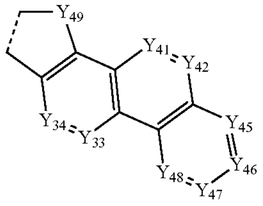

CR(12)

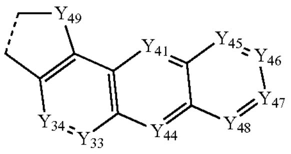

CR(13)

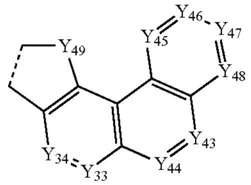

wherein, in Formulae CR(1) to CR(13), $Y_{49}$ may be the same as described in the present specification, and $Y_{31}$ to $Y_{34}$ and $Y_{41}$ to $Y_{48}$ may each independently be C or N.

In an embodiment, the first dopant may include at least one deuterium.

In an embodiment, the second dopant may include at least one deuterium.

For example, the first dopant and the second dopant may each independently be selected from a compound represented by Formula 1-1(1), a compound represented by Formula 1-2(1), and a compound represented by Formula 2A:

1-1(1)

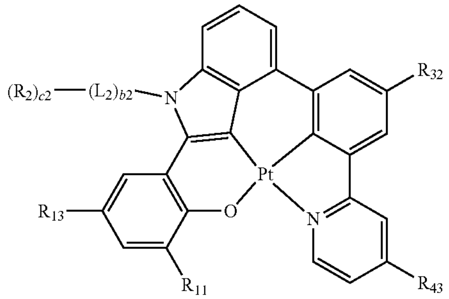

-continued 1-2(1)

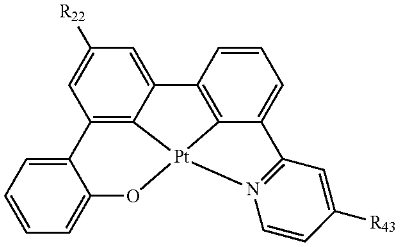

wherein, in Formulae 1-1(1) and 1-2(1), $R_{11}$ and $R_{13}$ may each independently be a $C_1$-$C_{10}$ alkyl group that is unsubstituted or substituted with deuterium, $L_2$ may be a benzene group that is unsubstituted or substituted with deuterium, a $C_1$-$C_{10}$ alkyl group, a $C_3$-$C_{10}$ cycloalkyl group, a phenyl group, a biphenyl group, or any combination thereof, b2 may be 1 or 2, c2 may be 0, 1, or 2, $R_2$ and $R_{32}$ may each independently be:

a $C_1$-$C_{10}$ alkyl group that is unsubstituted or substituted with deuterium, a $C_3$-$C_{10}$ cycloalkyl group, or any combination thereof; or a phenyl group that is unsubstituted or substituted with deuterium, a $C_1$-$C_{10}$ alkyl group, a $C_3$-$C_{10}$ cycloalkyl group, a phenyl group, a biphenyl group, or any combination thereof, and $R_{22}$ and $R_{43}$ may each independently be a phenyl group that is unsubstituted or substituted with deuterium, a $C_1$-$C_{10}$ alkyl group, a $C_3$-$C_{10}$ cycloalkyl group, a phenyl group, a biphenyl group, or any combination thereof:

Formula 2A $$Ir(L_{11})_{n11}(L_{12})_{n12}$$

wherein, in Formula 2A, n11 may be 0, 1, or 2, n12 may be 1, 2, or 3, and n11+n12 may be 3, $L_{11}$ may be a ligand represented by Formula 2-1, and $L_{12}$ may be a ligand represented by Formula 2-2, Formula 2-1

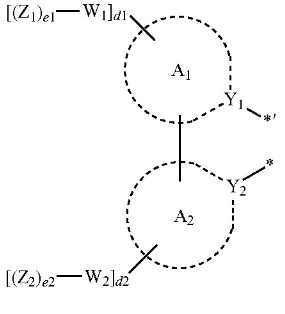

-continued

Formula 2-2

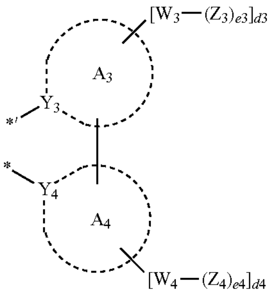

a group represented by

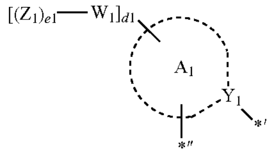

in Formula 2-1 may be a group represented by Formula A1-1, a group represented by

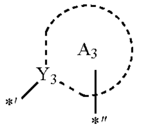

in Formula 2-2 may be a group represented by one of Formulae NR1, NR29, NR30, and NR37 to NR48, a group represented by

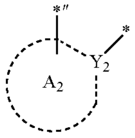

in Formula 2-1 may be a group represented by one of Formulae CR1, CR2, CR5, CR8, and CR24 to CR29, a group represented by

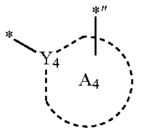

in Formula 2-2 may be a group represented by one of Formulae CR24 to CR29, $W_2$ to $W_4$ in Formula 2A may each independently be:

a single bond; or a benzene group that is unsubstituted or substituted with deuterium, —F, a $C_1$-$C_{10}$ alkyl group, a $C_3$-$C_{10}$ cycloalkyl group, a phenyl group, a biphenyl group, or any combination thereof, $Z_{11}$ to $Z_{14}$ in Formula A1-1 and $Z_2$ to $Z_4$ in Formula 2A may each independently be hydrogen, deuterium, or —F;

a $C_1$-$C_{10}$ alkyl group that is unsubstituted or substituted with deuterium, —F, a phenyl group, or any combination thereof;

a phenyl group that is unsubstituted or substituted with deuterium, —F, a $C_1$-$C_{10}$ alkyl group, a phenyl group, or any combination thereof;

—Si($Q_3$)($Q_4$)($Q_5$); or

—Ge($Q_3$)($Q_4$)($Q_5$), $Q_3$ to $Q_5$ may each be a $C_1$-$C_{10}$ alkyl group or a deuterated $C_1$-$C_{10}$ alkyl group, and e2 to e4 and d2 to d4 may each independently be 0, 1, 2 or 3.

The $C_1$-$C_{10}$ alkyl group may include, for example, a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group.

The $C_3$-$C_{10}$ cycloalkyl group may include a cyclopentyl group, a cyclohexyl group, a cycloheptyl group, a cyclooctyl group, an adamantanyl group, a norbornanyl group (or, a bicyclo[2.2.1]heptyl group), a bicyclo[1.1.1]pentyl group, a bicyclo[2.1.1]hexyl group, and a bicyclo[2.2.2]octyl group.

As another example, the first dopant and the second dopant may each independently be selected from compounds of Group 1-1 to Group 1-4 and compounds of Group 2-1 to Group 2-7:

Group 1-1

3-534

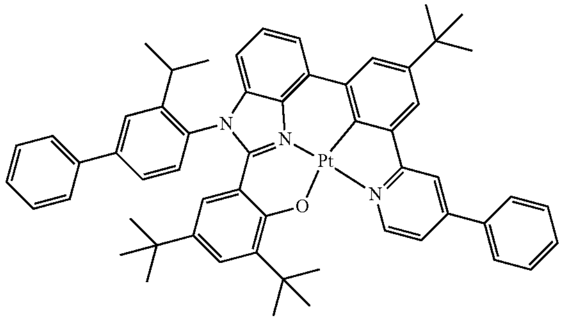

3-540

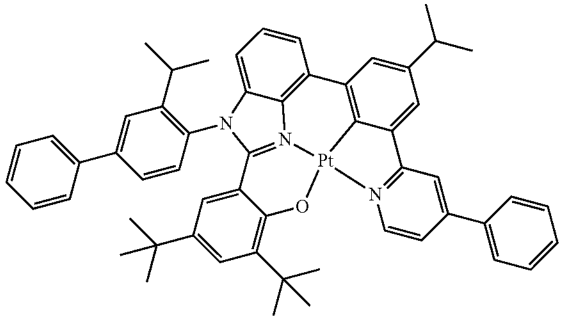

-continued 3-565

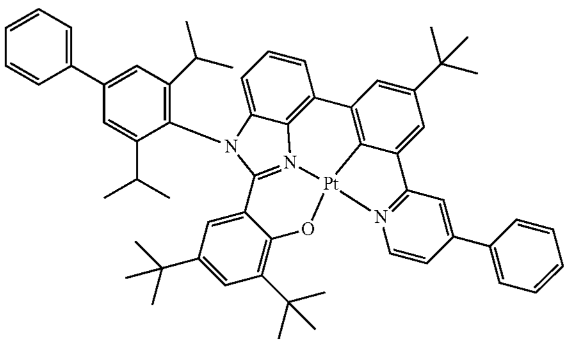

Group 1-2

1

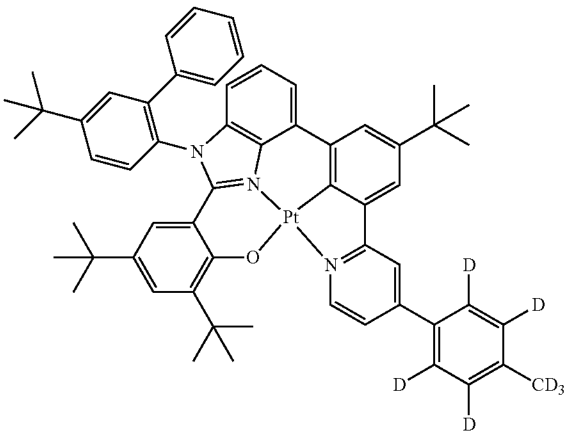

2

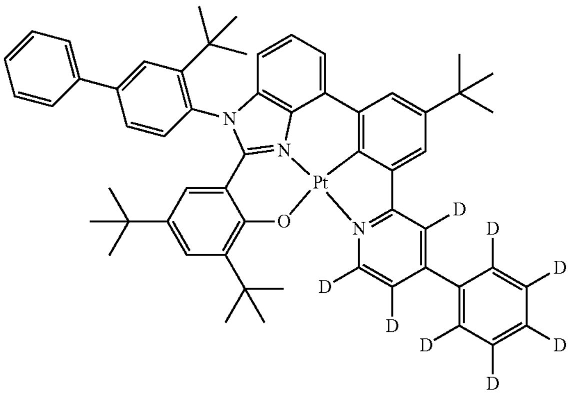

-continued
3
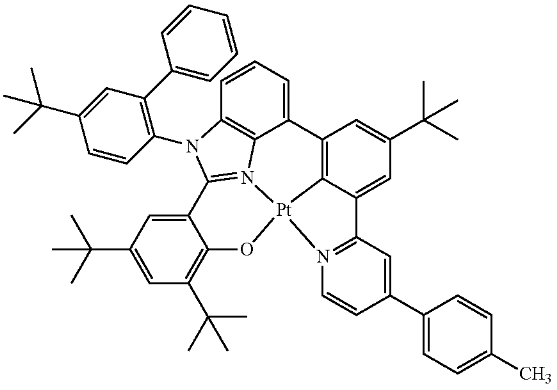
4
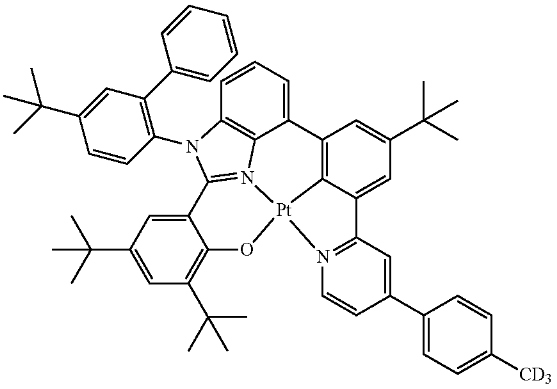
5
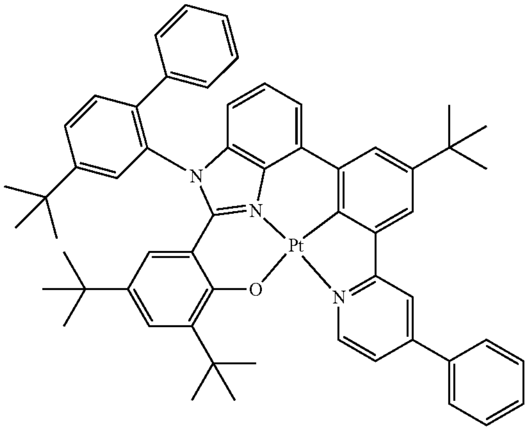
-continued
6
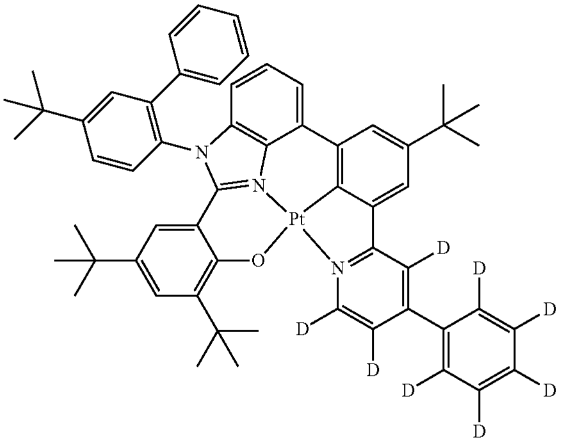
7
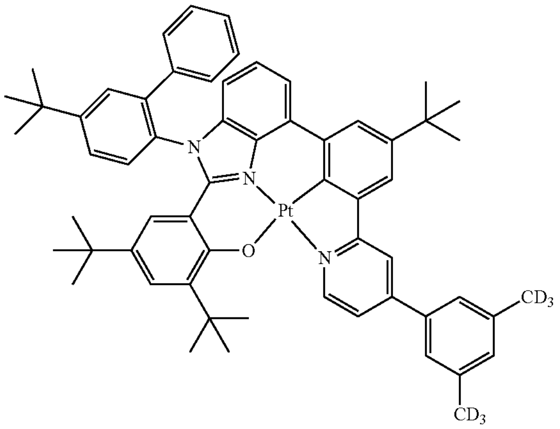
8
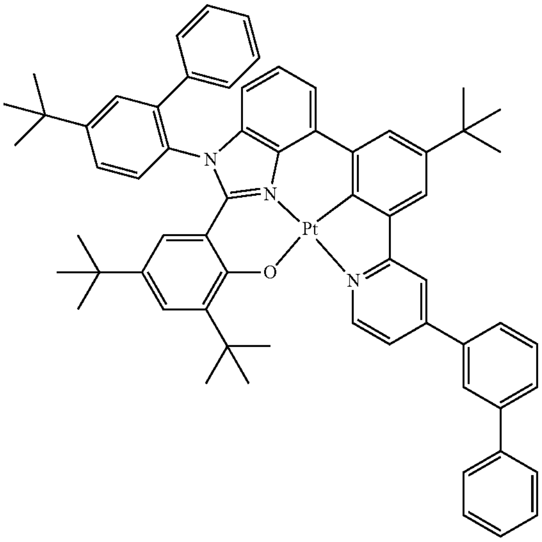

-continued
9
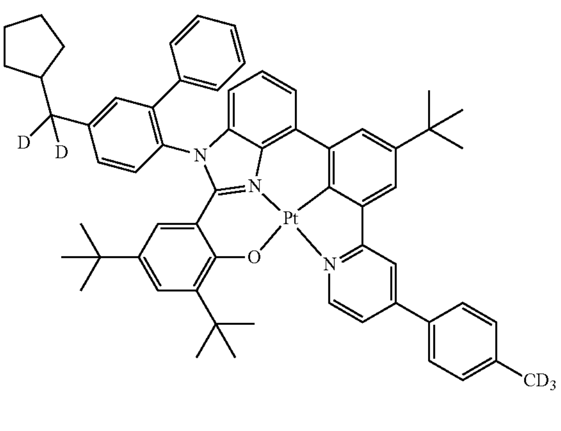
10
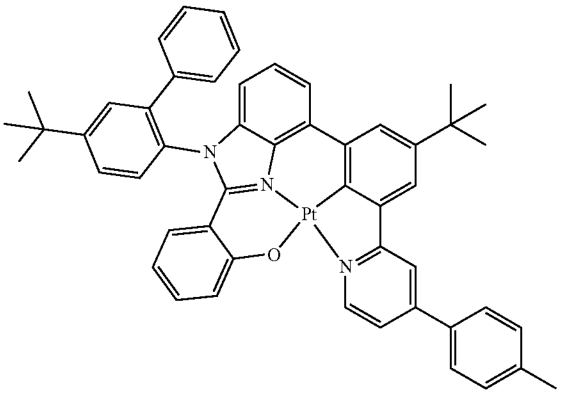
11
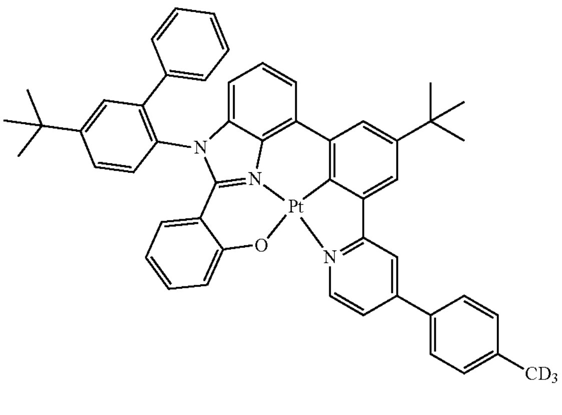
-continued
12
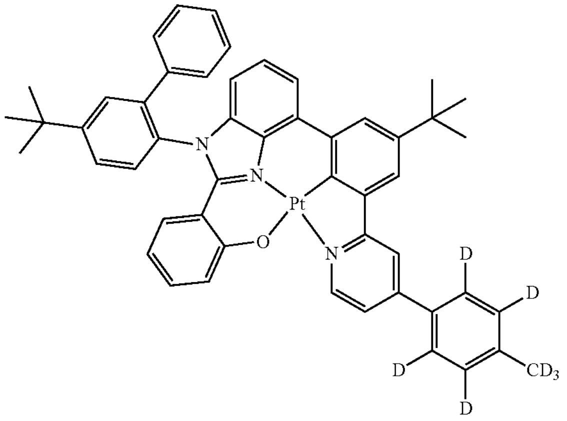
13
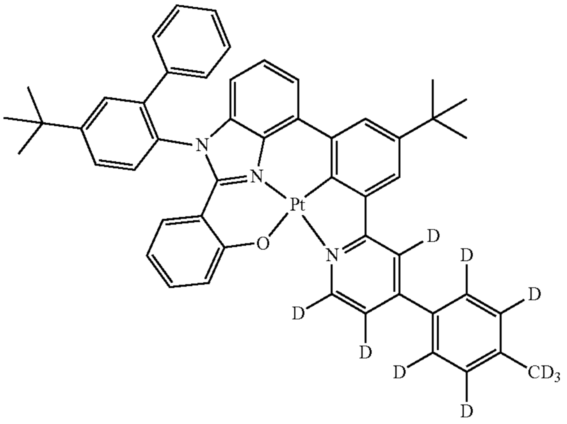
14
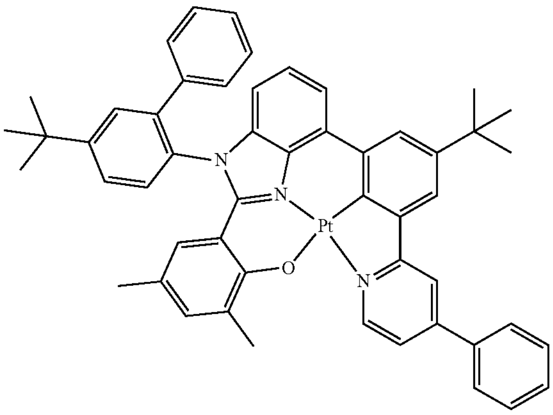

-continued
15
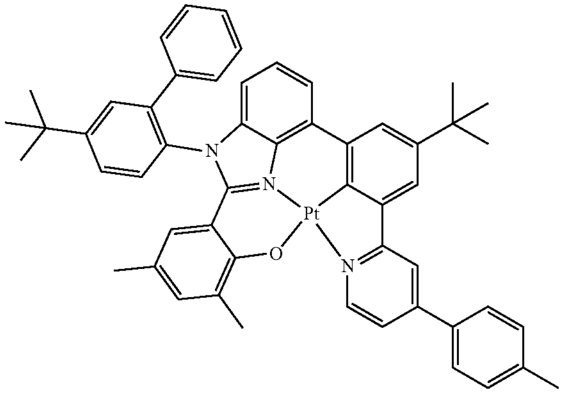
16
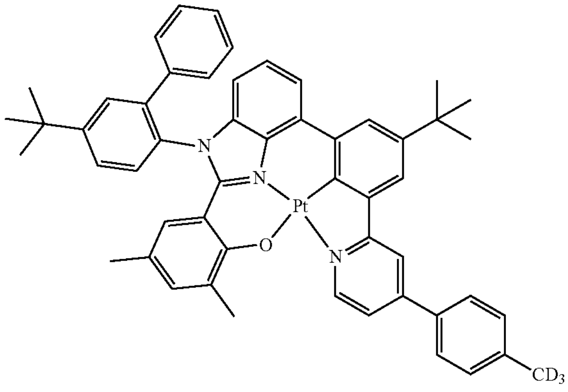
17
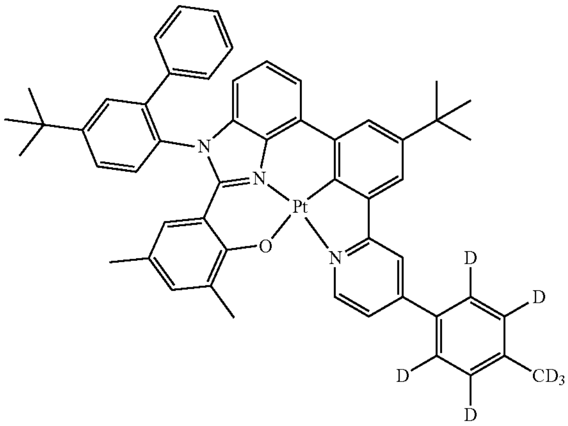
-continued
18
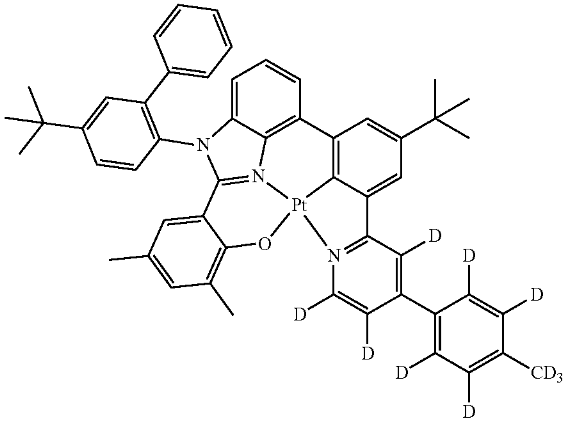
19
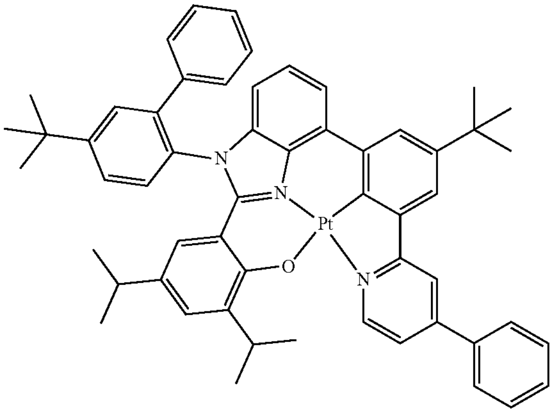
20
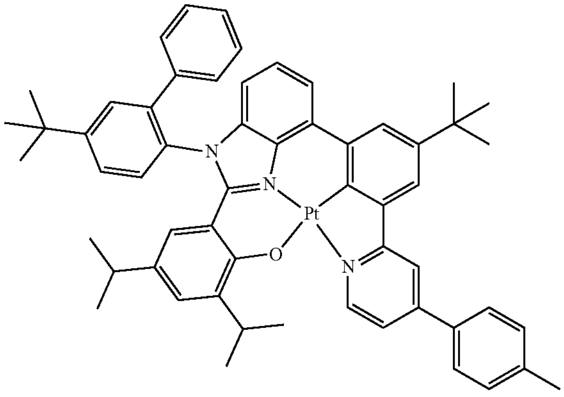

21
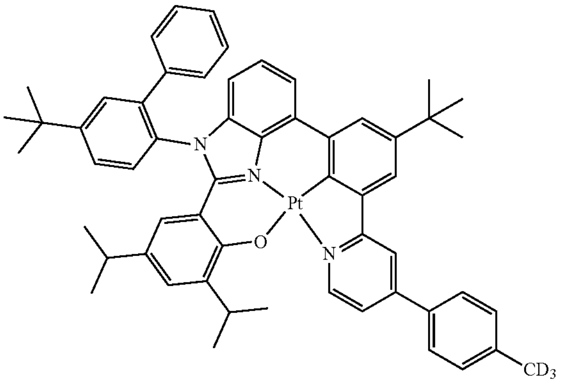
22
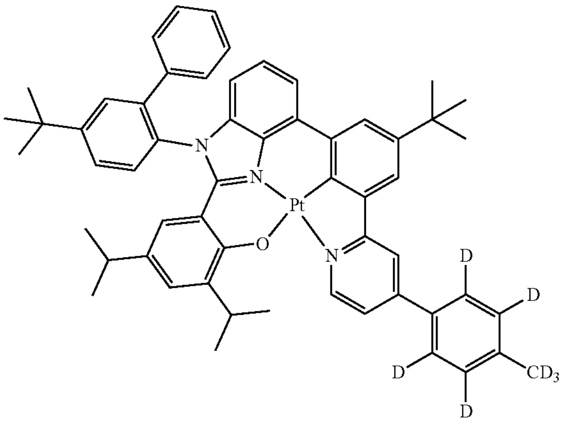
23
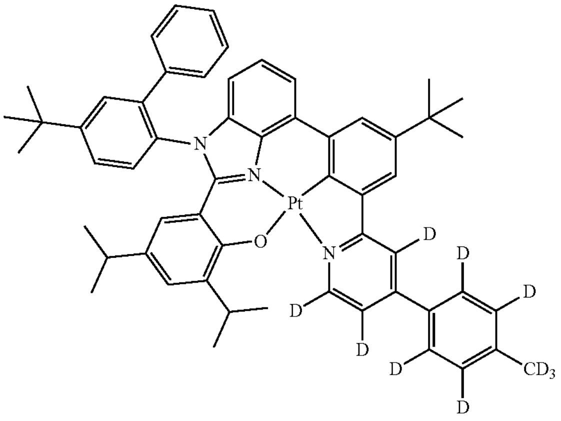
24
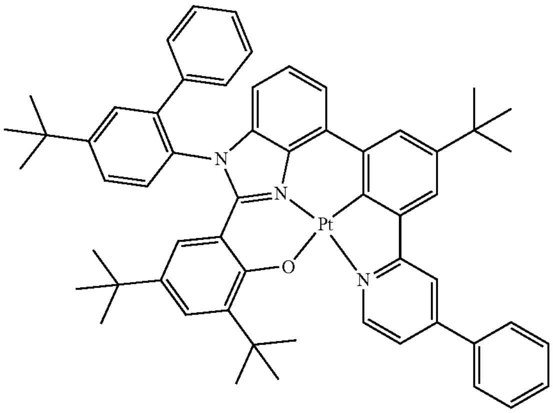
25
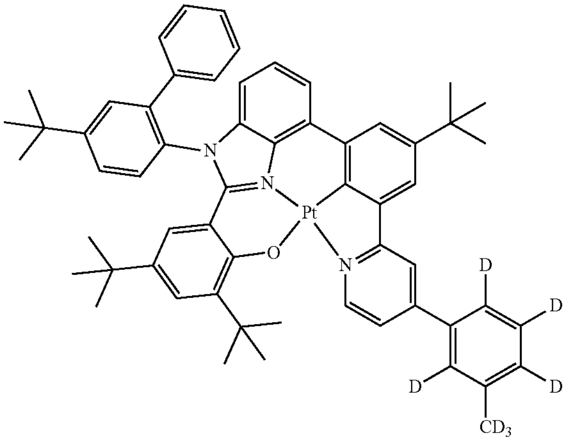
26
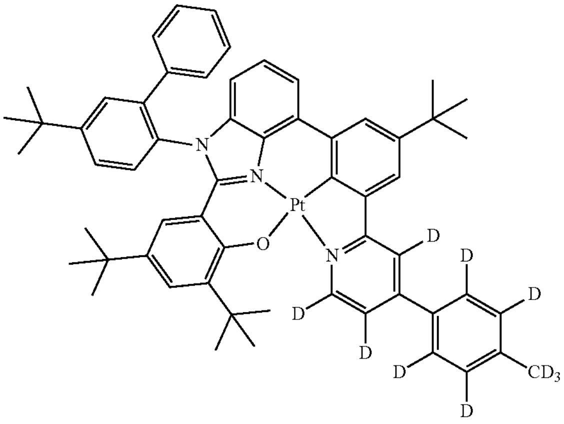

-continued
27
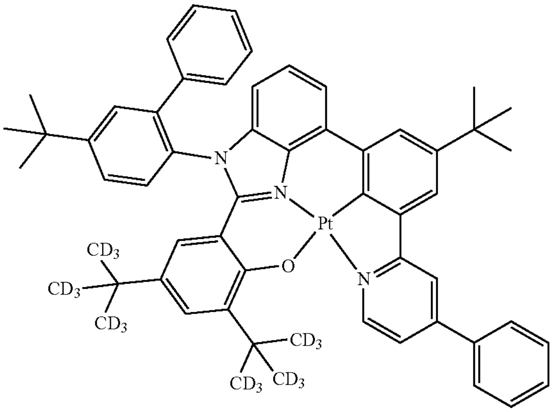
28
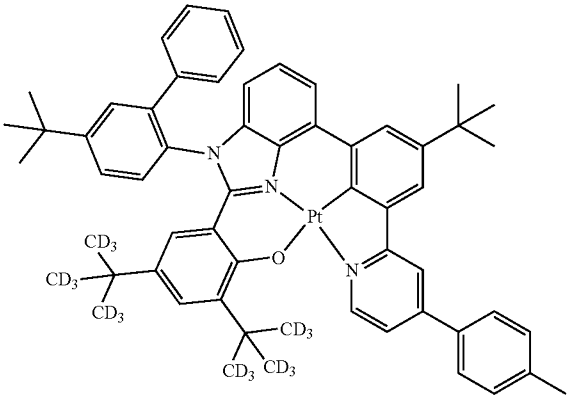
29
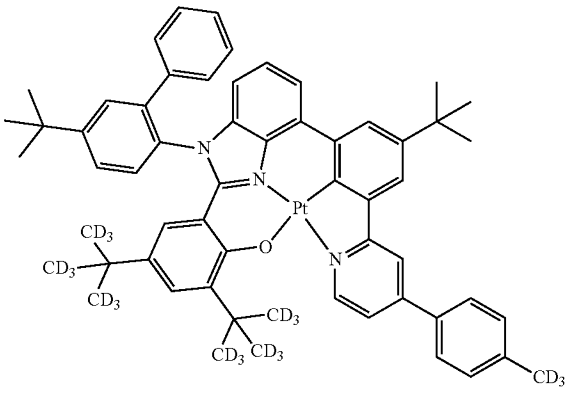
-continued
30
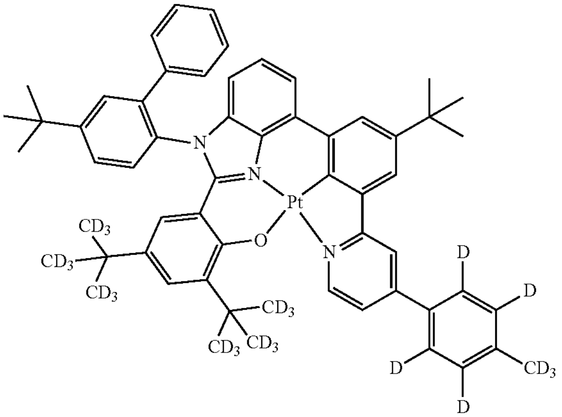
31
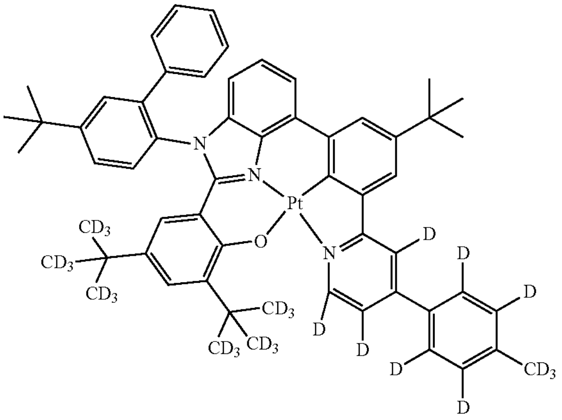
32
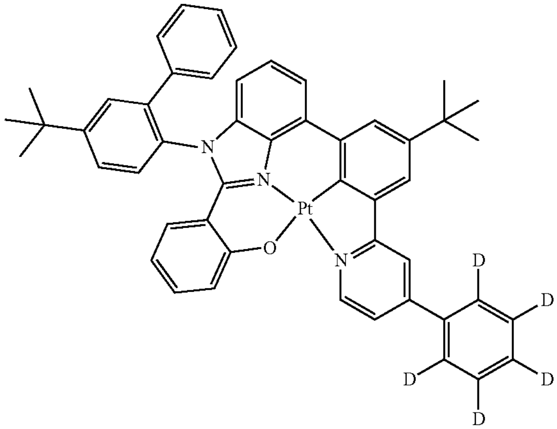

-continued
33
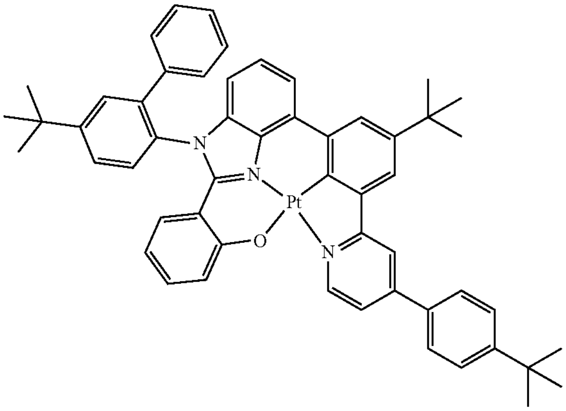
34
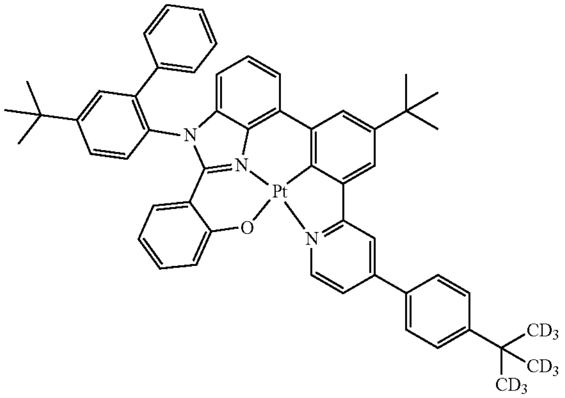
35
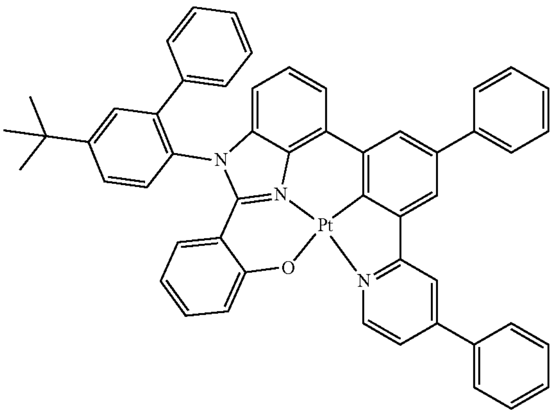
-continued
36
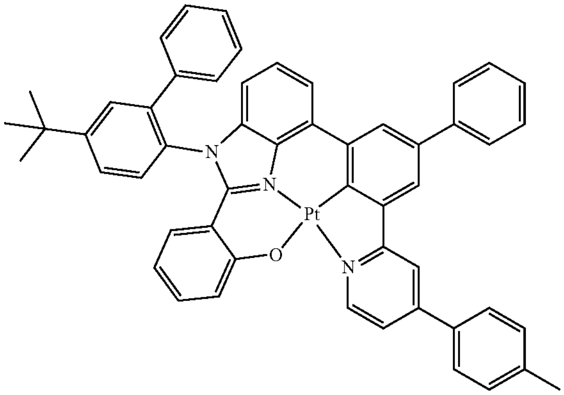
97
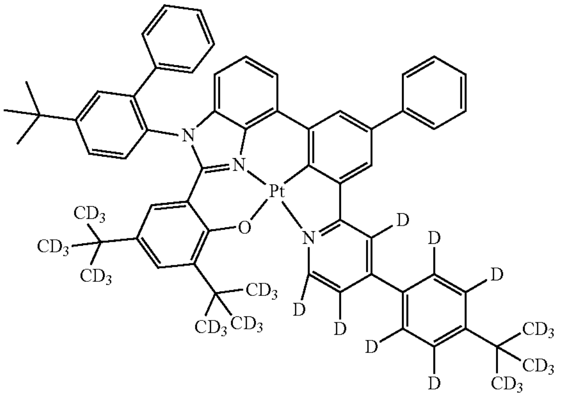
98
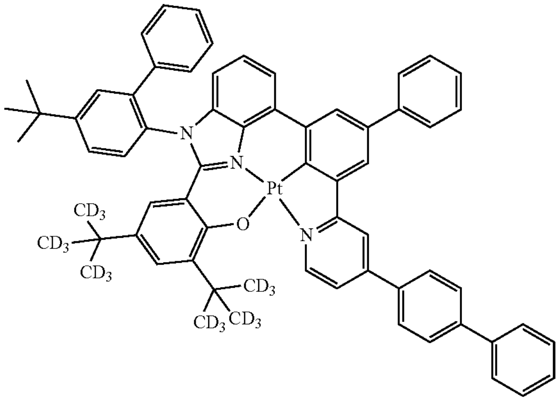

-continued
99
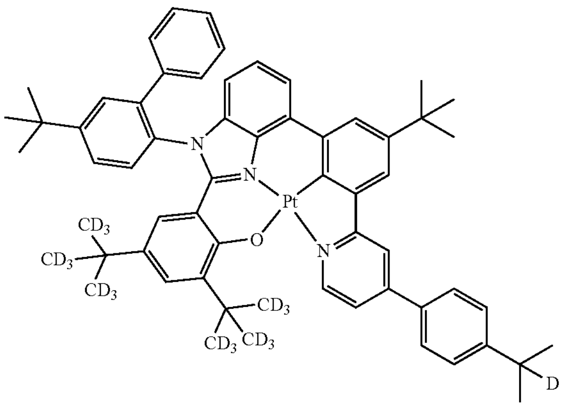
100
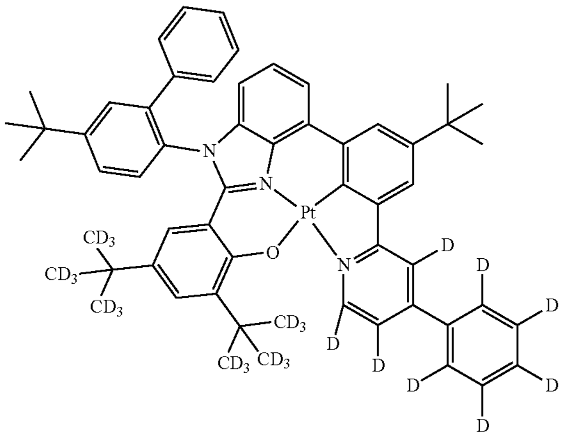
101
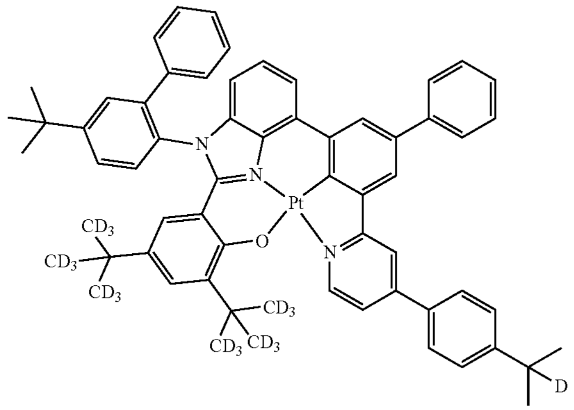
-continued
102
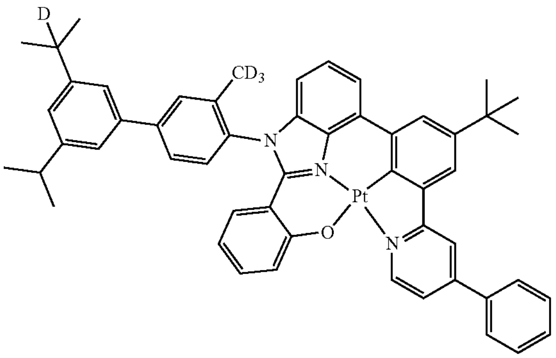
103
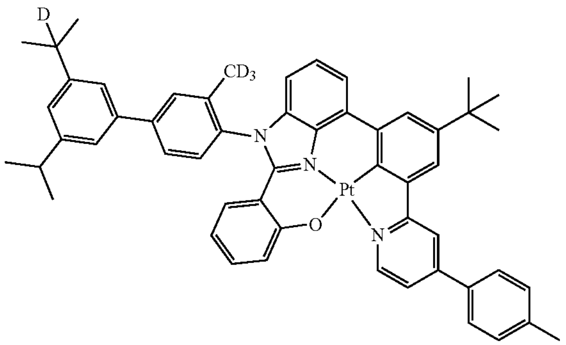
104
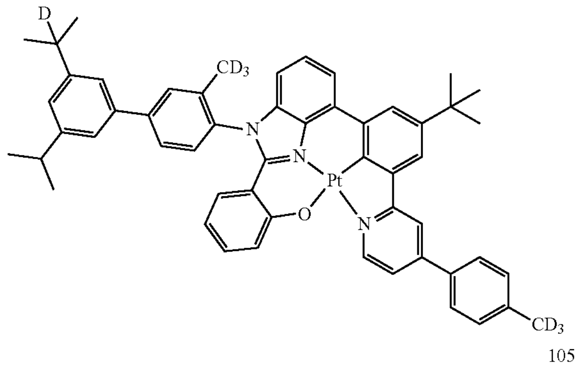
105
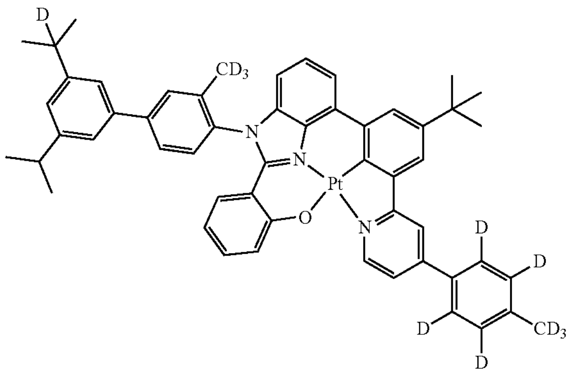

-continued
106
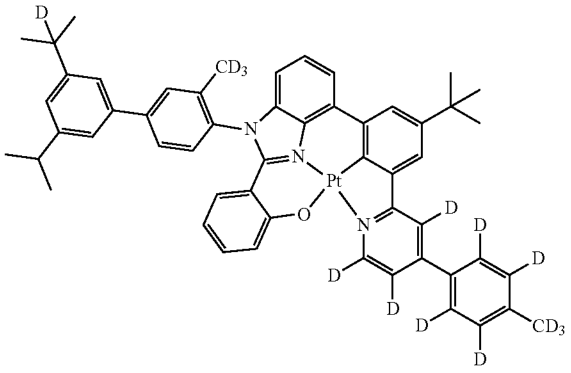
107
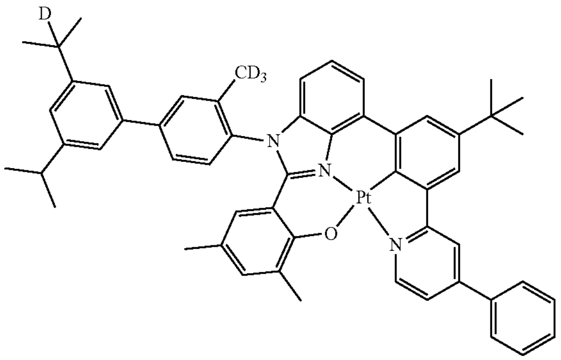
108
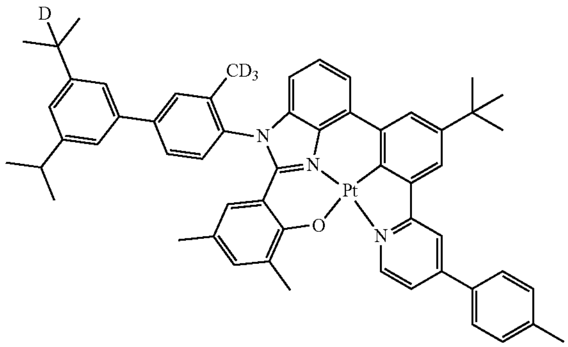
109
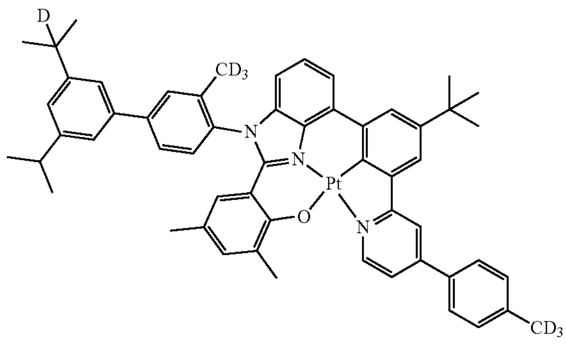
-continued
110
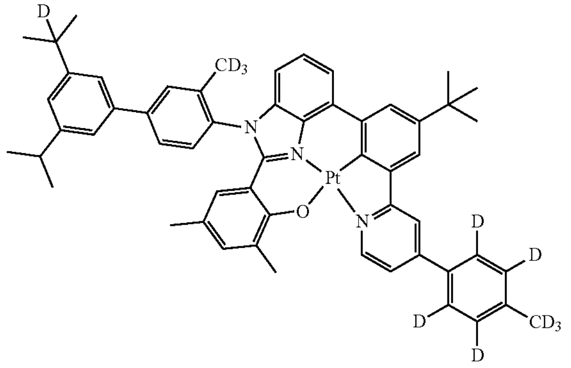
111
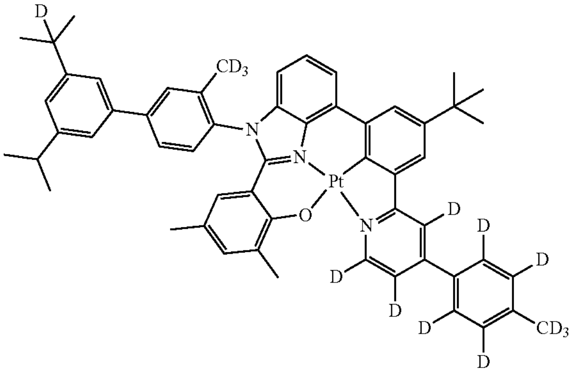
112
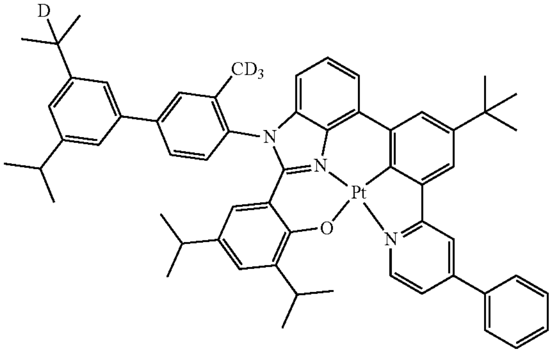
113
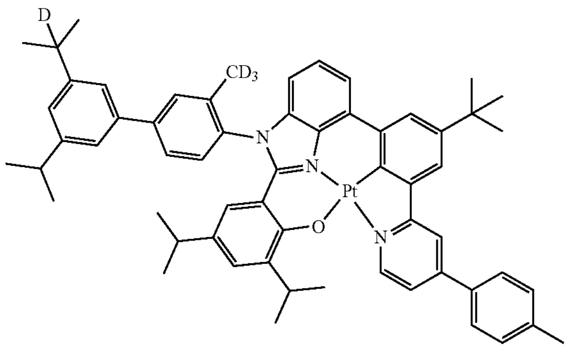

-continued
114
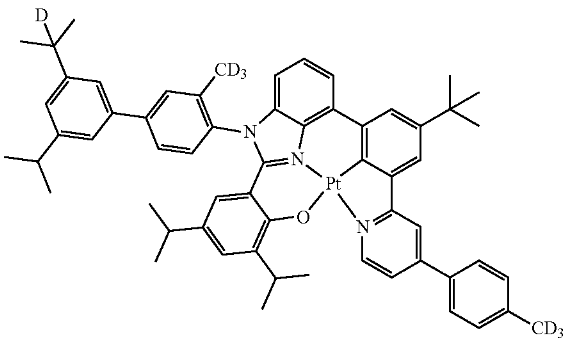
115
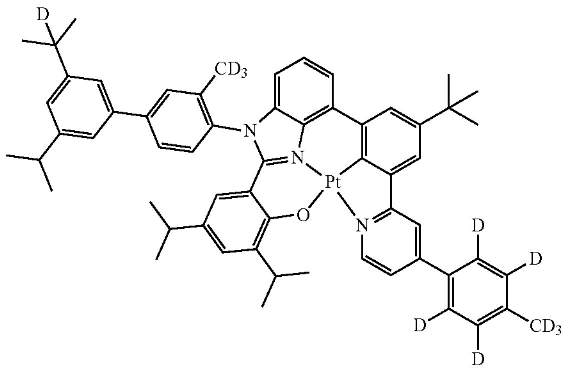
116
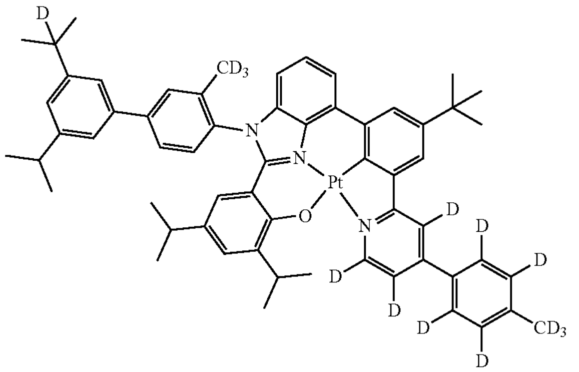
117
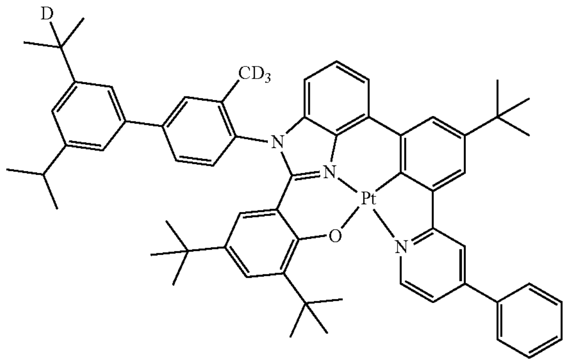
-continued
118
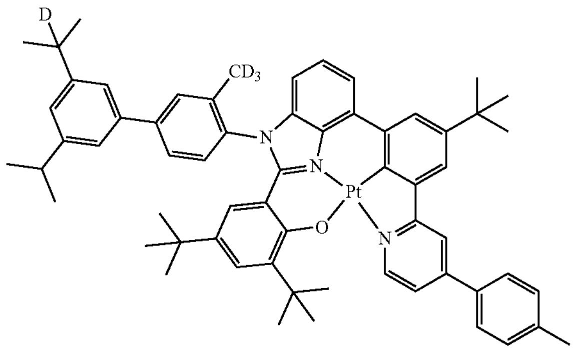
119
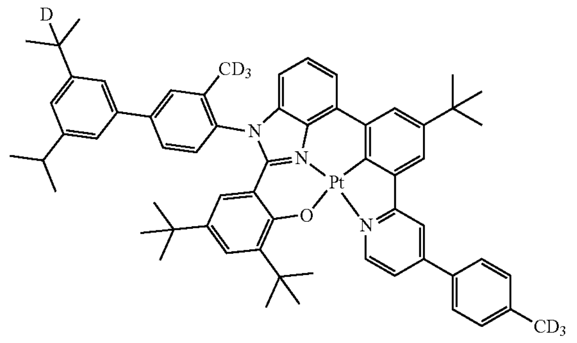
120
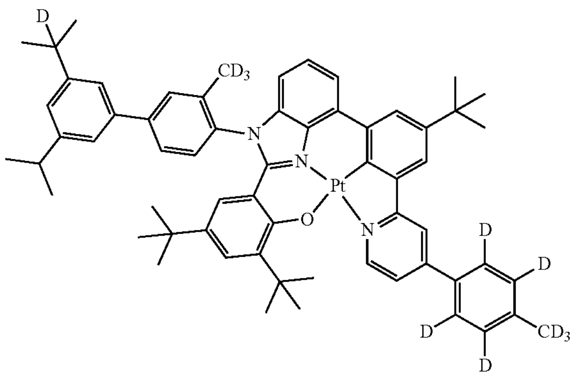
493
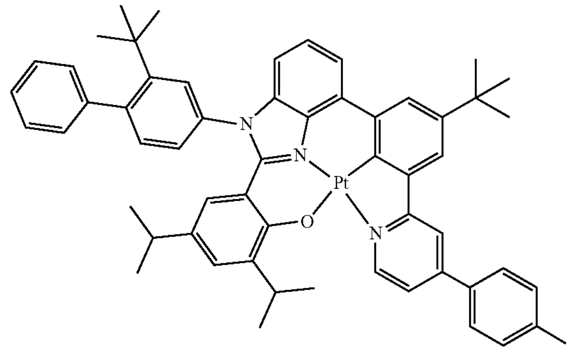

-continued
494
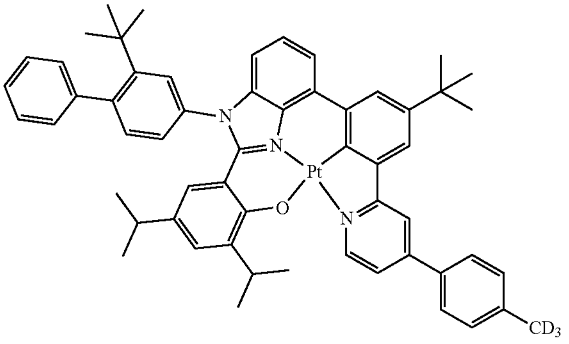
495
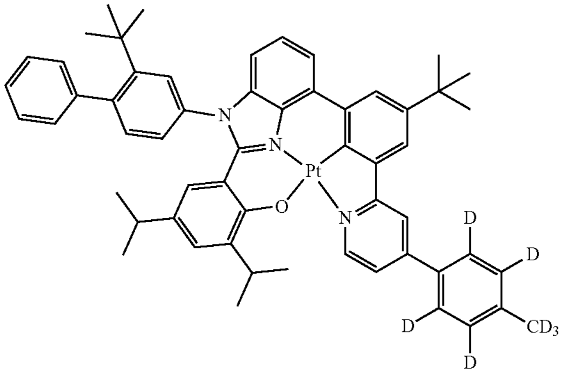
496
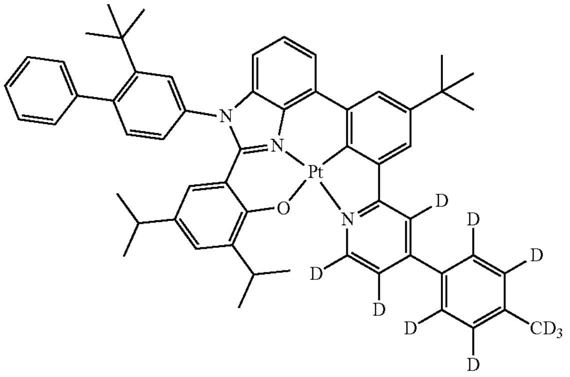
497
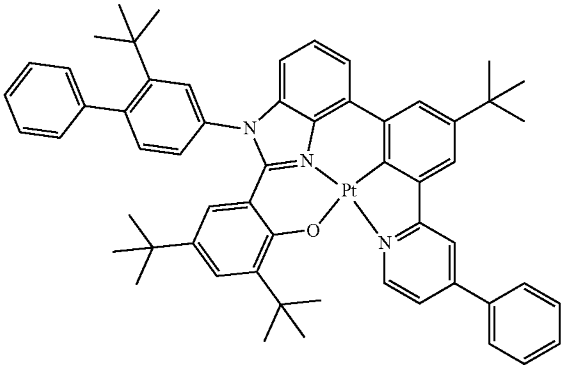
-continued
498
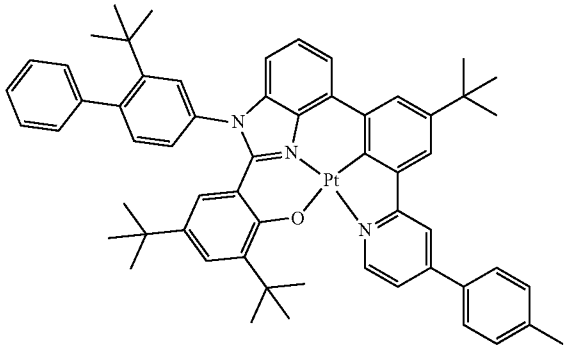
499
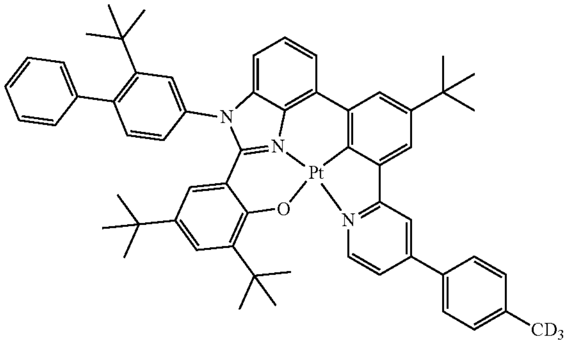
500
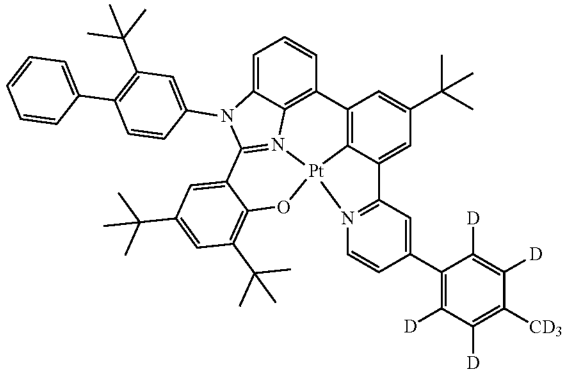
501
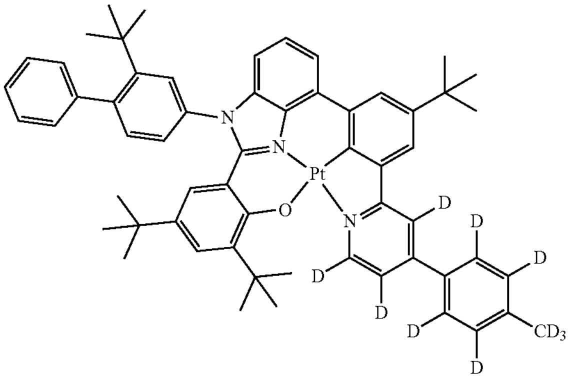

-continued
502
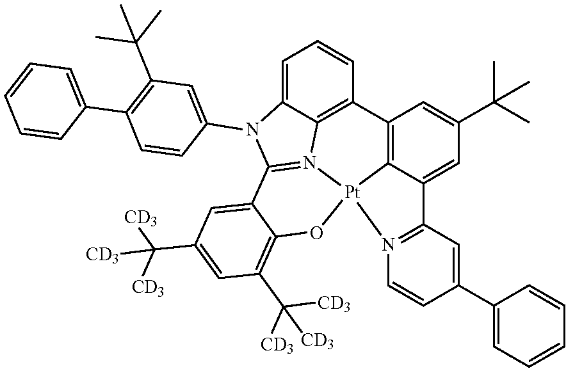
503
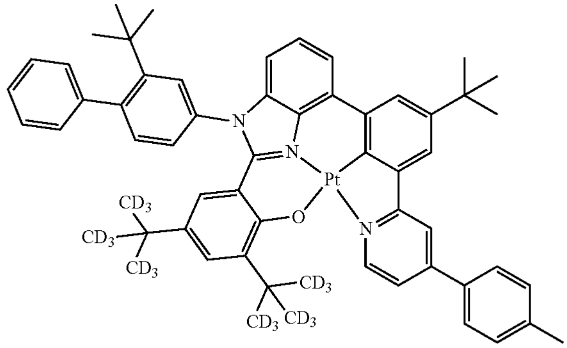
504
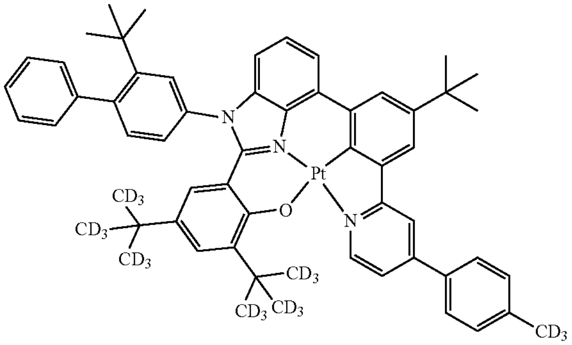
577
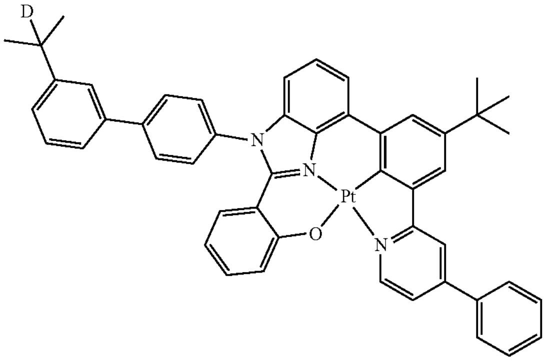
-continued
578
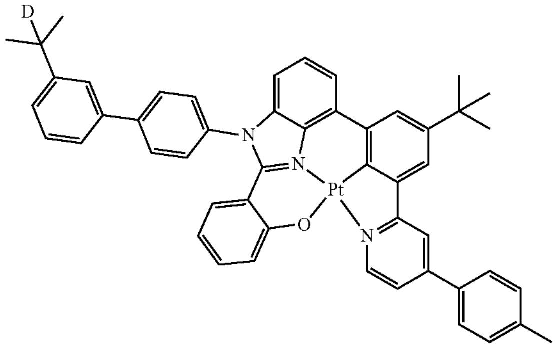
579
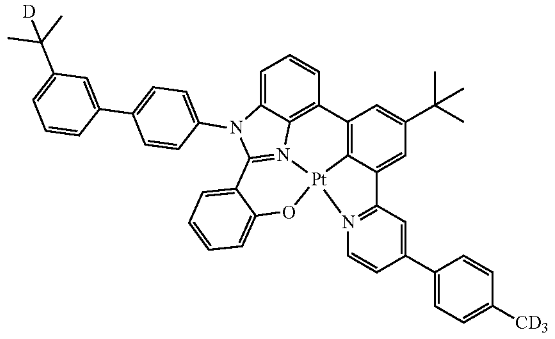
580
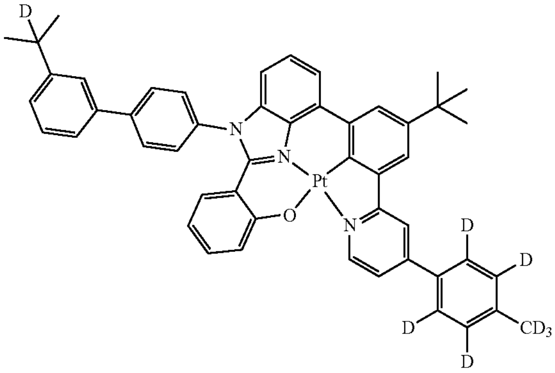
581
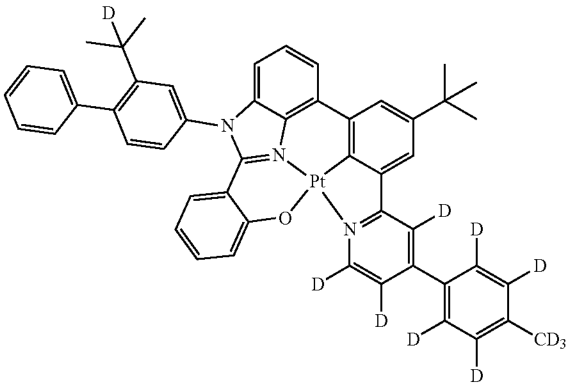

-continued
582
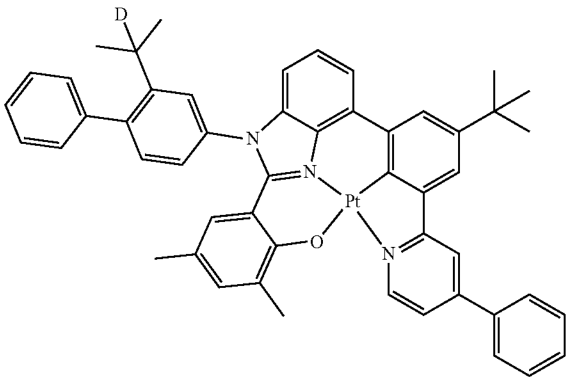
583
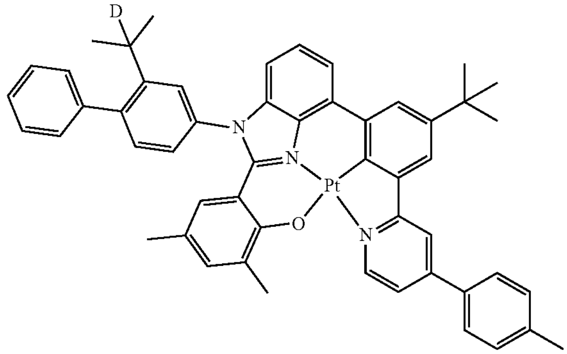
584
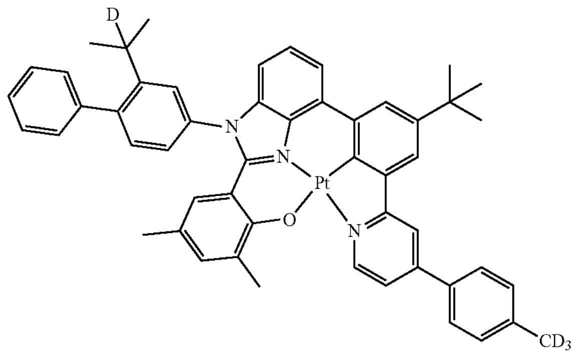
585
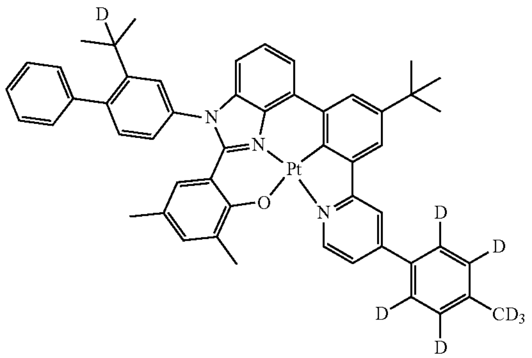
-continued
586
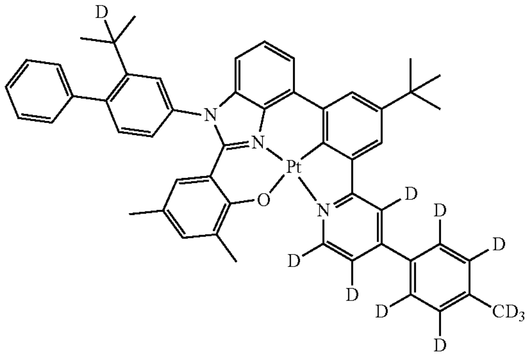
587
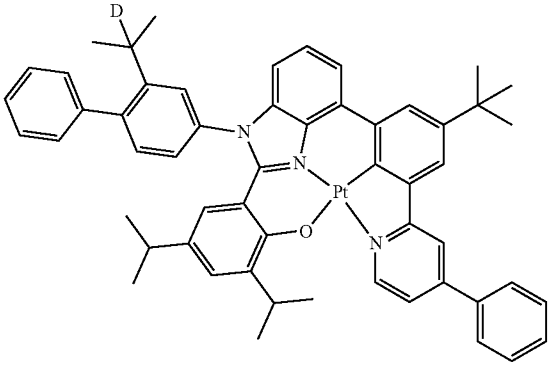
588
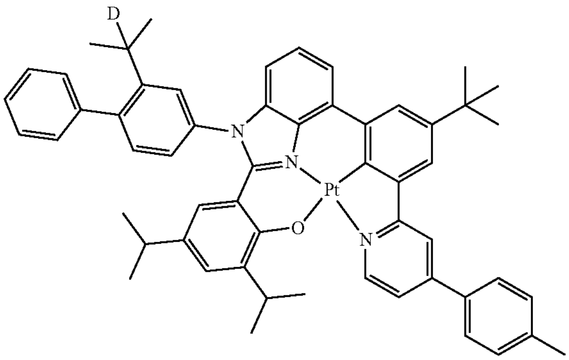
781
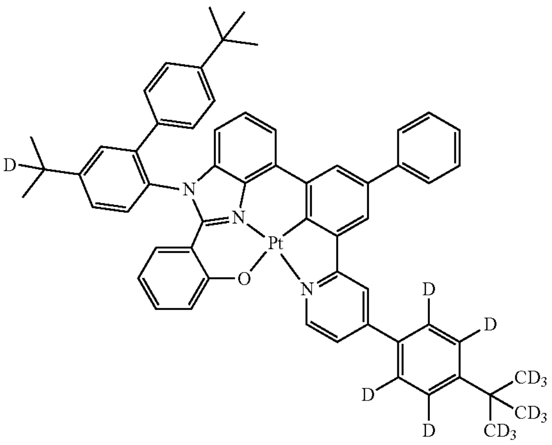

782
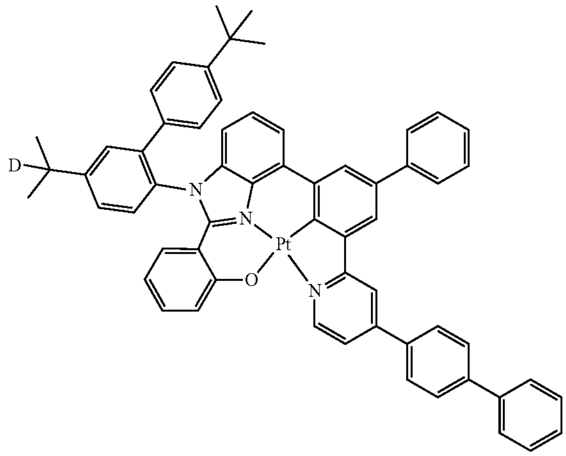
783
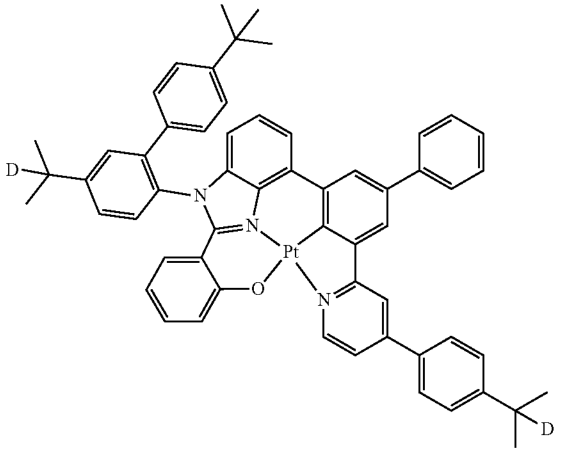
784
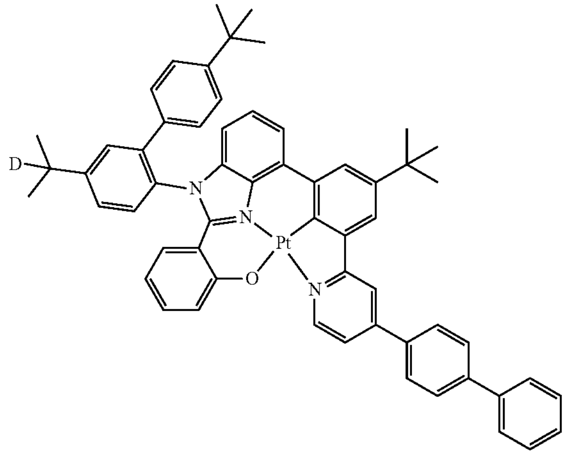
785
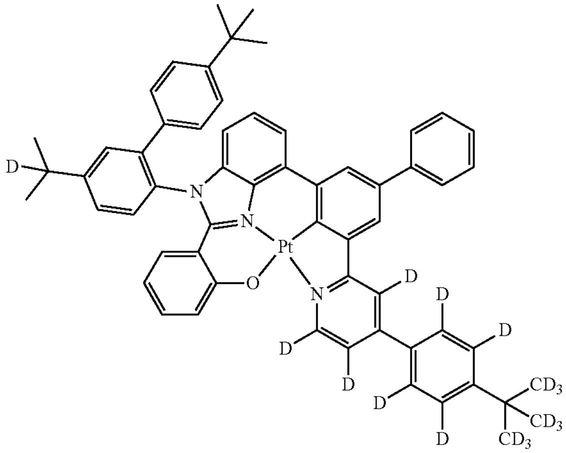
786
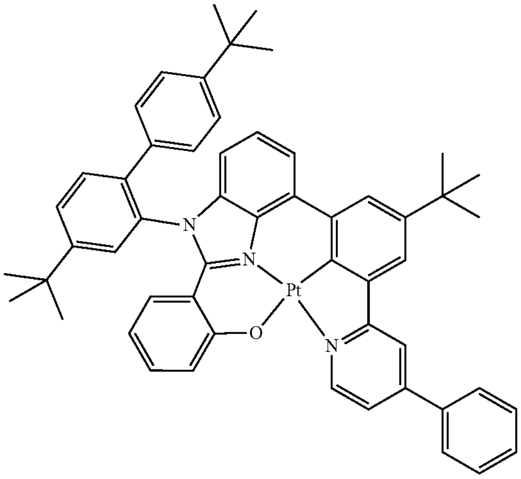
787
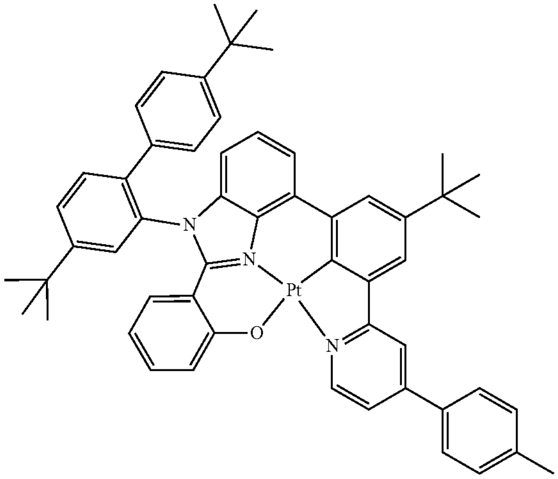

-continued
788
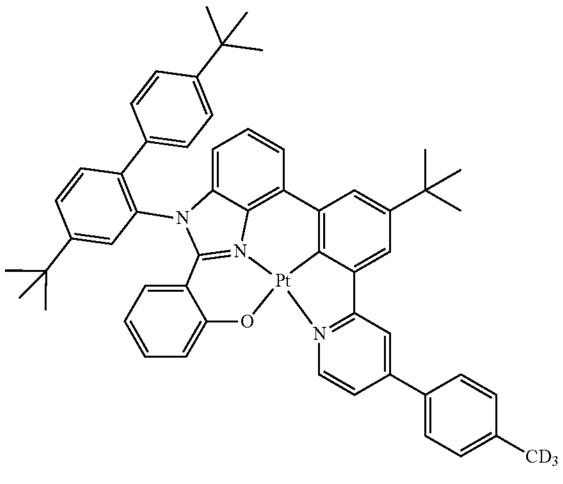
789
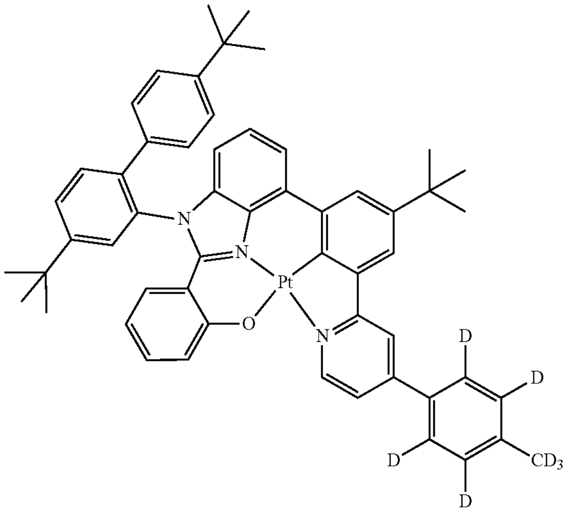
790
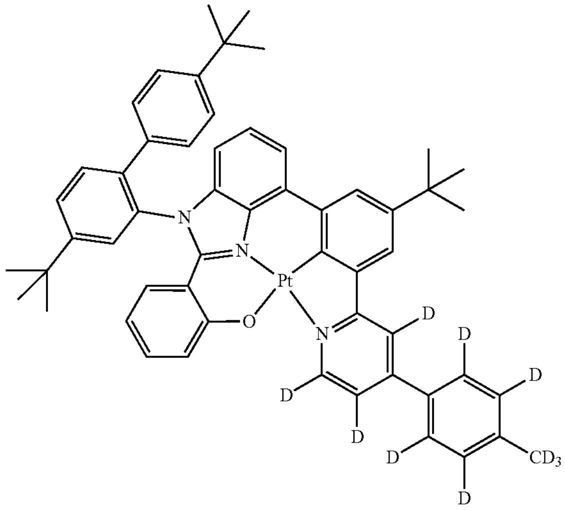
-continued
791
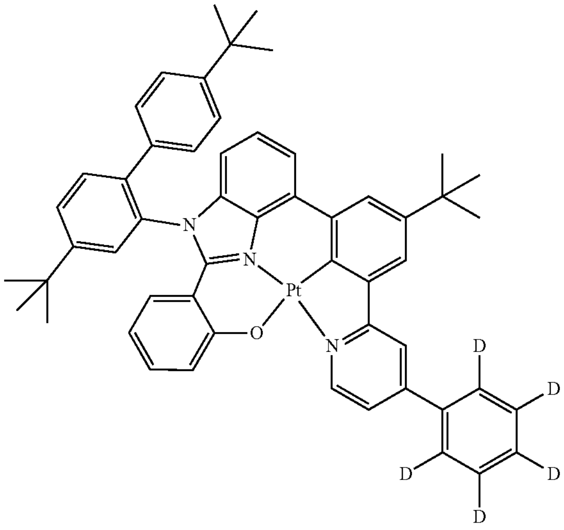
792
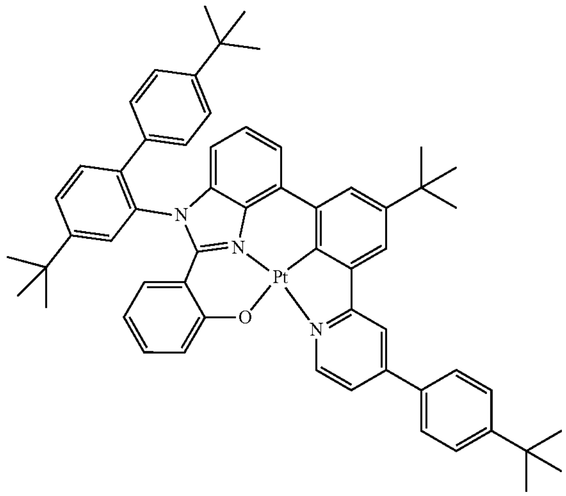
925
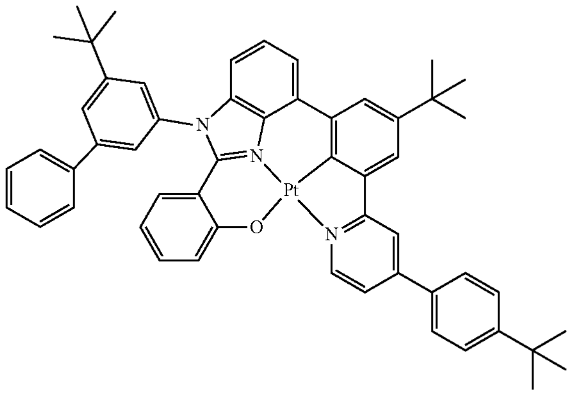

-continued
926
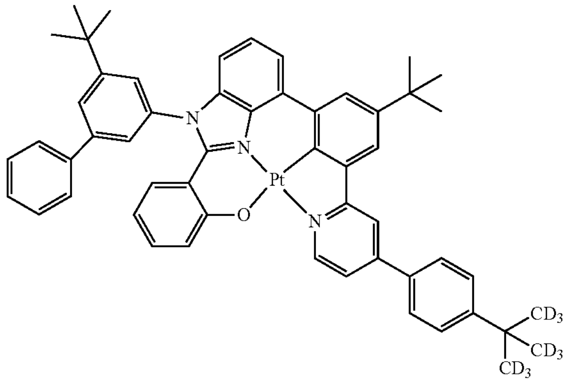
927
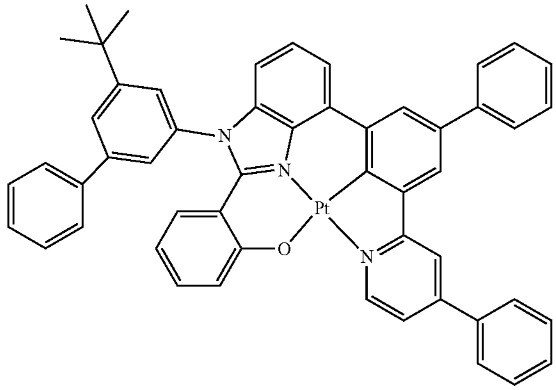
928
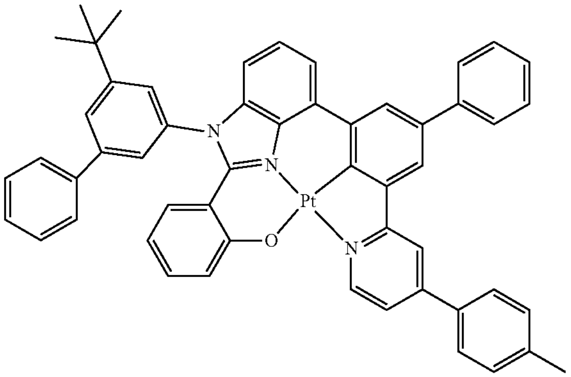
929
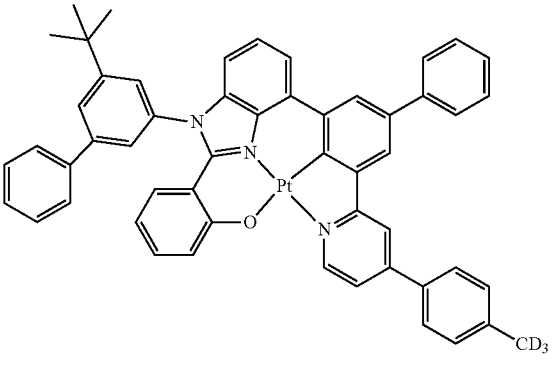
-continued
930
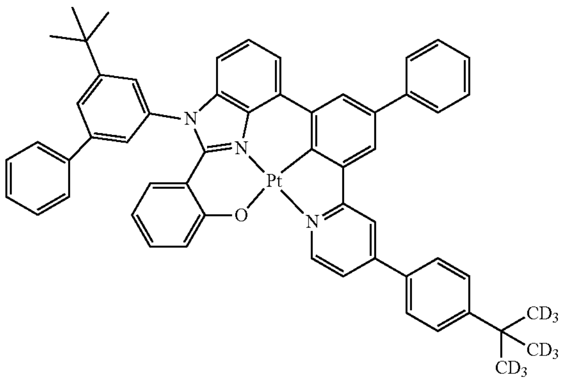
931
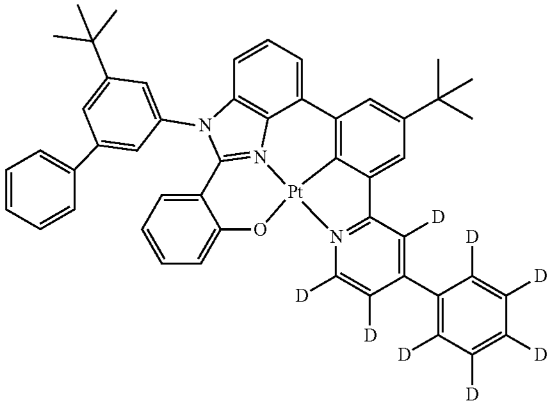
932
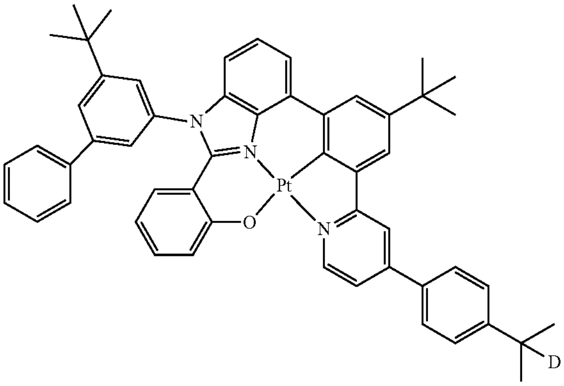
933
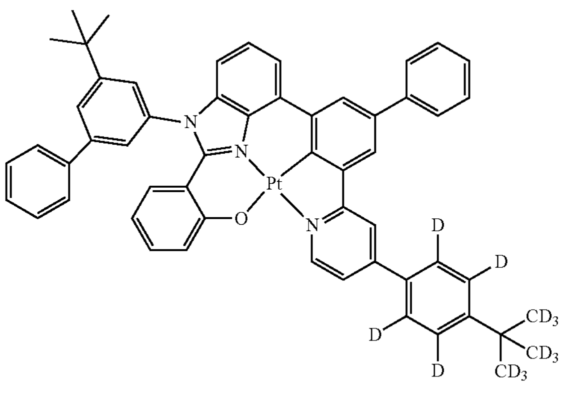

934
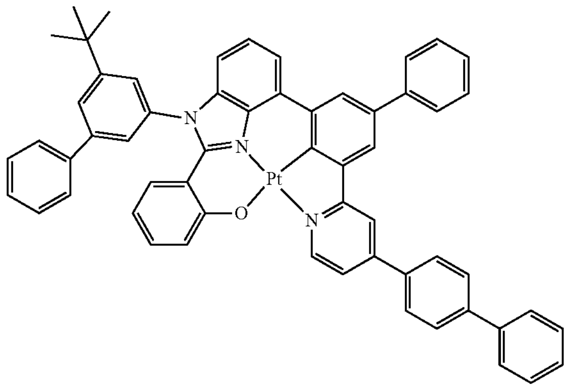
935
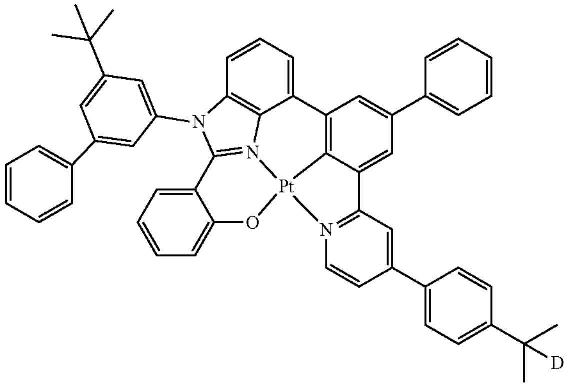
936
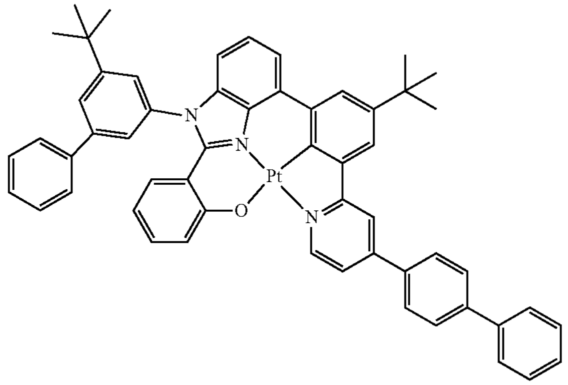
937
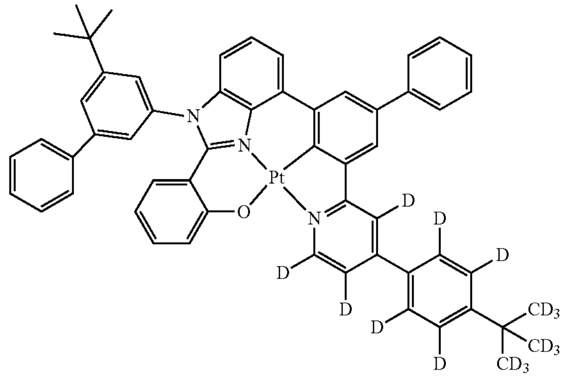
938
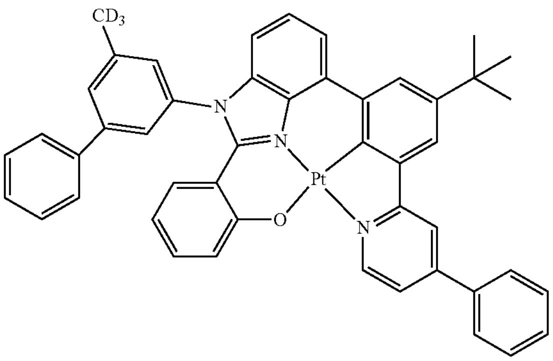
939
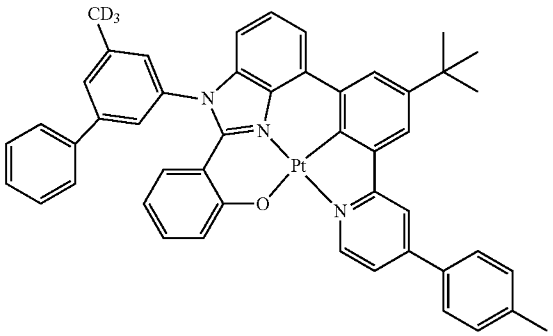
940
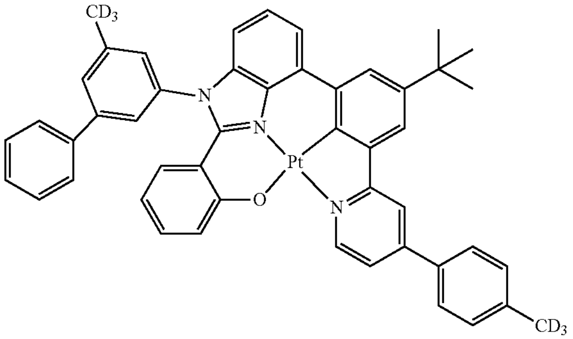
941
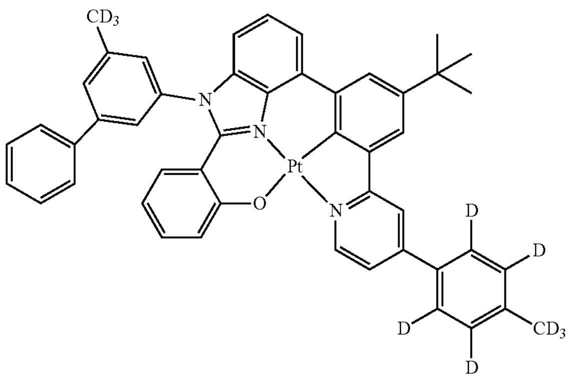

-continued
942
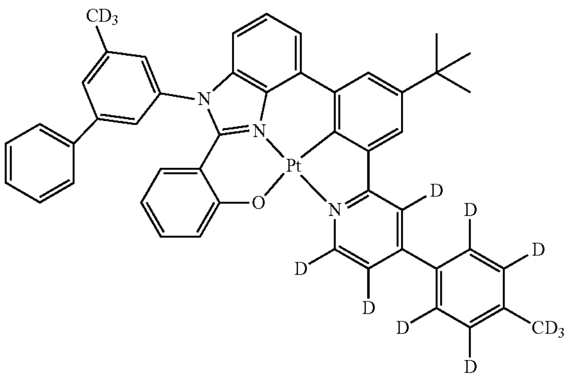
943
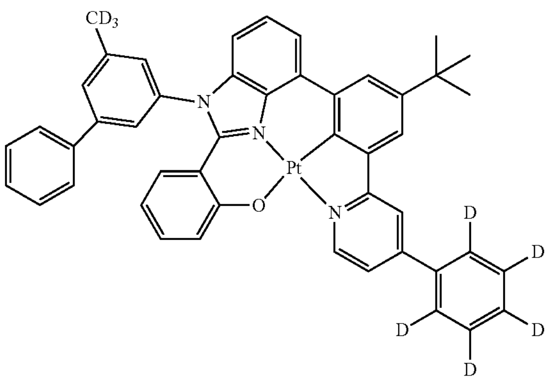
944
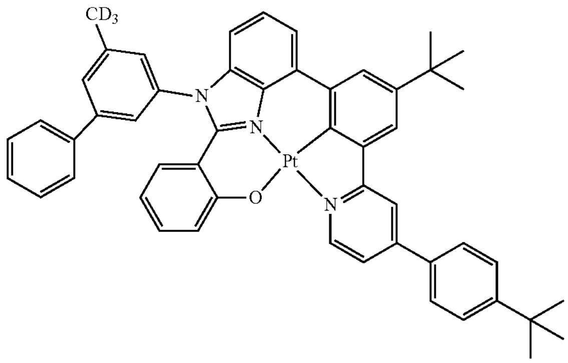
945
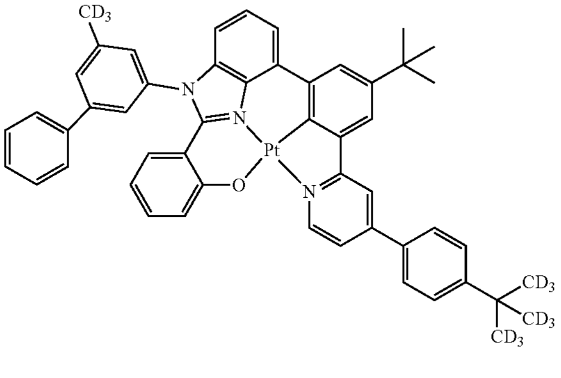
-continued
946
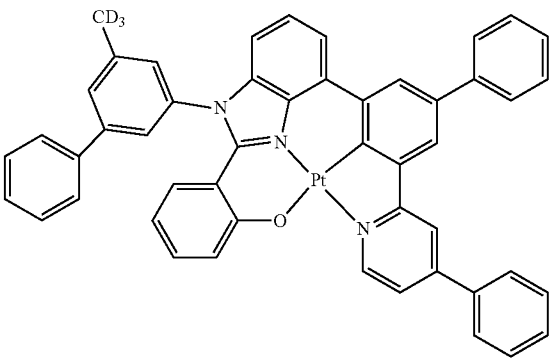
947
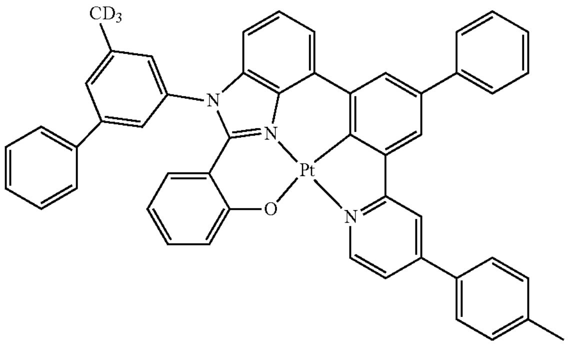
948
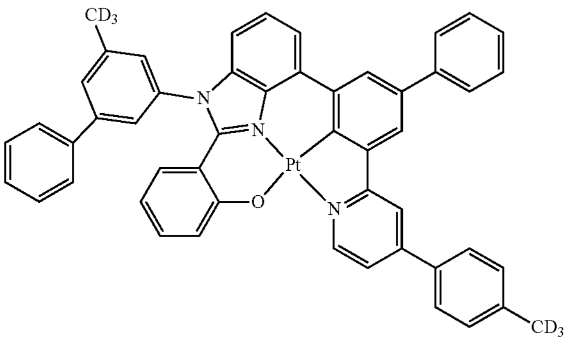
985
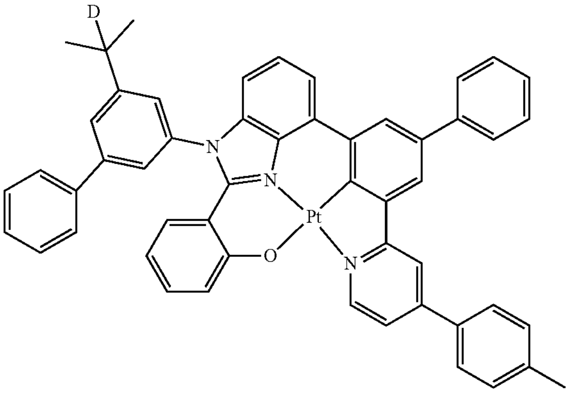

986
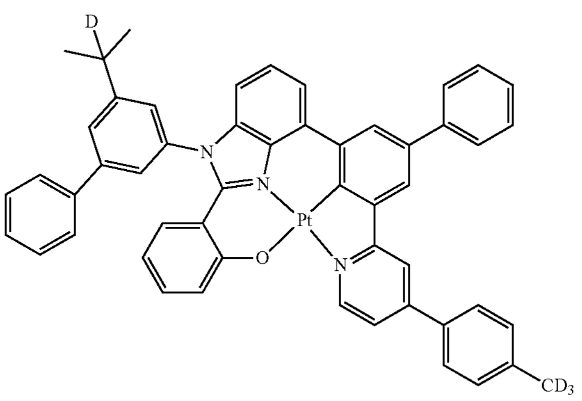
987
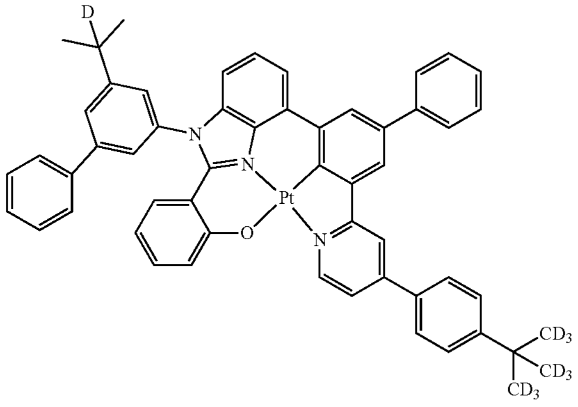
988
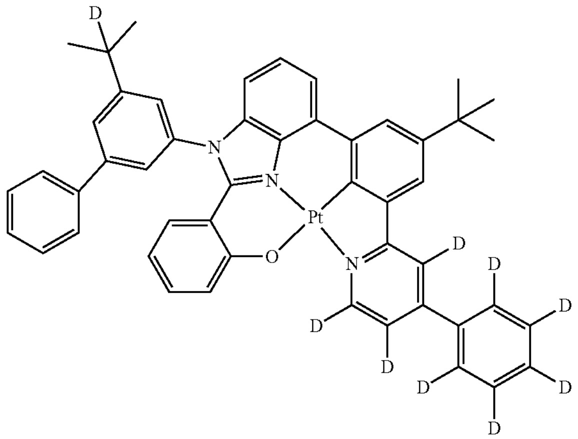
989
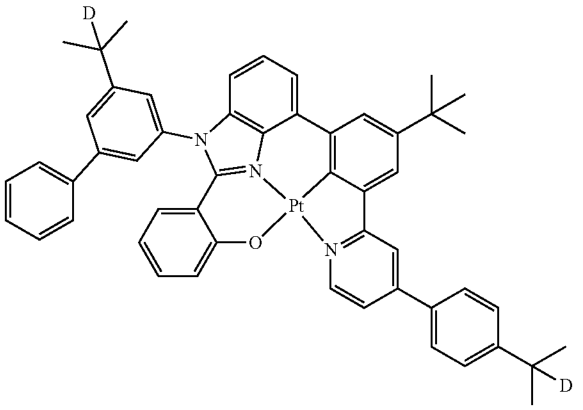
990
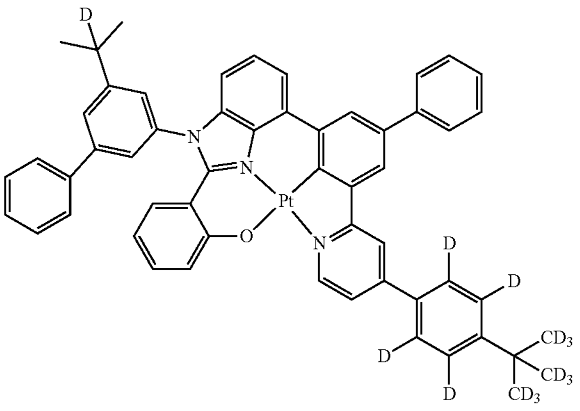
991
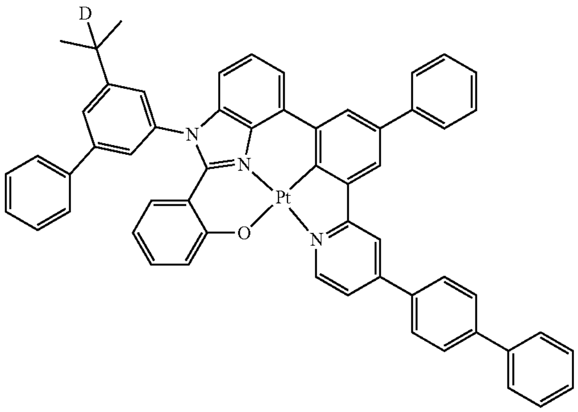

-continued
992
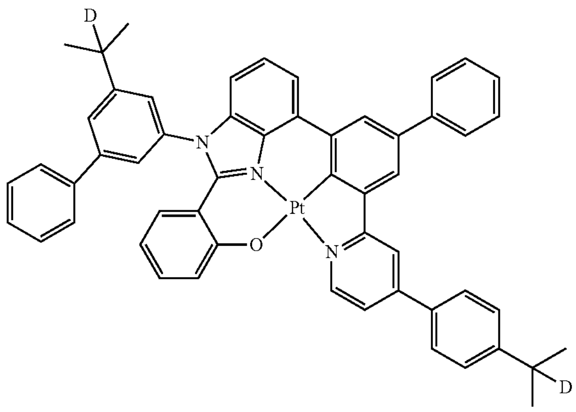
993
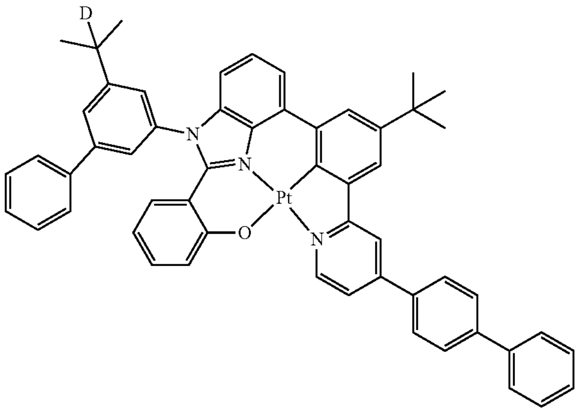
994
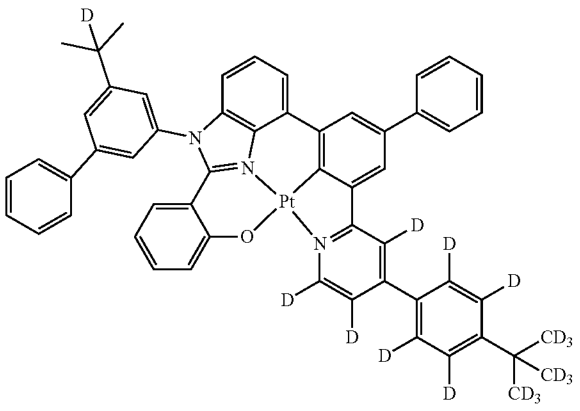
-continued
995
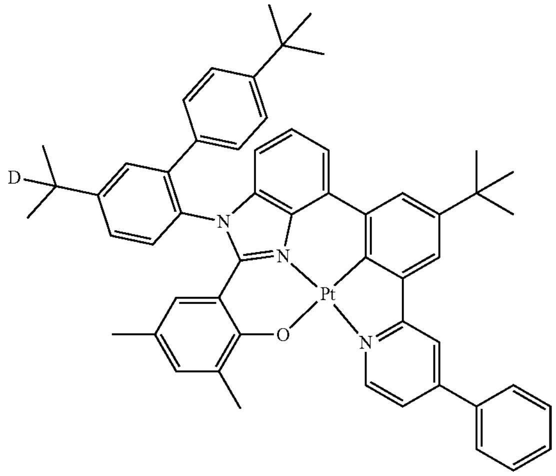
996
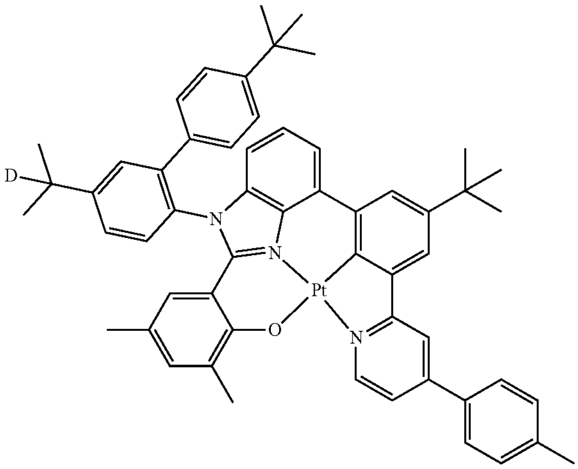
2779
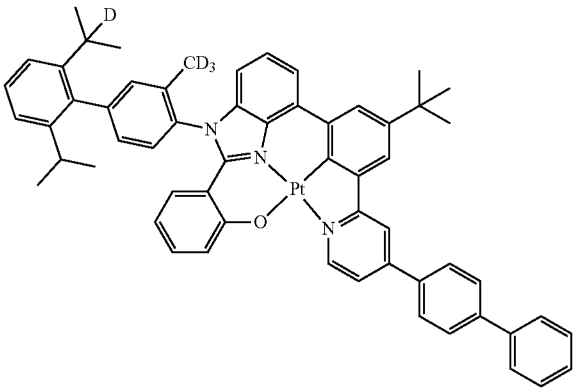

-continued
2780
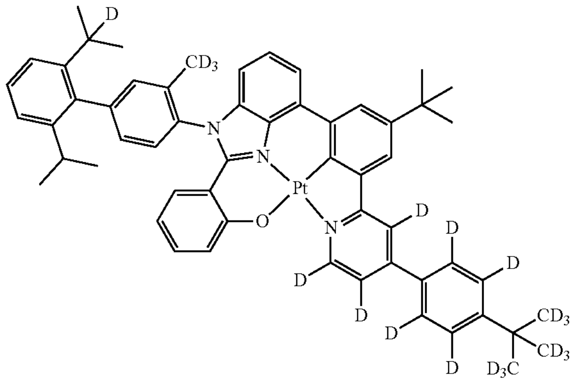
2781
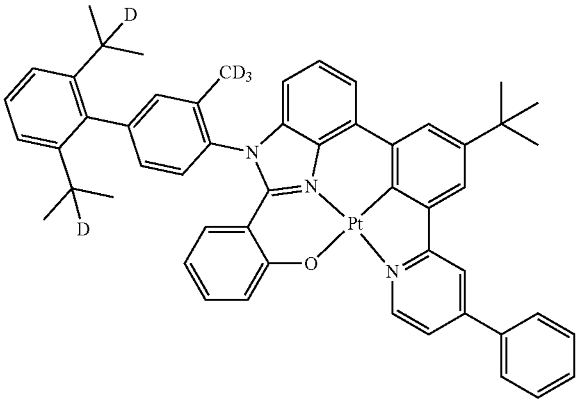
2782
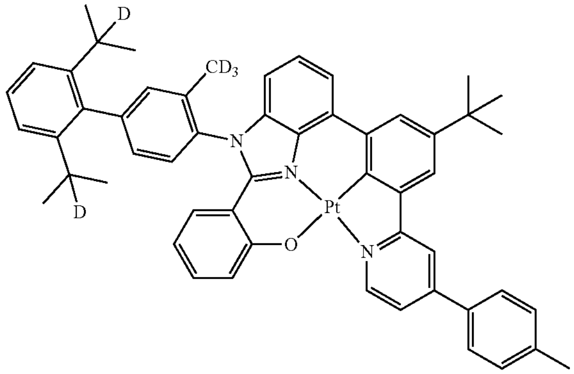
2783
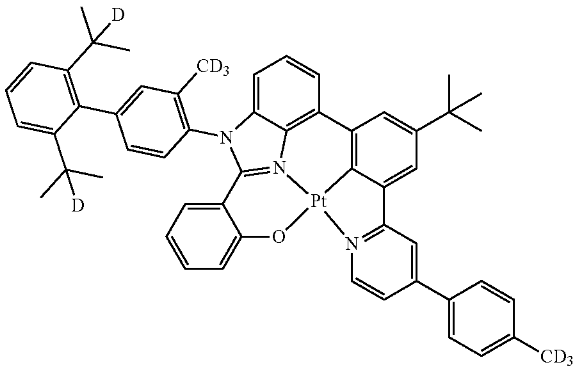
-continued
2784
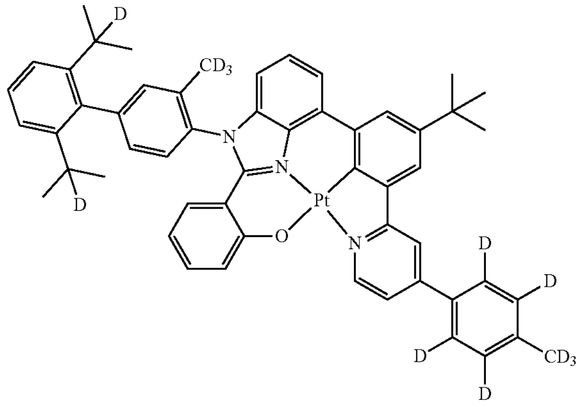
2785
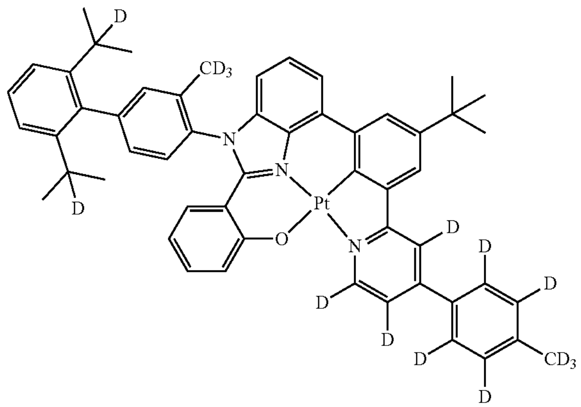
2786
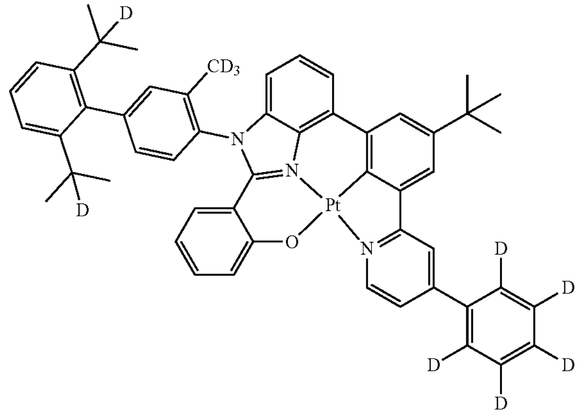

-continued
2787
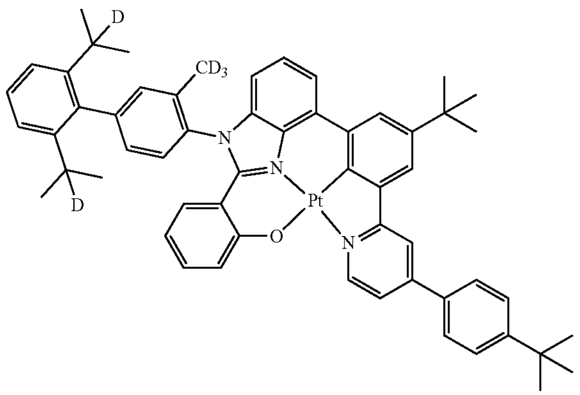
2788
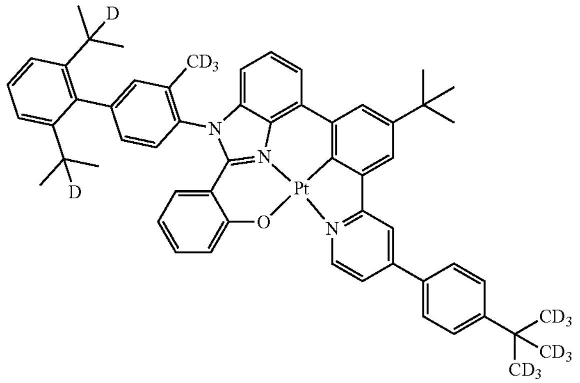
2789
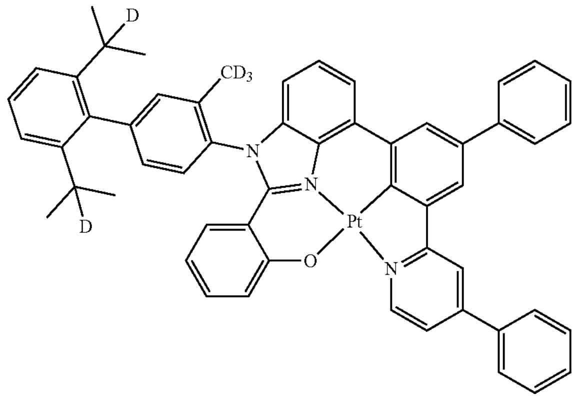
2790
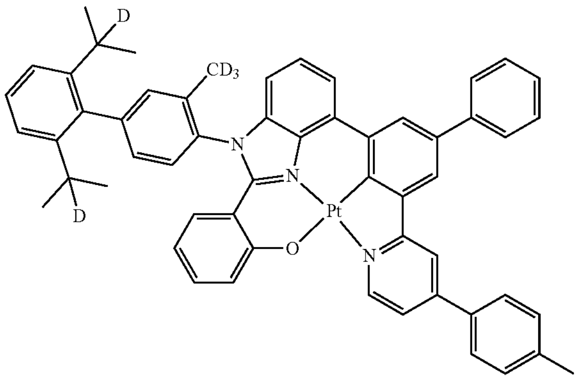
-continued
2991
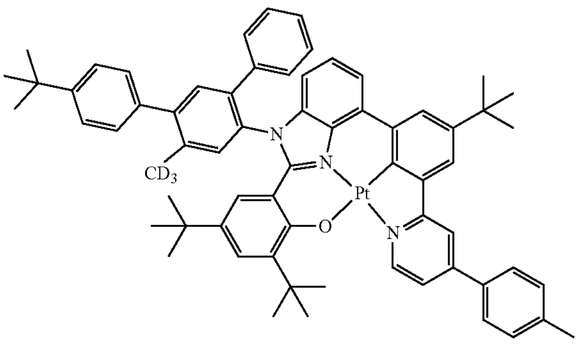
2992
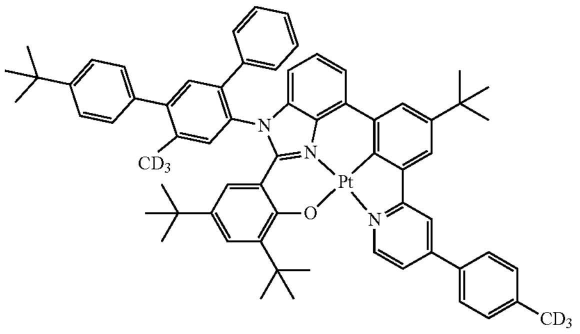
2993
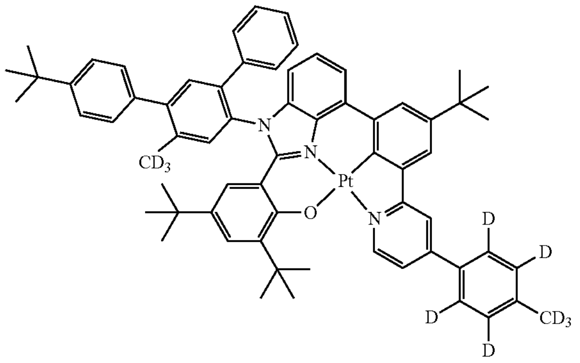
2994
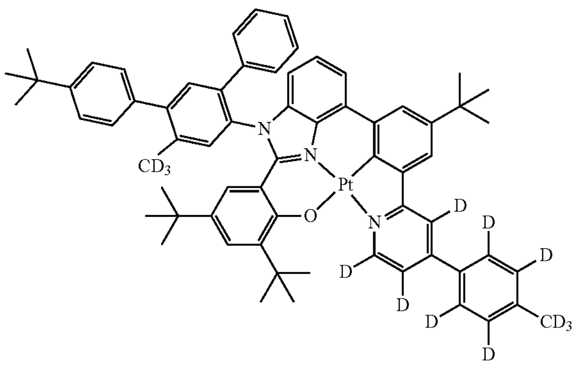

-continued
2995
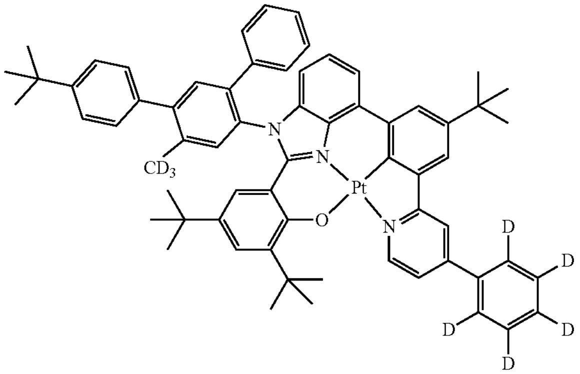
2996
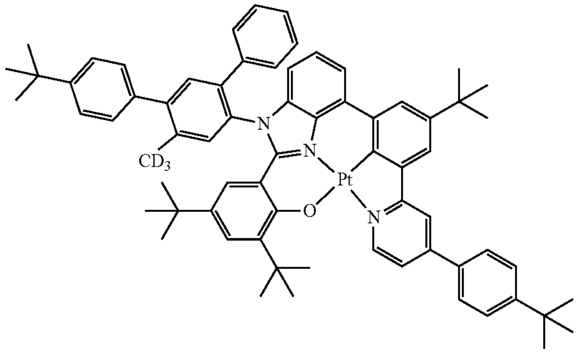
2997
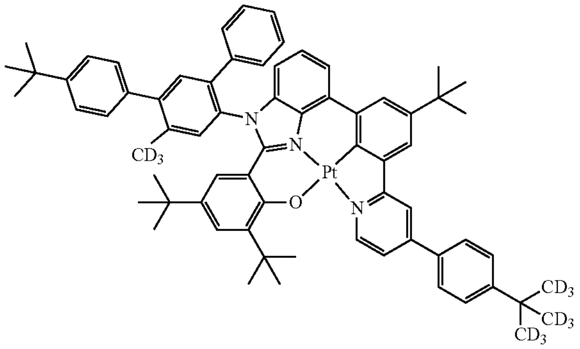
2998
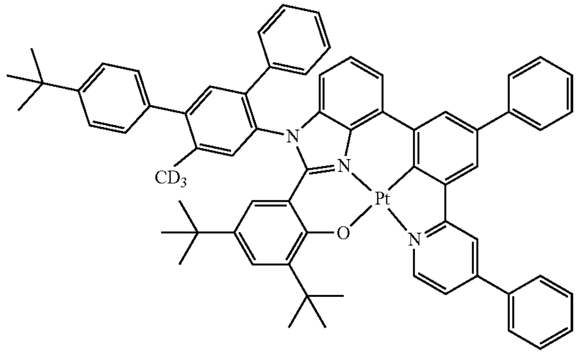
-continued
2999
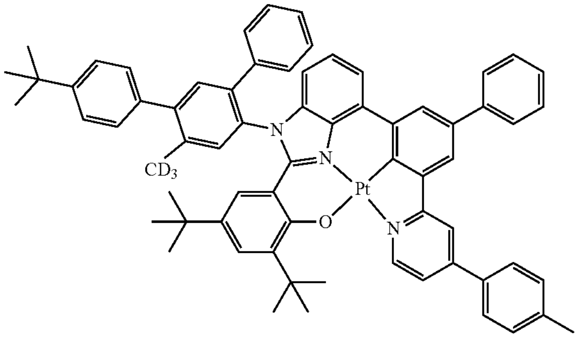
3000
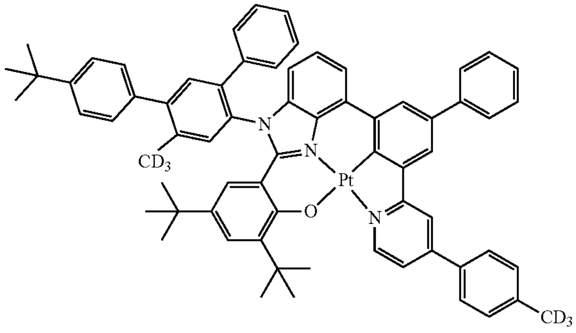
3001
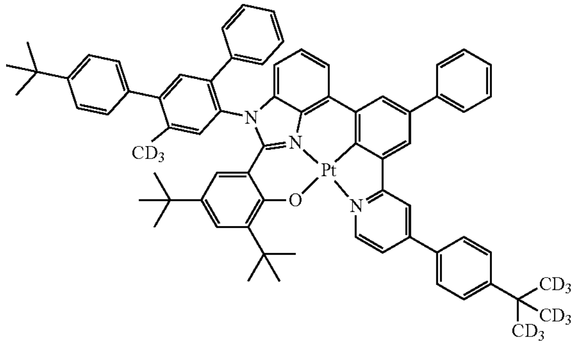
3002
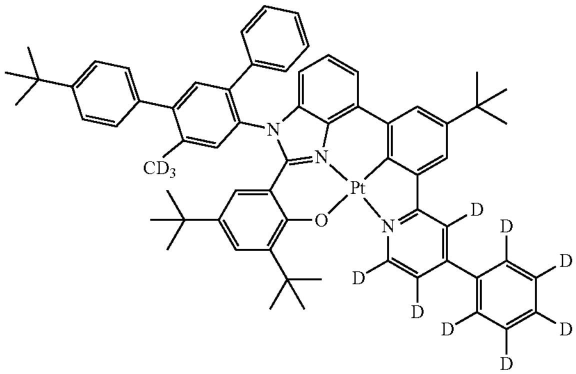

3515
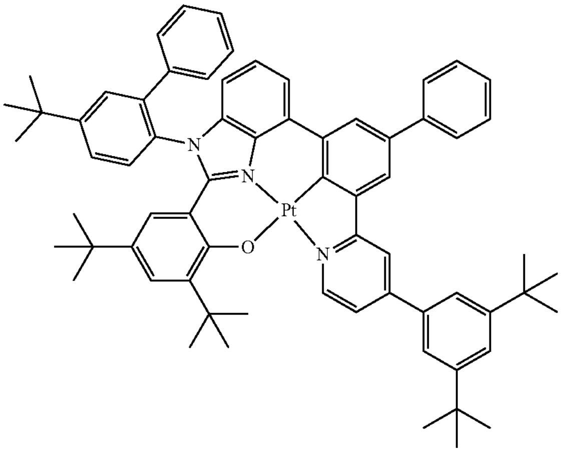
3516
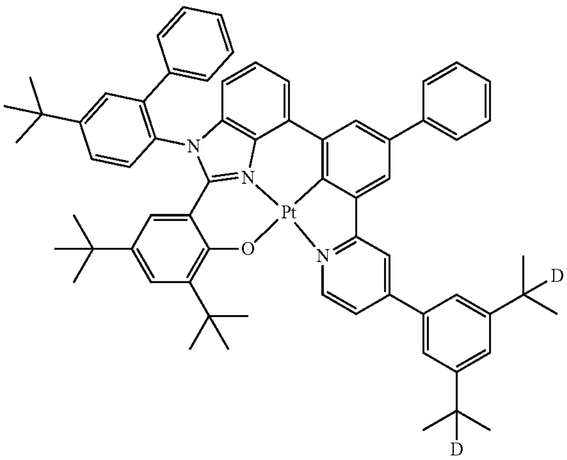
3517
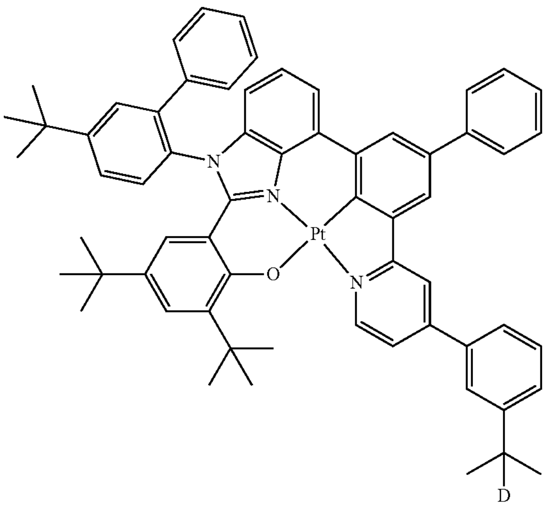
3518
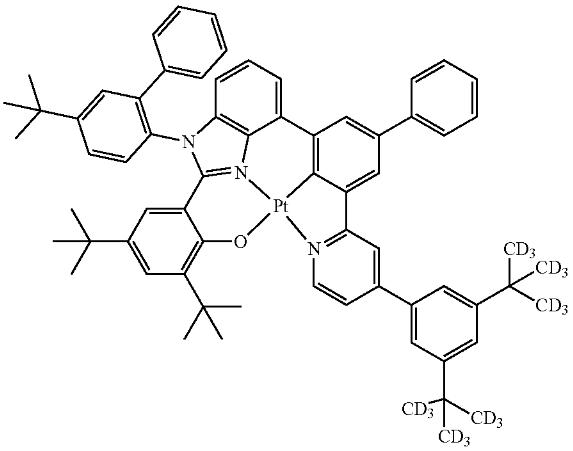
3519
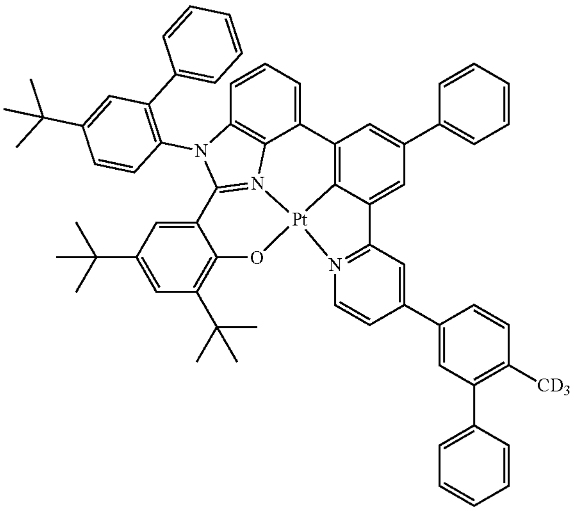
3520
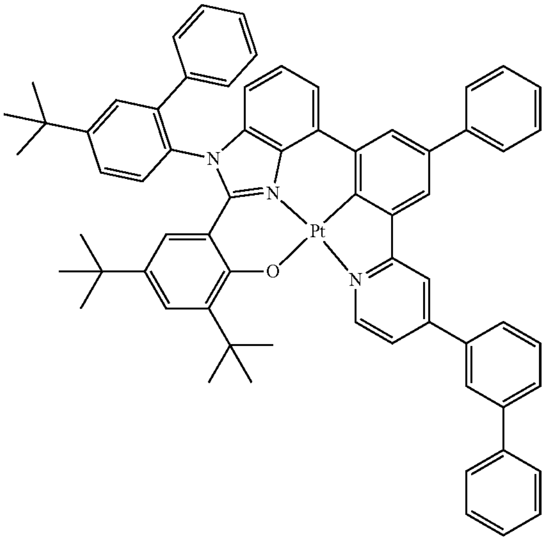

-continued
3521
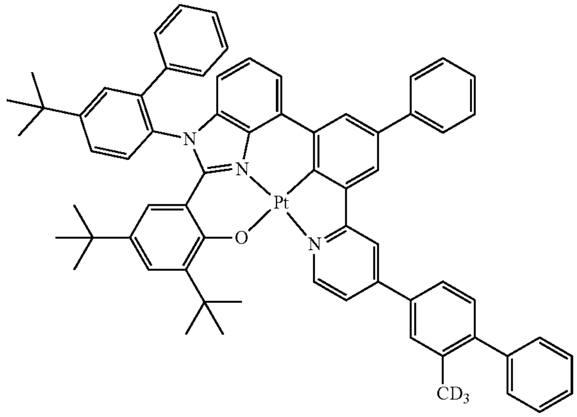
3522
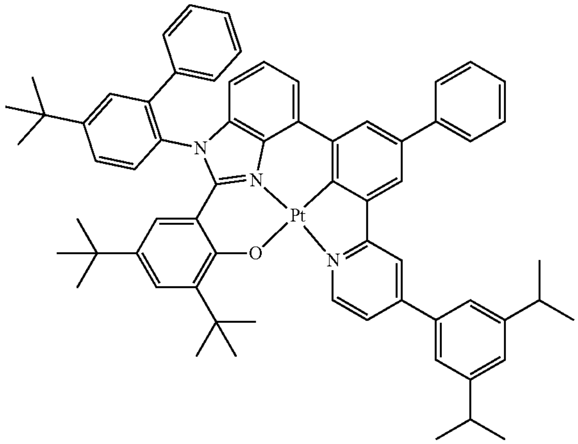
Group 1-3
37
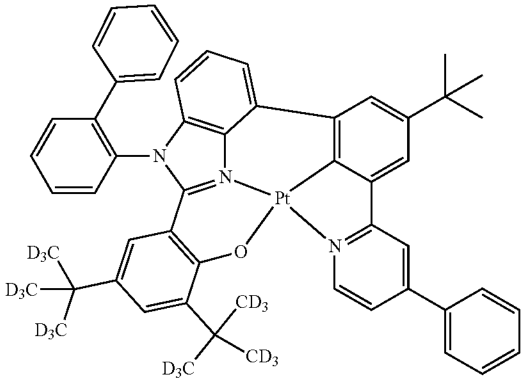
-continued
38
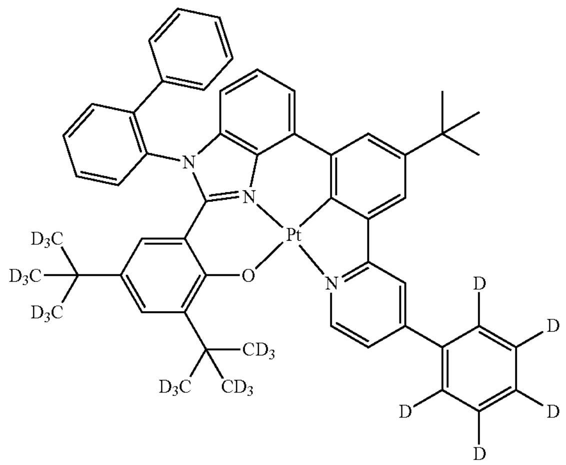
39
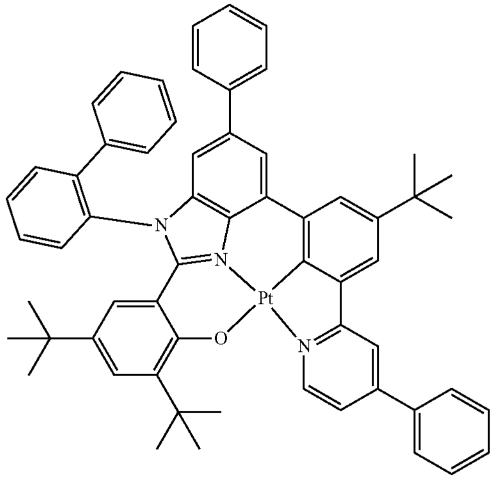
40
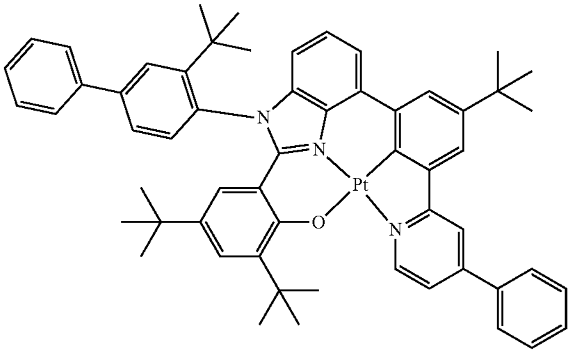

-continued
41
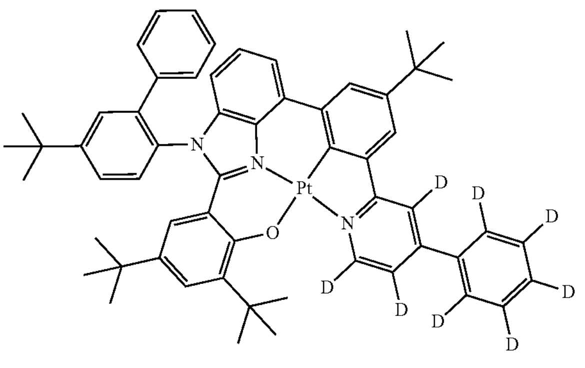
42
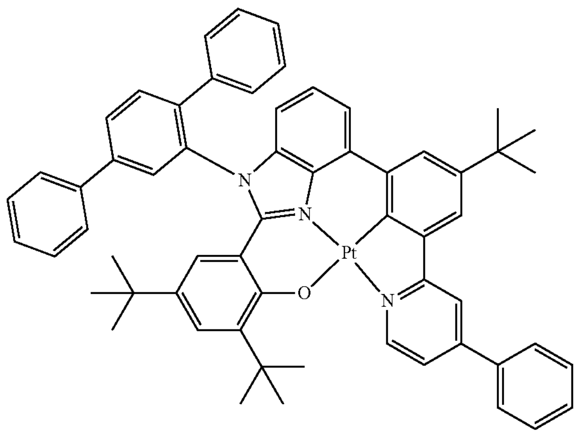
43
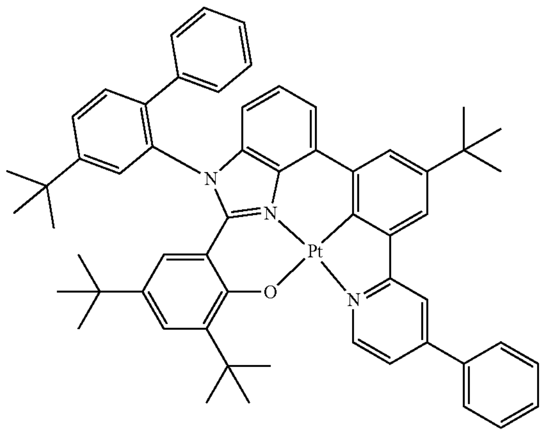
-continued
44
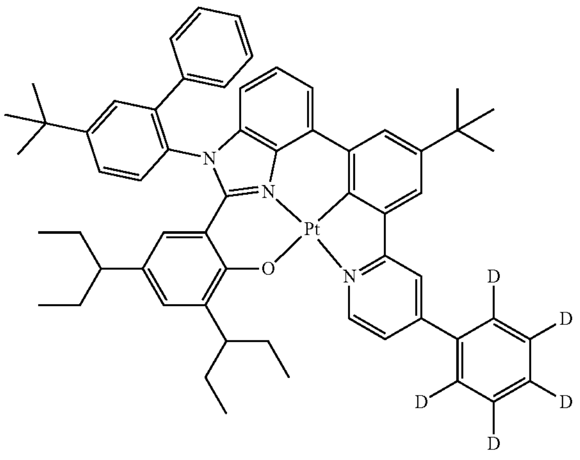
45
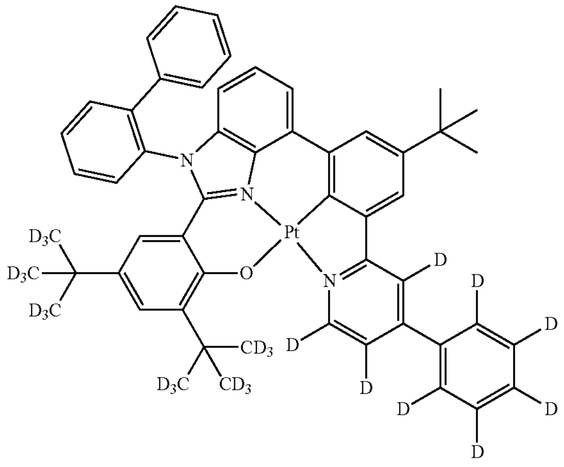
46
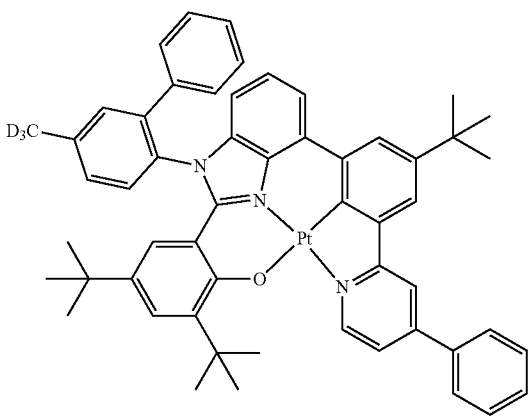

-continued
47
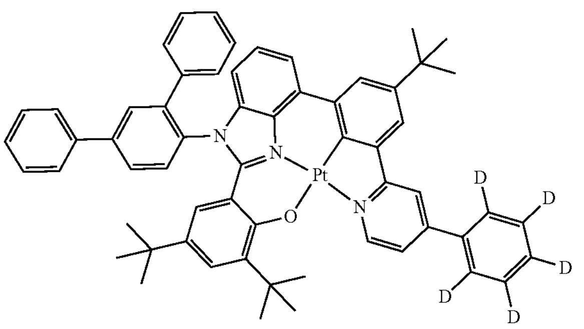
48
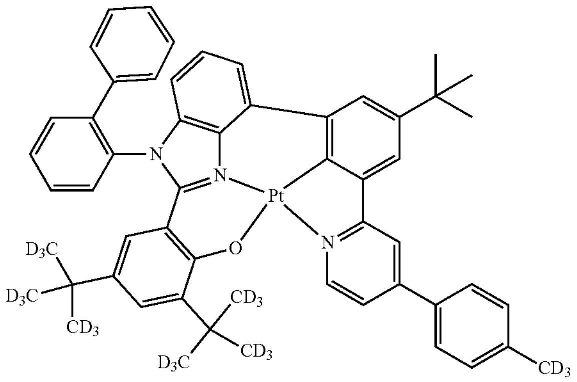
49
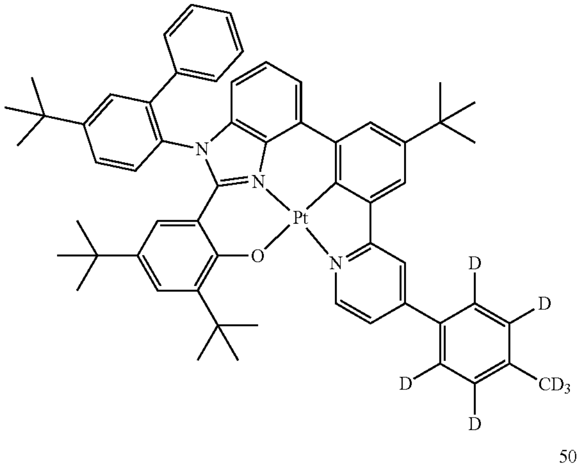
50
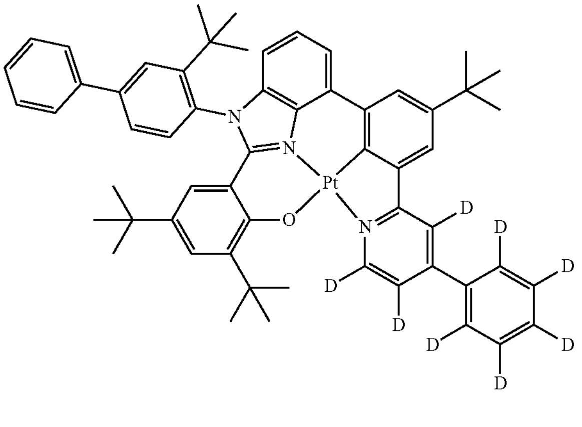
-continued
51
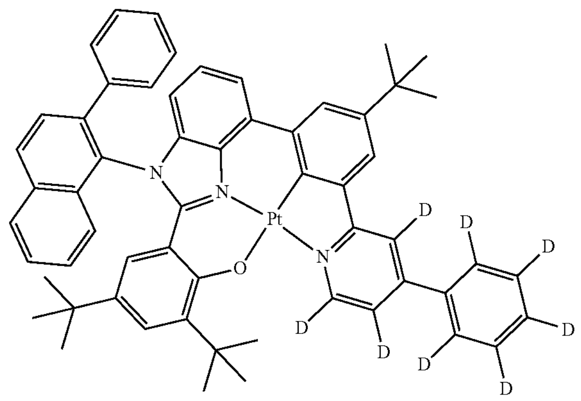
52
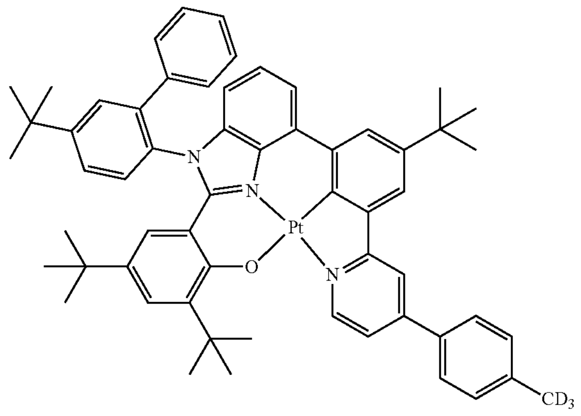
53
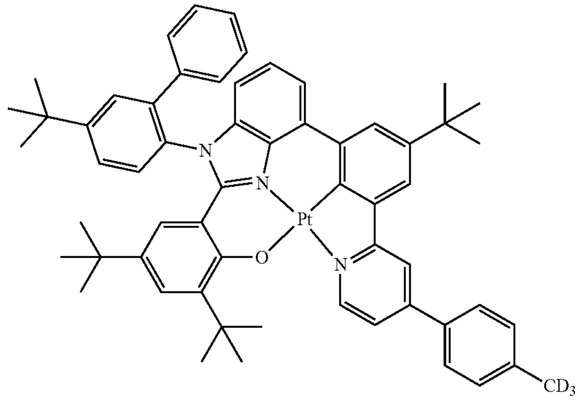

-continued
54
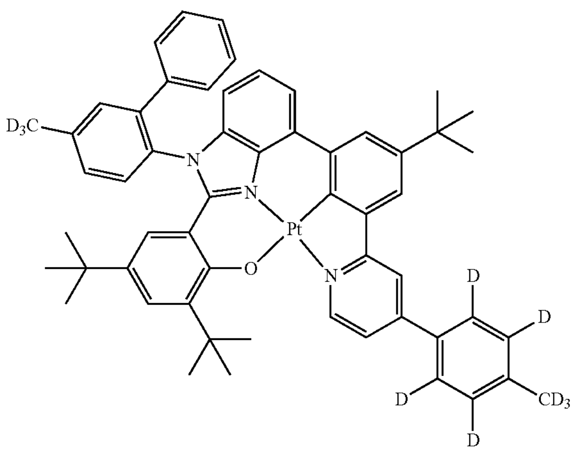
55
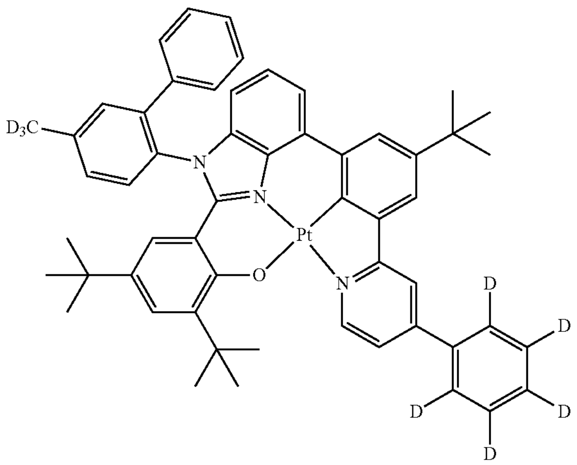
56
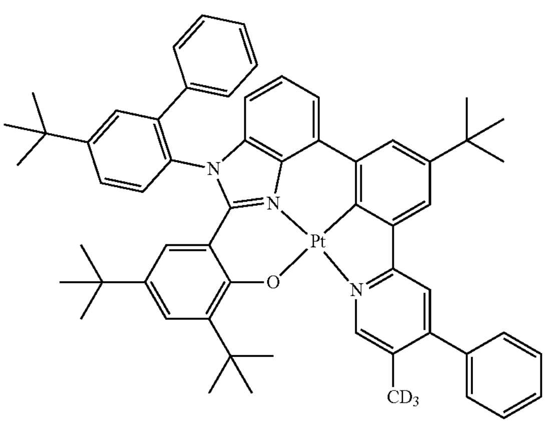
-continued
57
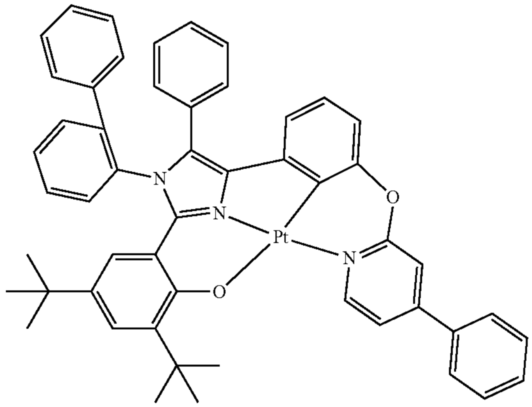
58
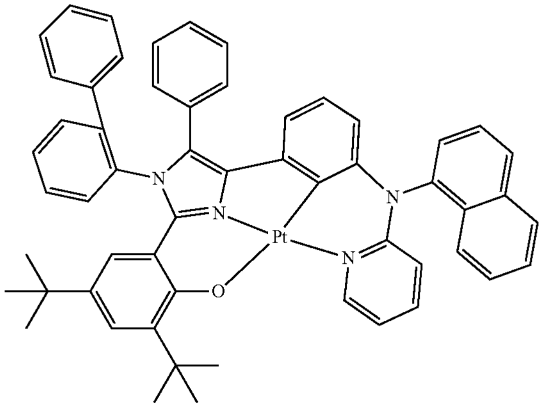
59
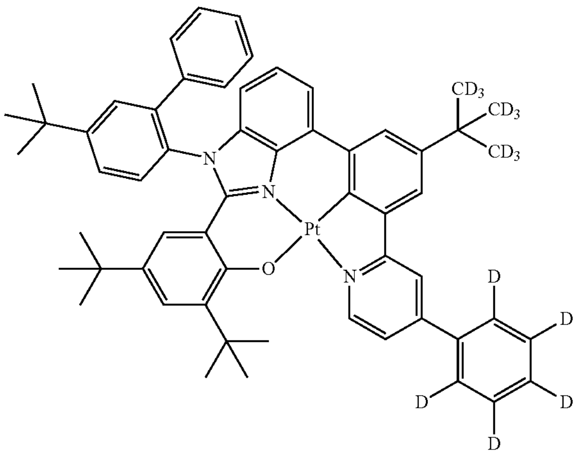

-continued
60
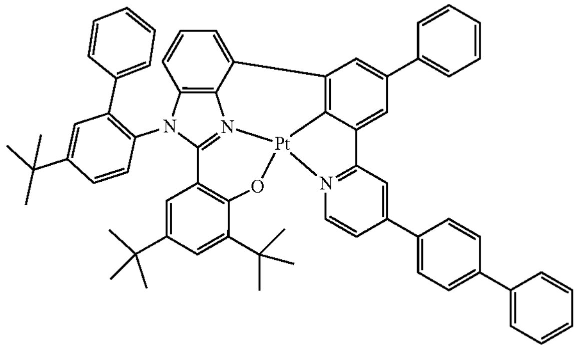
61
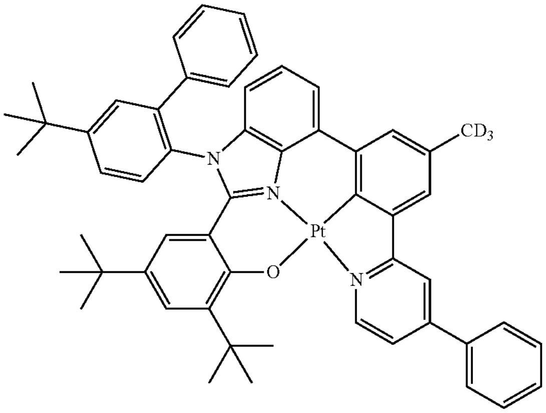
62
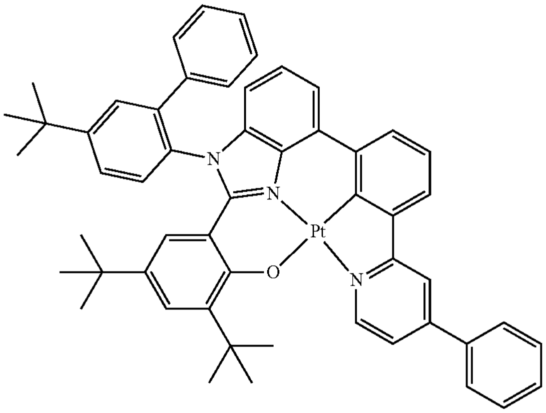
-continued
63
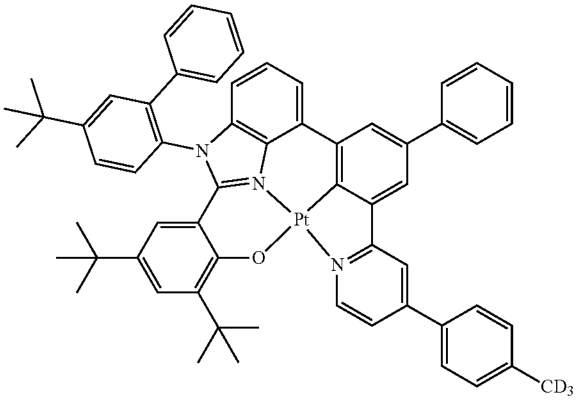
64
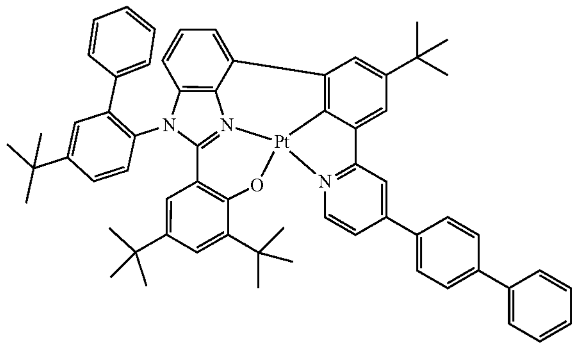
65
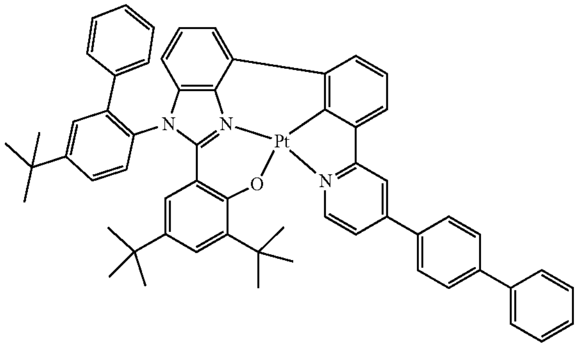
66
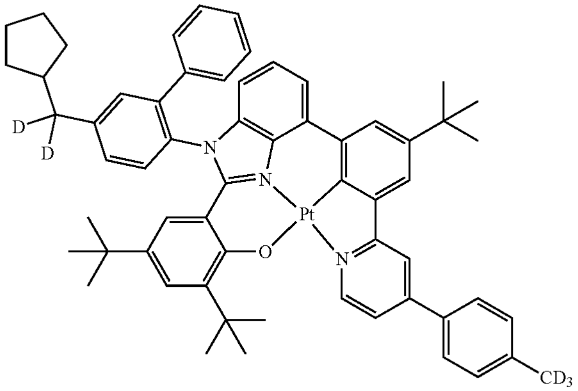

-continued
67
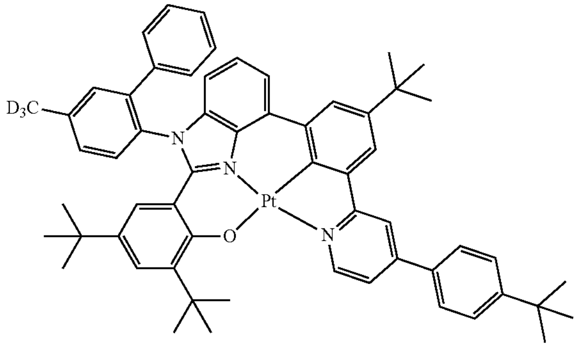
68
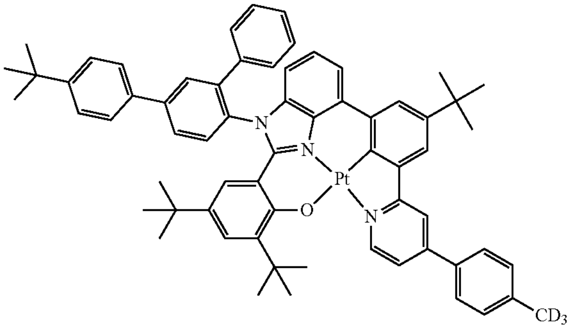
69
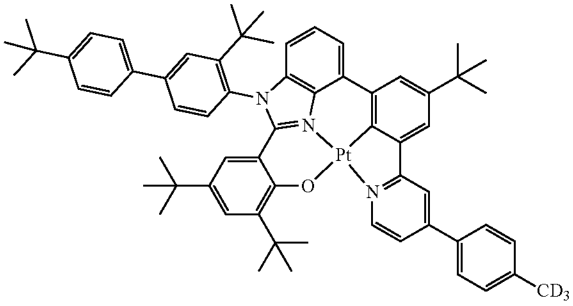
70
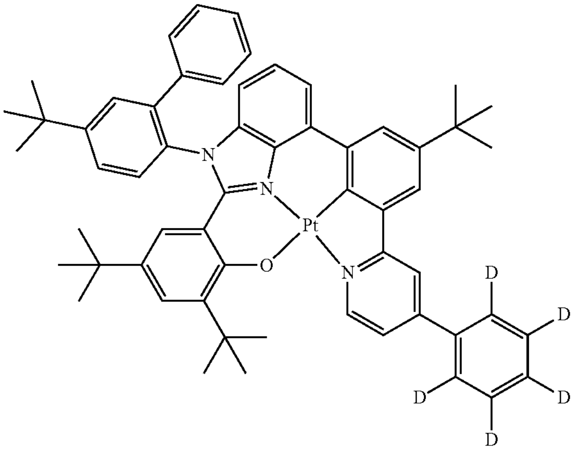
-continued
71
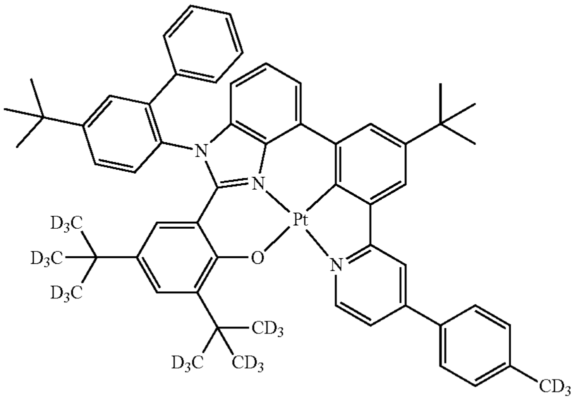
72
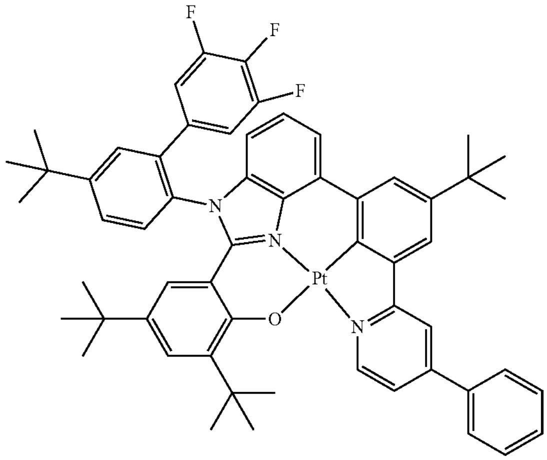
Group 1-4
1
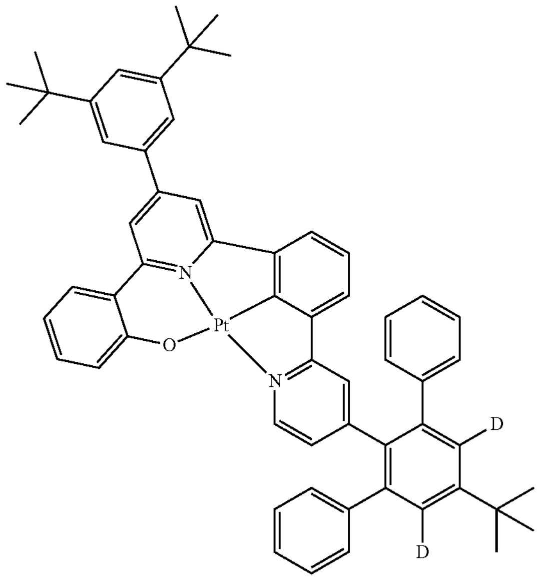

-continued
2
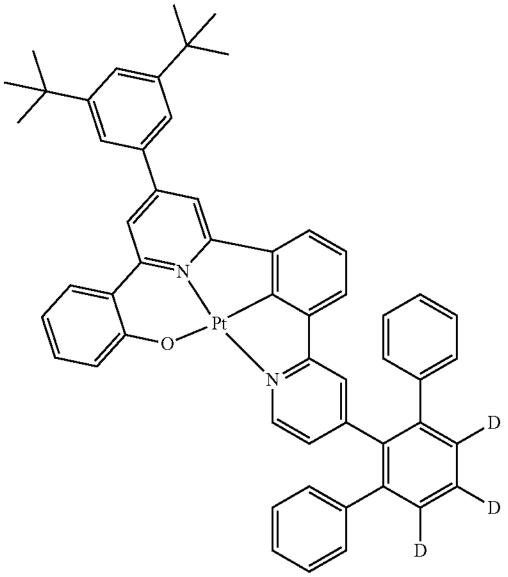
3
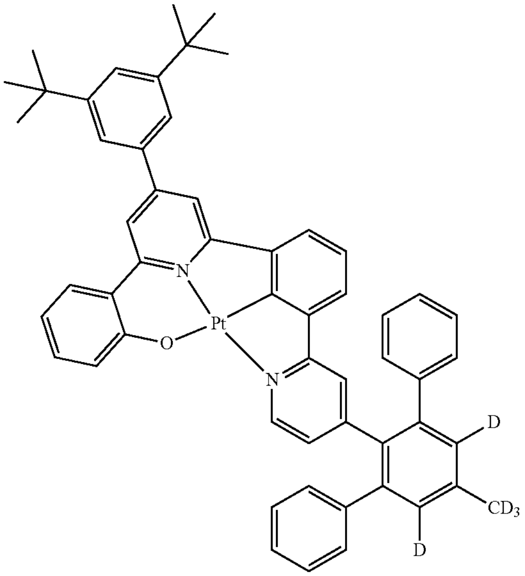
Group 2-1
1
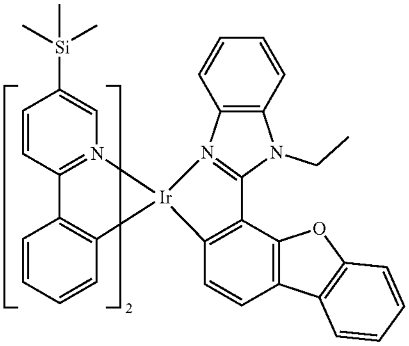
-continued
2
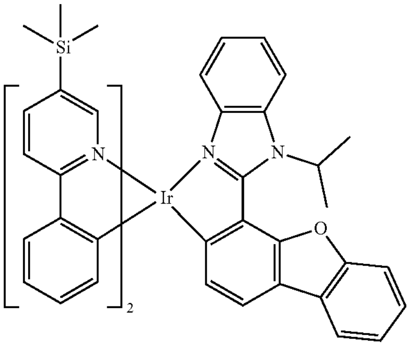
3
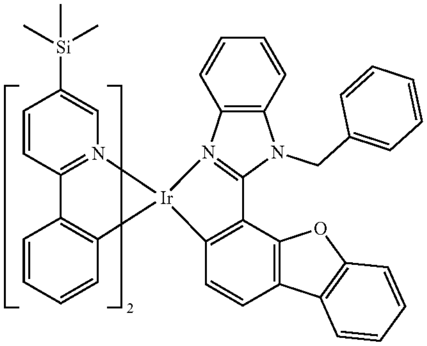
4
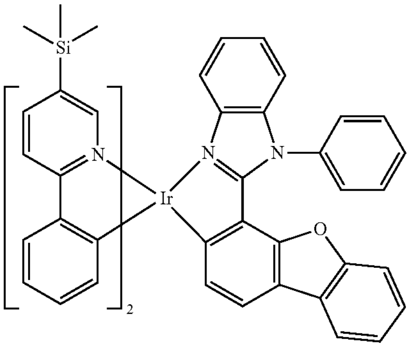
5
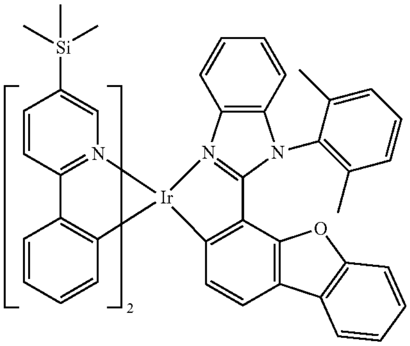

-continued
6
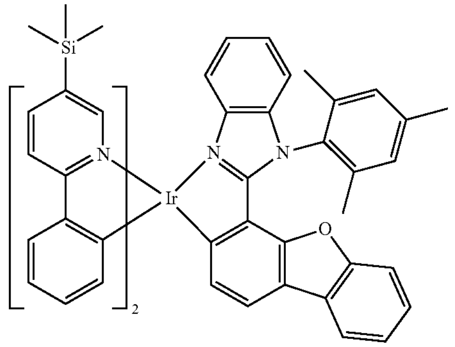
7
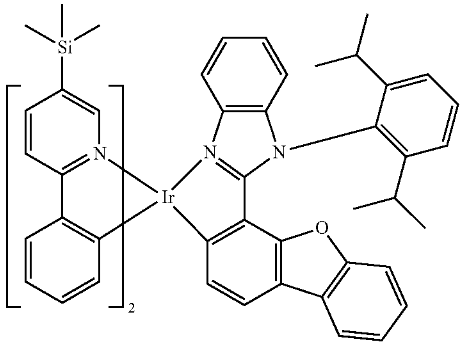
8
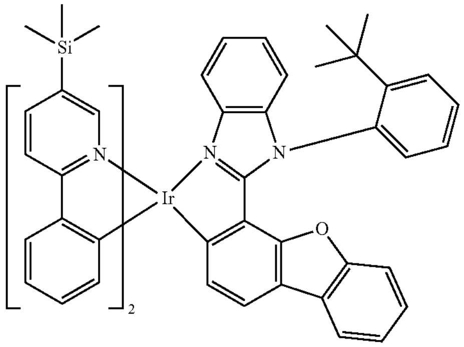
9
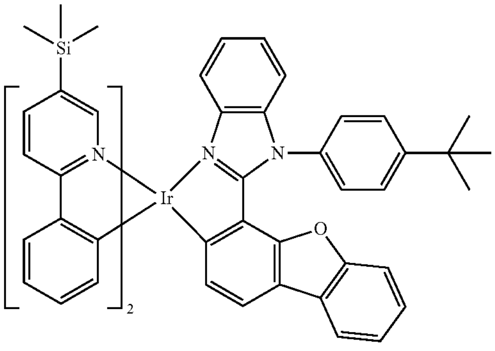
-continued
10
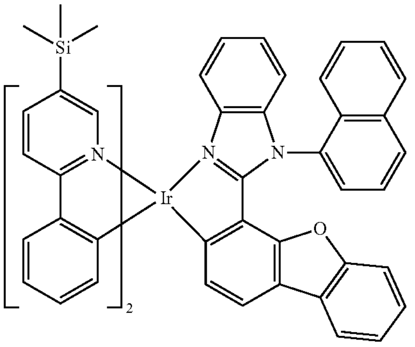
11
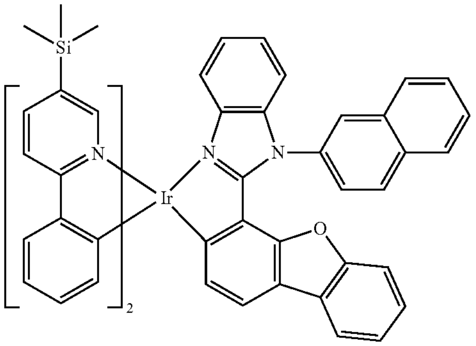
12
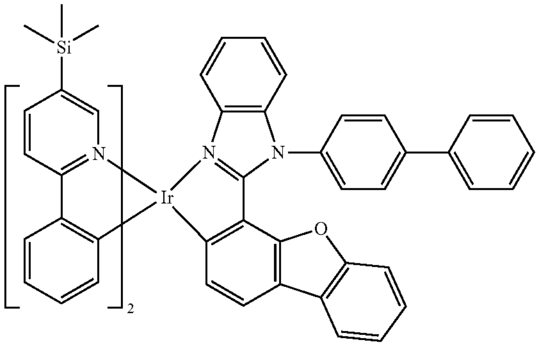
13
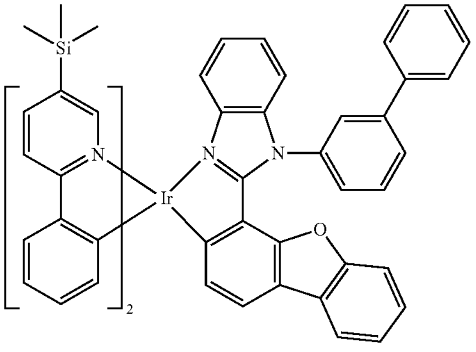

-continued
14
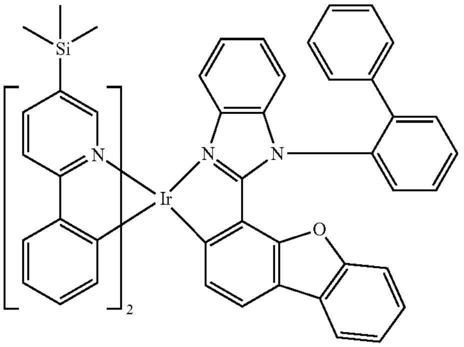
15
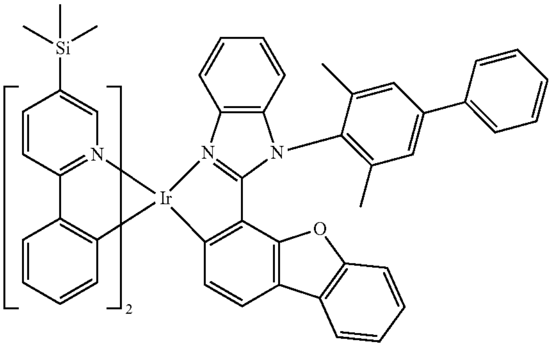
16
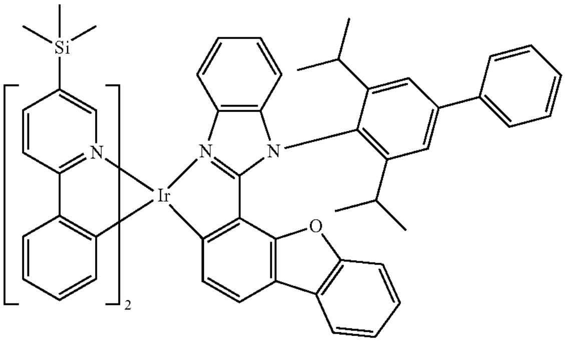
17
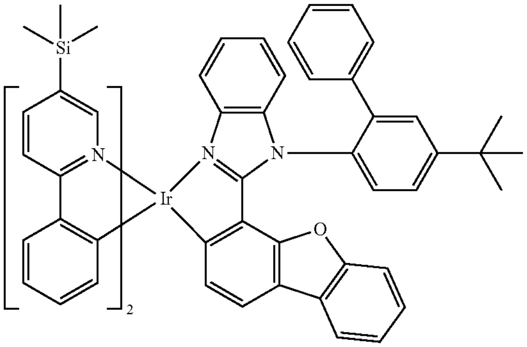
-continued
18
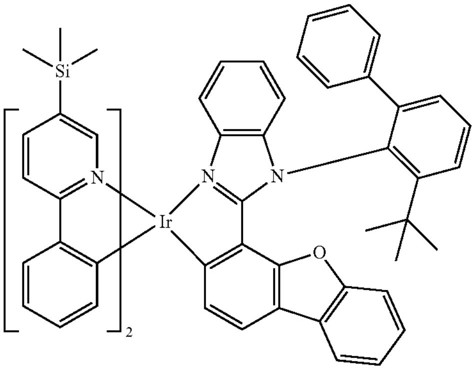
19
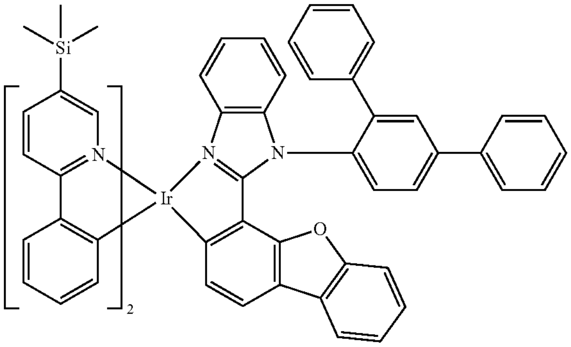
20
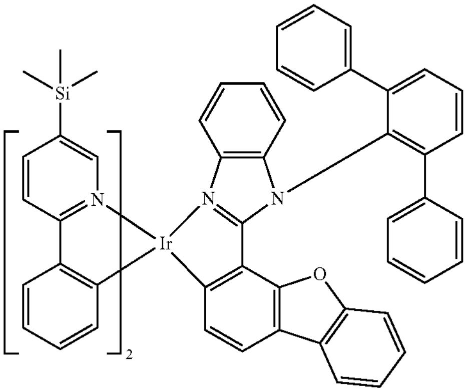
21
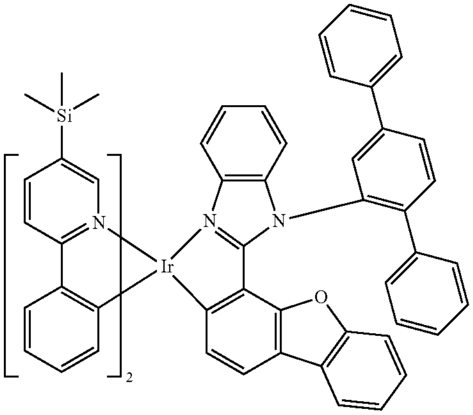

-continued
22
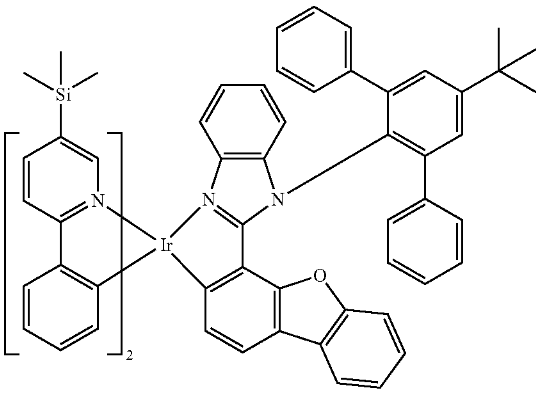
23
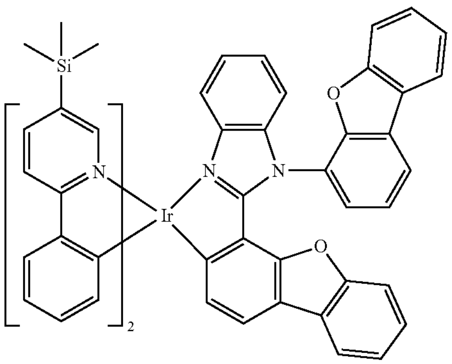
24
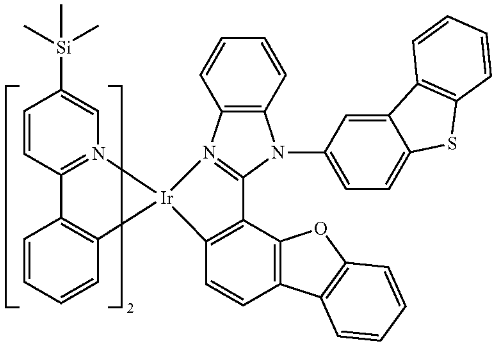
25
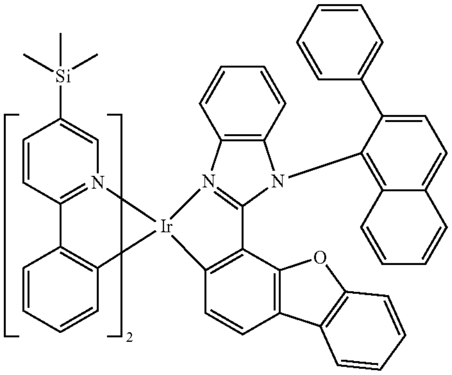
-continued
76
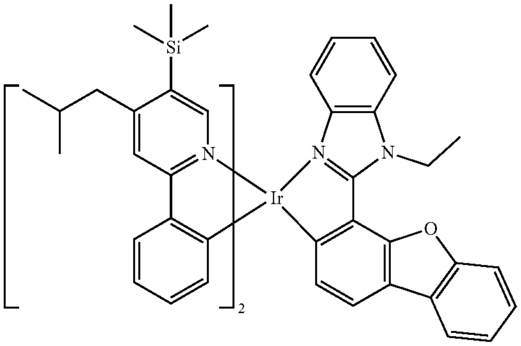
77
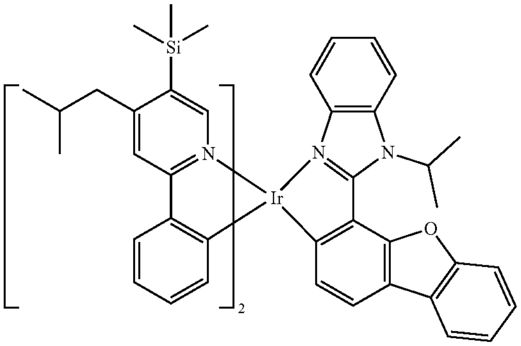
78
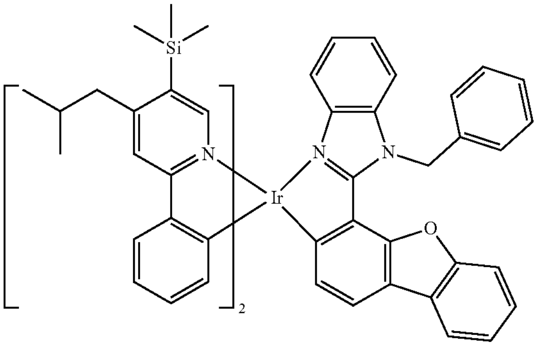
79
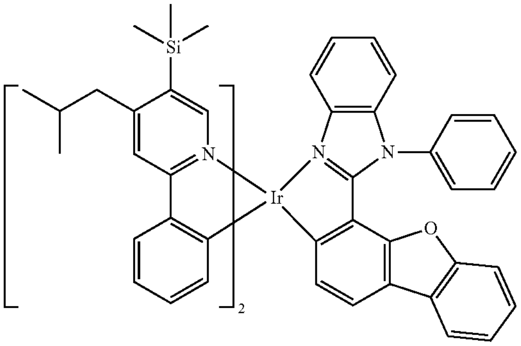

-continued
80
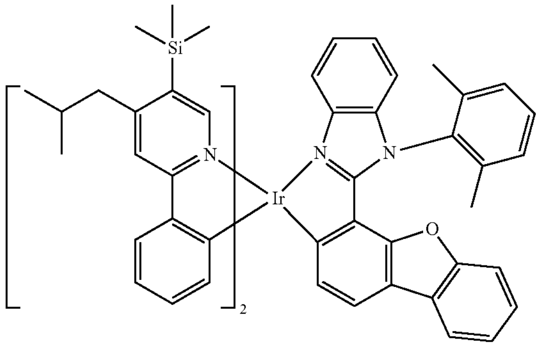
81
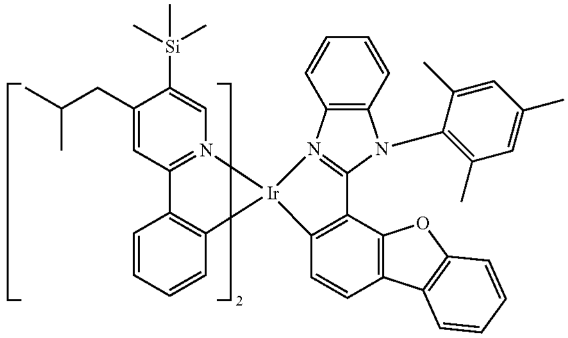
82
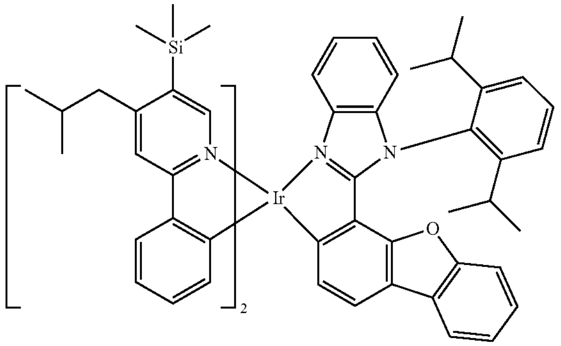
83
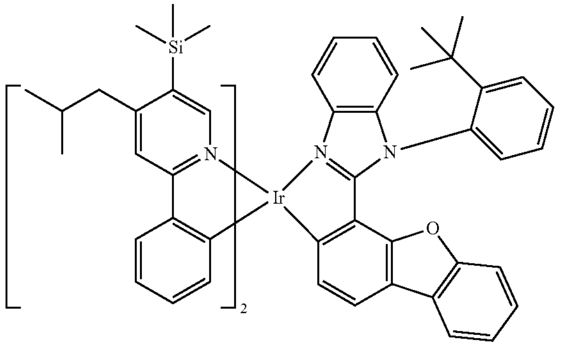
-continued
84
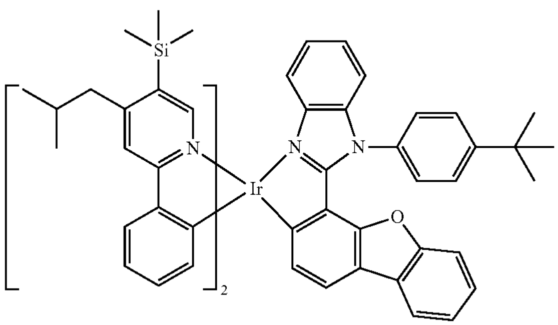
85
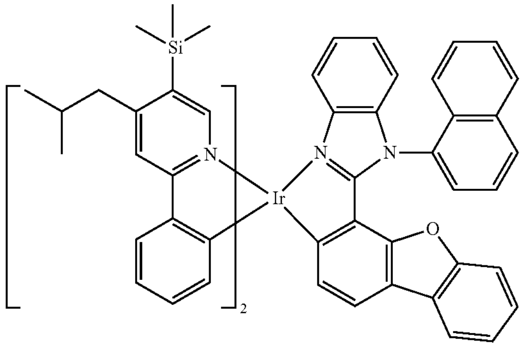
86
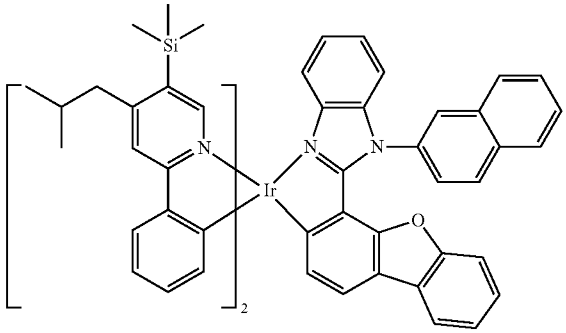
87
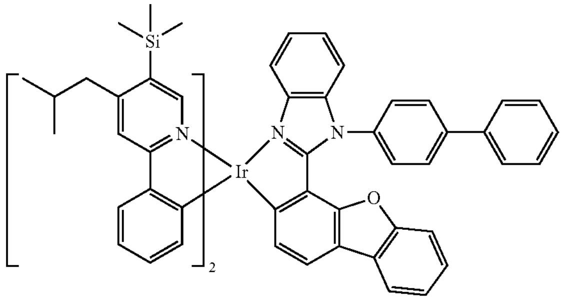

-continued
88
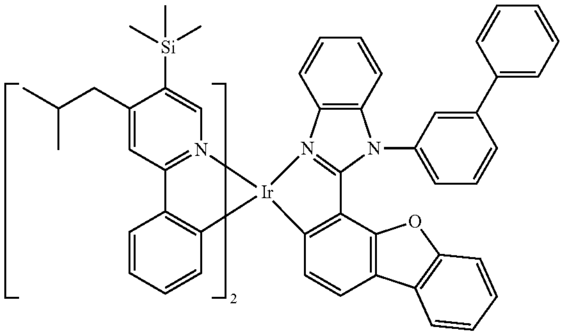
89
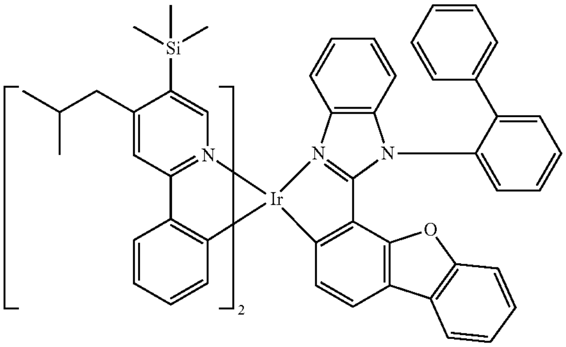
90
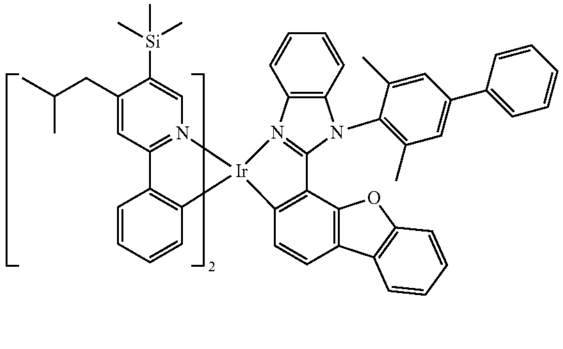
91
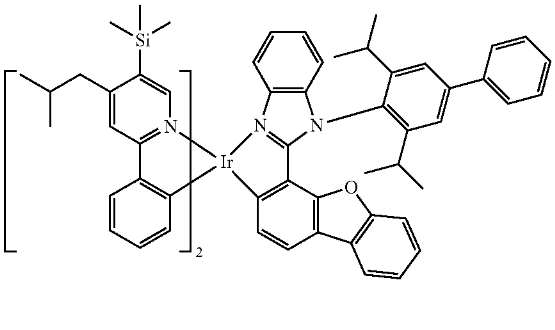
-continued
92
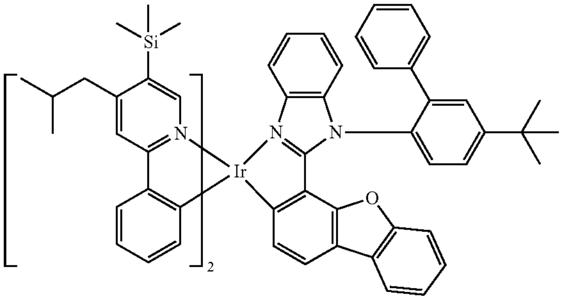
93
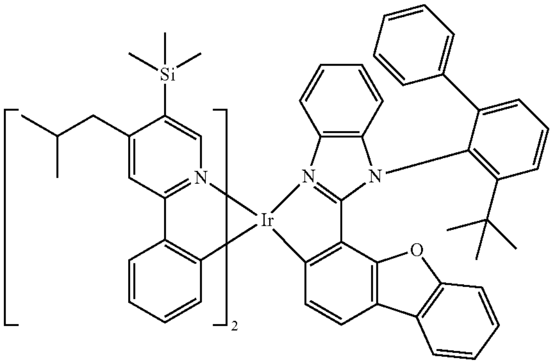
94
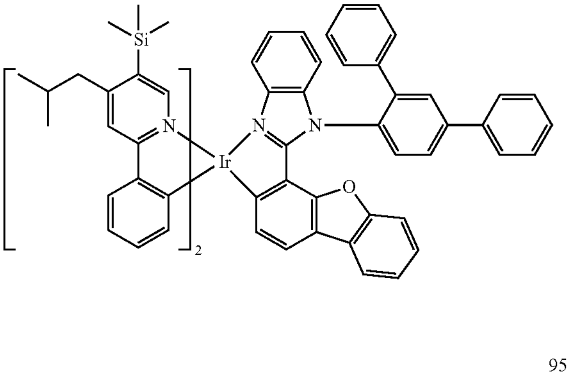
95
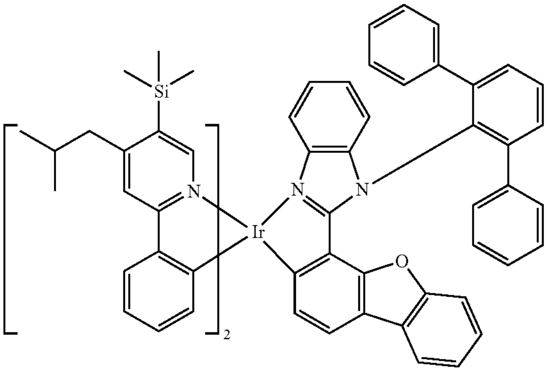

-continued
96
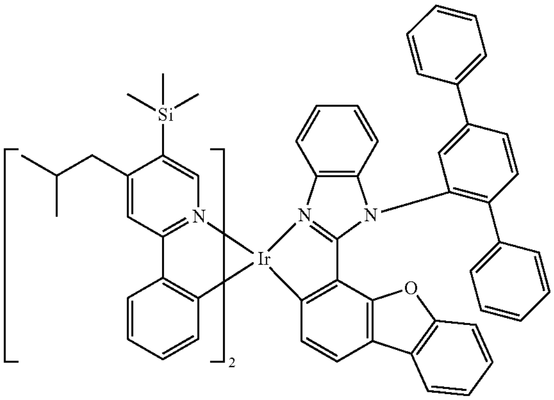
97
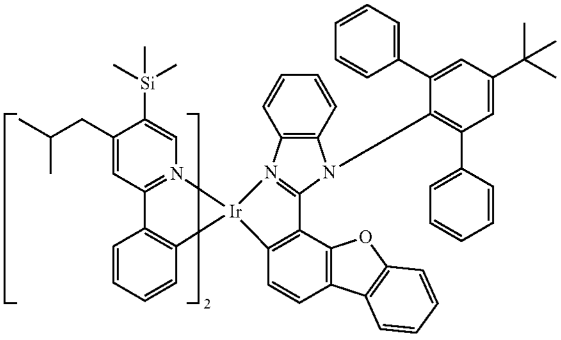
98
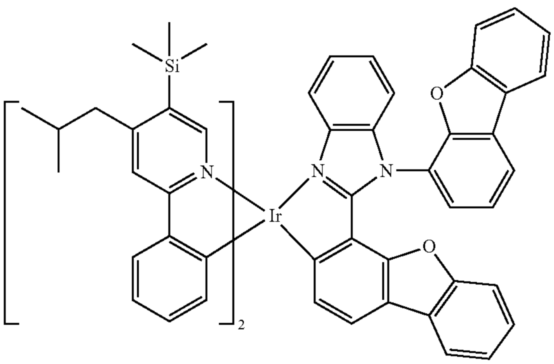
99
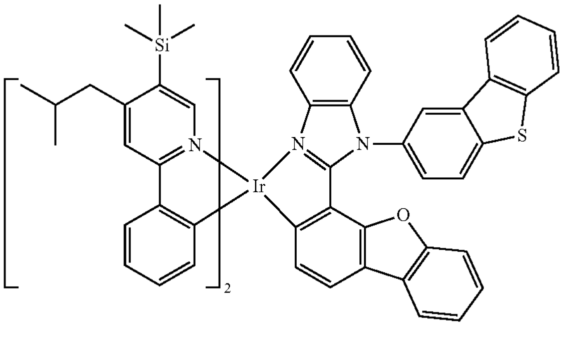
-continued
100
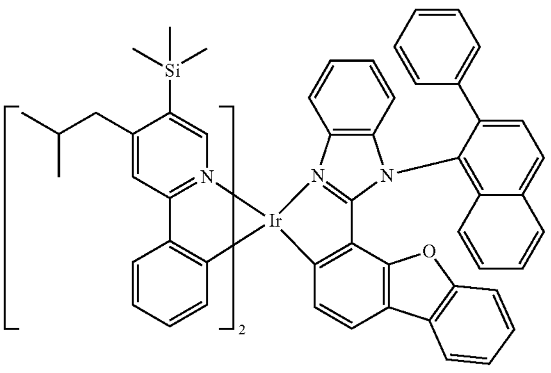
101
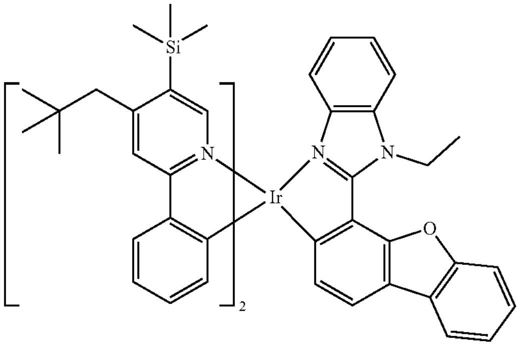
102
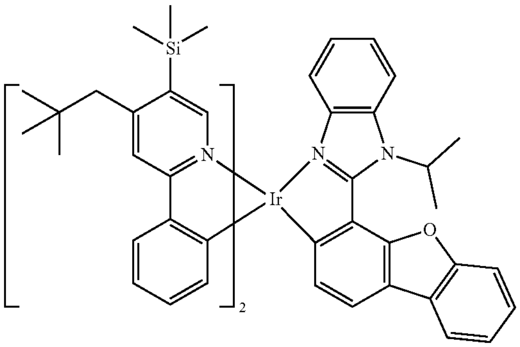
103
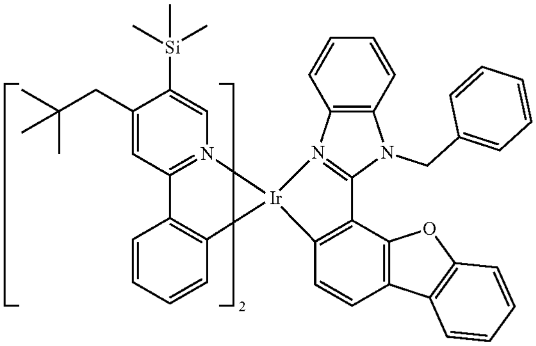

-continued
104
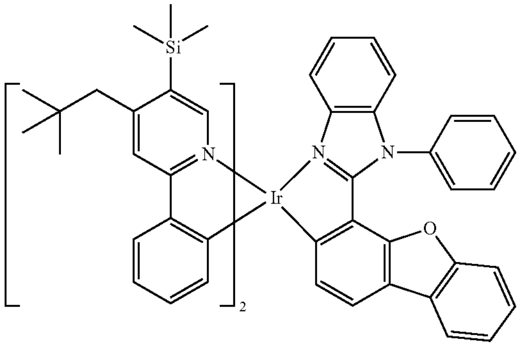
105
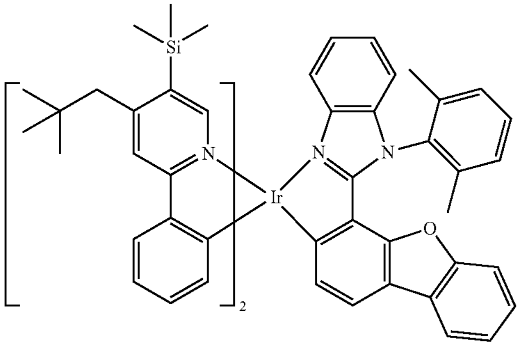
106
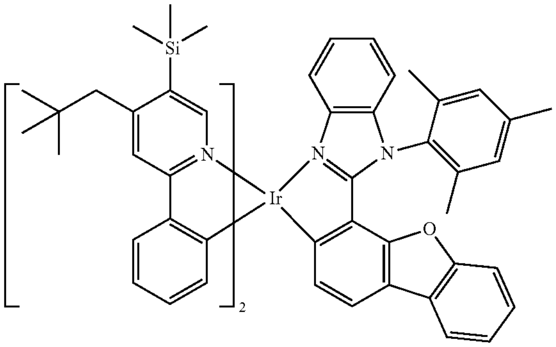
107
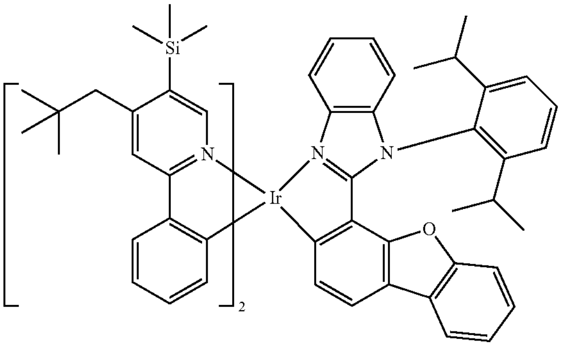
-continued
108
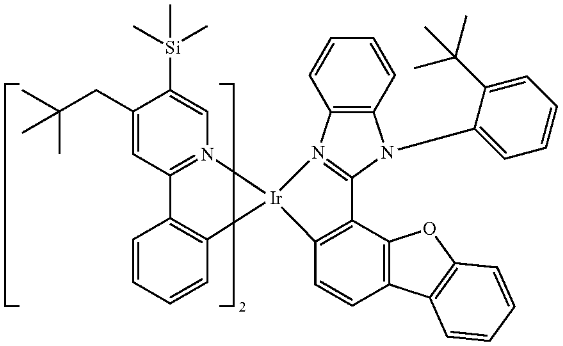
109
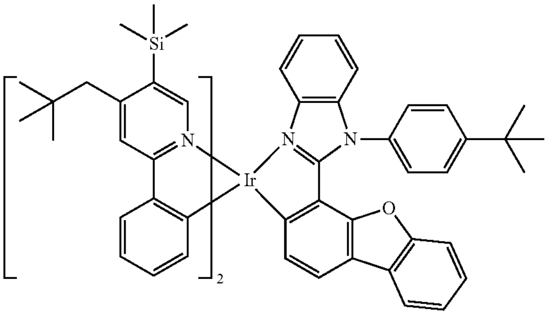
110
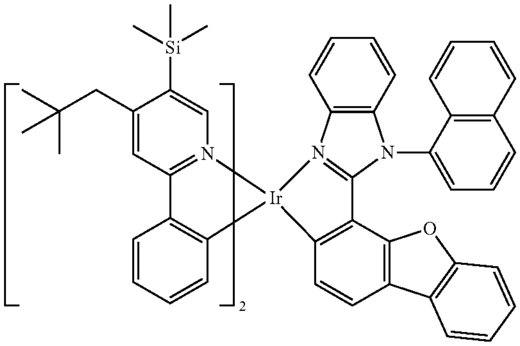
111
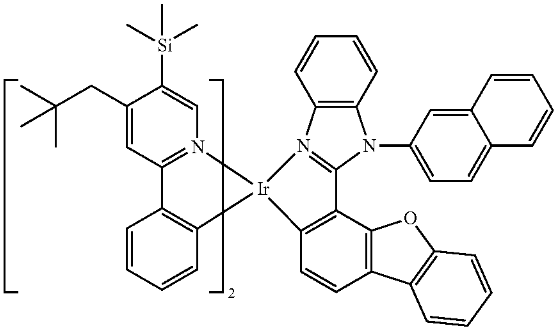

-continued
112
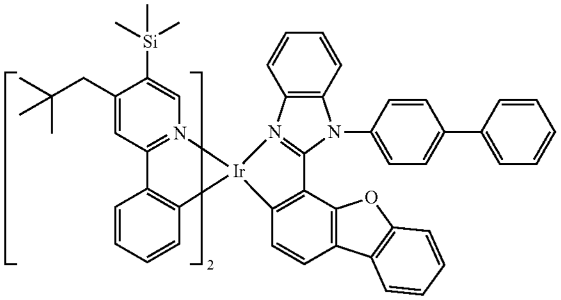
113
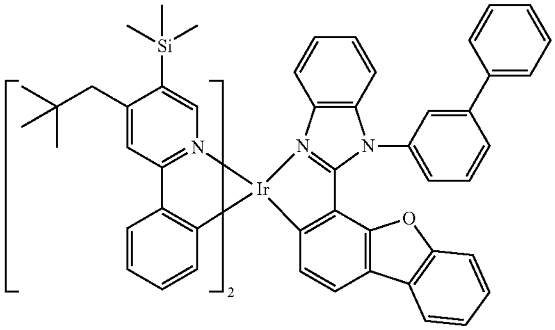
114
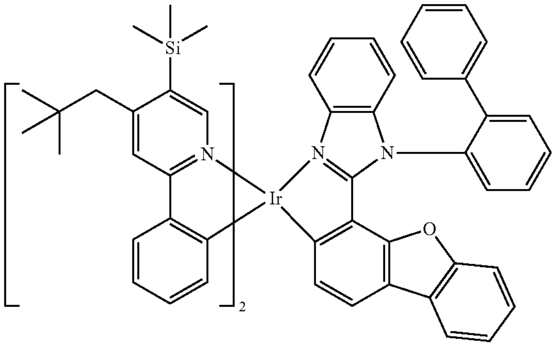
115
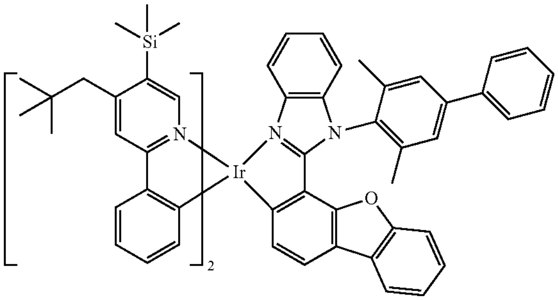
-continued
116
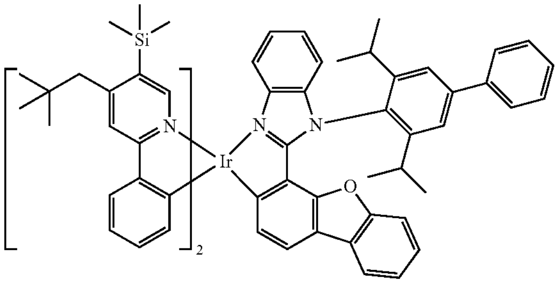
117
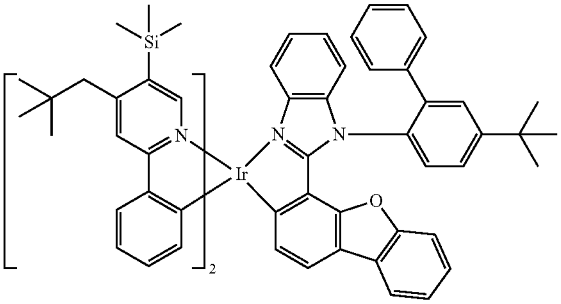
118
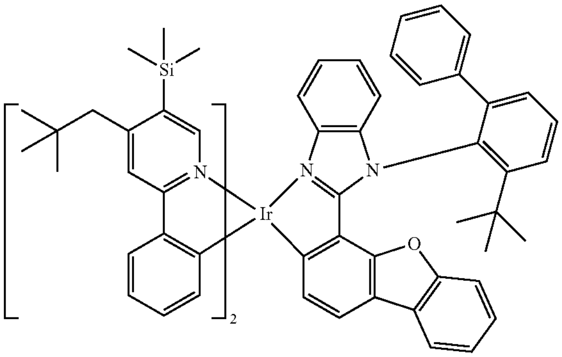
119
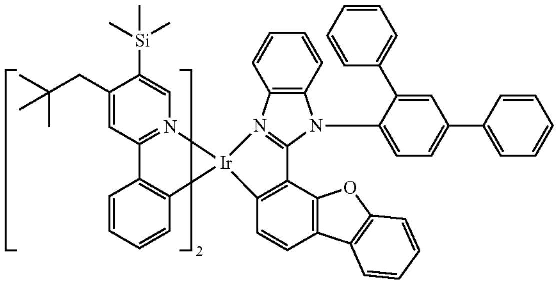

-continued
120
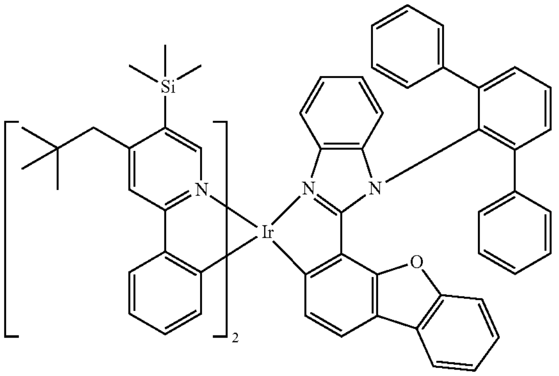
121
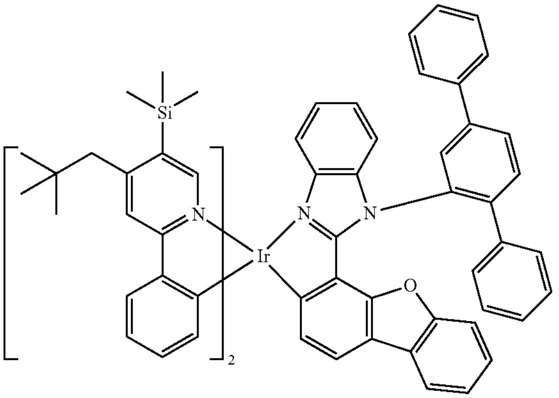
122
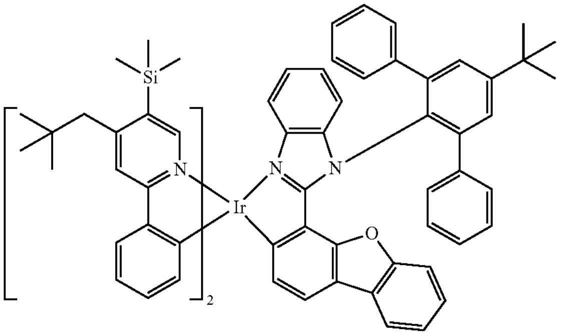
123
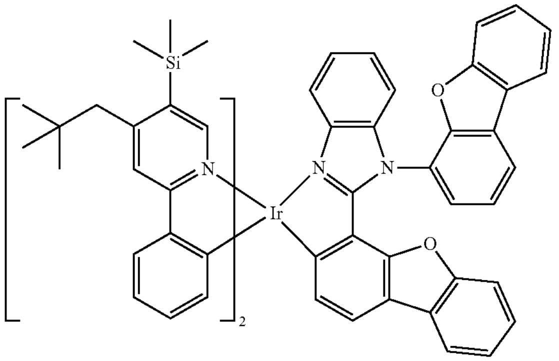
-continued
124
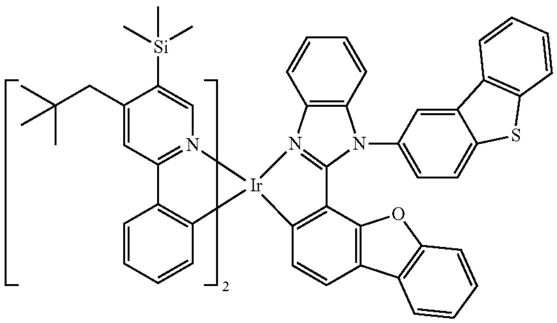
125
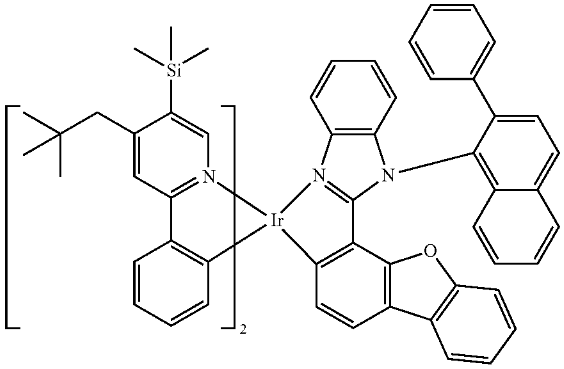
526
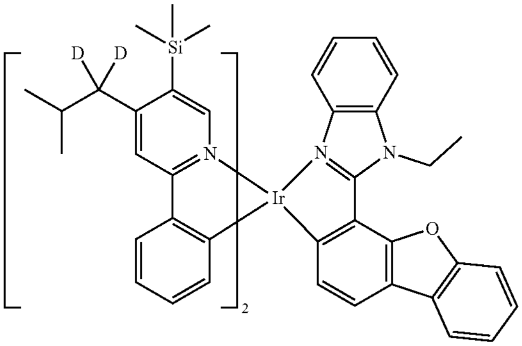
527
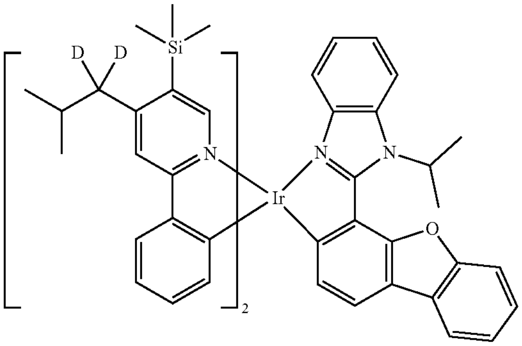

198
-continued
528
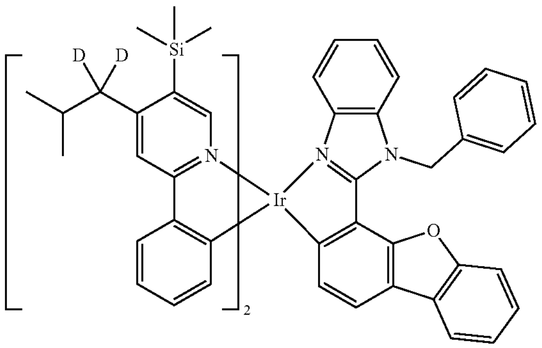
529
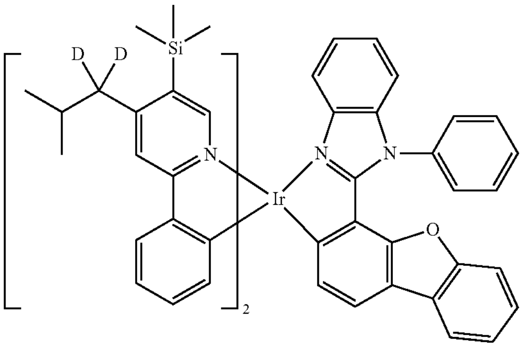
530
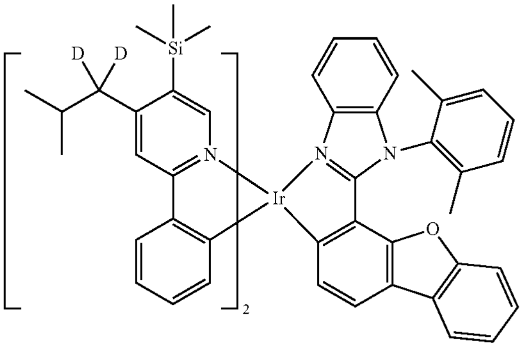
531
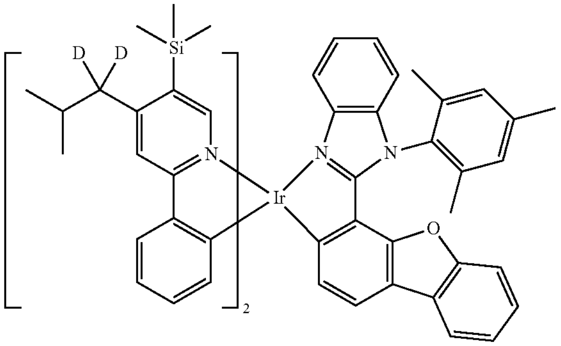
532
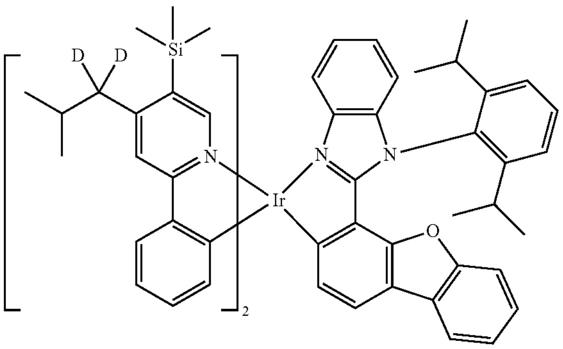
533
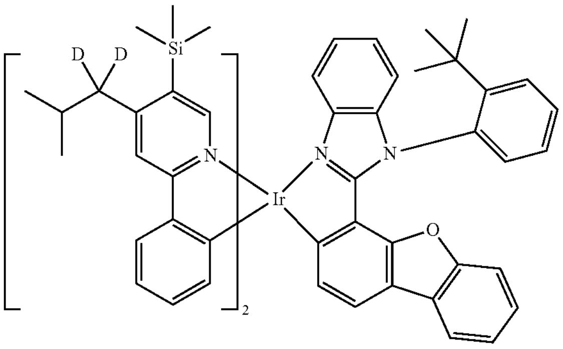
534
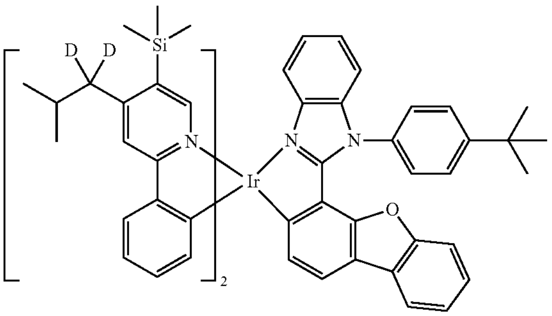
535
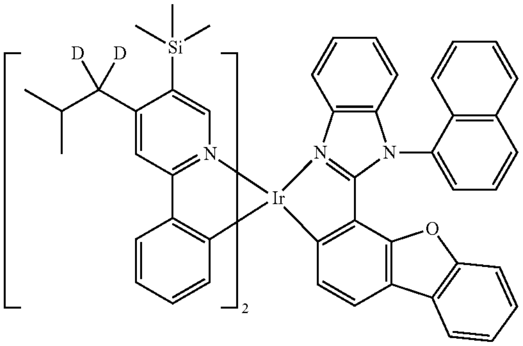

536
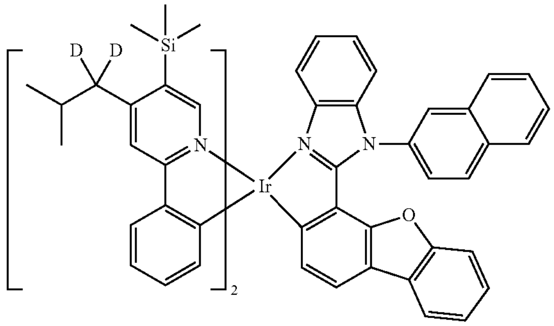
537
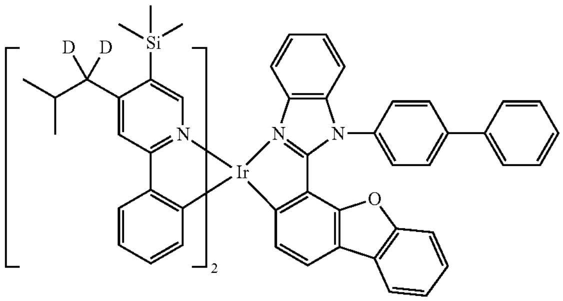
538
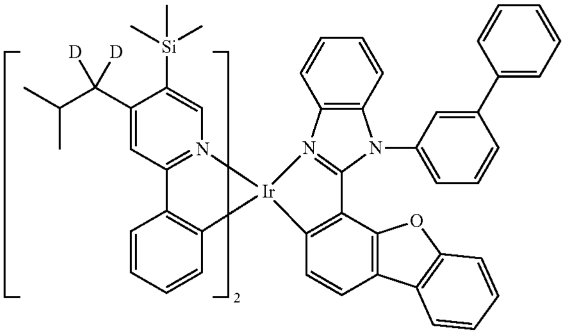
539
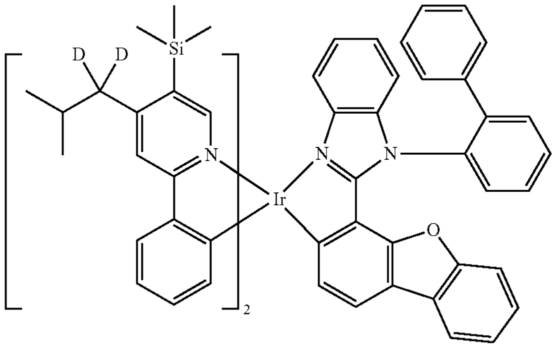
540
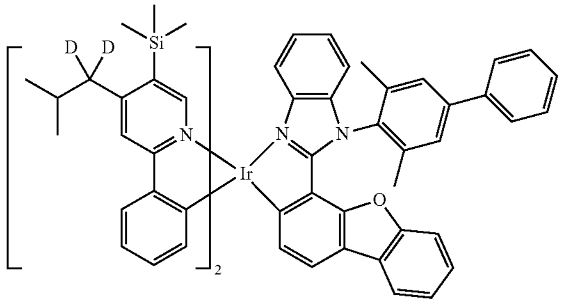
541
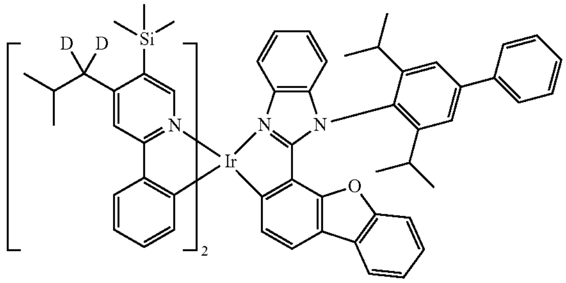
542
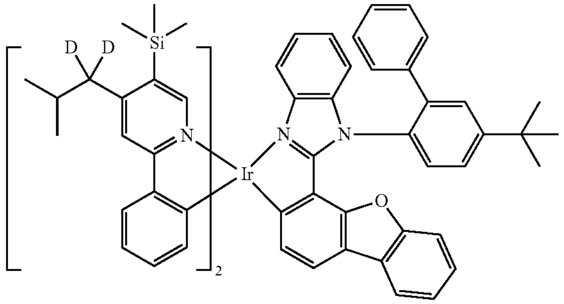
543
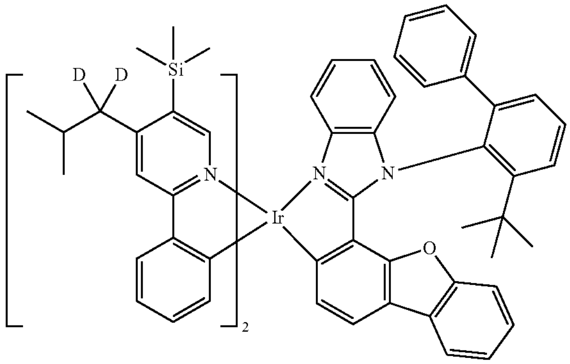

-continued
544
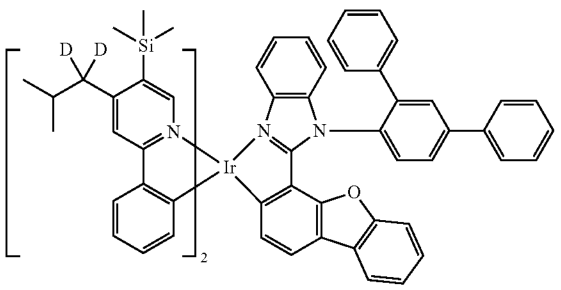
545
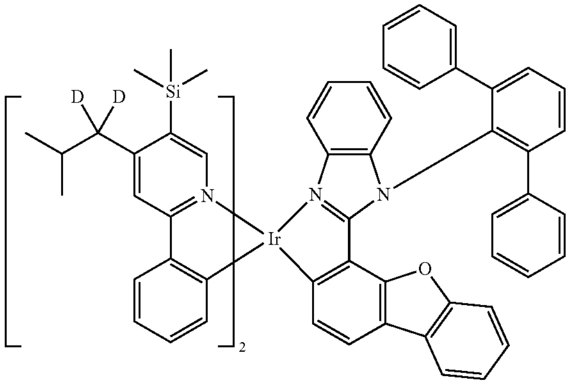
546
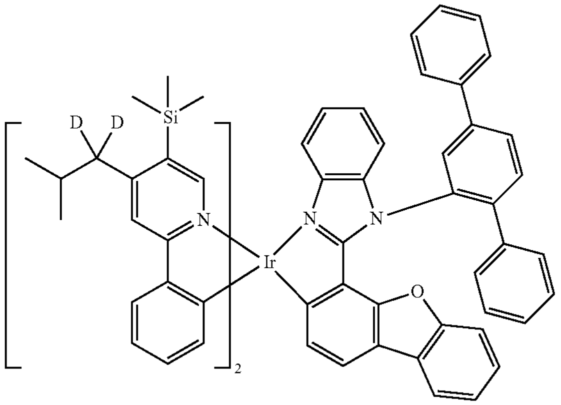
547
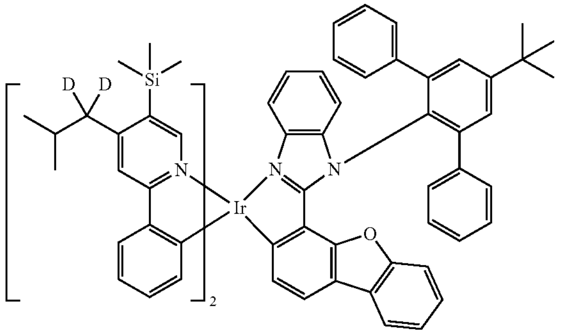
-continued
548
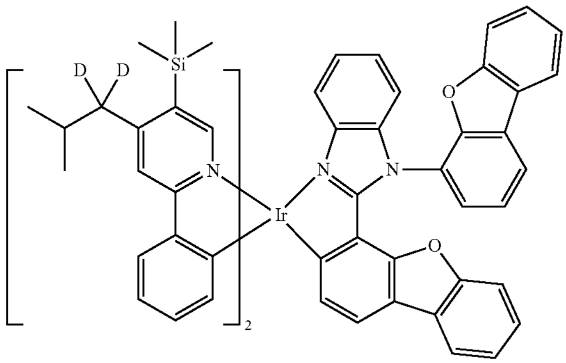
549
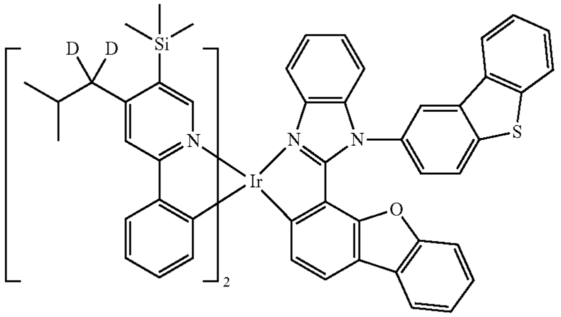
550
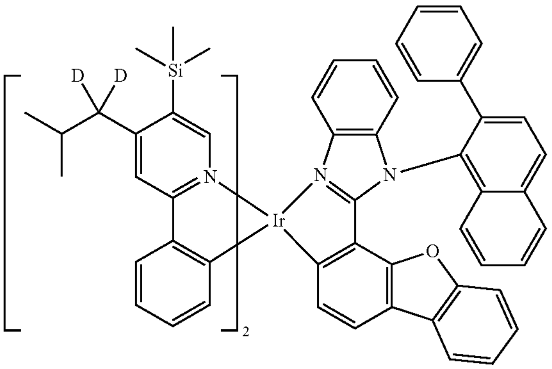
551
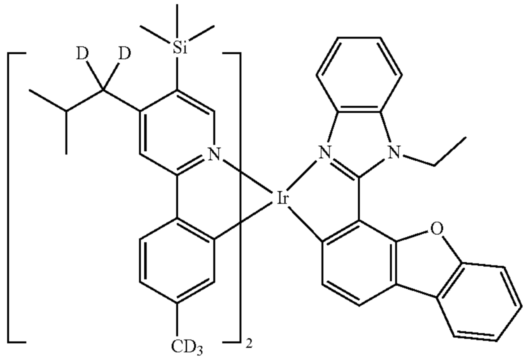

-continued
552
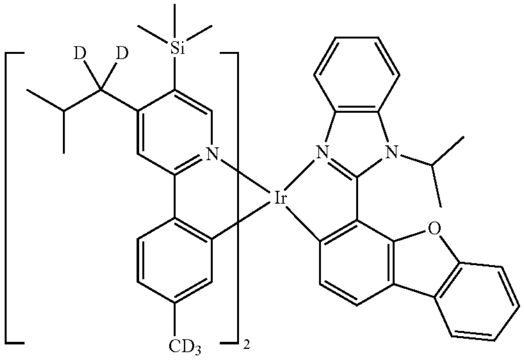
553
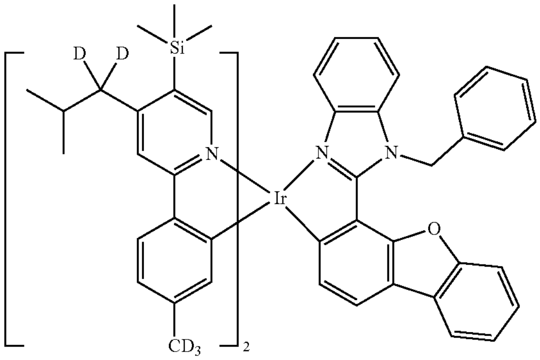
554
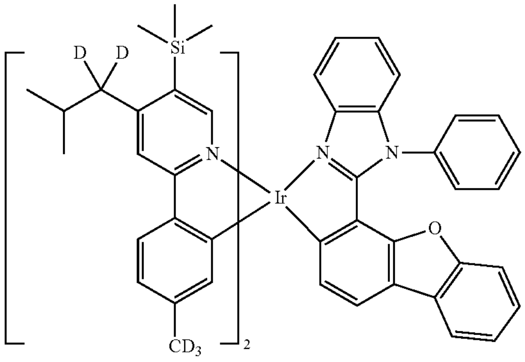
555
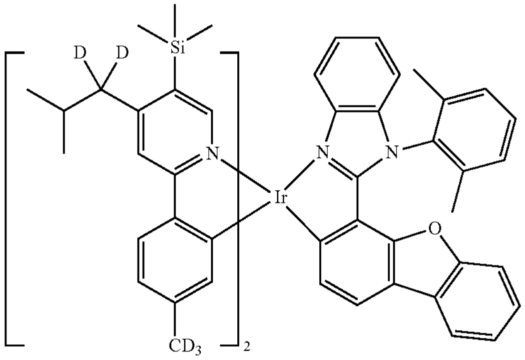
-continued
556
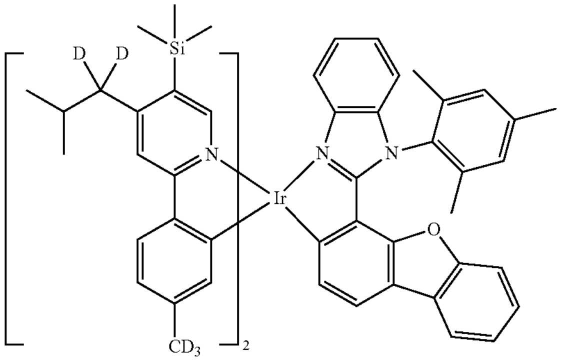
557
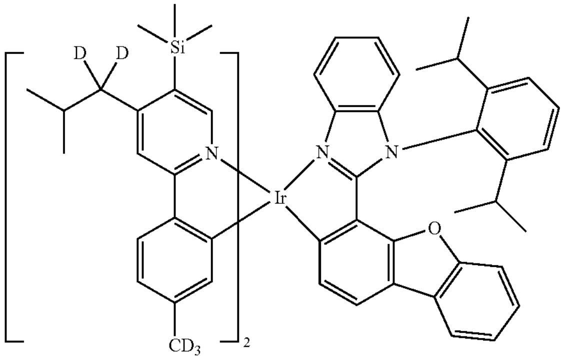
558
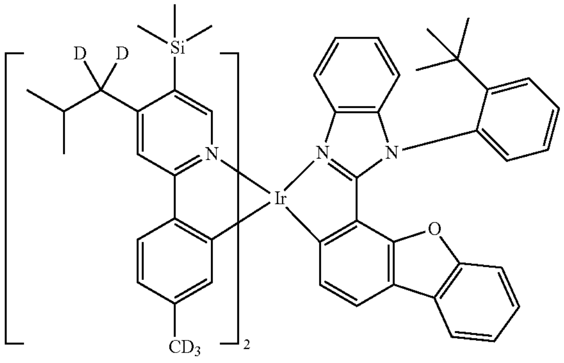
559
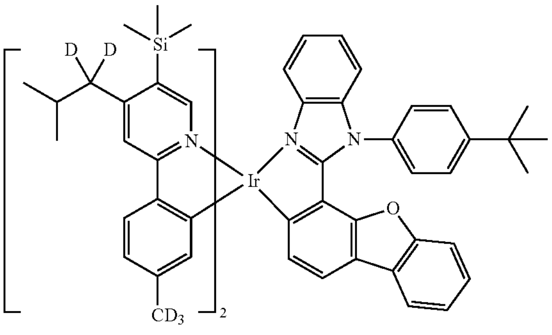

-continued
560
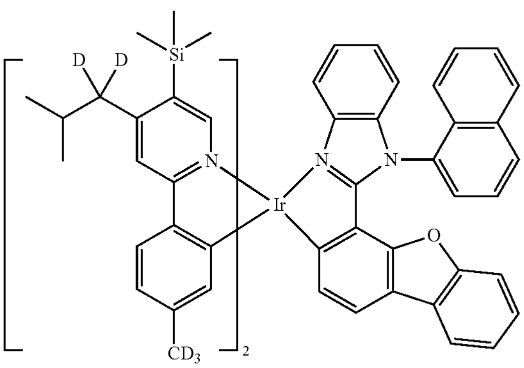
561
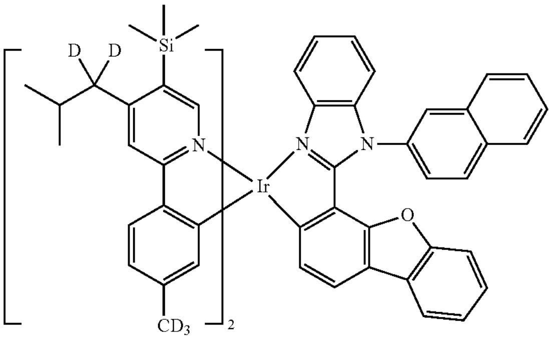
562
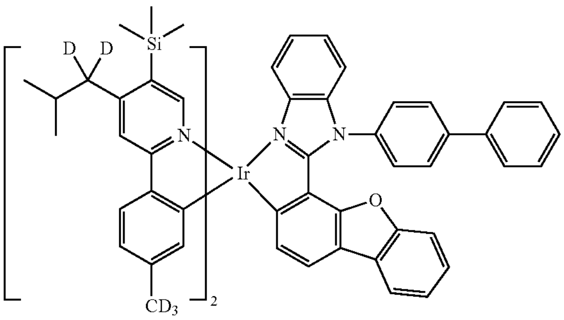
563
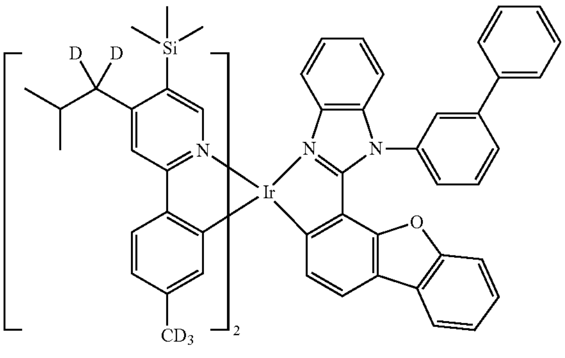
-continued
564
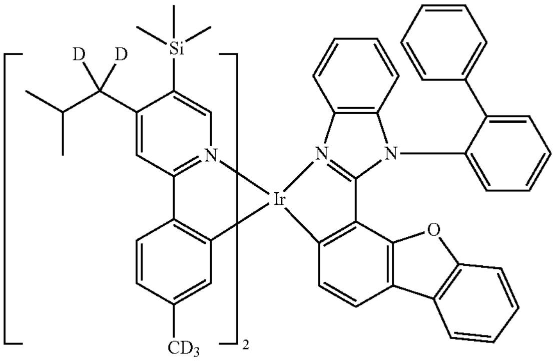
565
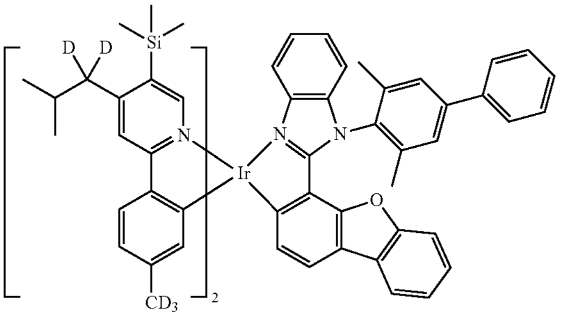
566
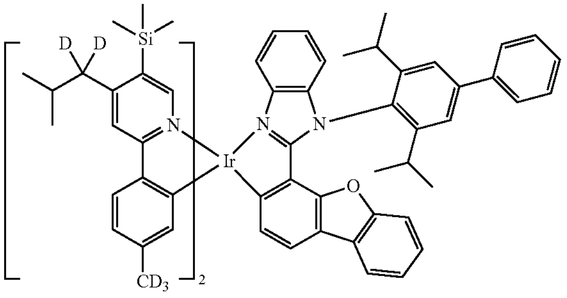
567
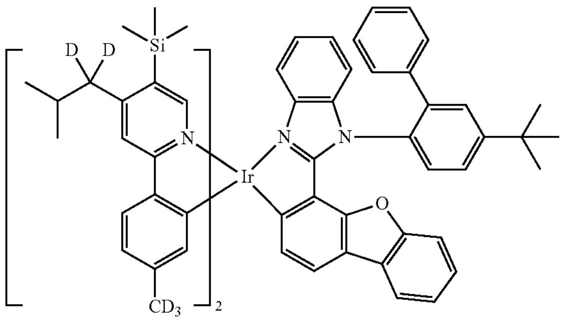

-continued
568
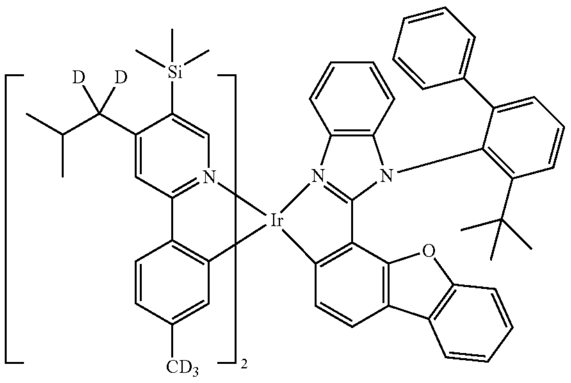
569
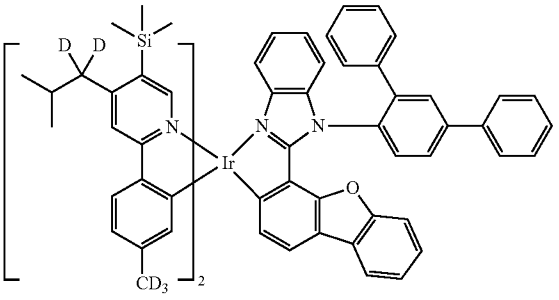
570
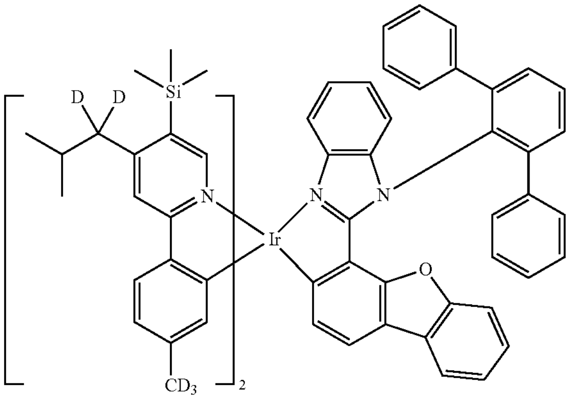
571
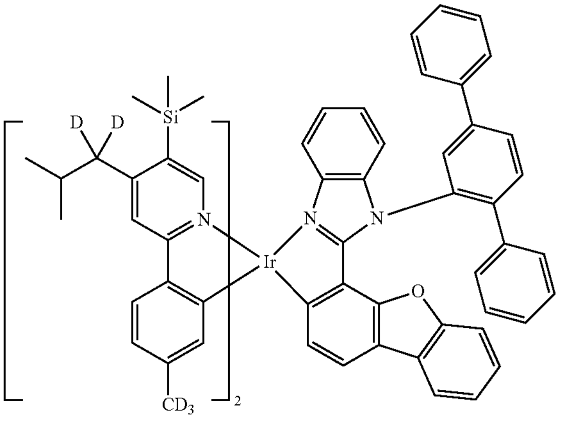
-continued
572
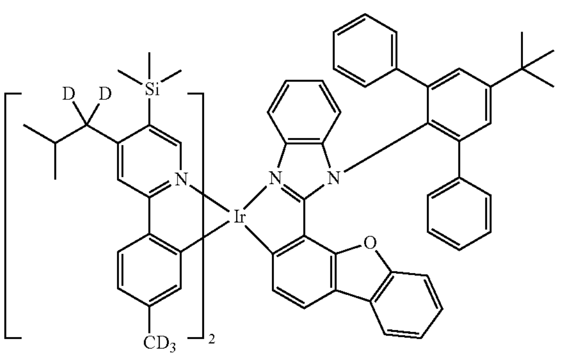
573
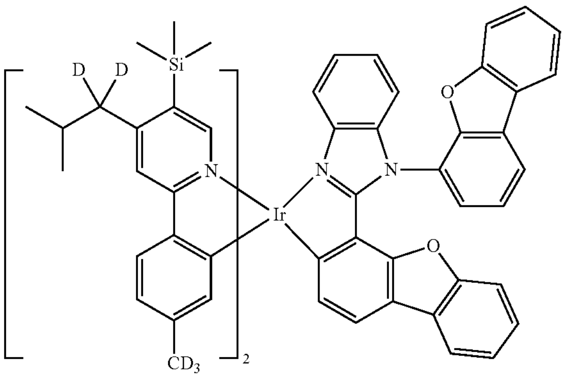
574
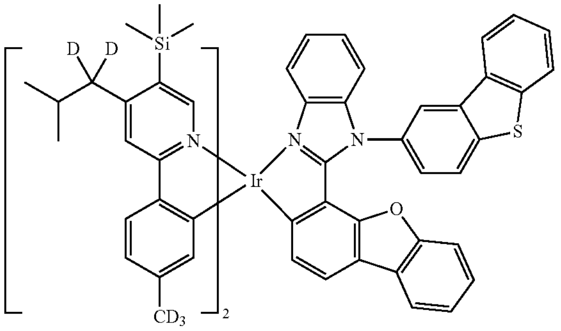
575
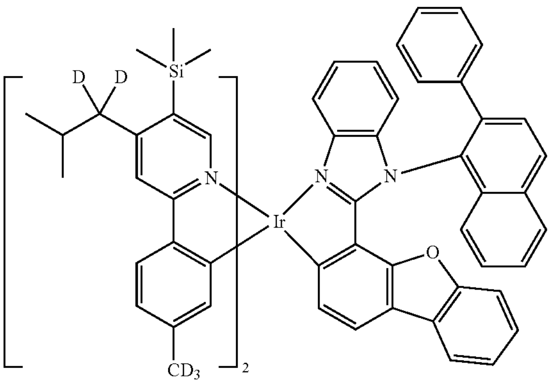

-continued
651
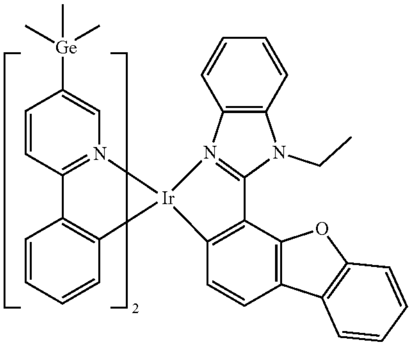
652
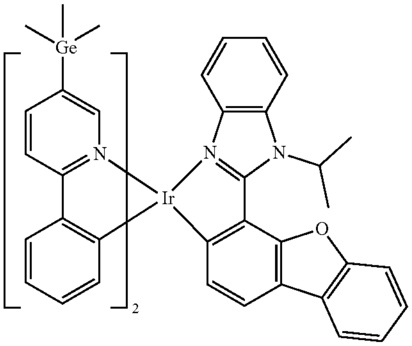
653
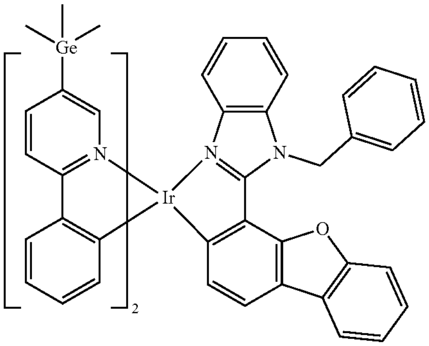
654
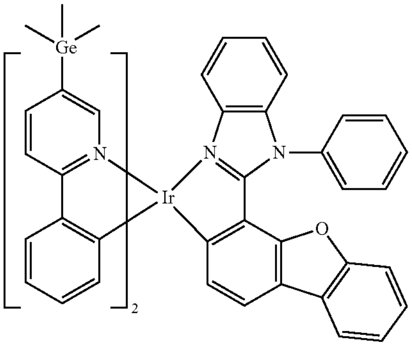
-continued
655
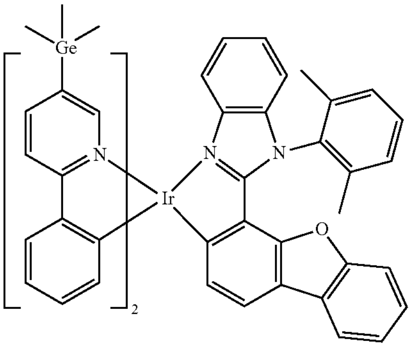
656
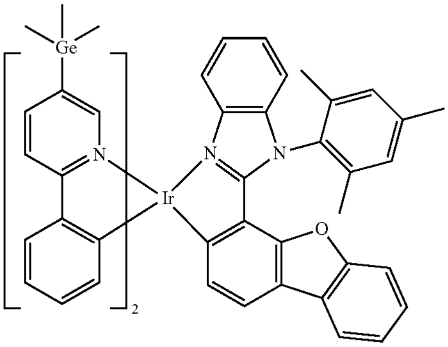
657
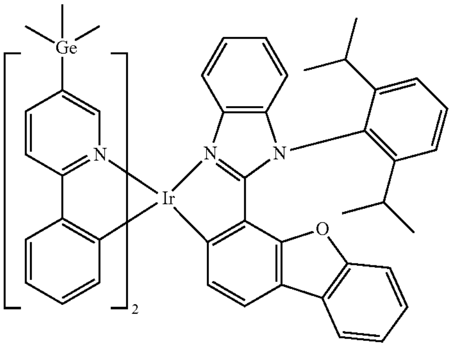
658
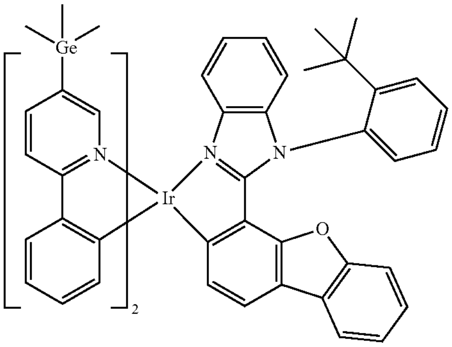

-continued
659
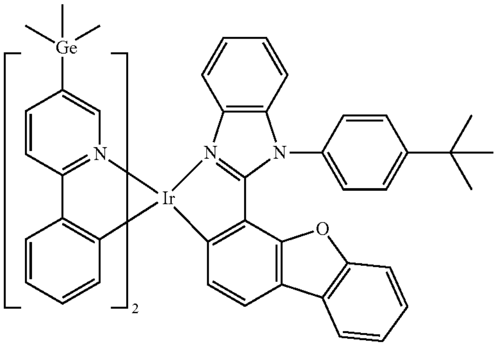
660
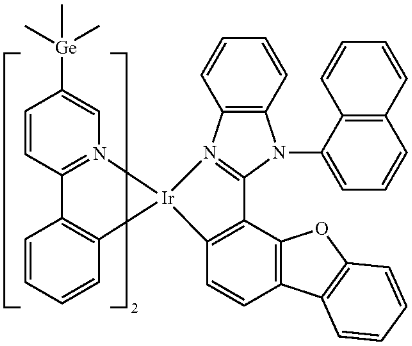
661
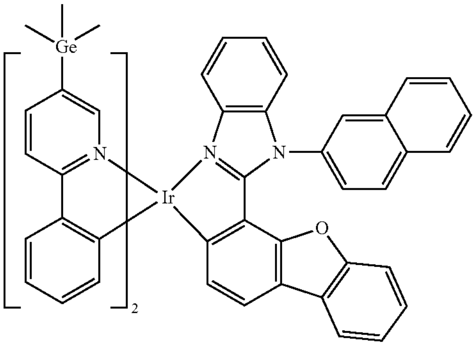
662
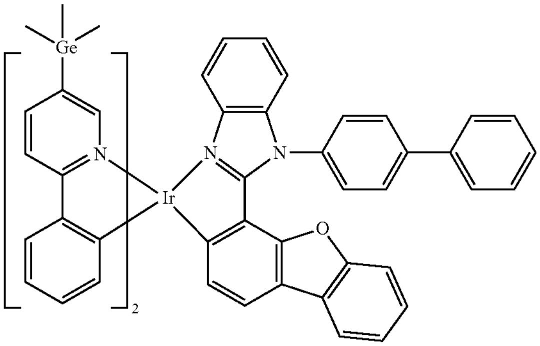
-continued
663
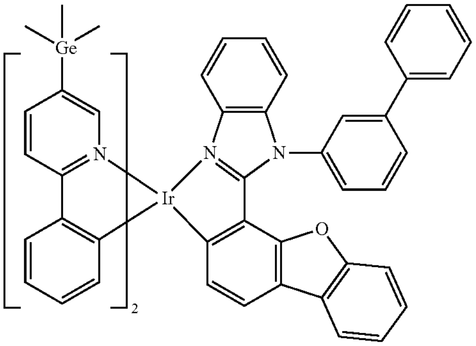
664
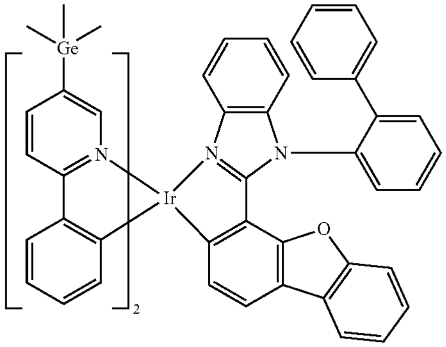
665
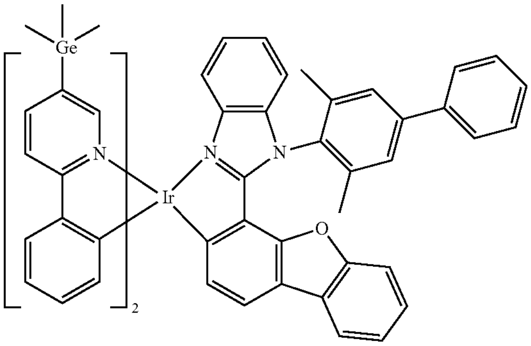
666
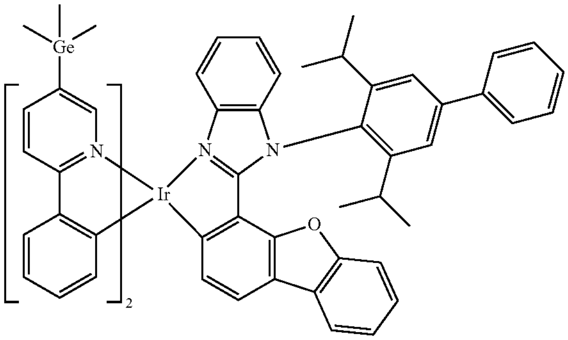

-continued
667
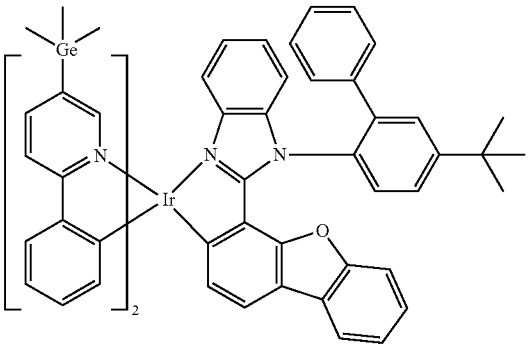
668
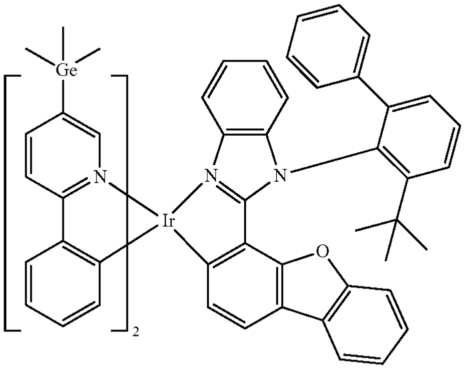
669
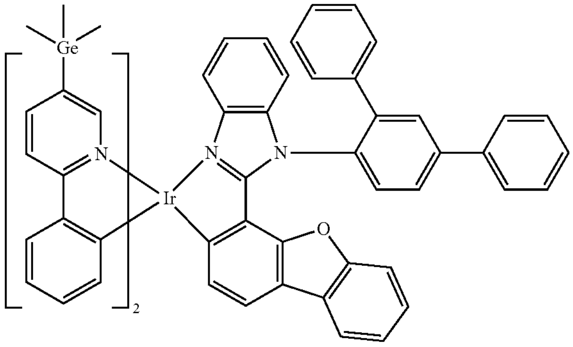
670
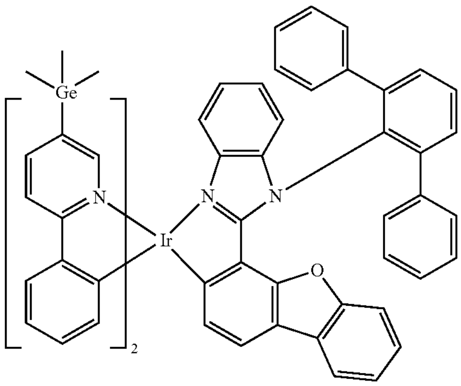
-continued
671
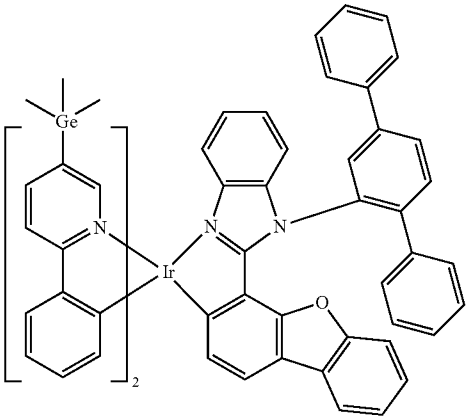
672
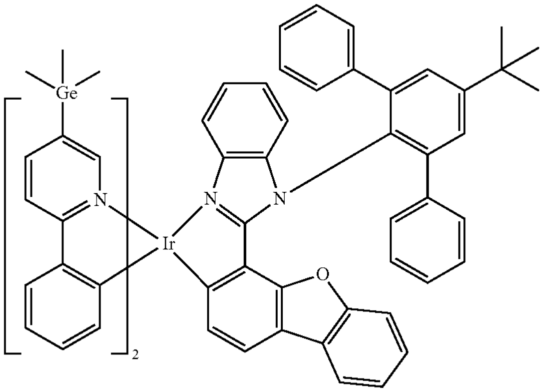
673
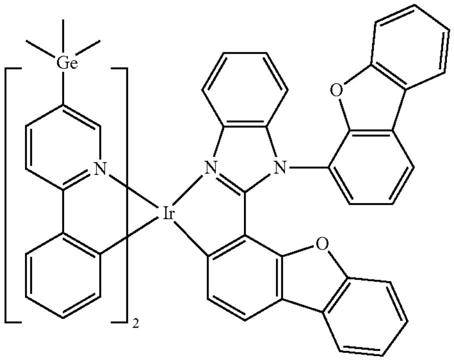
674
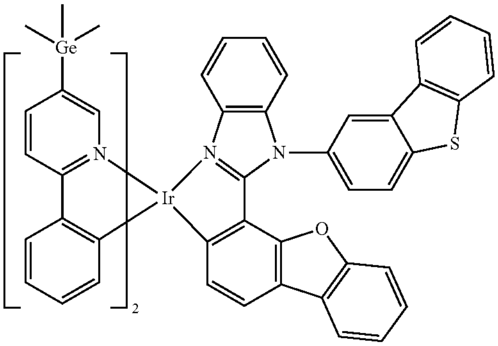

-continued
675
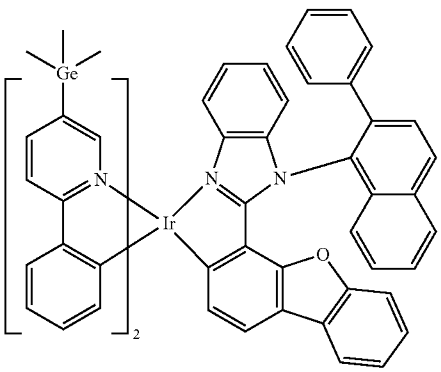
701
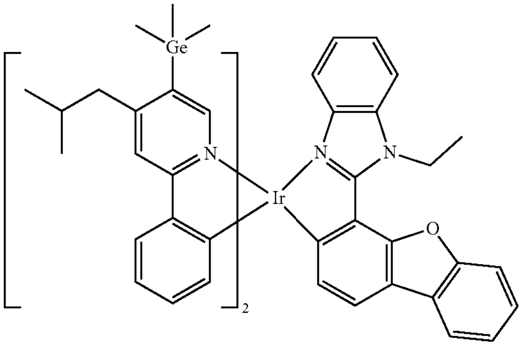
702
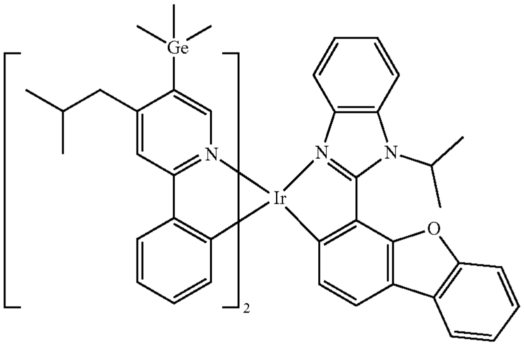
703
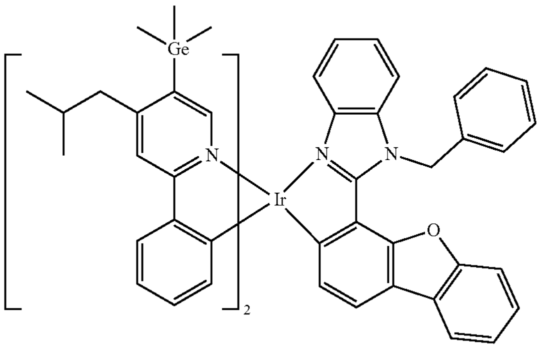
-continued
704
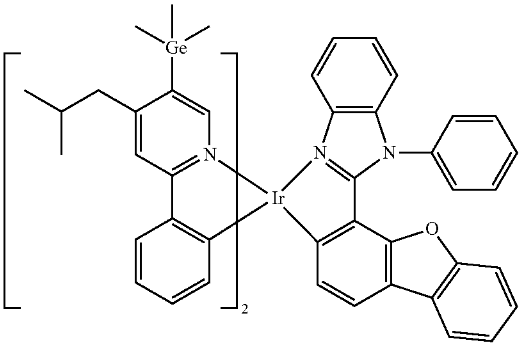
705
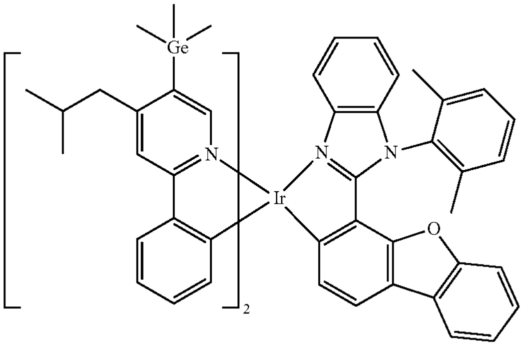
706
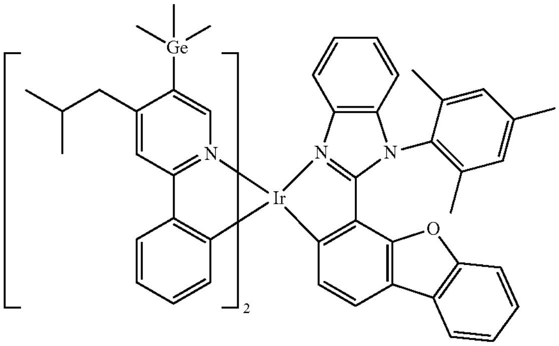
707
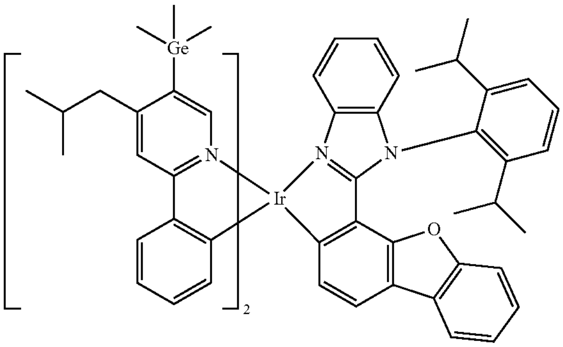

-continued
708
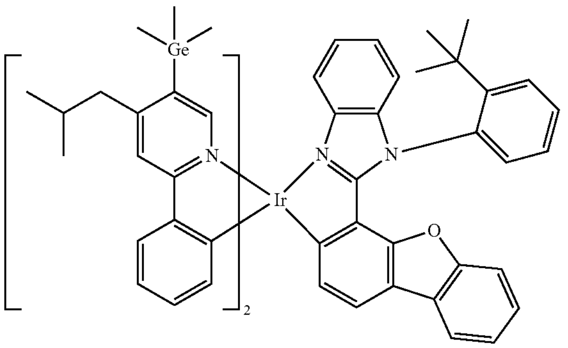
709
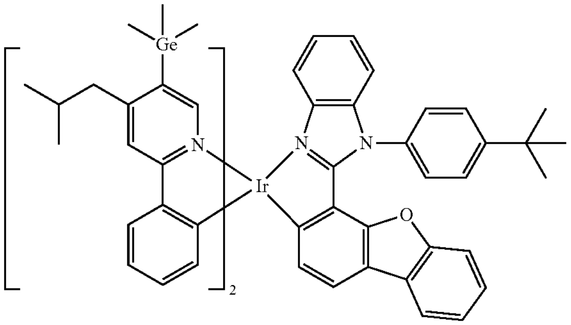
710
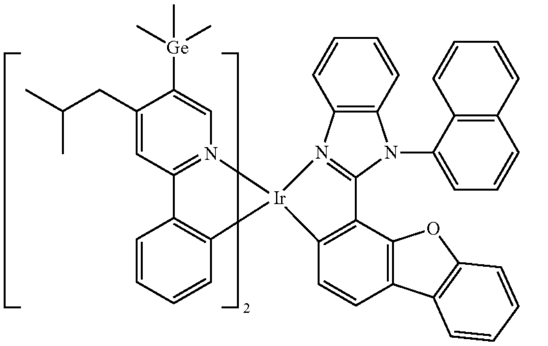
711
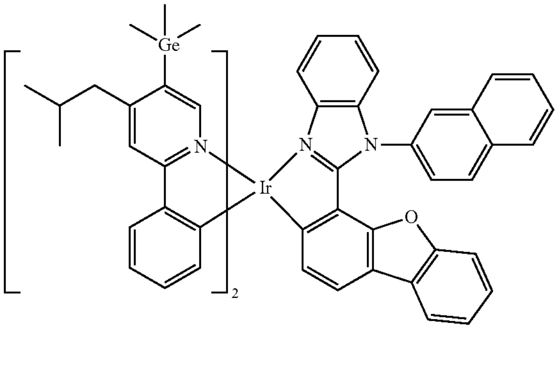
-continued
712
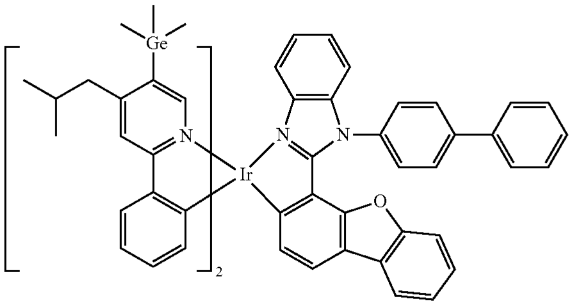
713
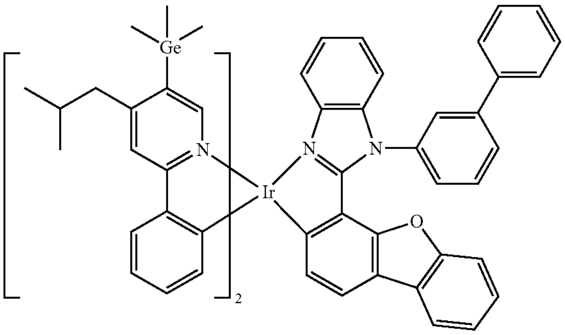
714
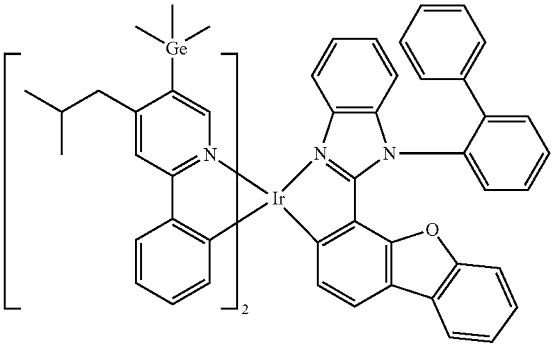
715
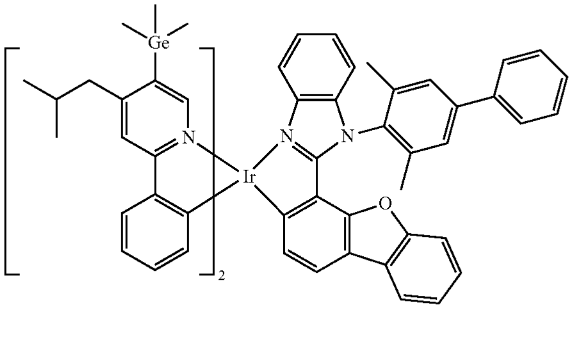

-continued
716
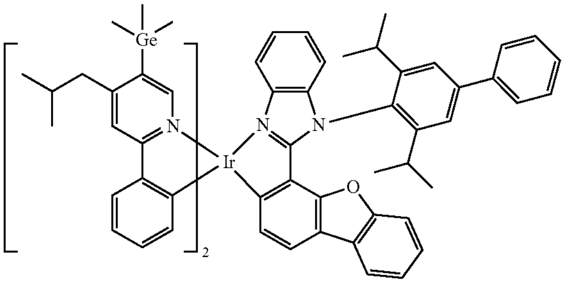
717
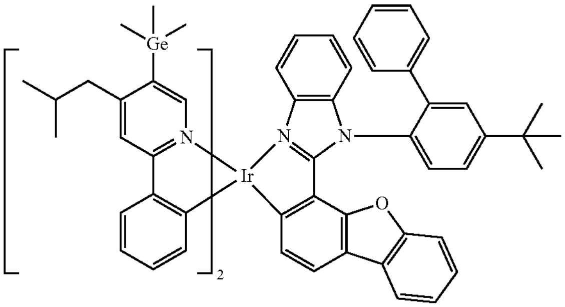
718
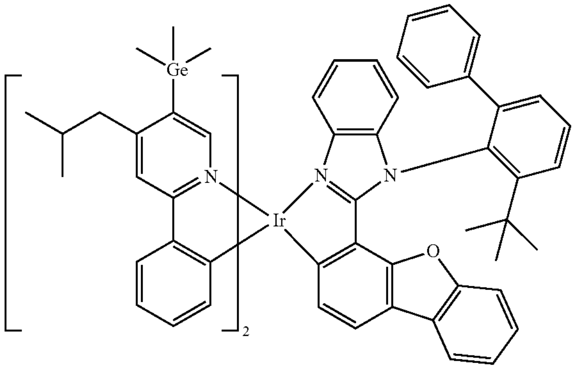
719
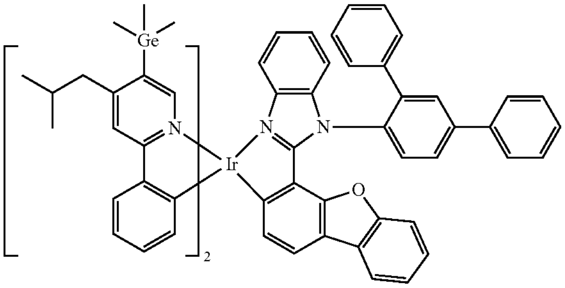
-continued
720
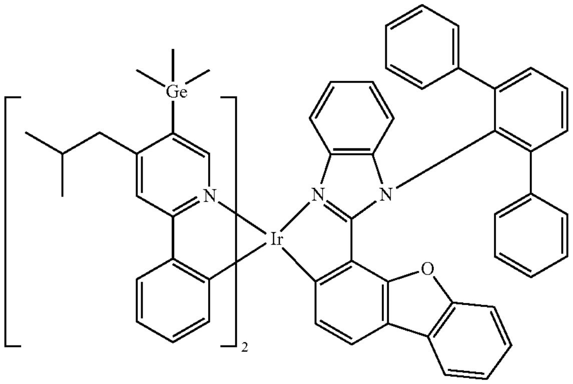
721
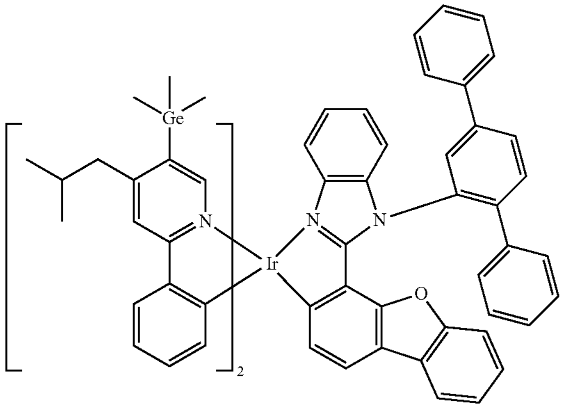
722
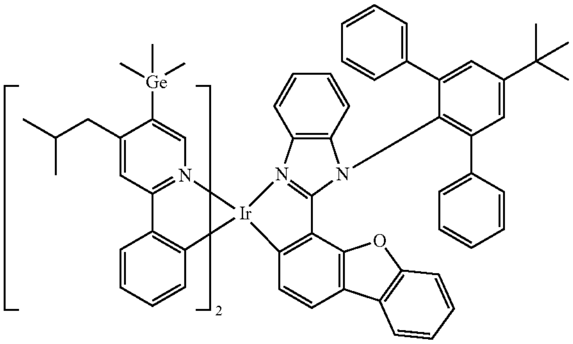
723
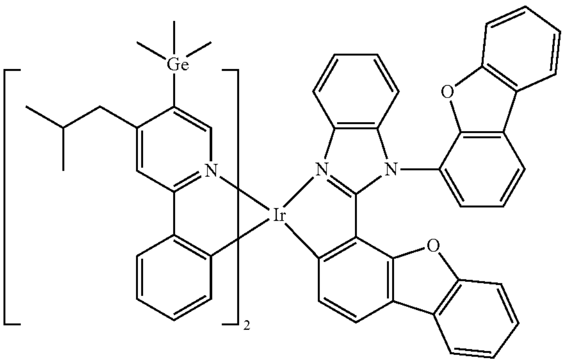

-continued
724
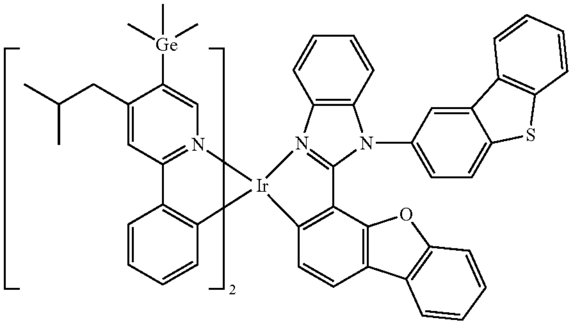
725
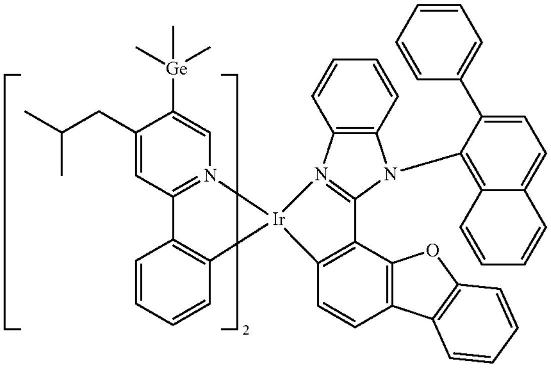
726
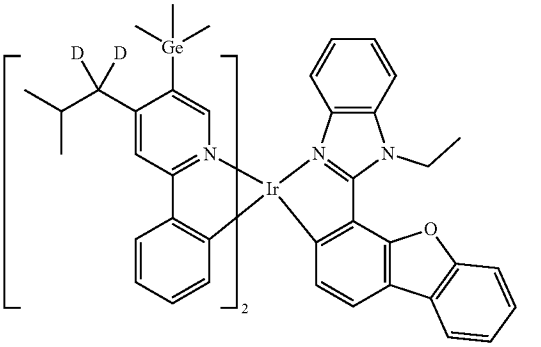
727
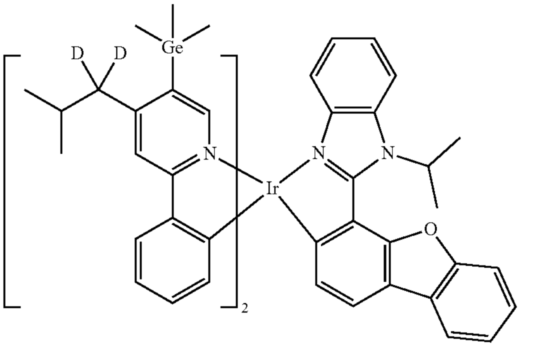
-continued
728
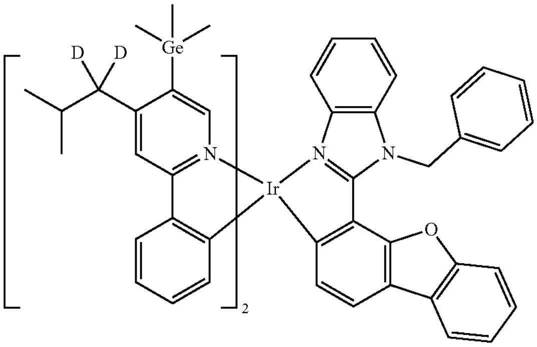
729
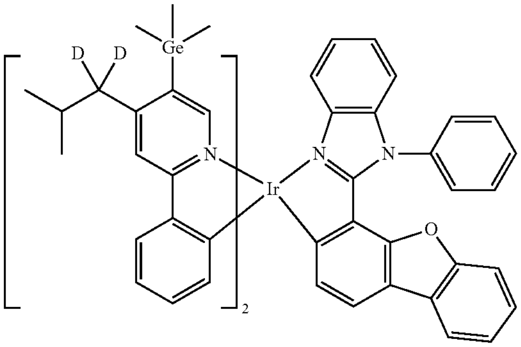
730
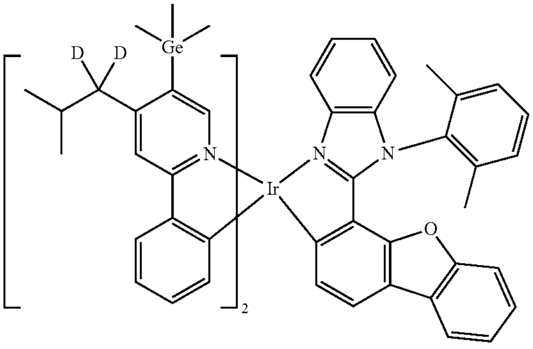
731
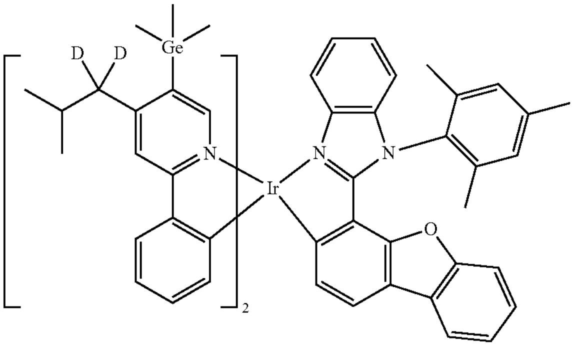

-continued
732
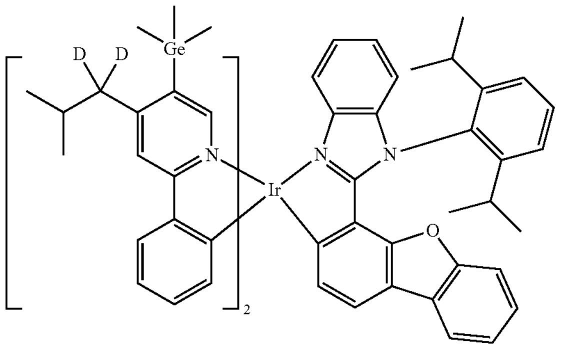
733
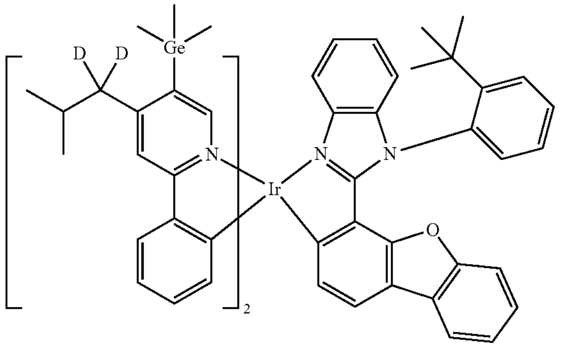
734
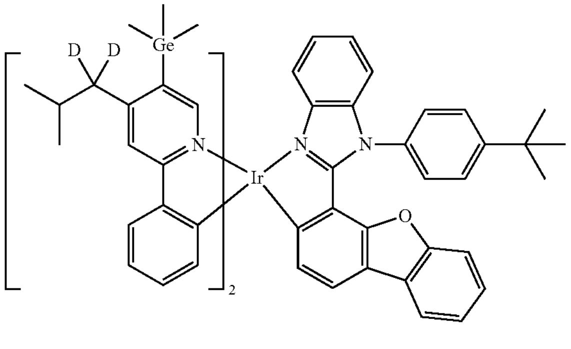
735
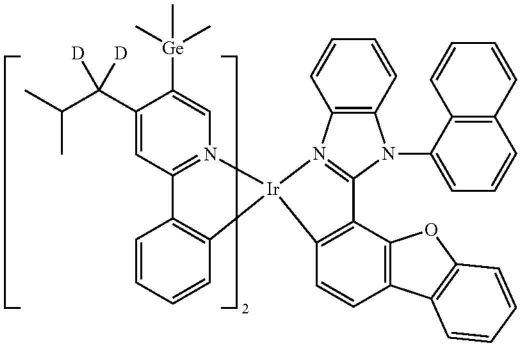
-continued
736
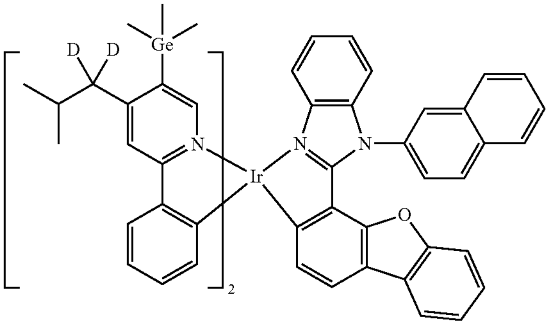
737
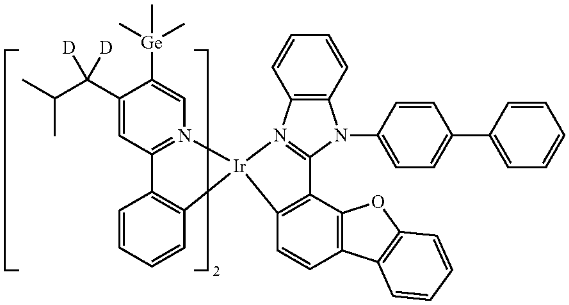
738
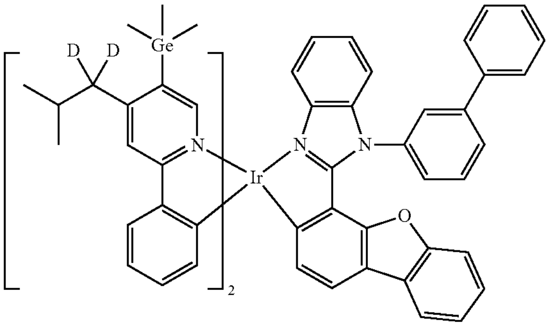
739
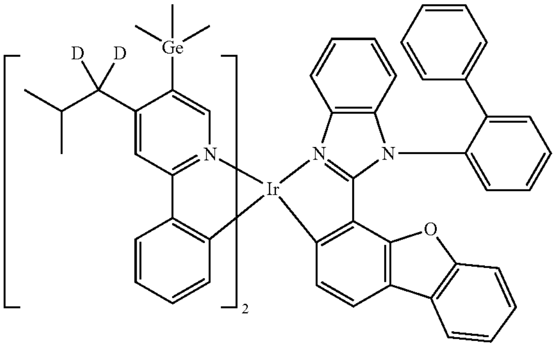

-continued
740
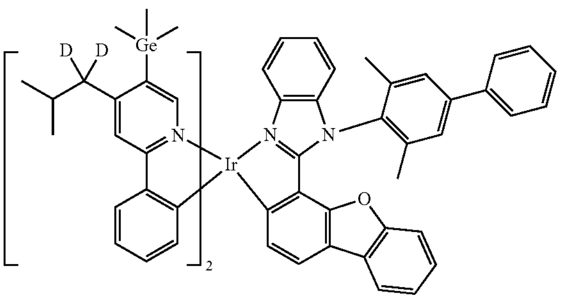
741
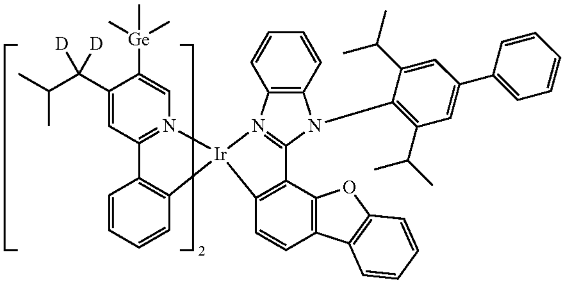
742
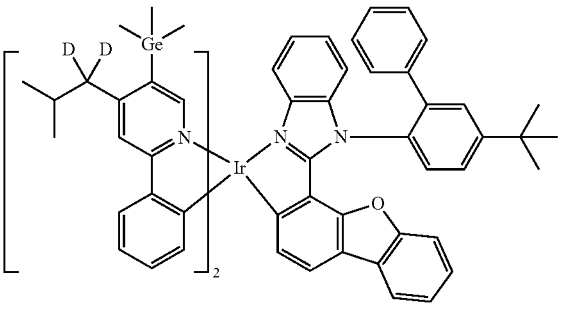
743
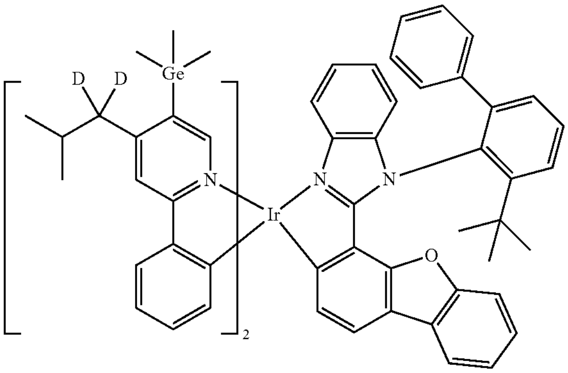
-continued
744
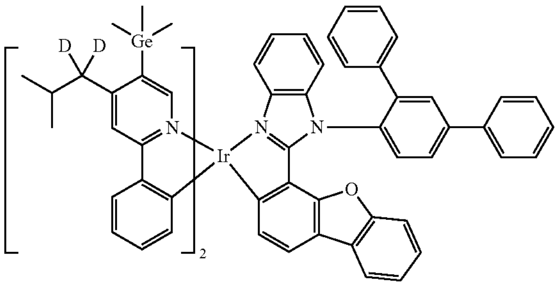
745
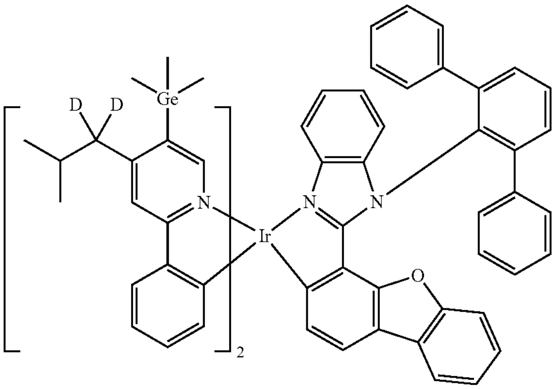
746
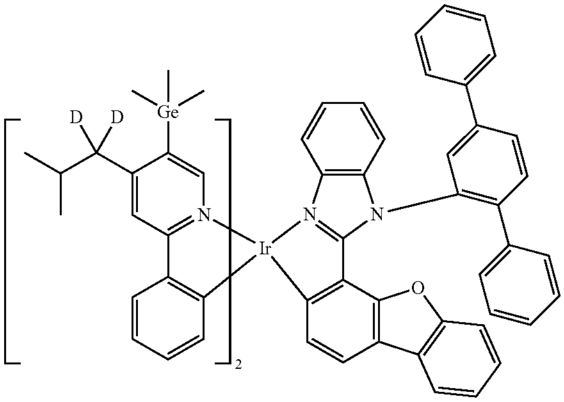
747
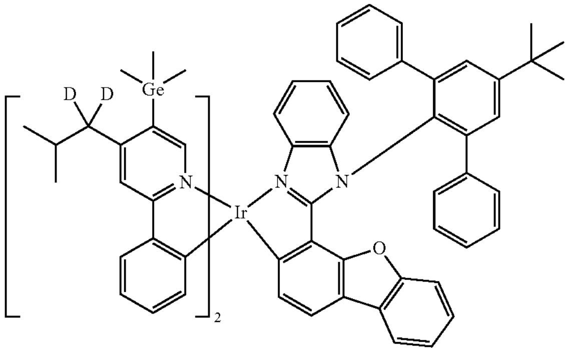

-continued
748
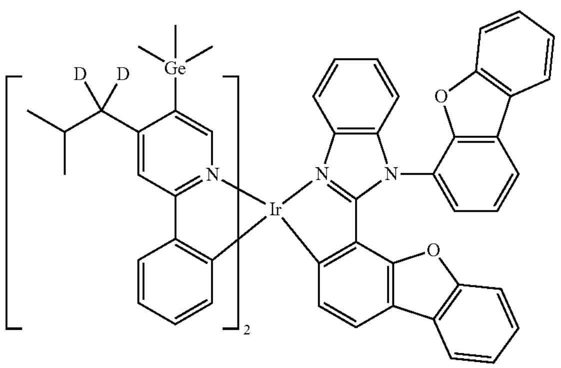
749
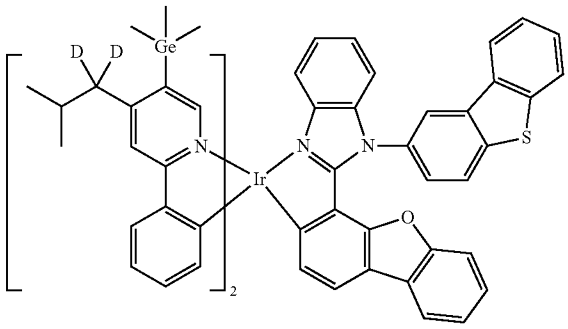
750
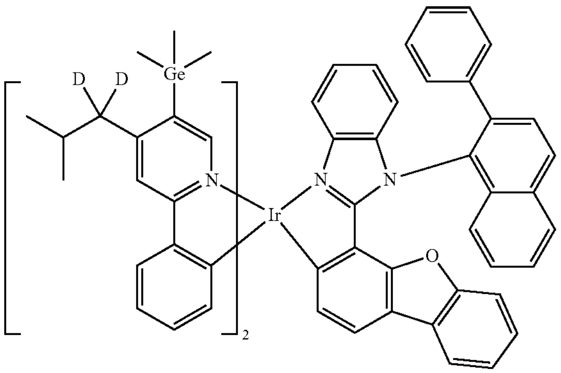
961
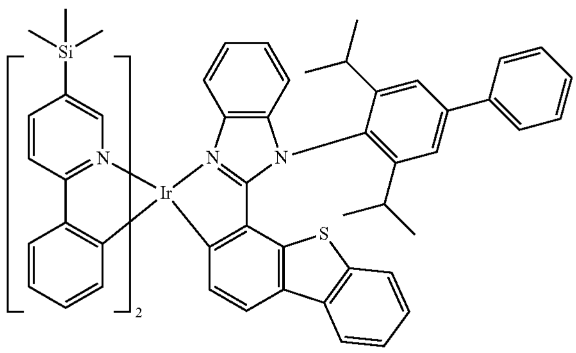
-continued
962
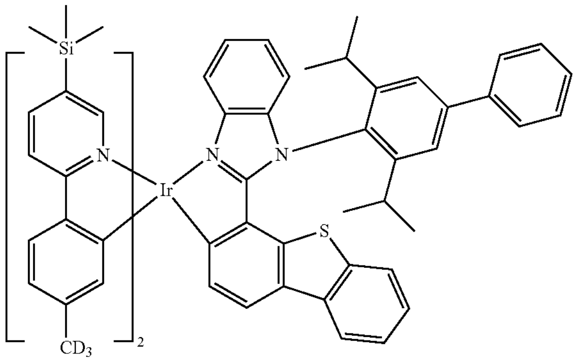
963
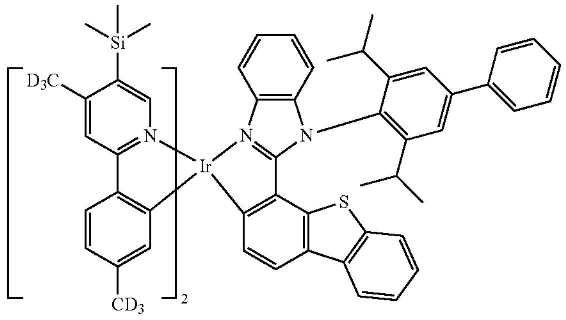
964
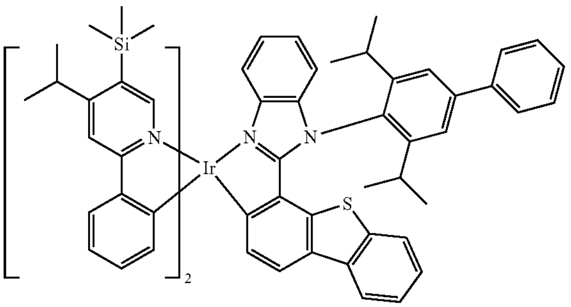
965
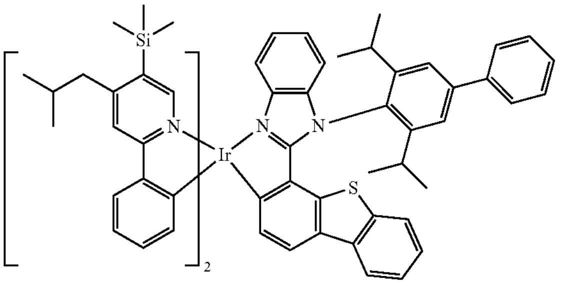

-continued
966
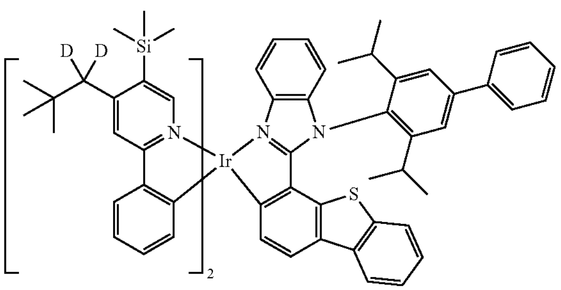
967
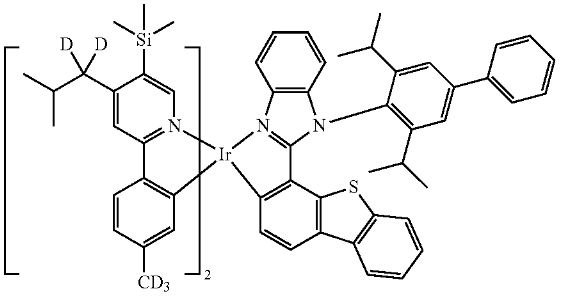
968
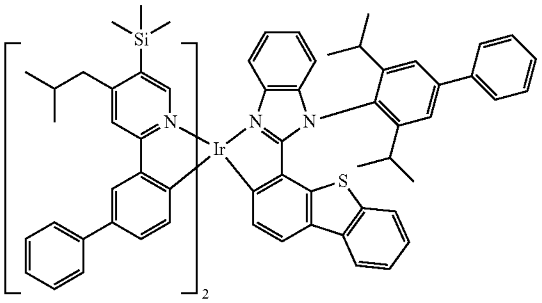
969
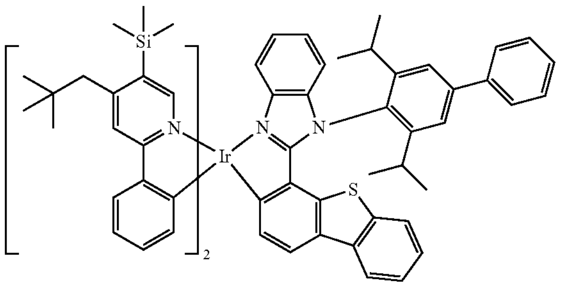
970
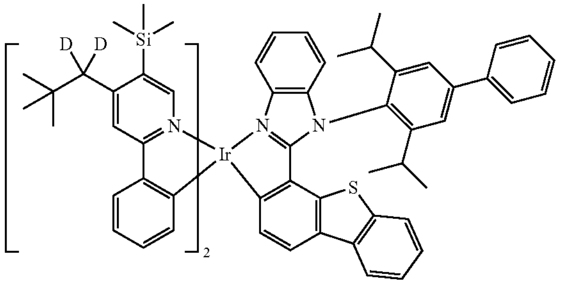
-continued
971
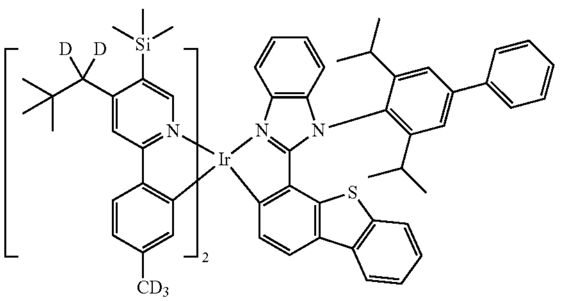
972
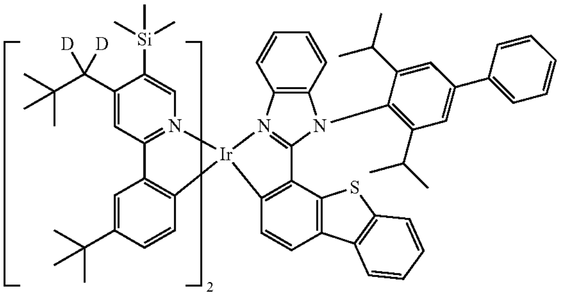
973
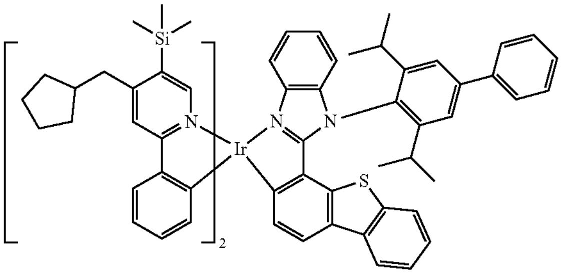
974
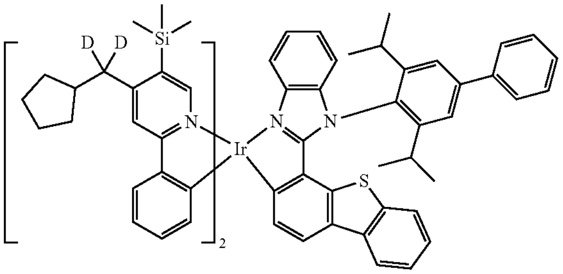
975
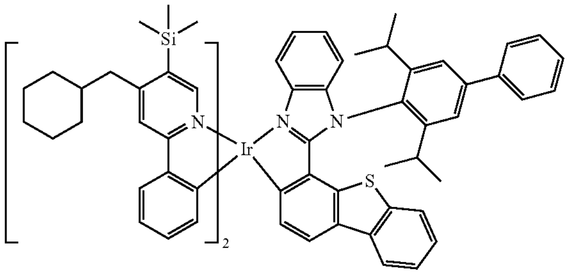

-continued
976
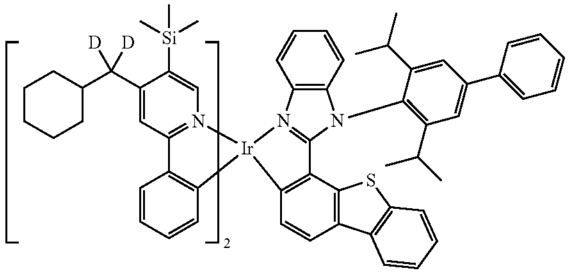
977
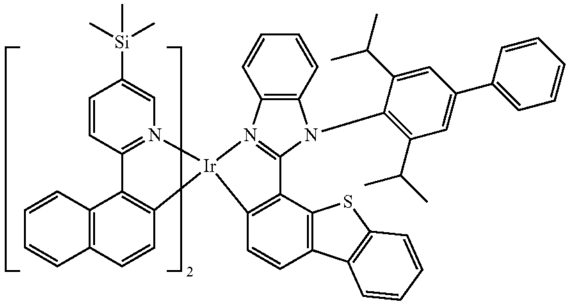
978
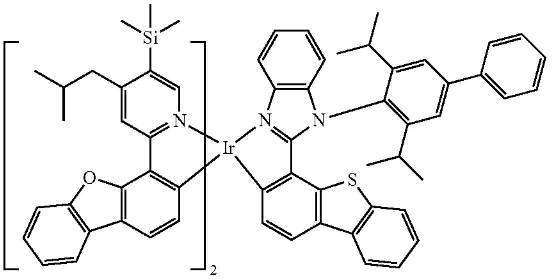
979
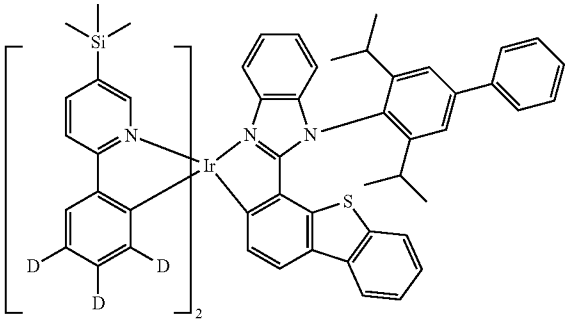
980
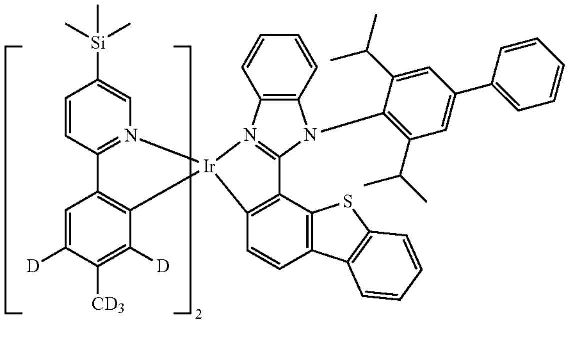
-continued
981
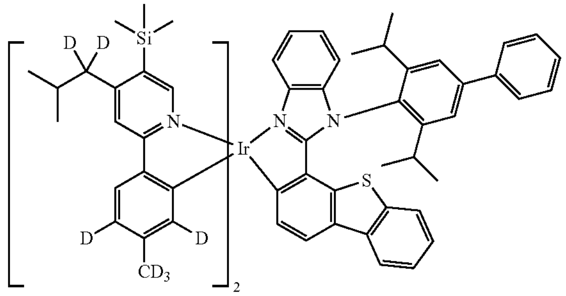
982
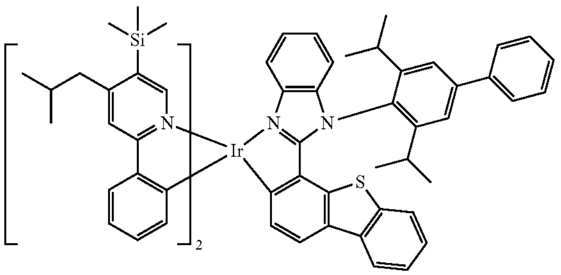
983
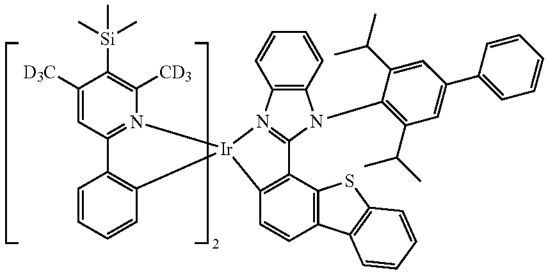
984
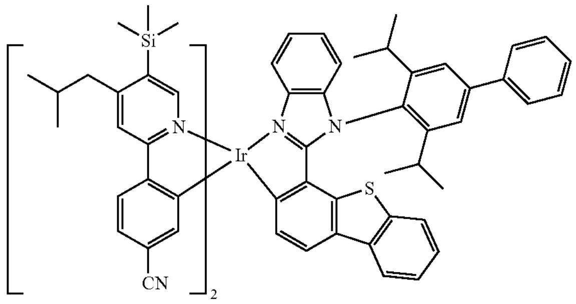
985
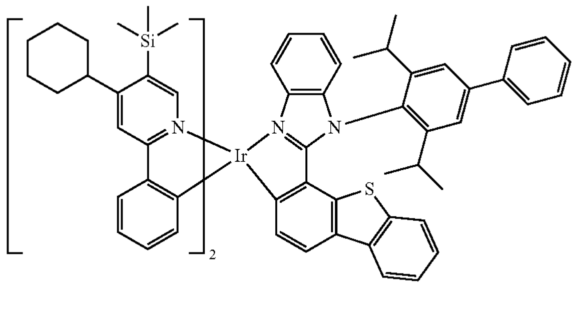

-continued
1186
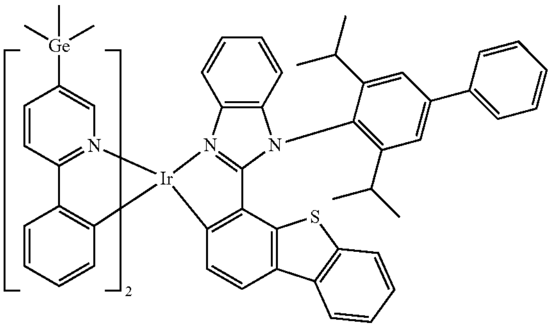
1187
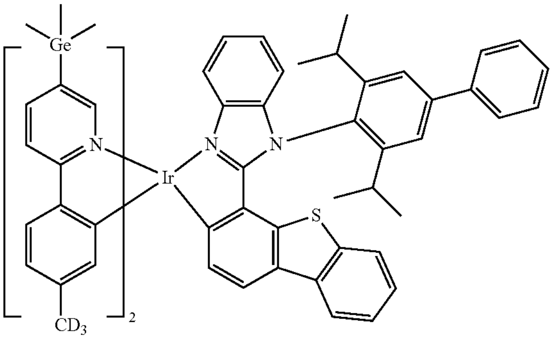
1188
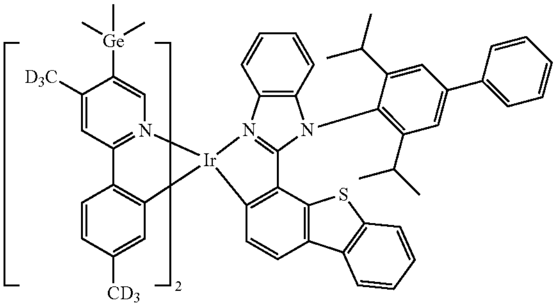
1189
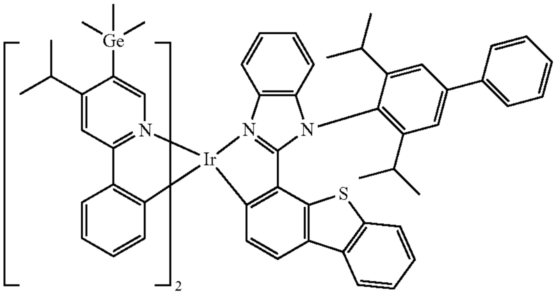
-continued
1190
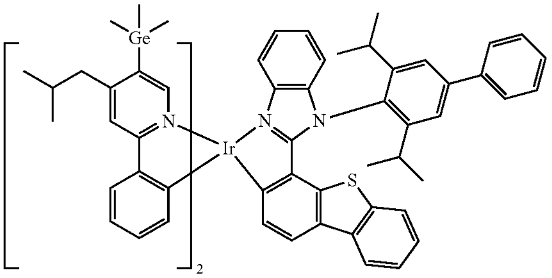
1191
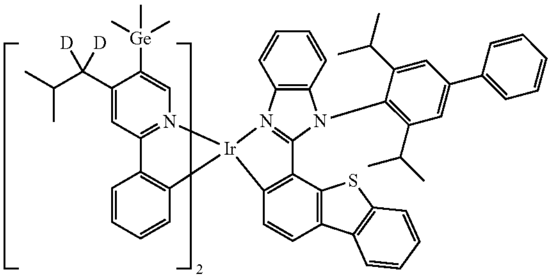
1192
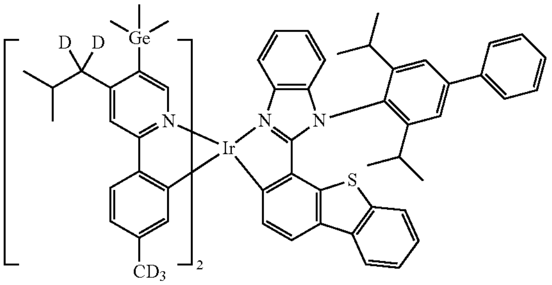
1193
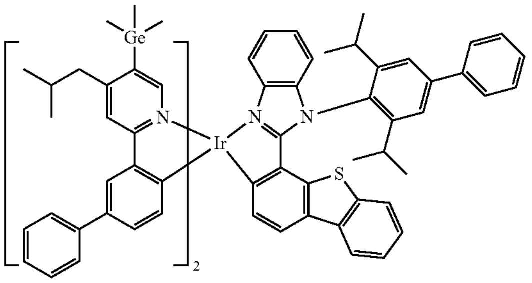
1194
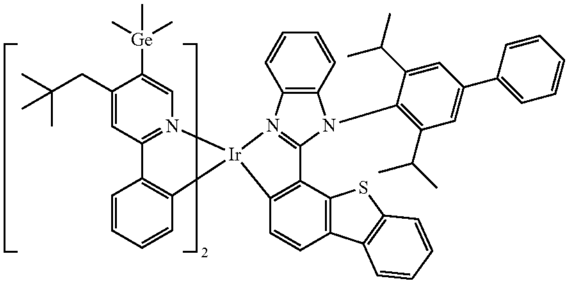

-continued
1195
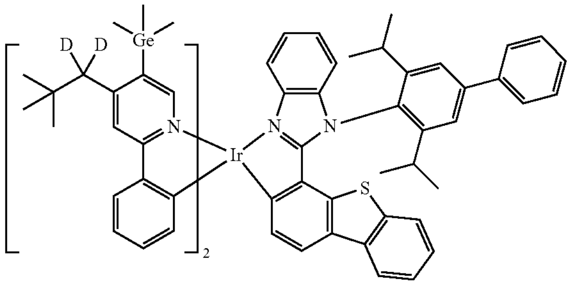
1196
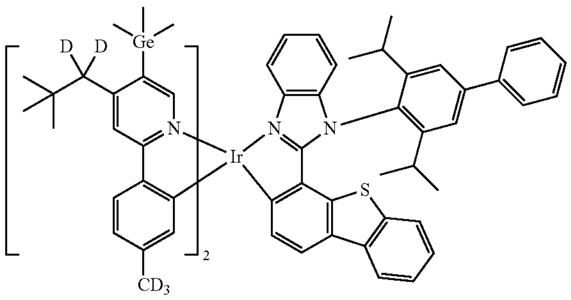
1197
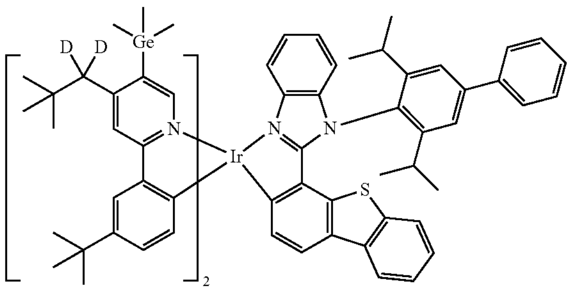
1198
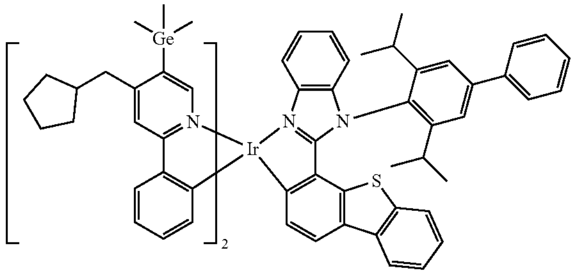
1199
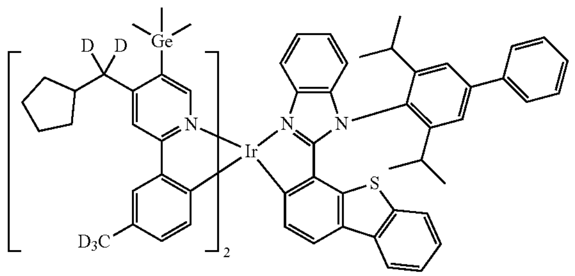
-continued
1200
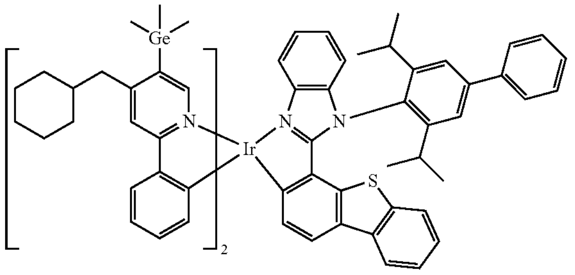
1201
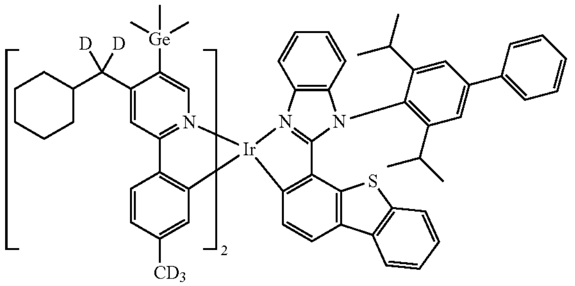
1202
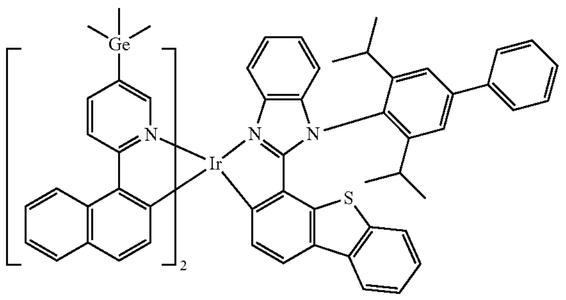
1203
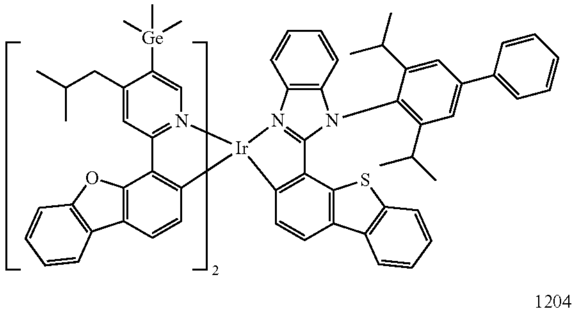
1204
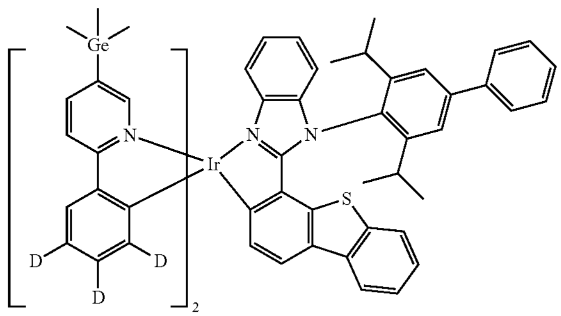

-continued
1205
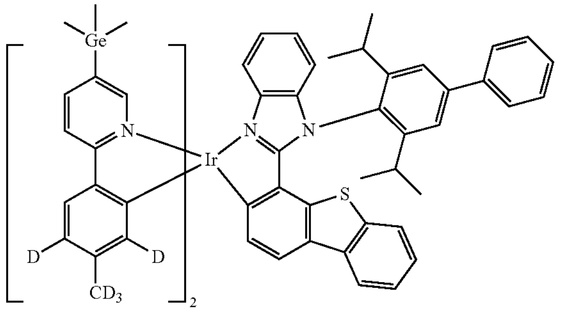
1206
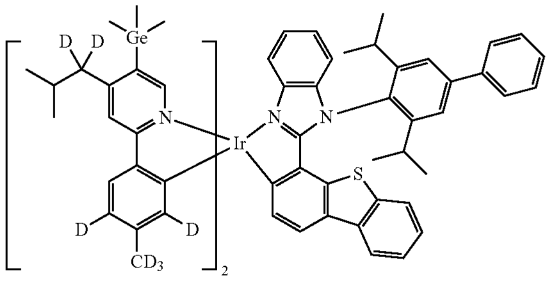
1207
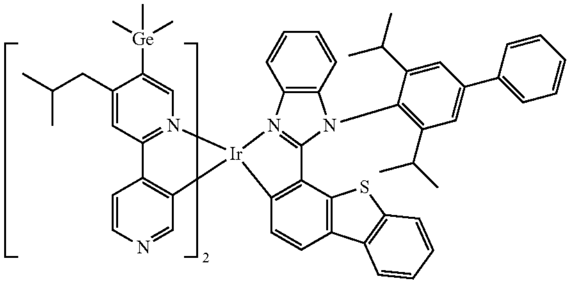
1208
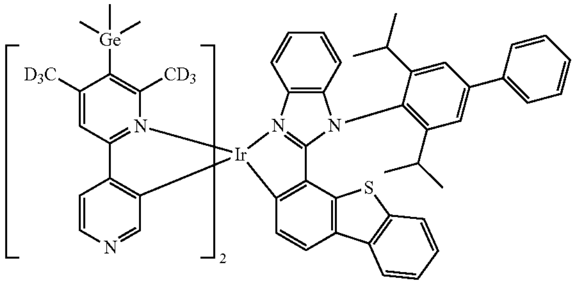
1209
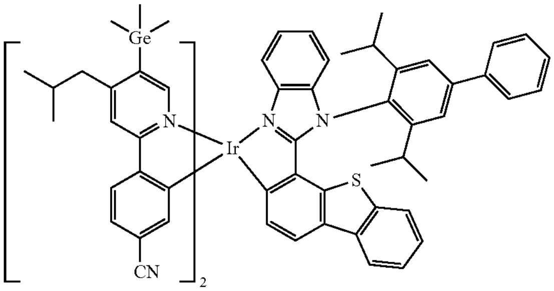
-continued
1210
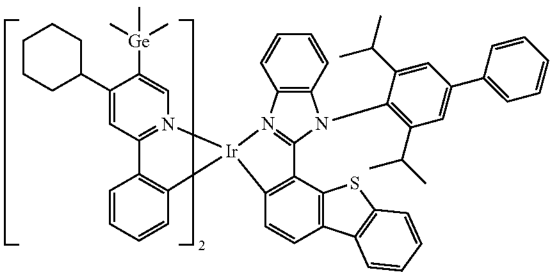
1336
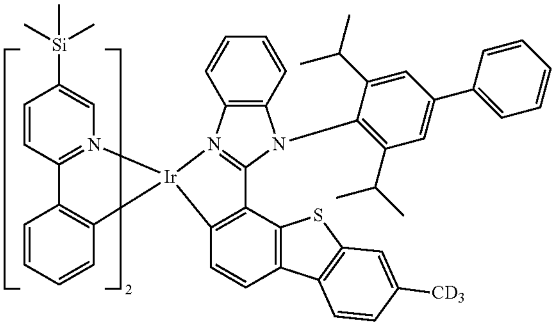
1337
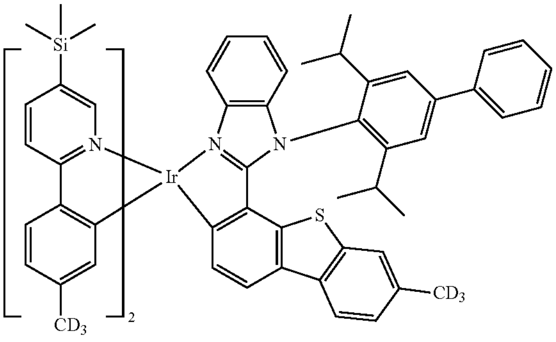
1338
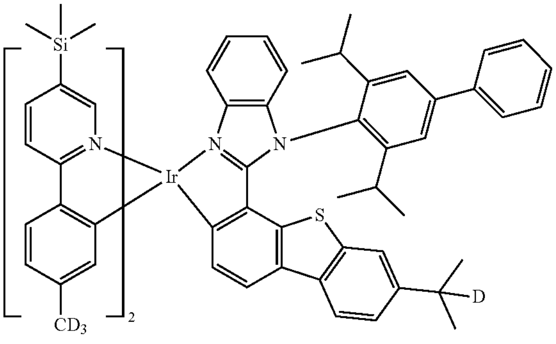

-continued
1339
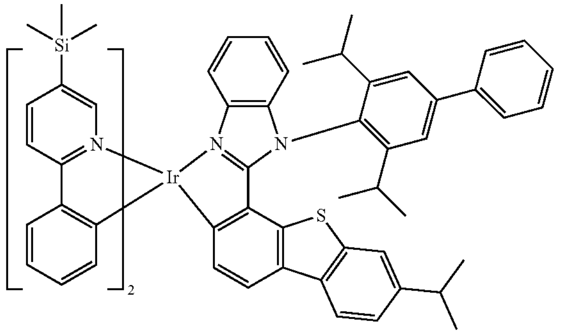
1340
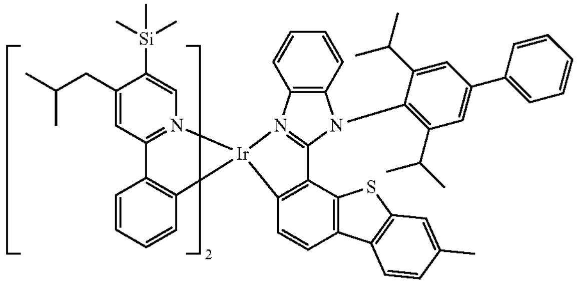
1341
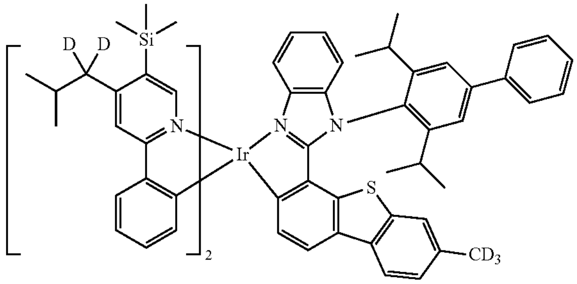
1342
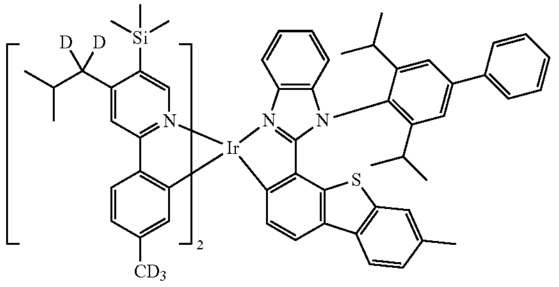
1343
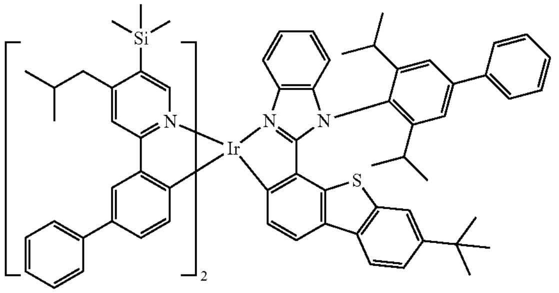
-continued
1344
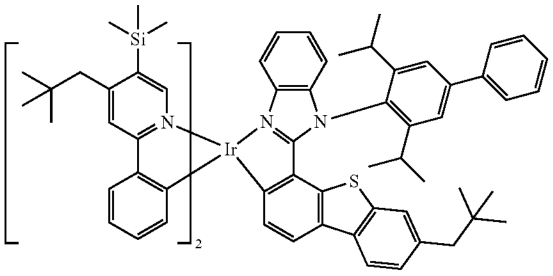
1345
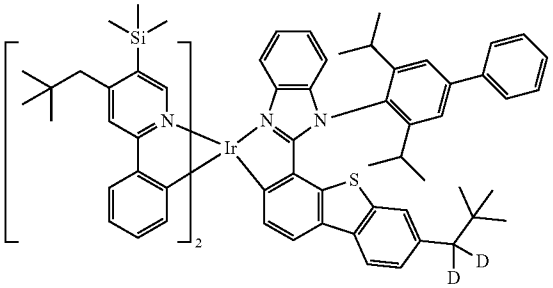
1346
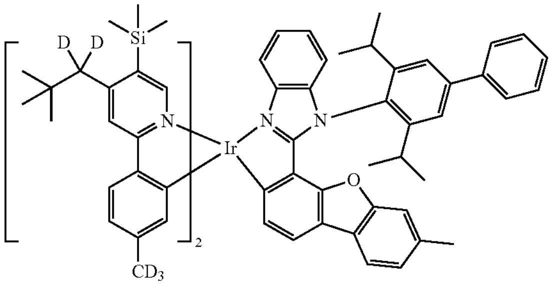
1347
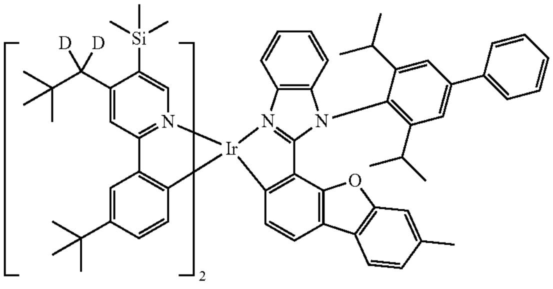
1348
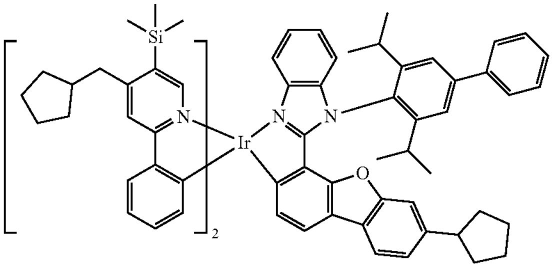

-continued
1349
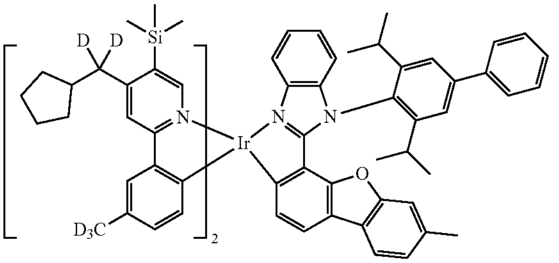
1350
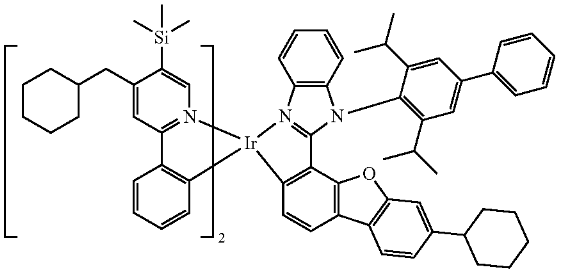
1351
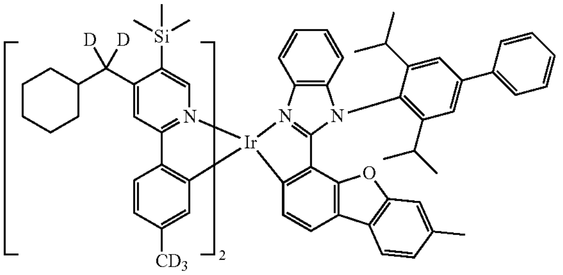
1352
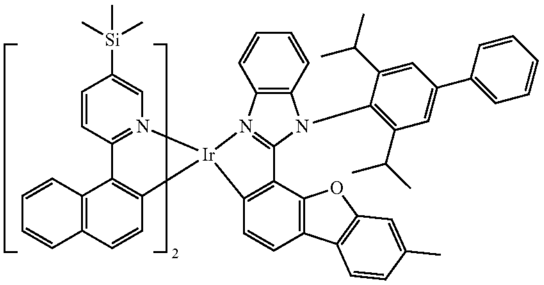
1353
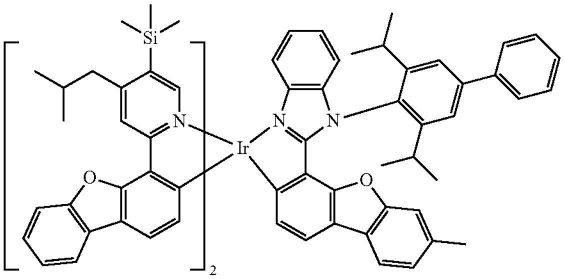
-continued
1354
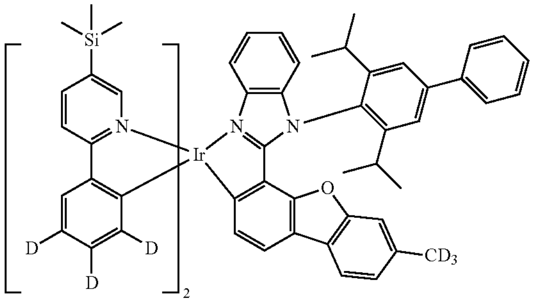
1355
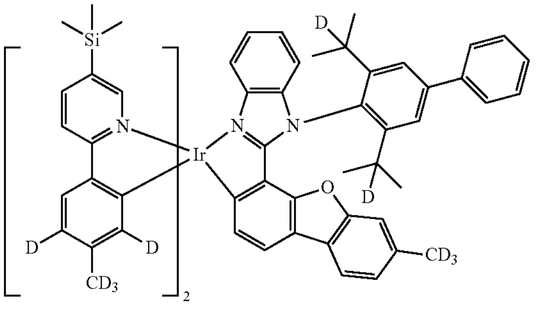
1356
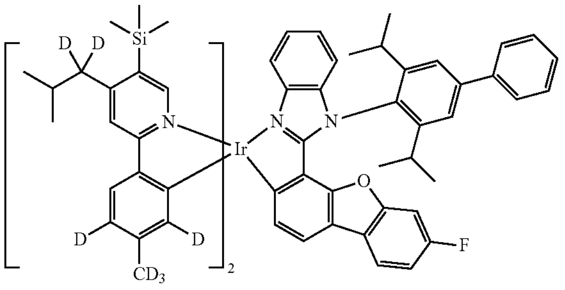
1357
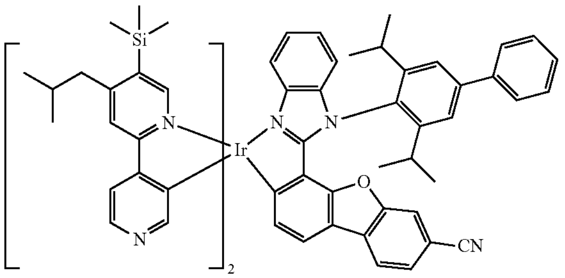
1358
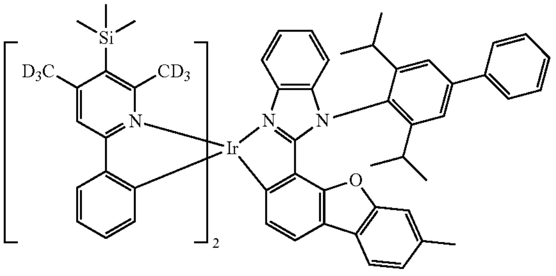

-continued
1359
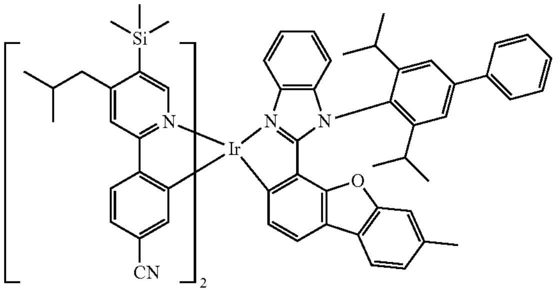
1360
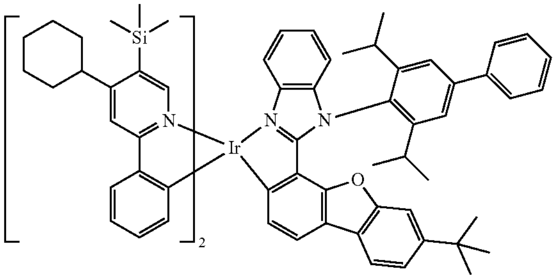
1361
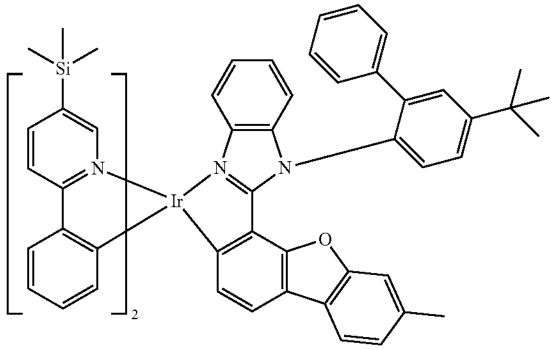
1362
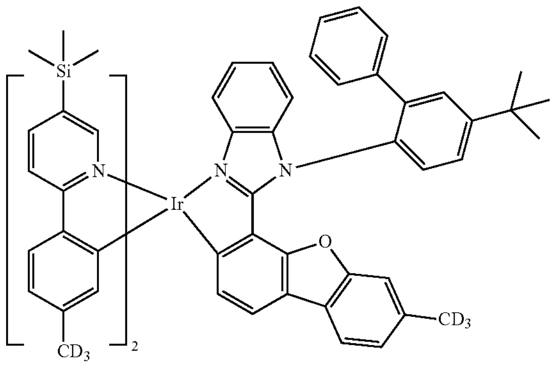
-continued
1363
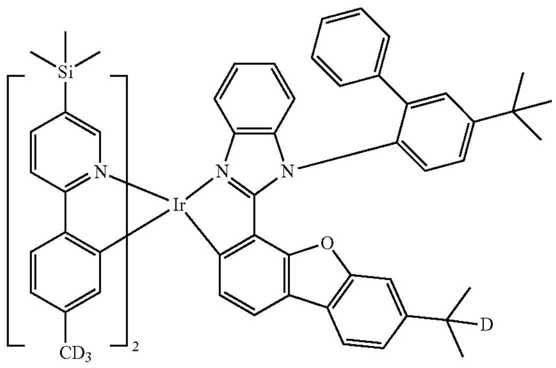
1364
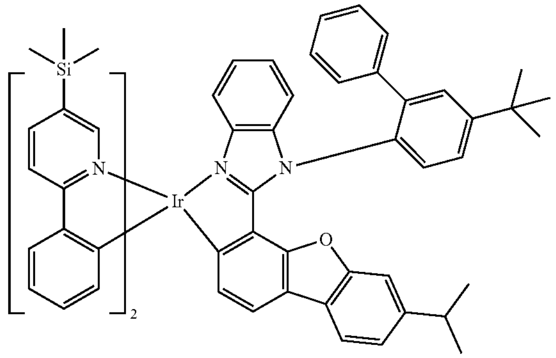
1365
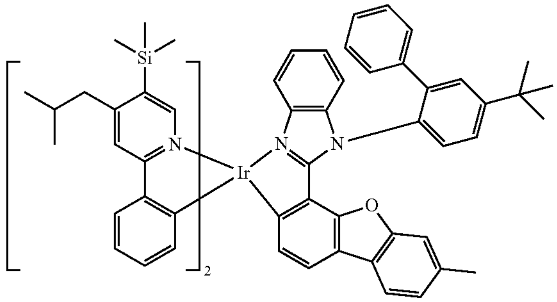
1366
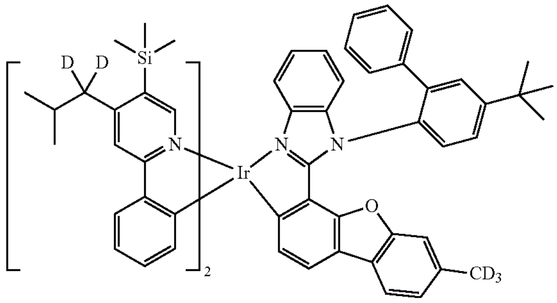

1367
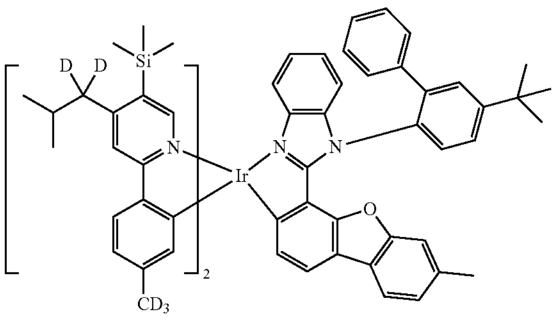
1368
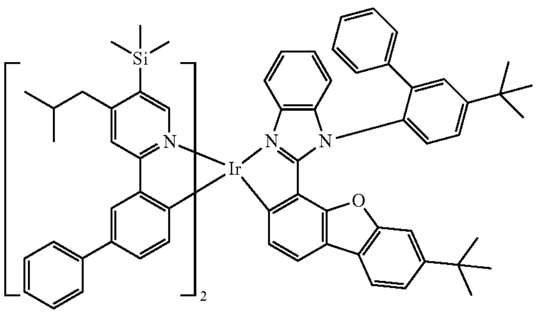
1369
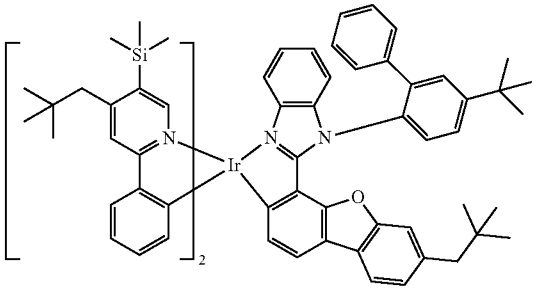
1370
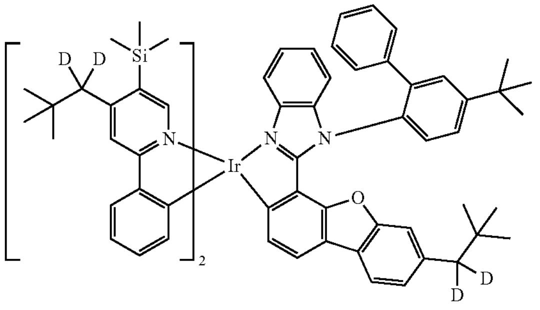
1371
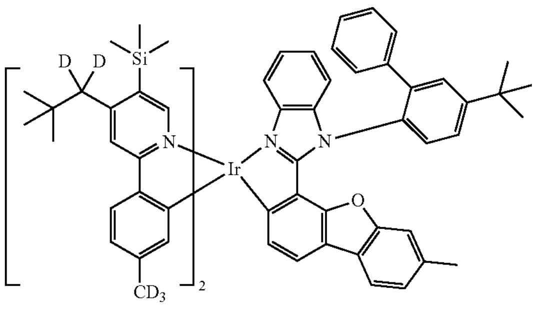
1372
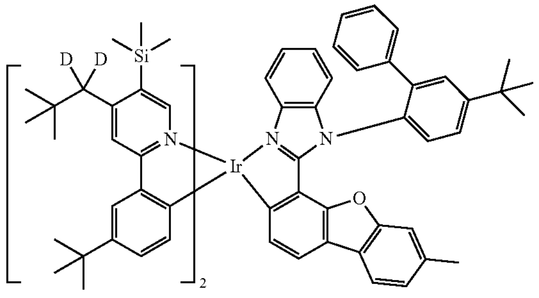
1373
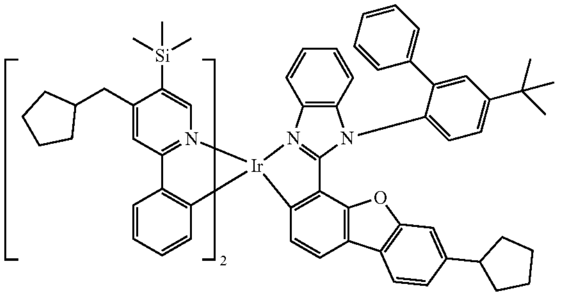
1374
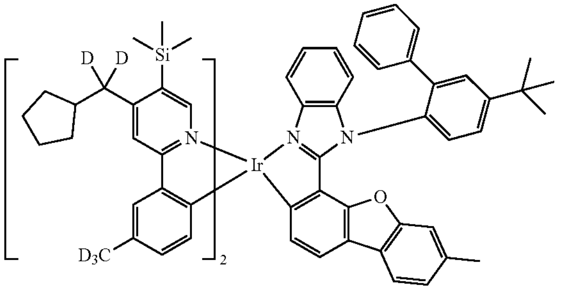
1375
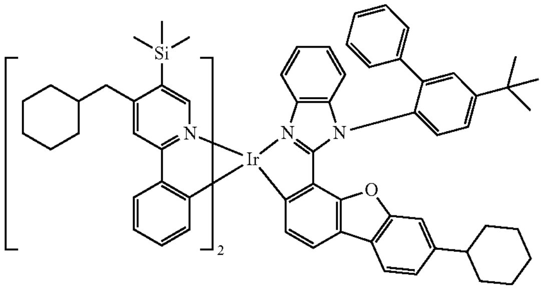
1376
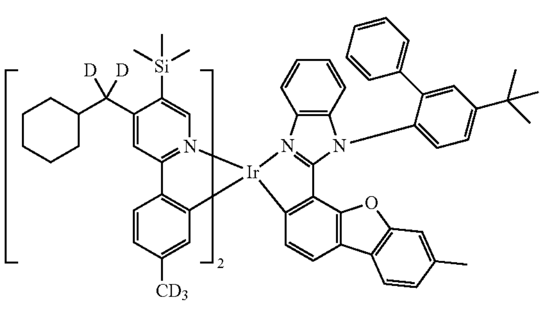

-continued
1377
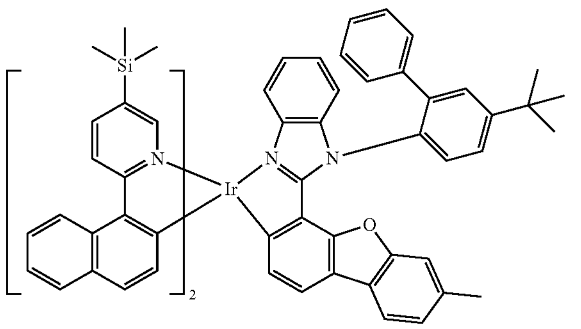
1378
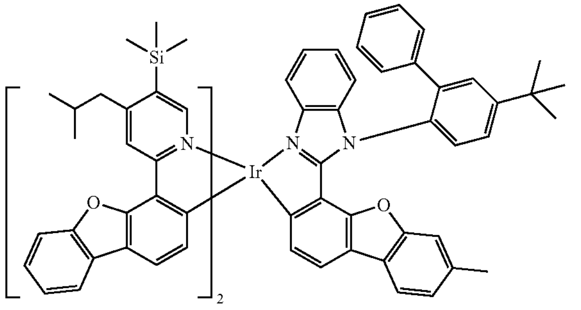
1379
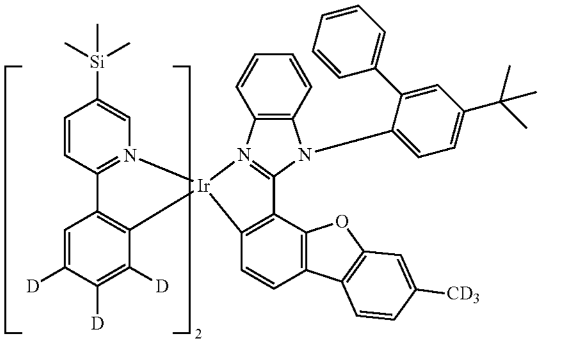
1380
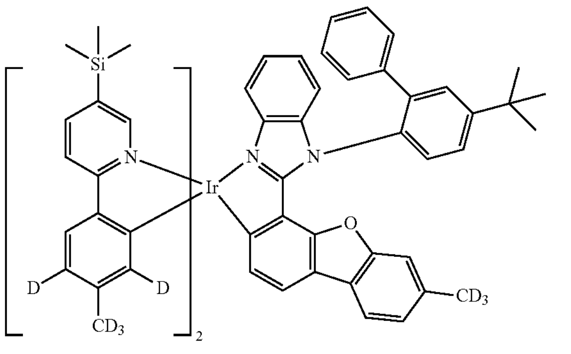
-continued
1381
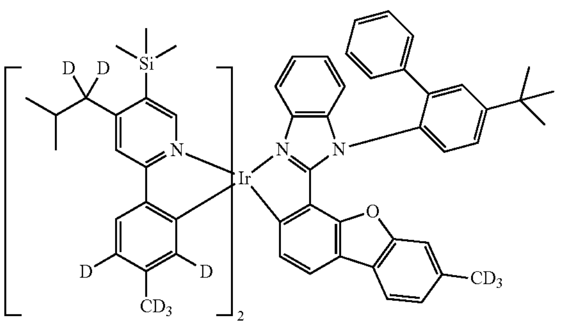
1382
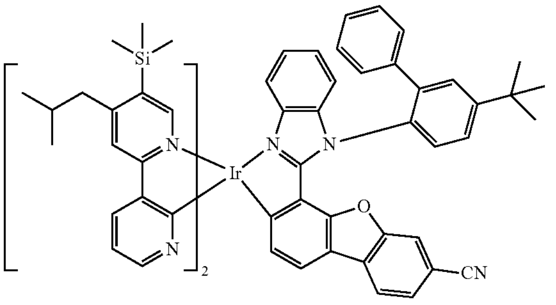
1383
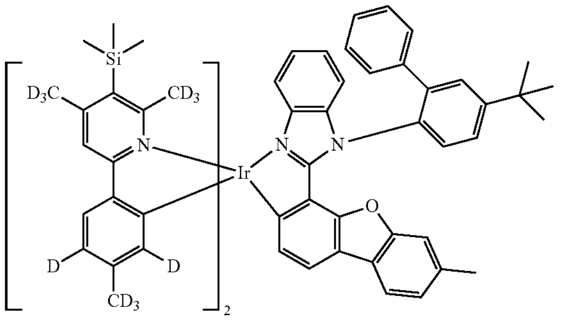
1384
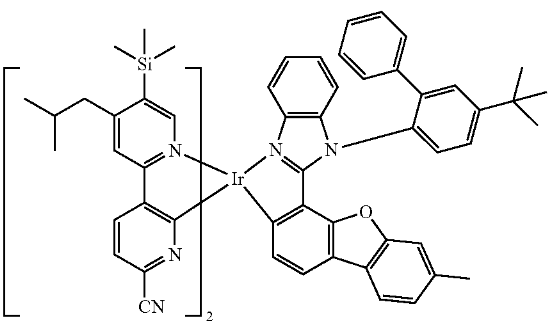

-continued
1385
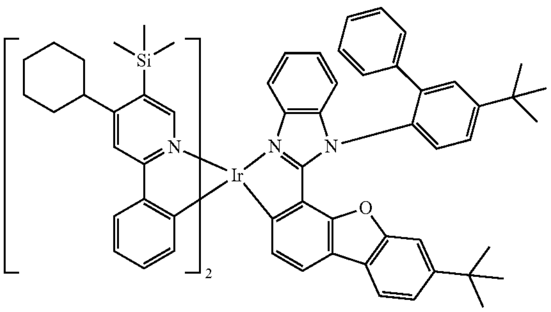
1636
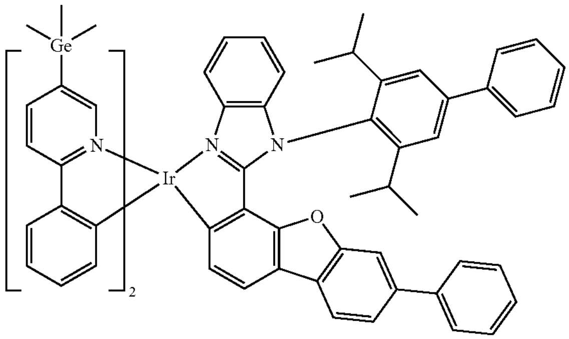
1637
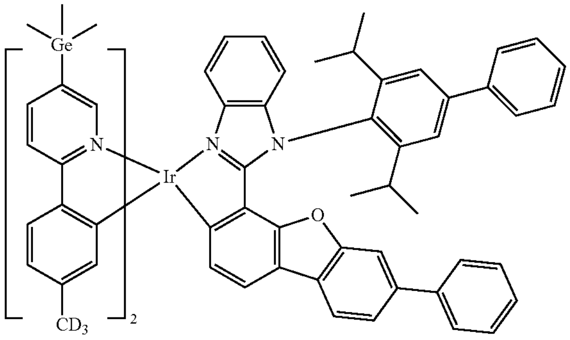
1638
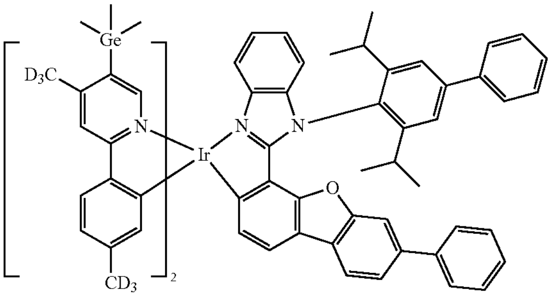
-continued
1639
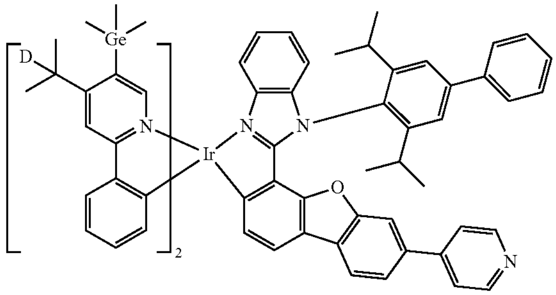
1640
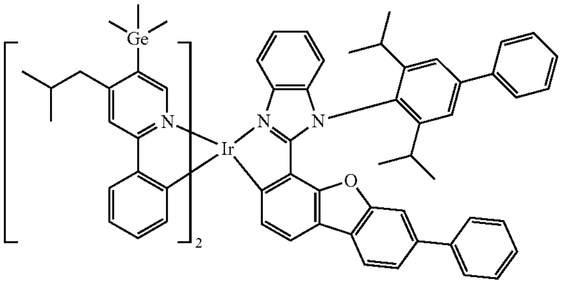
1641
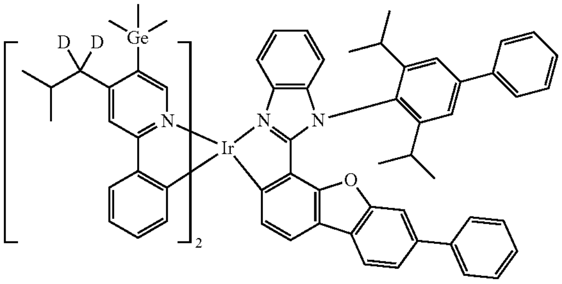
1642
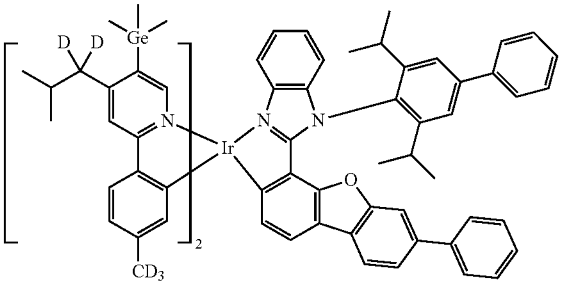
1643
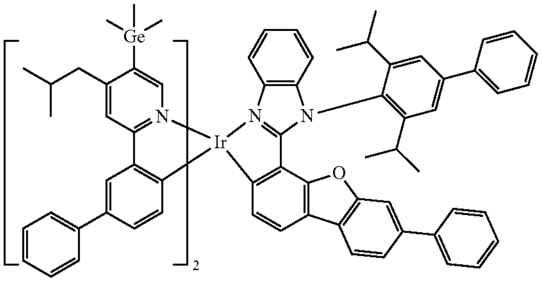

-continued
1644
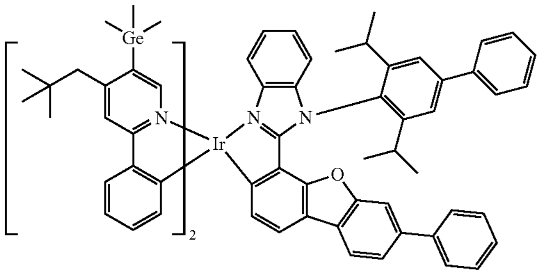
1645
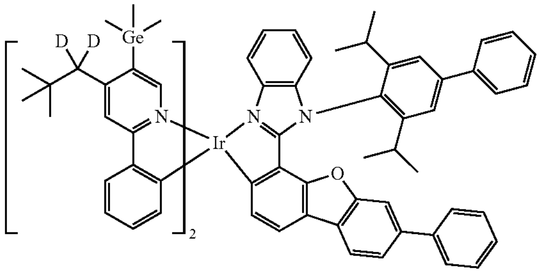
1646
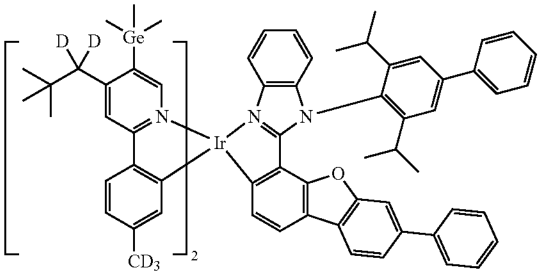
1647
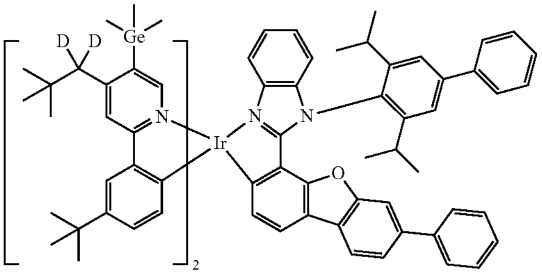
1648
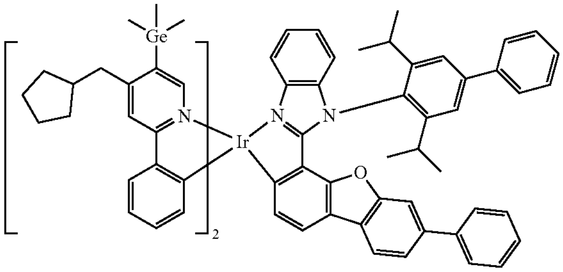
-continued
1649
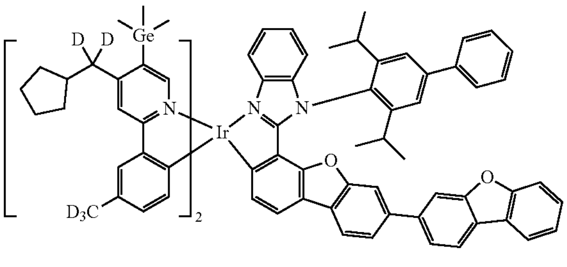
1650
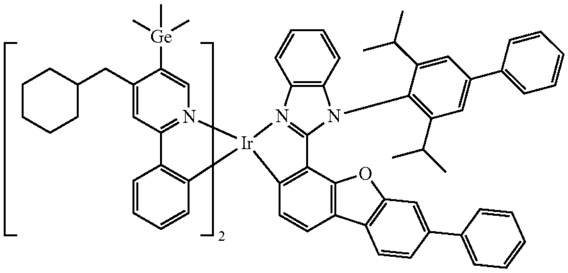
1651
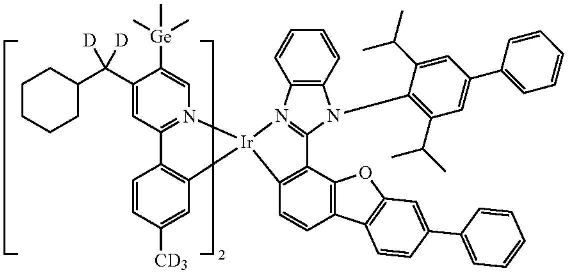
1652
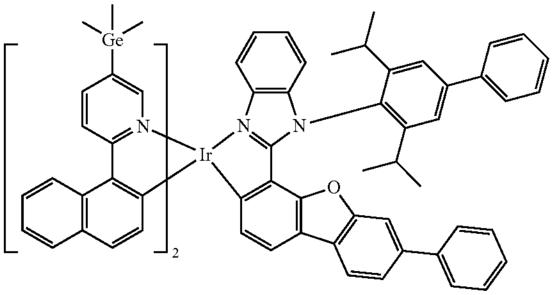
1653
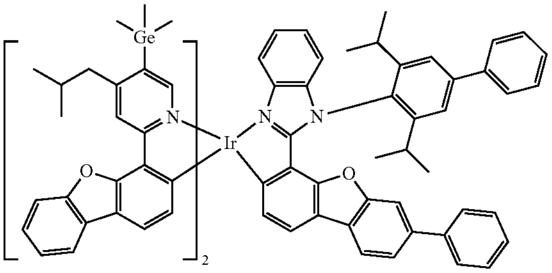

-continued
1654
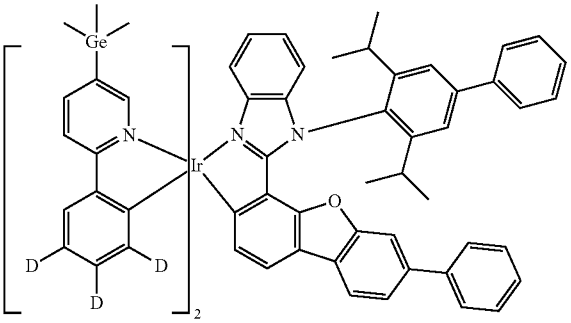
1655
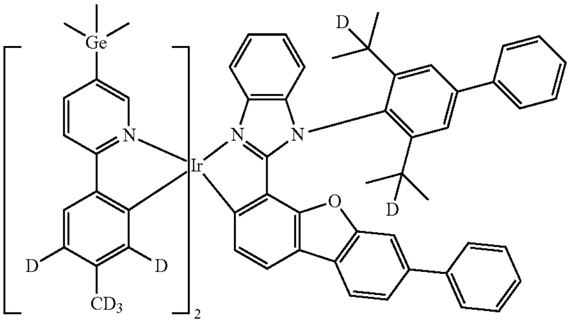
1656
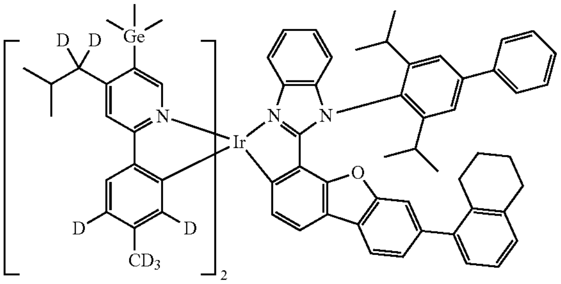
1657
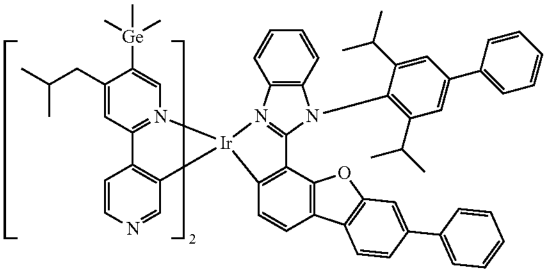
1658
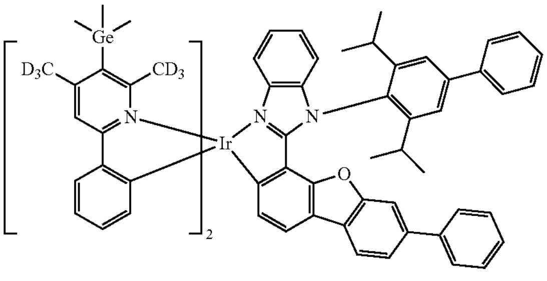
-continued
1659
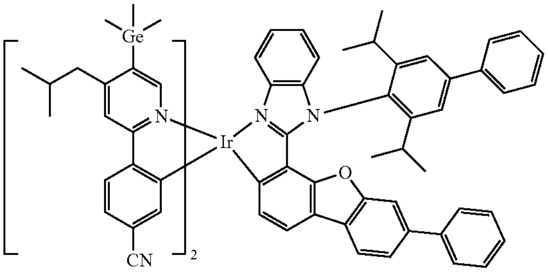
1660
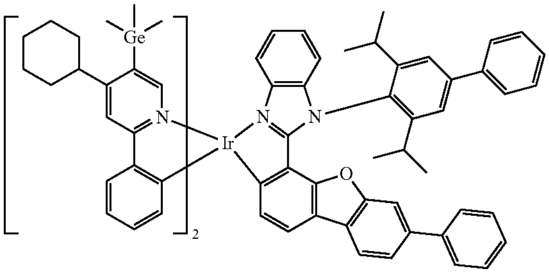
2241
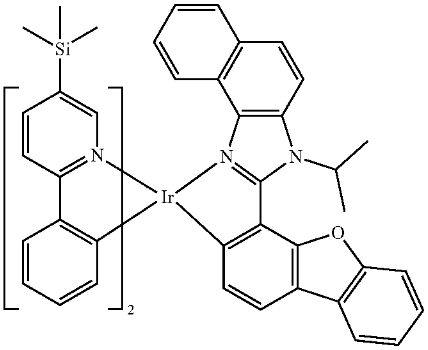
2242
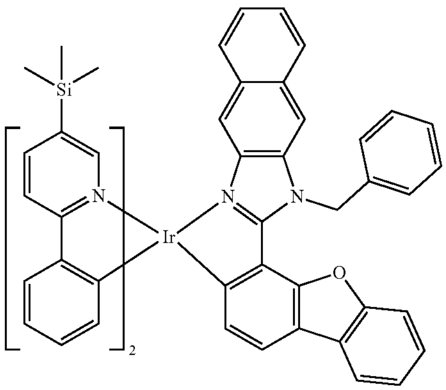

-continued
2243
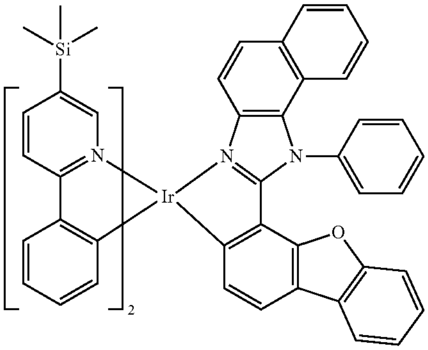
2244
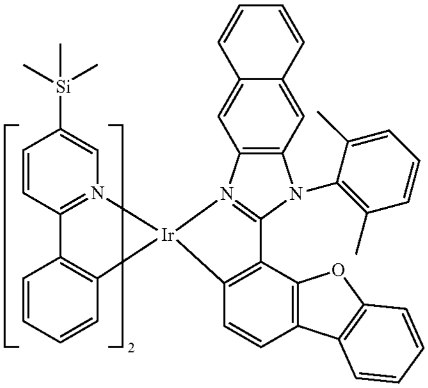
2245
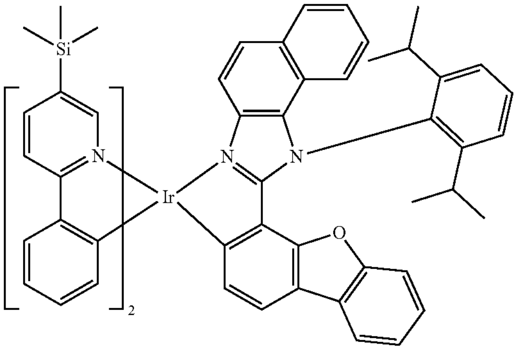
2246
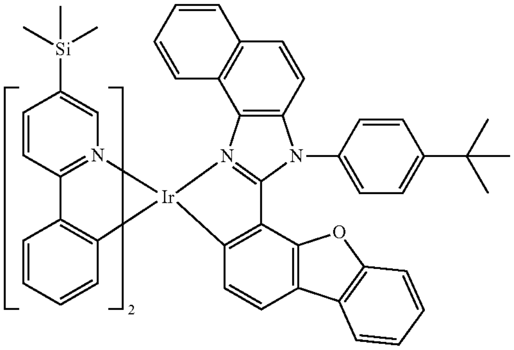
-continued
2247
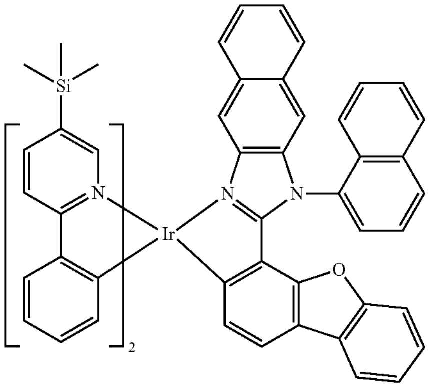
2248
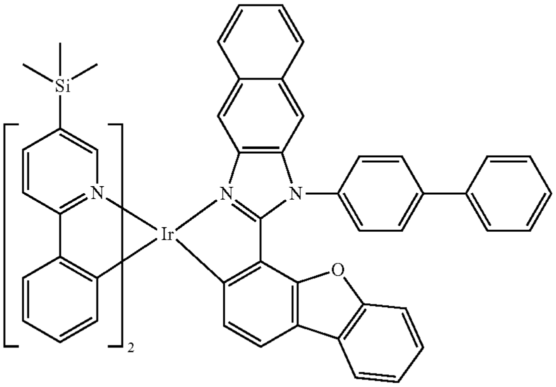
2249
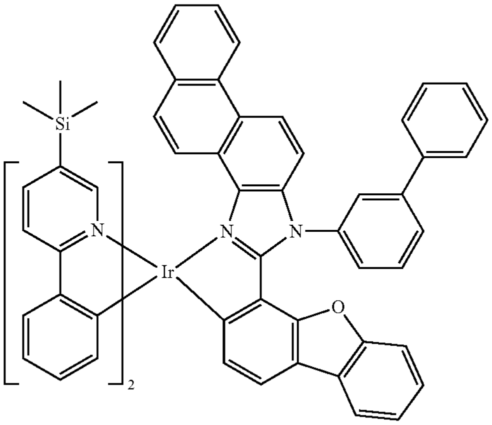
2250
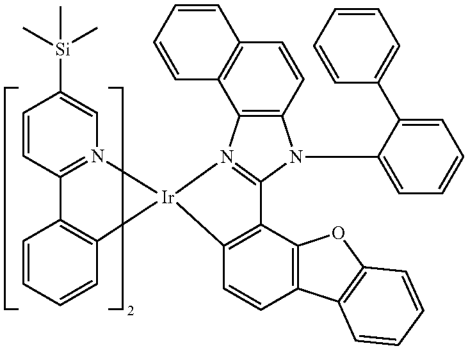

-continued
2251
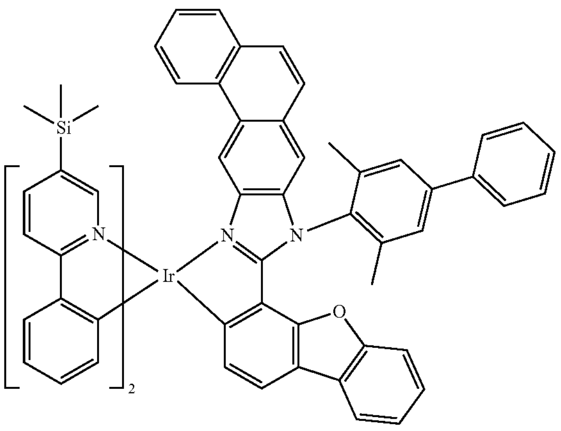
2252
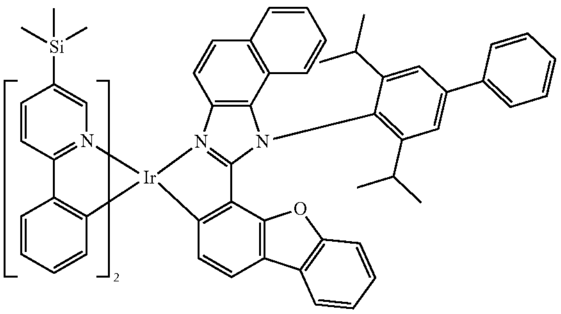
2253
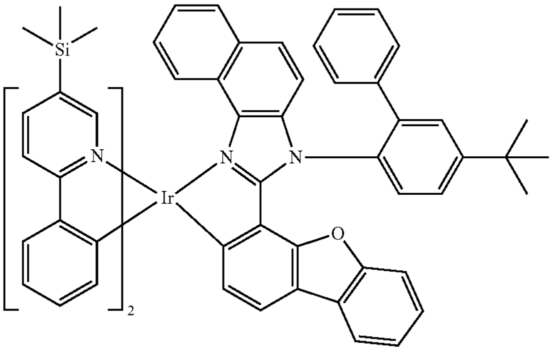
2254
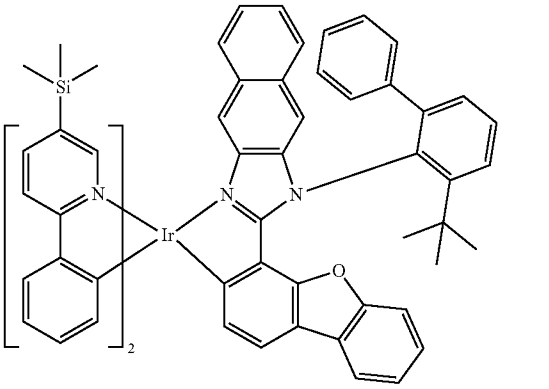
-continued
2255
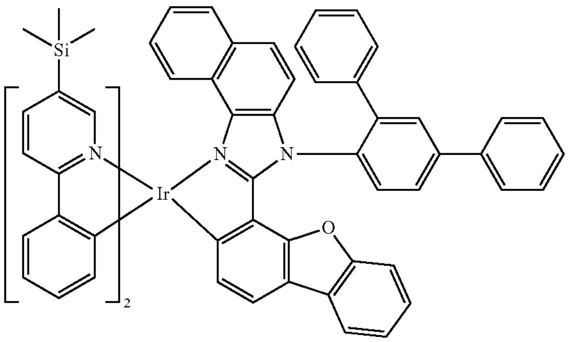
2256
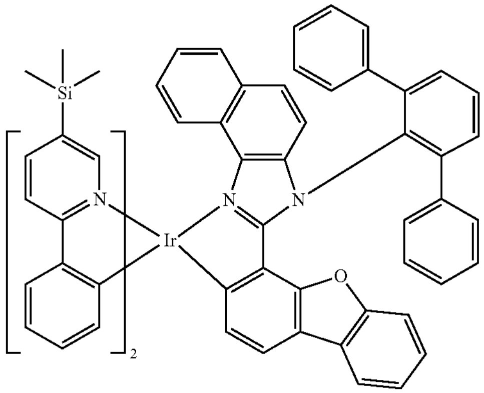
2257
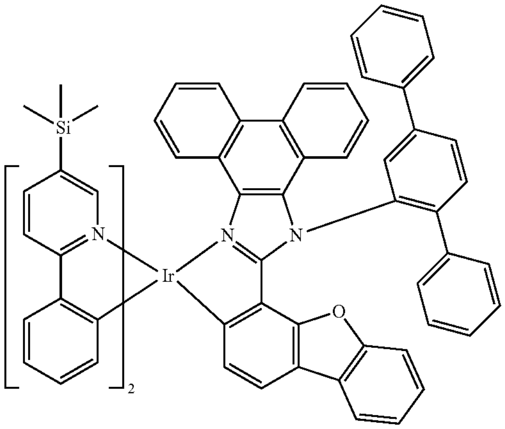
2258
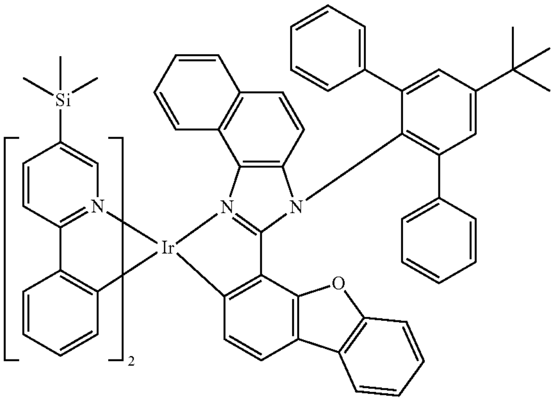

-continued
2259
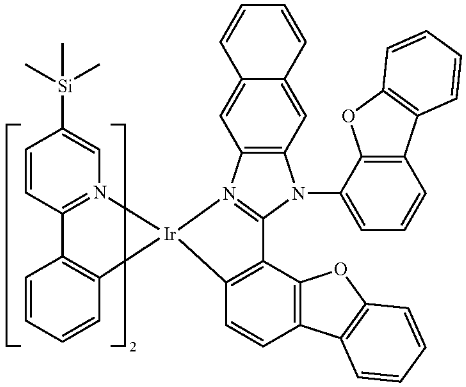
2260
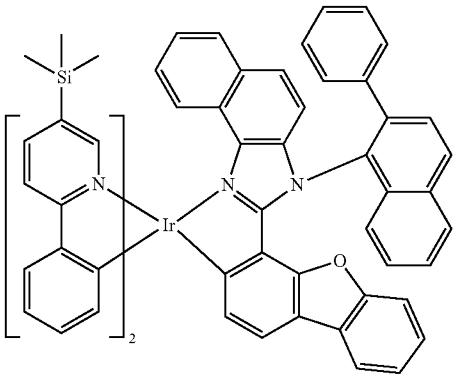
2261
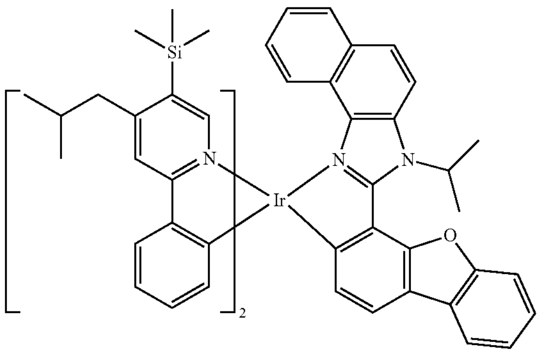
2262
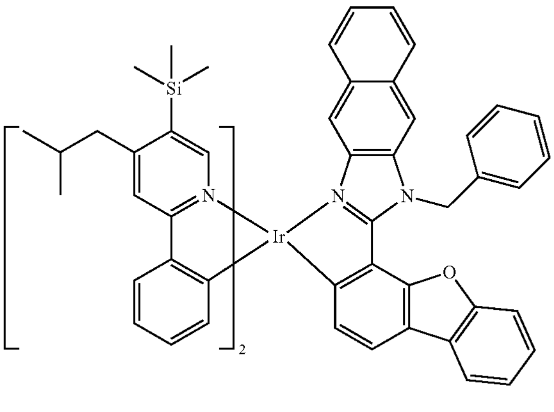
-continued
2263
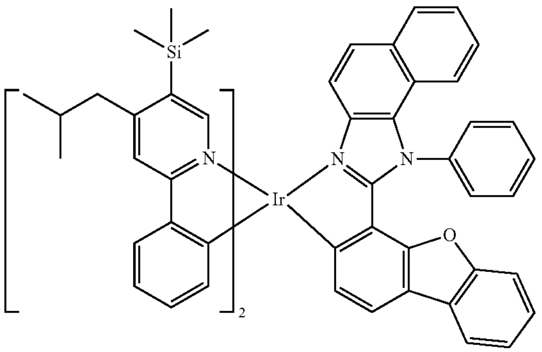
2264
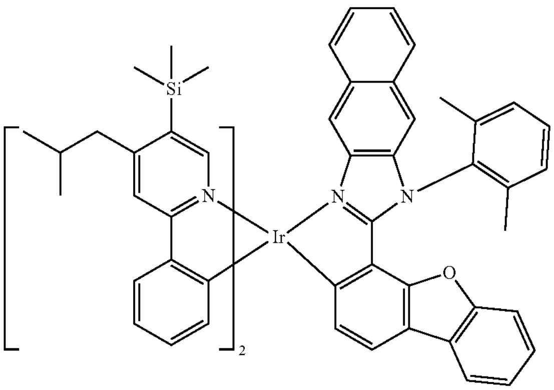
2265
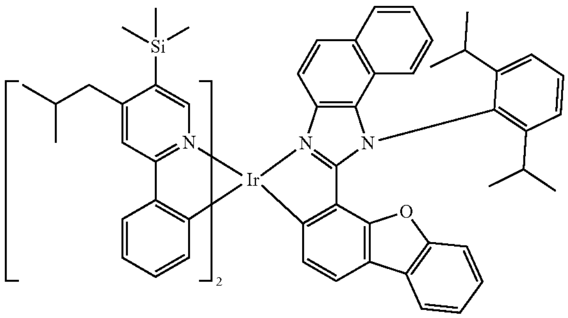
2266
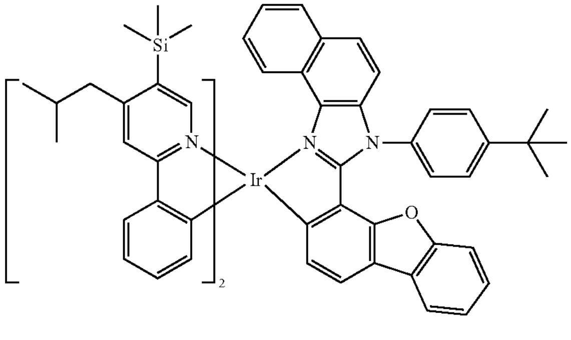

-continued
2267
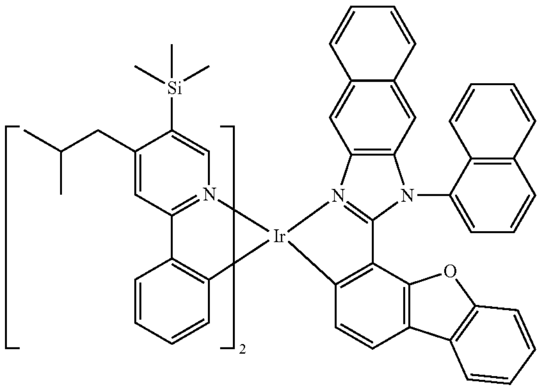
2268
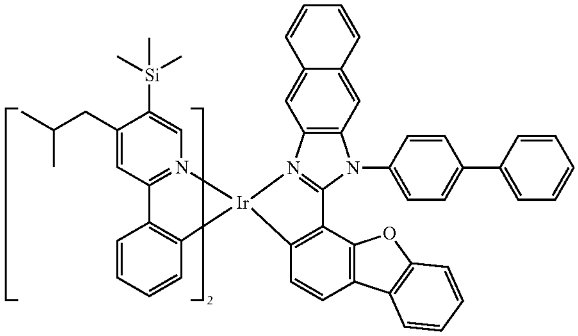
2269
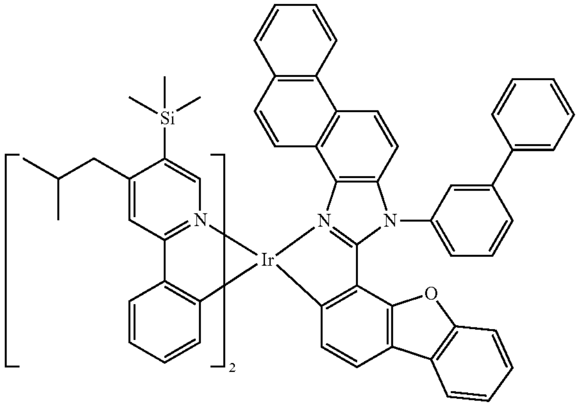
2270
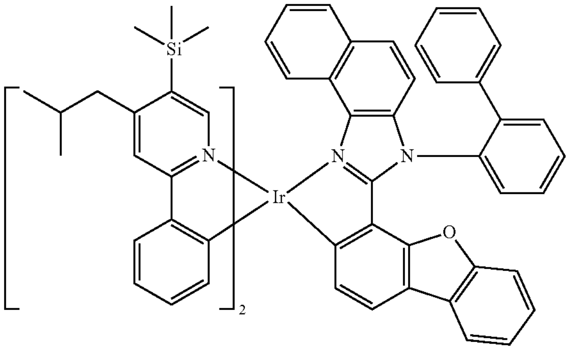
-continued
2271
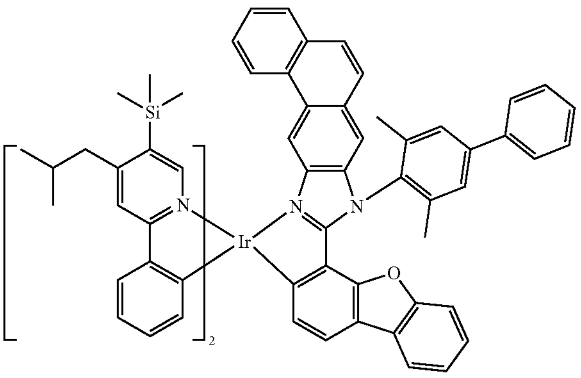
2272
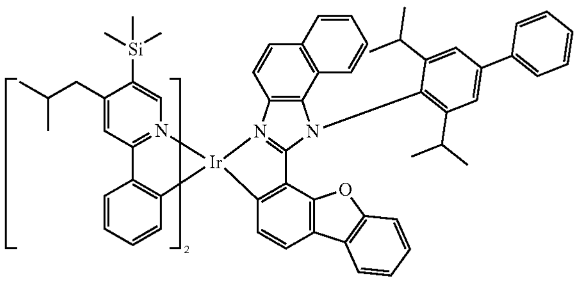
2273
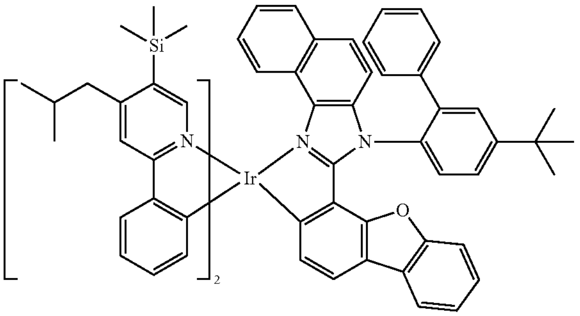
2274
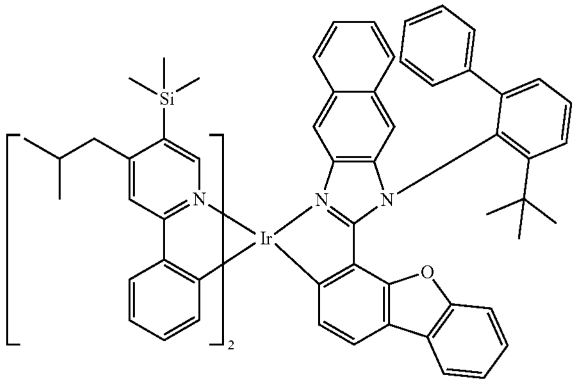

-continued
2275
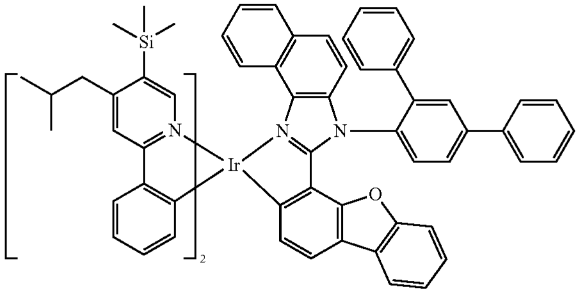
2276
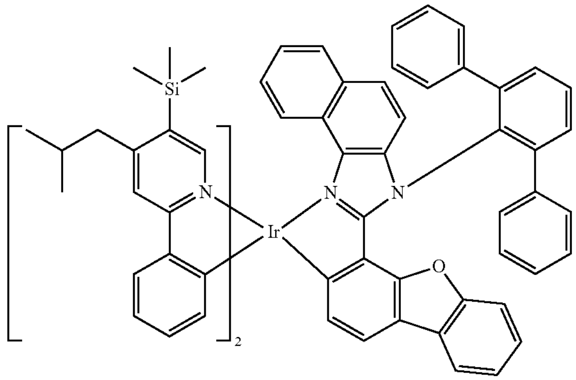
2277
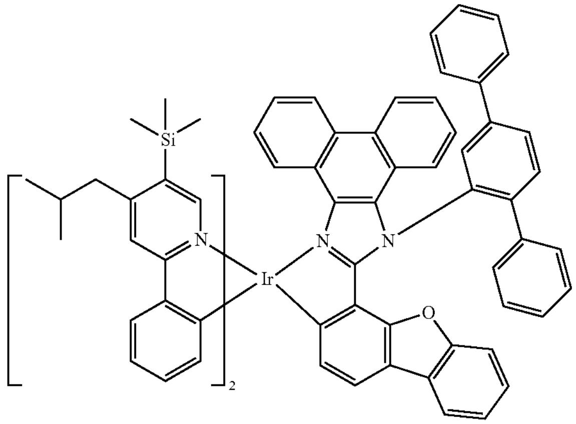
2278
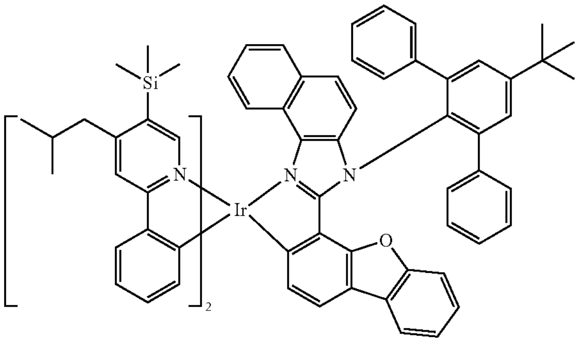
-continued
2279
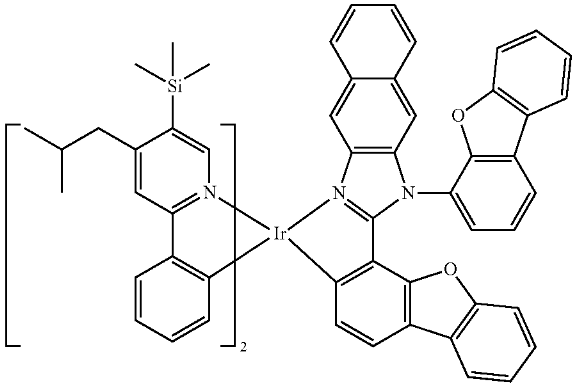
2280
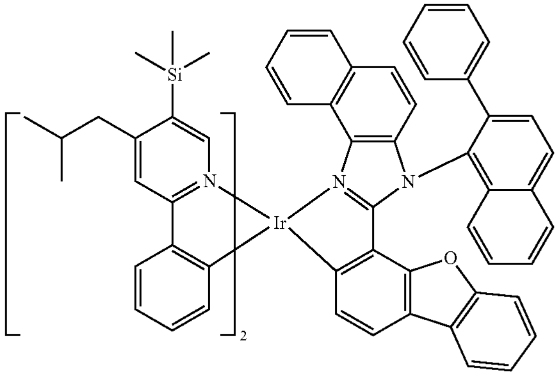
2281
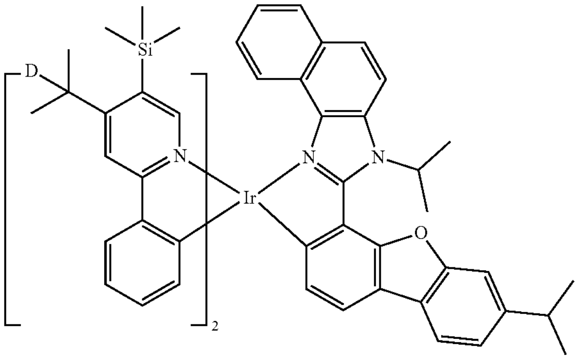
2282
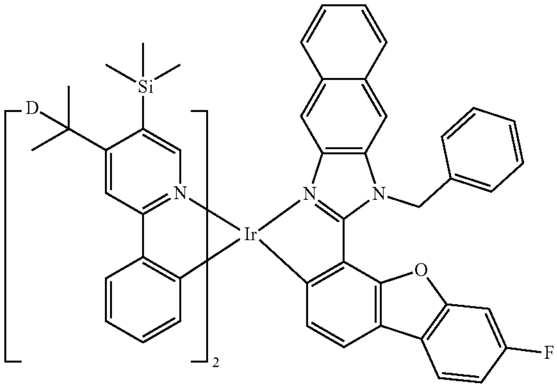

2283
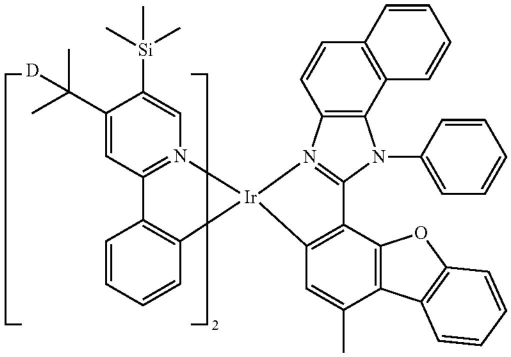
2284
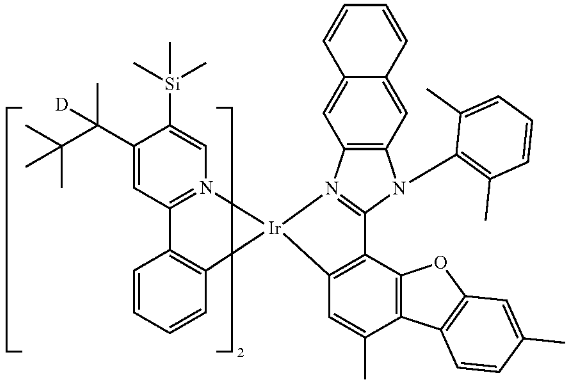
2285
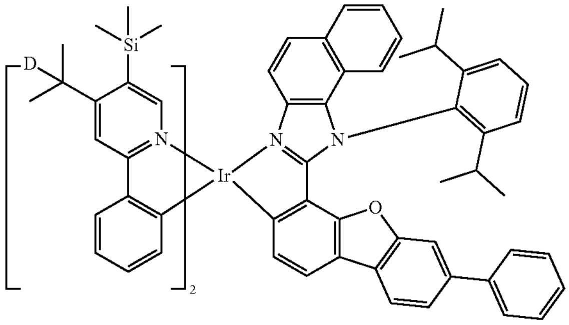
2286
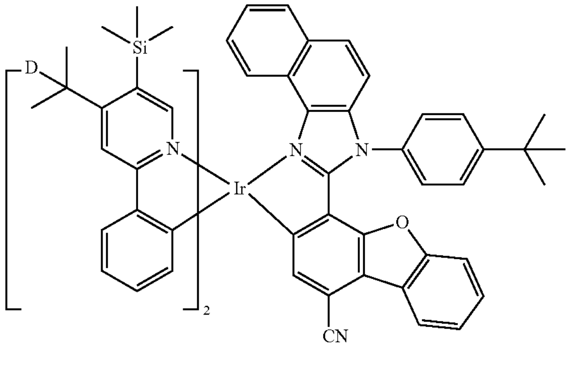
2287
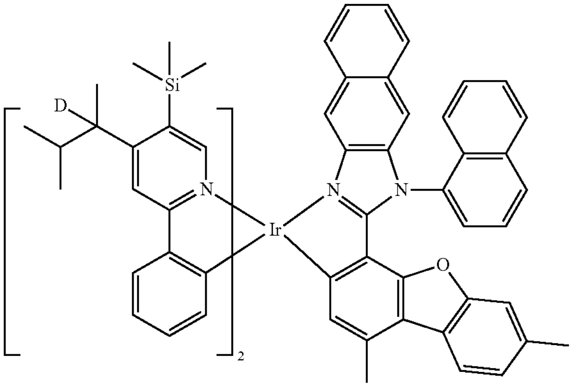
2288
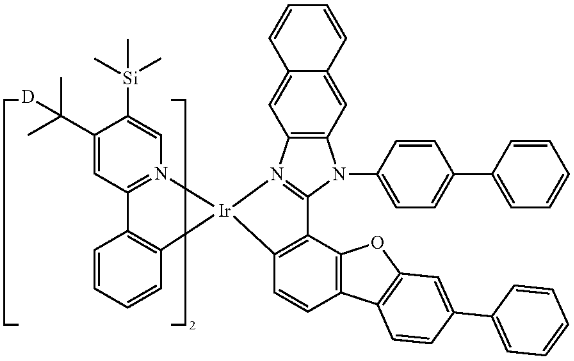
2289
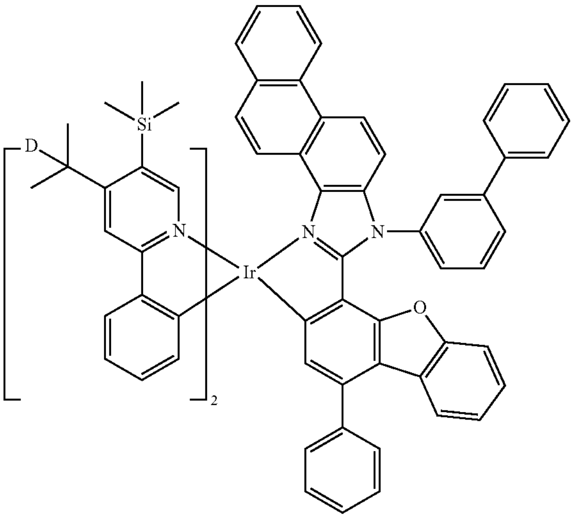

-continued
2290
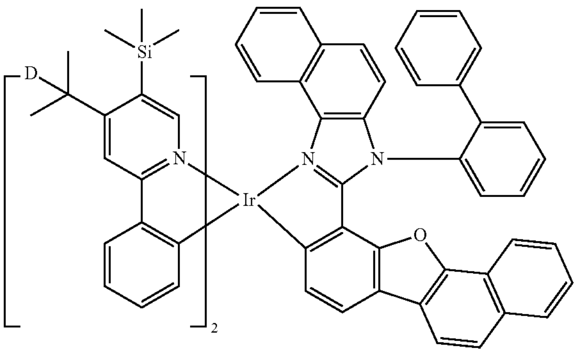
2291
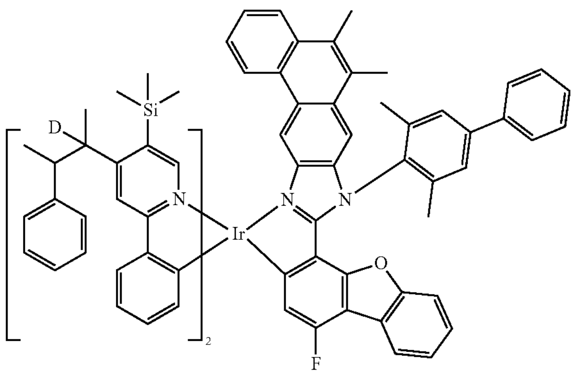
2292
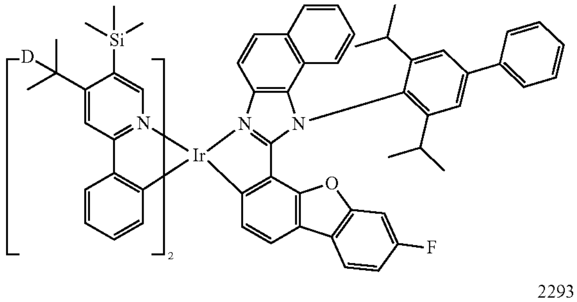
2293
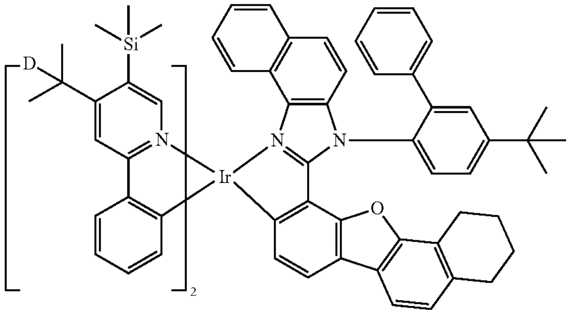
-continued
2294
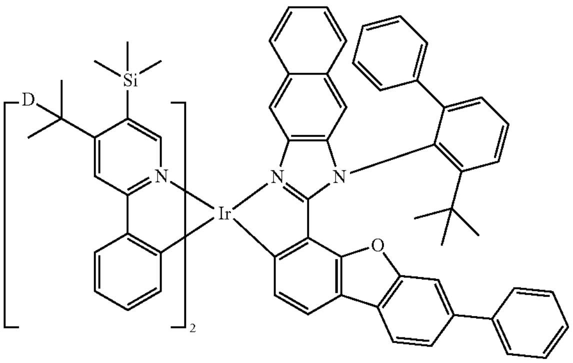
2295
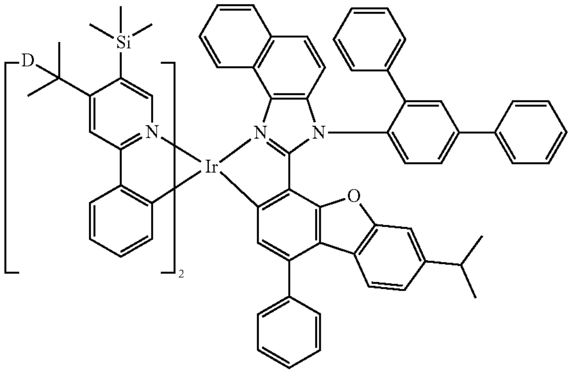
2296
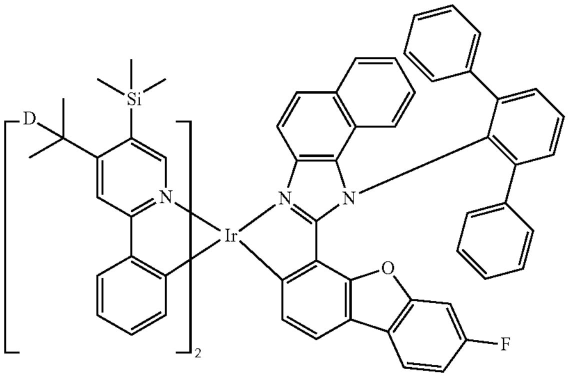
2297
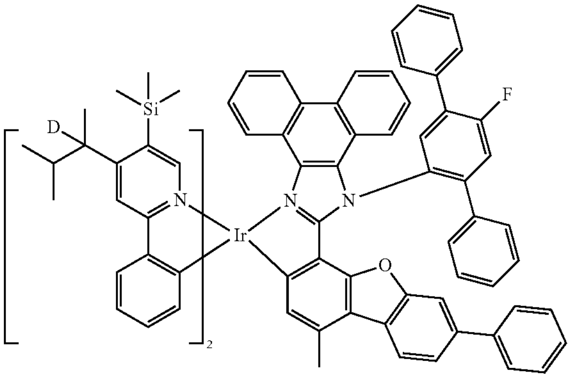

-continued
2298
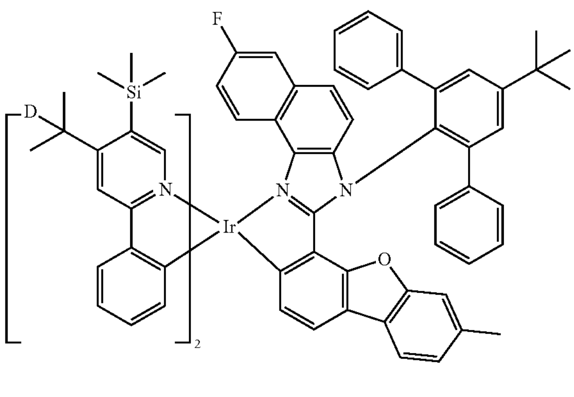
2299
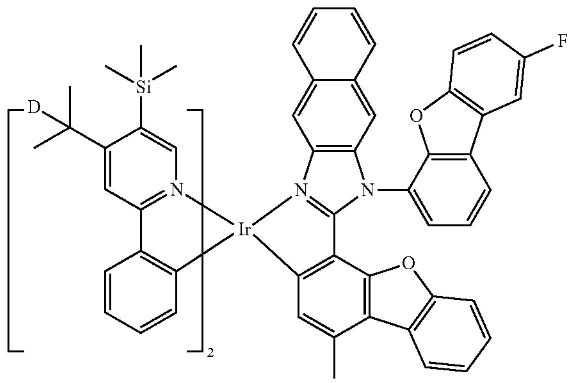
2300
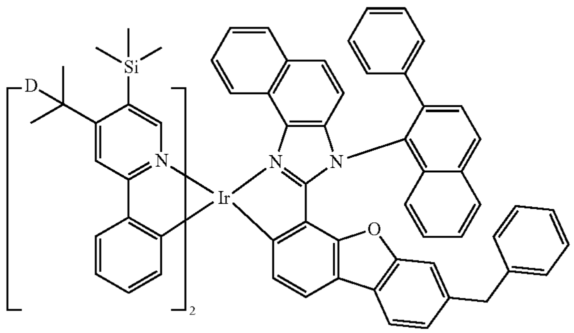
2301
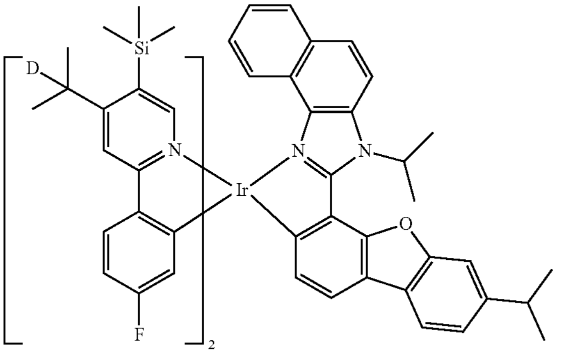
-continued
2302
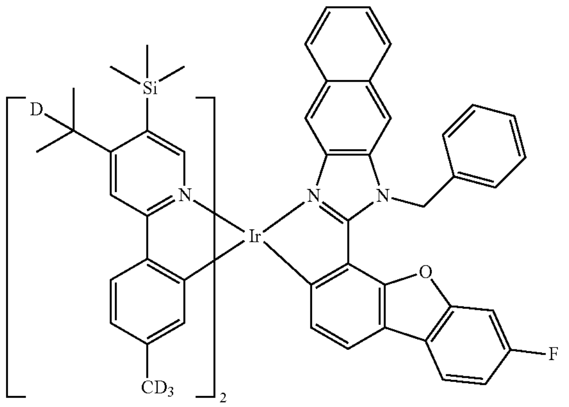
2303
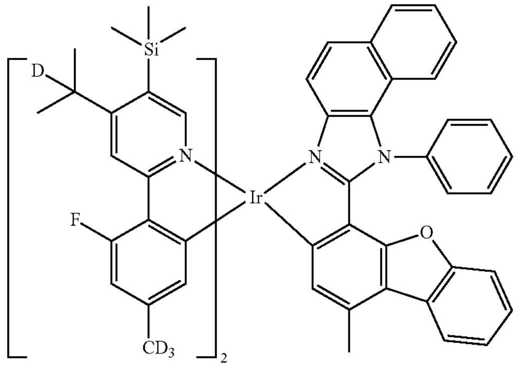
2304
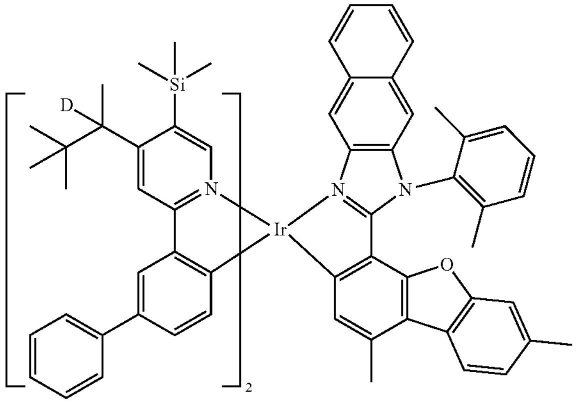
2305
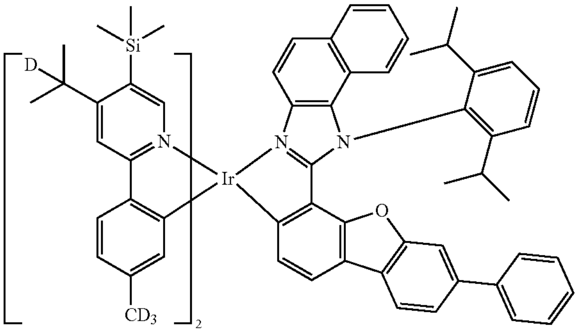

-continued
2306
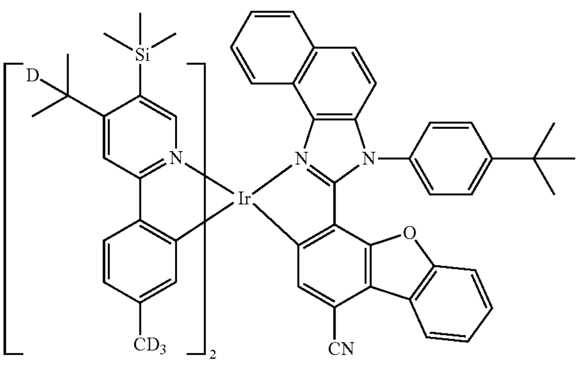
2307
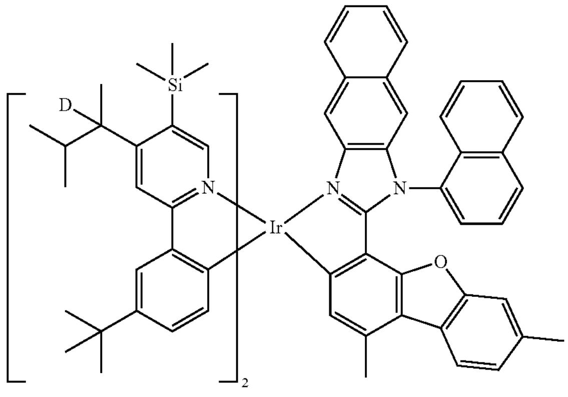
2308
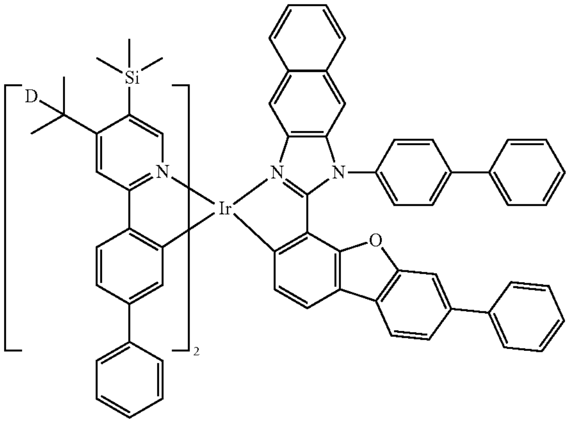
-continued
2309
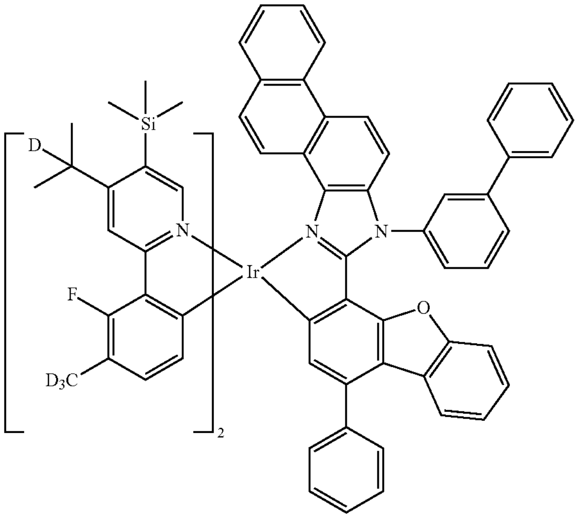
2310
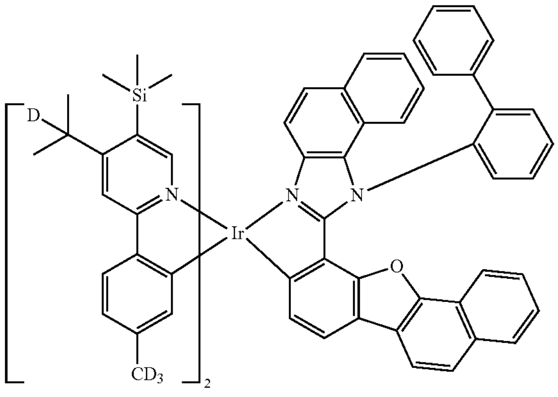
2311
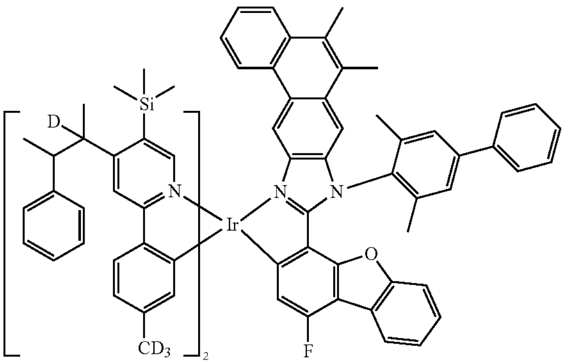
2312
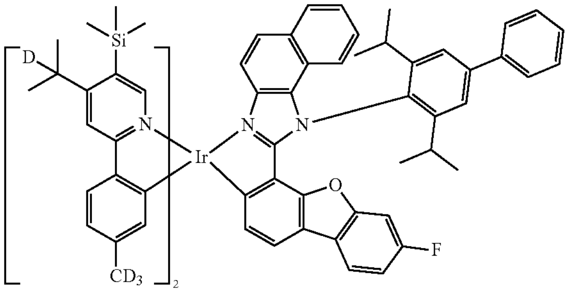

-continued
2313
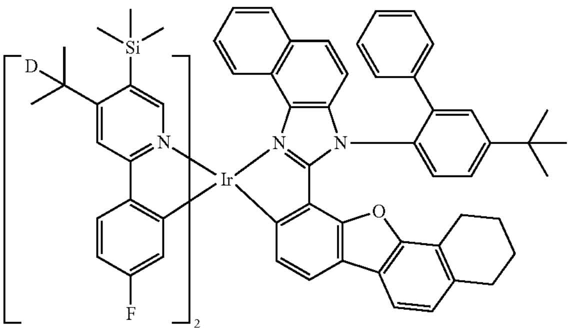
2314
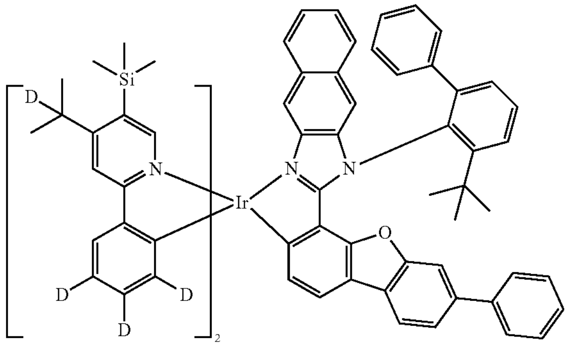
2315
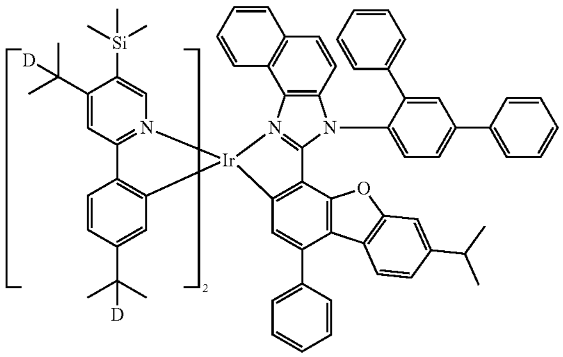
2316
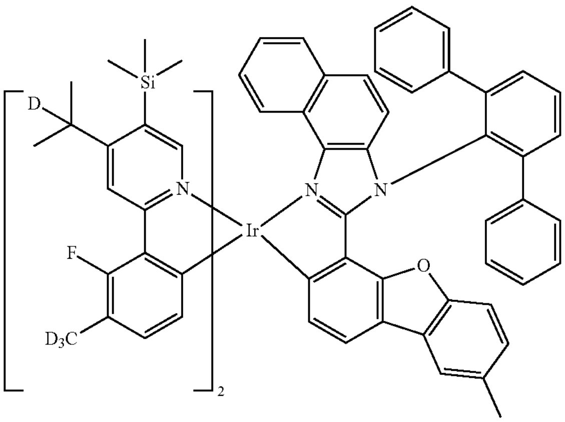
-continued
2317
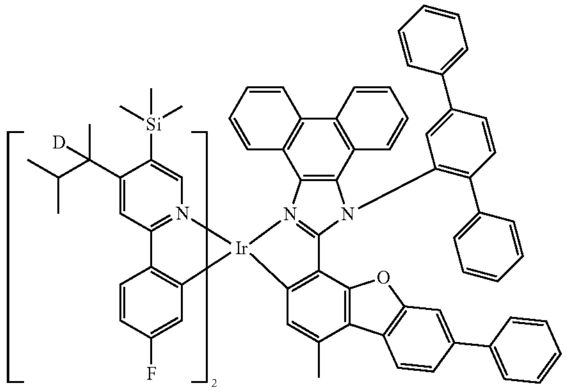
2318
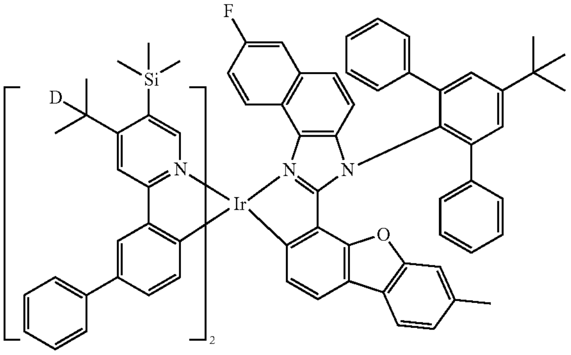
2319
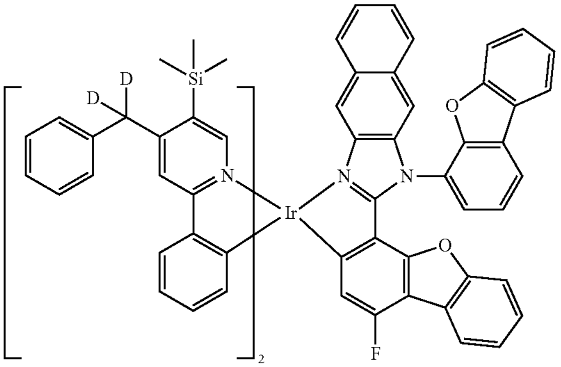
2320
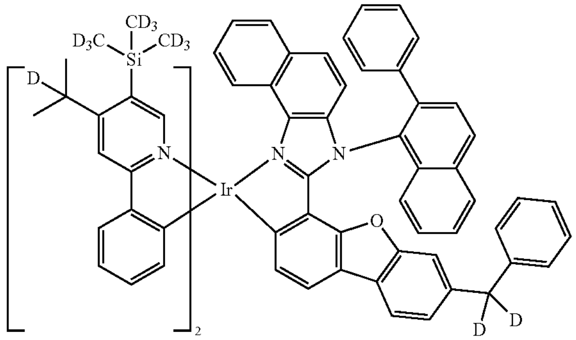

-continued
2361
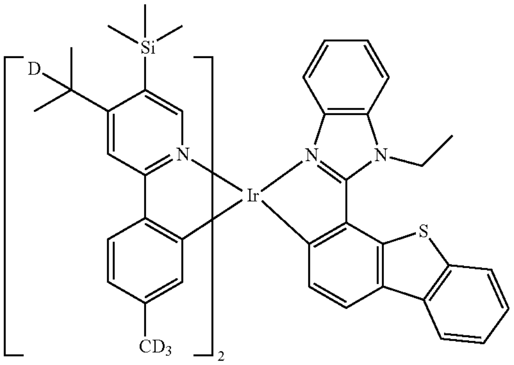
2362
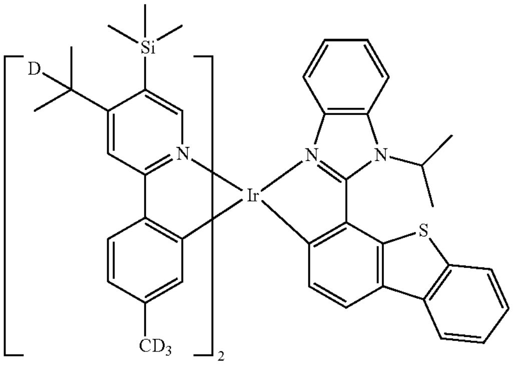
2363
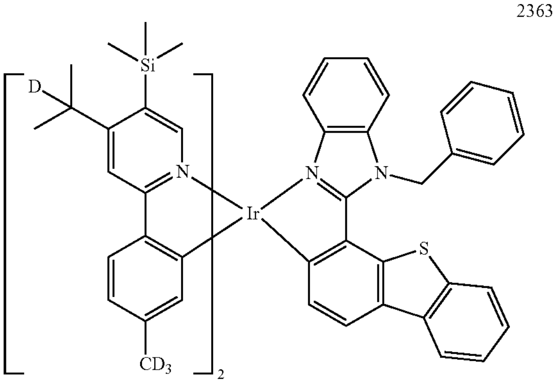
2364
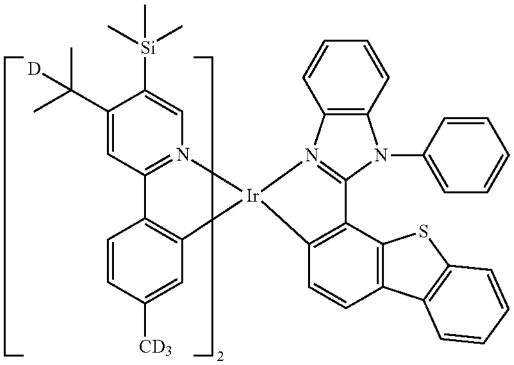
-continued
2365
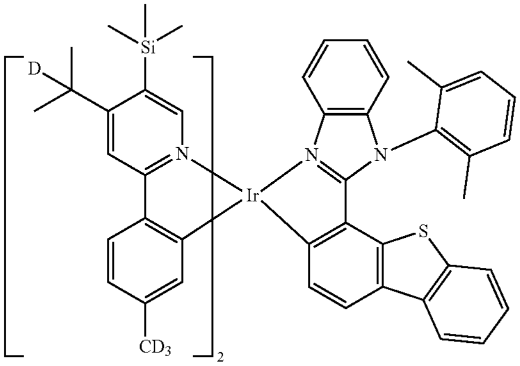
2366
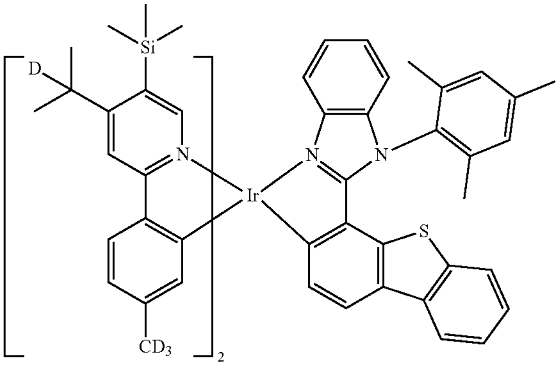
2367
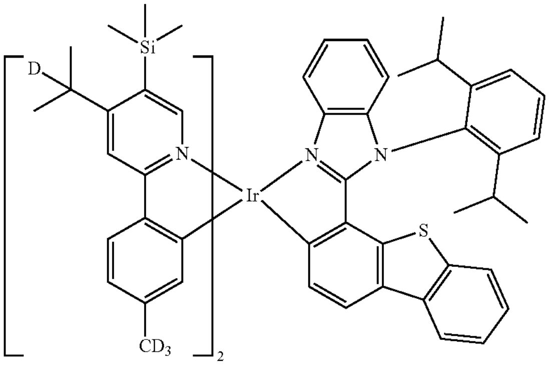
2368
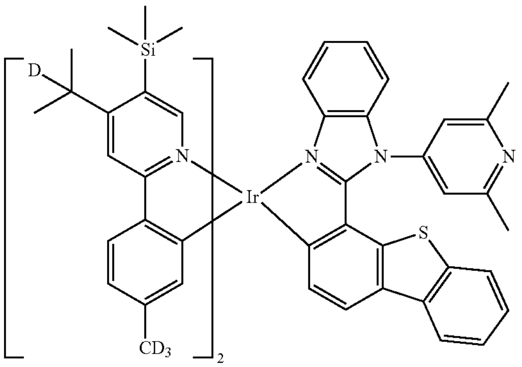

-continued
2369
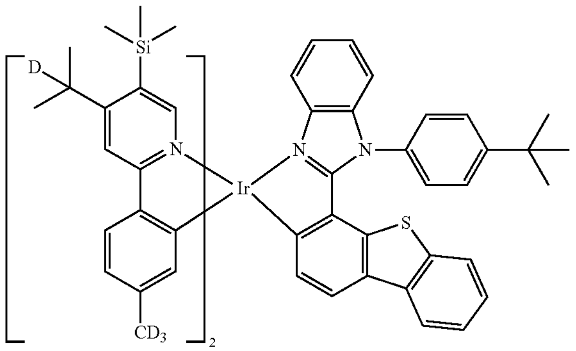
2370
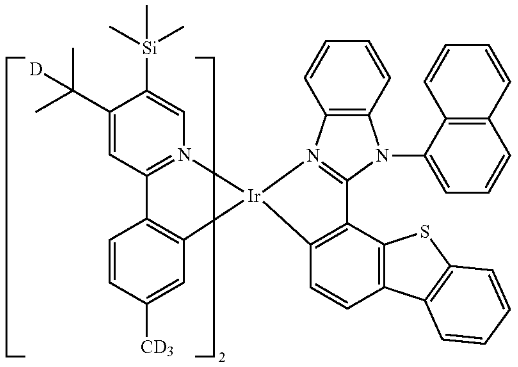
2371
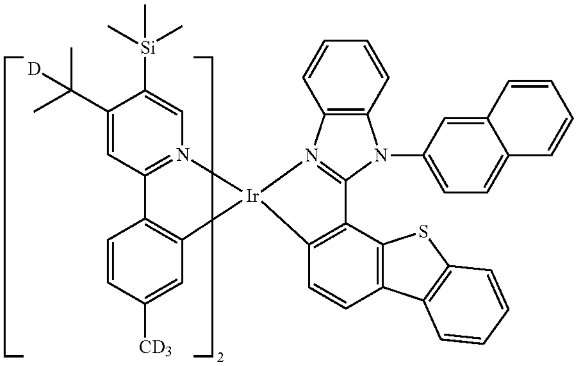
2372
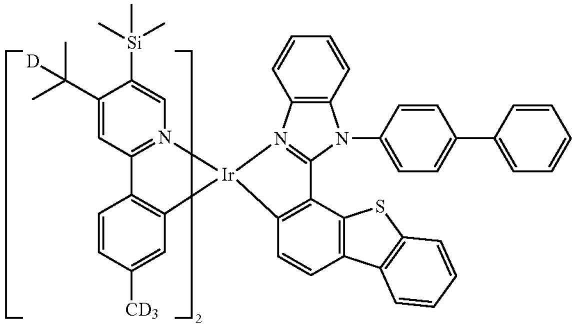
-continued
2373
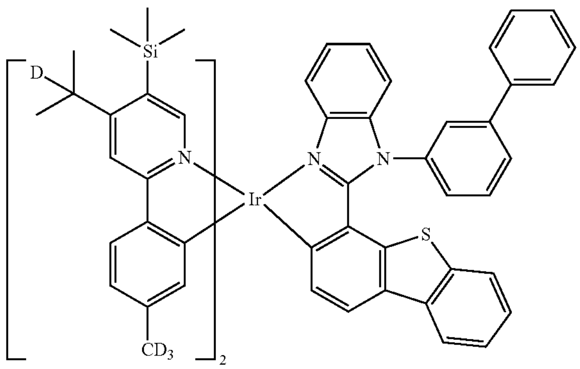
2374
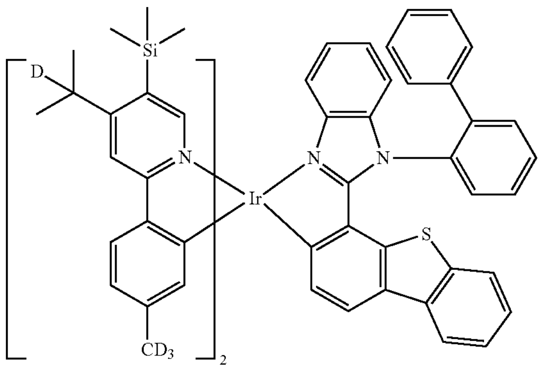
2375
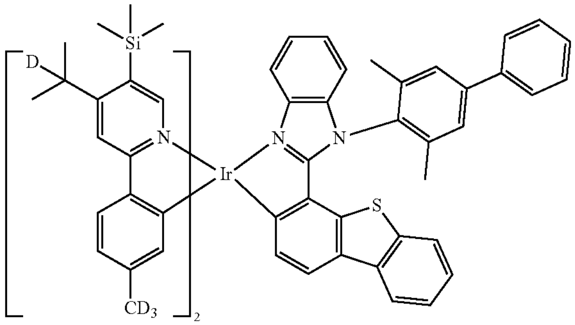
2376
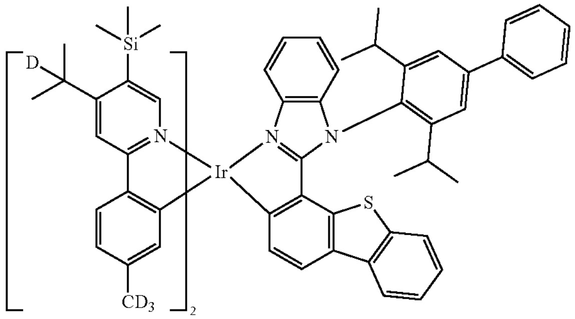

-continued
2377
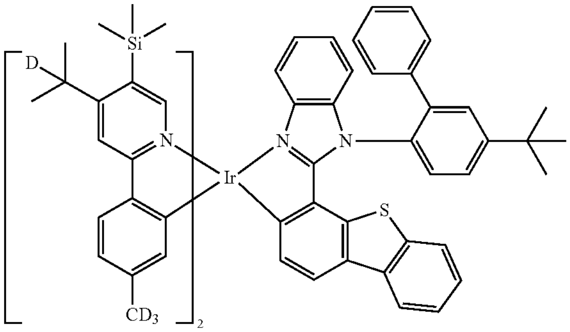
2378
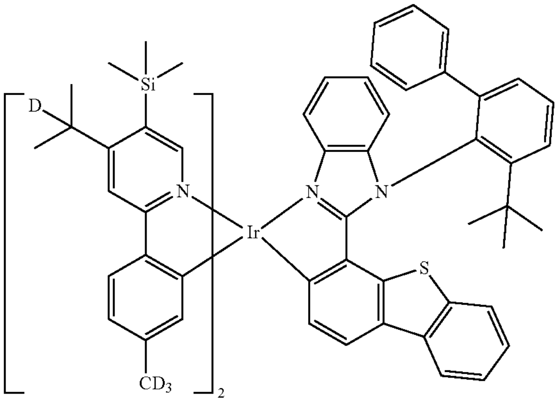
2379
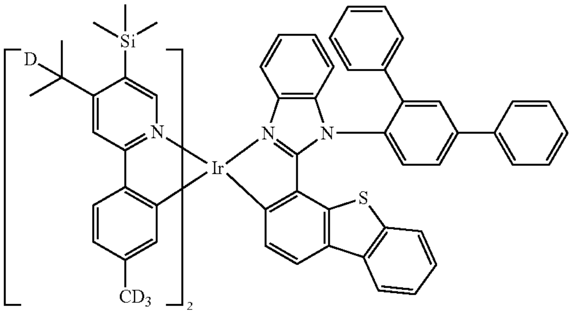
2380
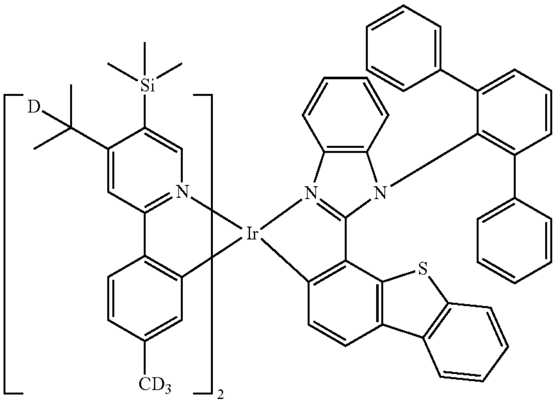
-continued
2381
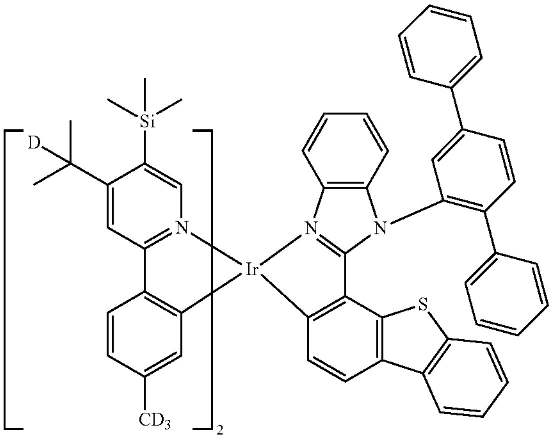
2382
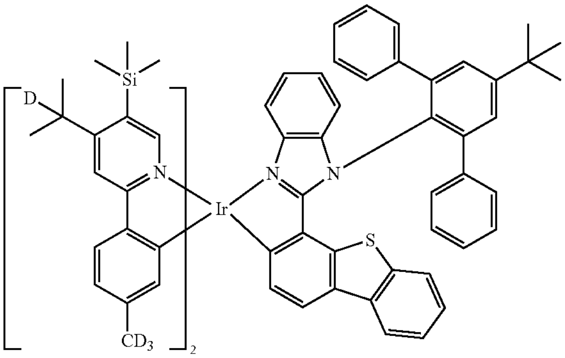
2383
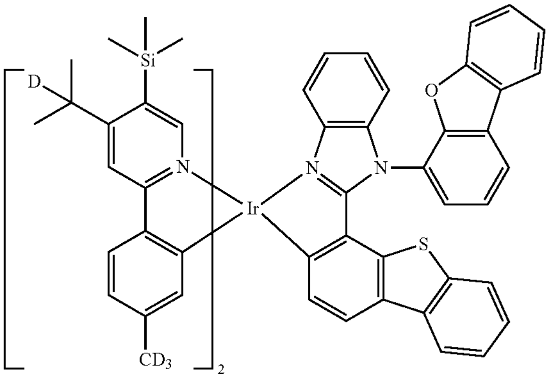
2384
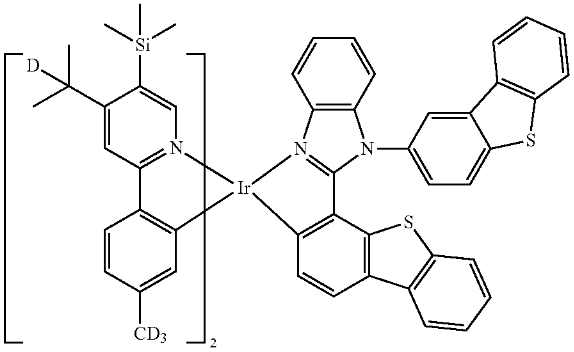

-continued
2385
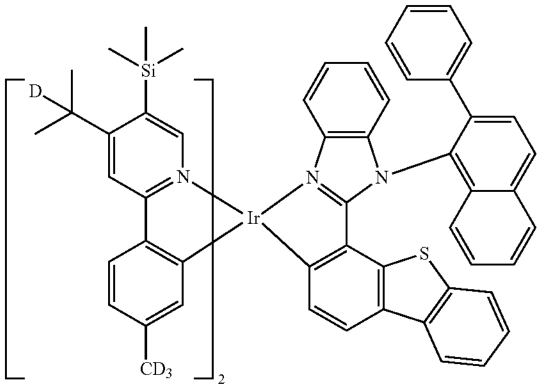
2836
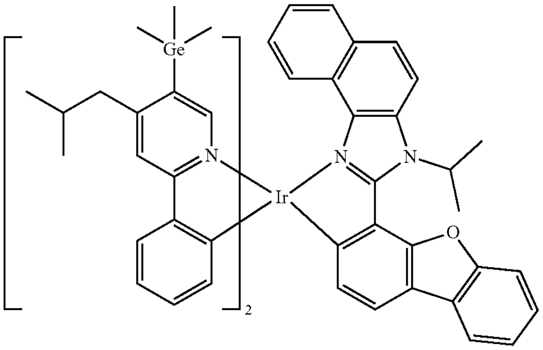
2837
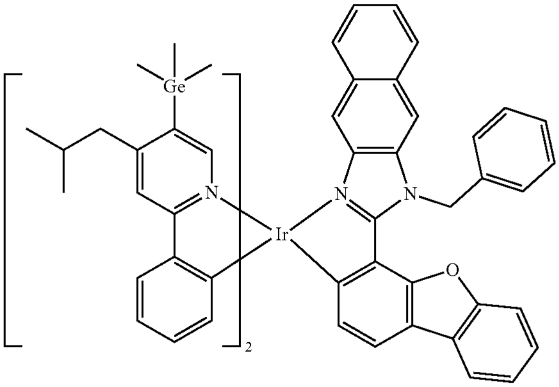
2838
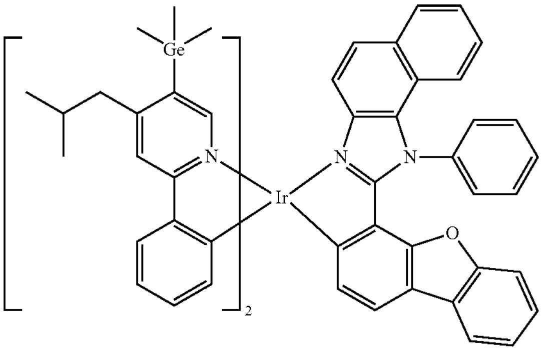
-continued
2839
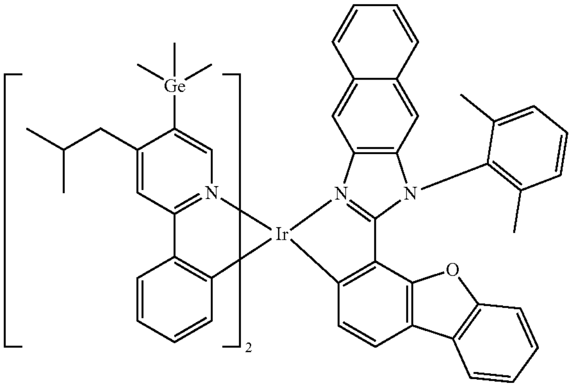
2840
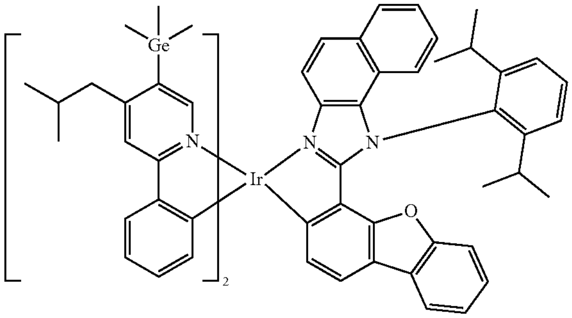
2841
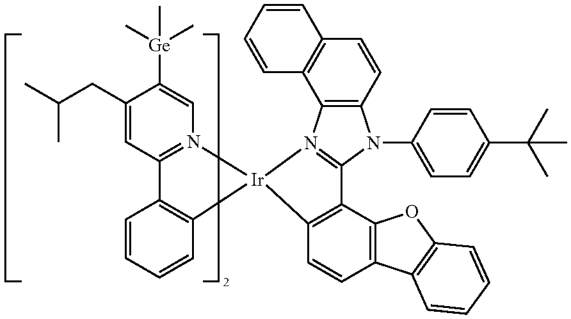
2842
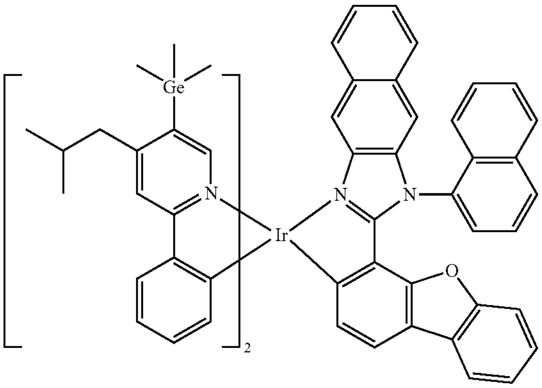

-continued
2843
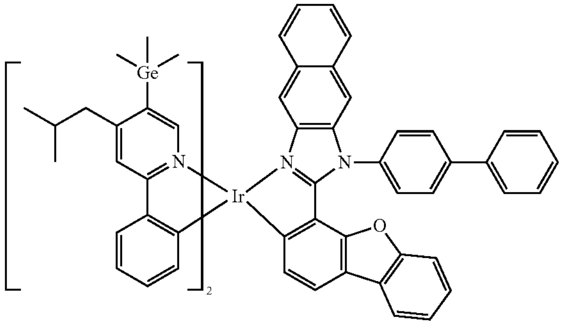
2844
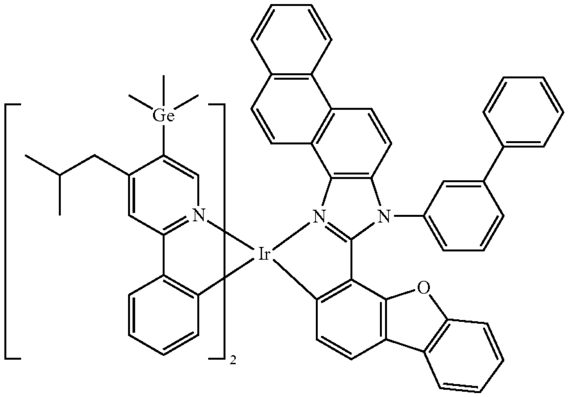
2845
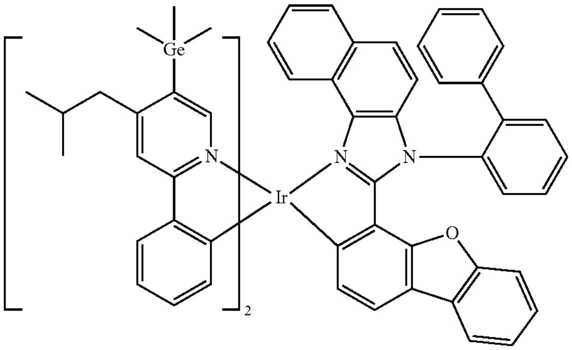
2846
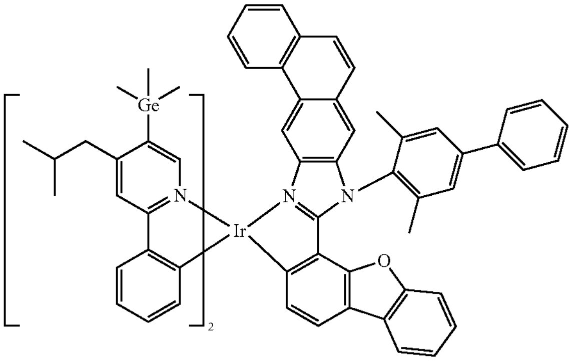
-continued
2847
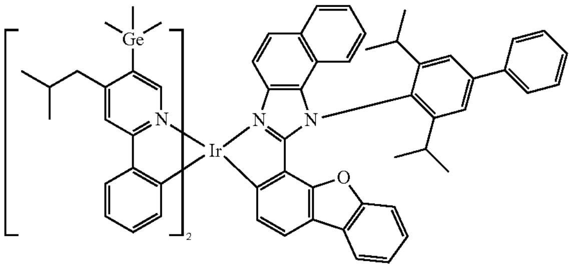
2848
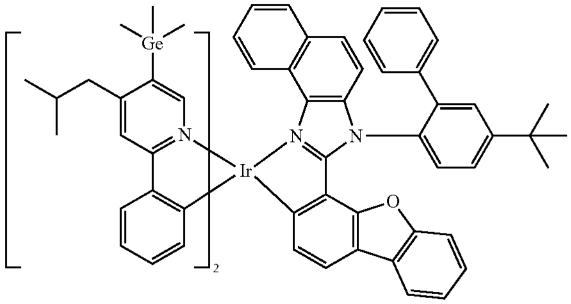
2849
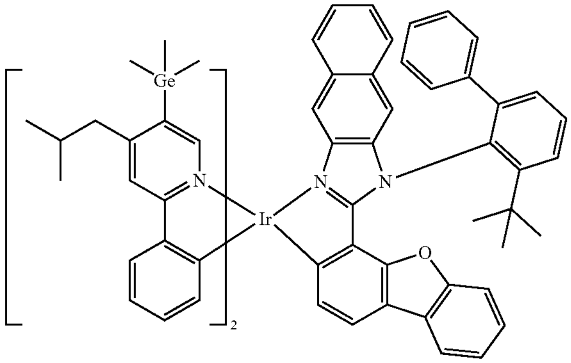
2850
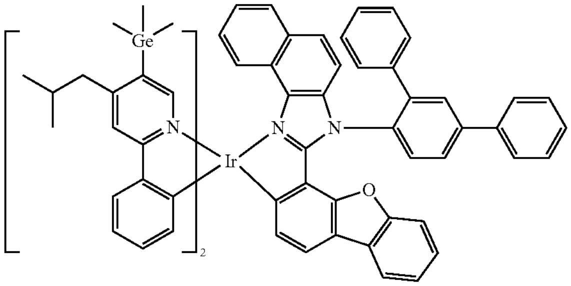

-continued
2851
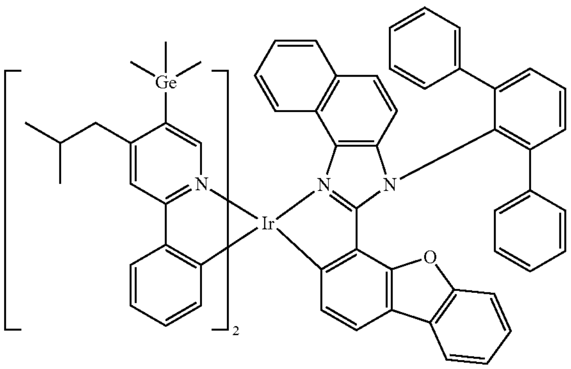
2852
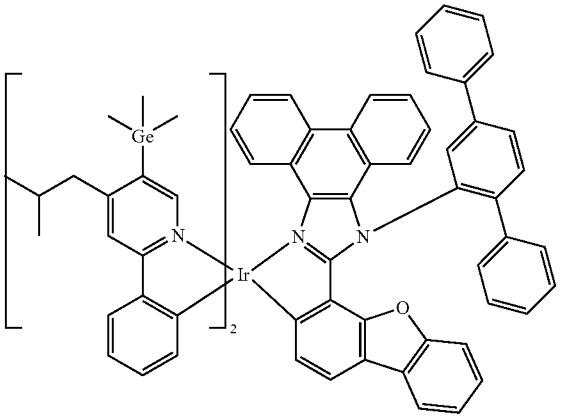
2853
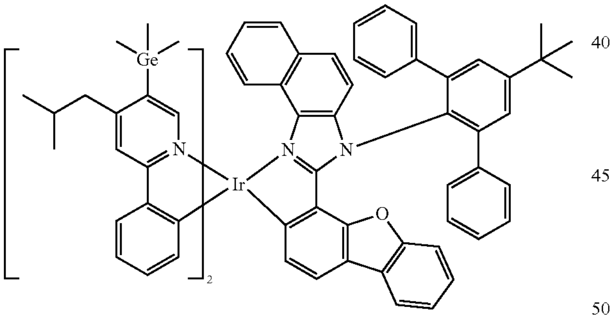
2854
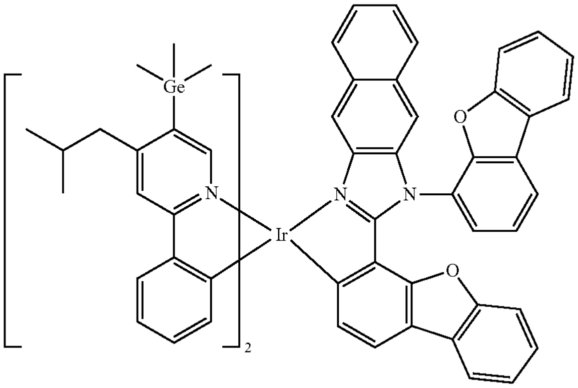
-continued
2855
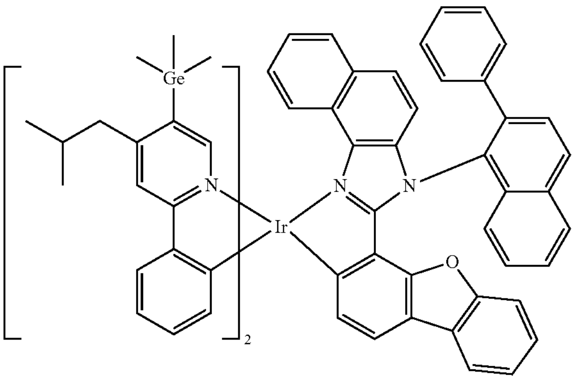
3191
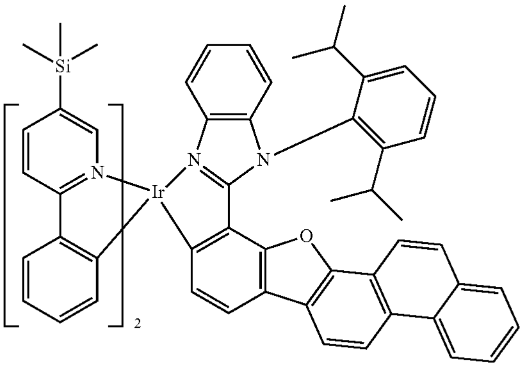
3192
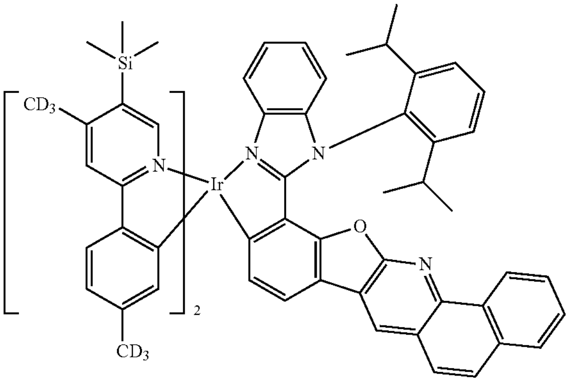

-continued
3193
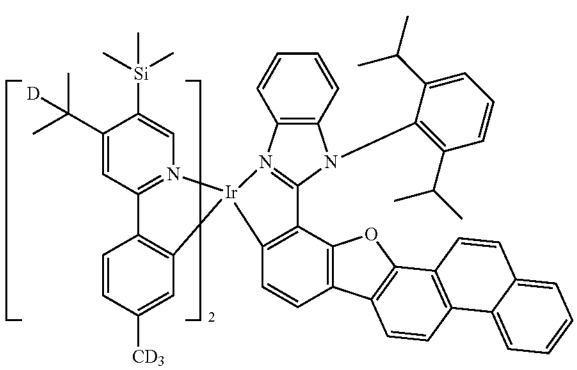
3194
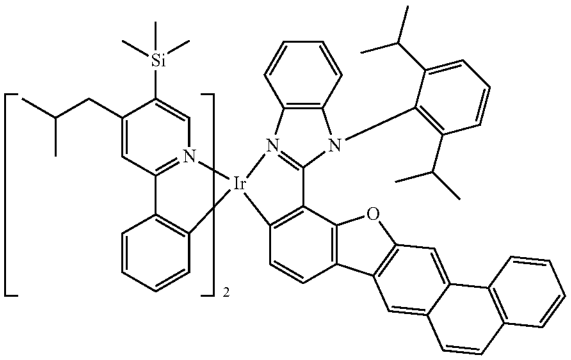
3195
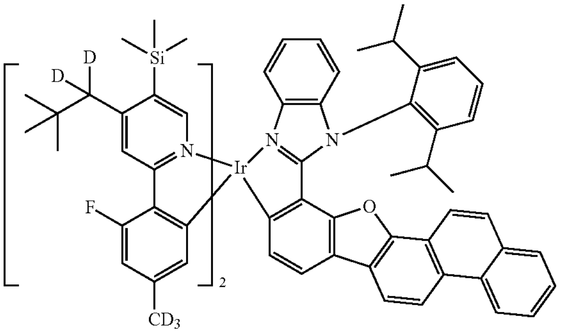
3196
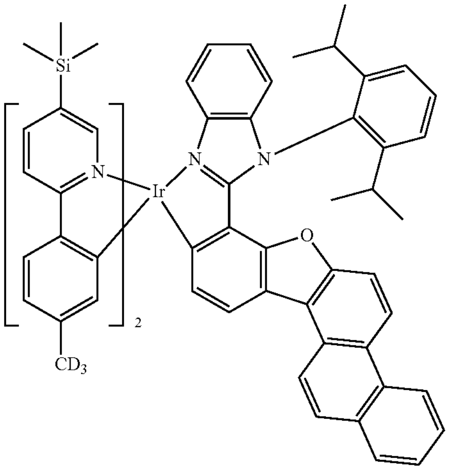
-continued
3197
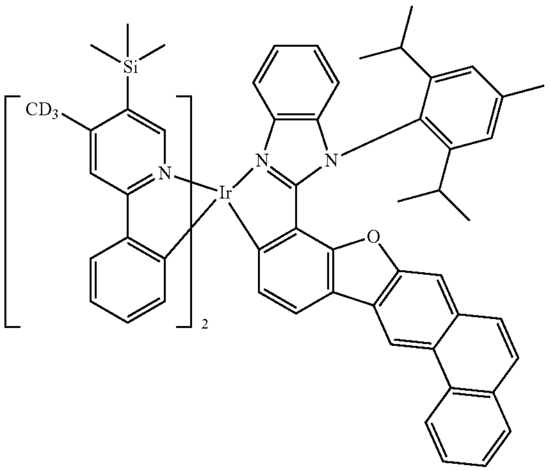
3198
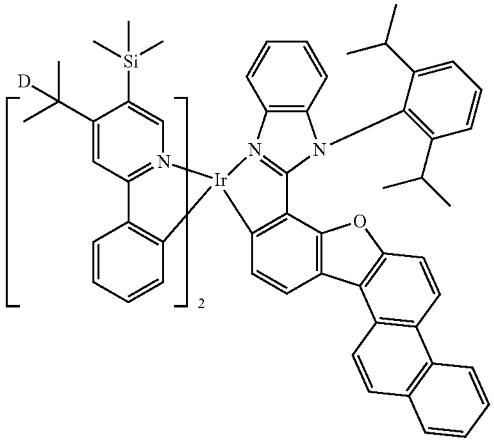
3199
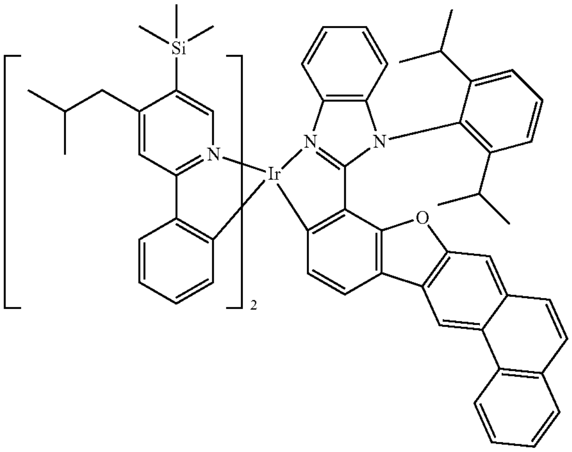

-continued
3200
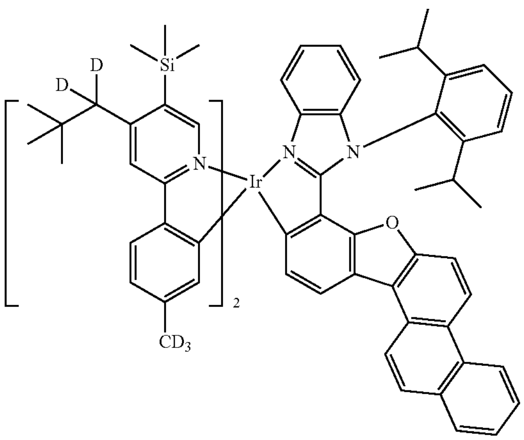
3201
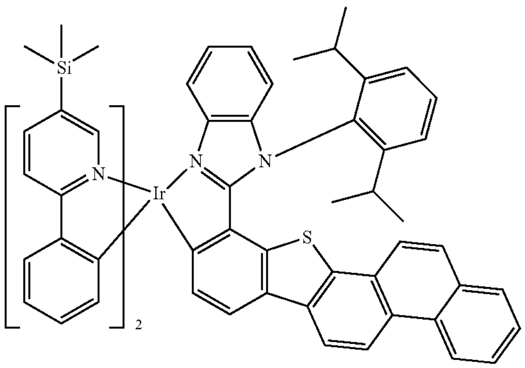
3202
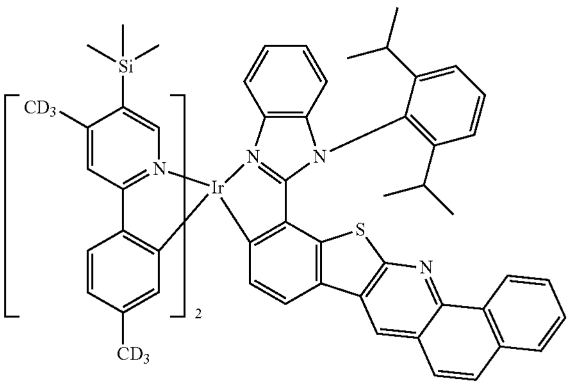
3203
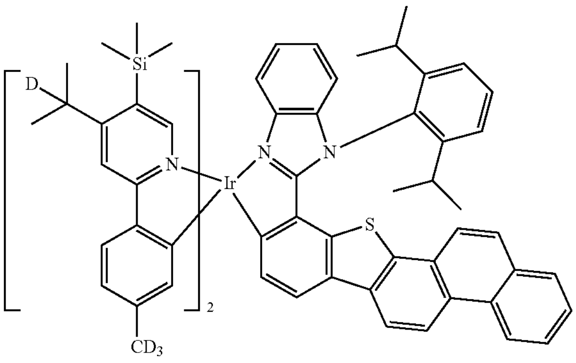
-continued
3204
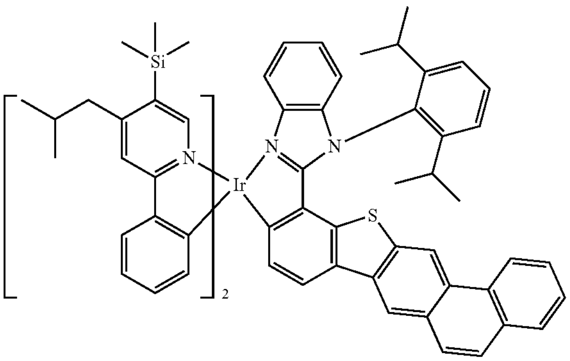
3205
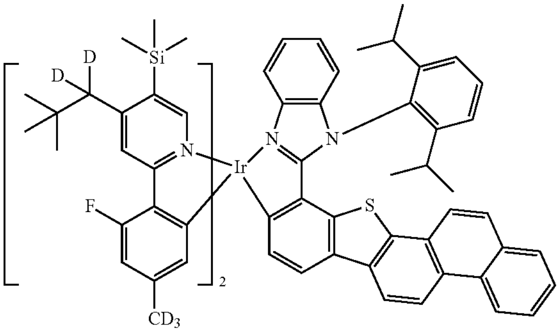
3206
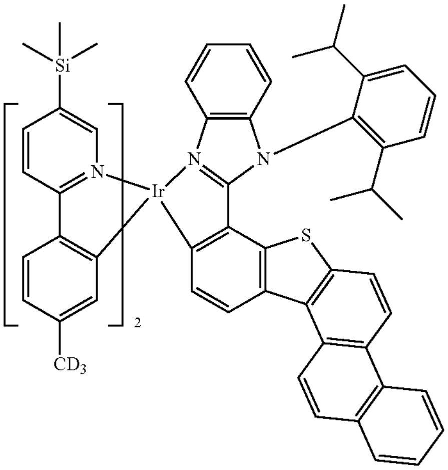

-continued
3207
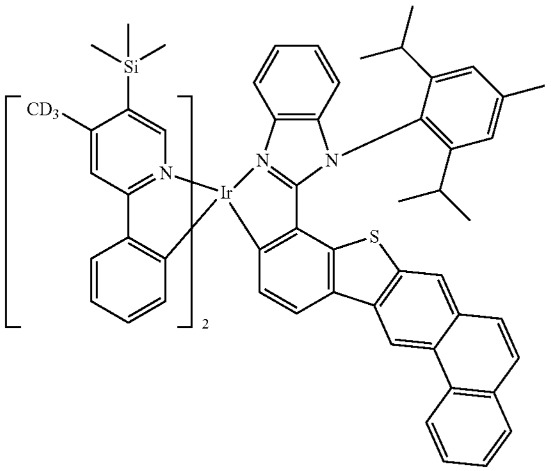
3208
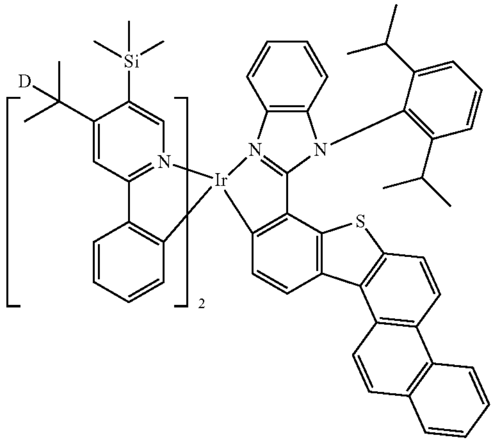
3209
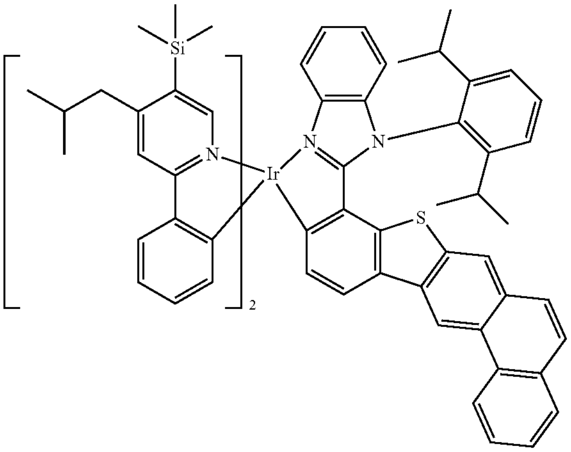
-continued
3210
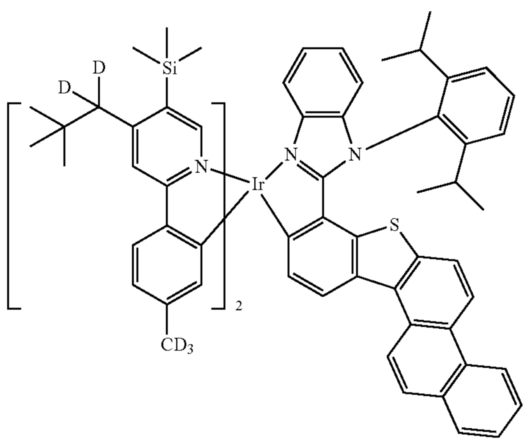
3211
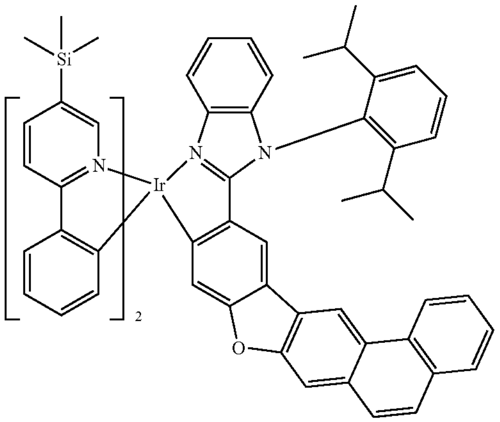
3212
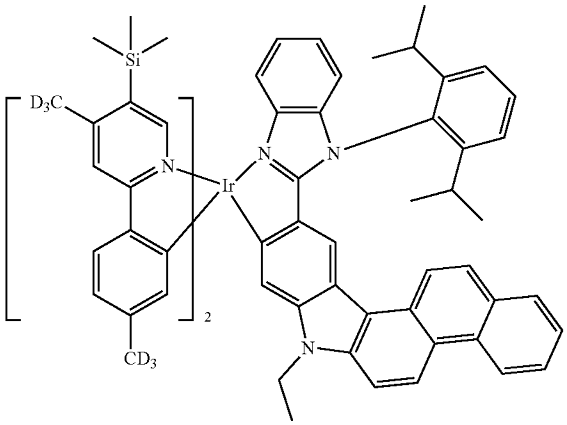

-continued
3213
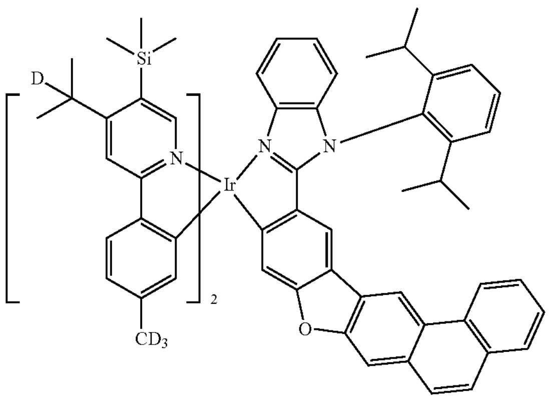
3214
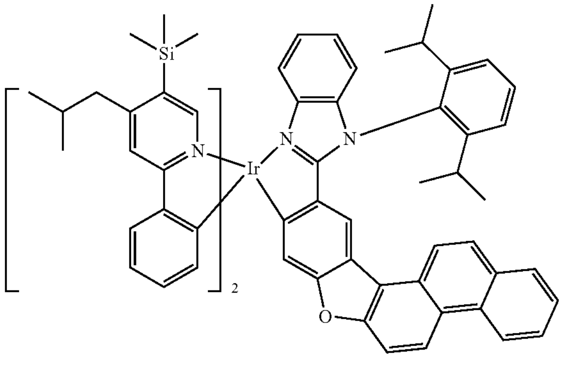
3215
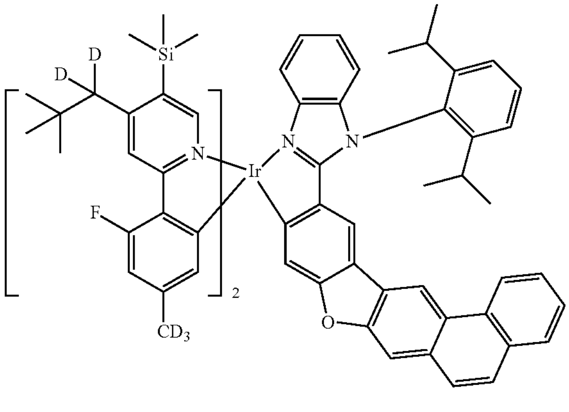
-continued
3216
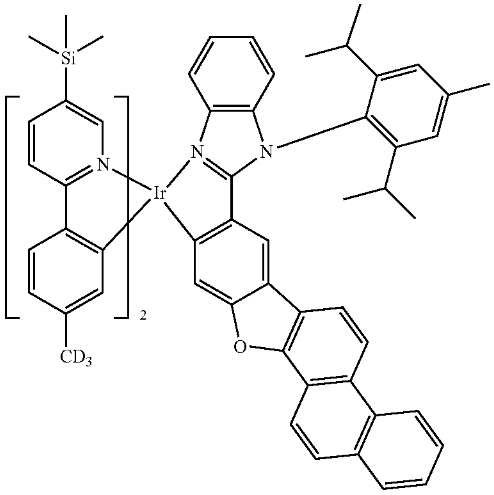
3217
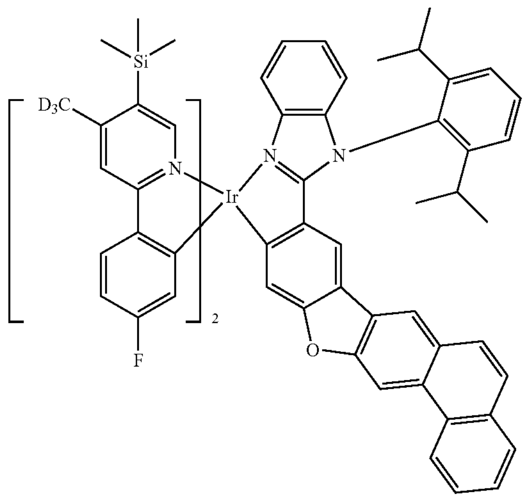
3218
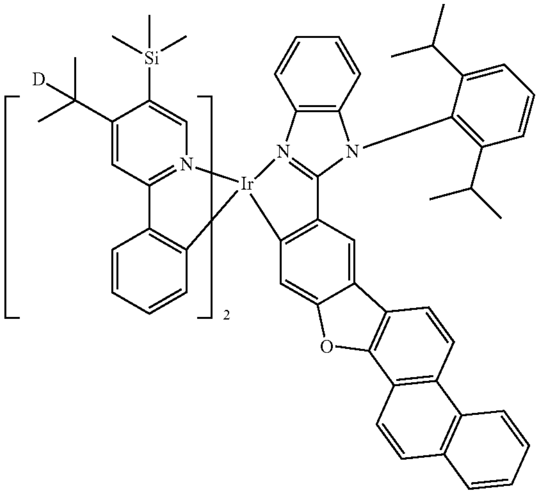

-continued
3219
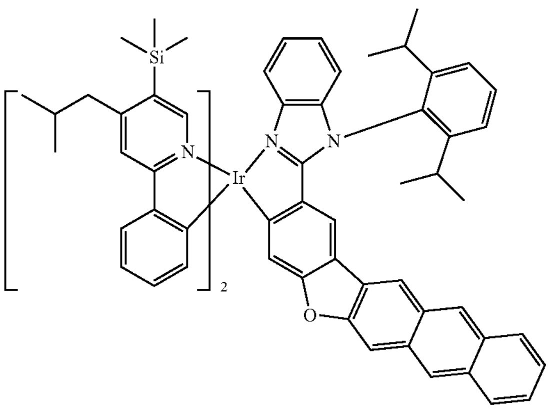
3220
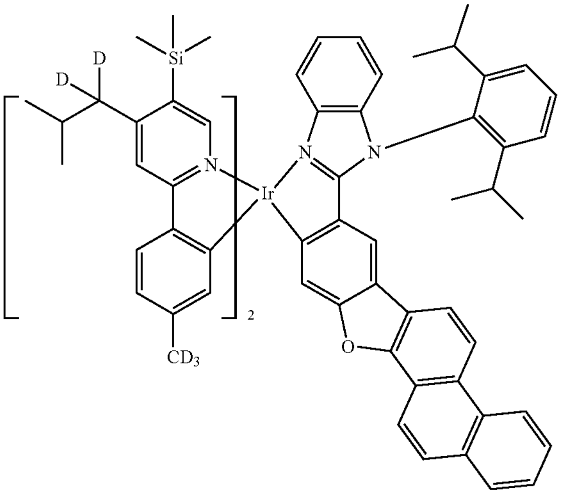
3221
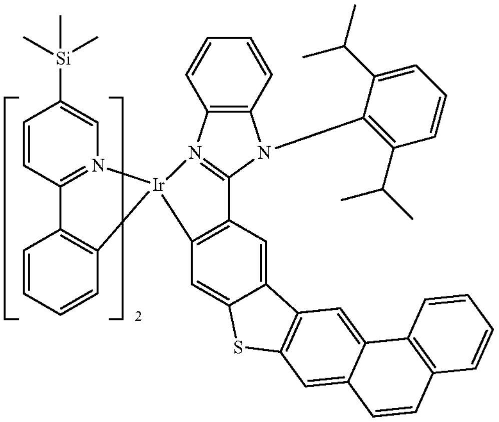
-continued
3222
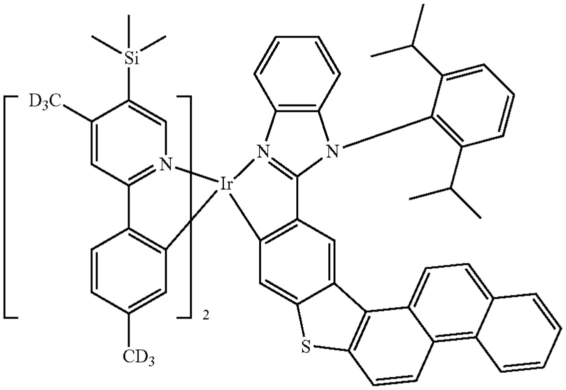
3223
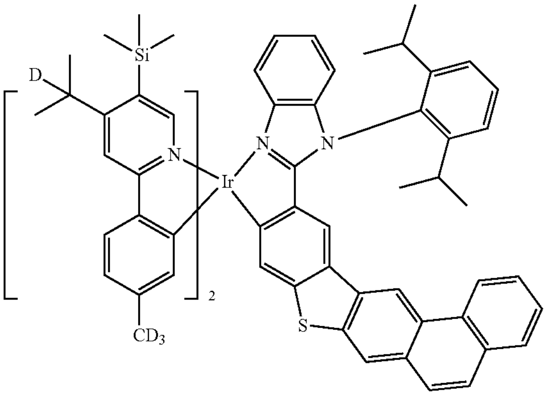
3224
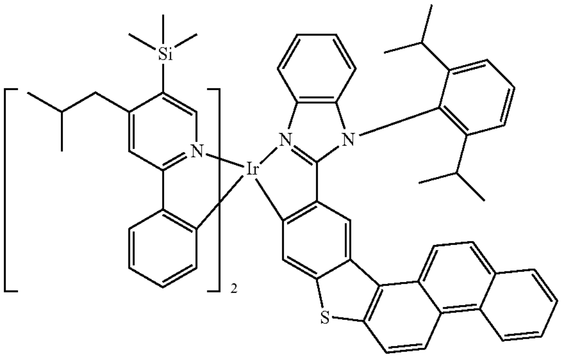
3225
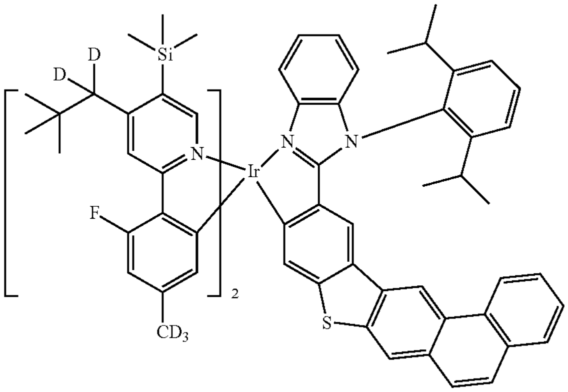

-continued
3226
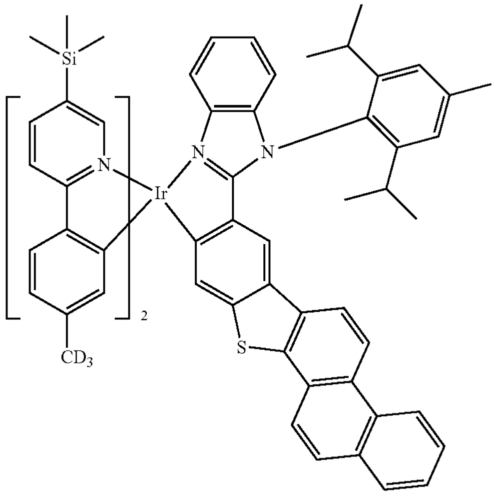
3227
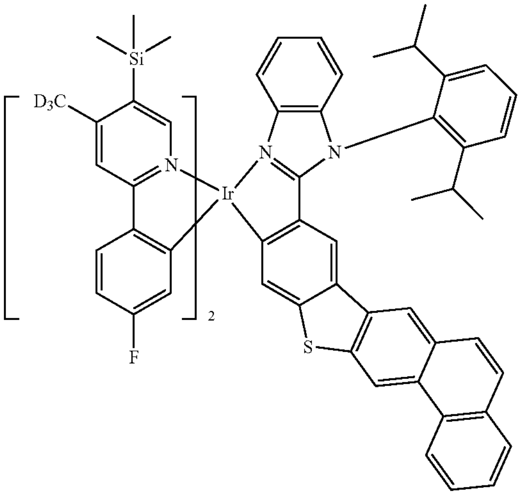
3228
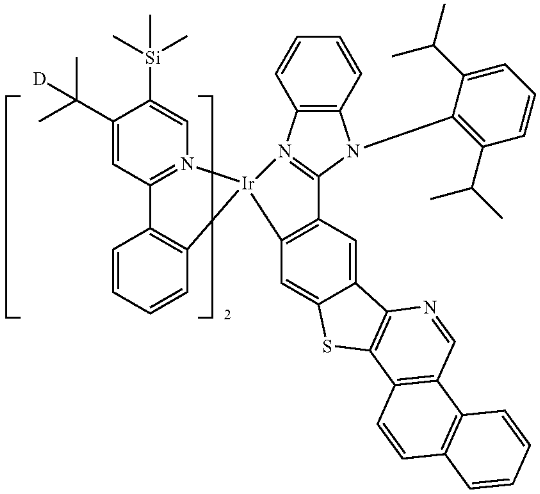
-continued
3229
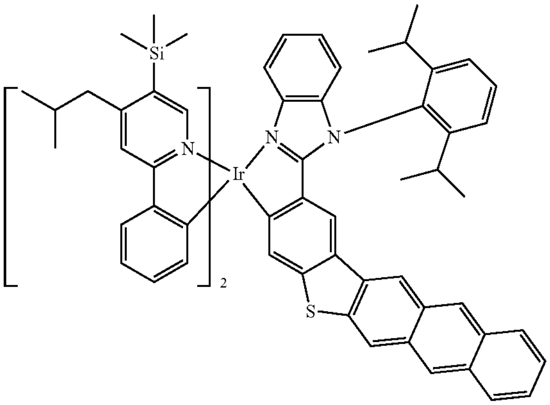
3230
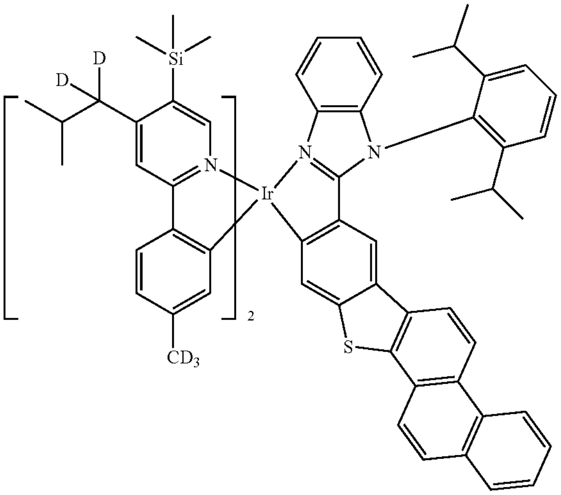
3231
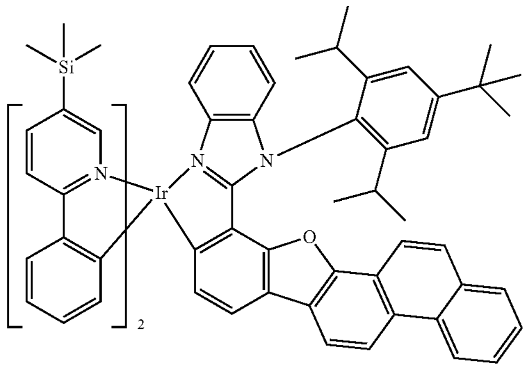

-continued
3232
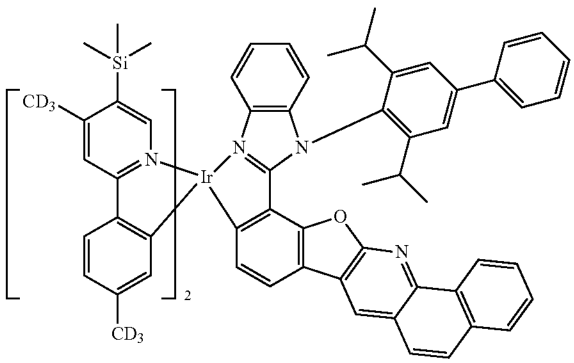
3233
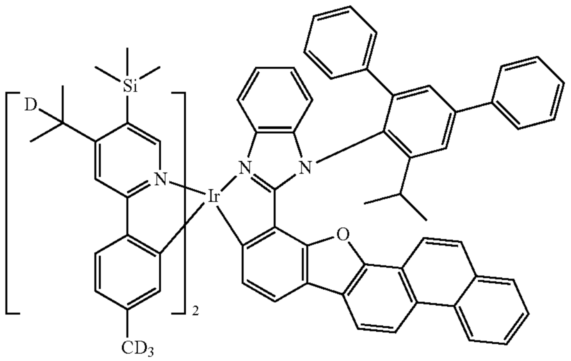
3234
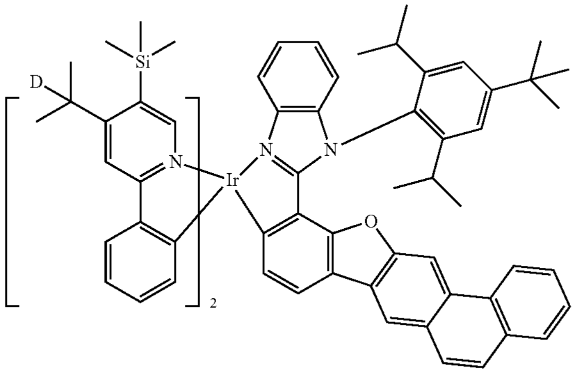
3235
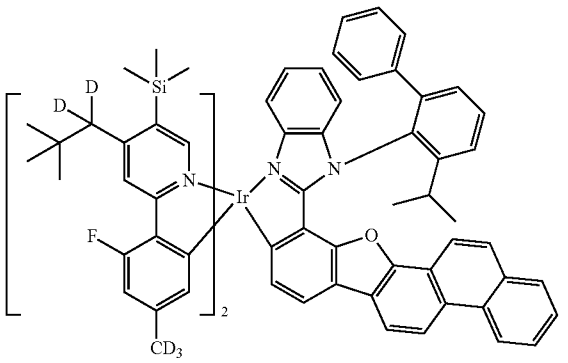
-continued
3236
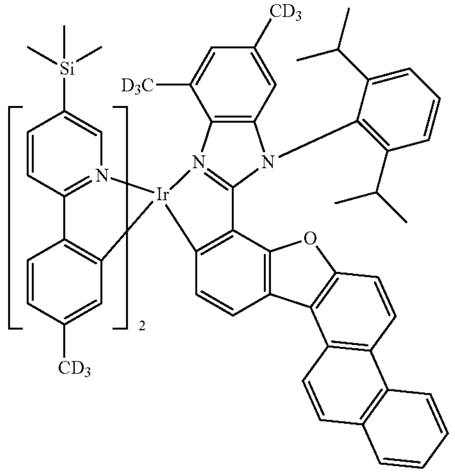
3237
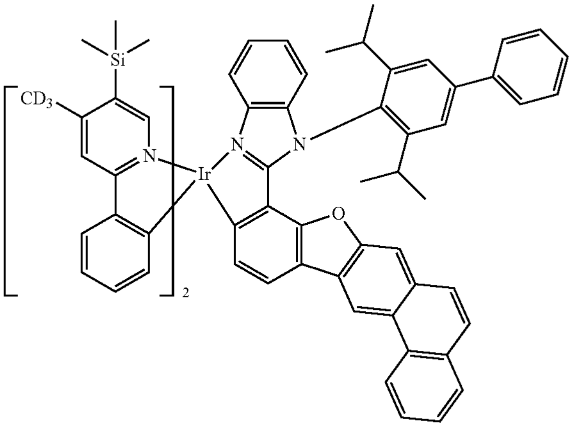
3238
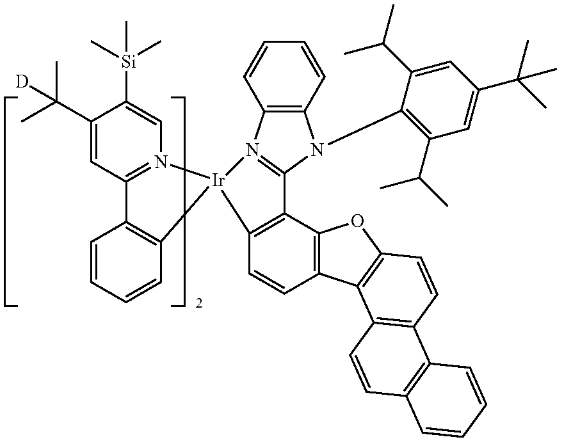

-continued
3239
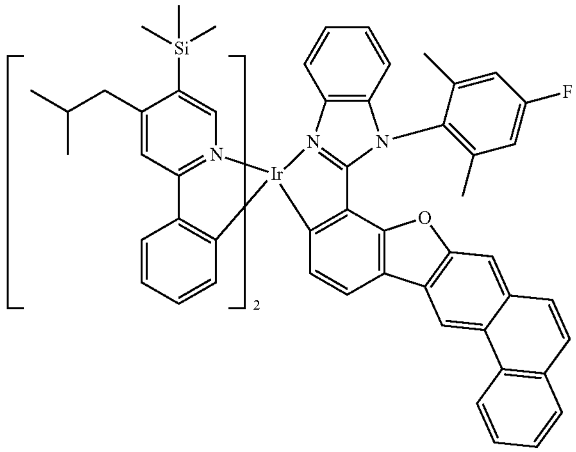
3240
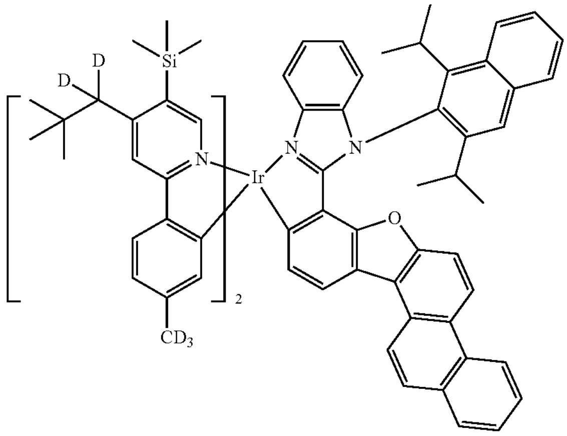
3241
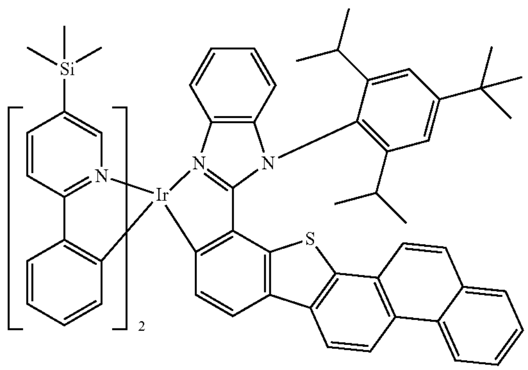
-continued
3242
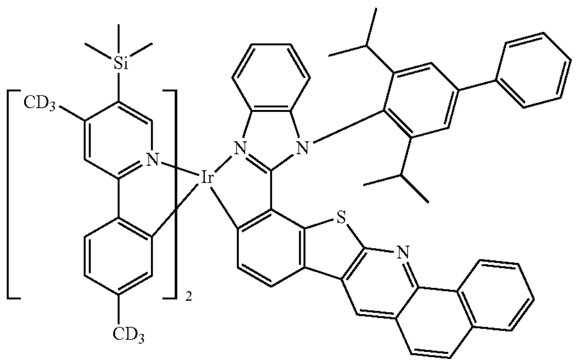
3243
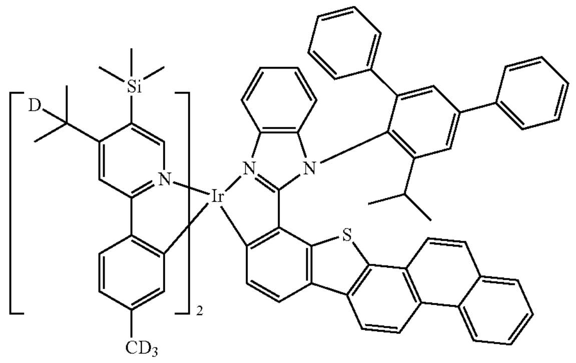
3244
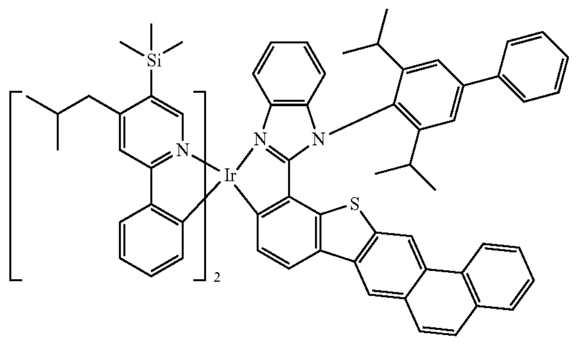
3245
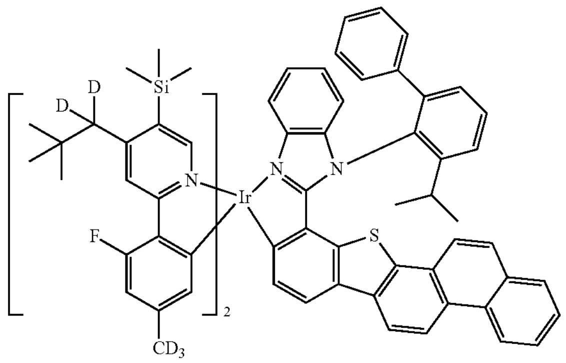

-continued
3246
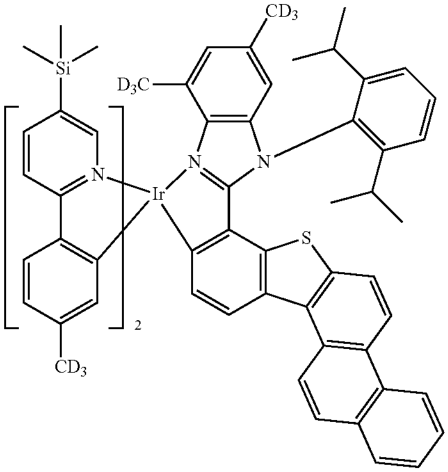
3247
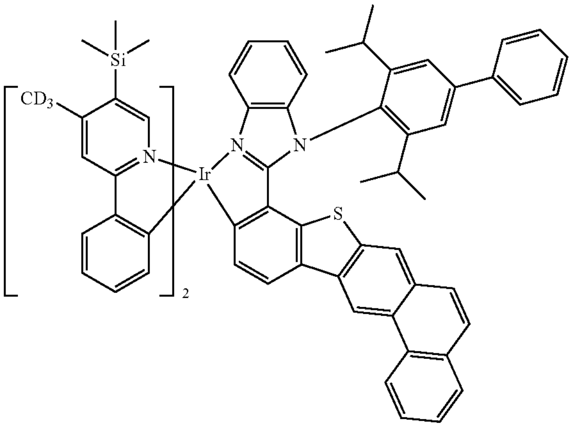
3248
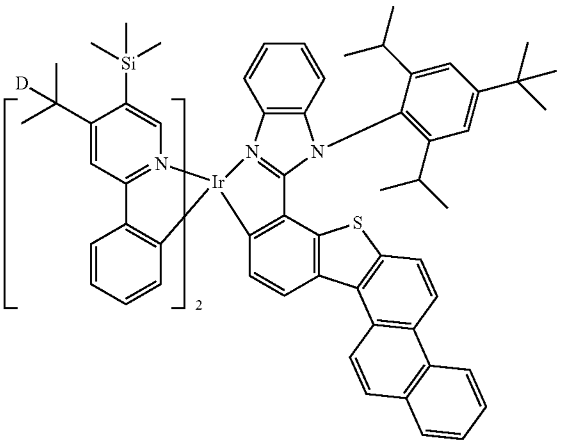
-continued
3249
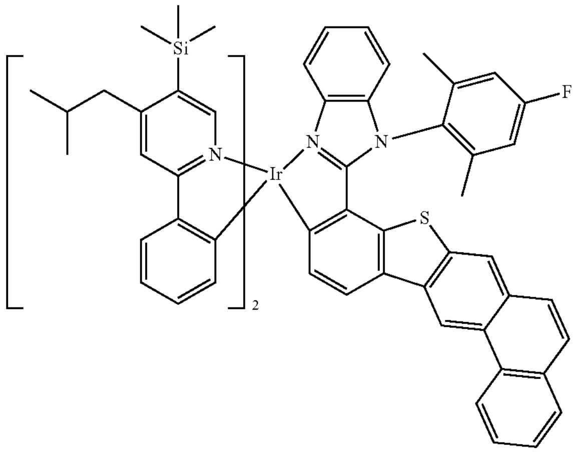
3240
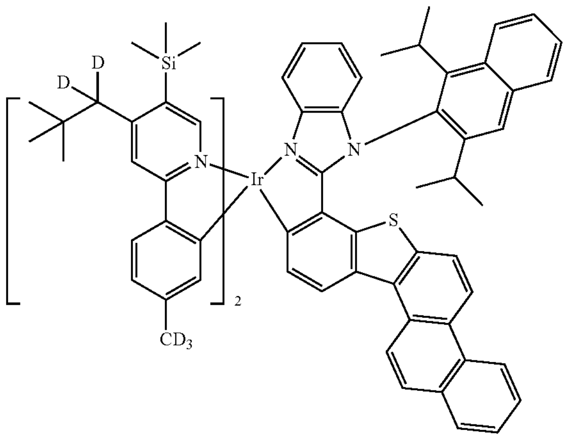
3251
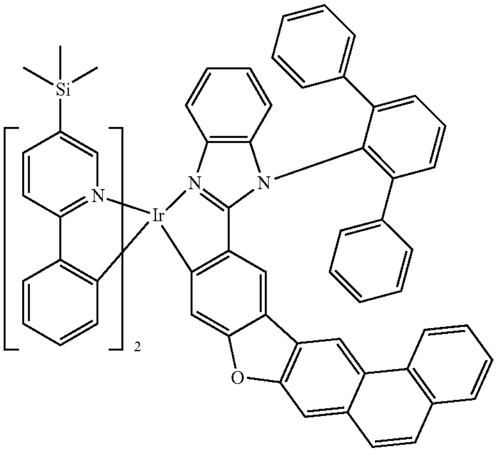

-continued
3252
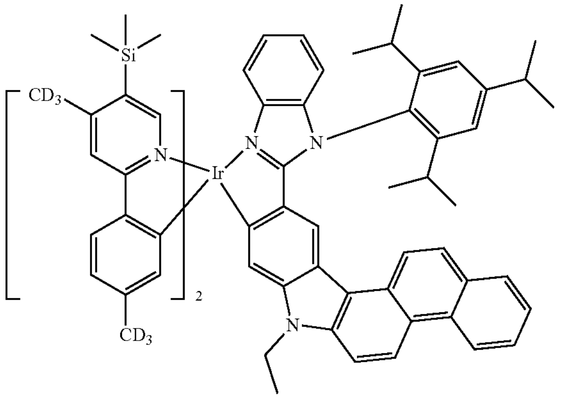
3253
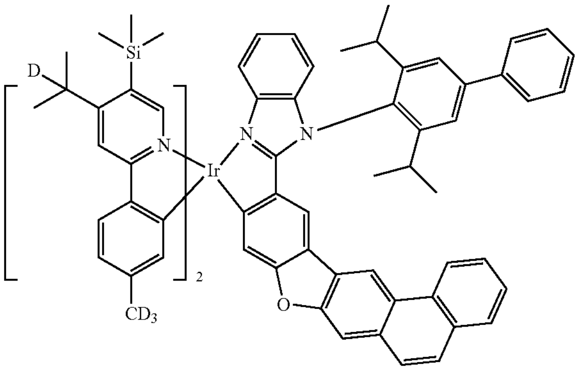
3254
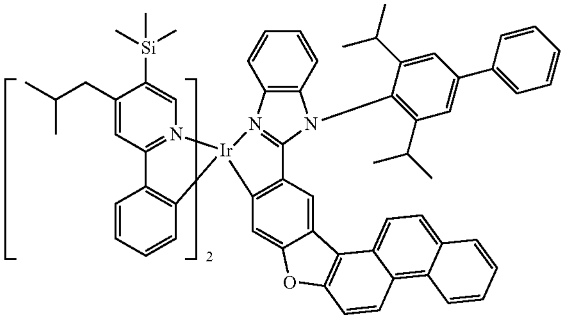
3255
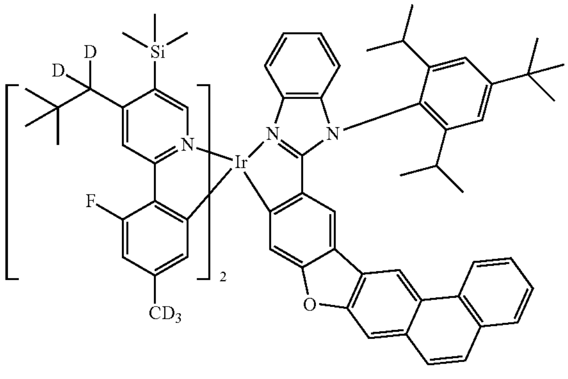
-continued
3256
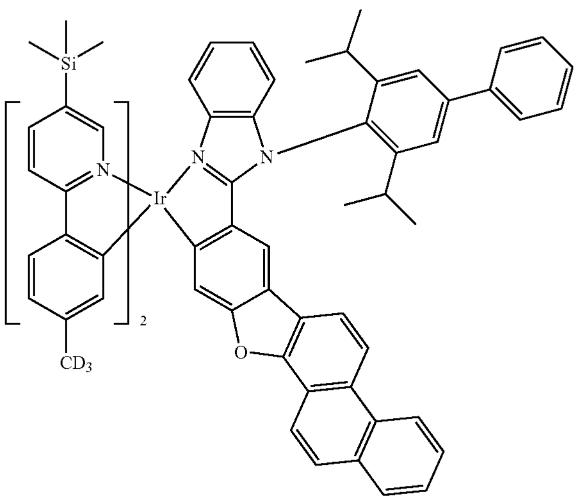
3257
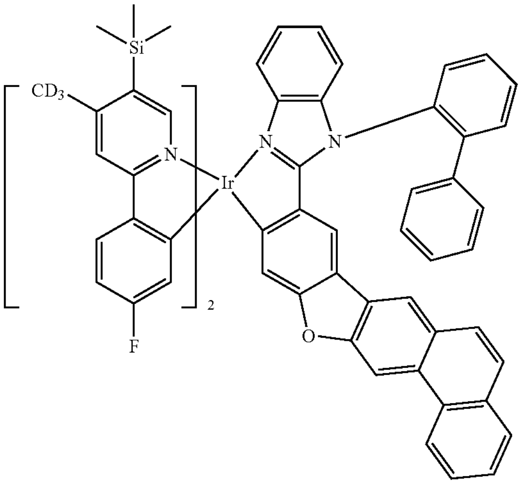
3258
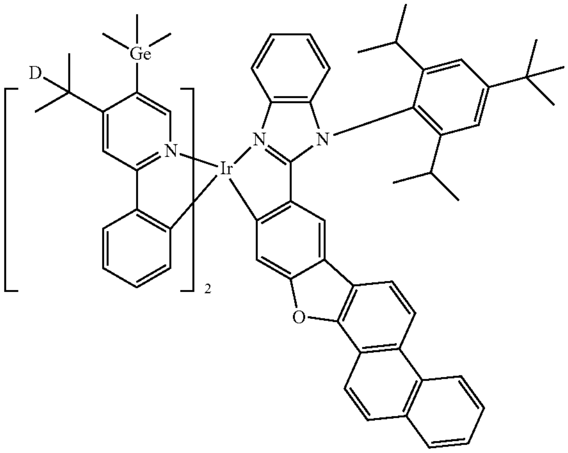

3259
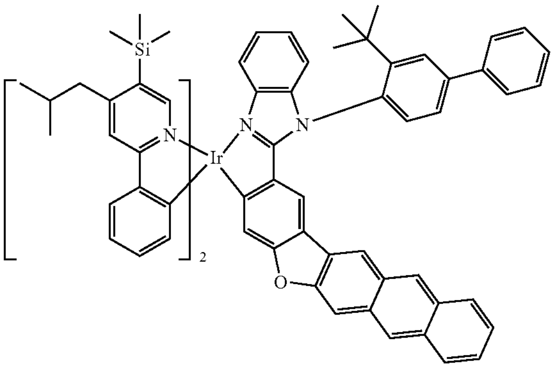
3260
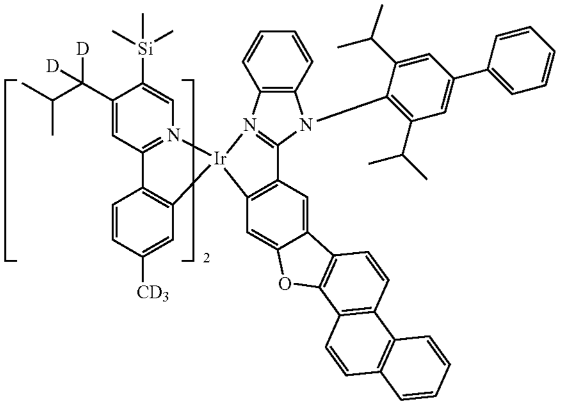
3261
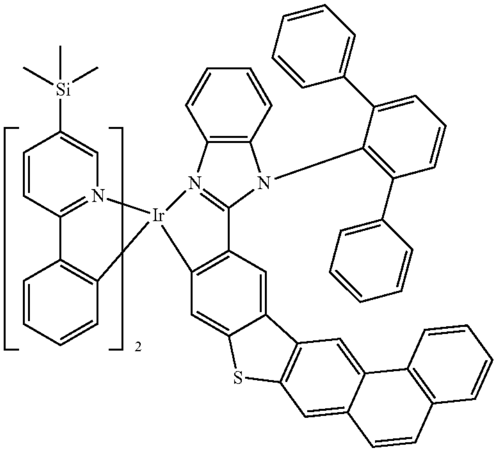
3262
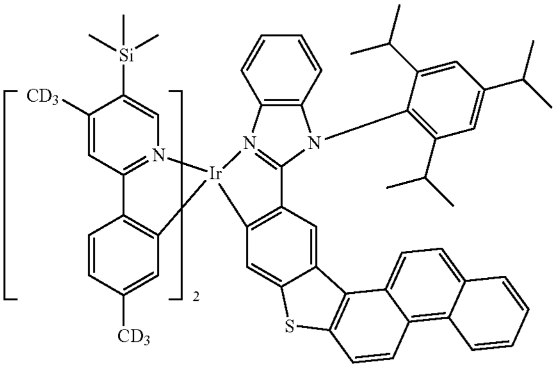
3263
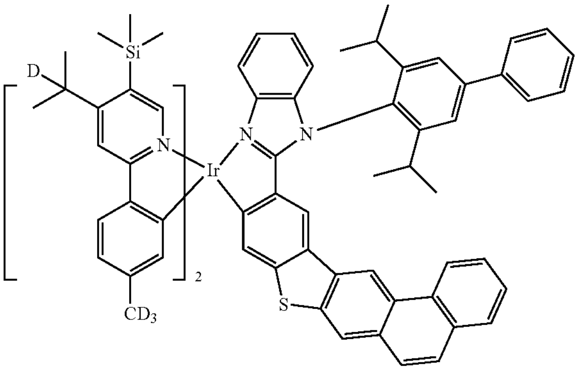
3264
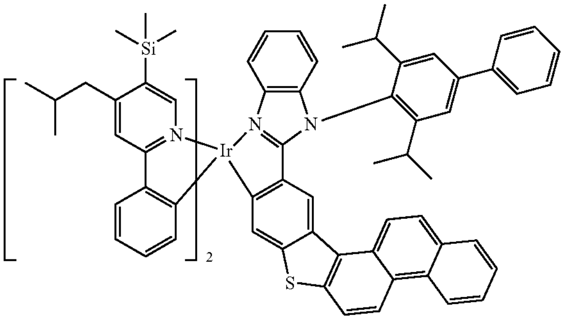
3265
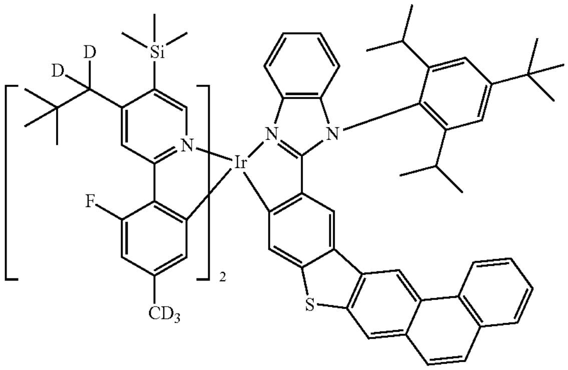

-continued
3266
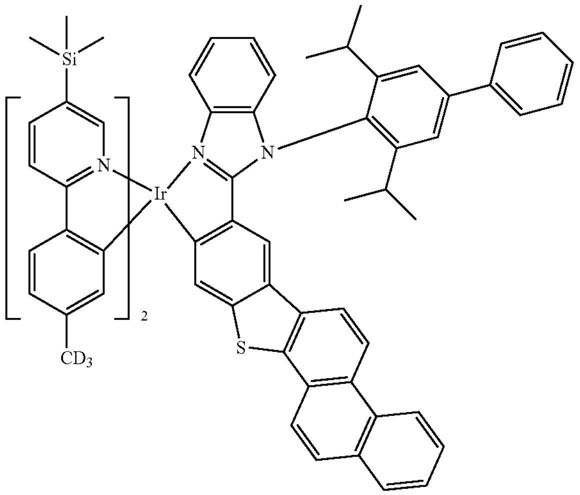
3267
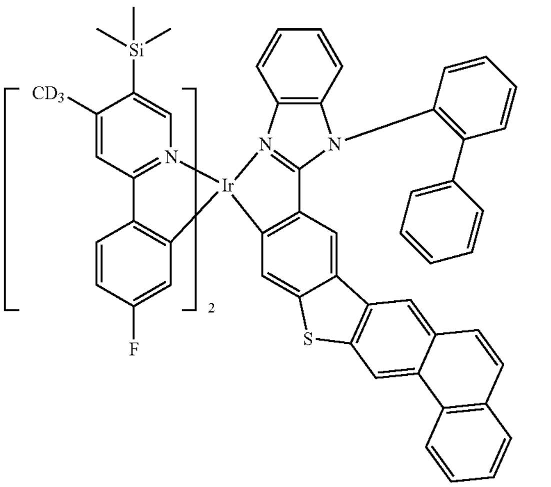
3268
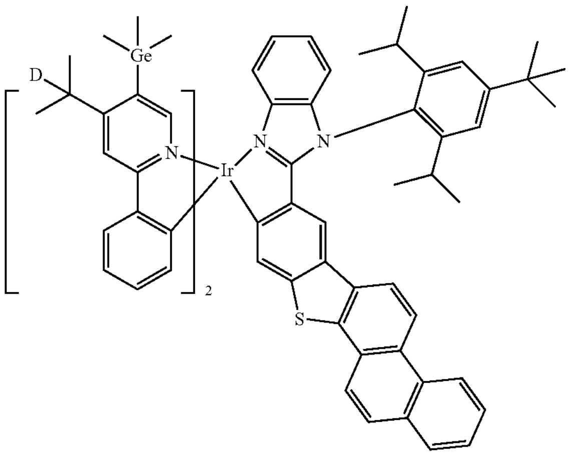
-continued
3269
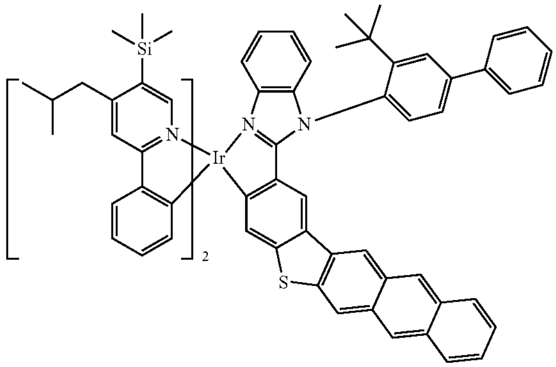
3270
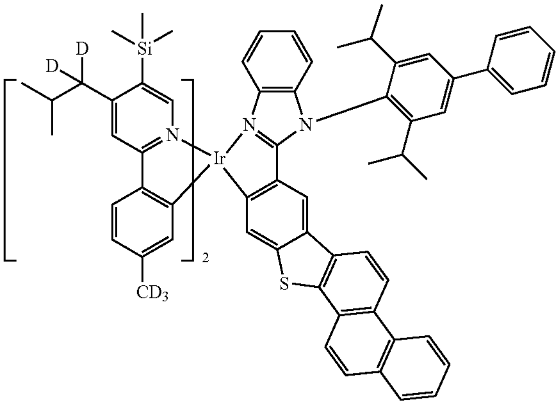
3271
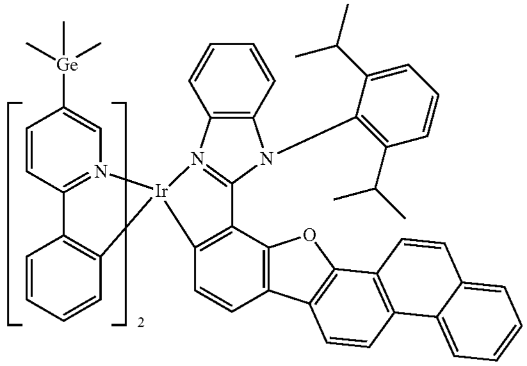
3272
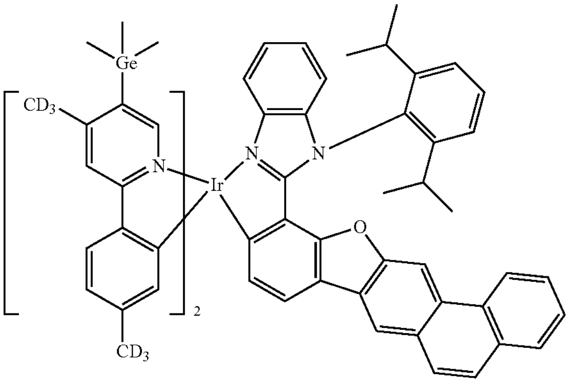

-continued
3273
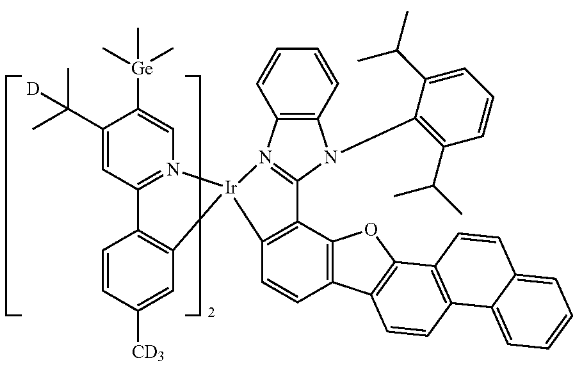
3274
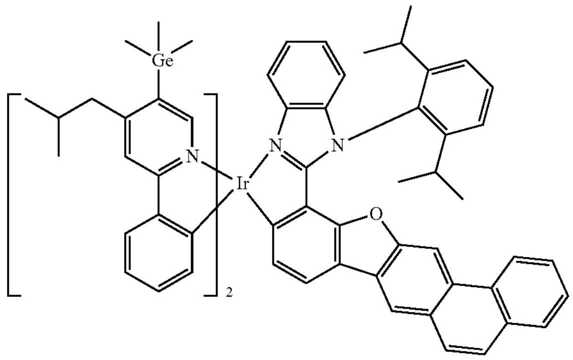
3275
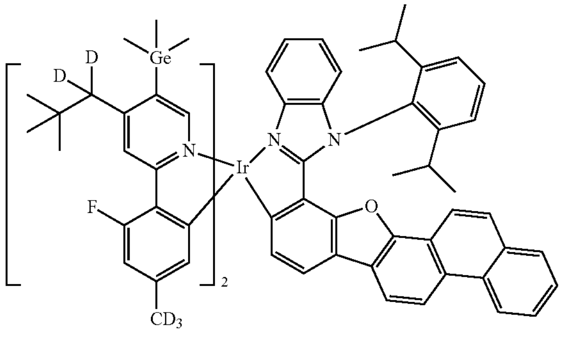
3276
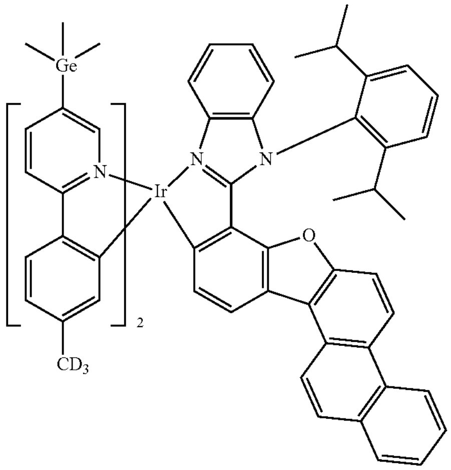
-continued
3277
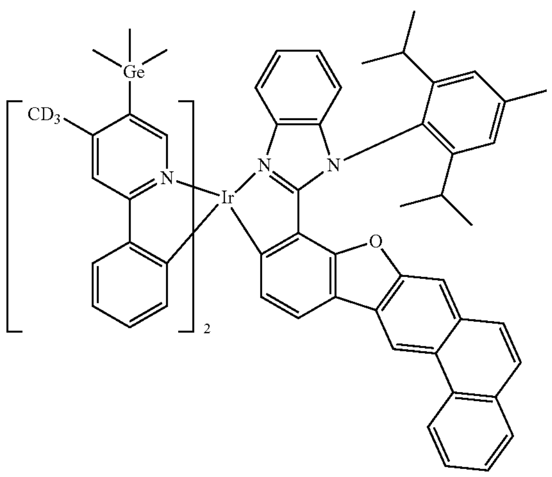
3278
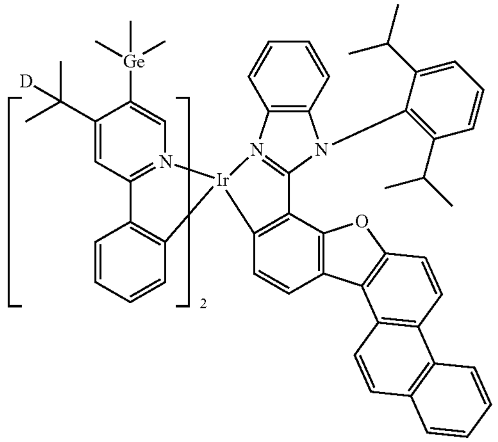
3279
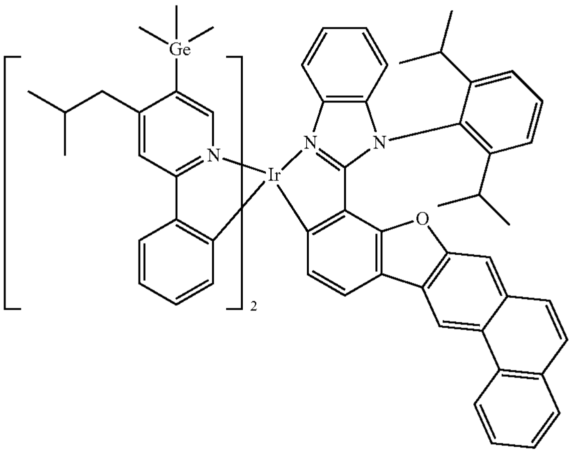

-continued
3280
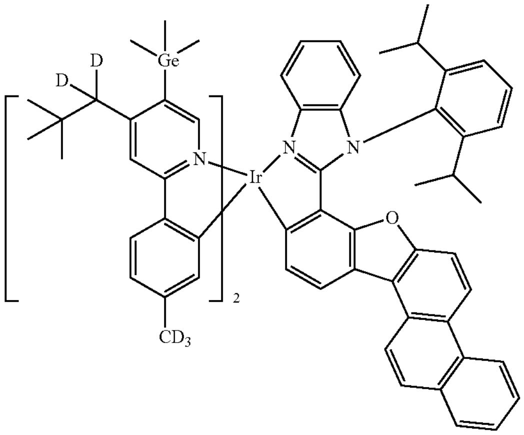
3281
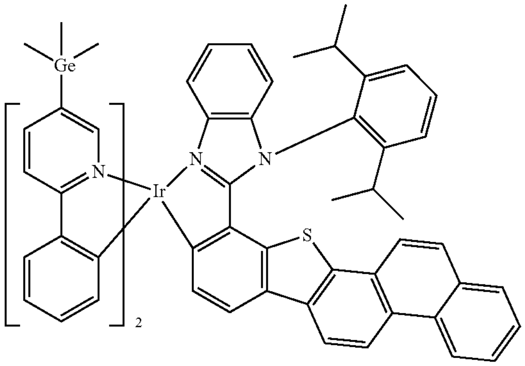
3282
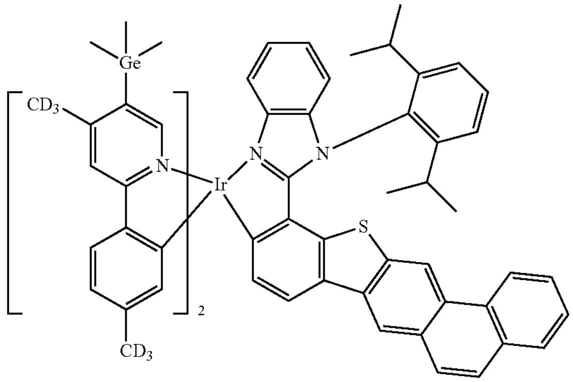
3283
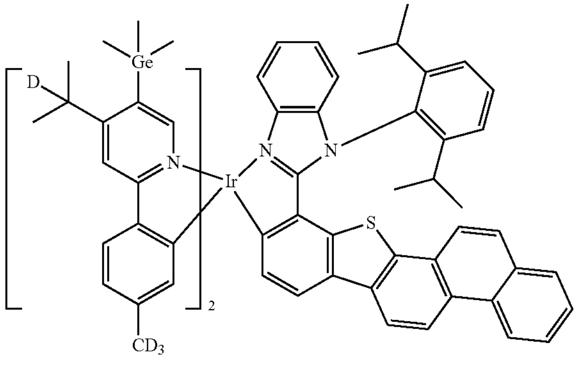
-continued
3284
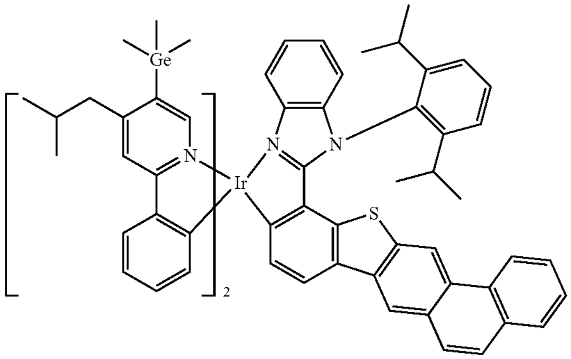
3285
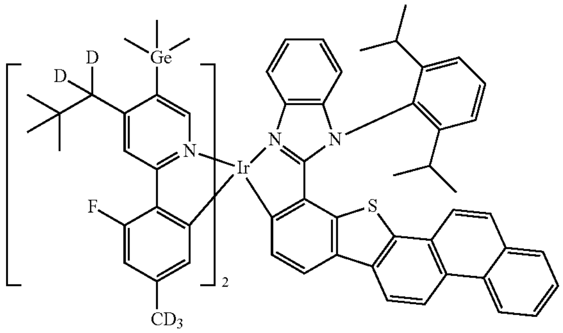
3286
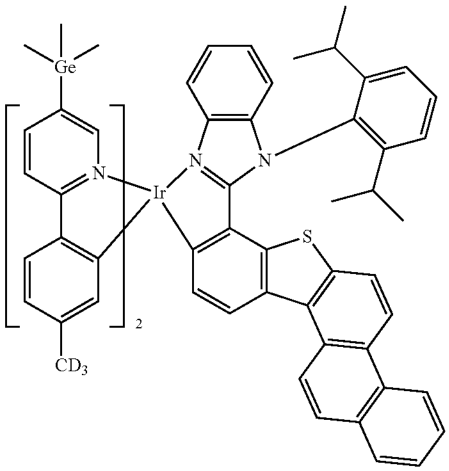

-continued
3287
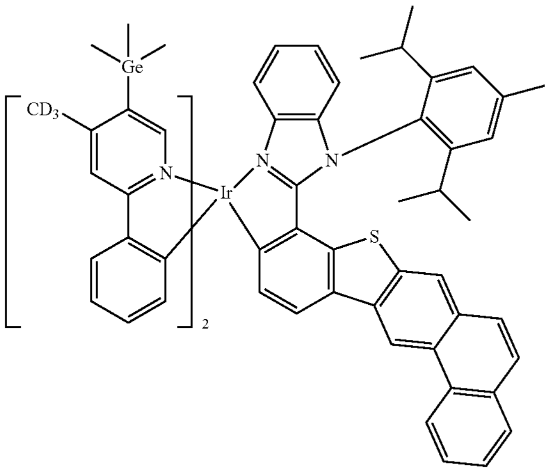
3288
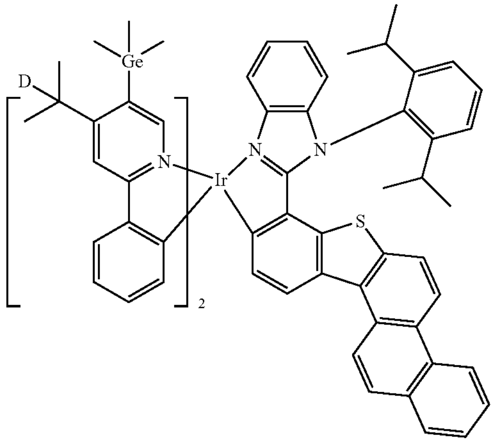
3289
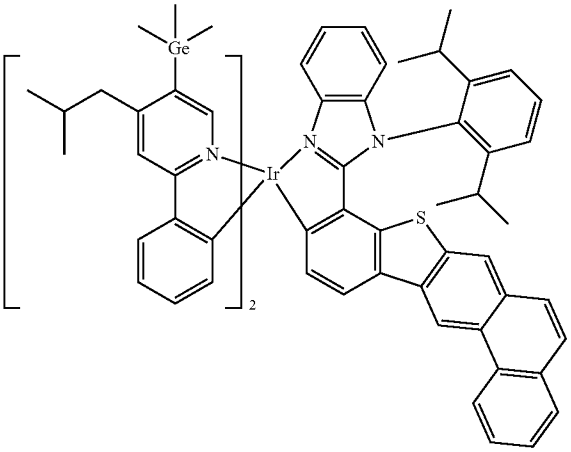
-continued
3290
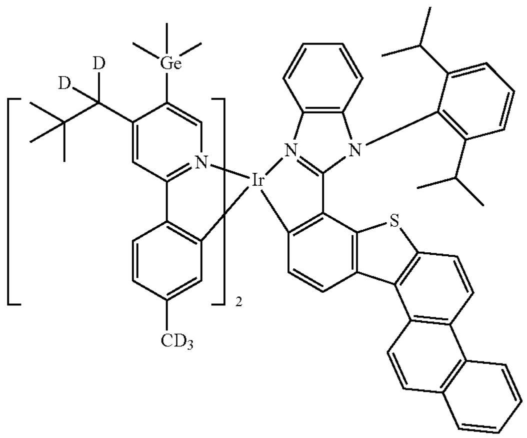
3291
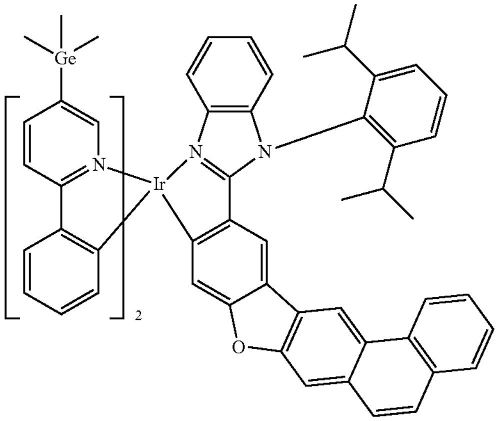
3292
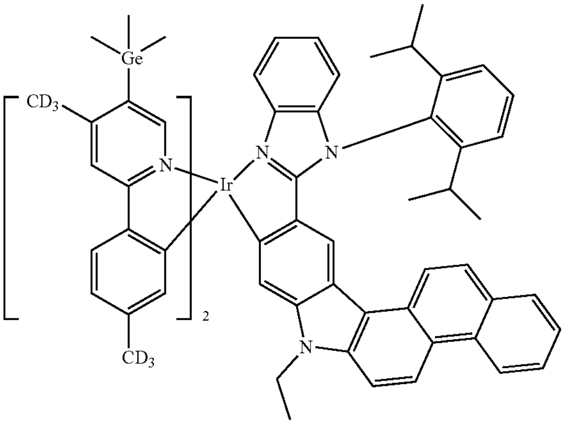

-continued
3293
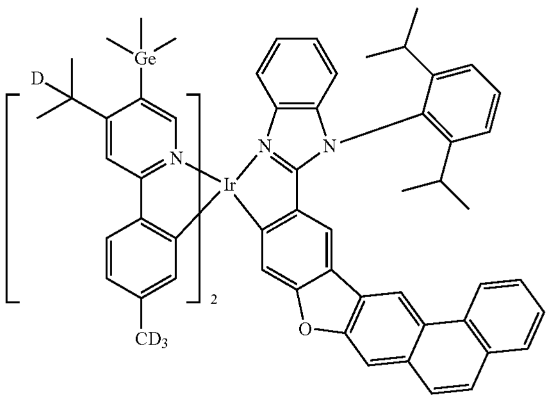
3294
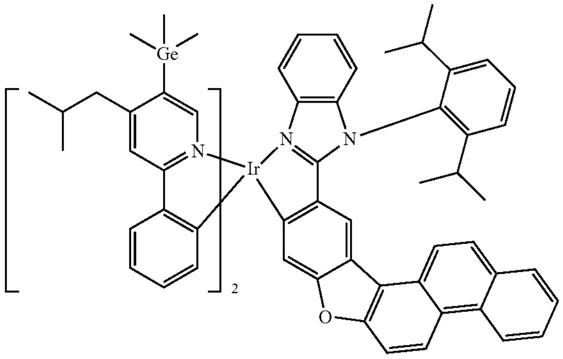
3295
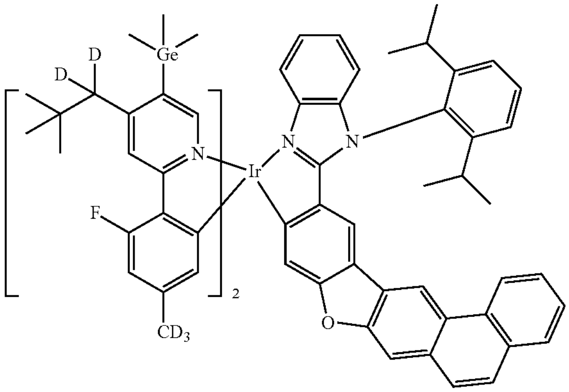
-continued
3296
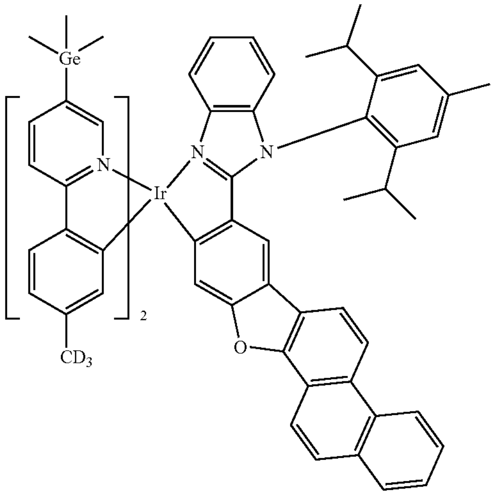
3297
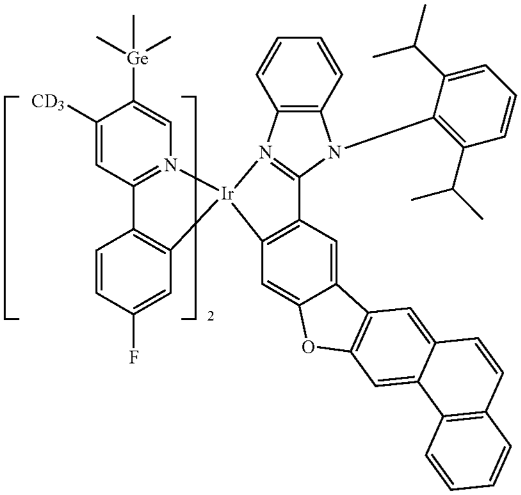
3298
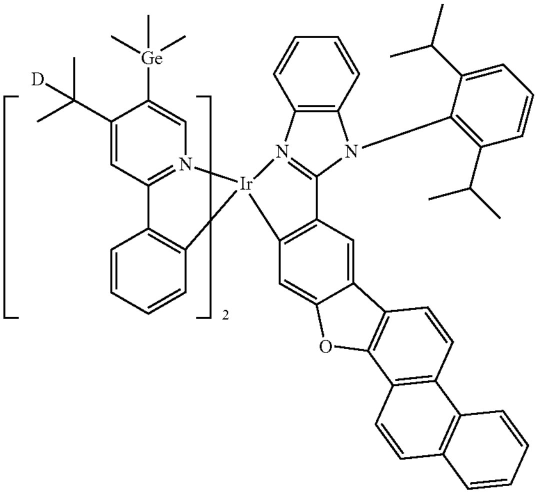

-continued
3299
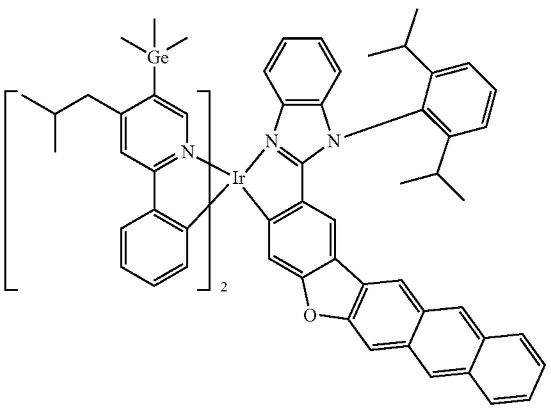
3300
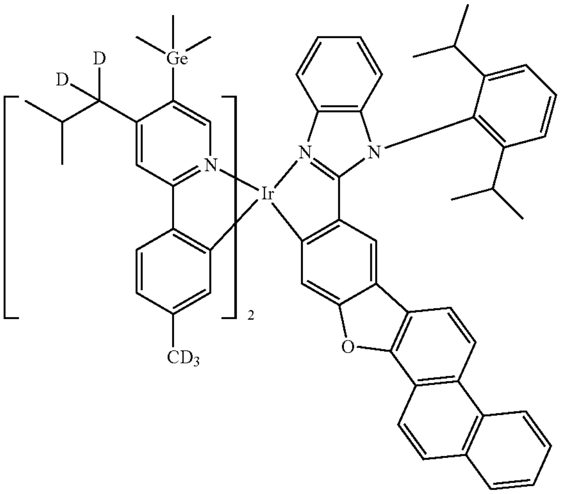
3301
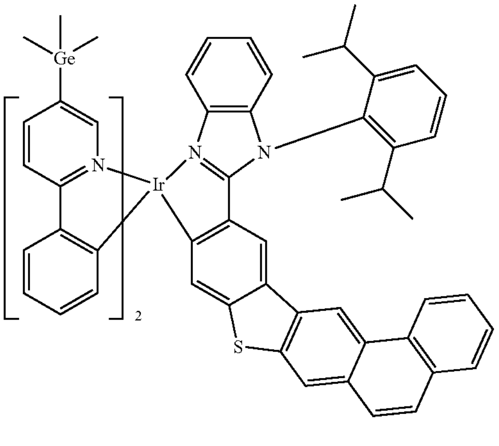
-continued
3302
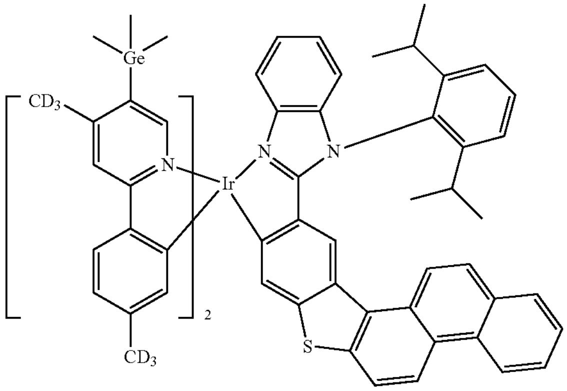
3303
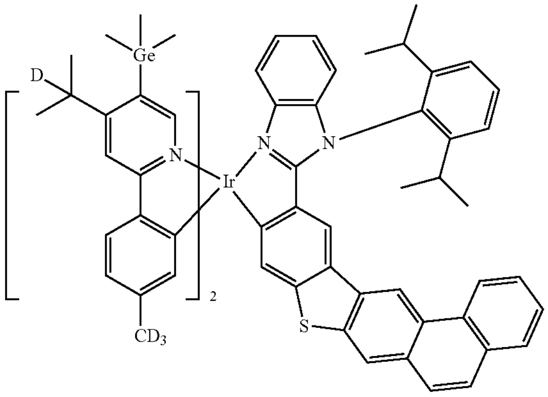
3304
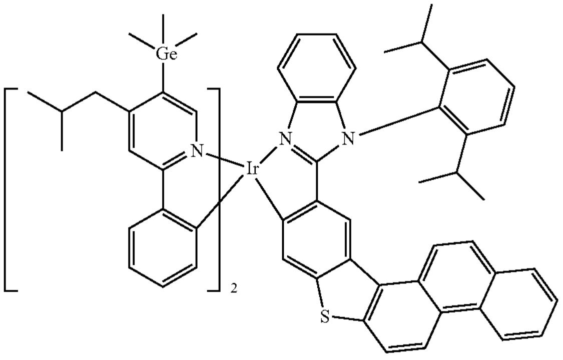
3305
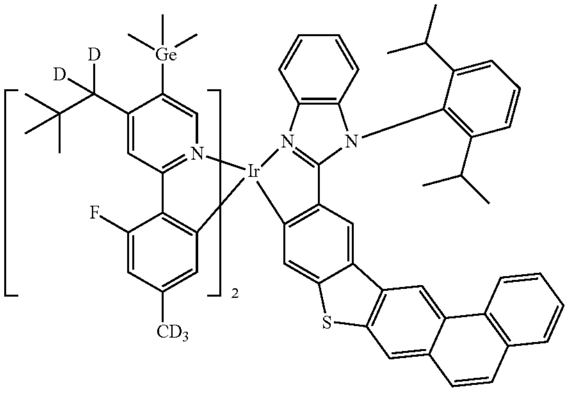

-continued
3306
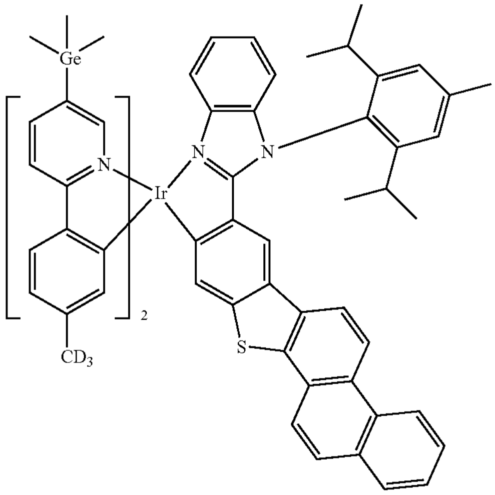
3307
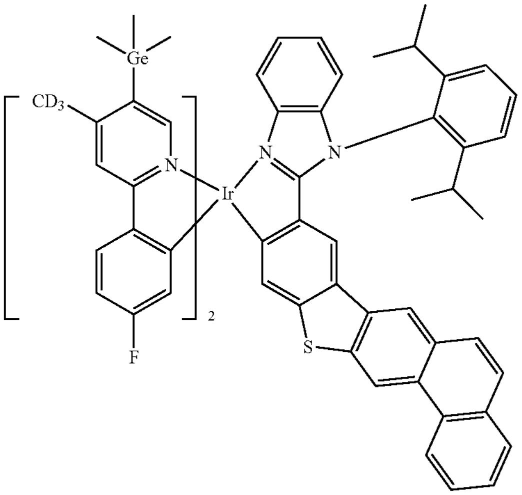
3308
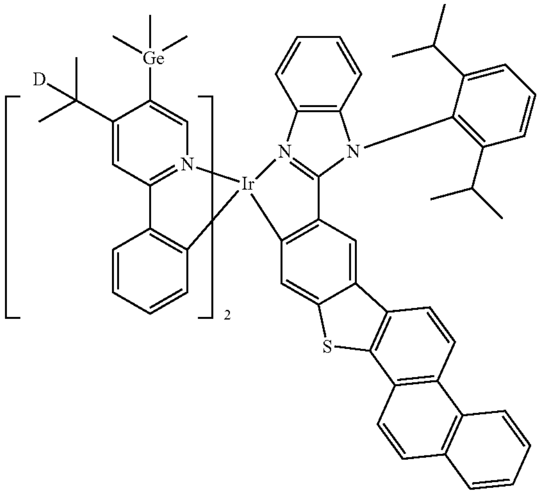
-continued
3309
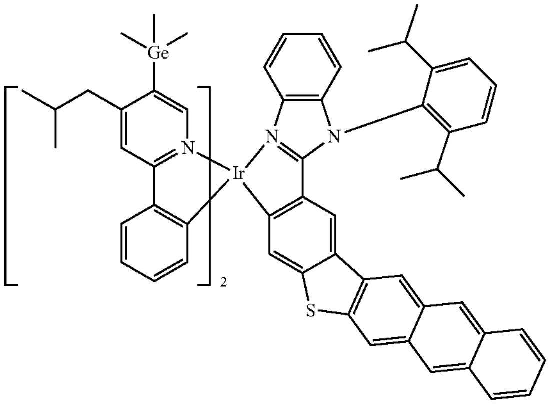
3310
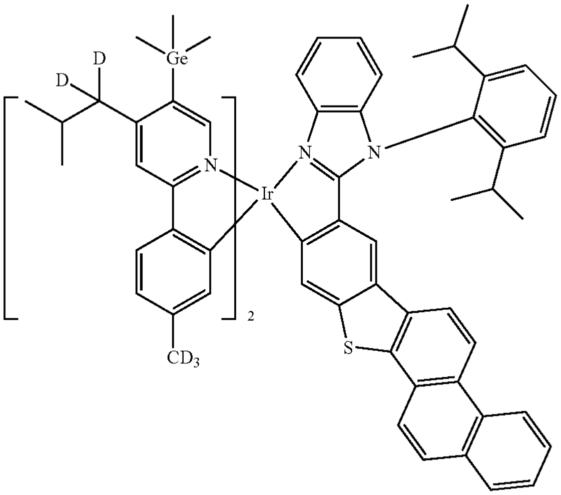
3311
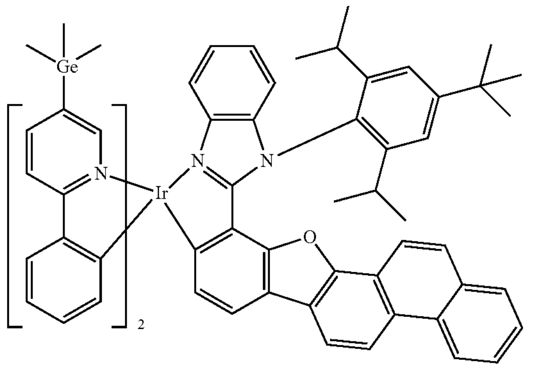

-continued
3312
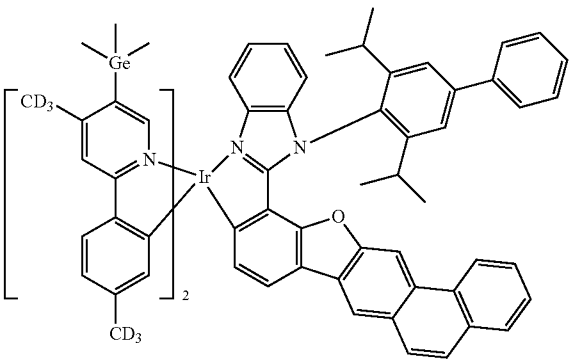
3313
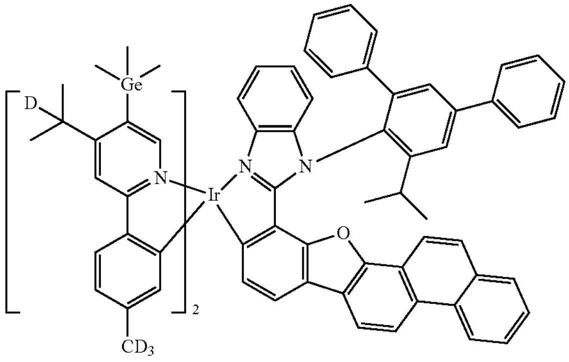
3314
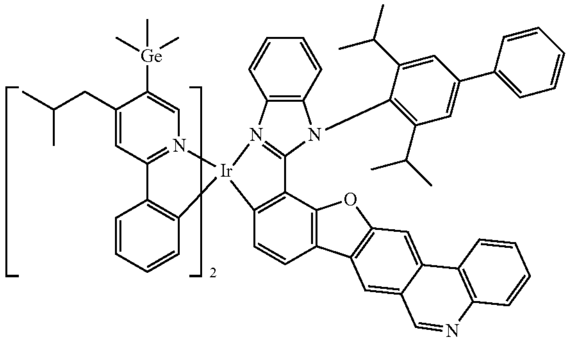
3315
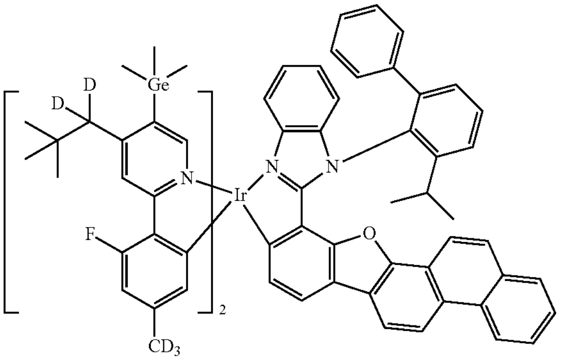
-continued
3316
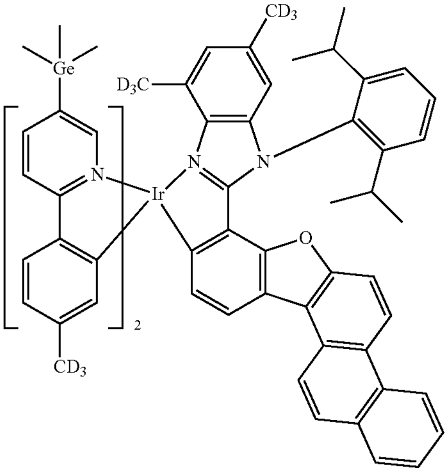
3317
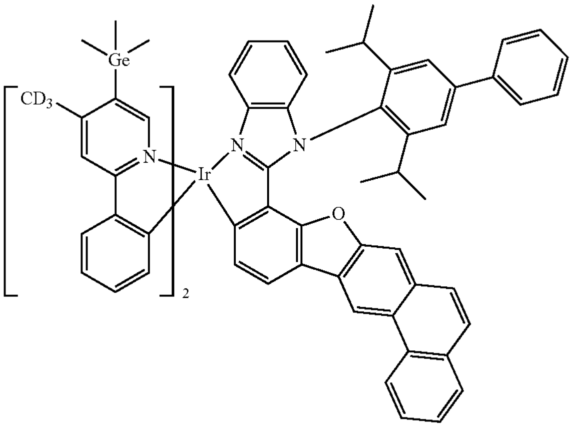
3318
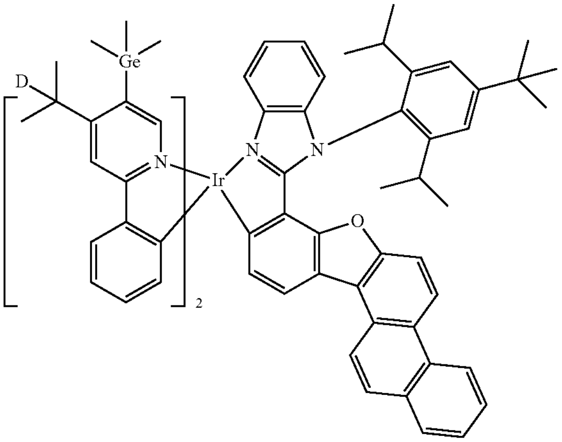

-continued
3319
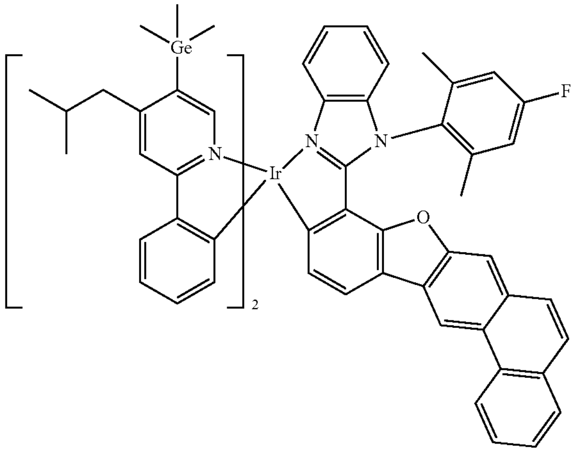
3320
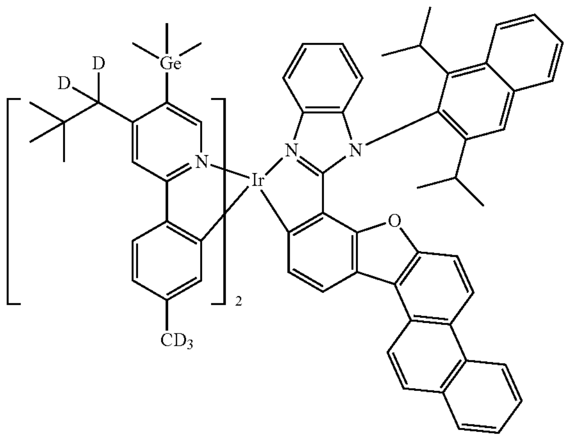
3321
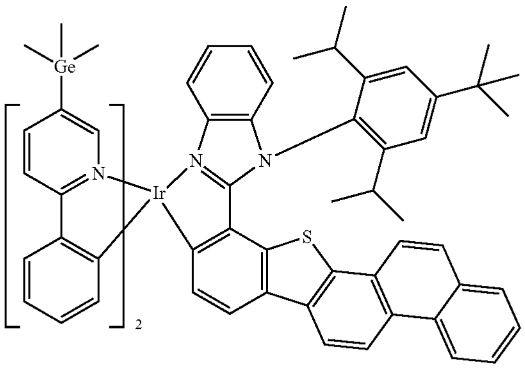
-continued
3322
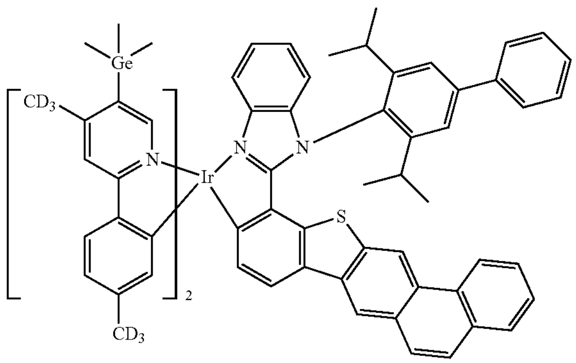
3323
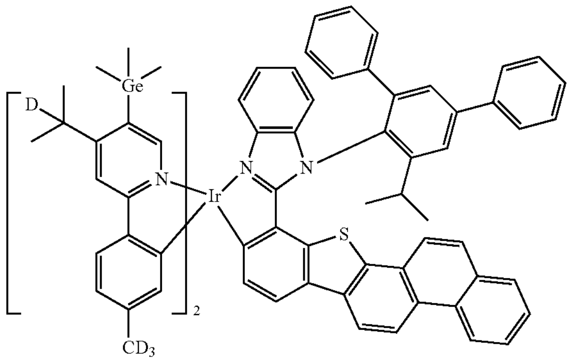
3324
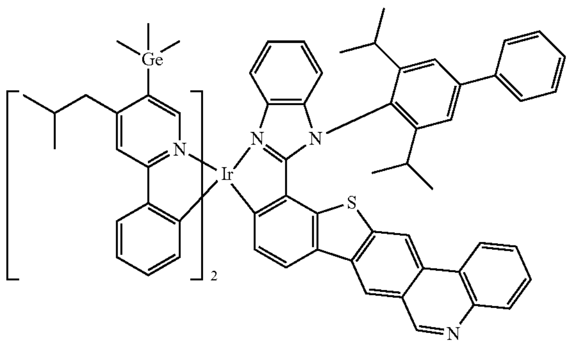
3325
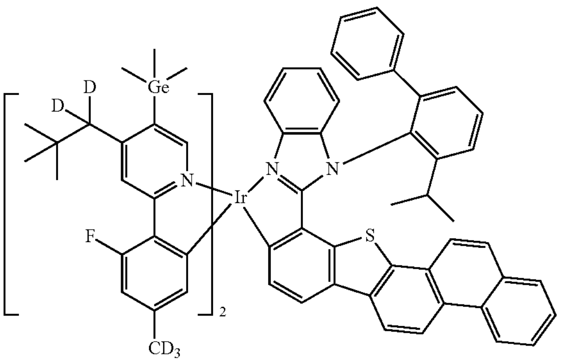

-continued
3326
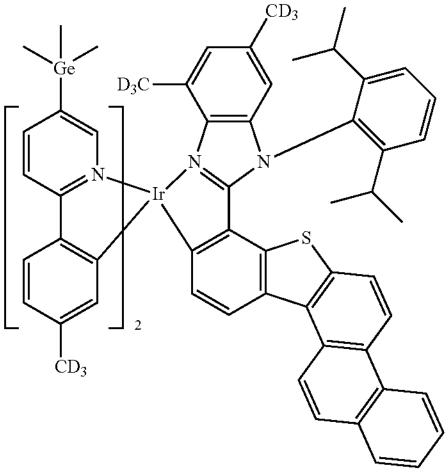
3327
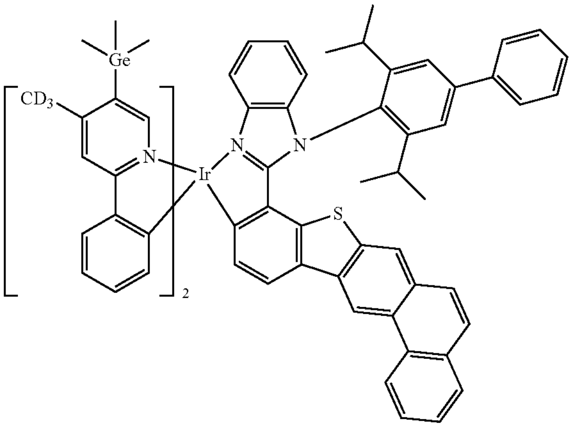
3328
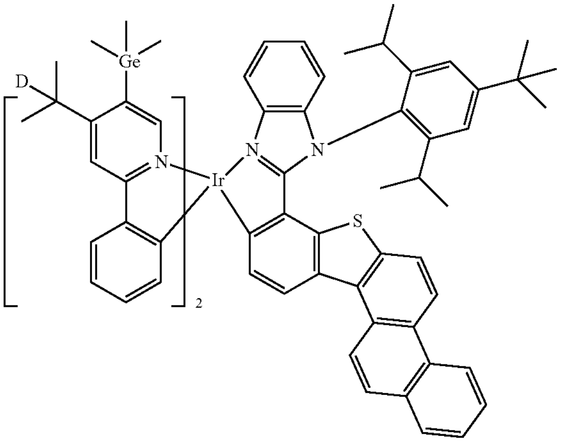
-continued
3329
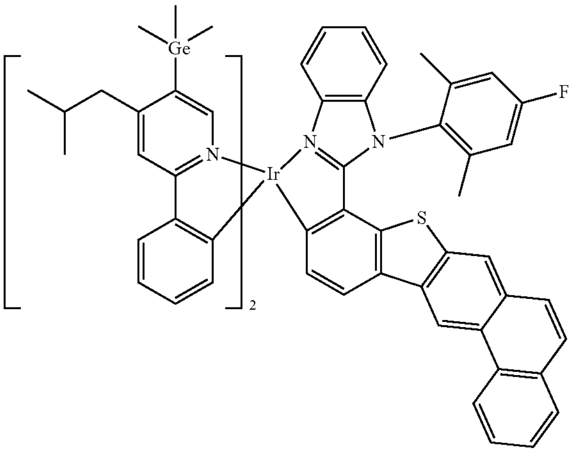
3330
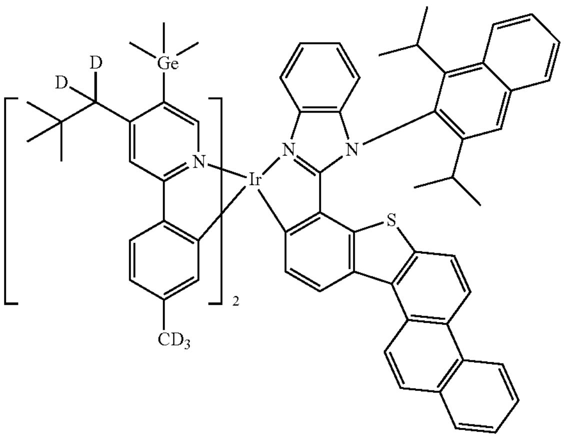
3331
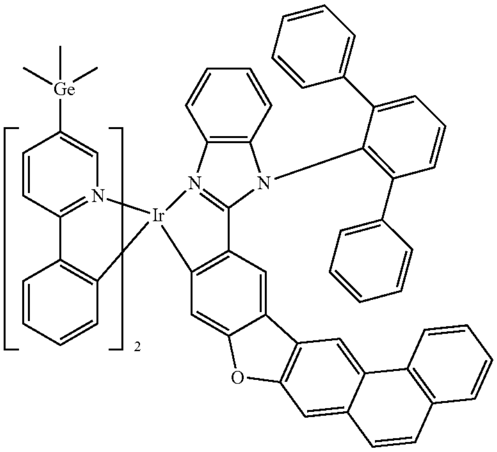

-continued
3332
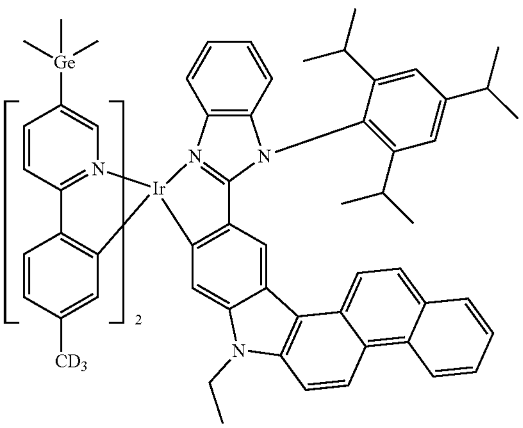
3333
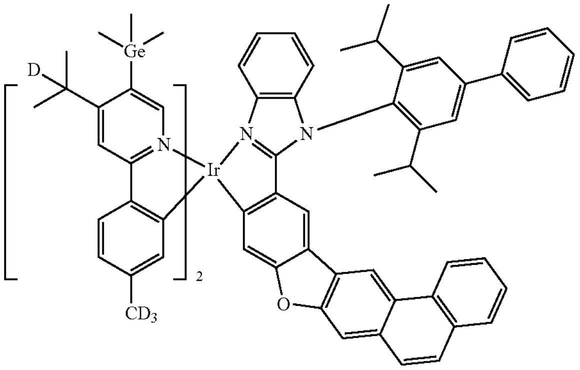
3334
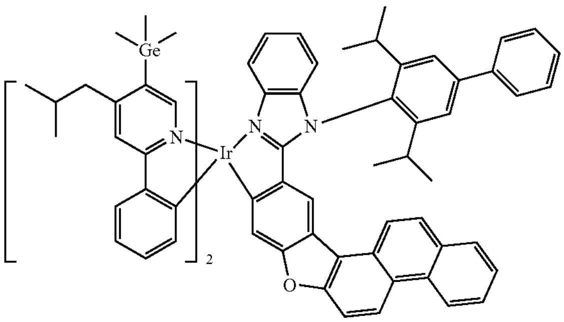
3335
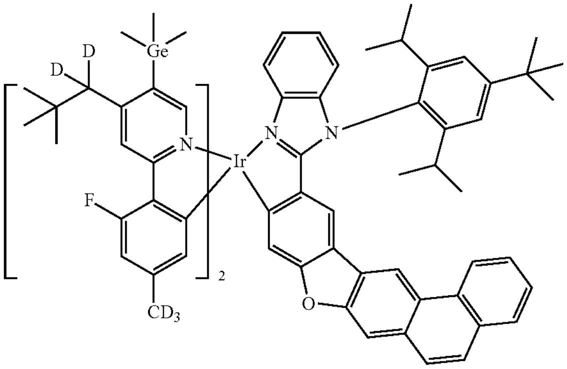
-continued
3336
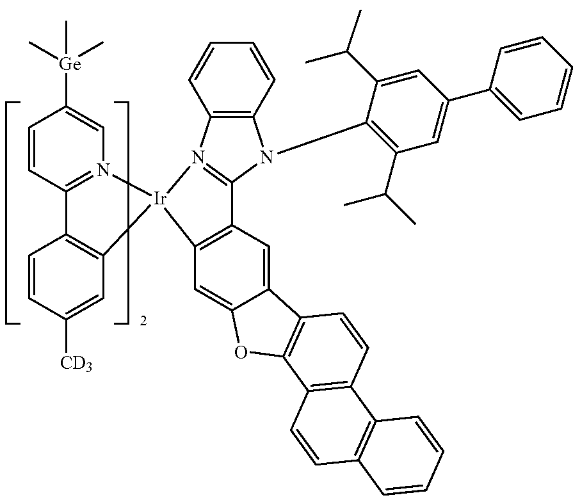
3337
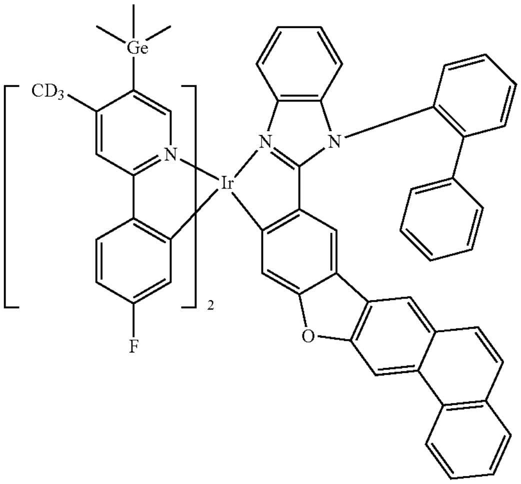
3338
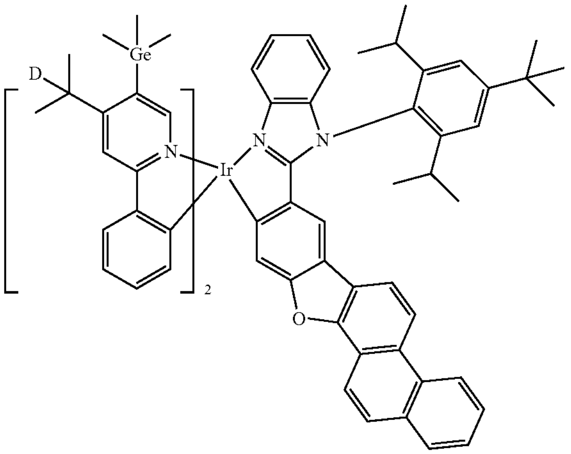

-continued
3339
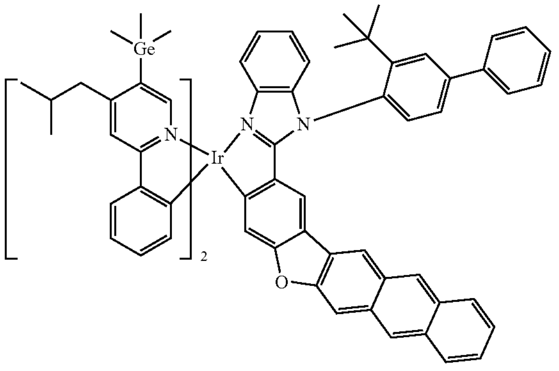
3340
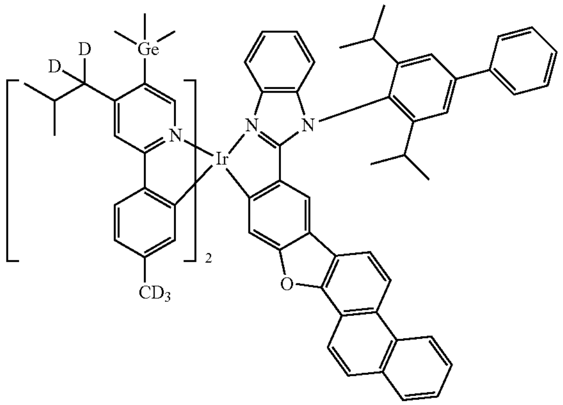
3341
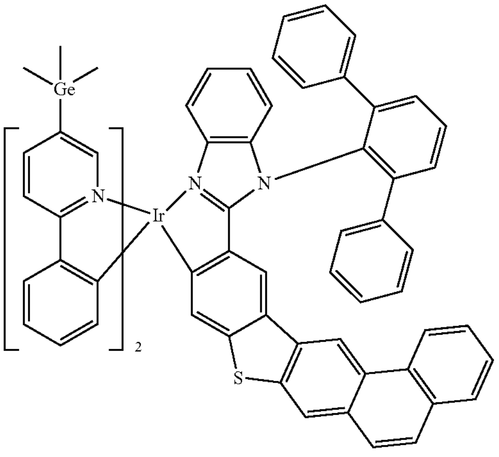
-continued
3342
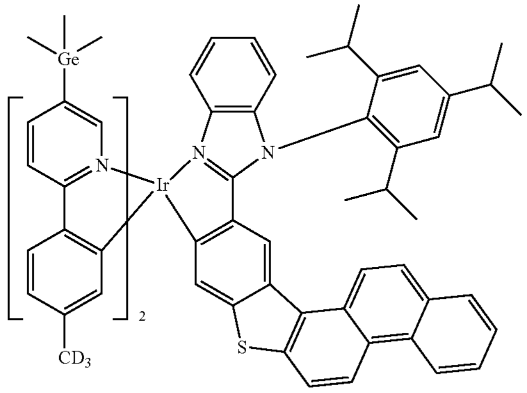
3343
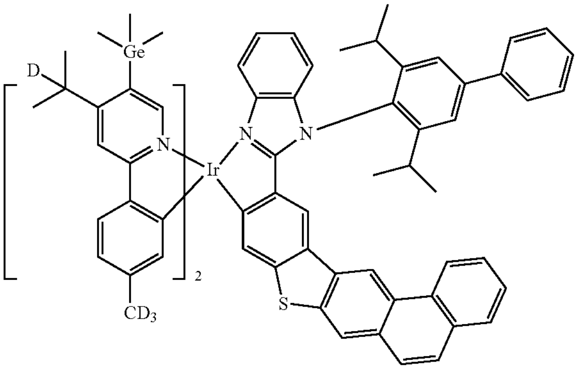
3344
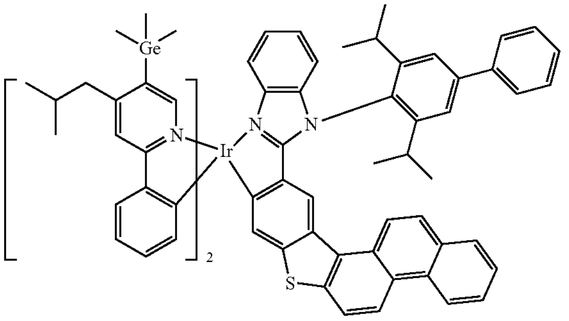
3345
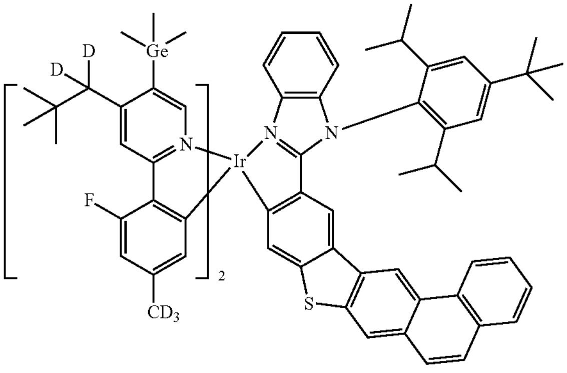

-continued
3346
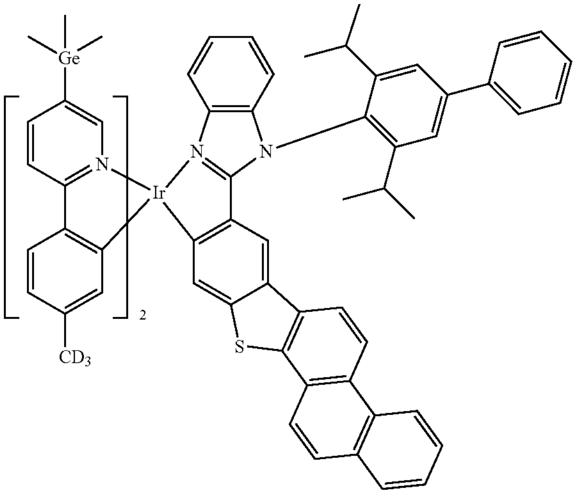
3347
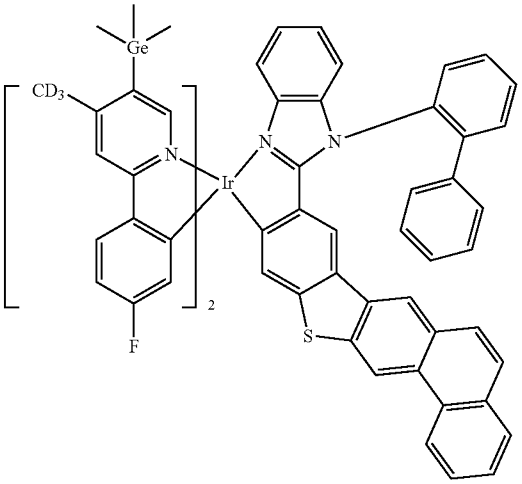
3348
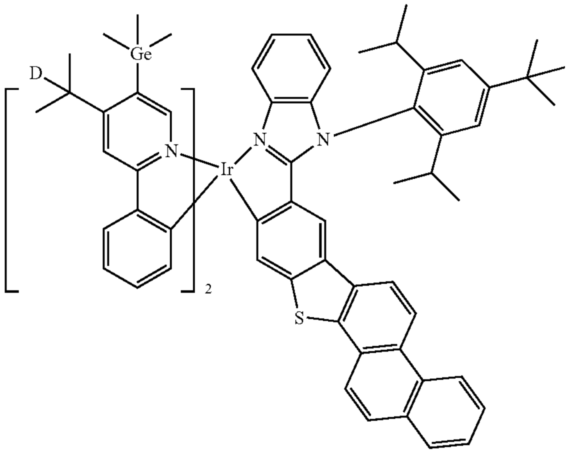
-continued
3349
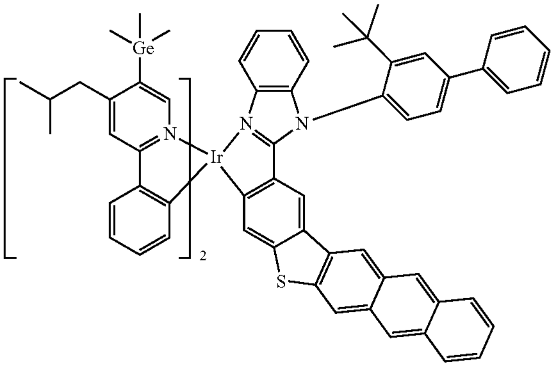
3350
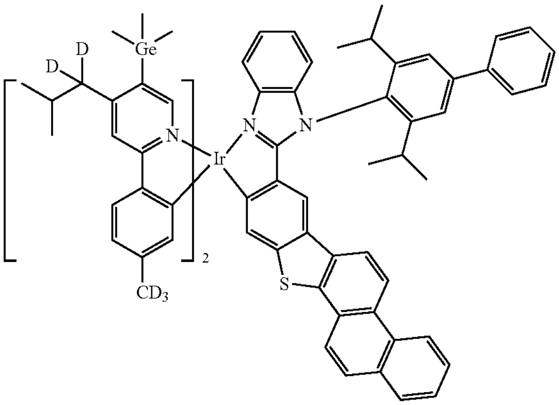
Group 2-2
1
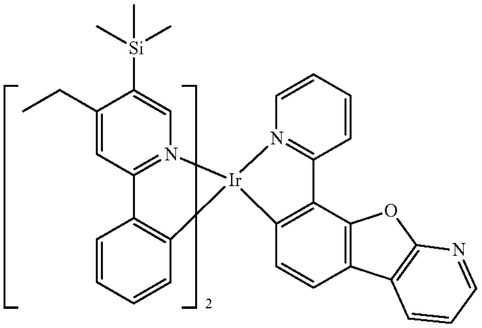
2
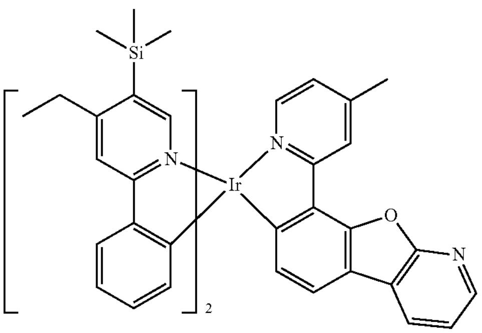

-continued
3
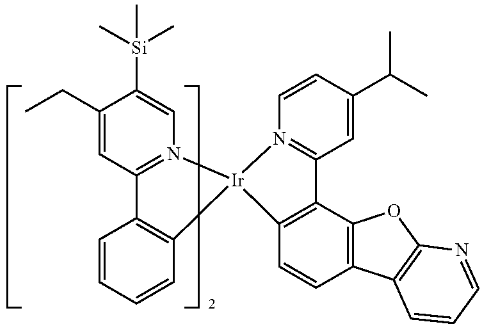
4
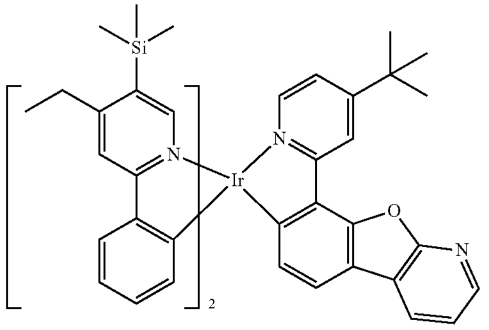
5
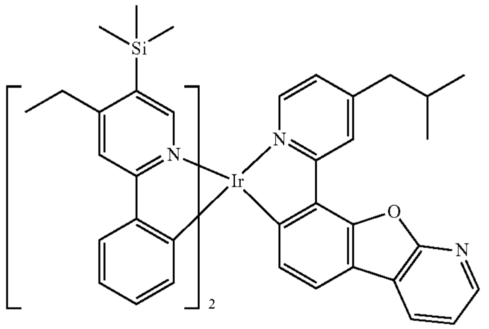
6
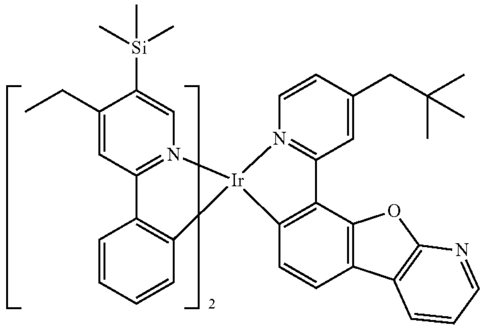
-continued
7
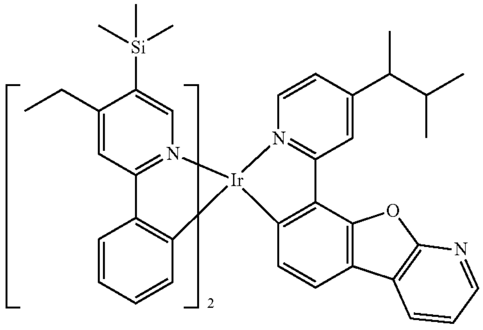
8
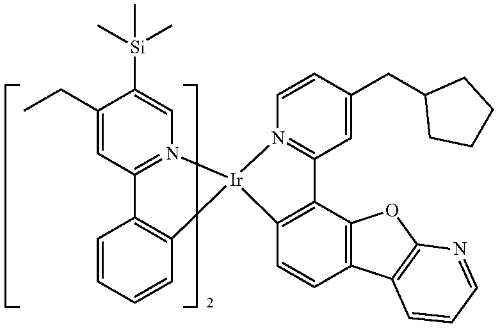
9
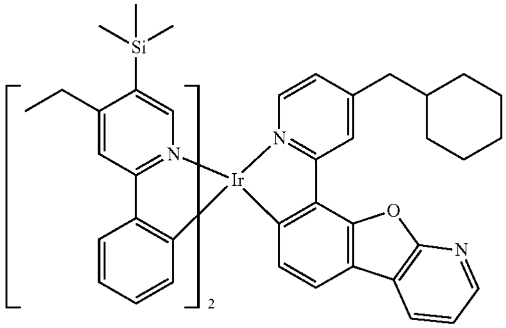
10
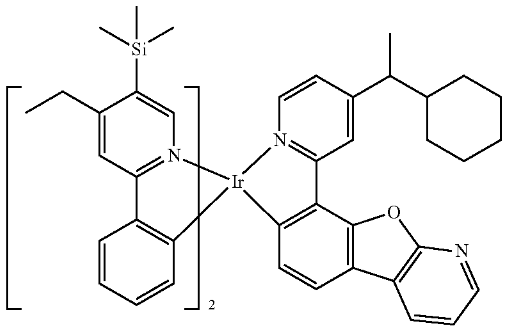

-continued
11
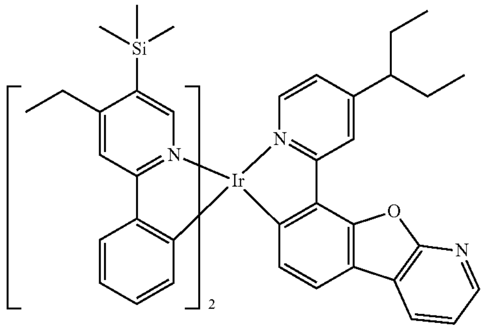
12
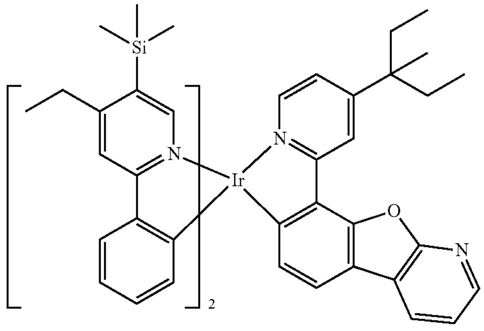
13
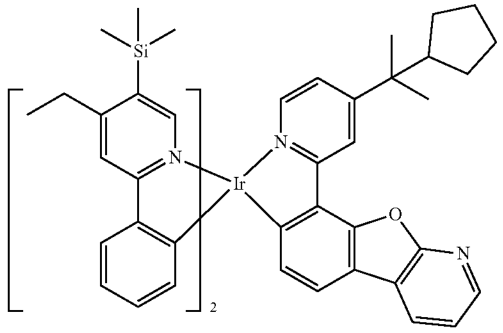
14
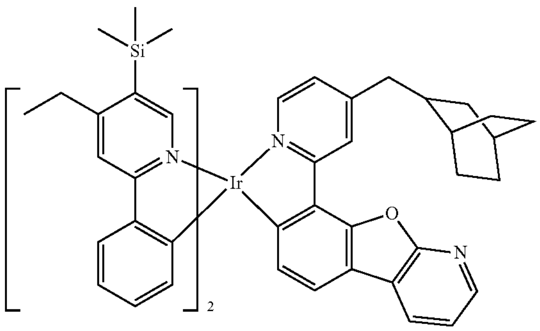
-continued
15
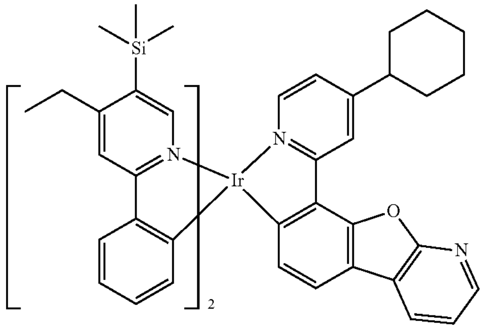
16
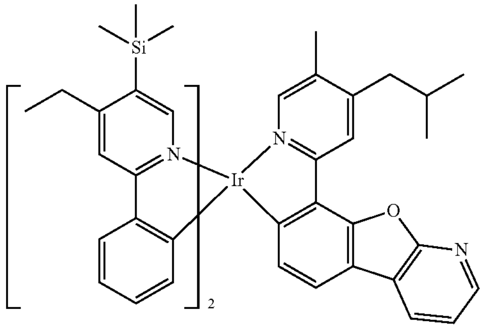
17
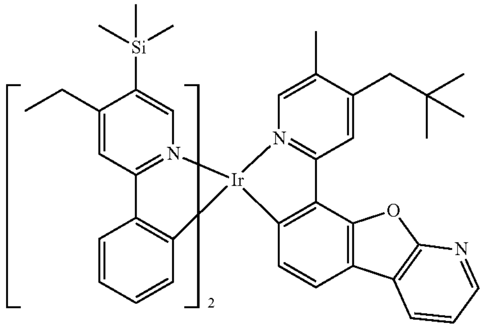
18
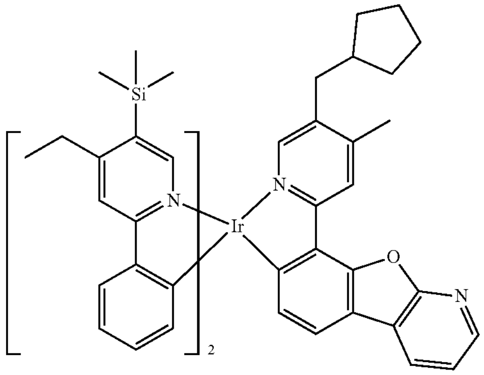

-continued
19
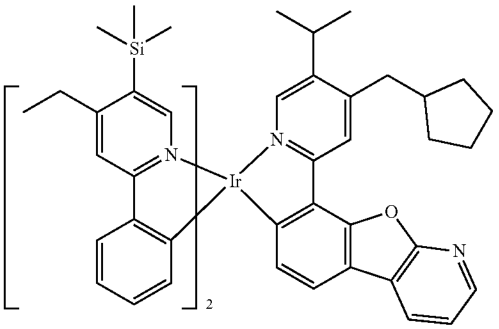
20
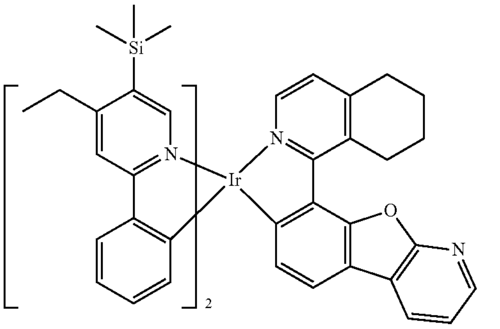
41
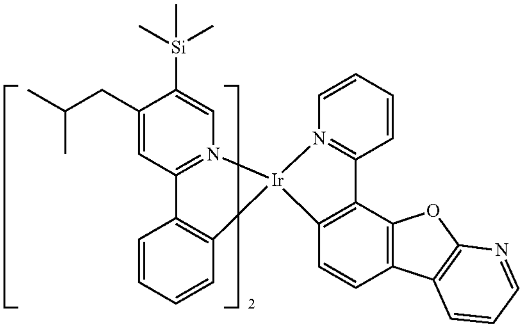
42
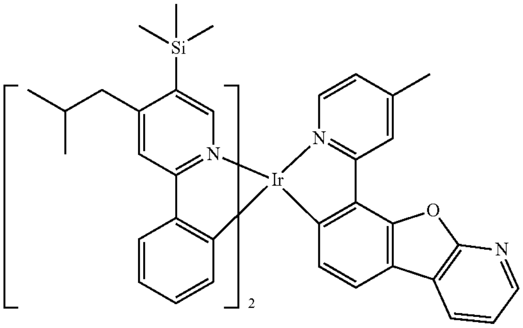
-continued
43
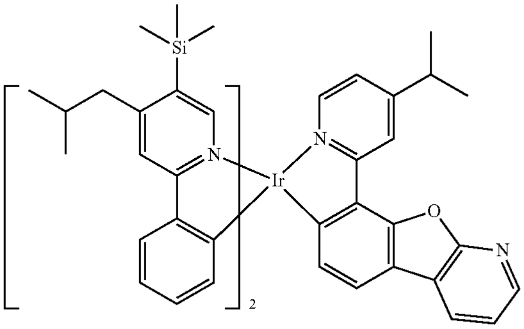
44
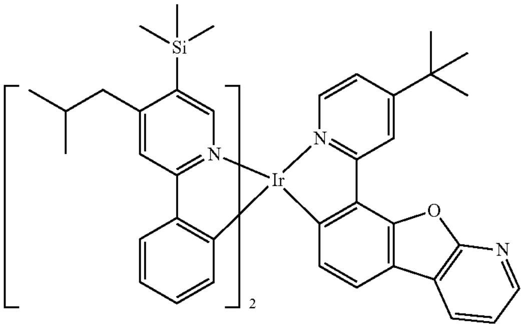
45
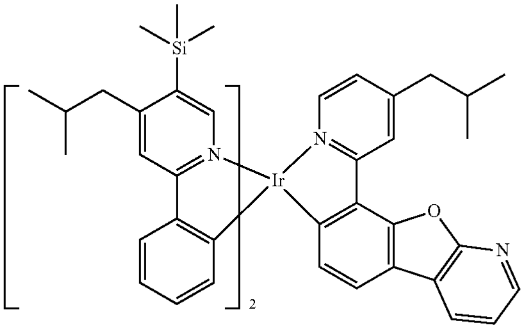
46
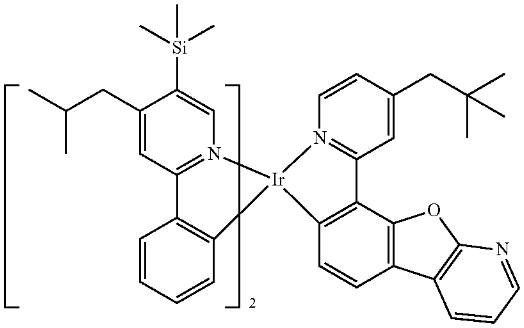

-continued
47
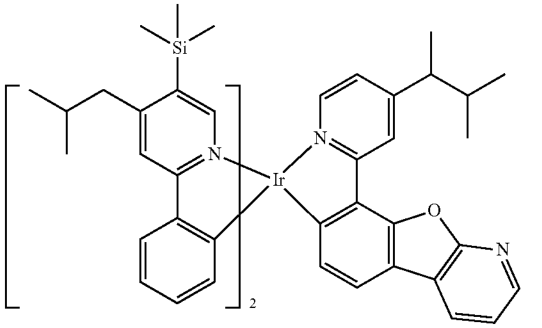
48
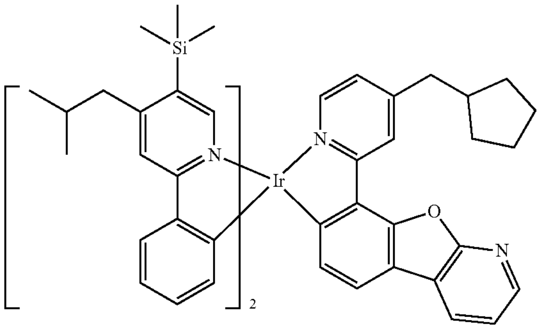
49
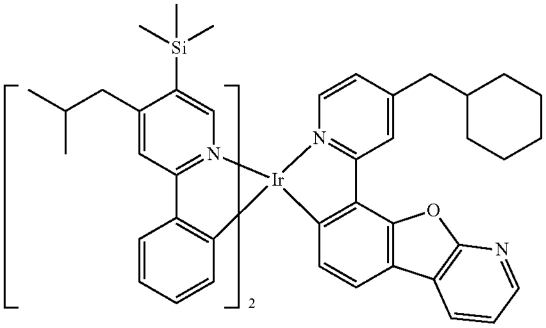
50
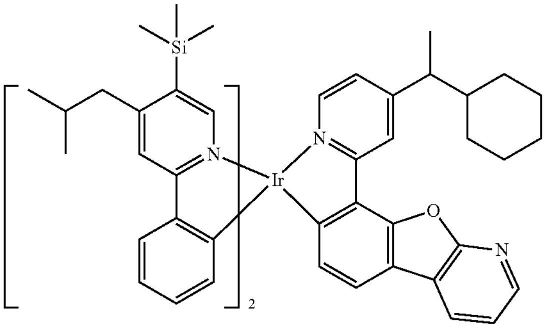
-continued
51
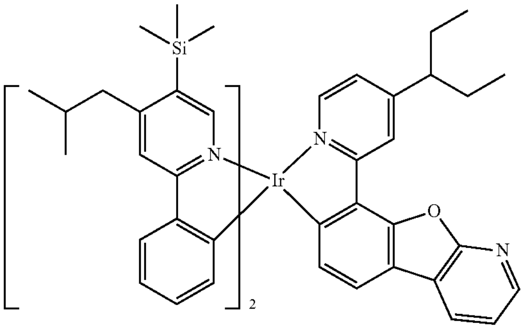
52
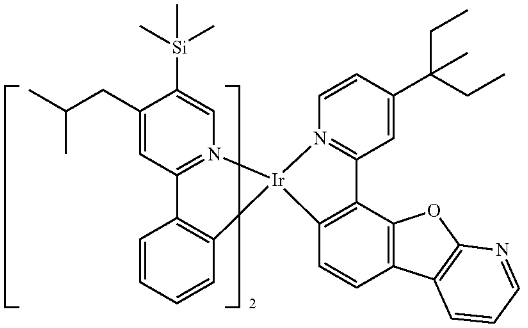
53
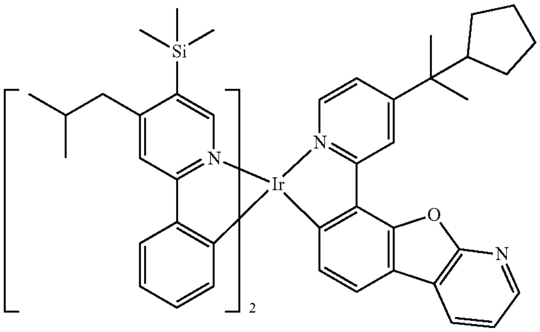
54
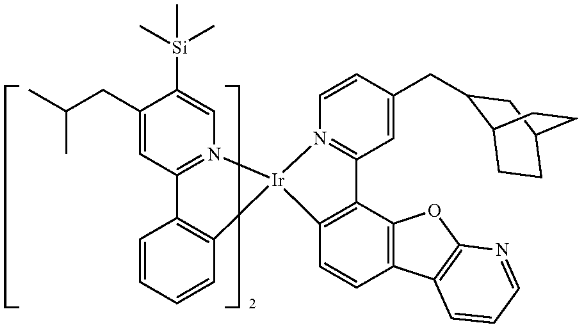

-continued
55
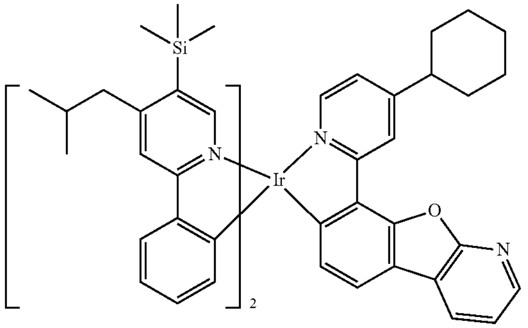
56
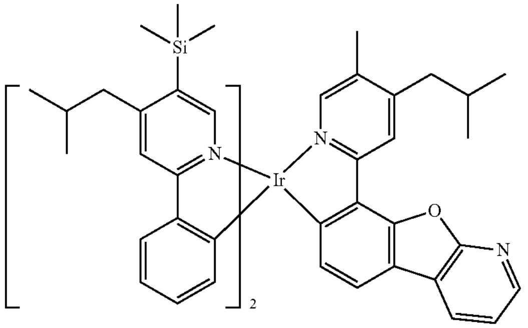
57
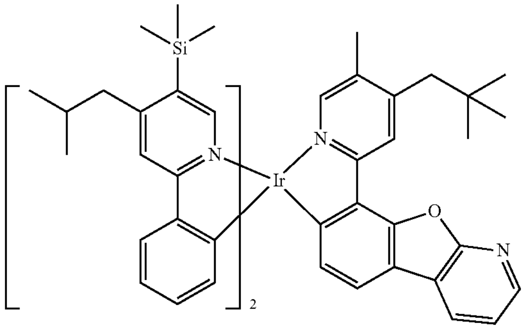
58
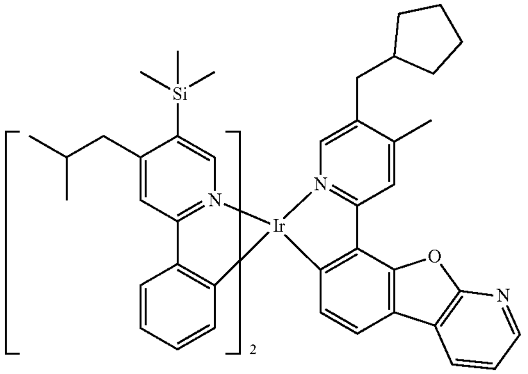
-continued
59
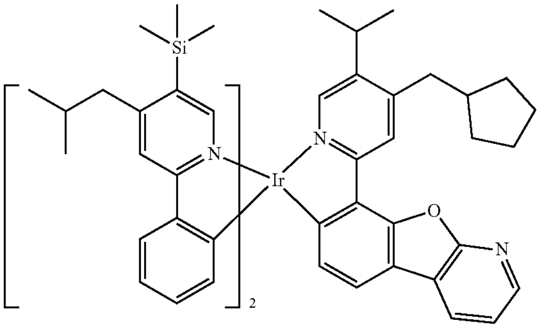
60
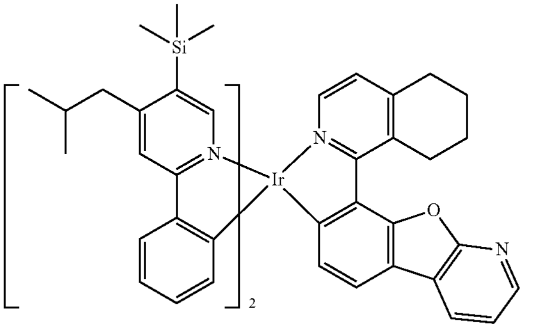
61
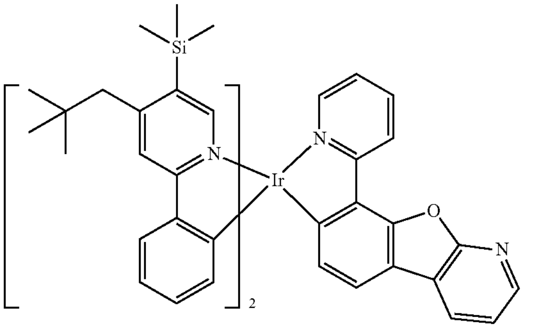
62
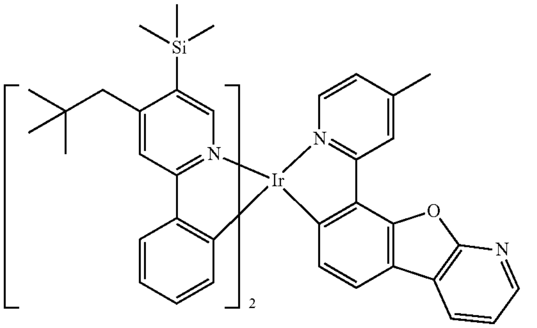

-continued
63
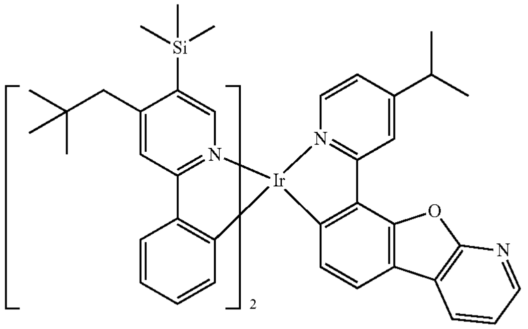
64
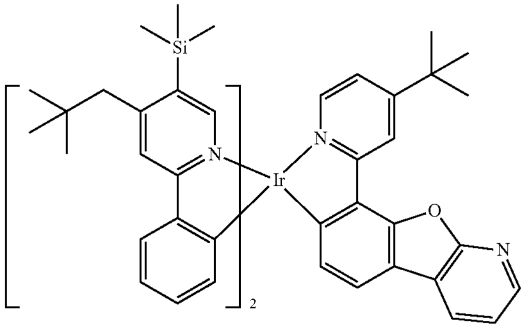
65
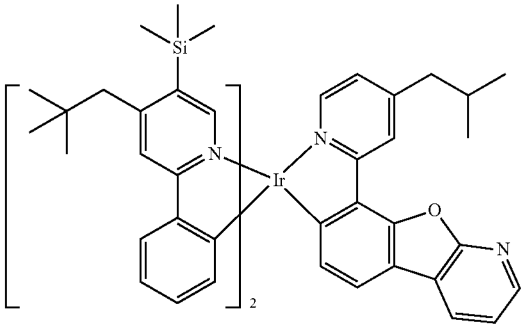
66
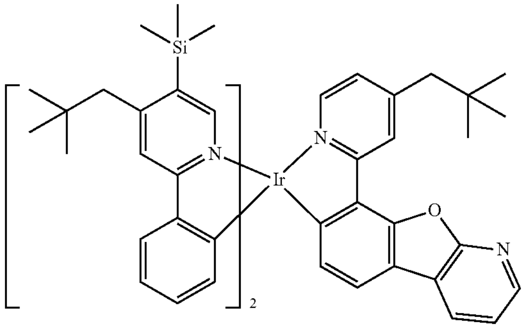
-continued
67
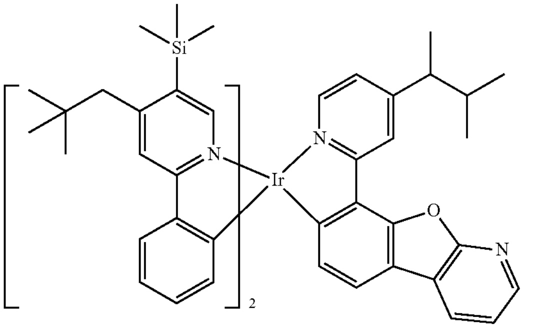
68
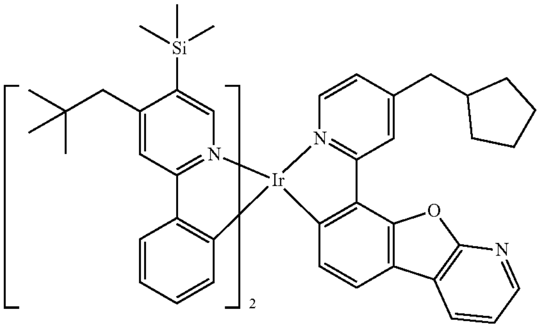
69
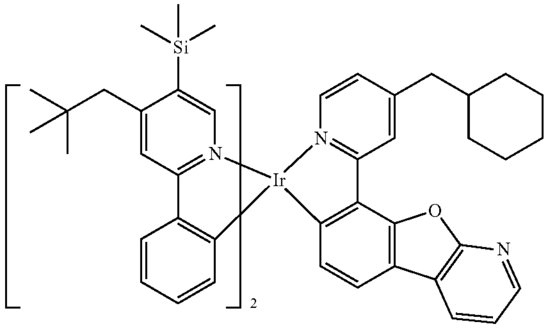
70
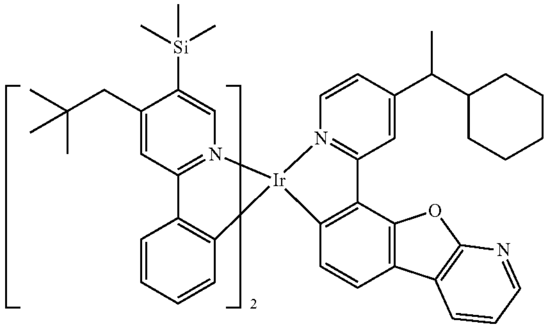

-continued
71
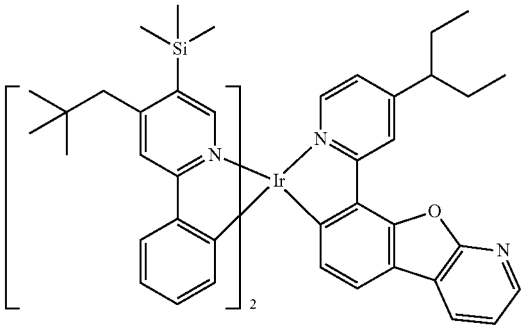
72
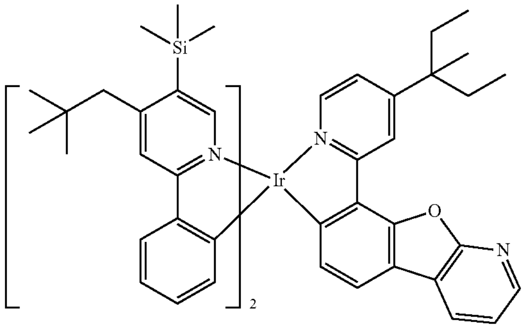
73
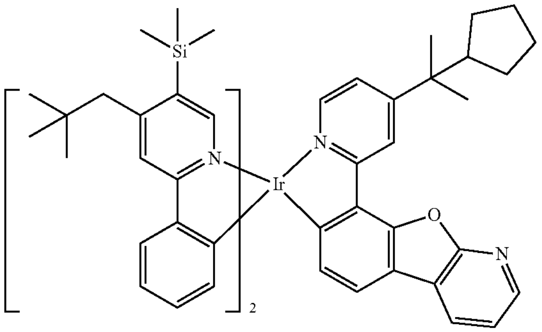
74
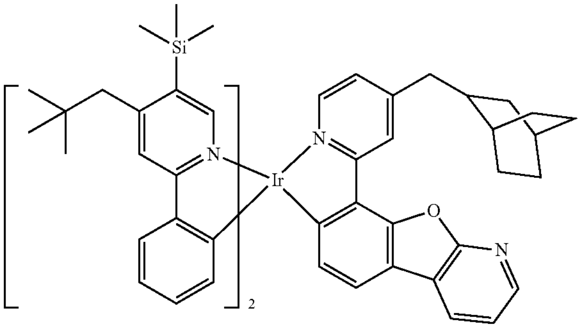
-continued
75
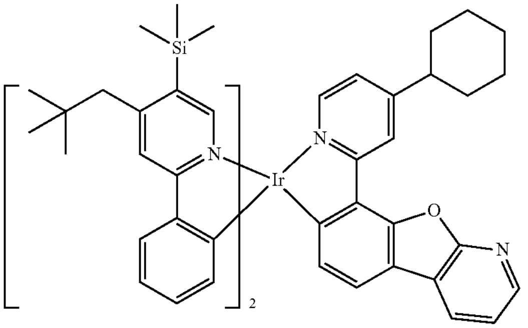
76
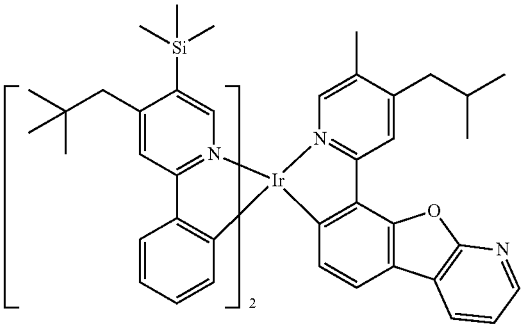
77
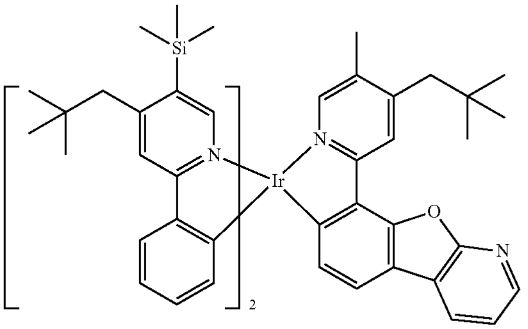
78
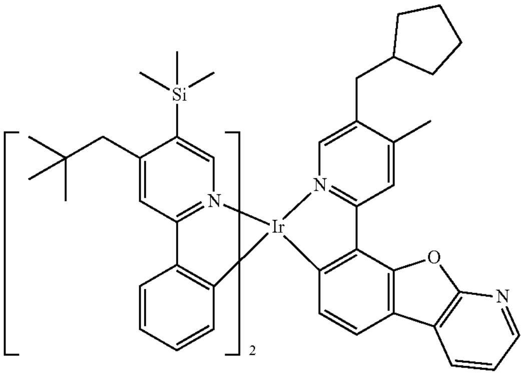

-continued
79
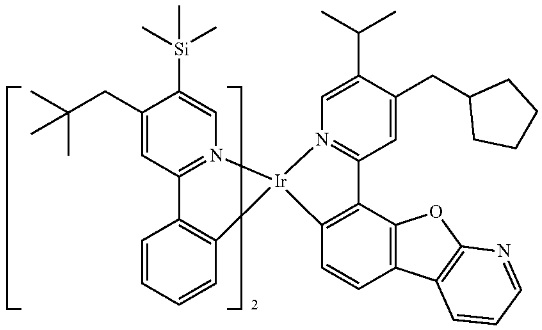
80
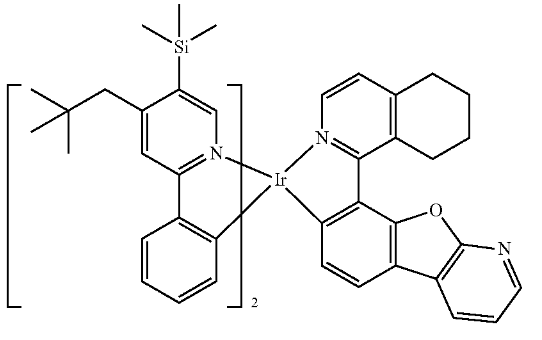
501
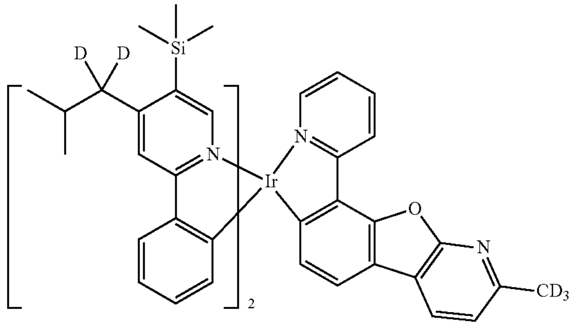
502
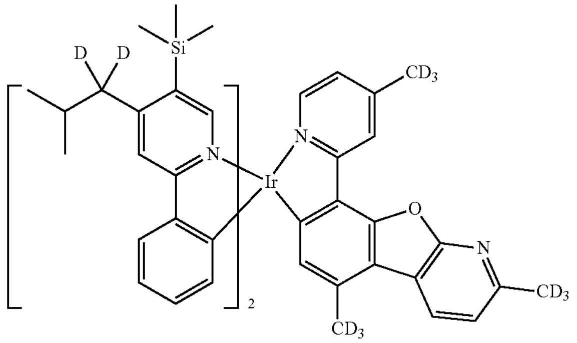
-continued
503
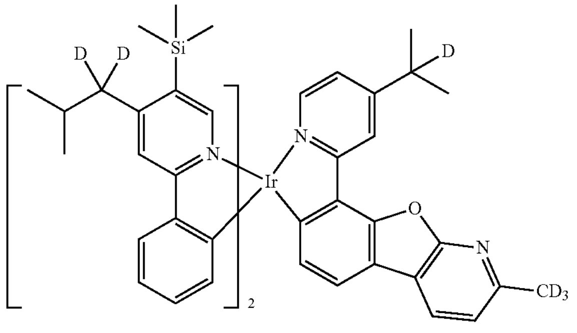
504
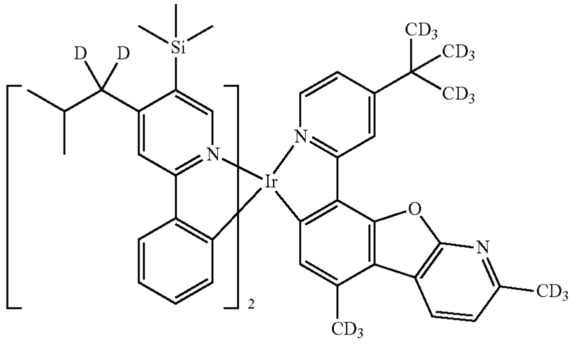
505
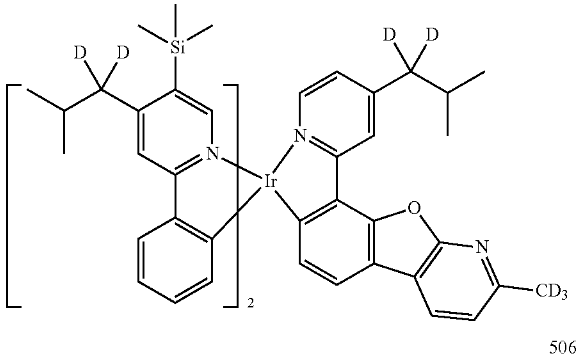
506
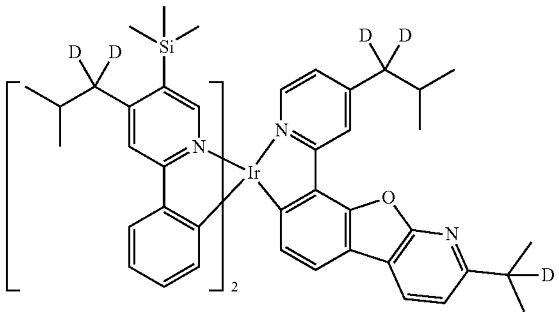

-continued
507
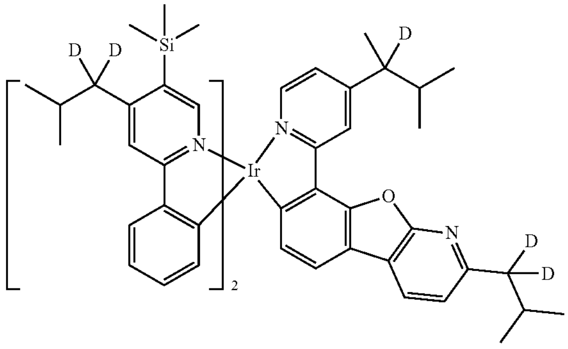
508
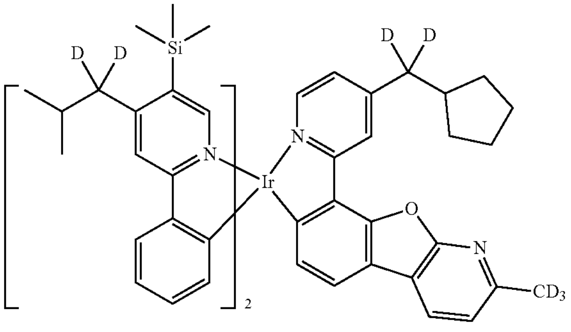
509
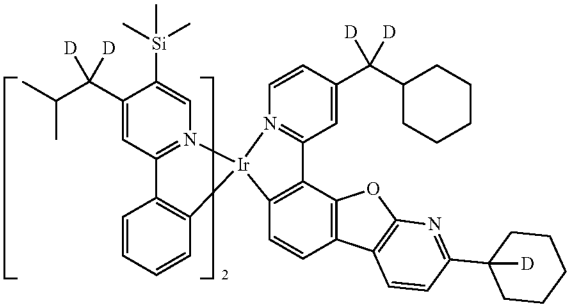
510
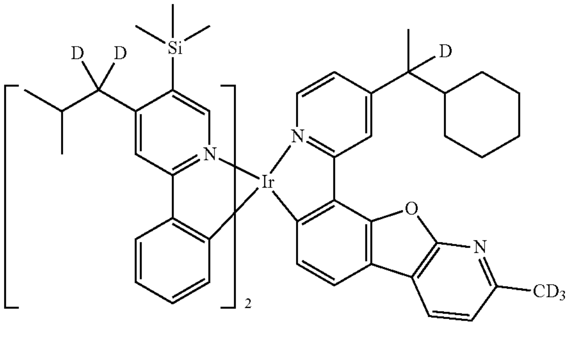
-continued
511
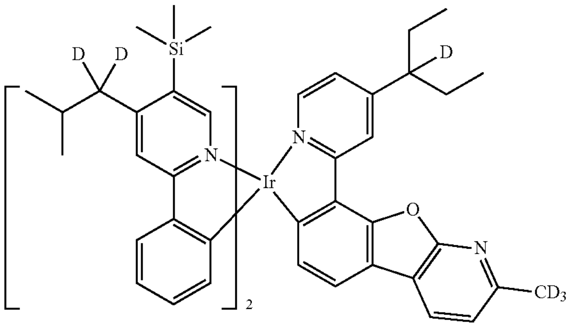
512
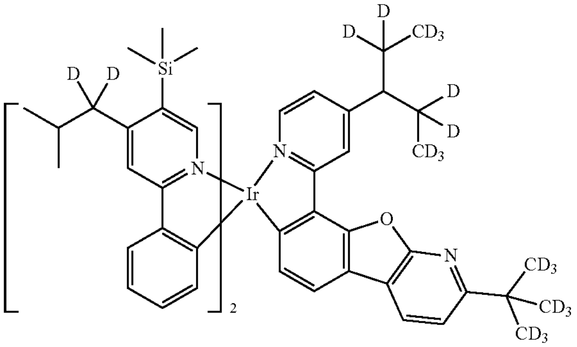
513
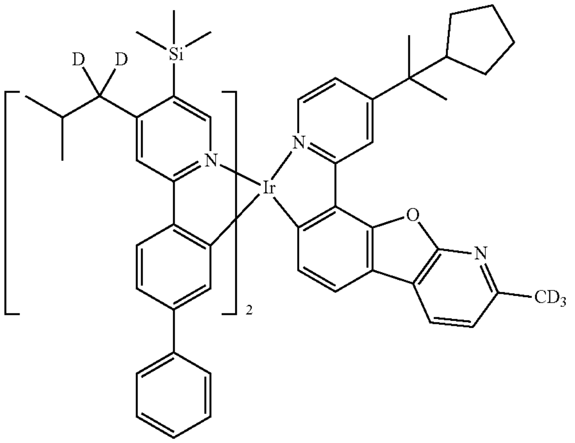
514
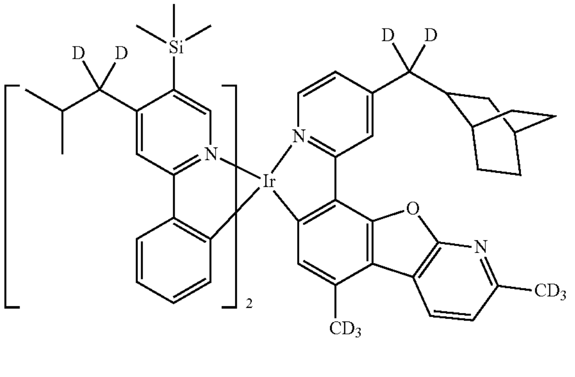

-continued
515
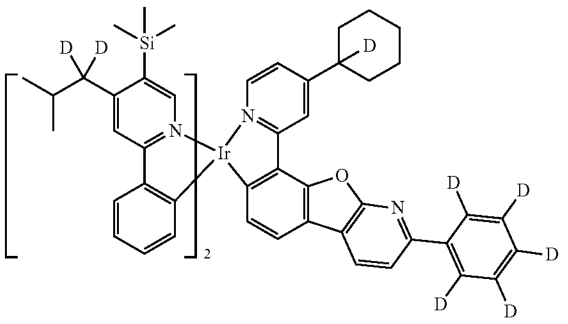
516
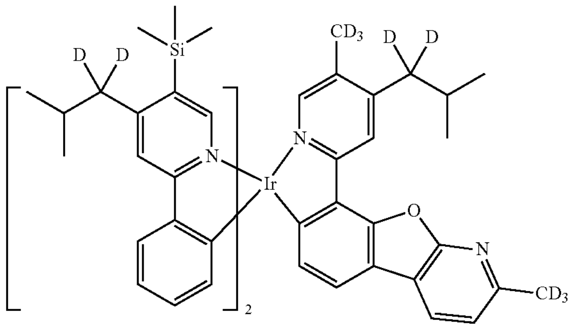
517
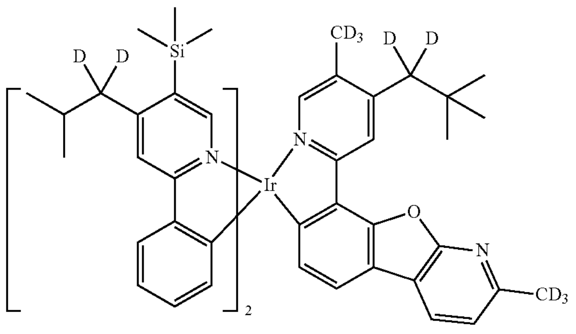
518
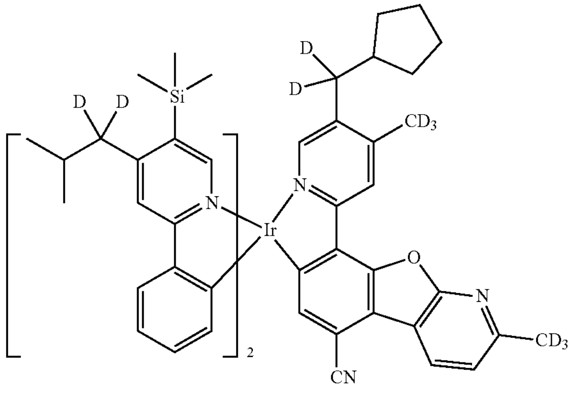
-continued
519
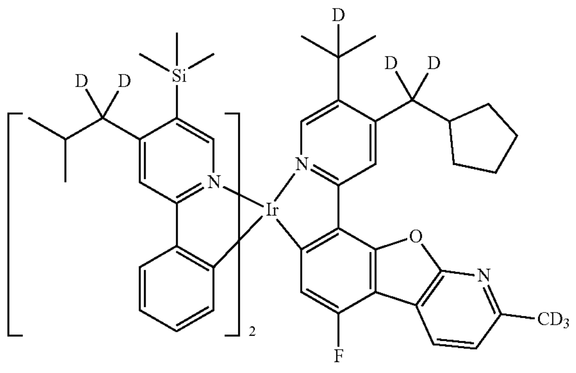
520
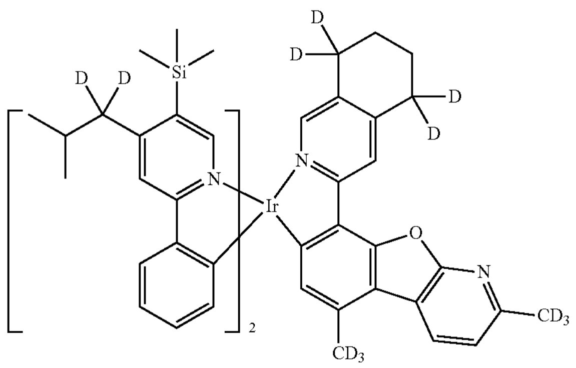
521
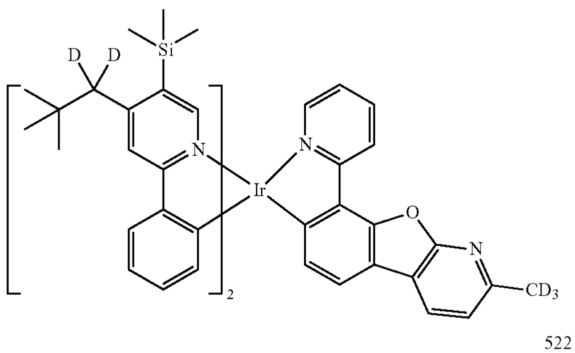
522
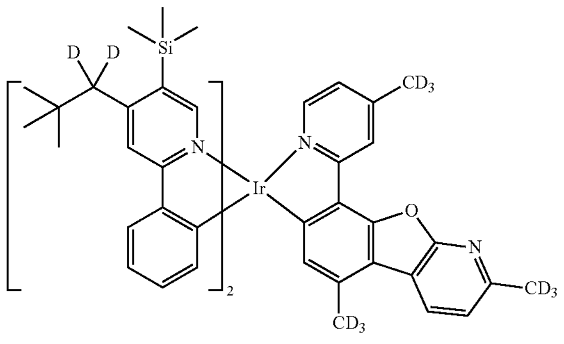

-continued
523
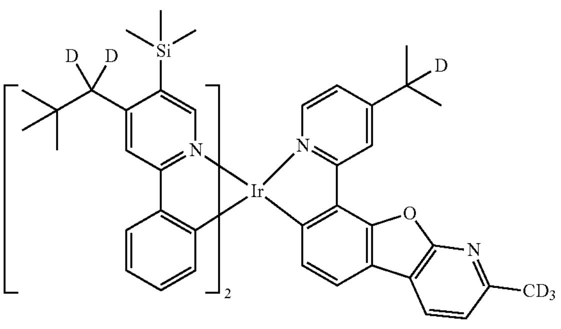
524
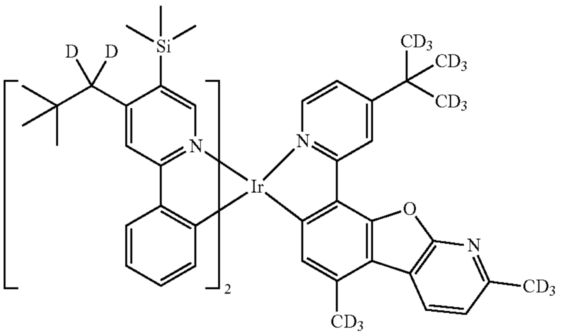
525
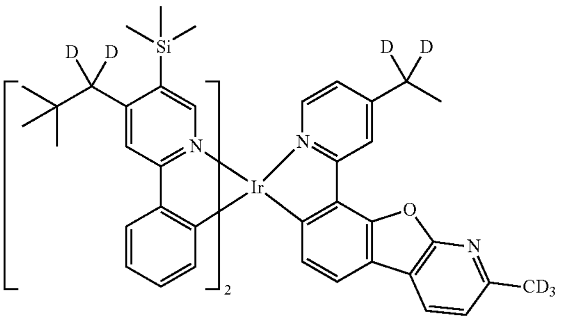
526
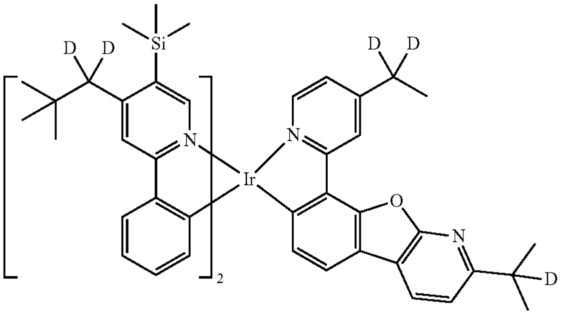
-continued
527
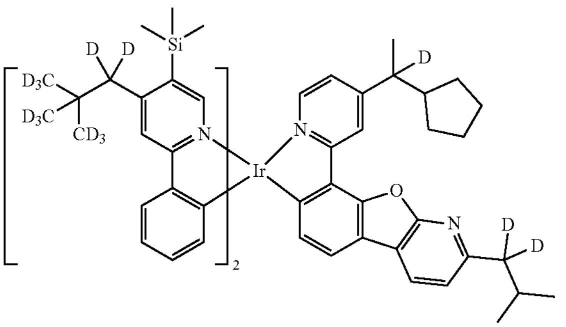
528
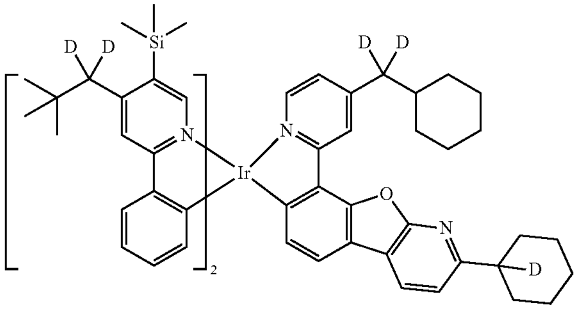
529
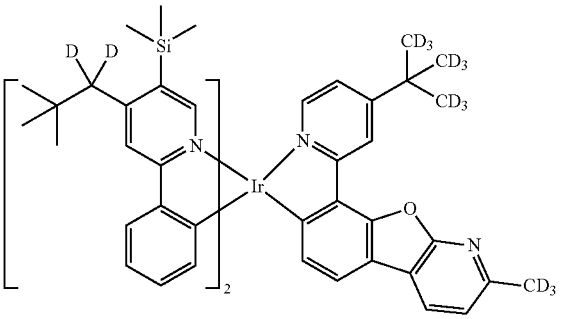
530
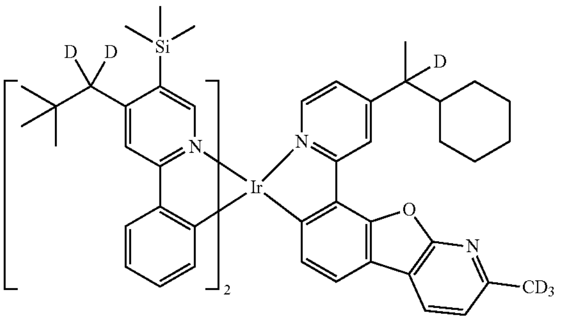

-continued
531
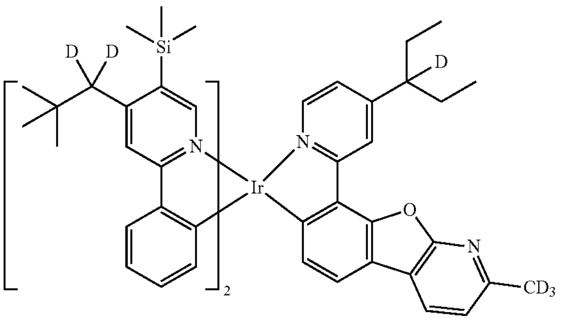
532
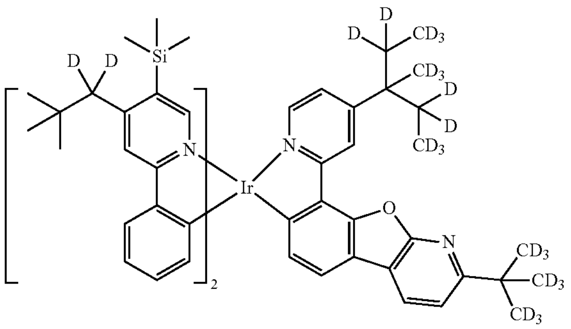
533
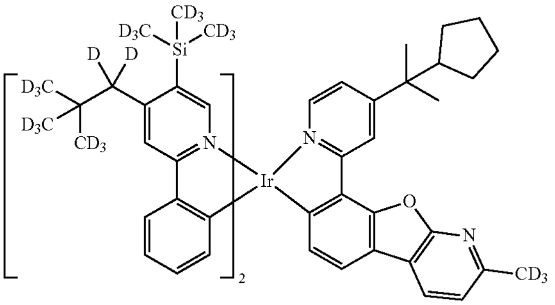
534
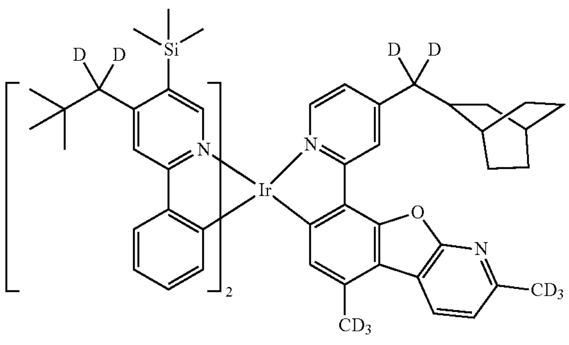
-continued
535
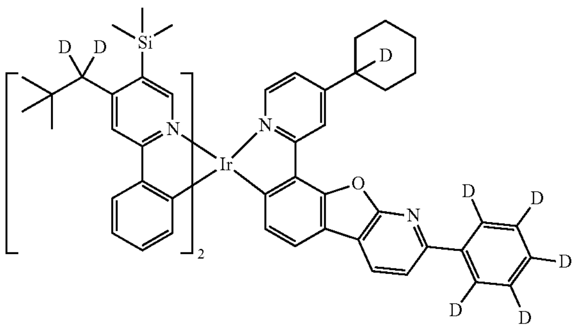
536
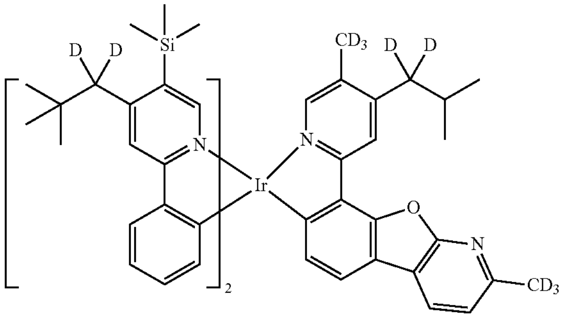
537
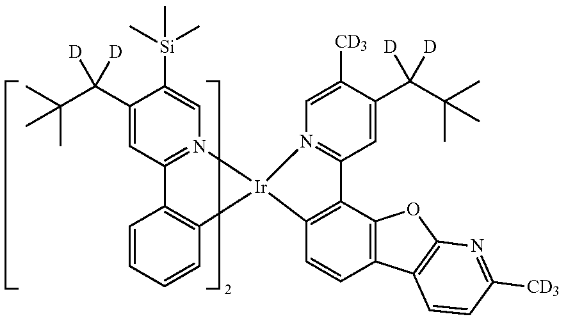
538
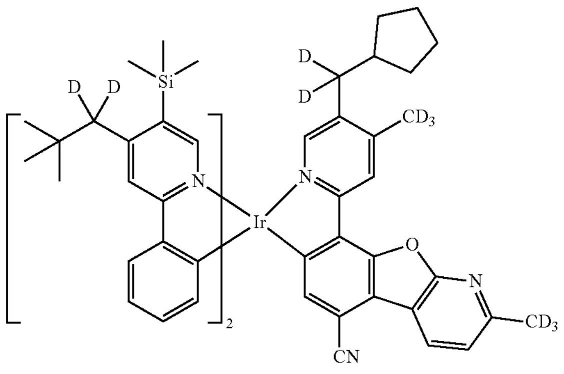

-continued
539
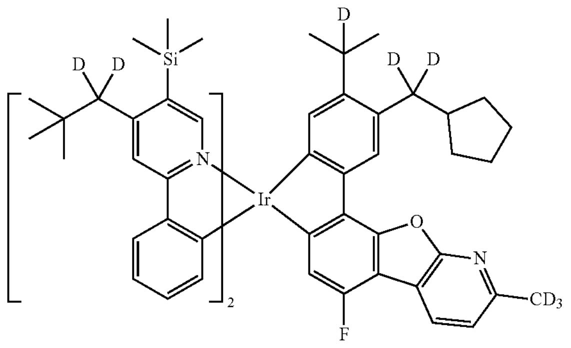
540
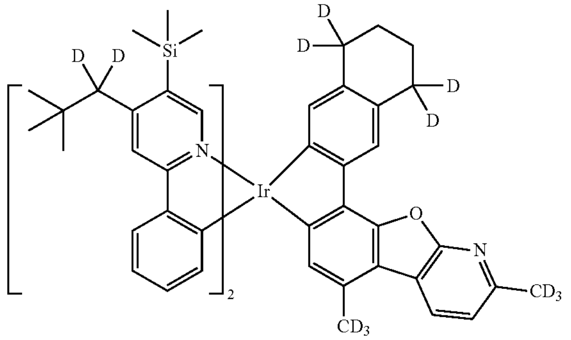
801
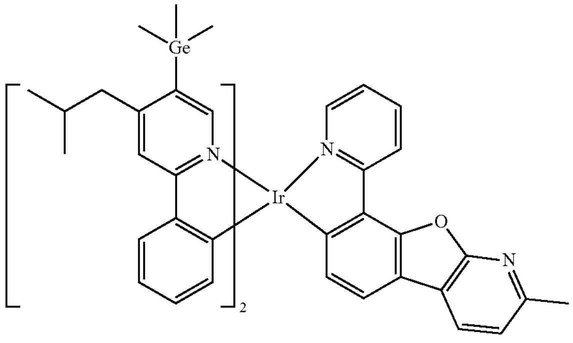
802
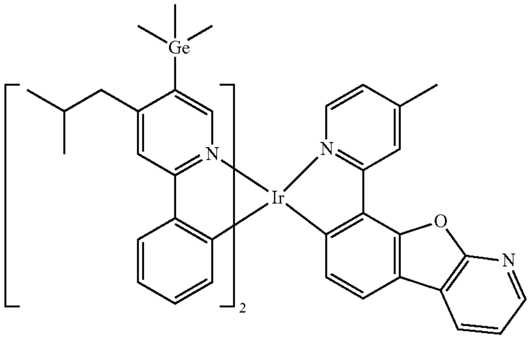
-continued
803
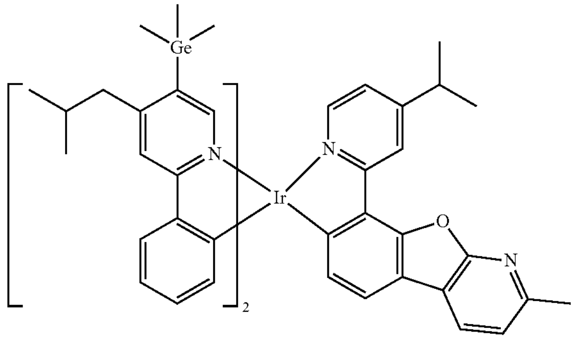
804
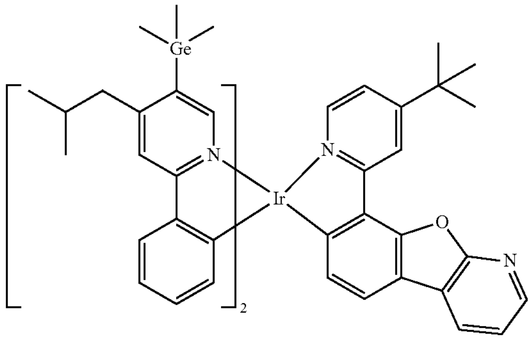
805
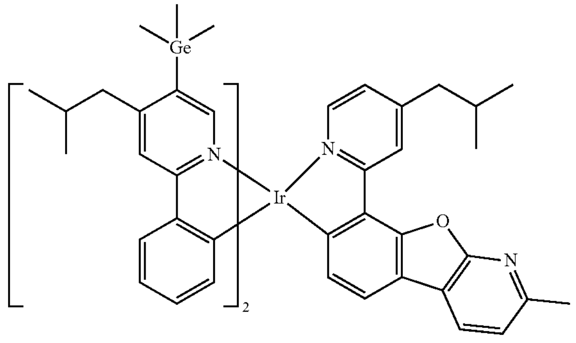
806
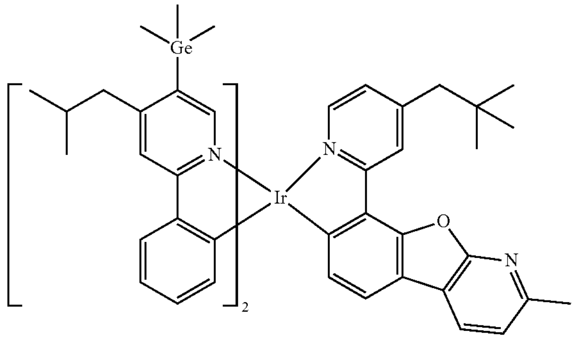

-continued
807
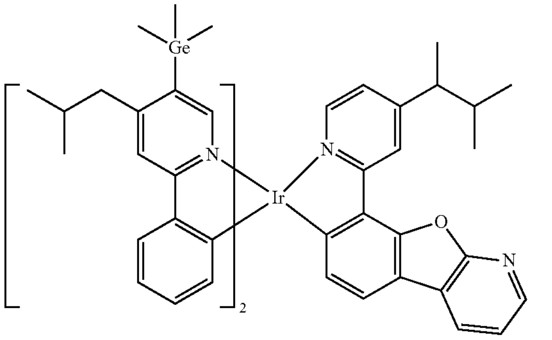
808
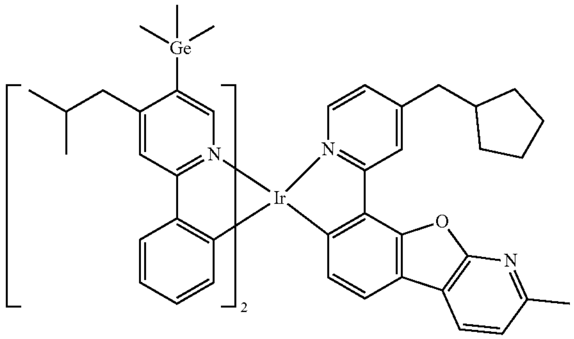
809
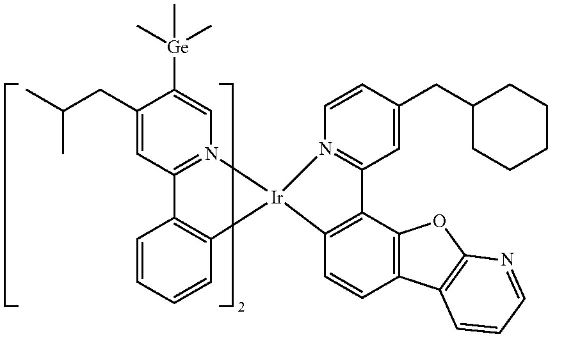
810
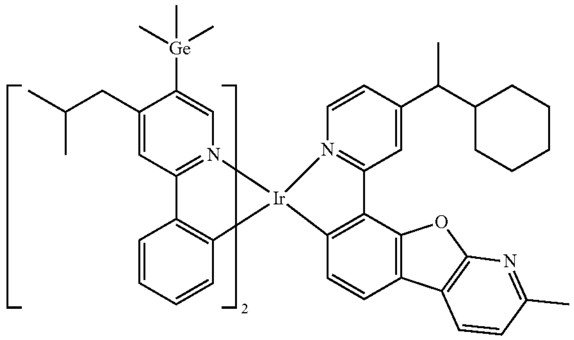
-continued
811
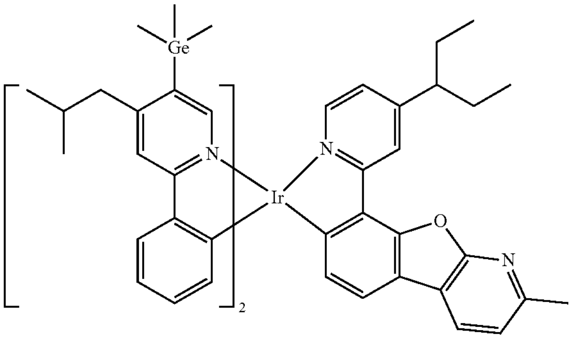
812
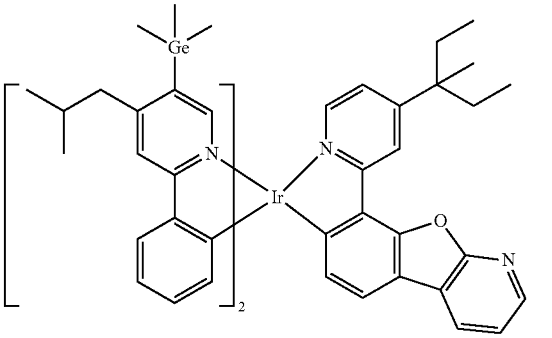
813
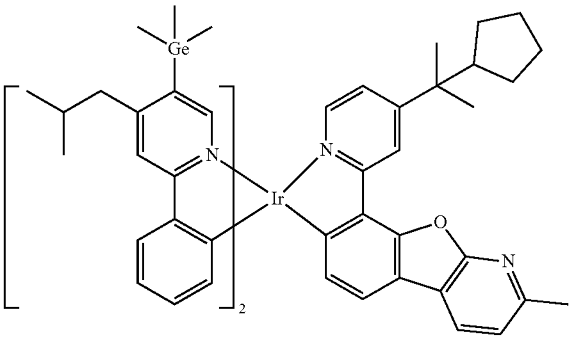
814
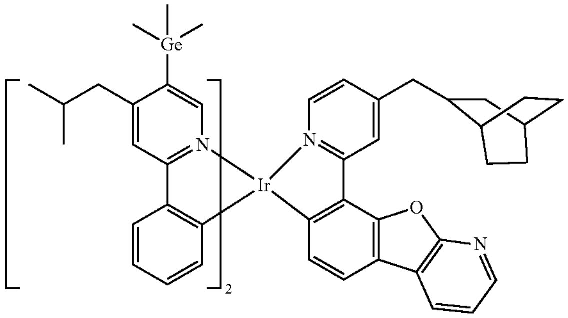

-continued
815
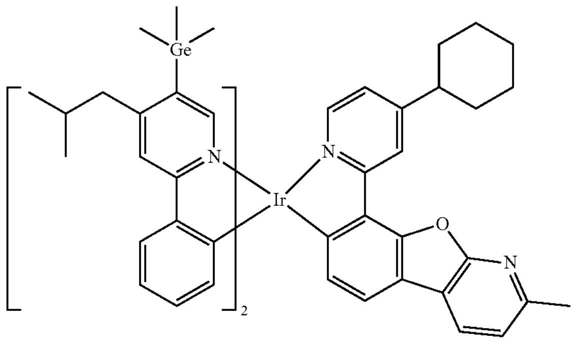
816
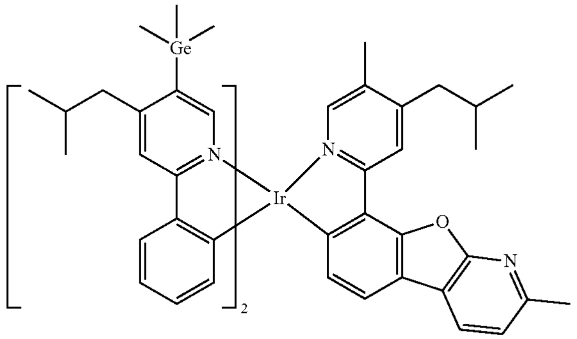
817
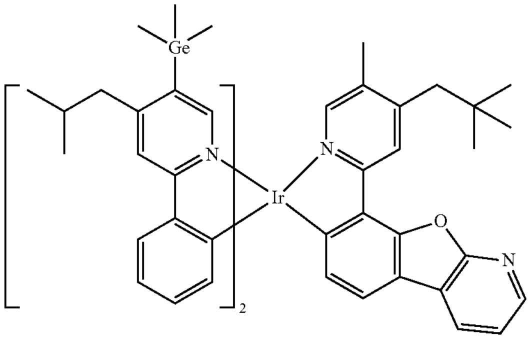
818
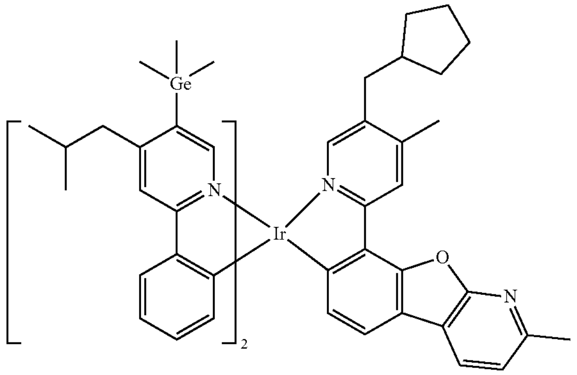
-continued
819
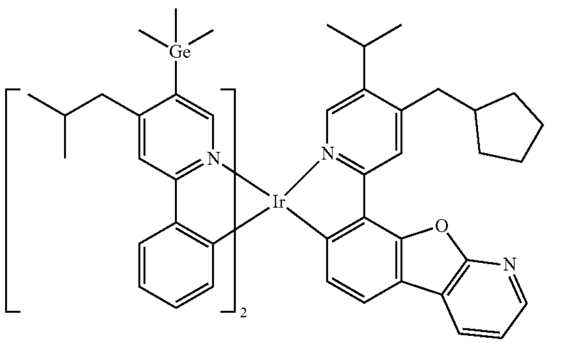
820
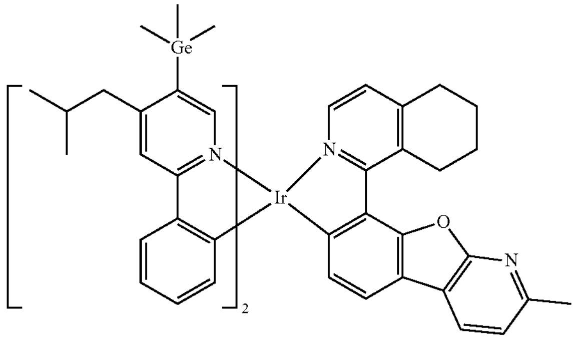
821
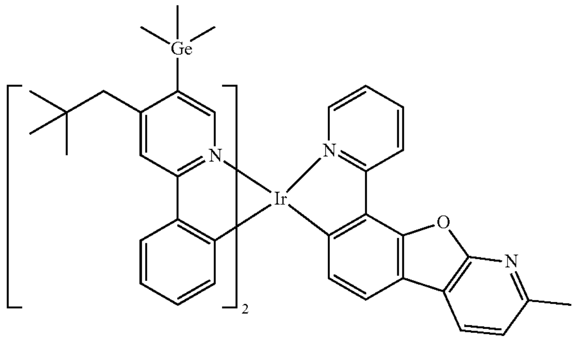
822
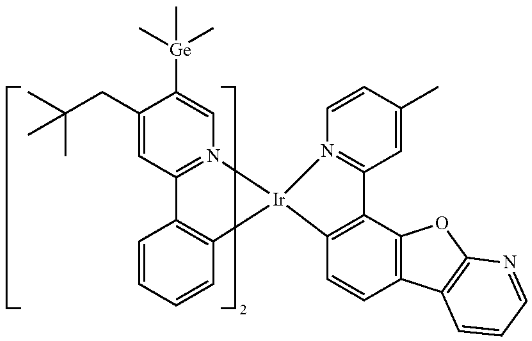

-continued
823
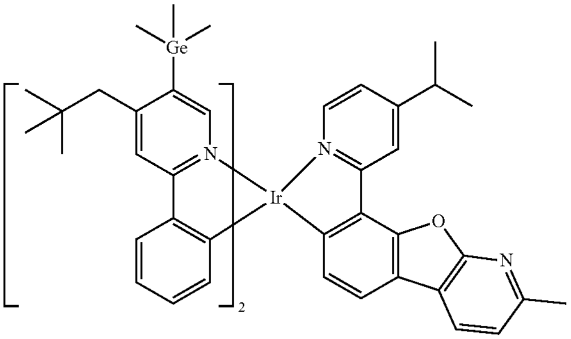
824
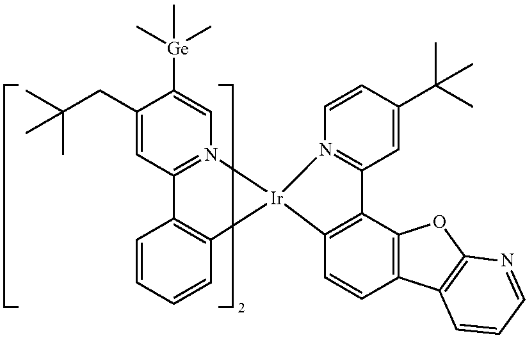
825
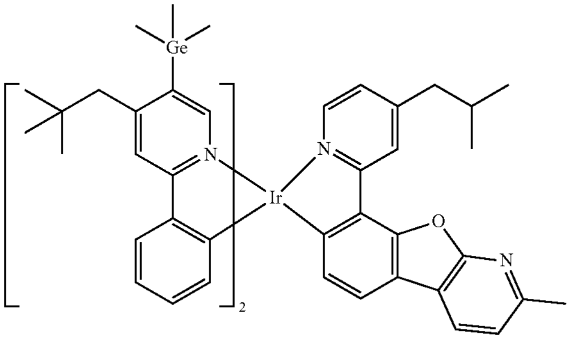
826
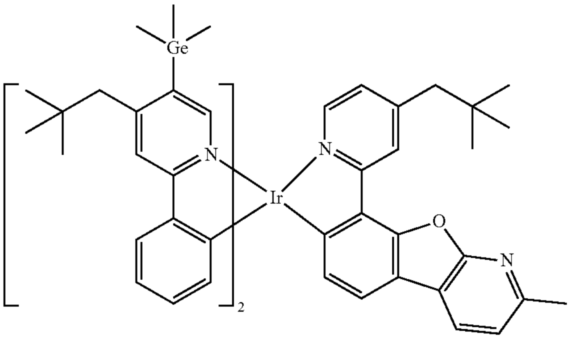
-continued
827
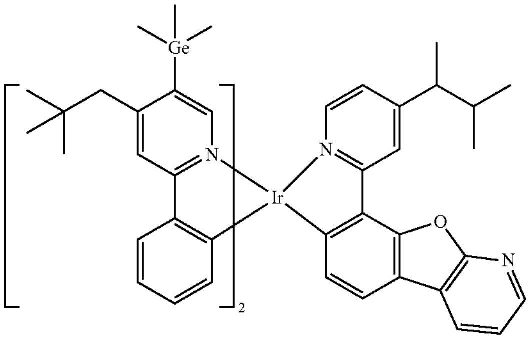
828
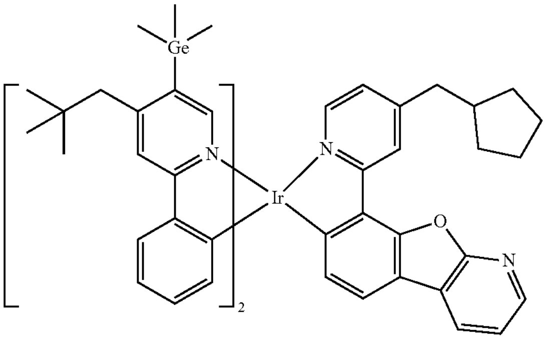
829
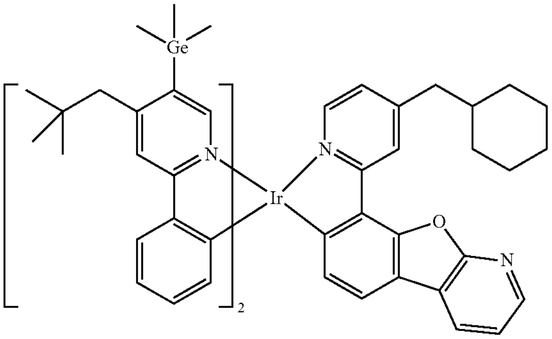
830
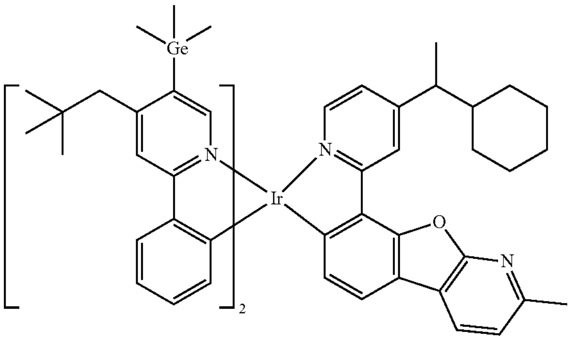

-continued
831
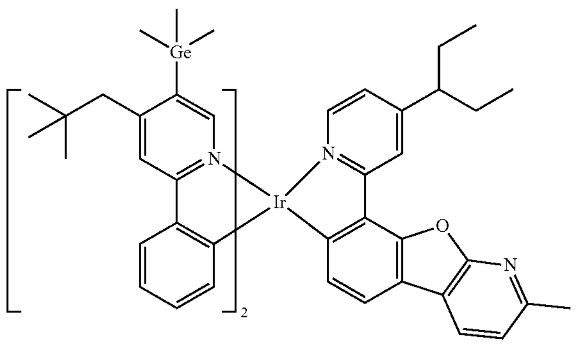
832
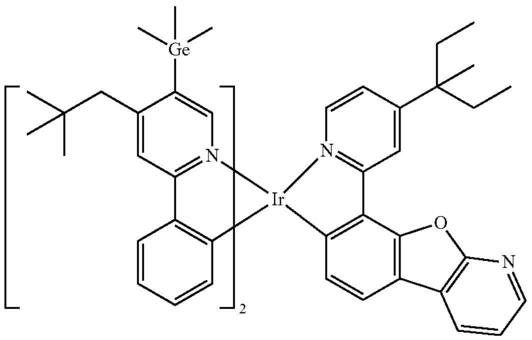
833
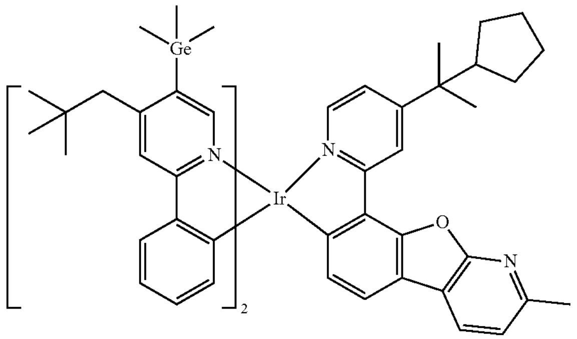
834
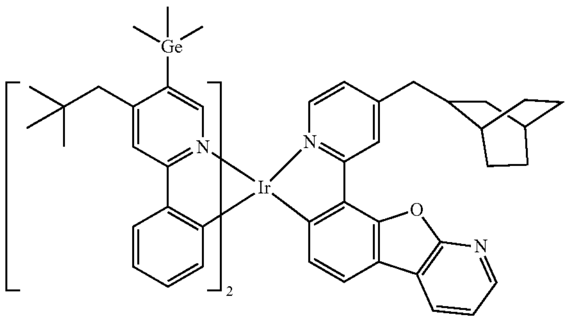
-continued
835
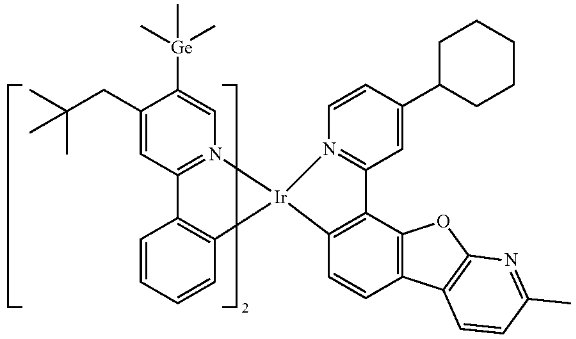
836
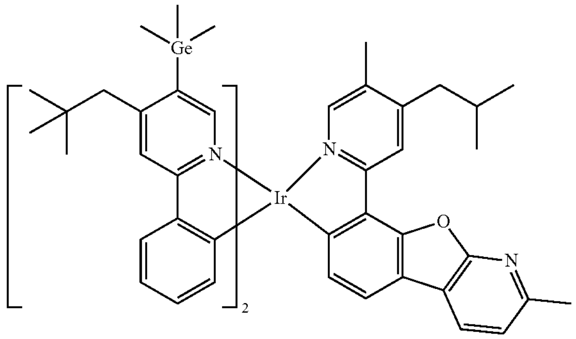
837
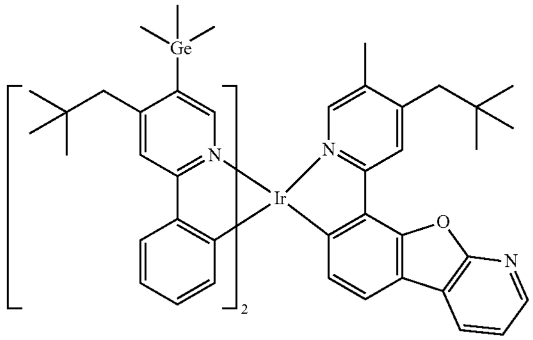
838
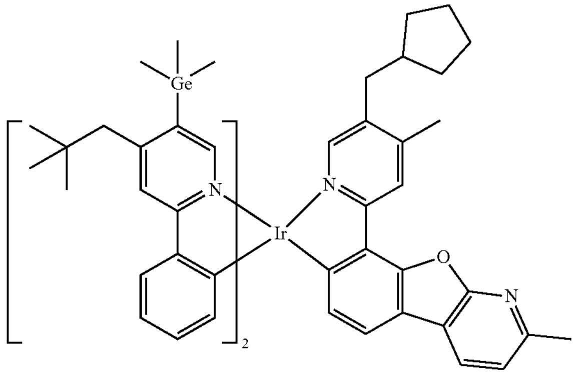

-continued
839
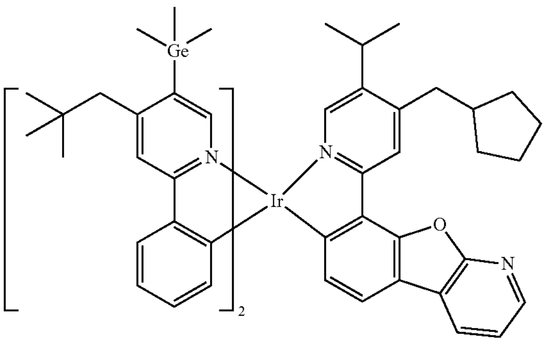
840
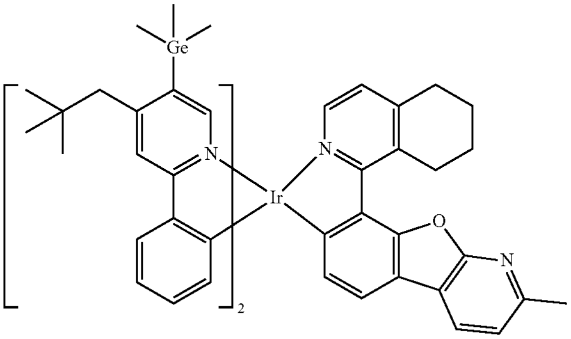
1301
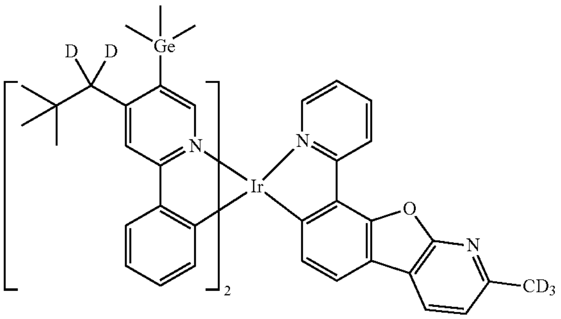
1302
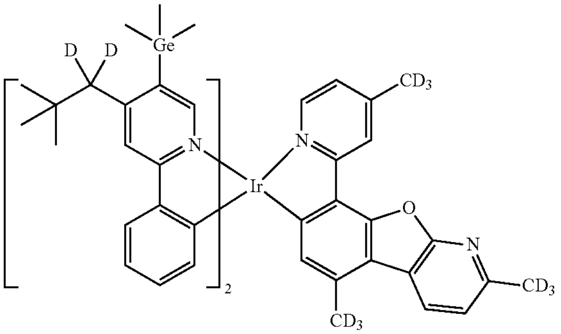
-continued
1303
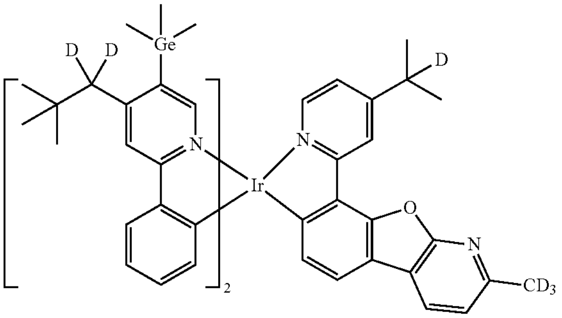
1304
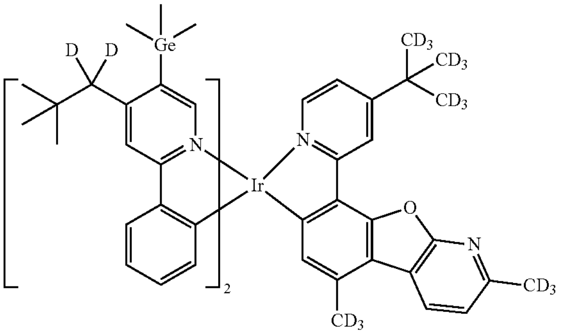
1305
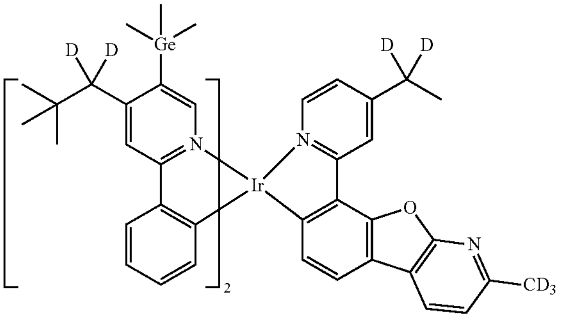
1306
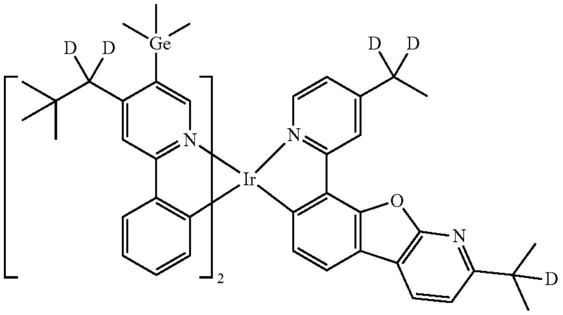

-continued
1307
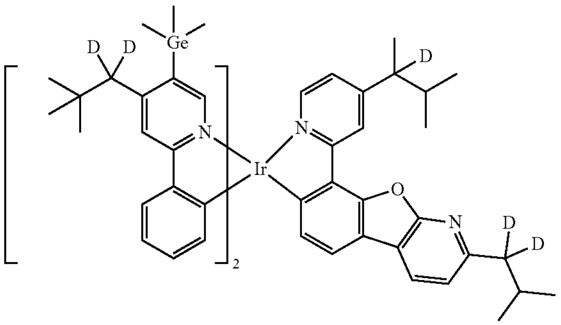
1308
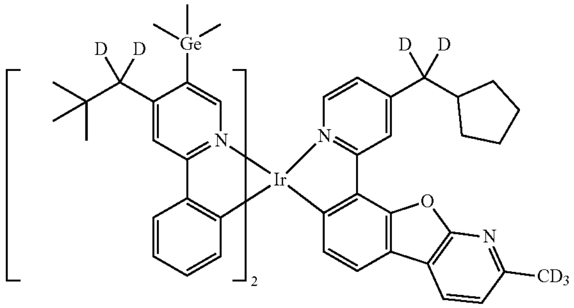
1309
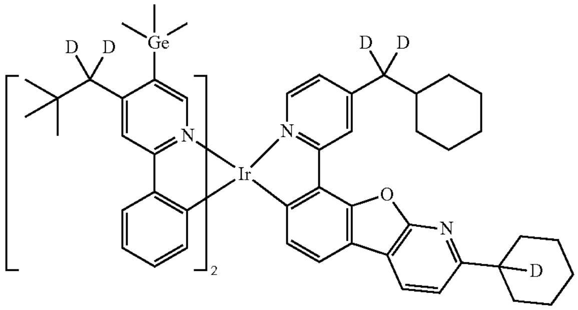
1310
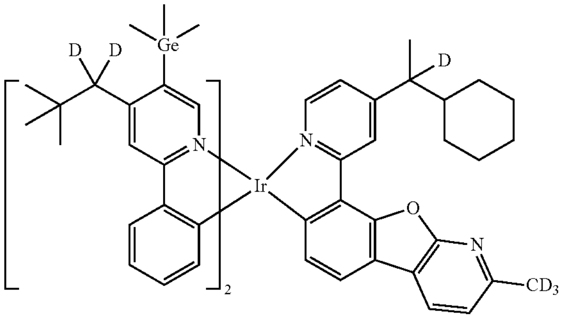
-continued
1311
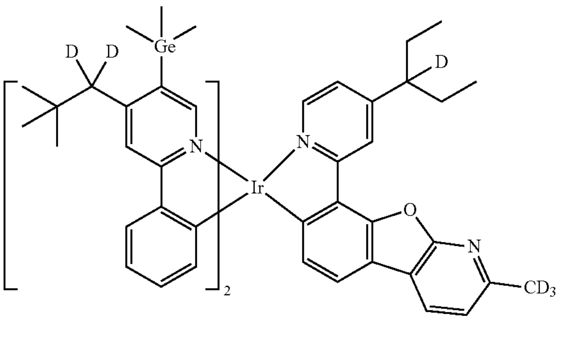
1312
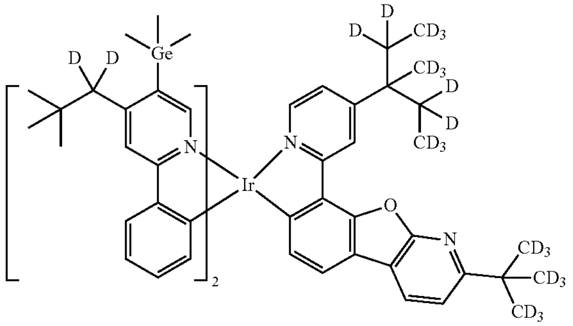
1313
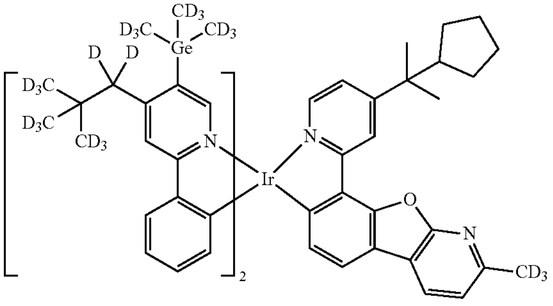
1314
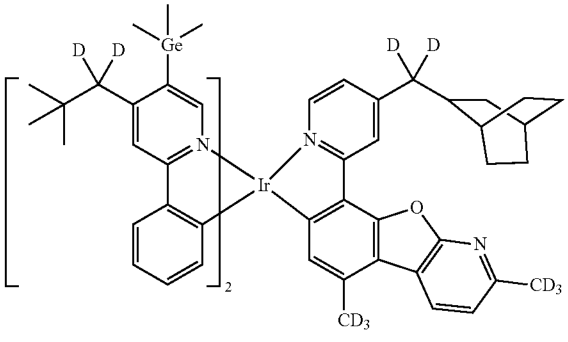

-continued
1315
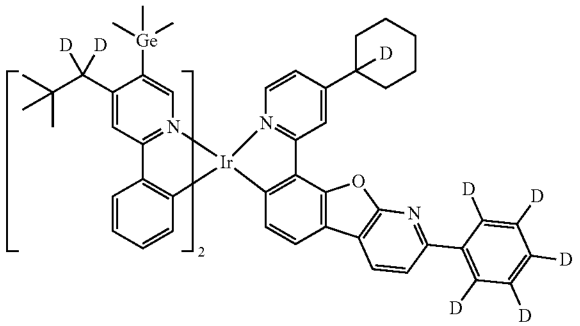
1316
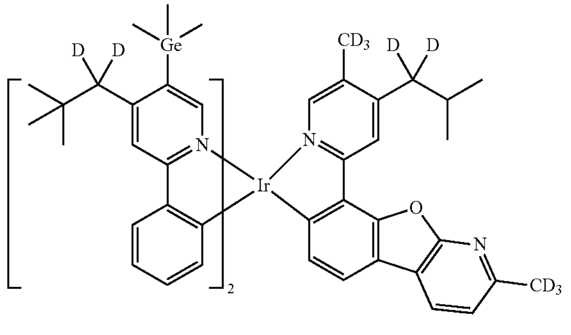
1317
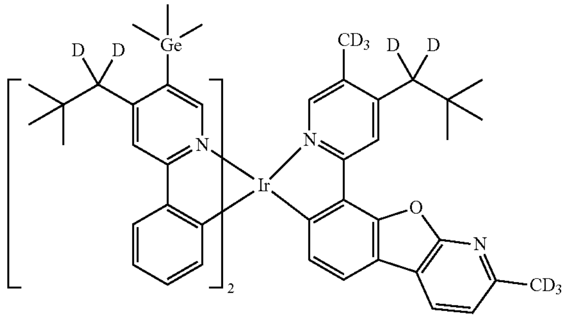
1318
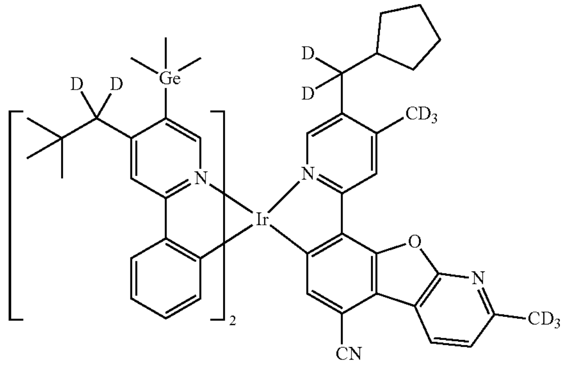
-continued
1319
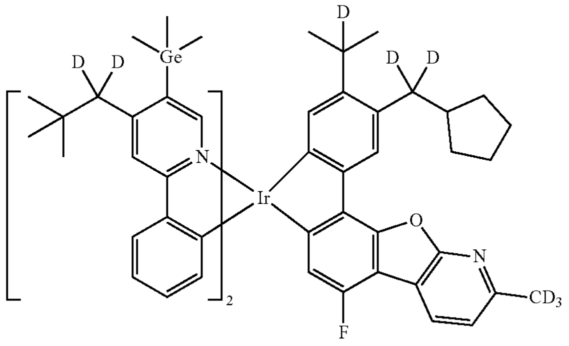
1320
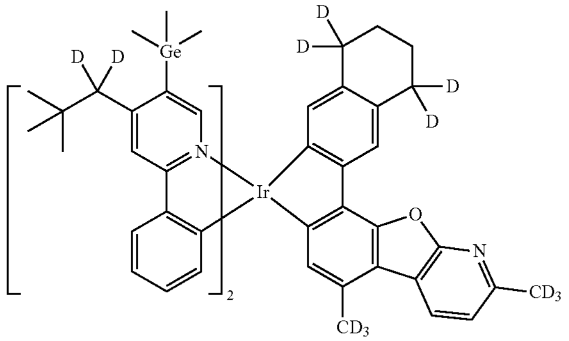
1321
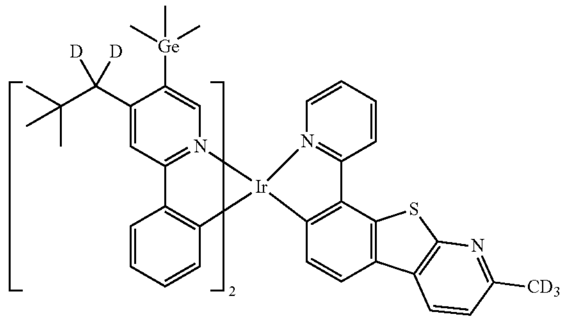
1322
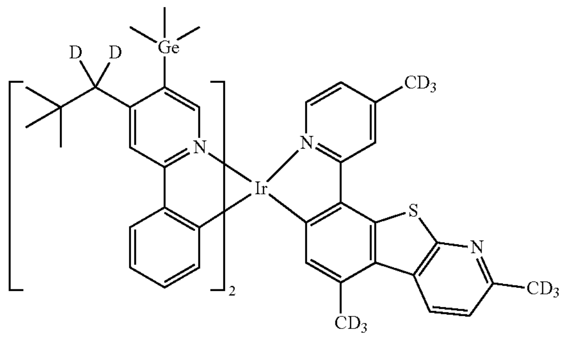

-continued
1323
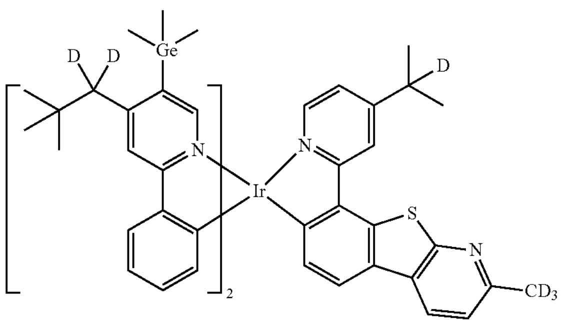
1324
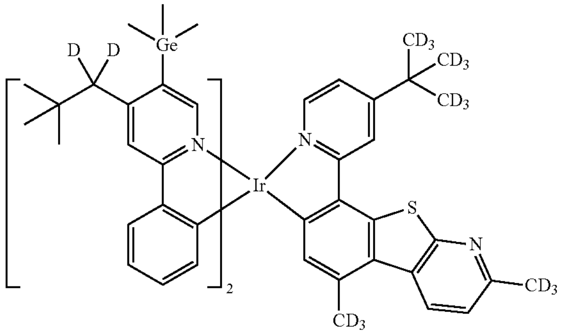
1325
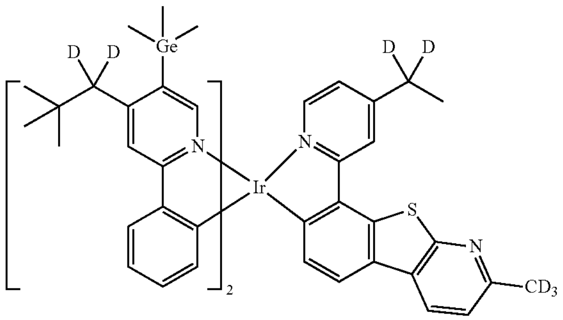
1326
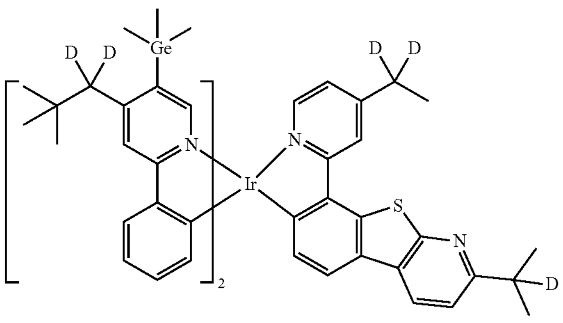
-continued
1327
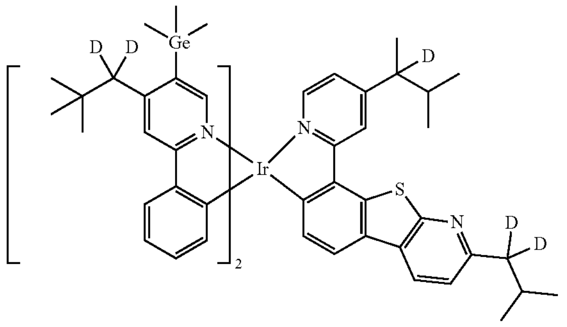
1328
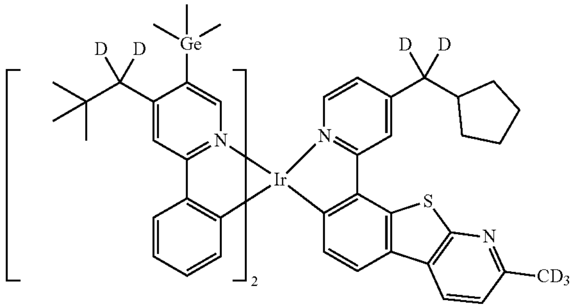
1329
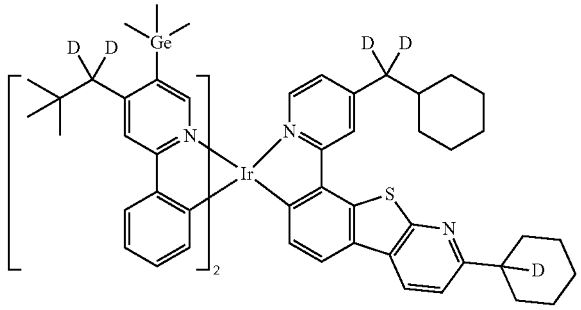
1330
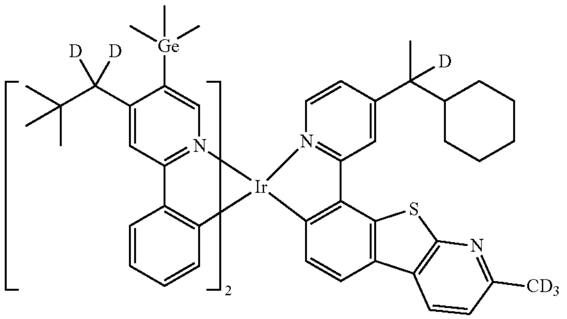

-continued
1331
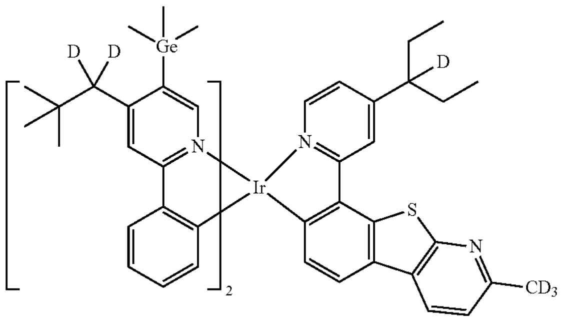
1332
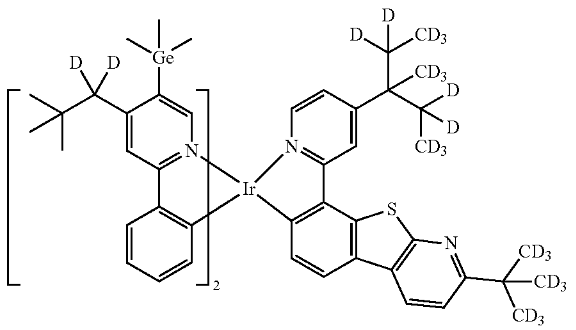
1333
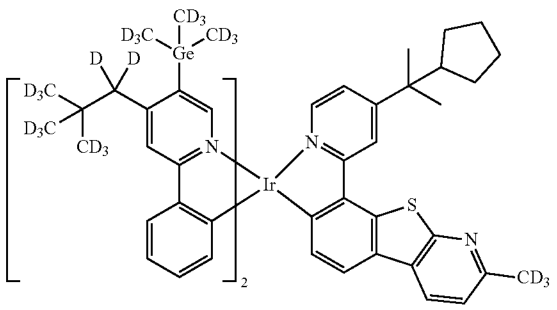
1334
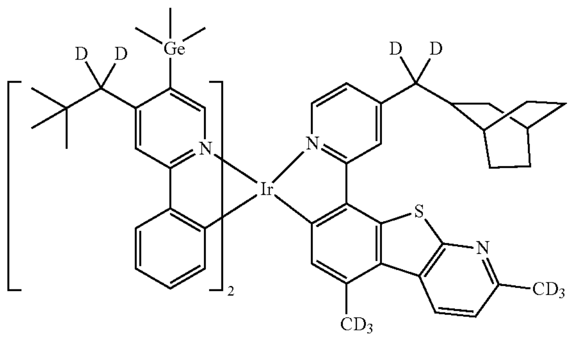
-continued
1335
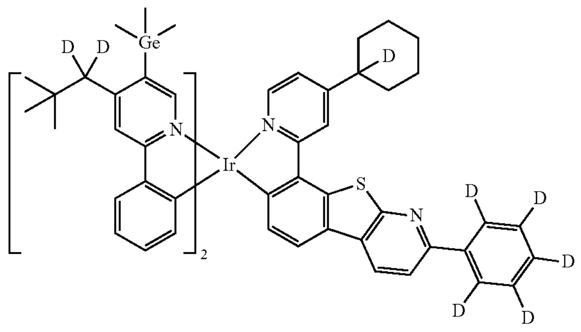
1336
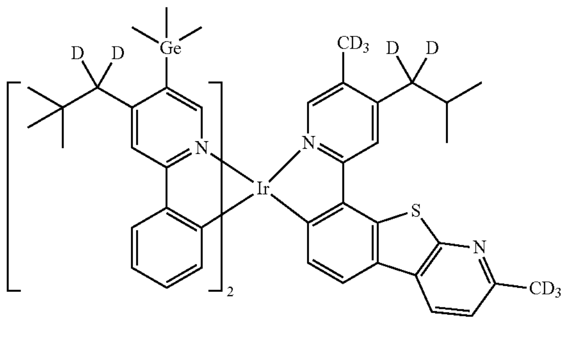
1337
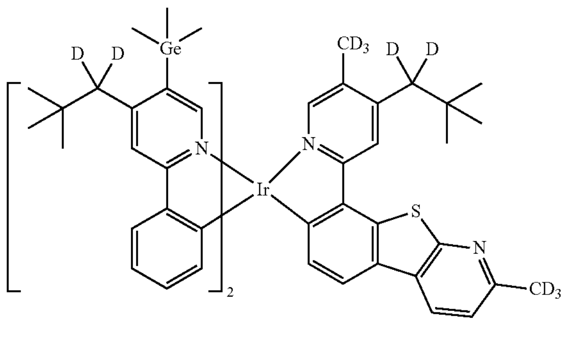
1338
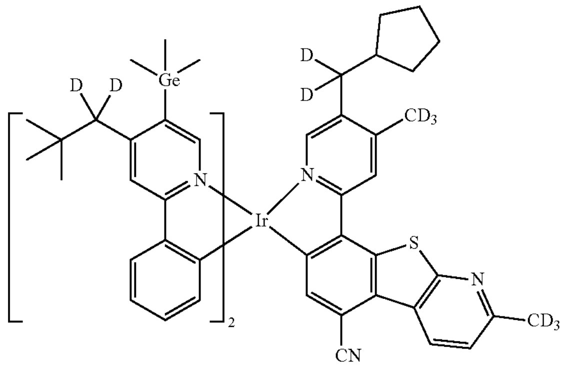

-continued
1339
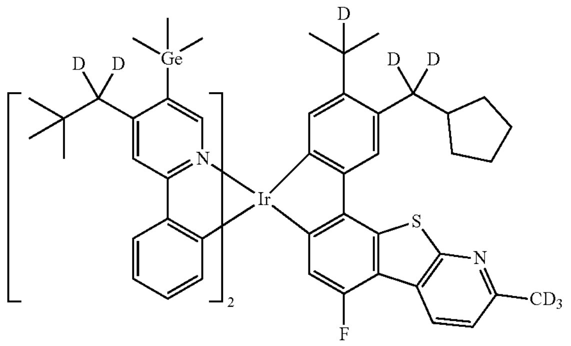
1340
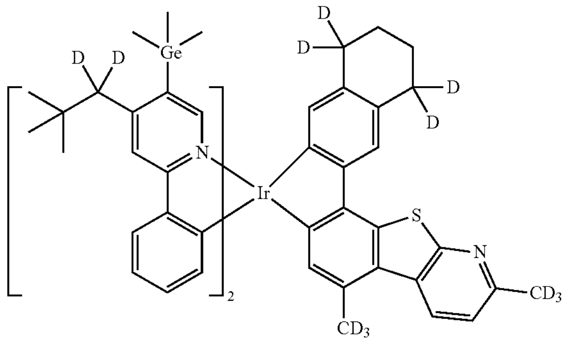
Group 2-3
1
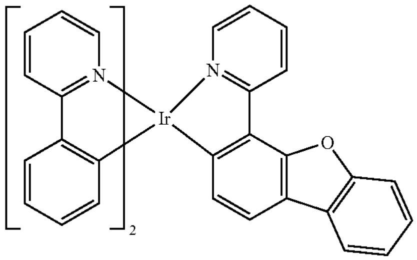
2
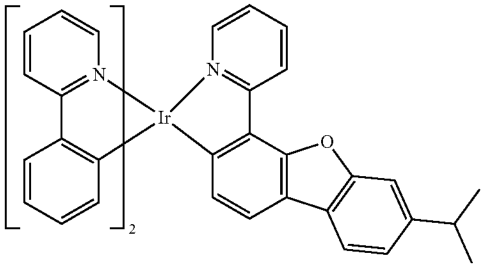
3
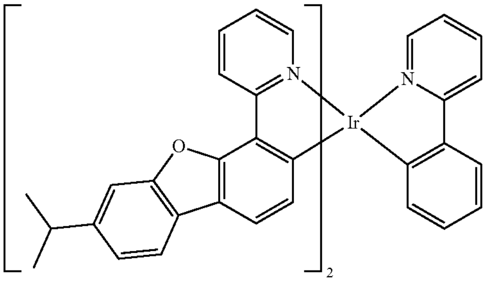
-continued
4
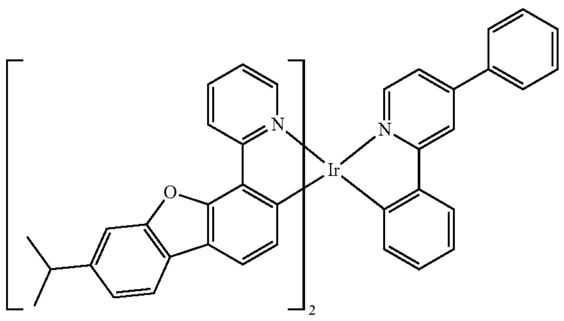
5
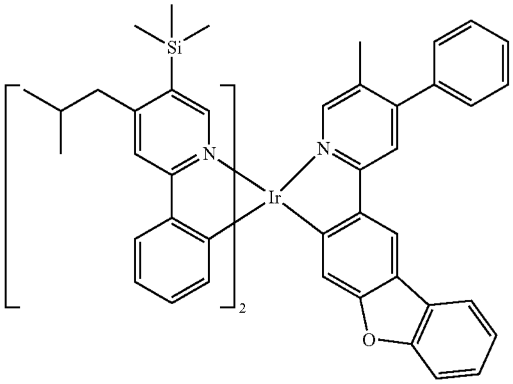
6
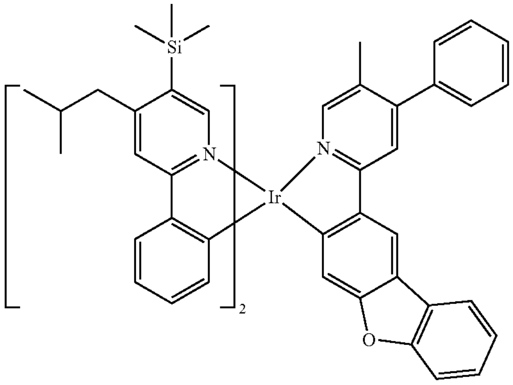
7
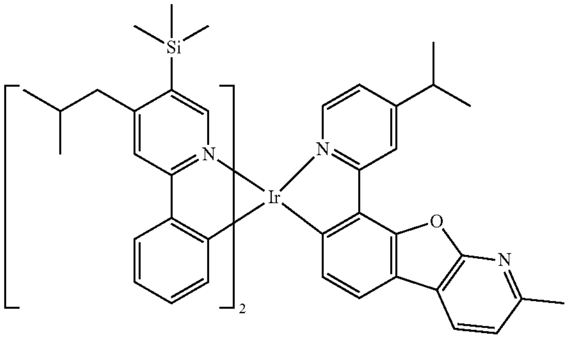

-continued
8
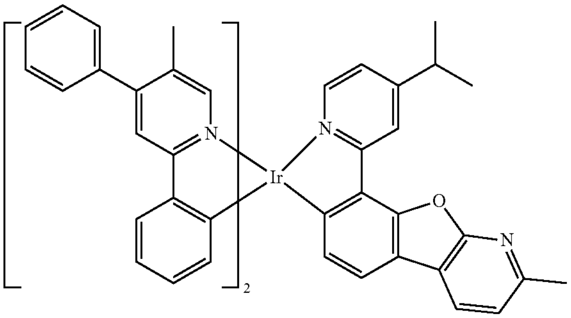
9
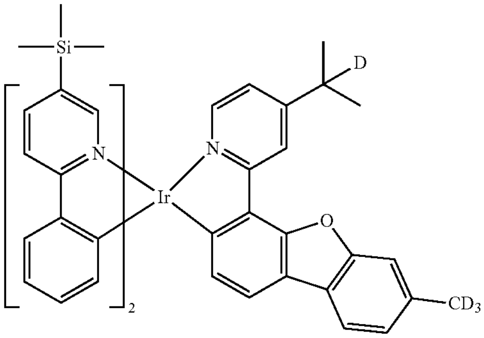
10
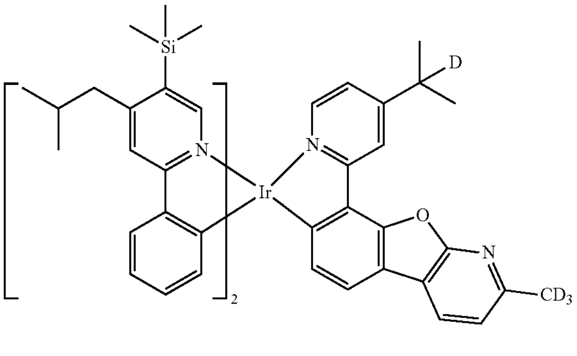
11
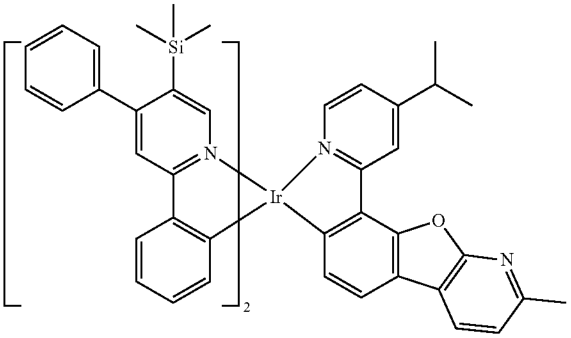
-continued
12
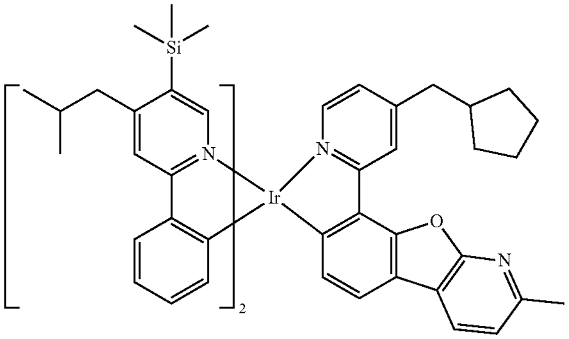
13
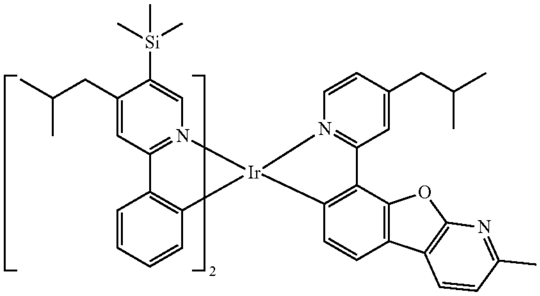
14
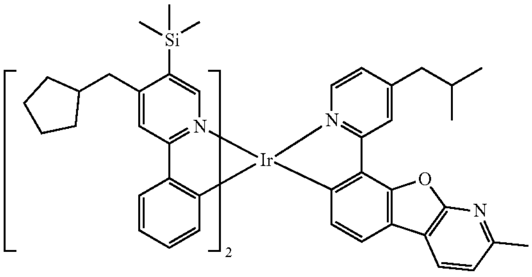
15
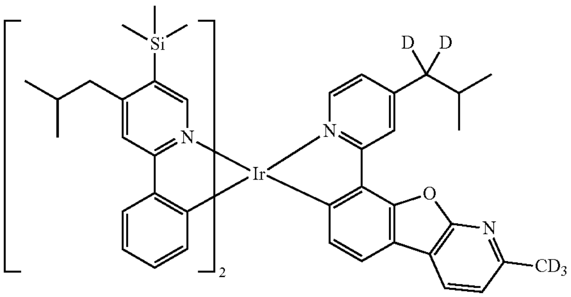

-continued
16
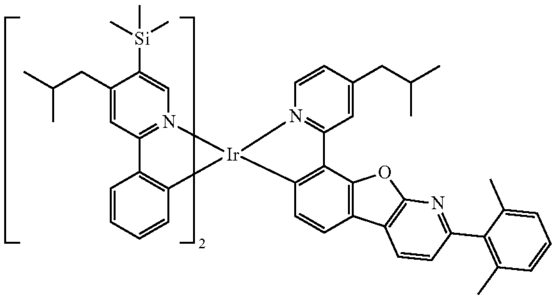
17
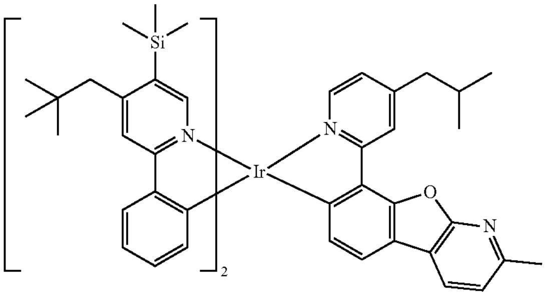
18
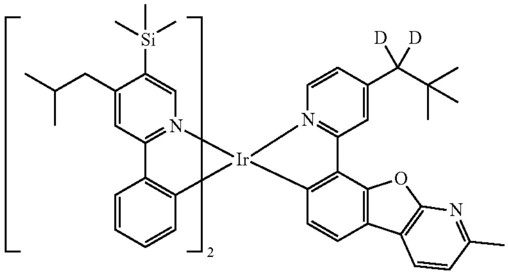
19
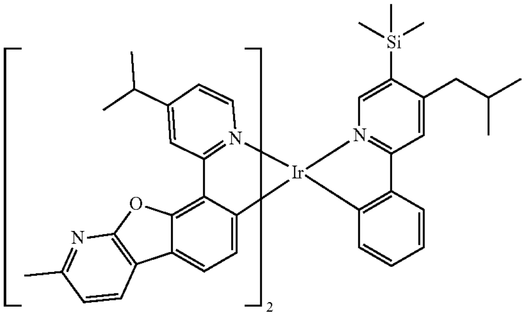
20
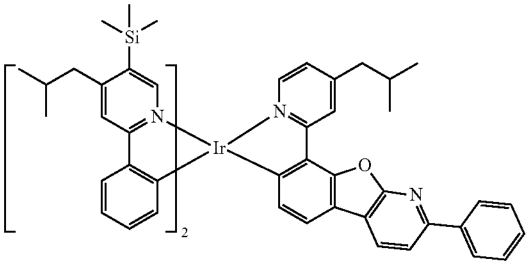
-continued
21
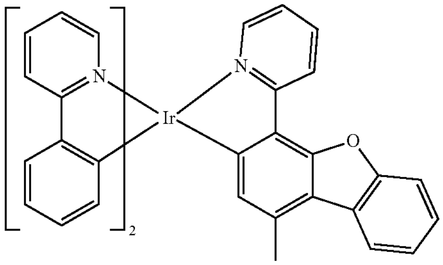
22
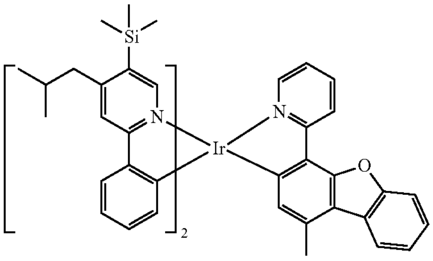
23
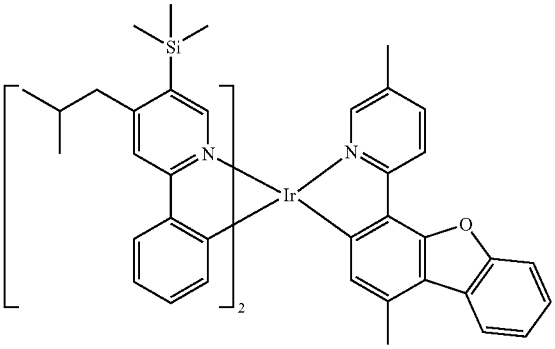
24
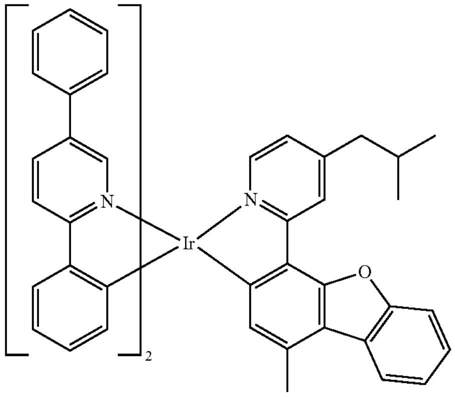
25
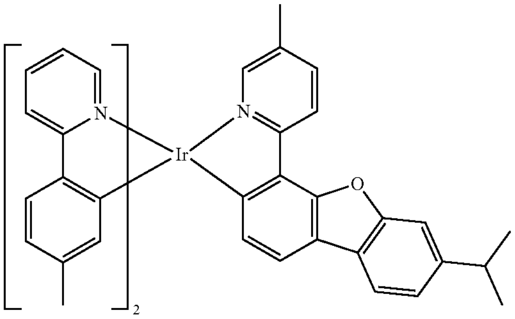

-continued
26
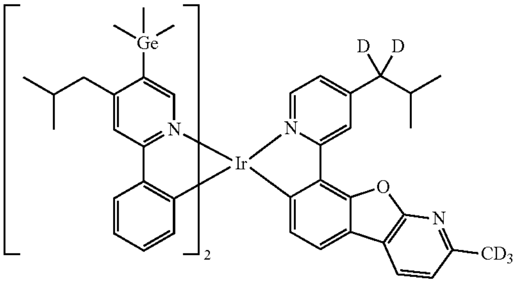
27
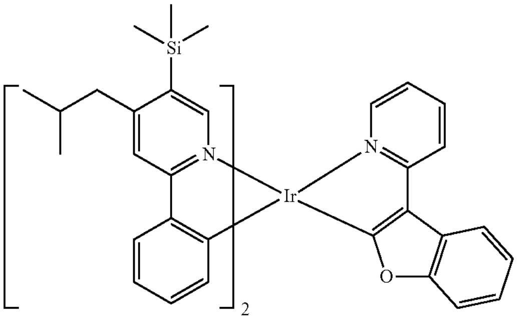
28
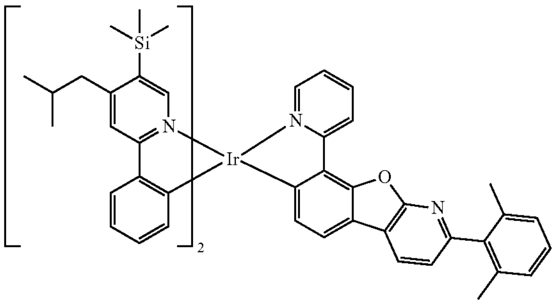
29
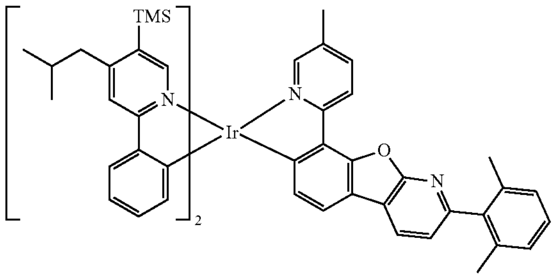
30
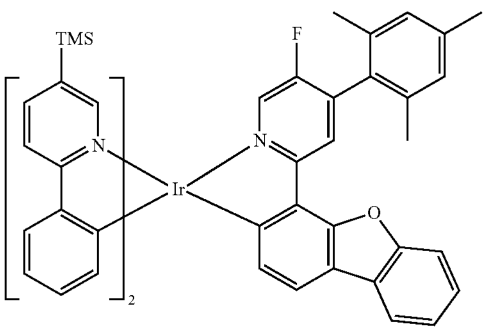
-continued
31
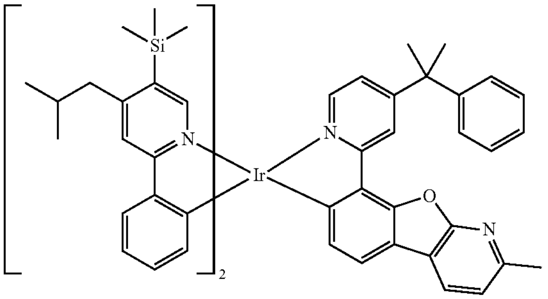
32
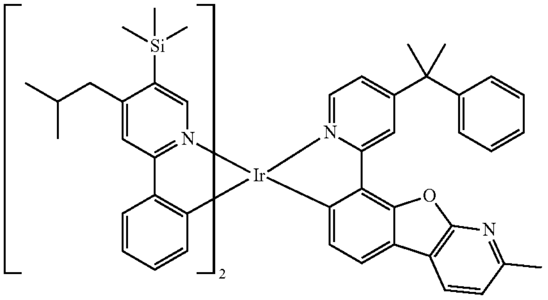
33
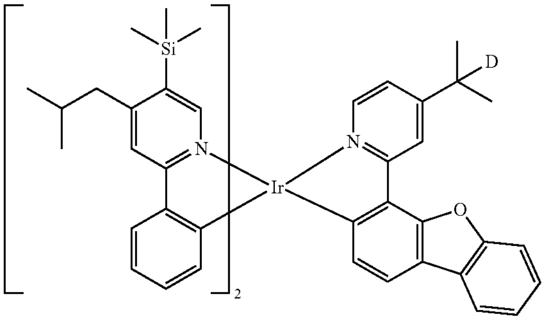
34
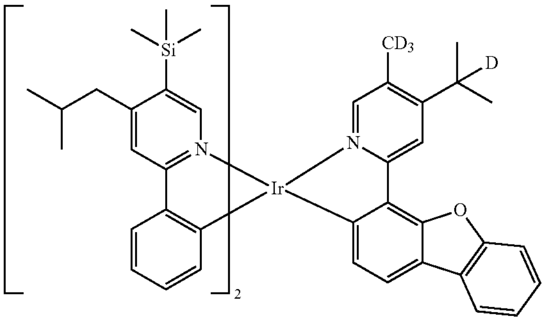
35
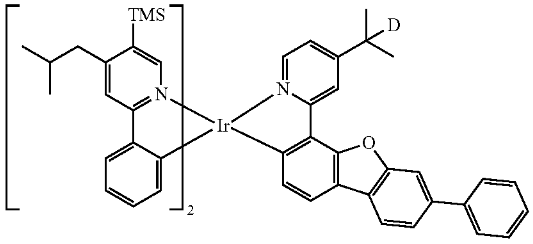

-continued
36
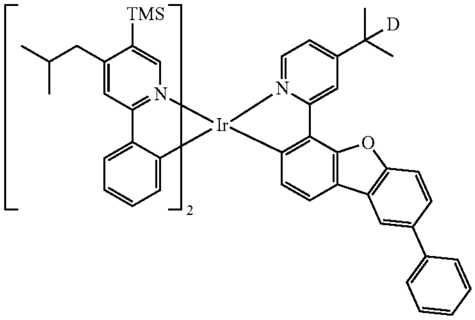
37
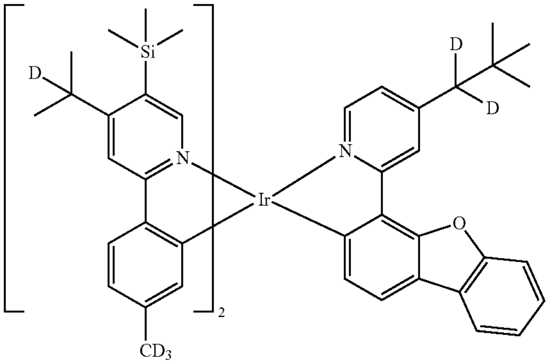
38
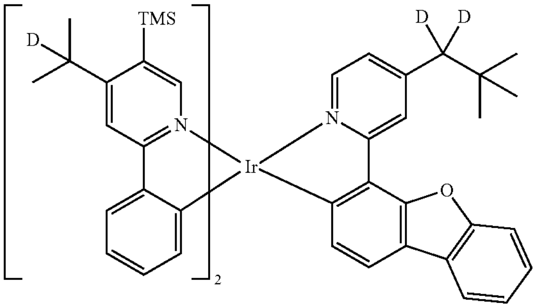
39
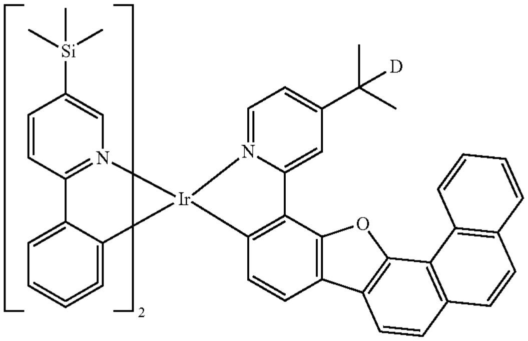
-continued
40
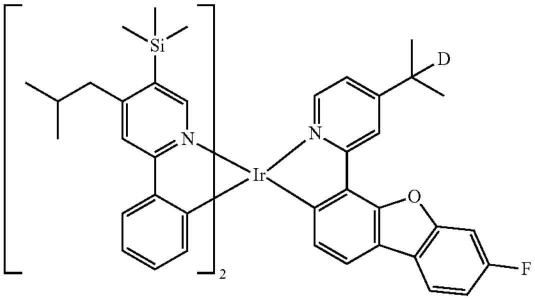
41
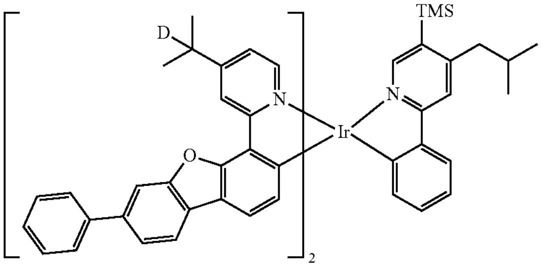
42
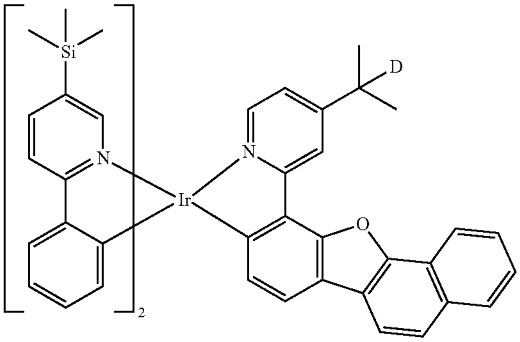
43
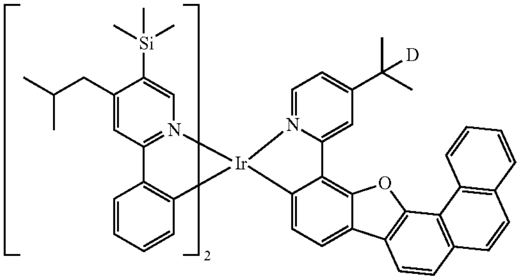
44
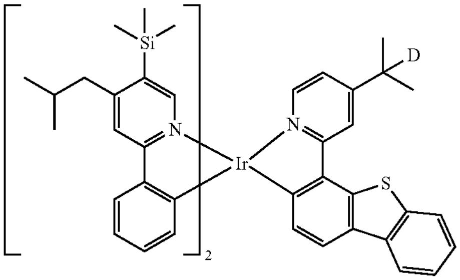

-continued
45
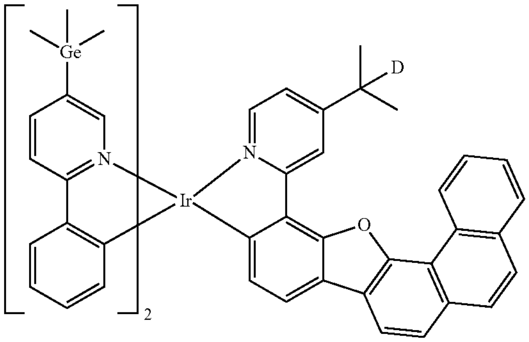
46
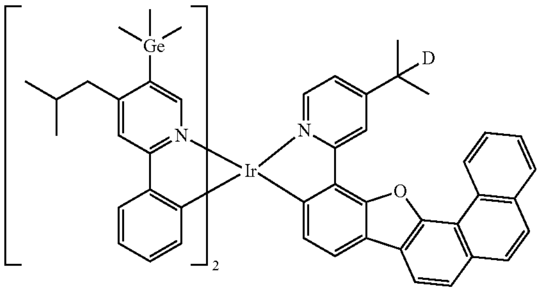
47
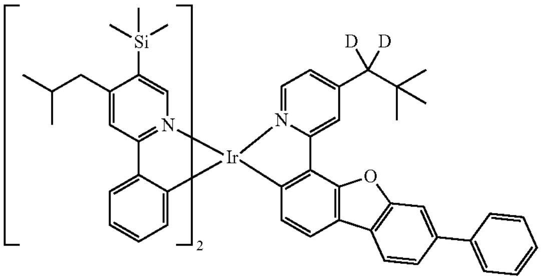
48
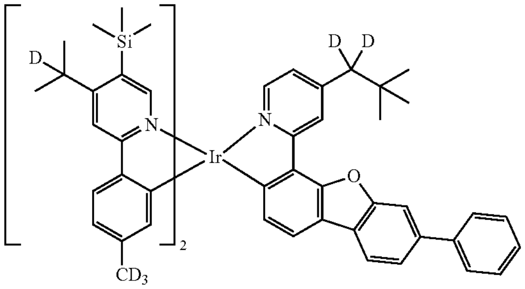
49
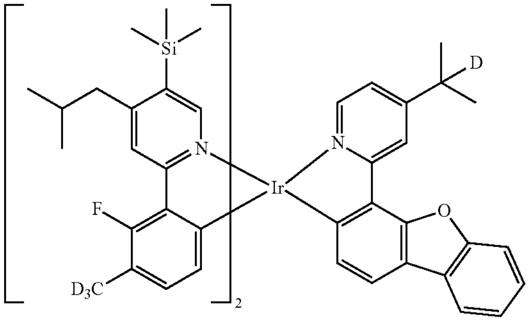
-continued
50
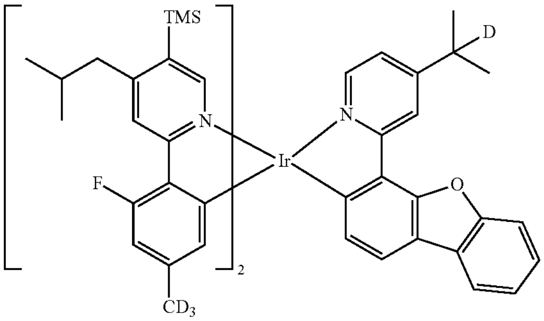
51
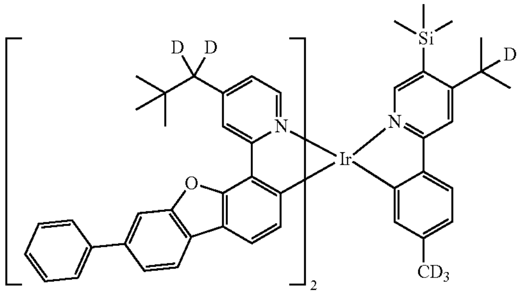
52
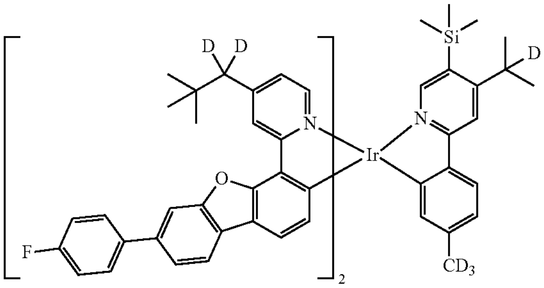
53
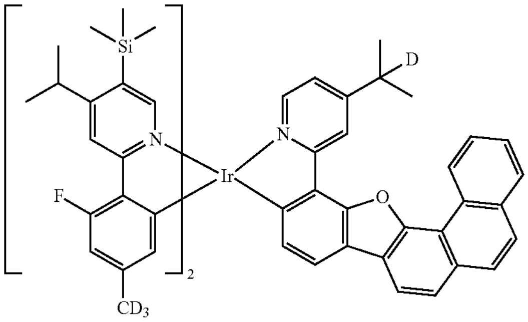
54
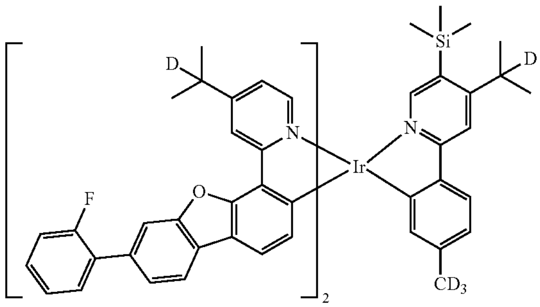

-continued
55
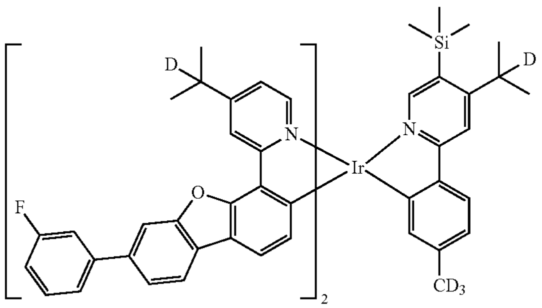
56
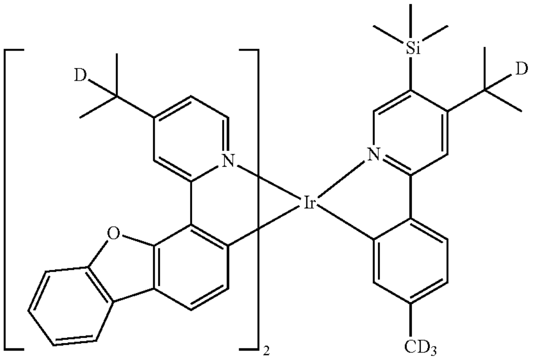
57
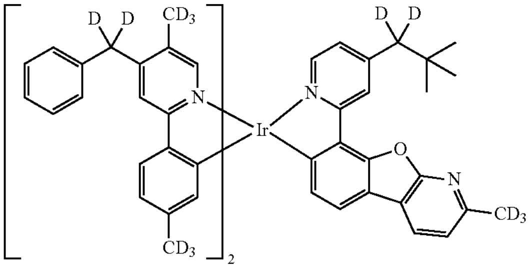
58
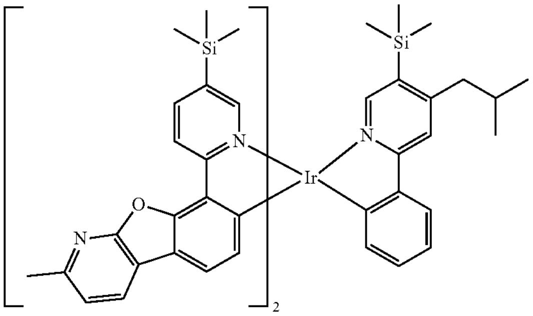
-continued
59
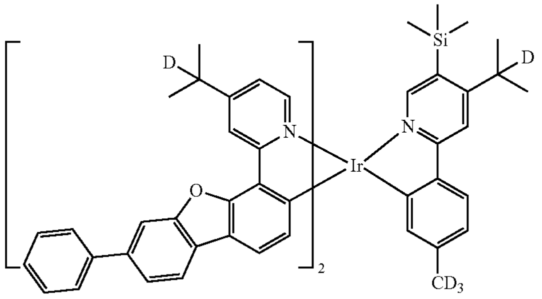
60
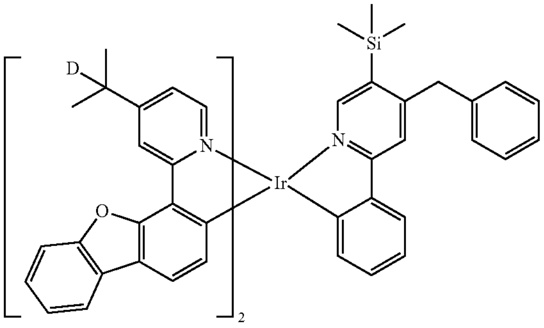
61
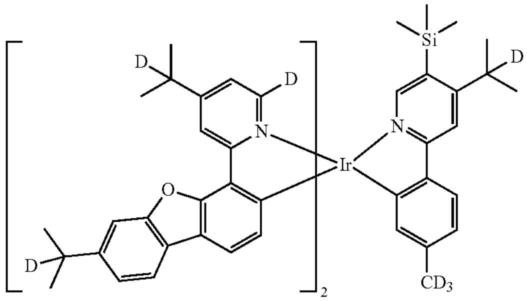
62
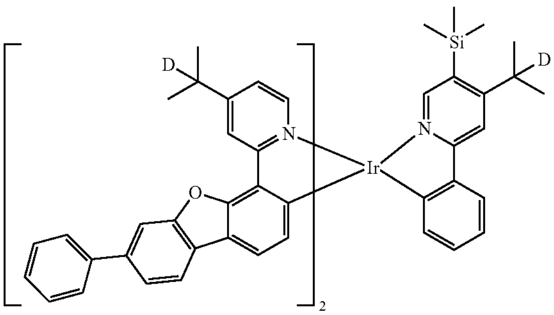

-continued
63
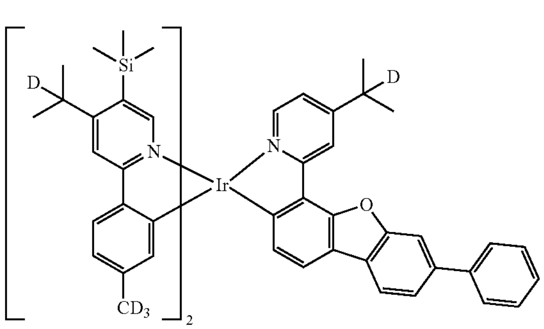
64
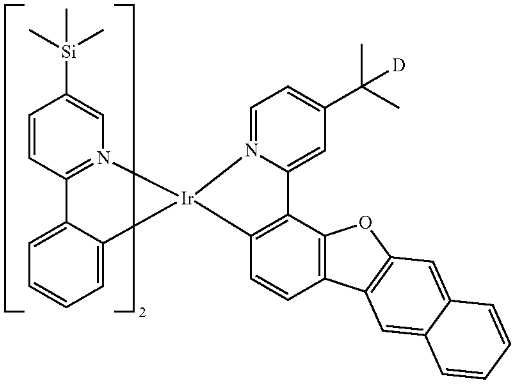
65
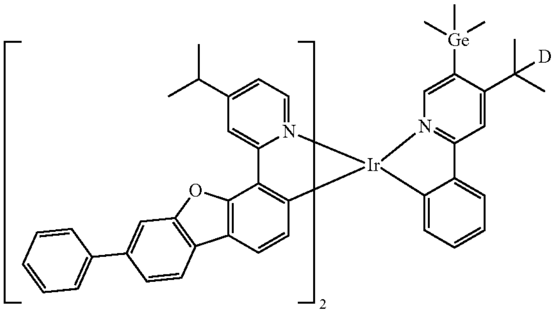
66
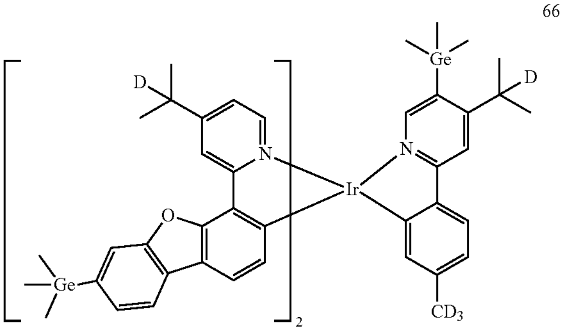
-continued
67
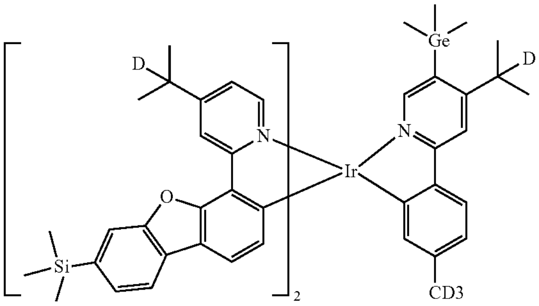
68
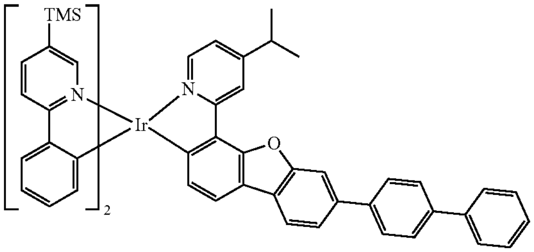
69
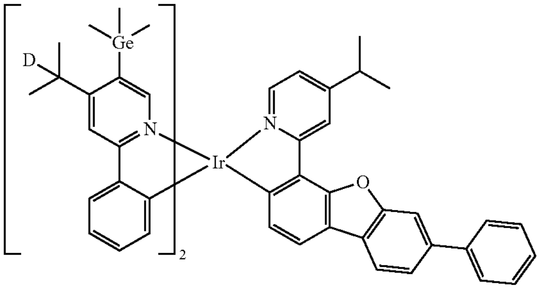
70
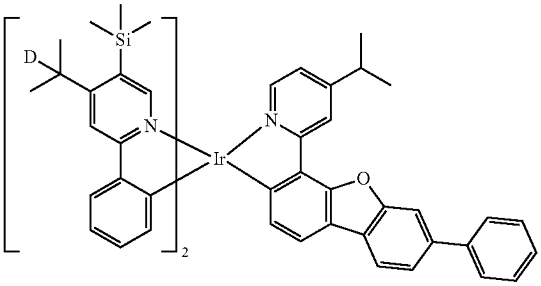
71
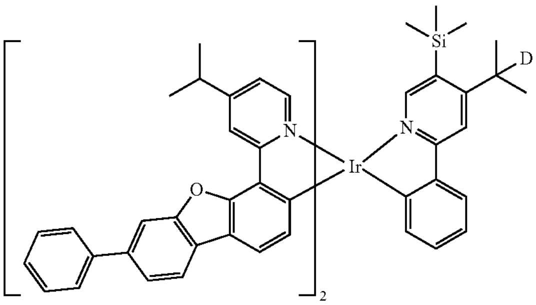

-continued
72
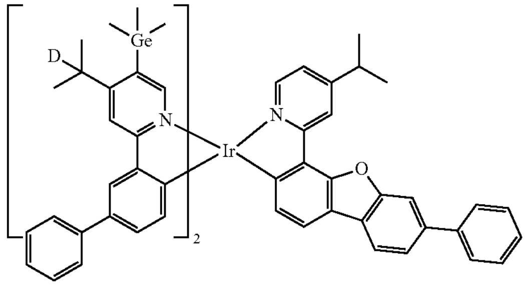
73
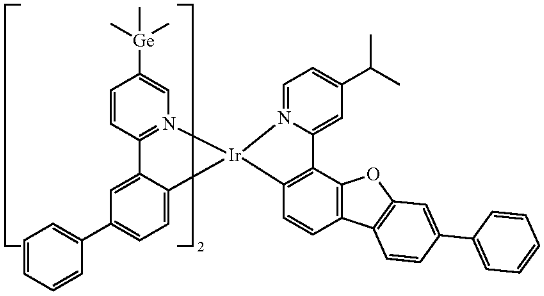
74
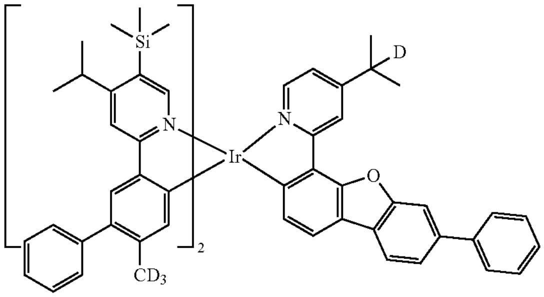
75
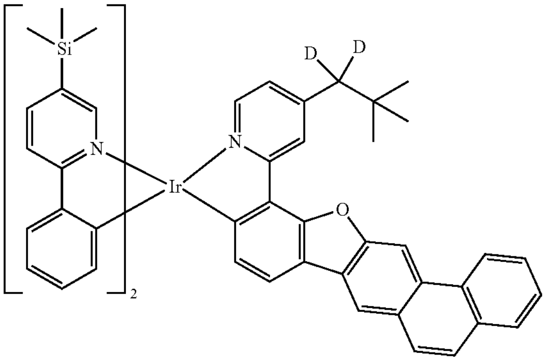
76
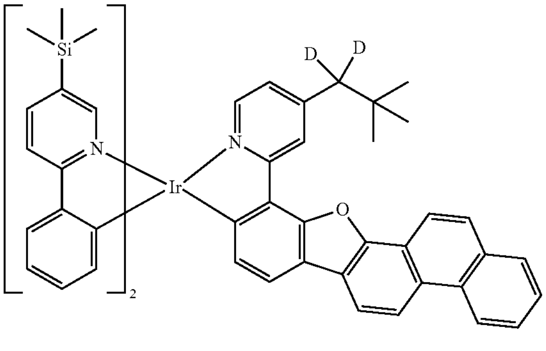
-continued
77
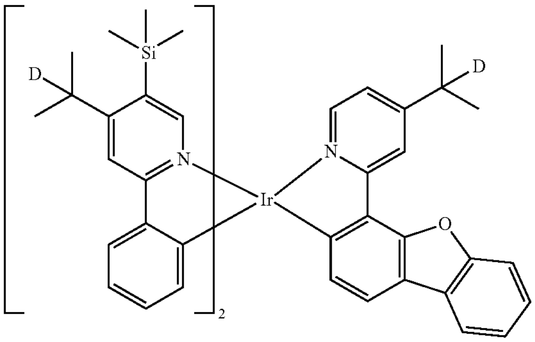
78
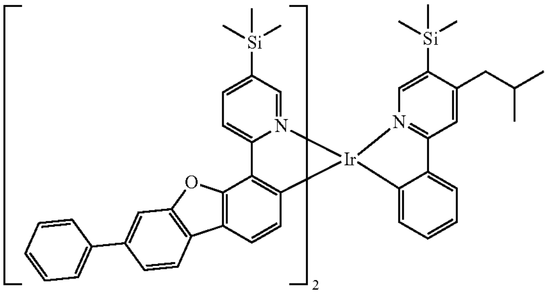
79
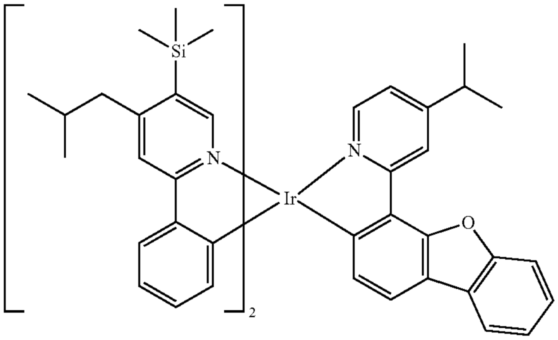
Group 2-4
37
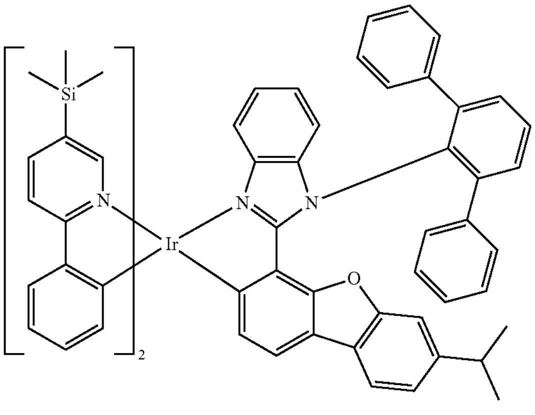

-continued
38
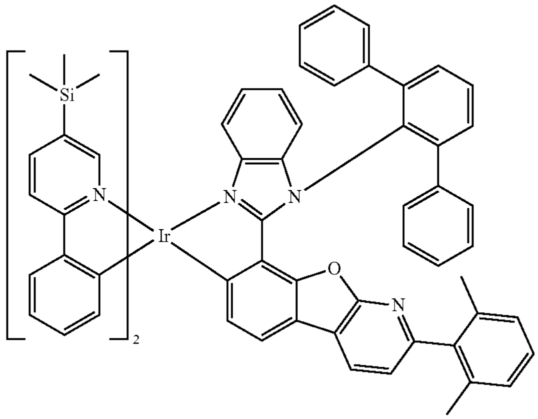
39
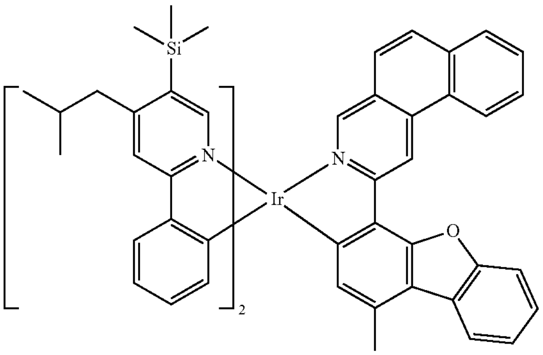
40
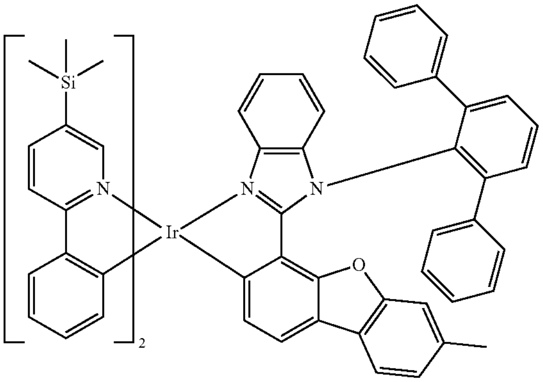
41
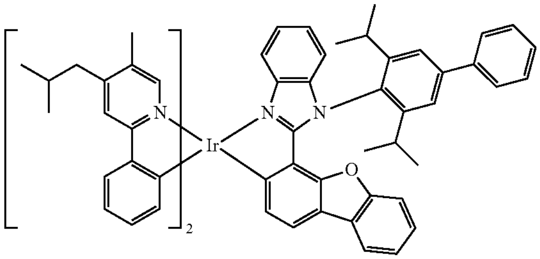
-continued
42
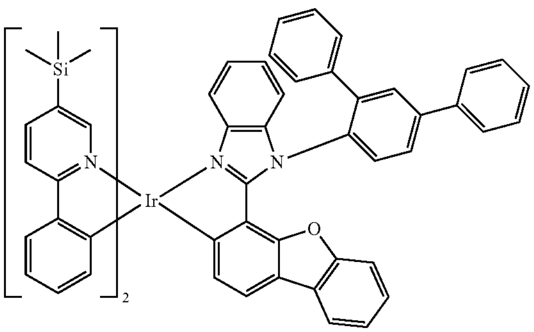
43
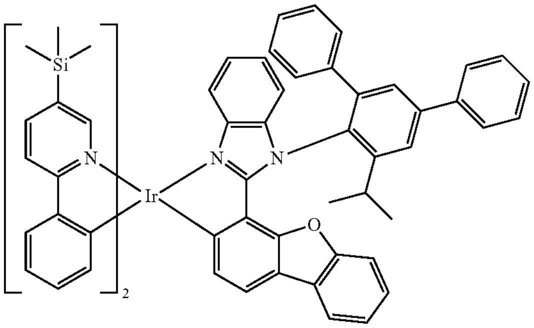
44
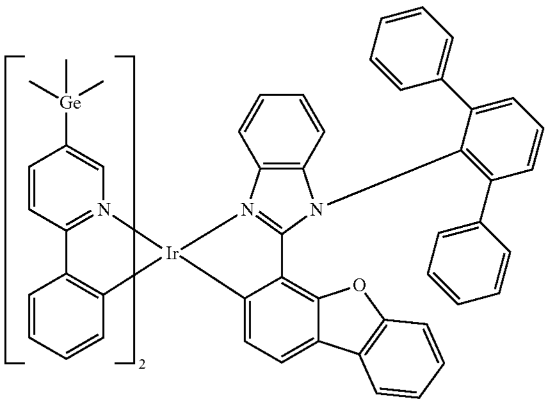
45
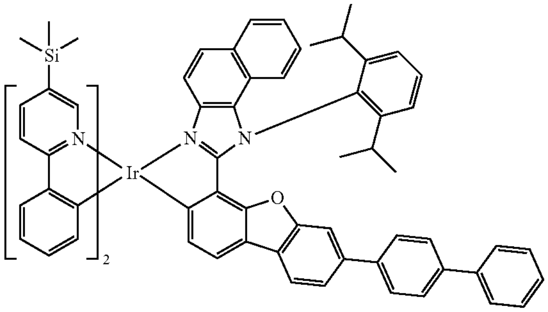

73
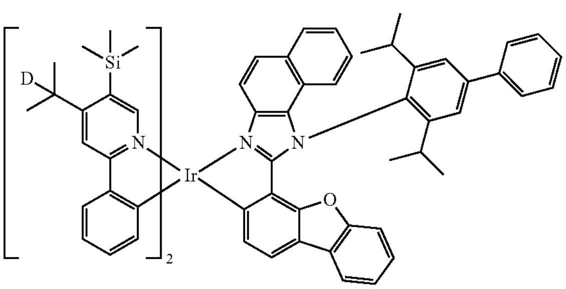
74
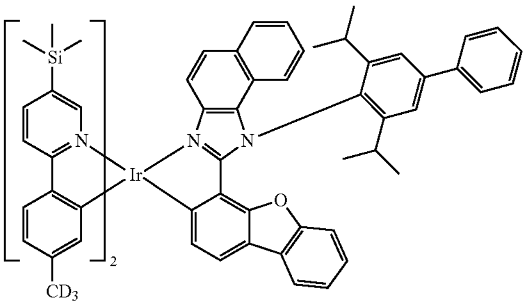
75
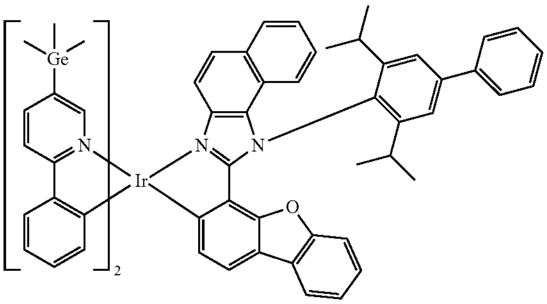
76
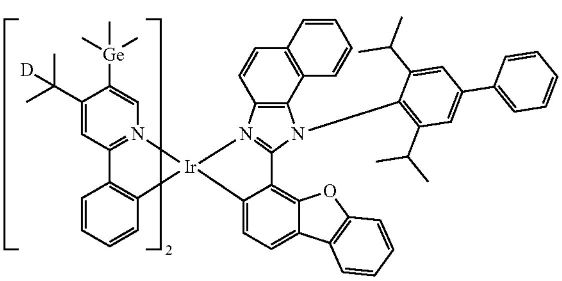
77
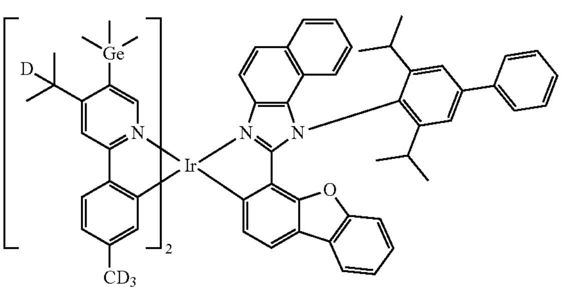
78
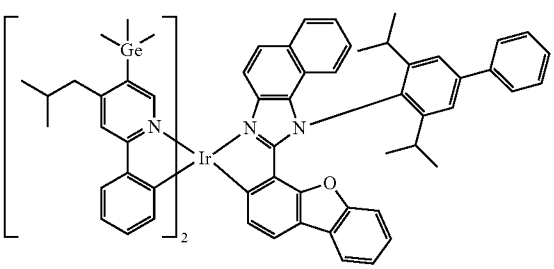
79
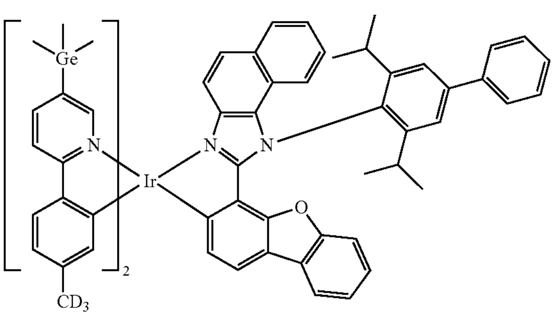
80
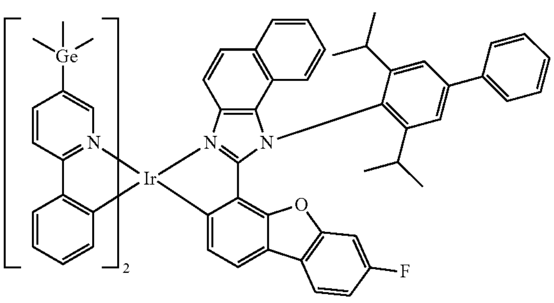
81
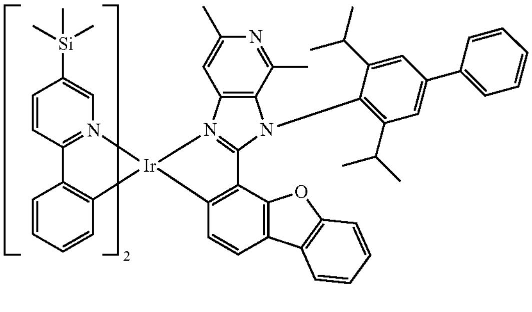

-continued
91
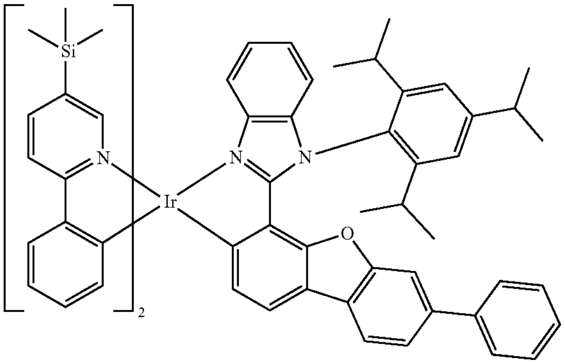
92
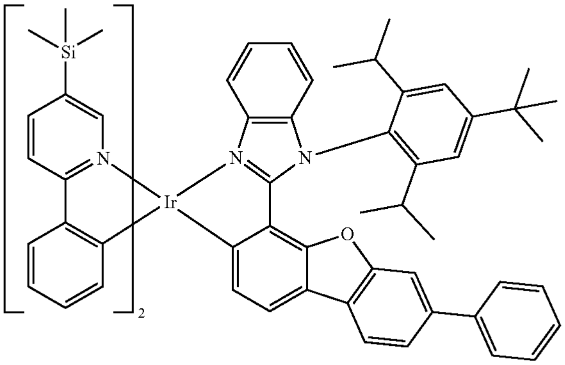
93
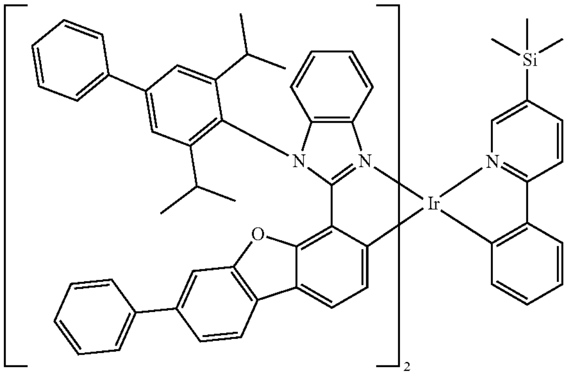
94
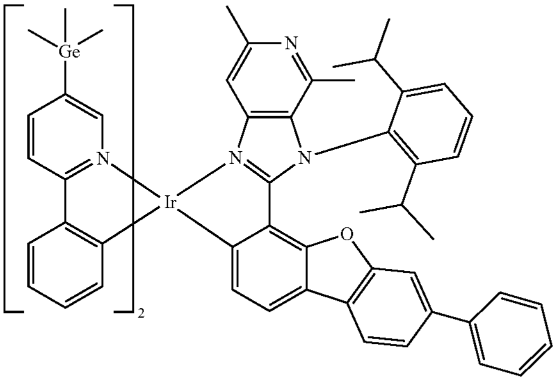
95
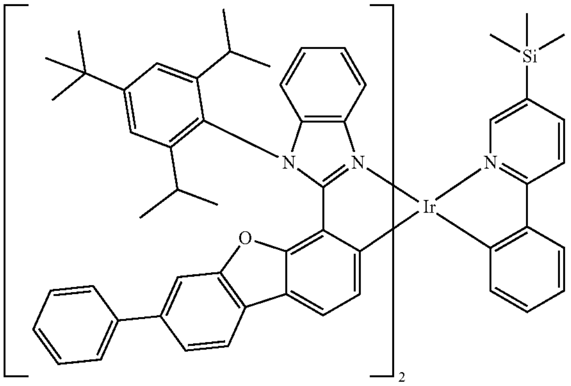
96
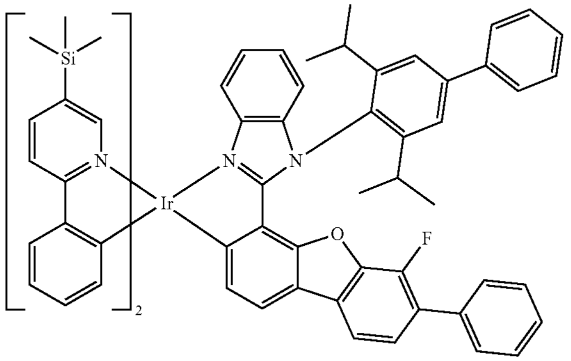
97
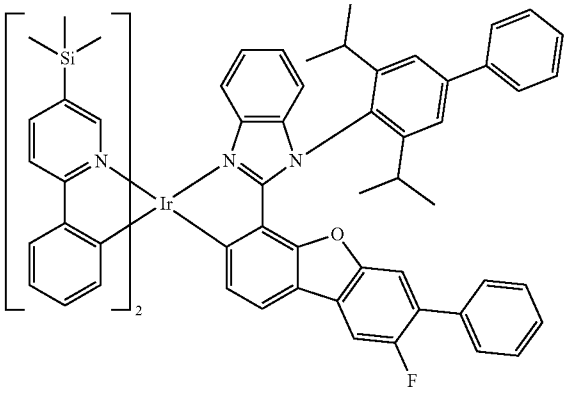
98
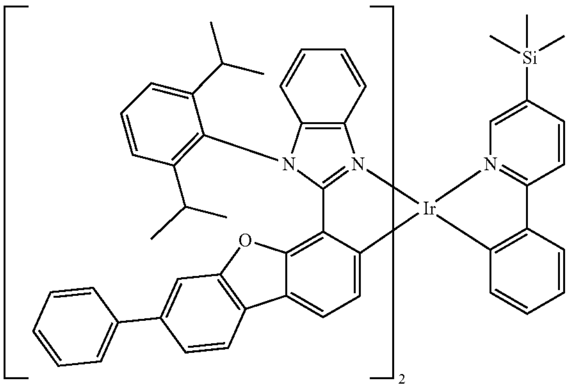

-continued
99
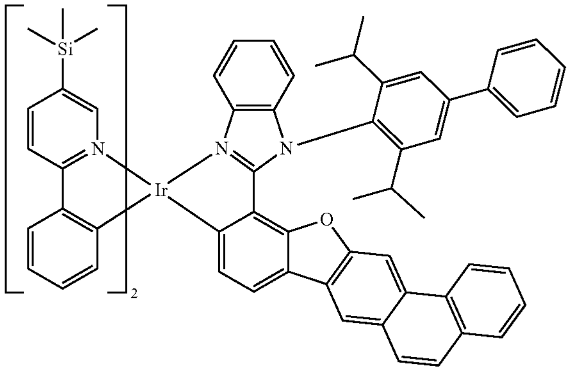
109
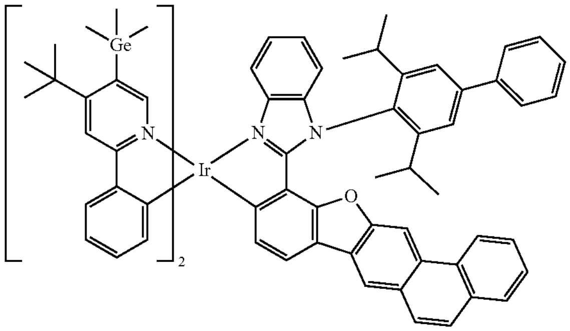
110
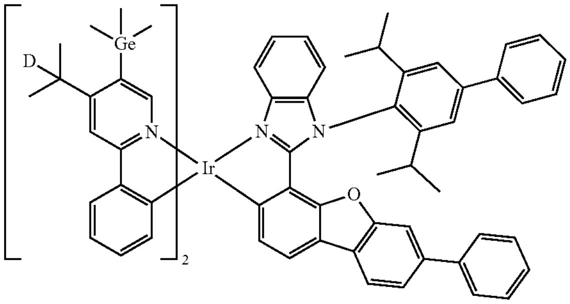
111
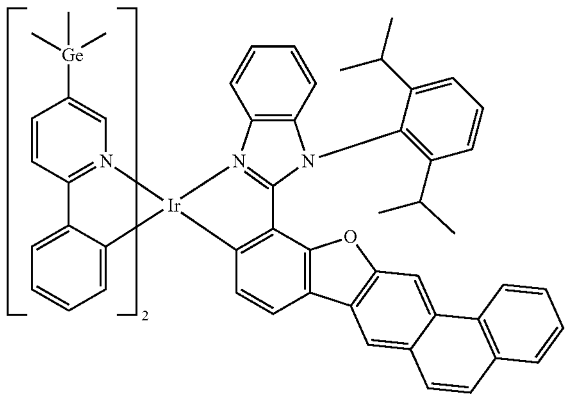
-continued
112
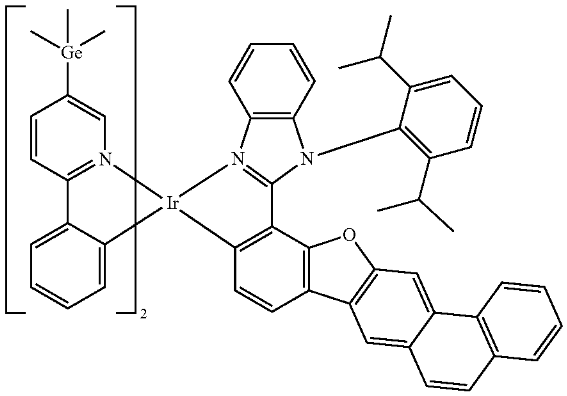
113
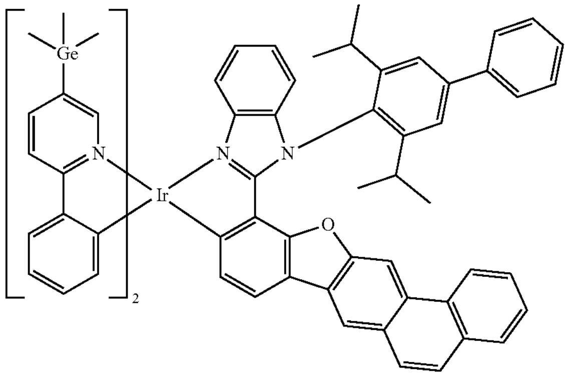
114
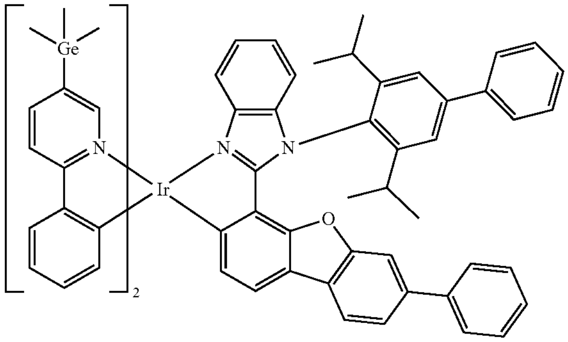
115
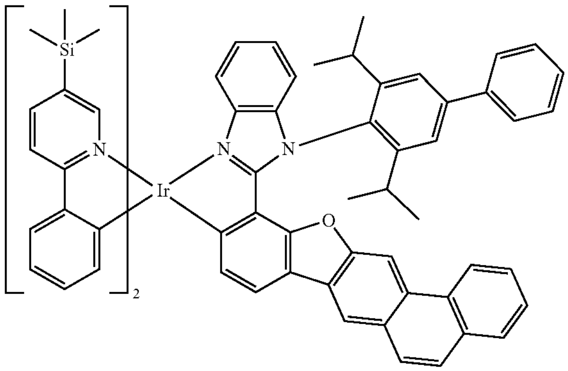

-continued
116
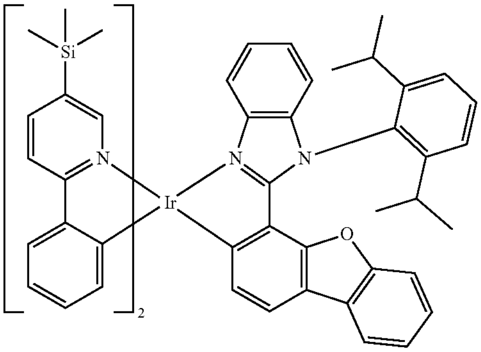
Group 2-5
1
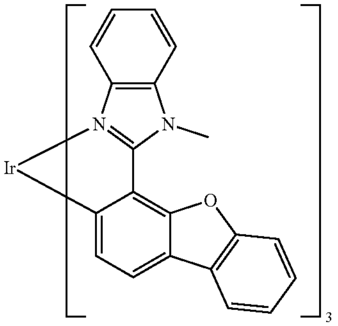
2
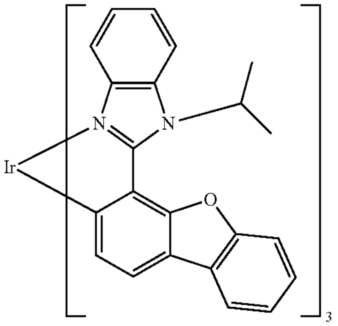
3
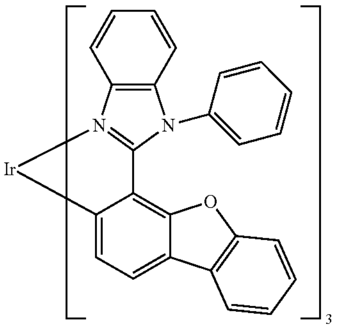
-continued
4
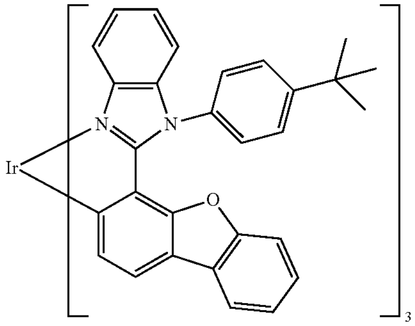
5
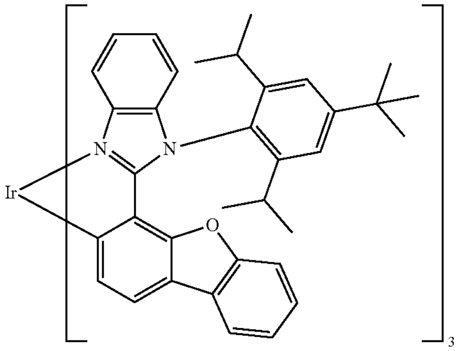
6
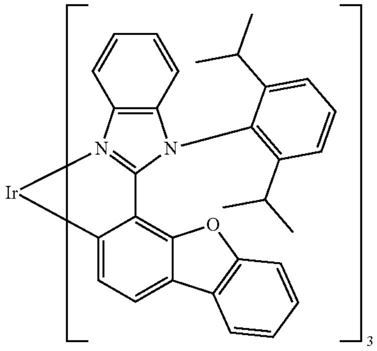
7
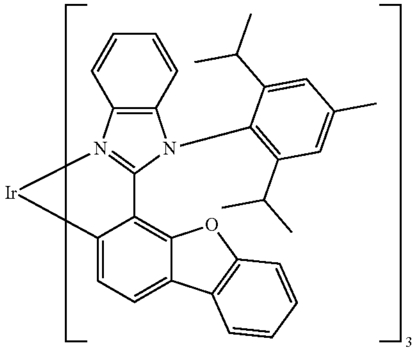

-continued
8
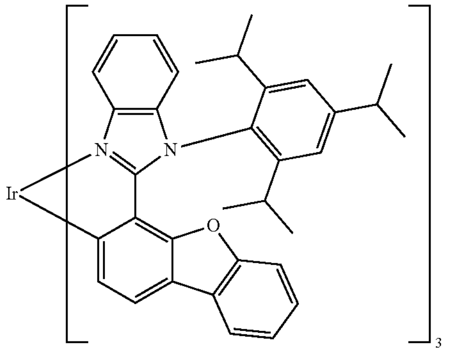
9
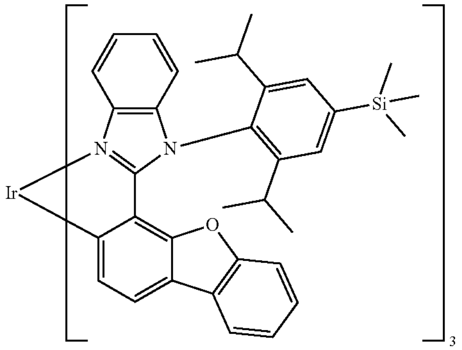
10
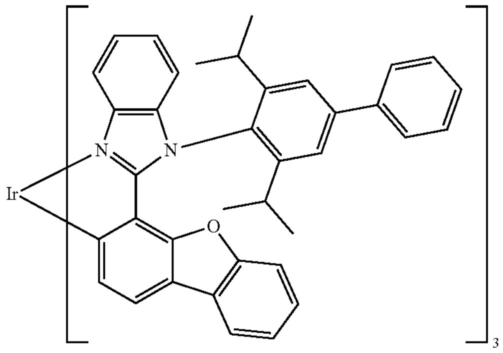
11
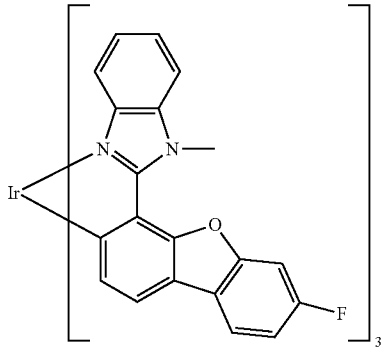
-continued
12
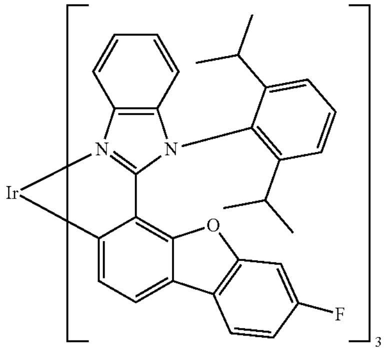
13
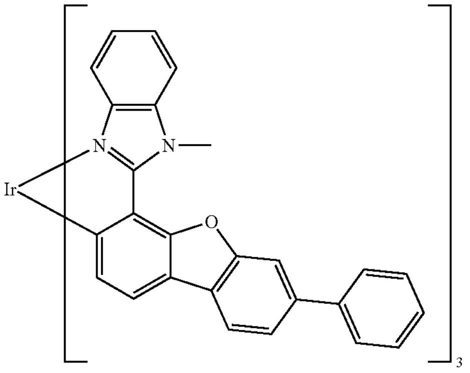
14
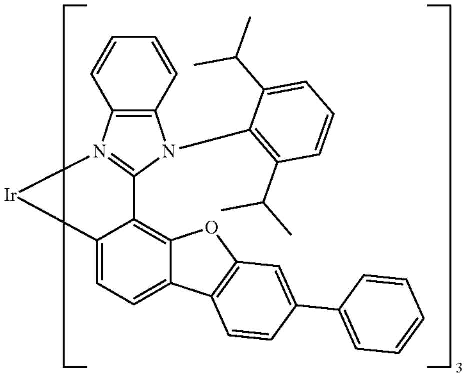
15
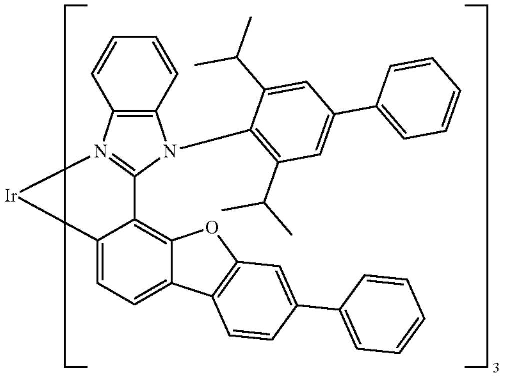

-continued
16
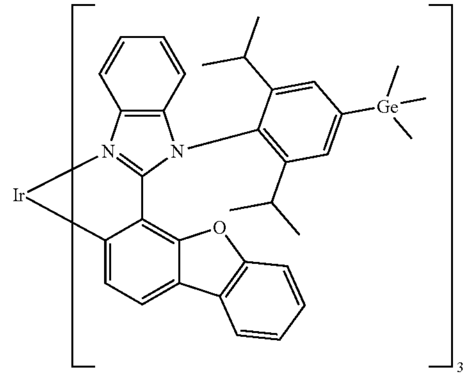
Group 2-6
1
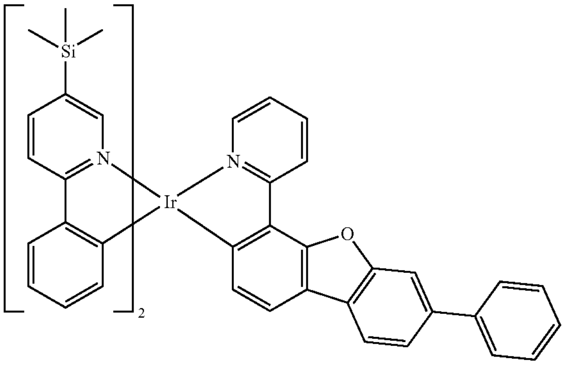
2
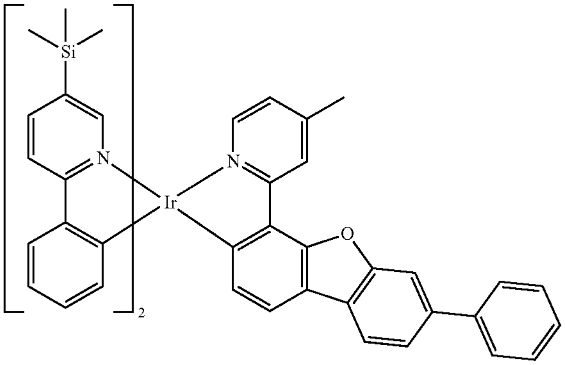
3
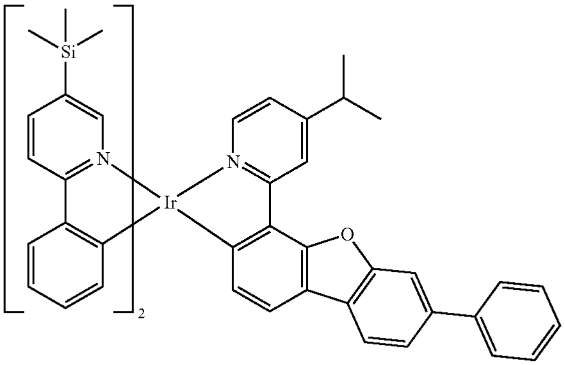
-continued
4
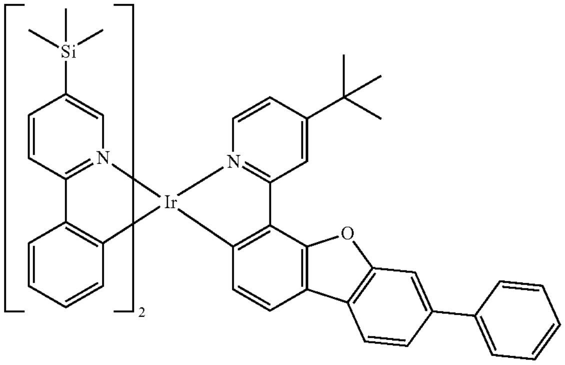
5
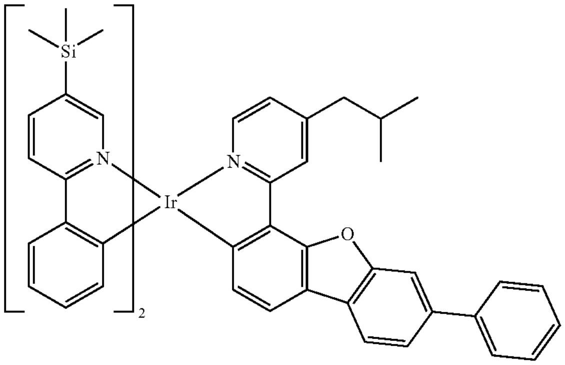
6
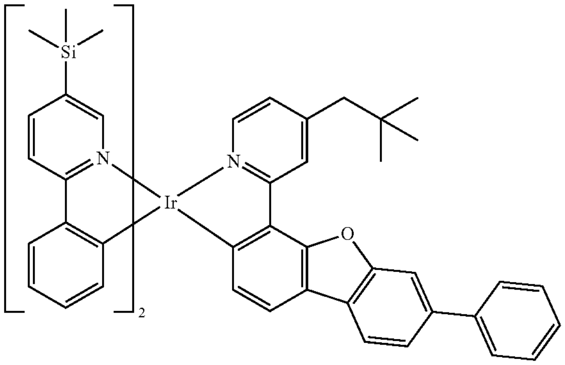
7
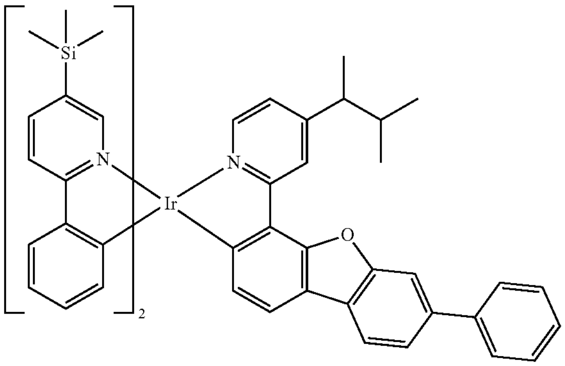

-continued
8
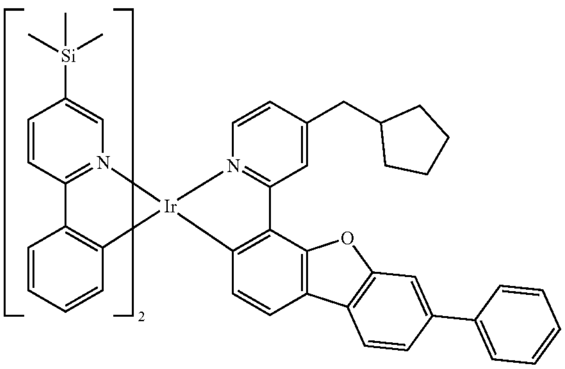
9
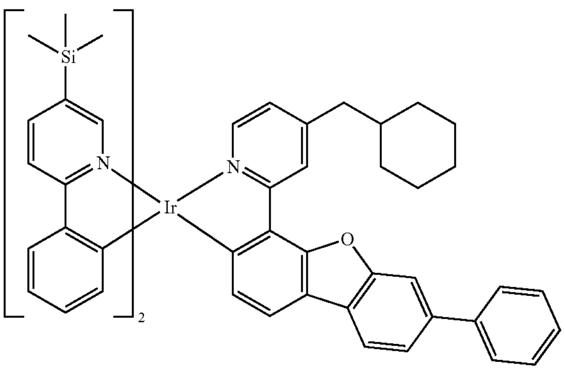
10
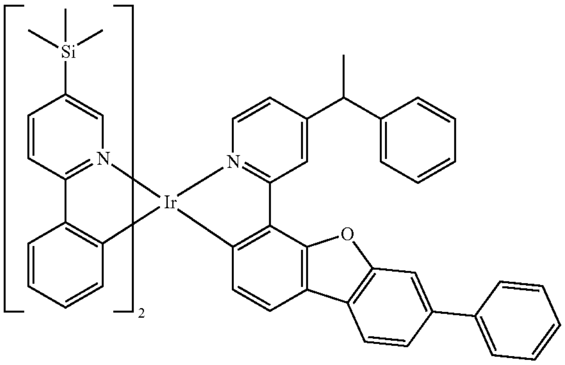
11
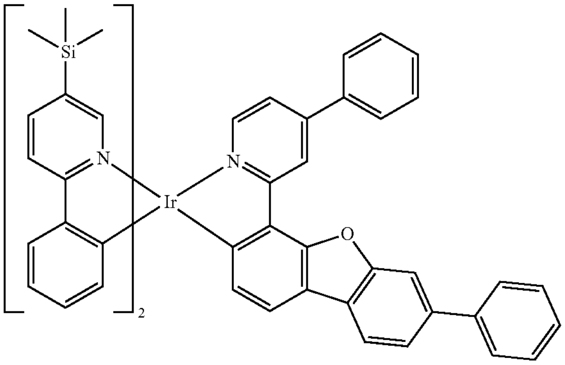
-continued
12
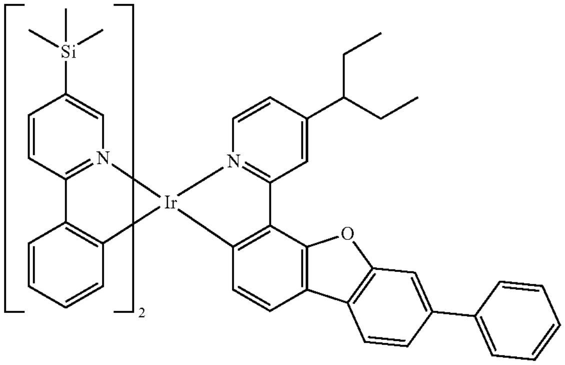
13
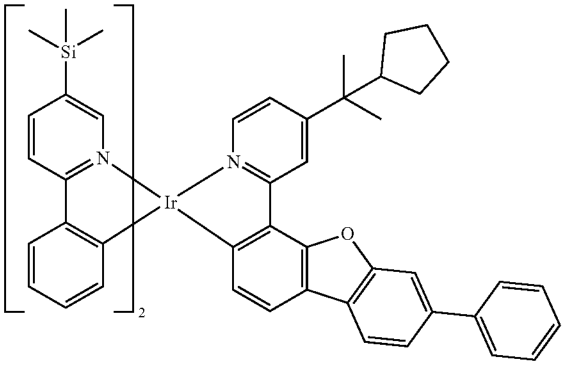
14
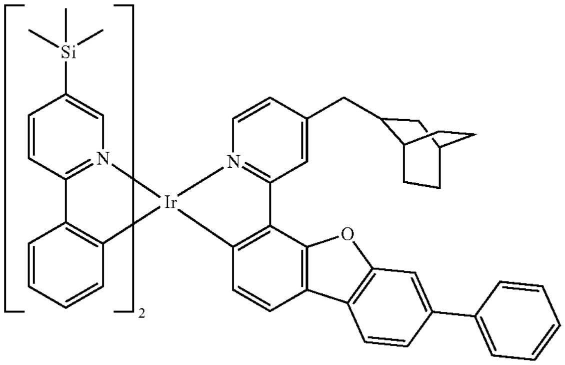
15
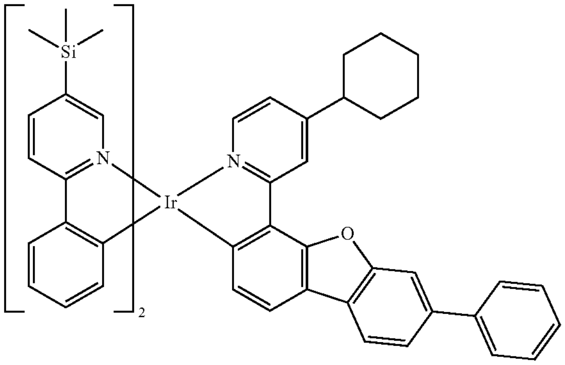

16
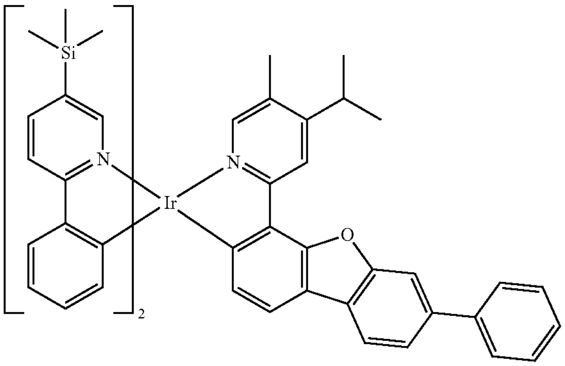
17
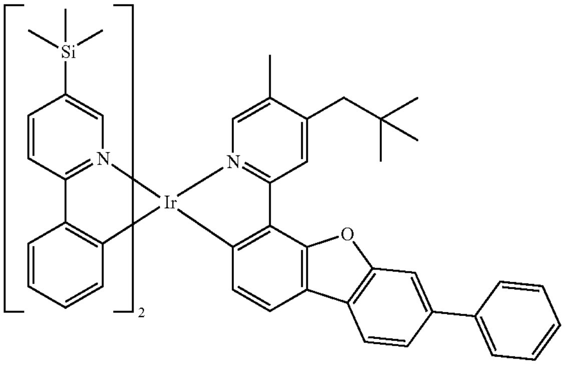
18
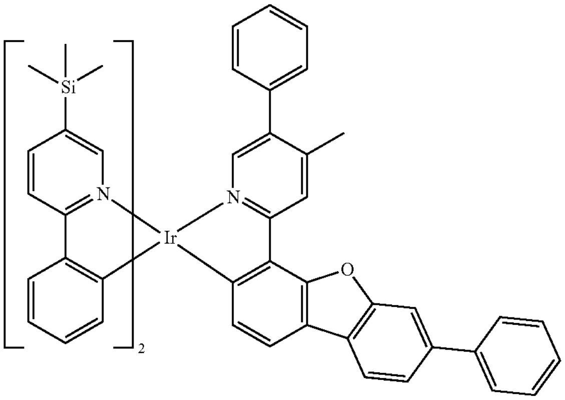
19
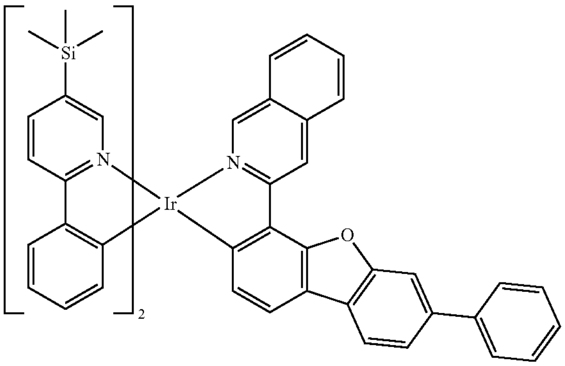
20
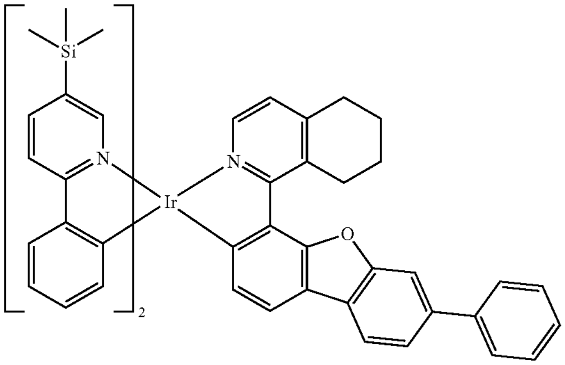
61
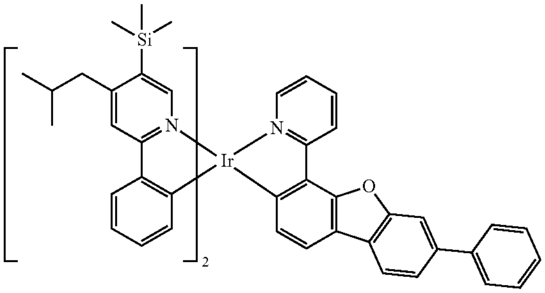
62
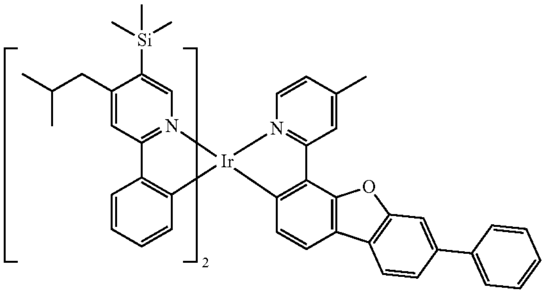
63
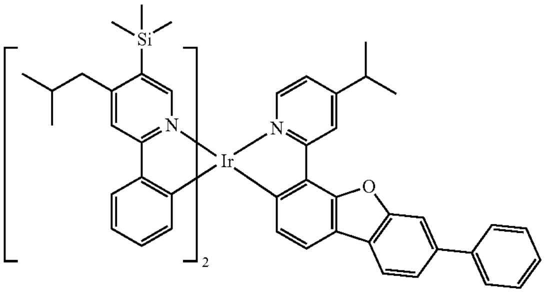

-continued
64
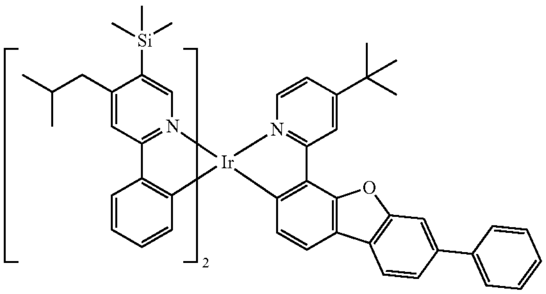
65
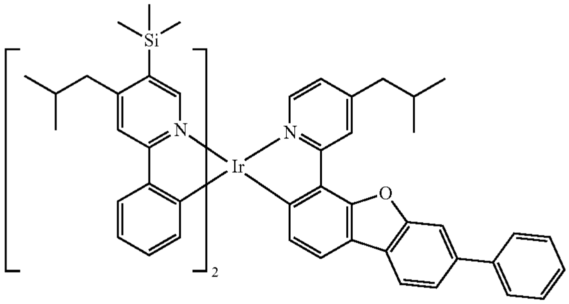
66
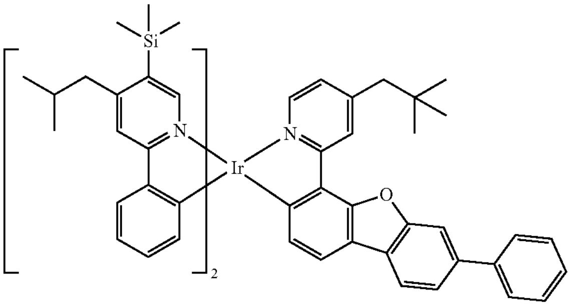
67
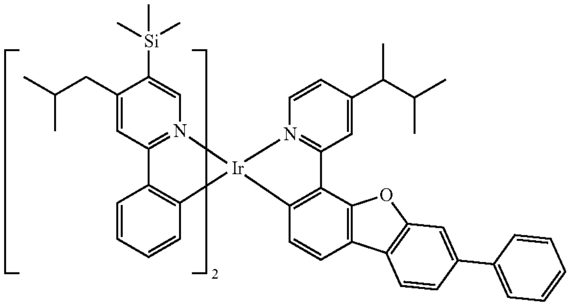
68
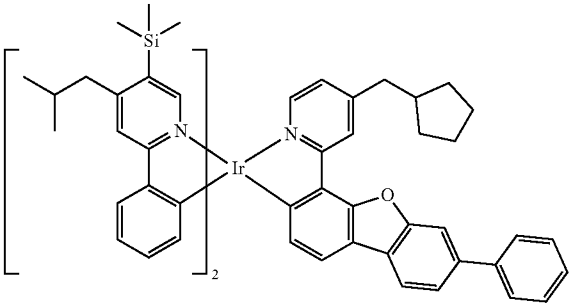
-continued
69
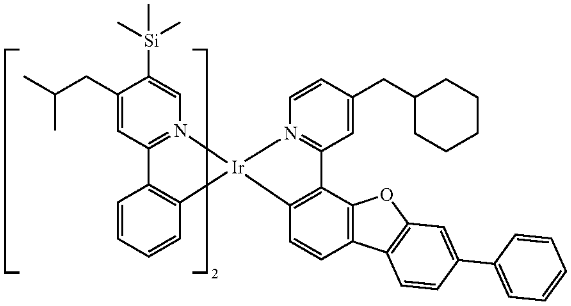
70
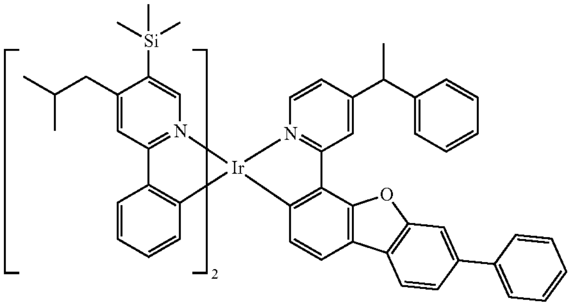
71
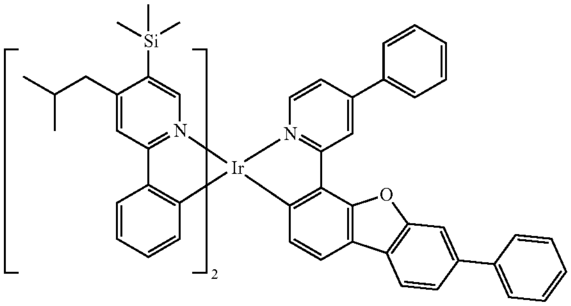
72
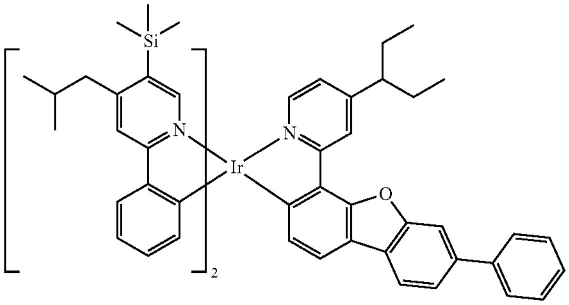
73
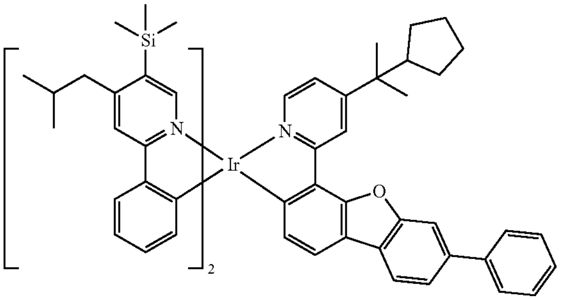

-continued
74
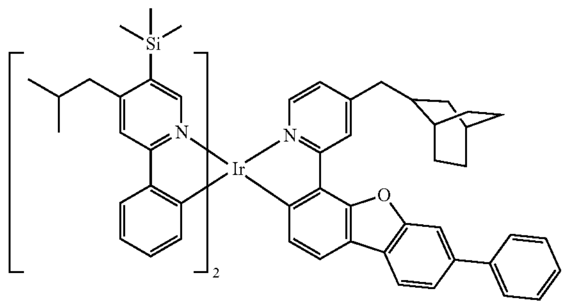
75
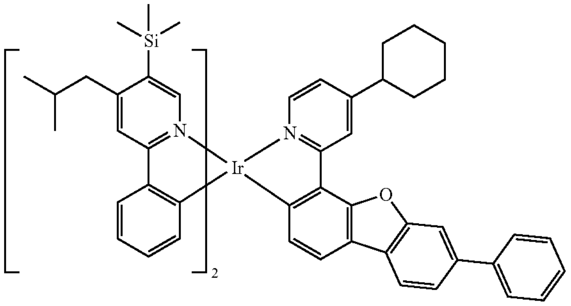
76
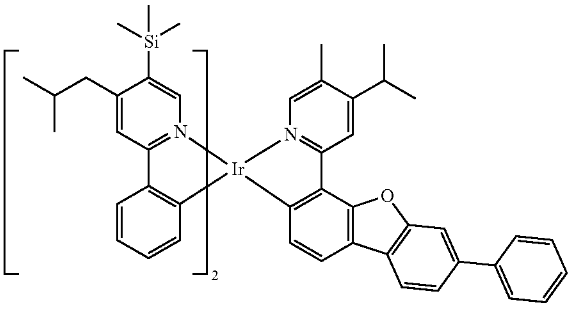
77
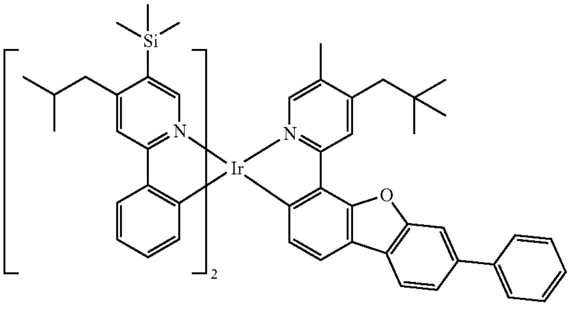
-continued
78
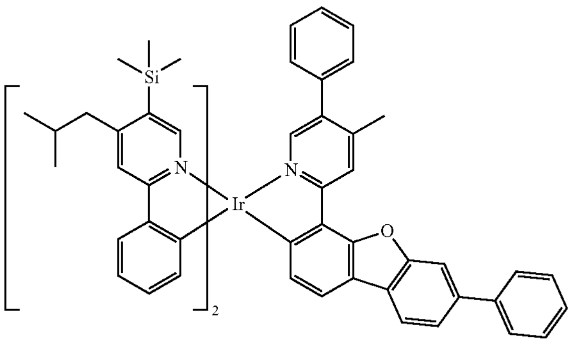
79
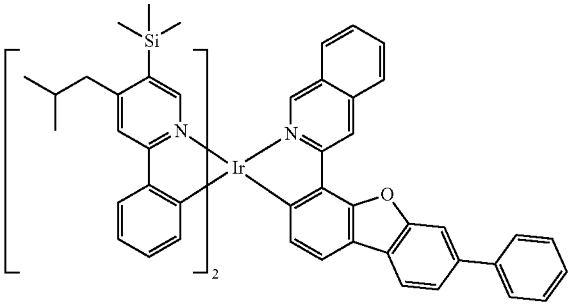
80
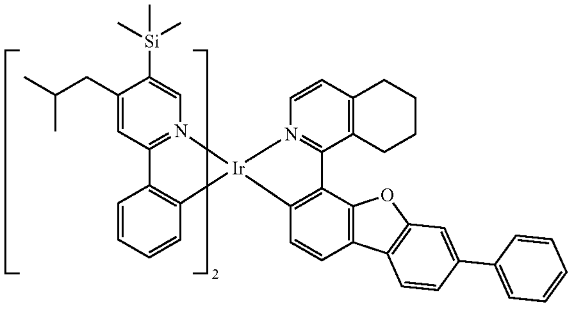
81
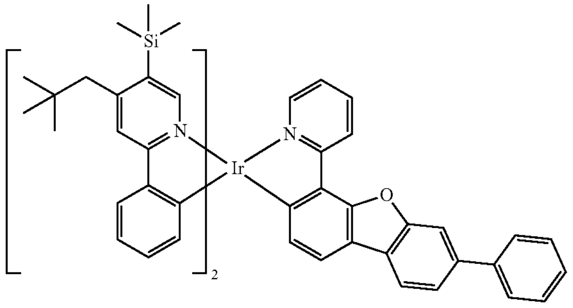

-continued
82
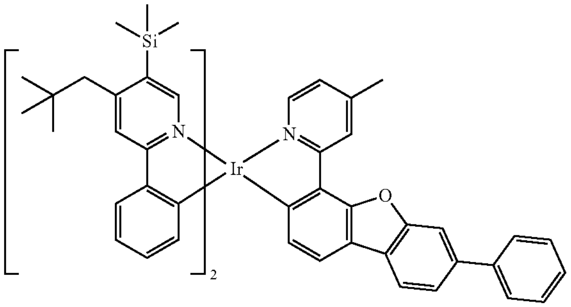
83
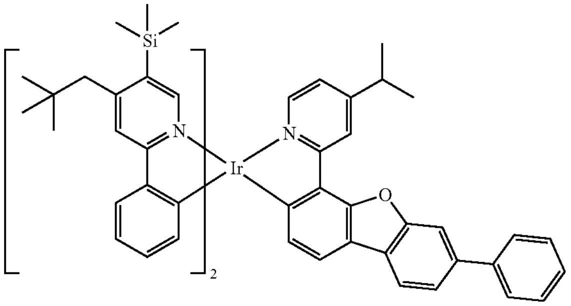
84
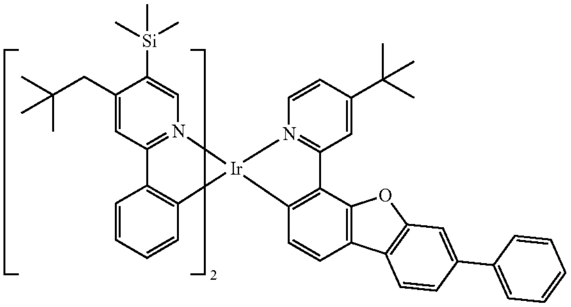
85
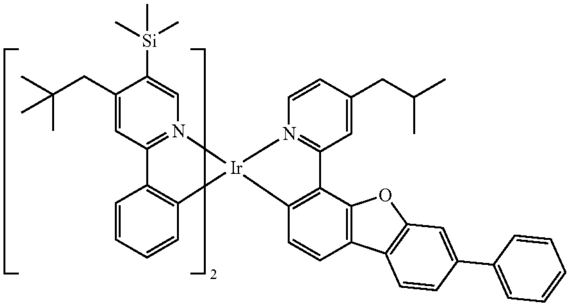
-continued
86
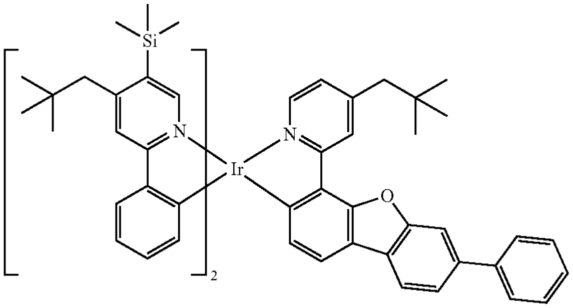
87
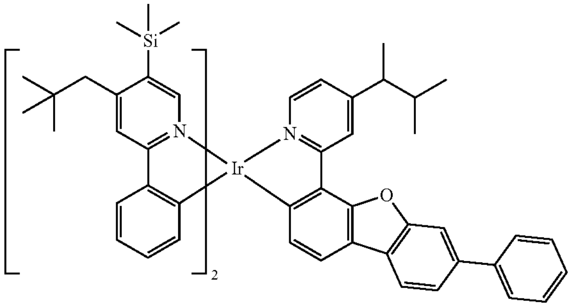
88
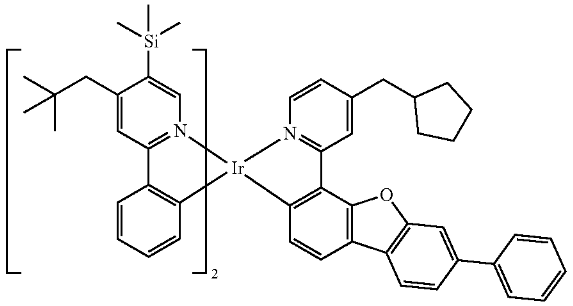
89
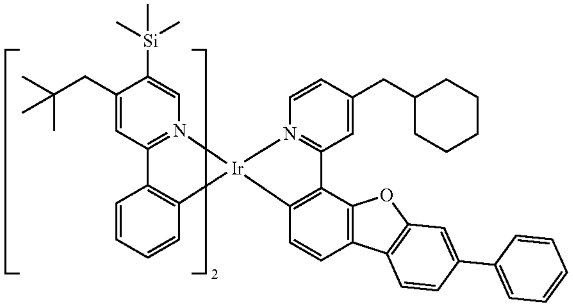

-continued
90
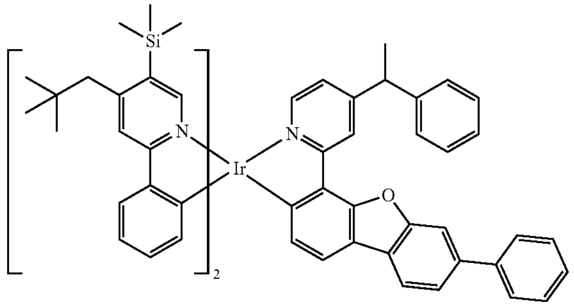
91
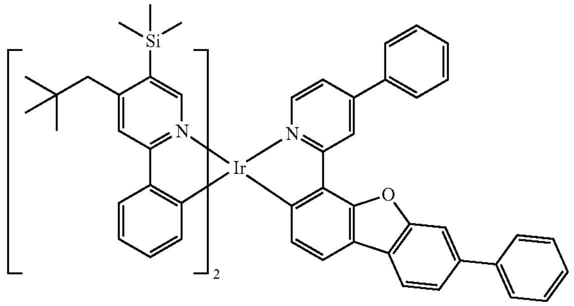
92
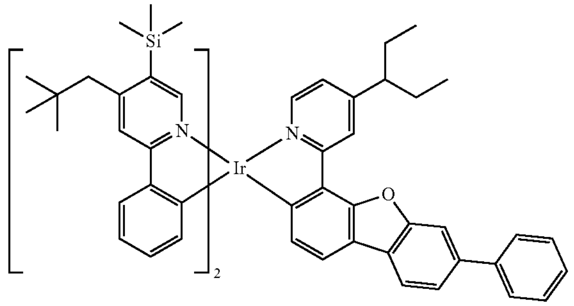
93
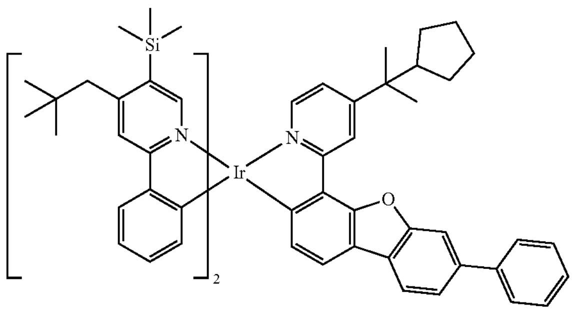
-continued
94
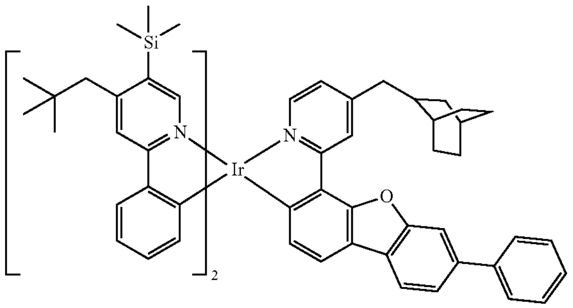
95
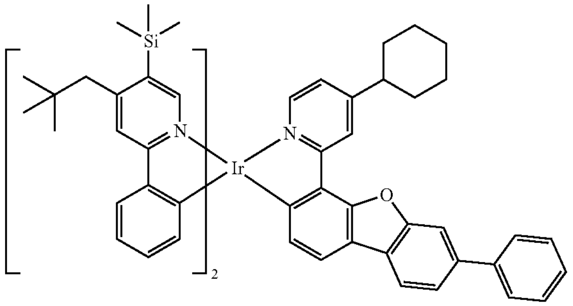
96
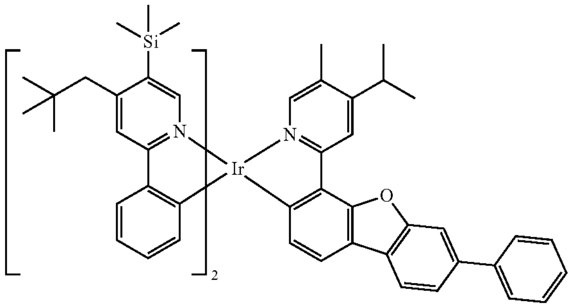
97
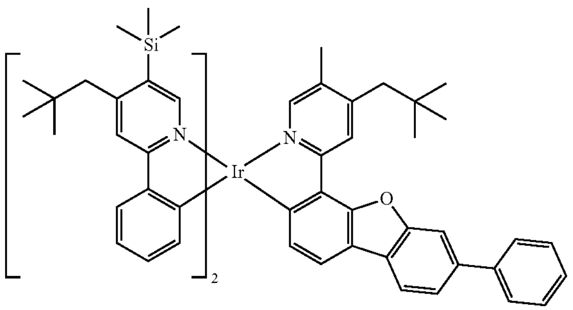

-continued
98
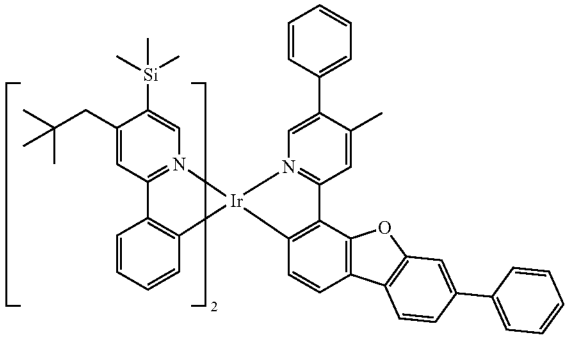
99
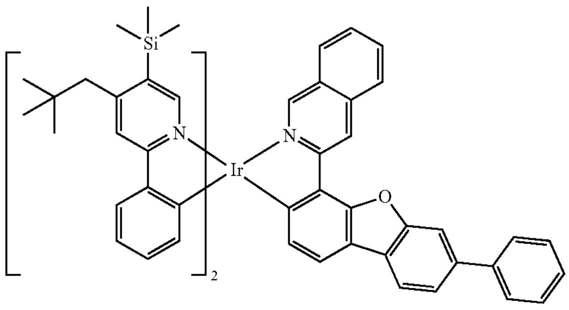
100
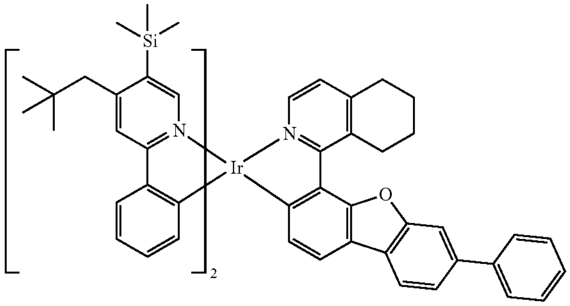
121
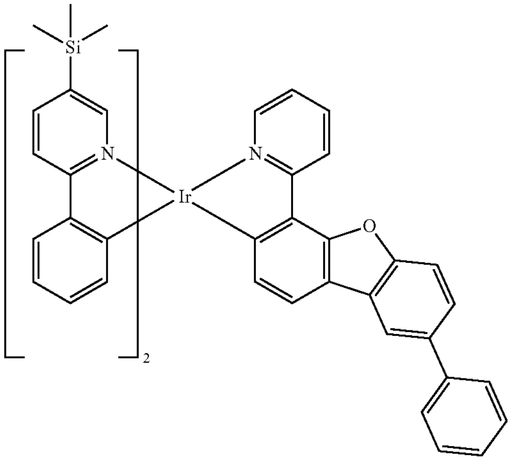
-continued
122
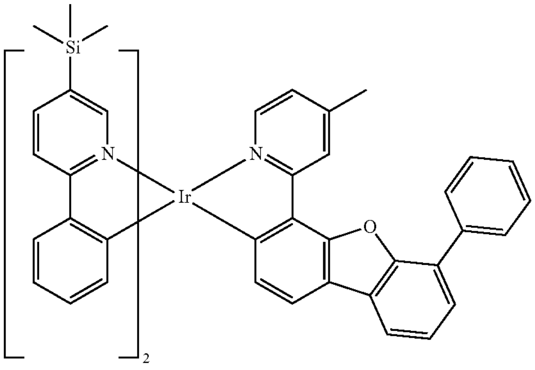
123
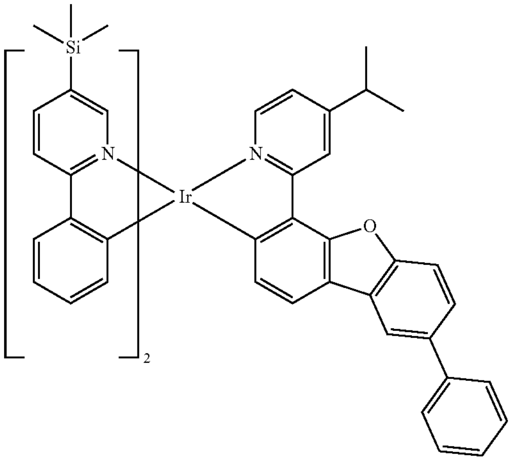
124
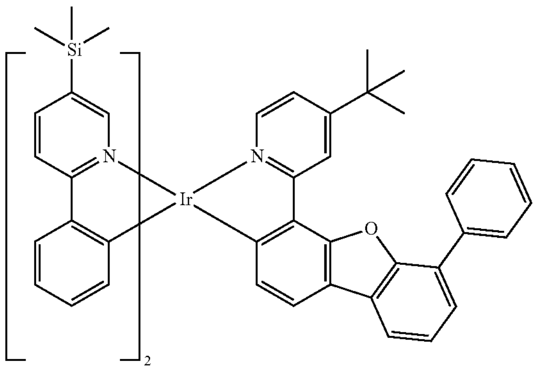

125
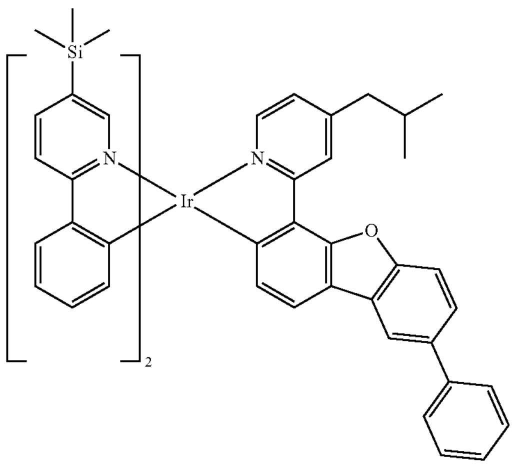
126
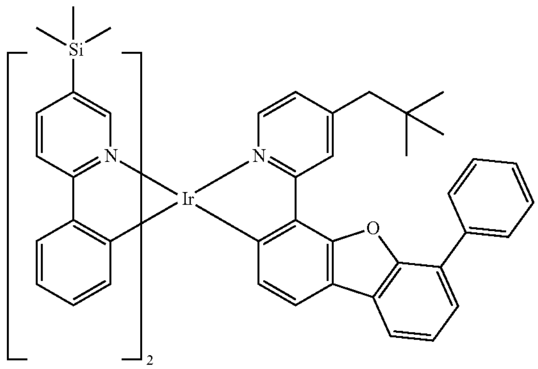
127
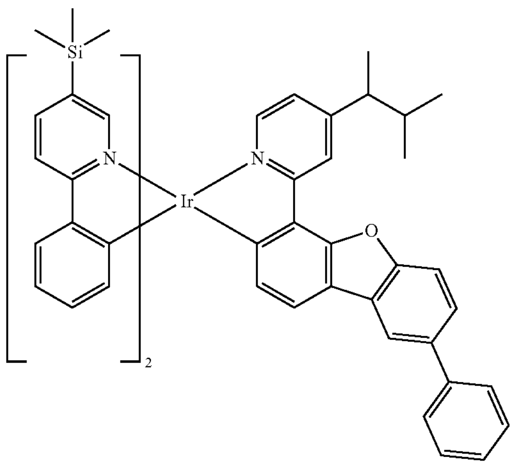
128
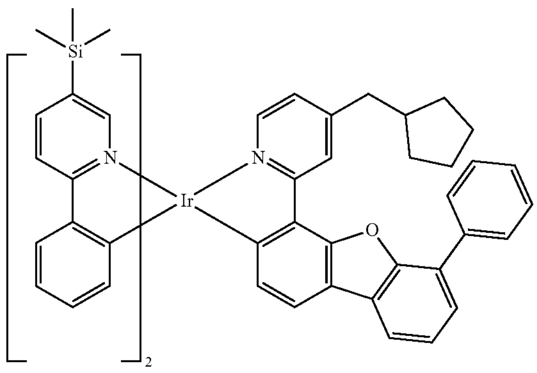
129
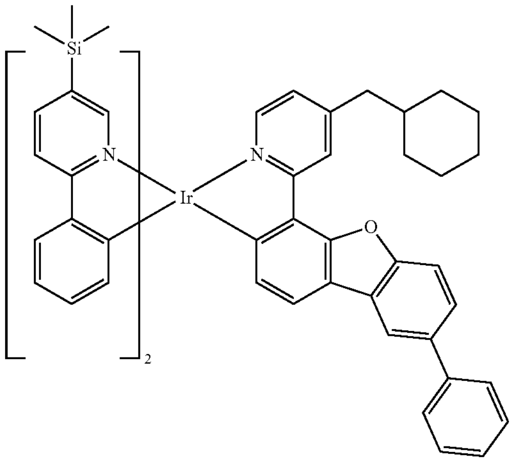
130
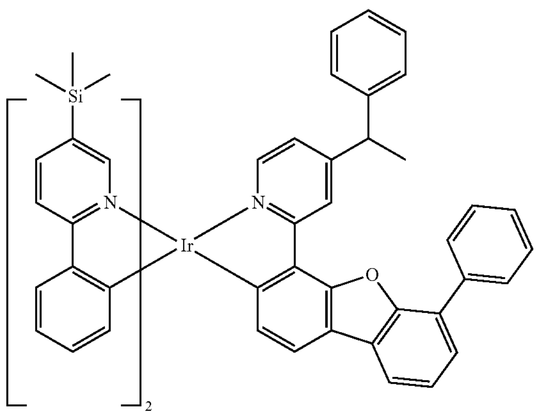

-continued
131
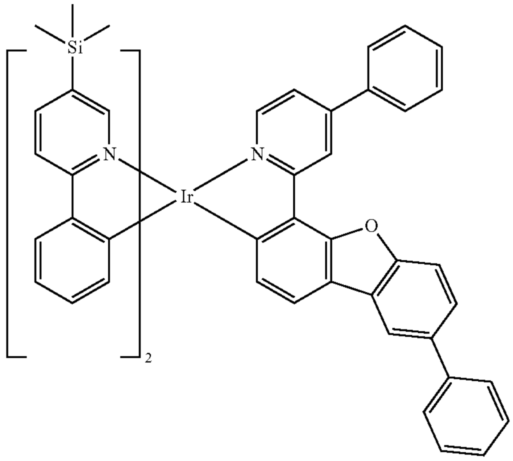
132
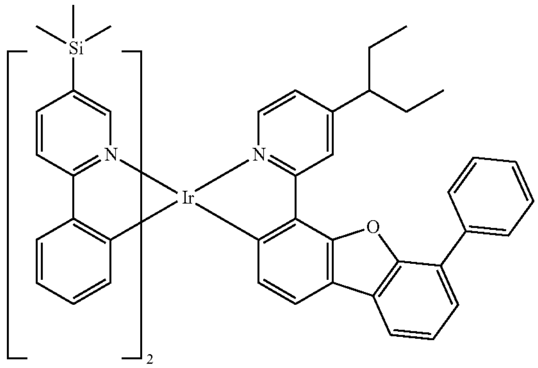
133
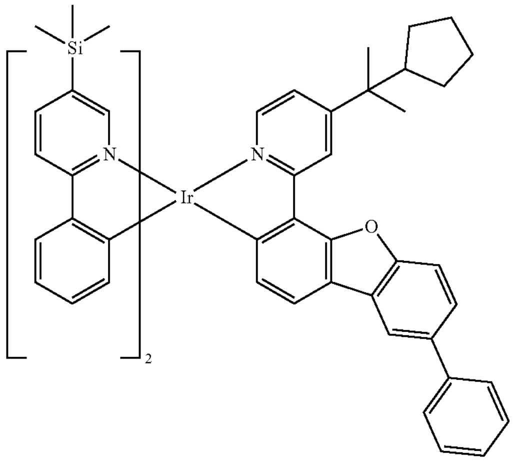
-continued
134
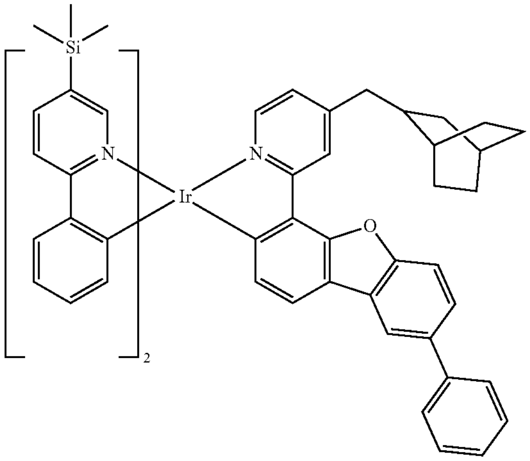
135
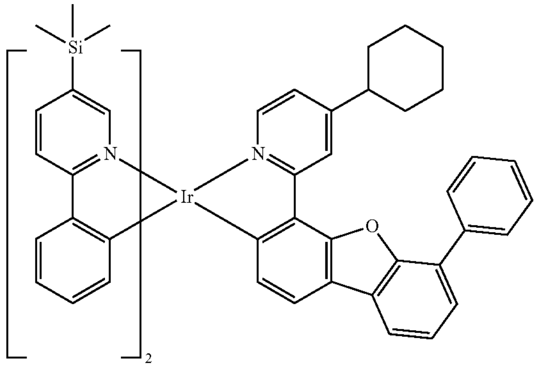
136
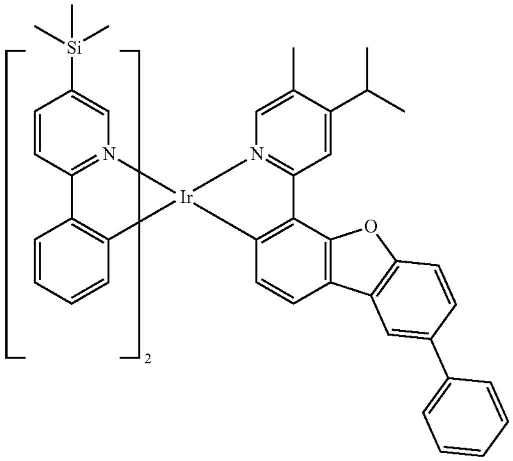

-continued
137
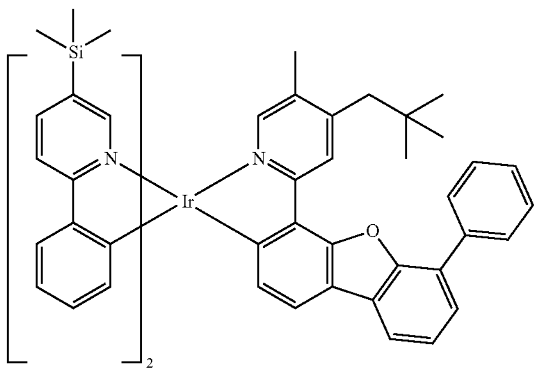
138
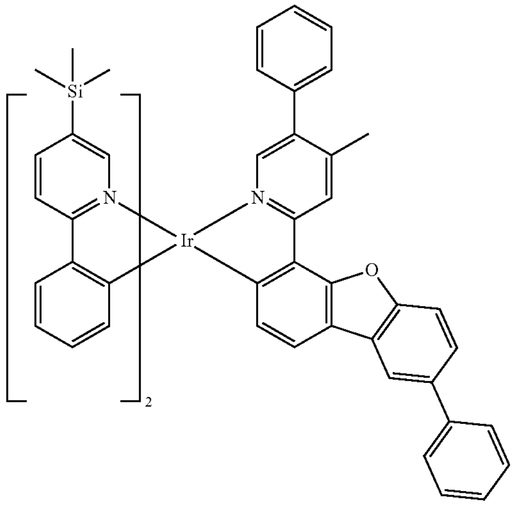
139
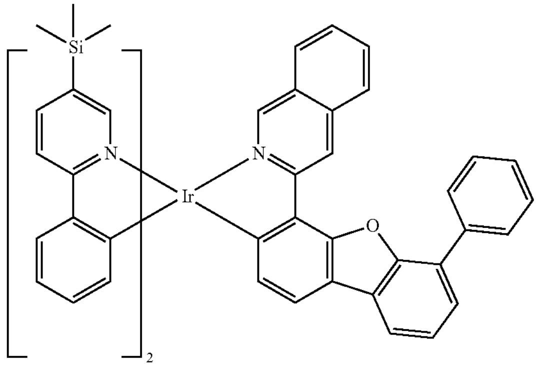
-continued
140
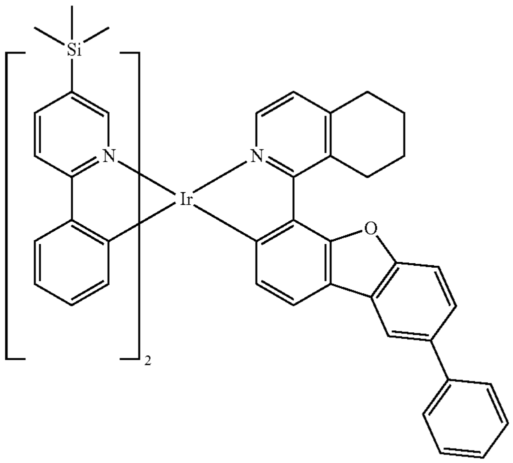
361
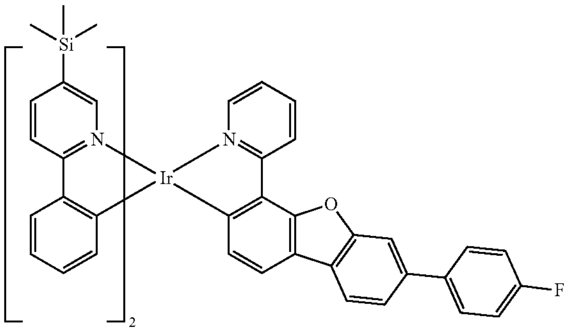
362
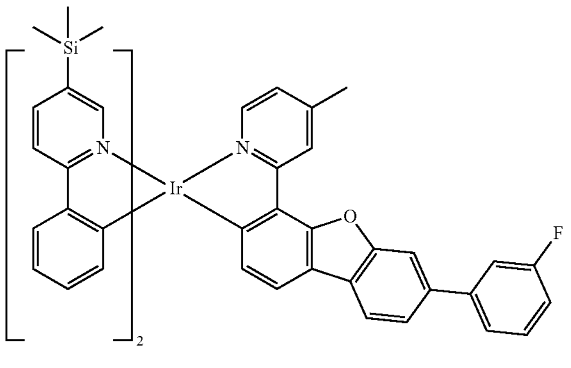
363
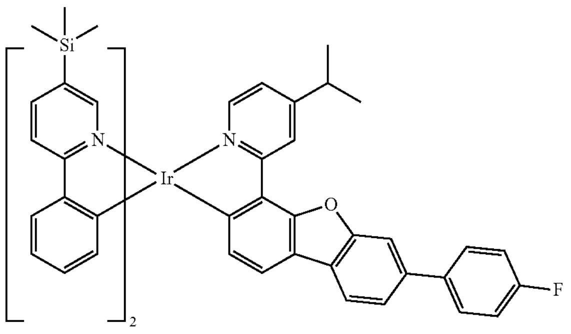

-continued
364
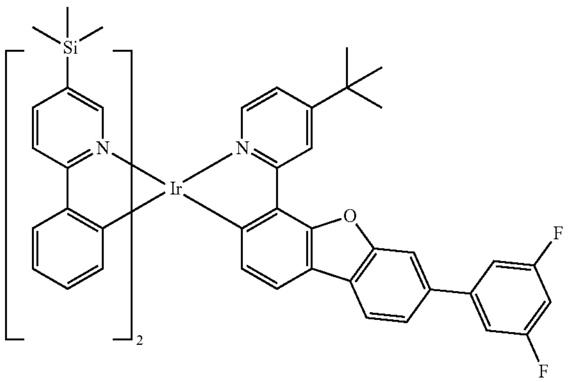
365
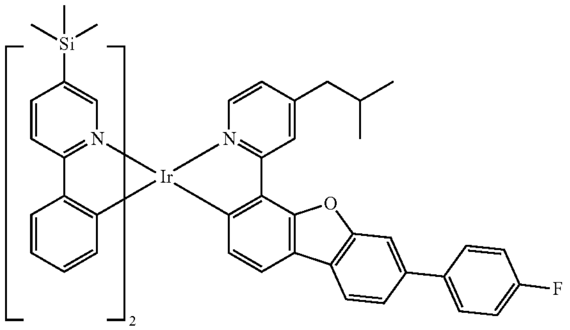
366
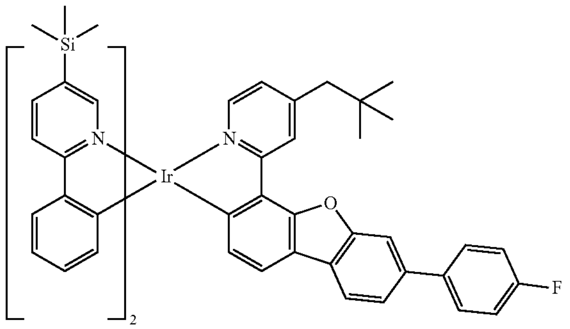
367
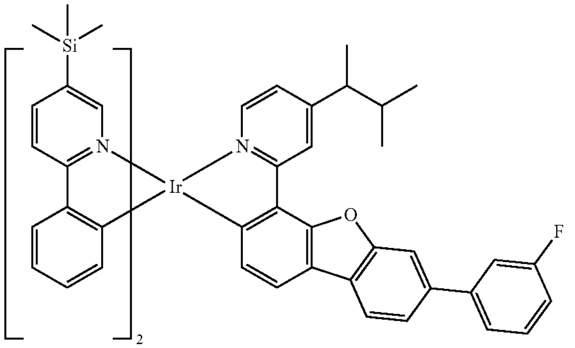
-continued
368
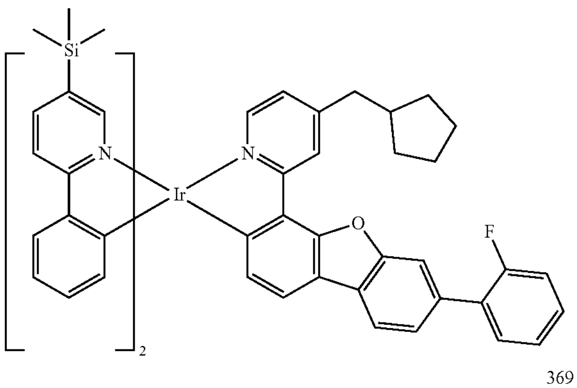
369
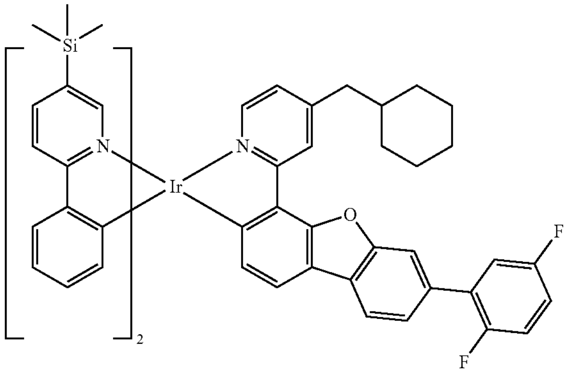
370
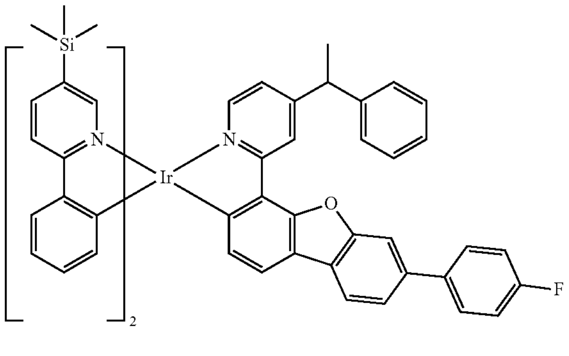
371
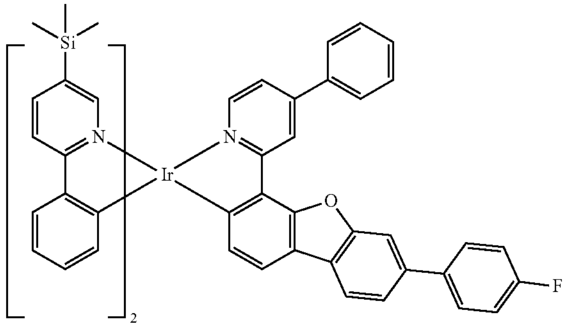

-continued
372
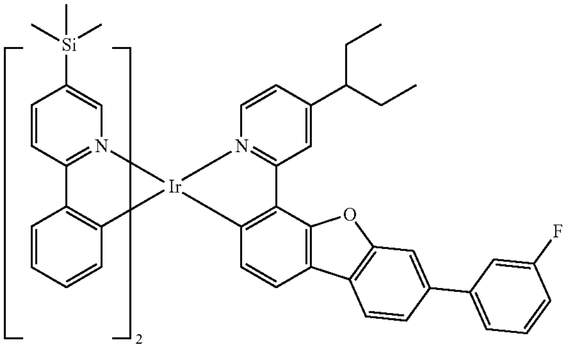
373
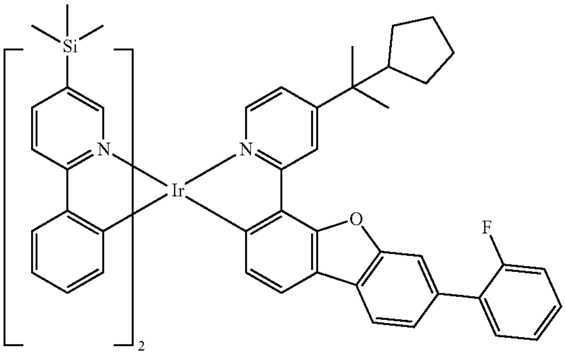
374
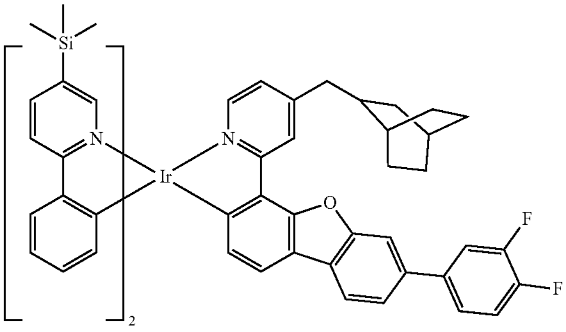
375
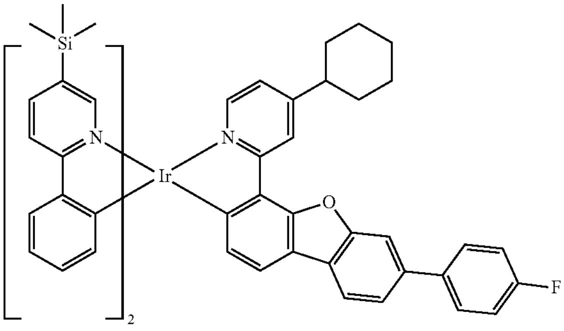
-continued
376
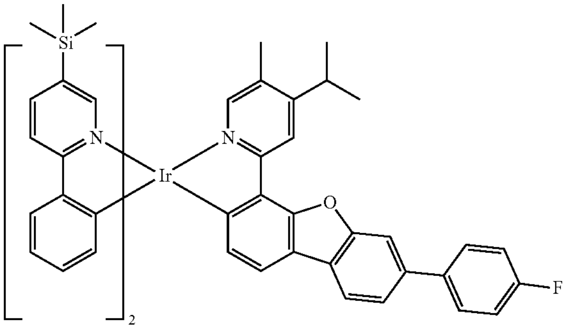
377
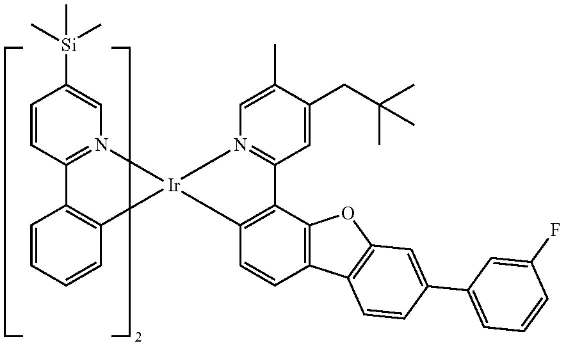
378
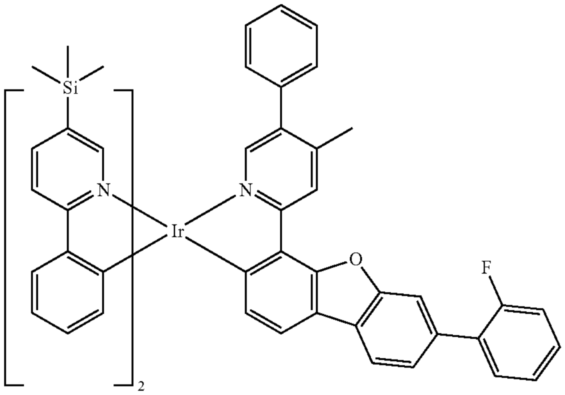
379
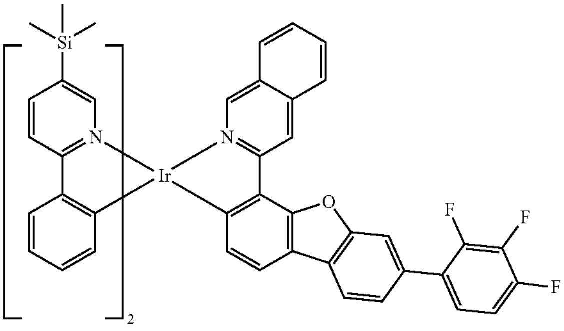

-continued
380
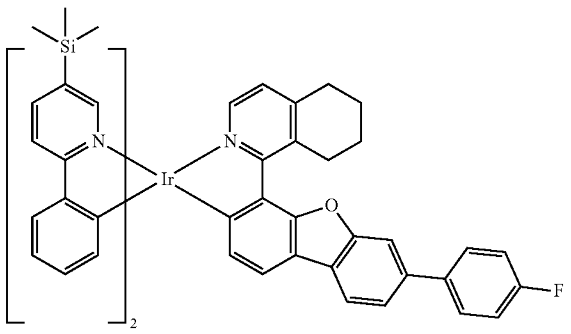
1701
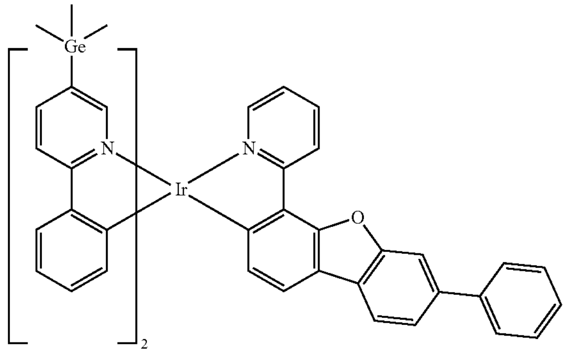
1702
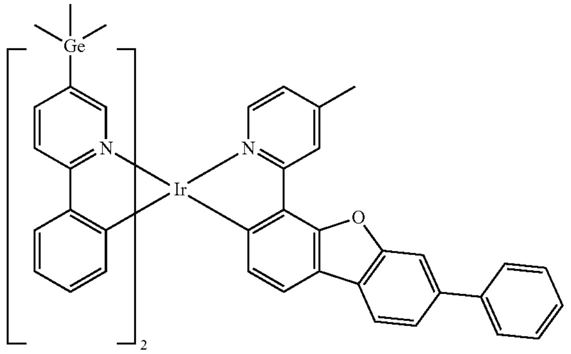
1703
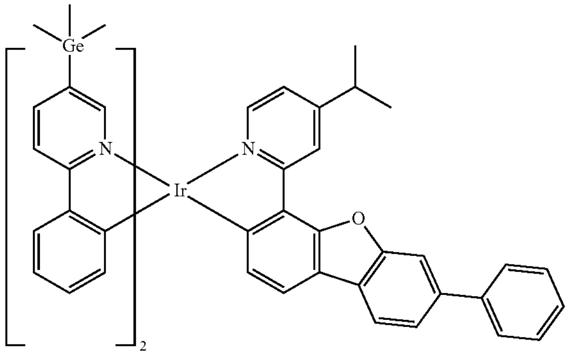
-continued
1704
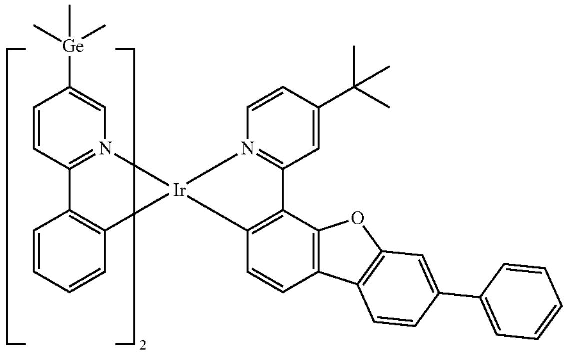
1705
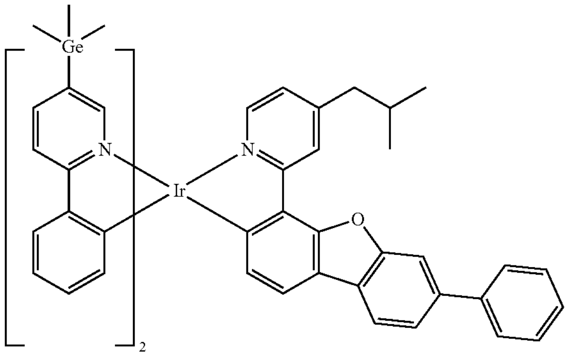
1706
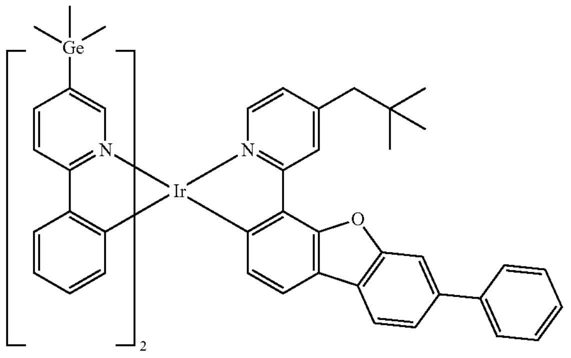
1707
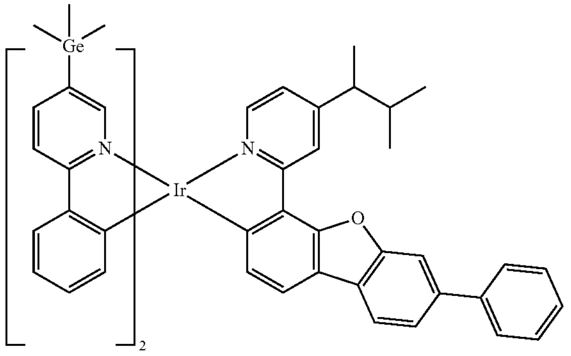

-continued
1708
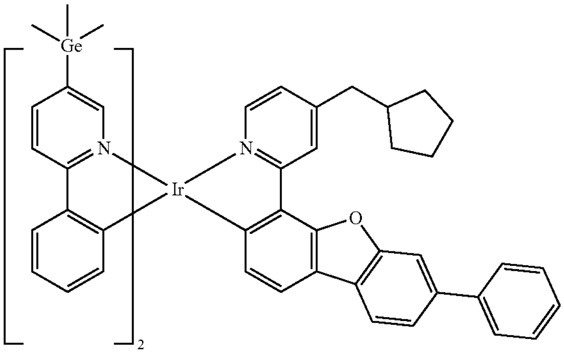
1709
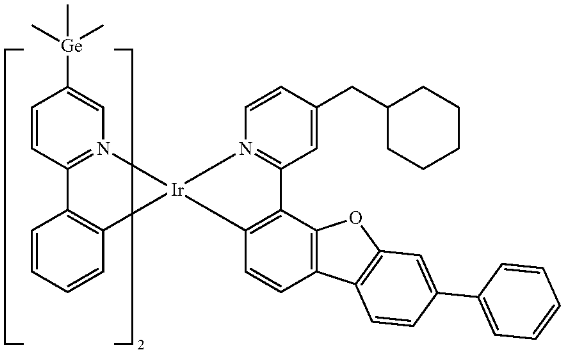
1710
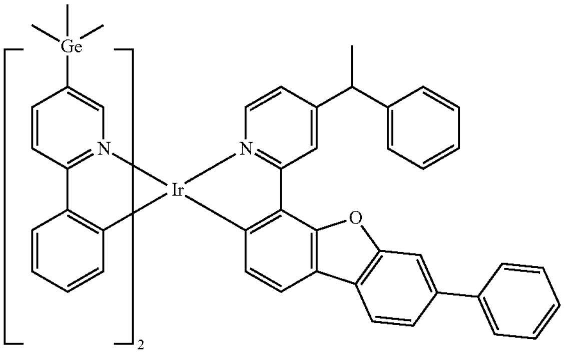
1711
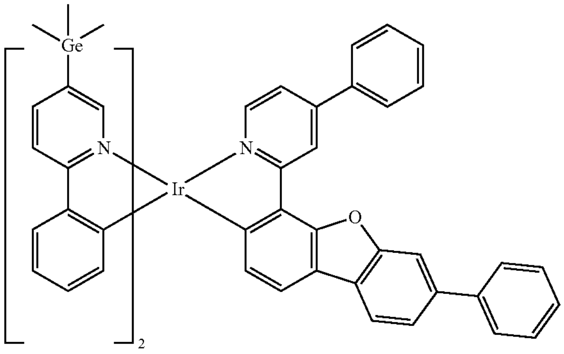
-continued
1712
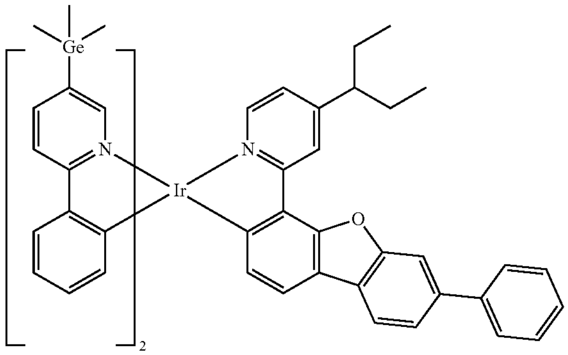
1713
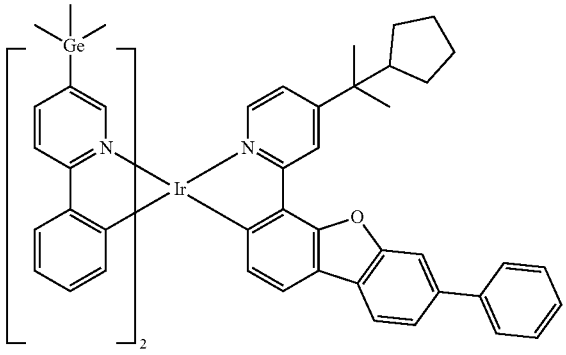
1714
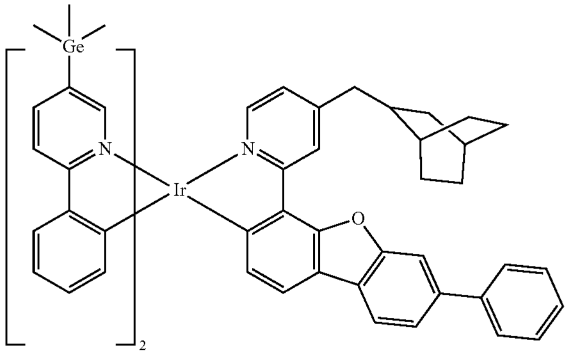
1715
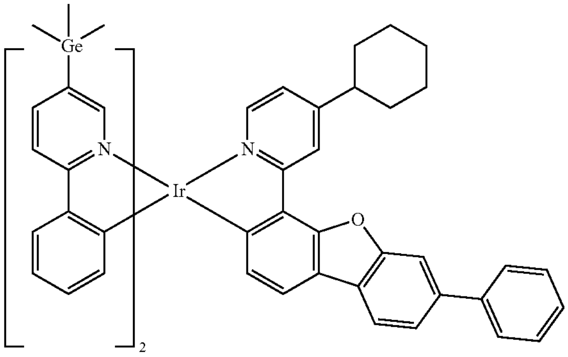

-continued
1716
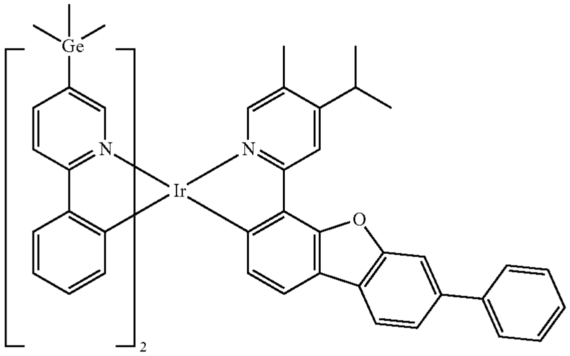
1717
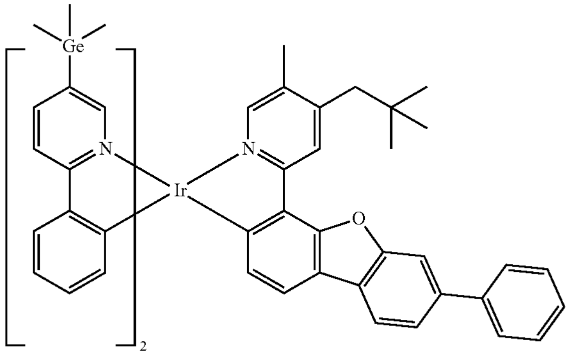
1718
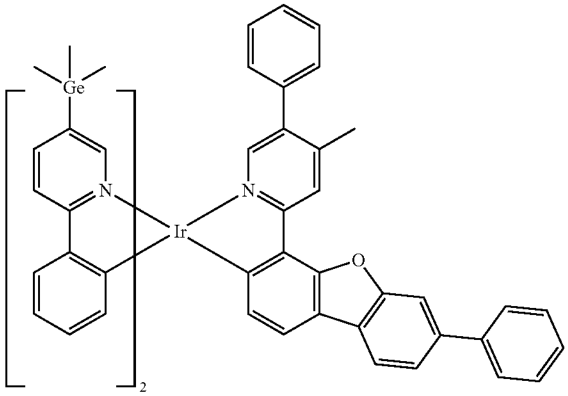
1719
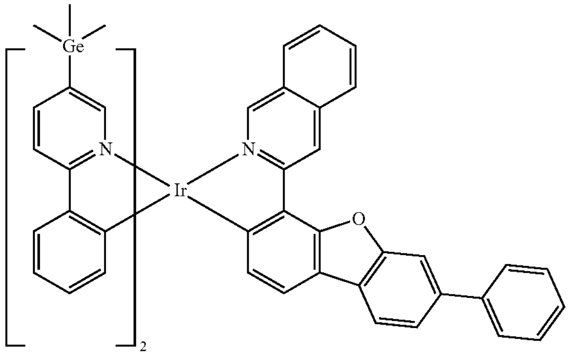
-continued
1720
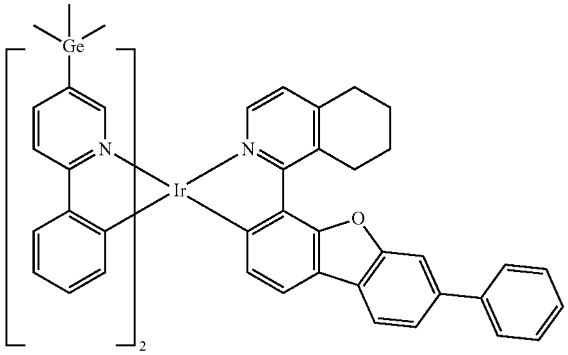
1781
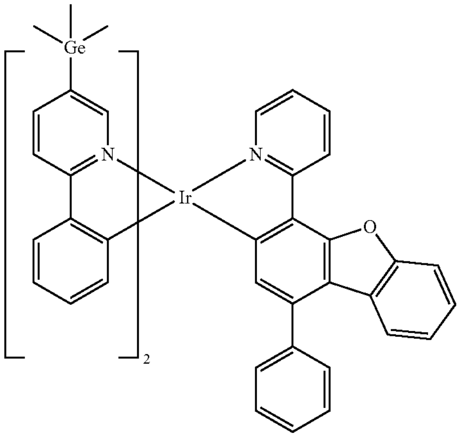
1782
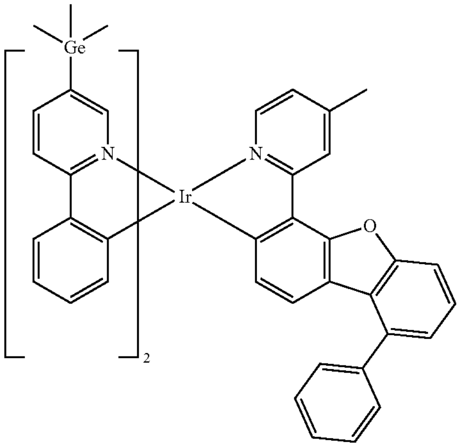

1783
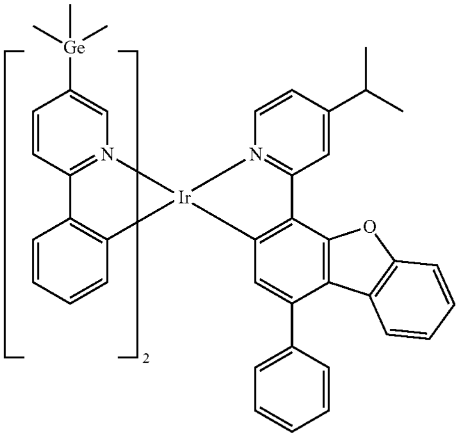
1784
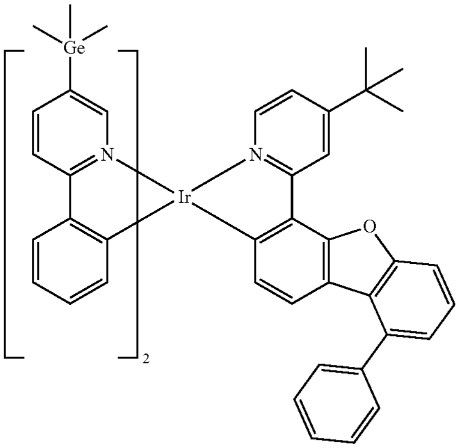
1785
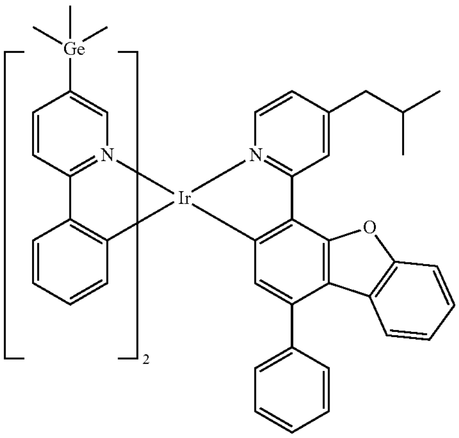
1786
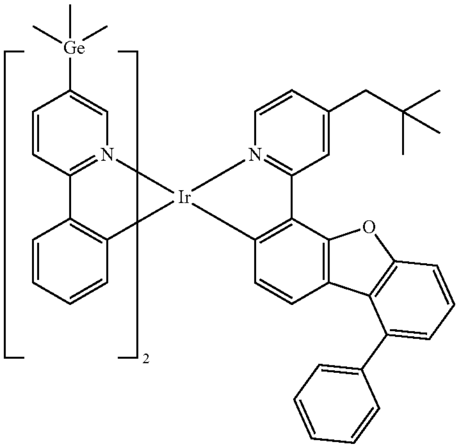
1787
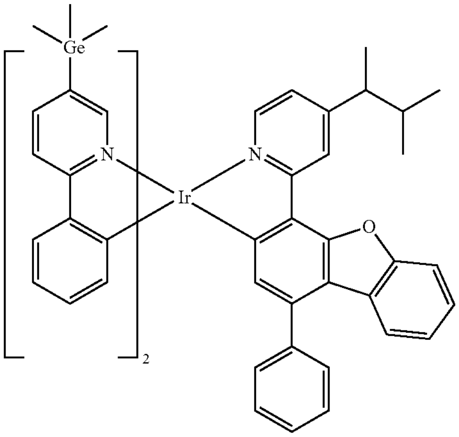
1788
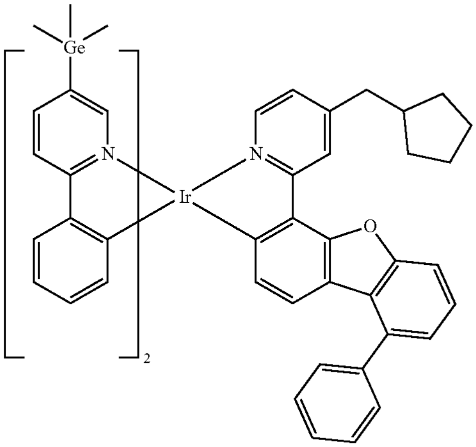

-continued
1789
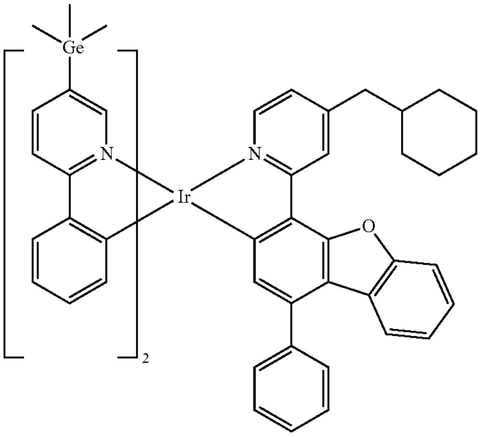
1790
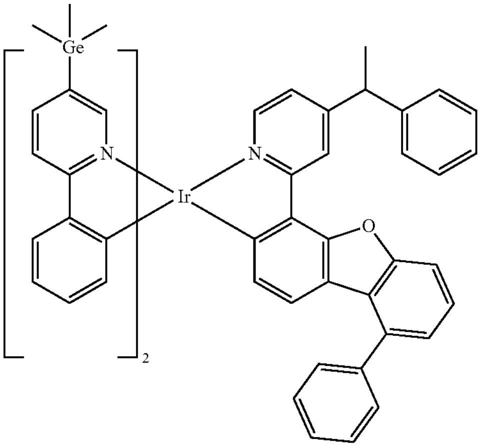
1791
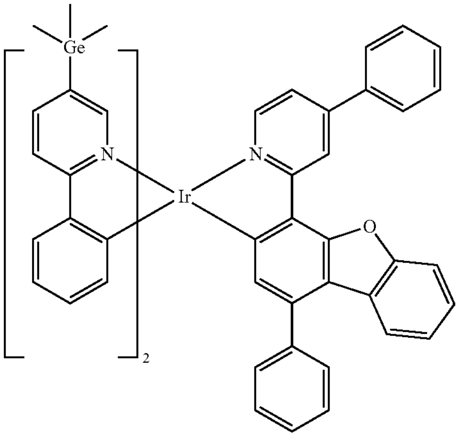
-continued
1792
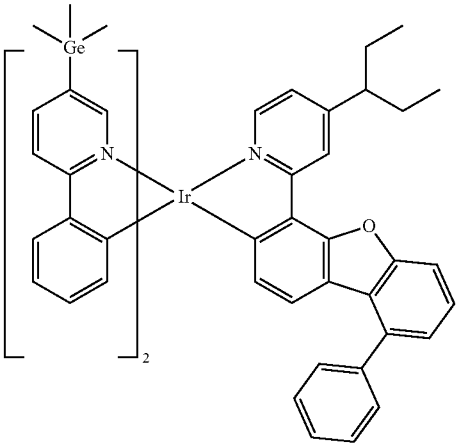
1793
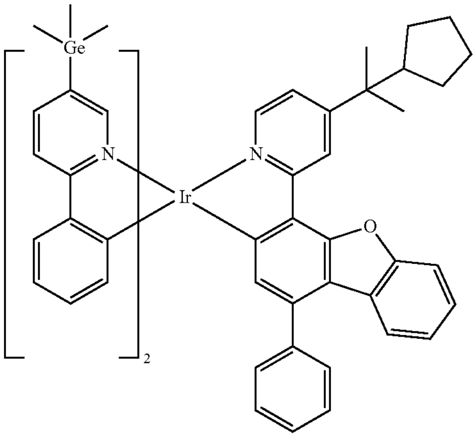
1794
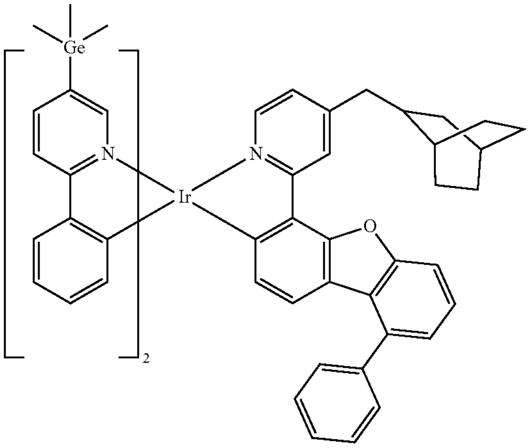

-continued
1795
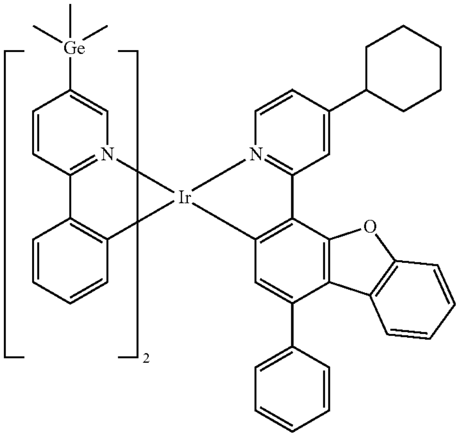
1796
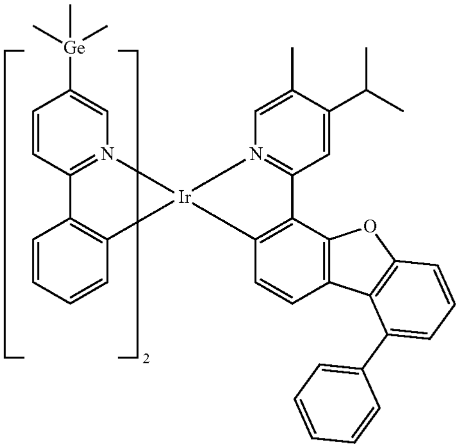
1797
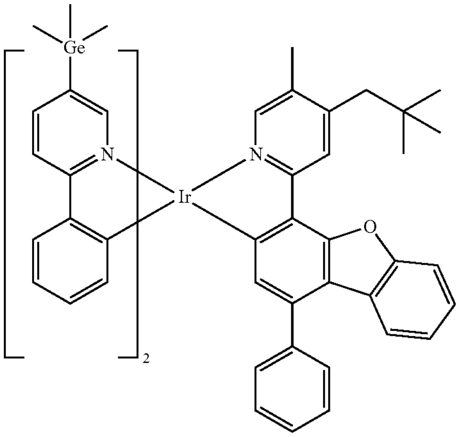
-continued
1798
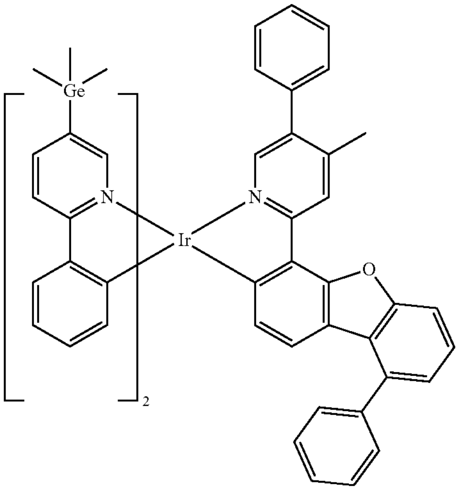
1799
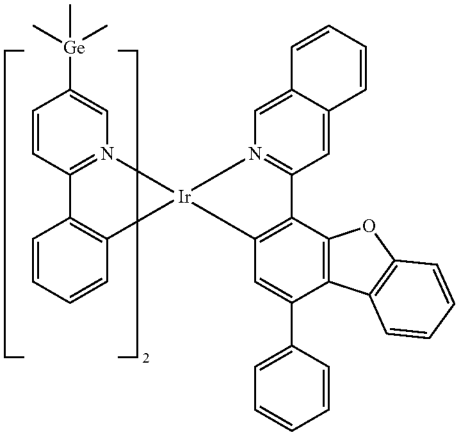
1800
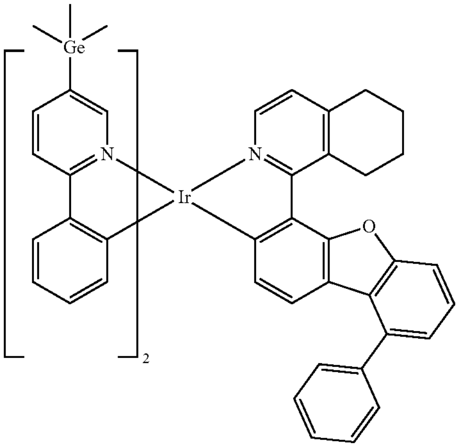

-continued
1821
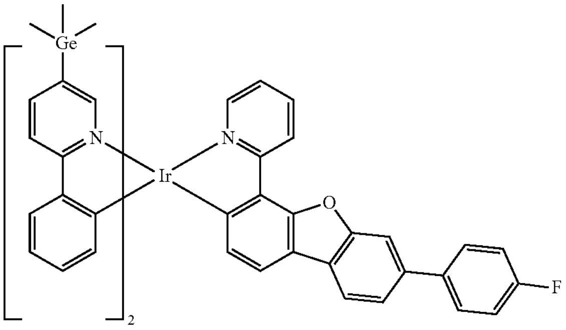
1822
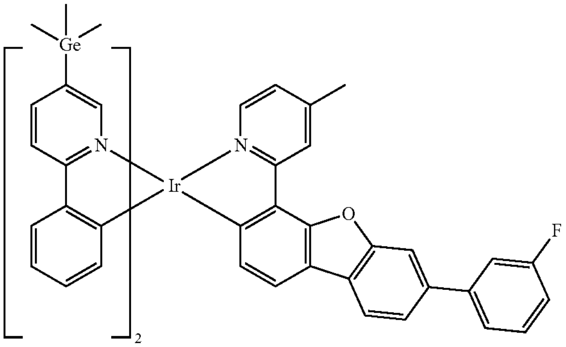
1823
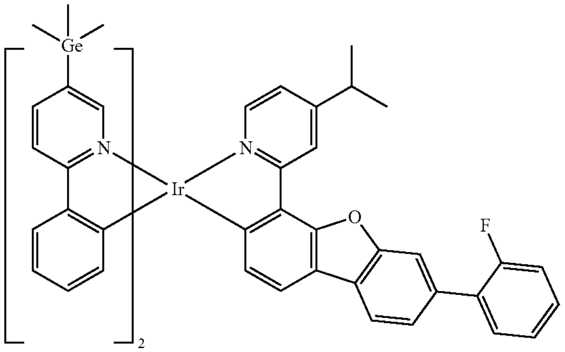
1824
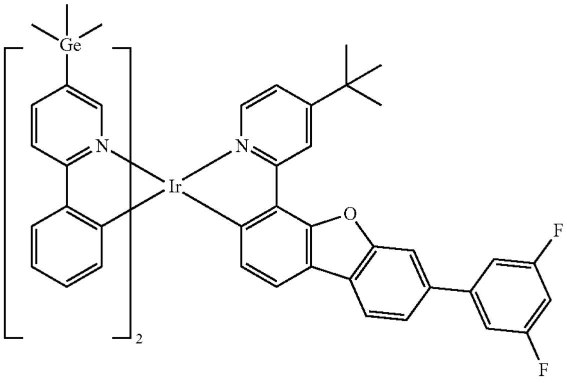
-continued
1825
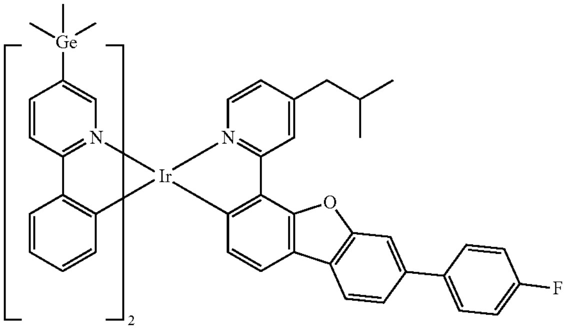
1826
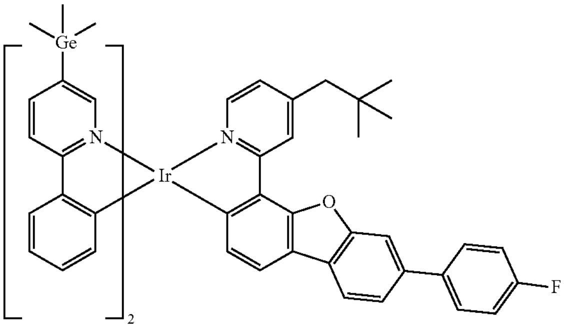
1827
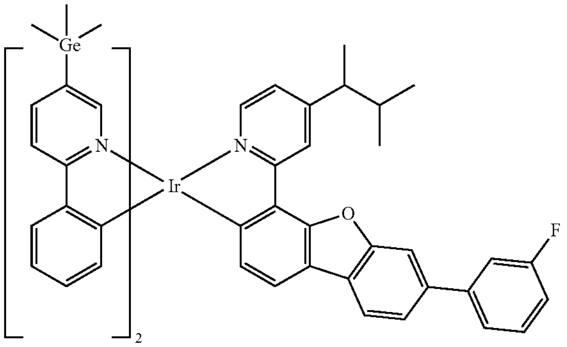
1828
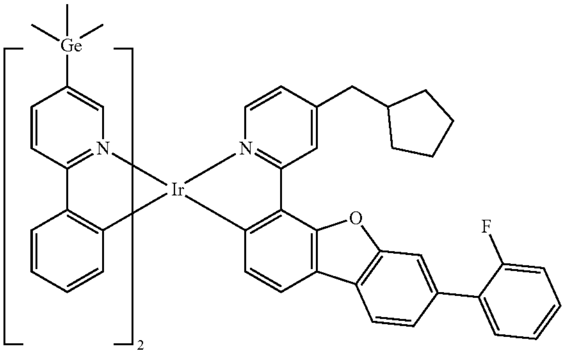

-continued
1829
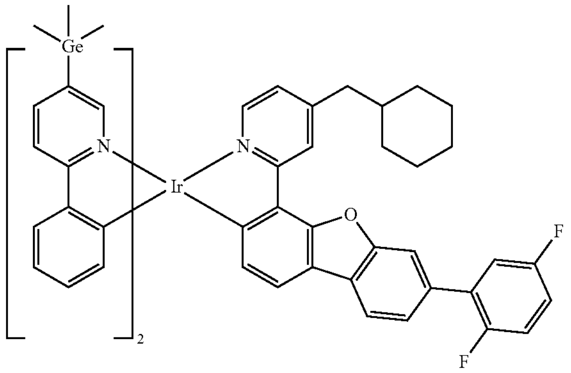
1830
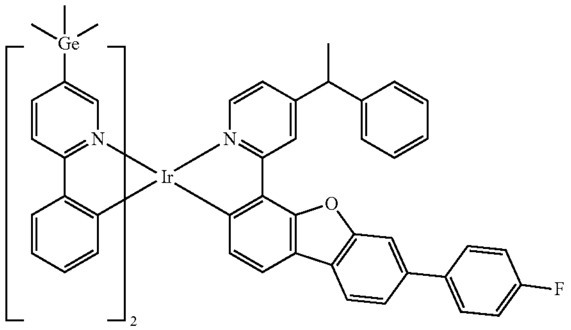
1831
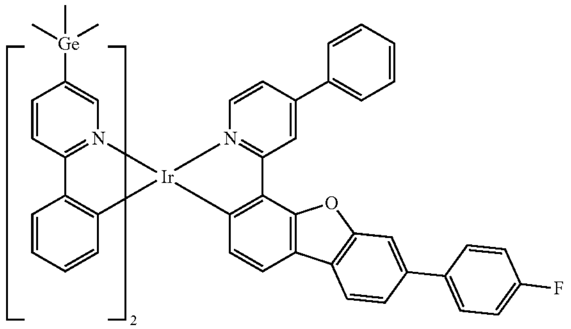
1832
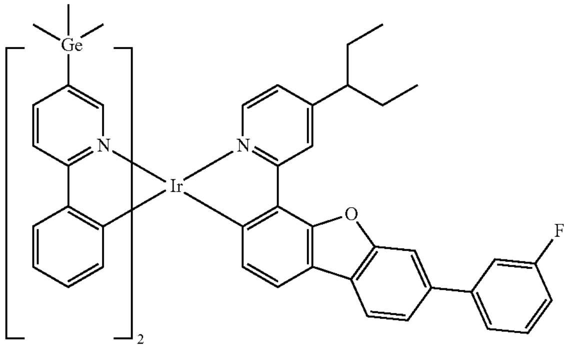
-continued
1833
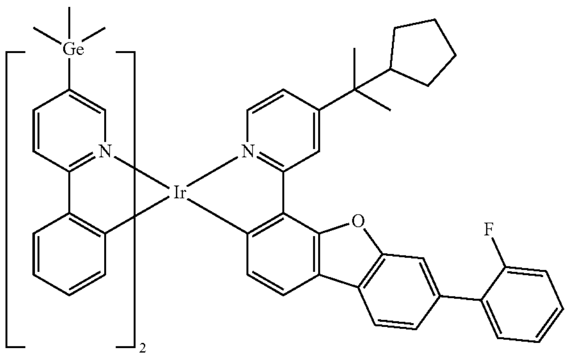
1834
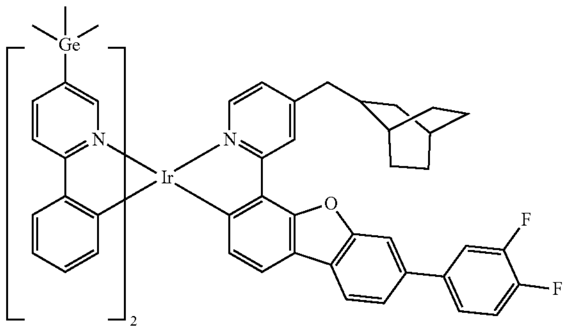
1835
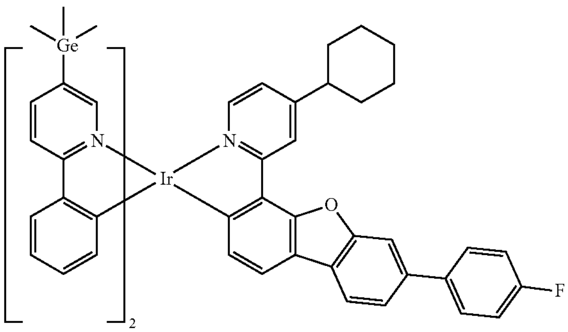
1836
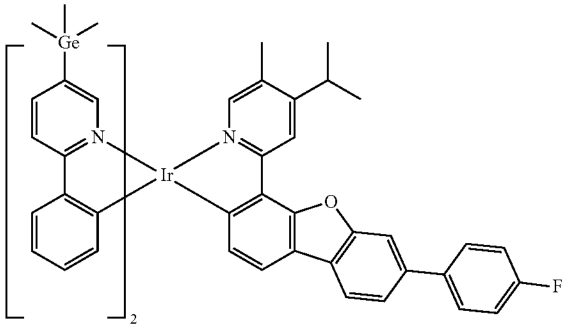

1837
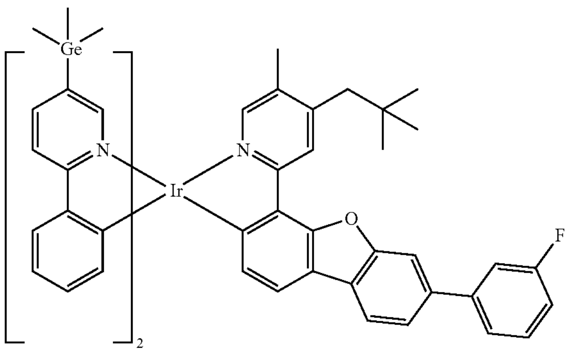
1838
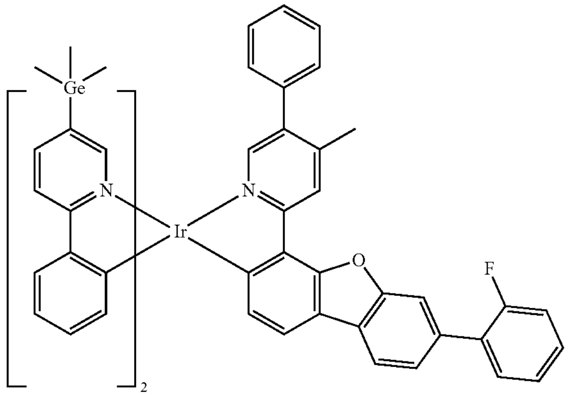
1839
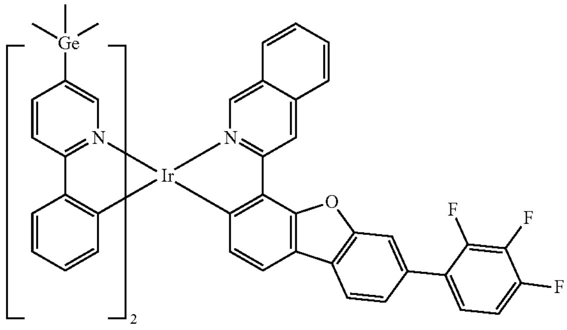
1840
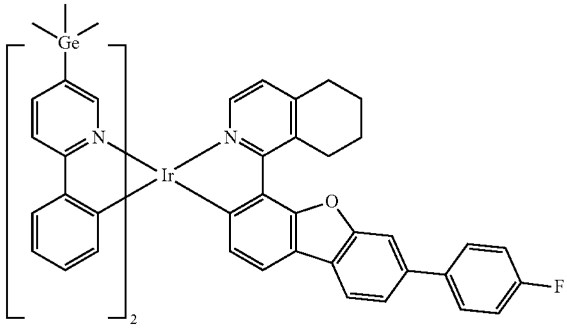
2361
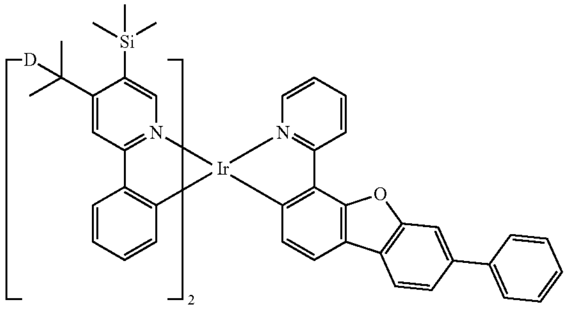
2362
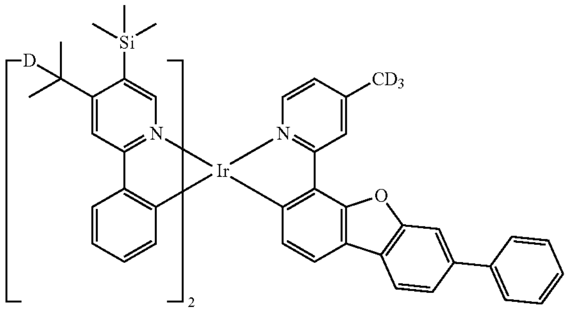
2363
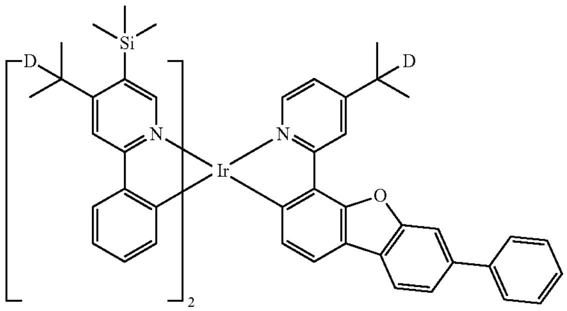
2364
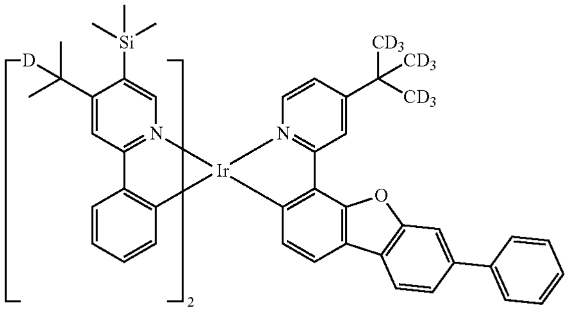

-continued
2365
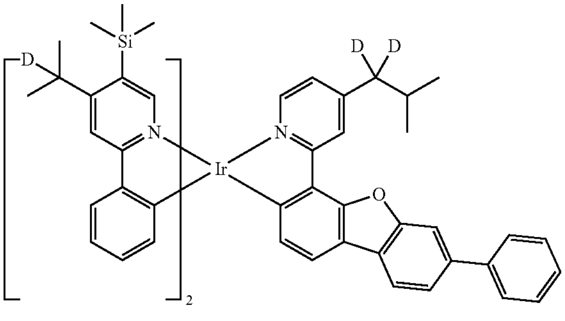
2366
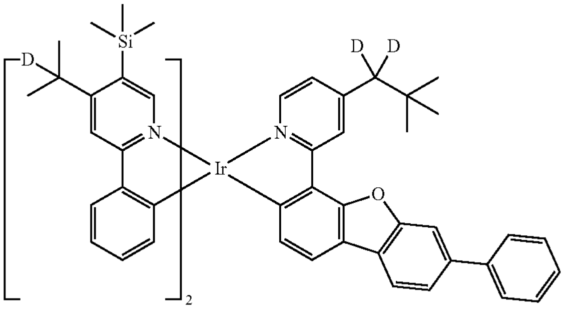
2367
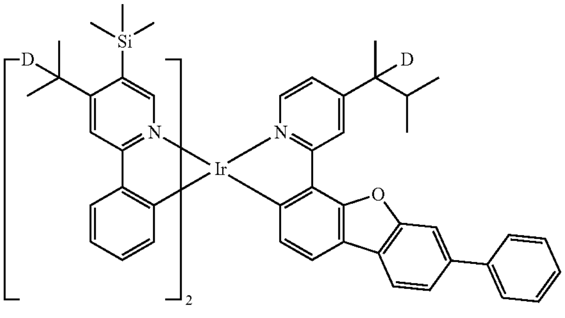
2368
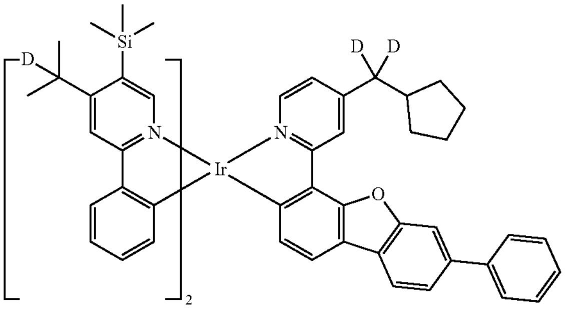
-continued
2369
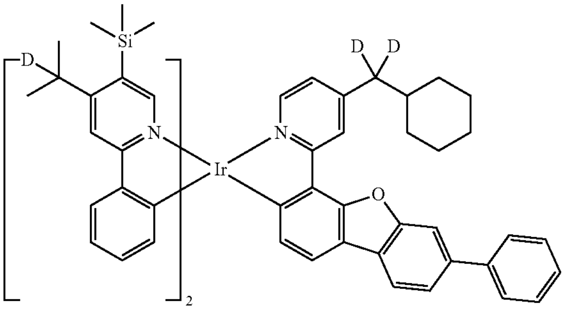
2370
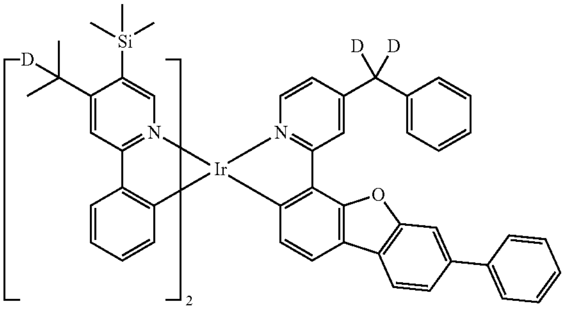
2371
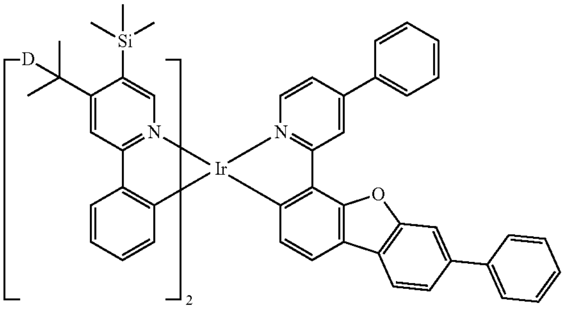
2372
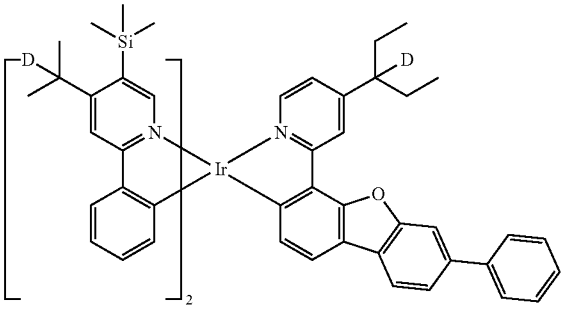

-continued
2373
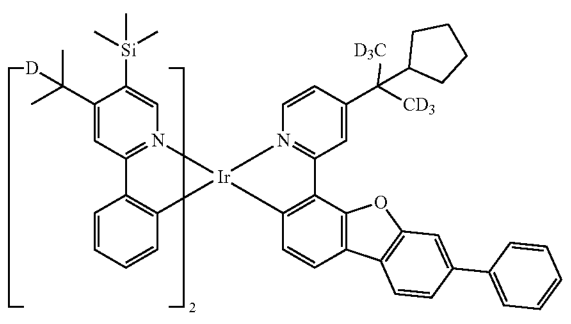
2374
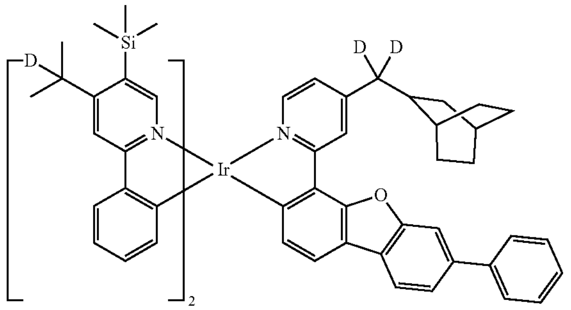
2375
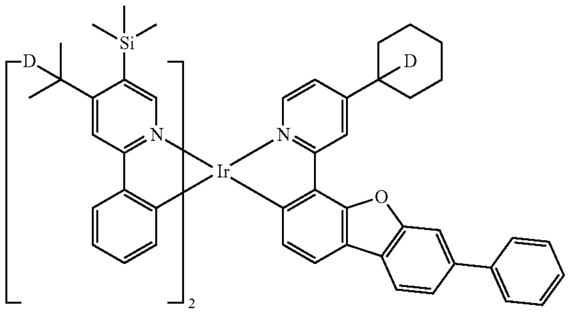
2376
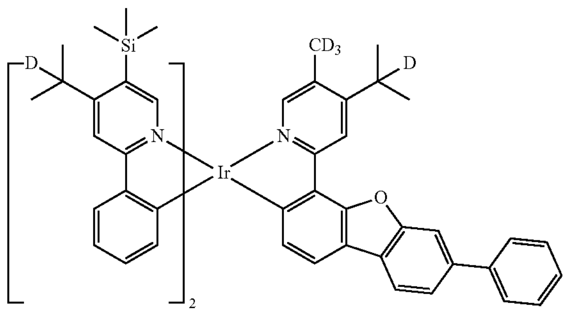
-continued
2377
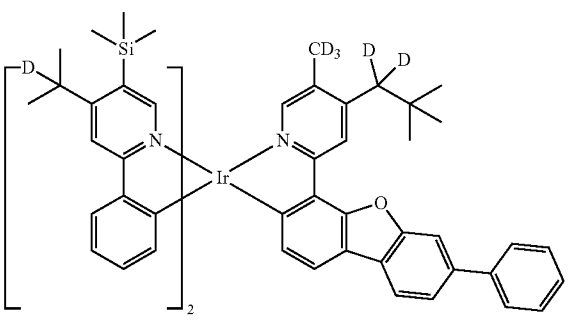
2378
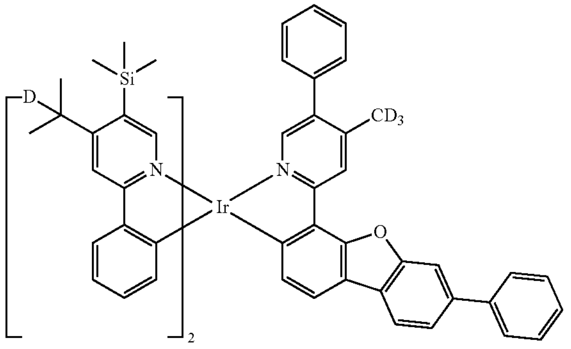
2379
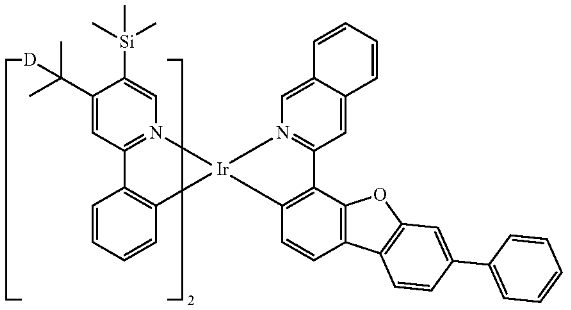
2380
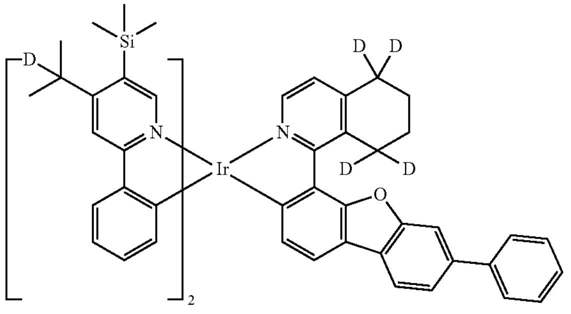

2381
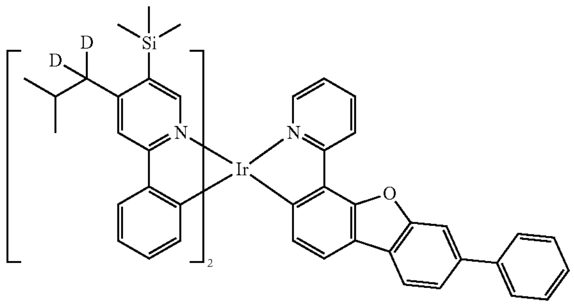
2382
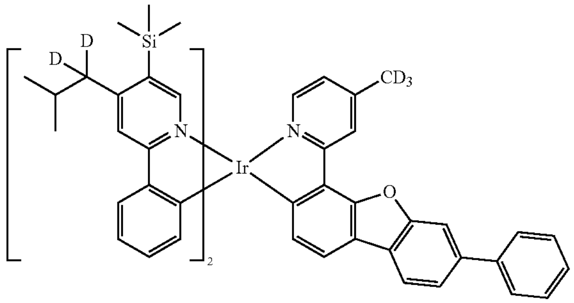
2383
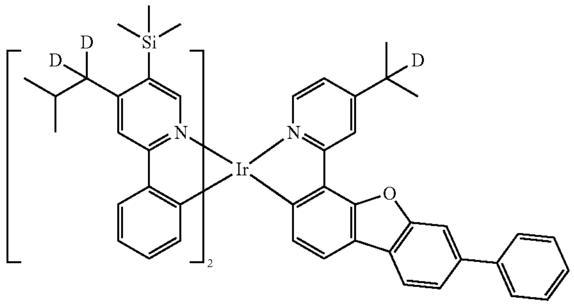
2384
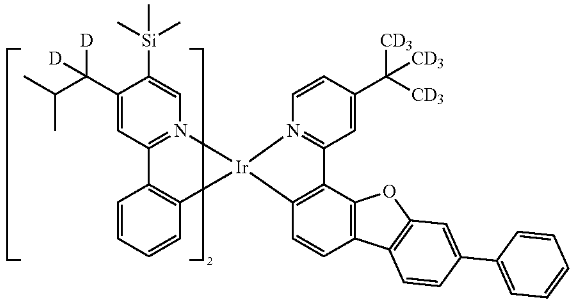
2385
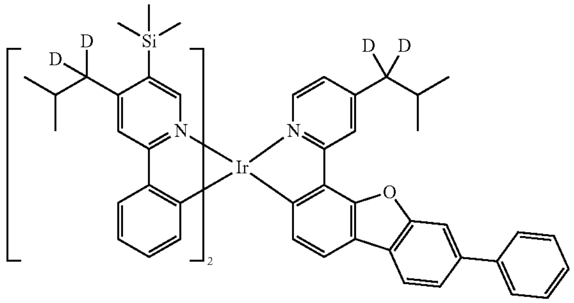
-continued
2386
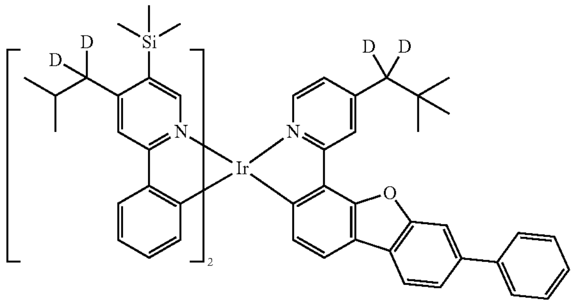
2387
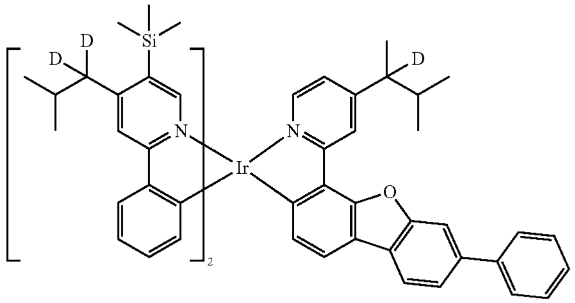
2388
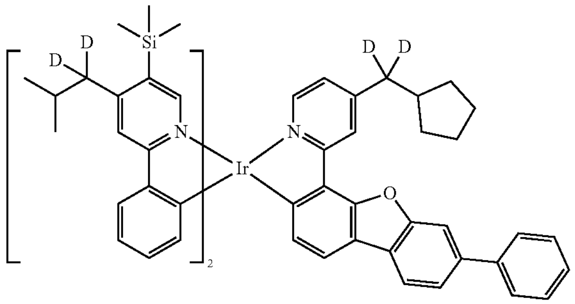
2389
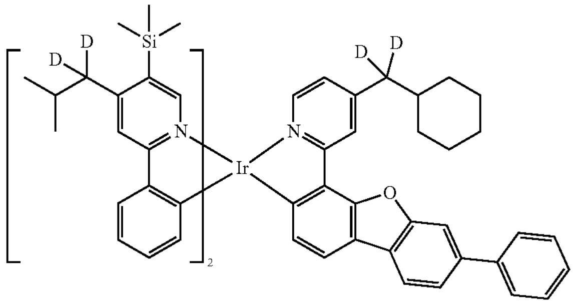
2390
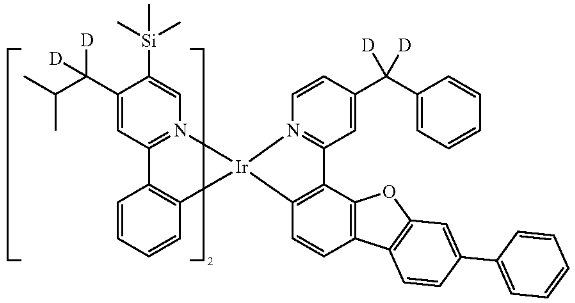

-continued
2391
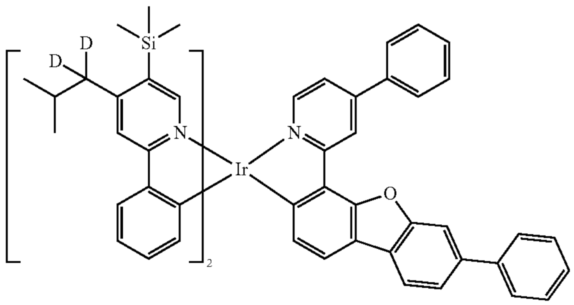
2392
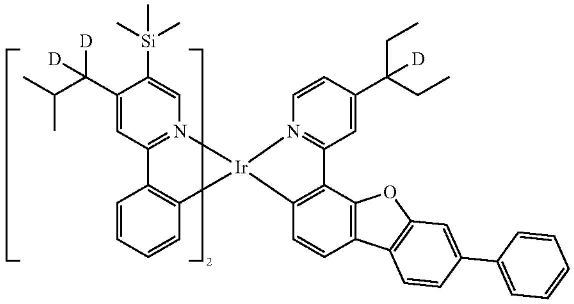
2393
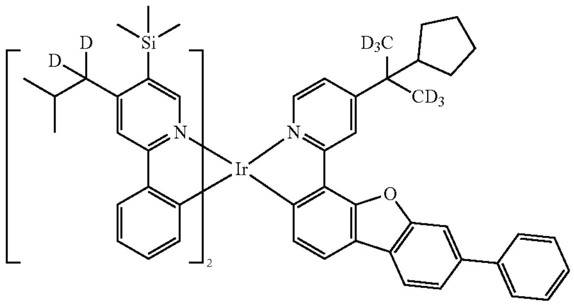
2394
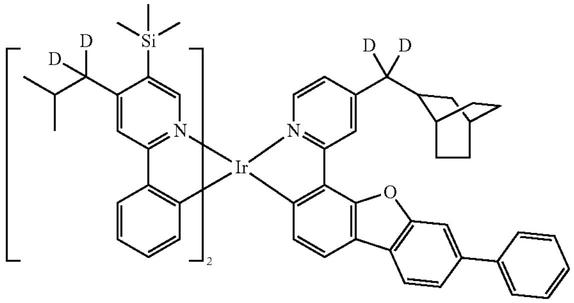
2395
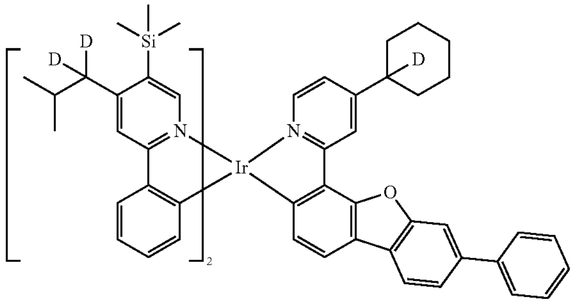
-continued
2396
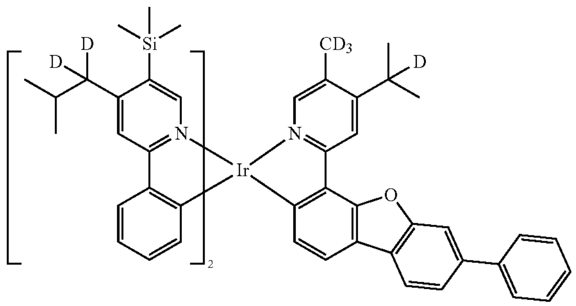
2397
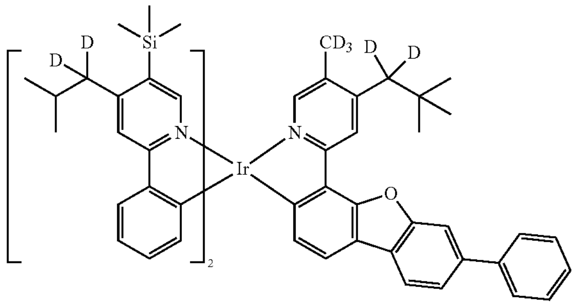
2398
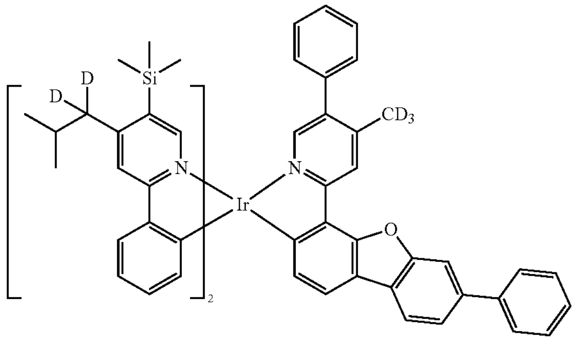
2399
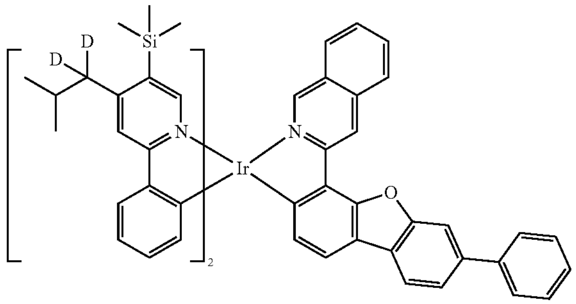

-continued
2400
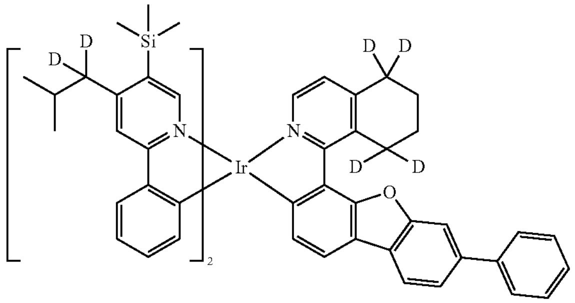
2401
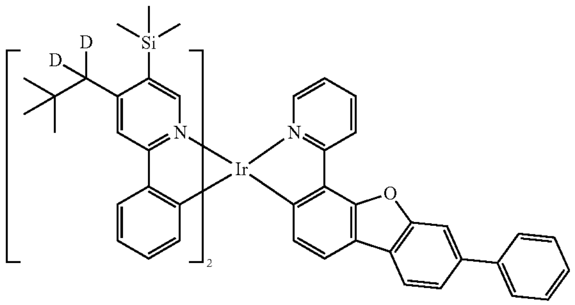
2402
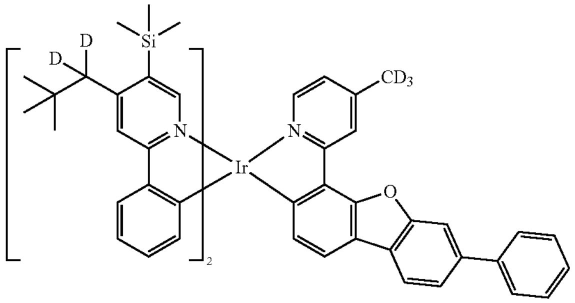
2403
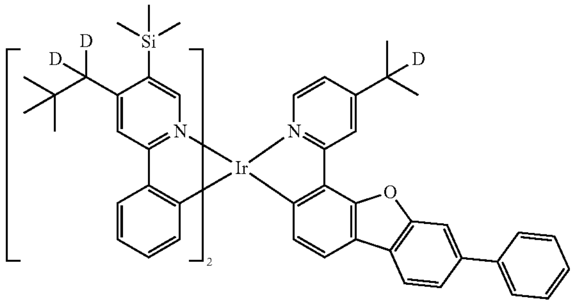
2404
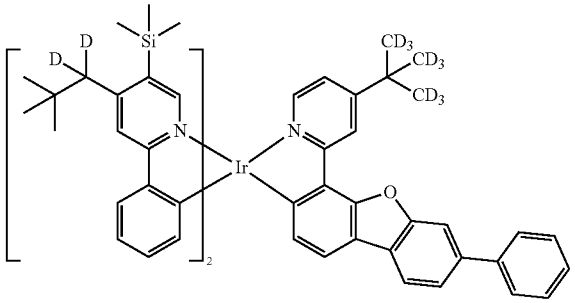
-continued
2405
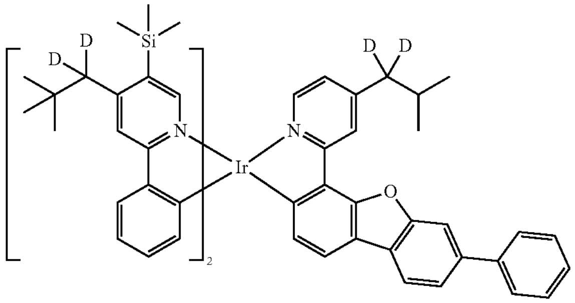
2406
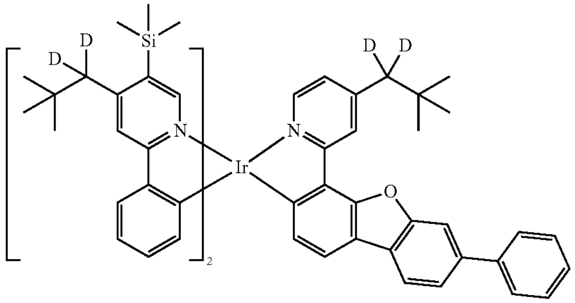
2407
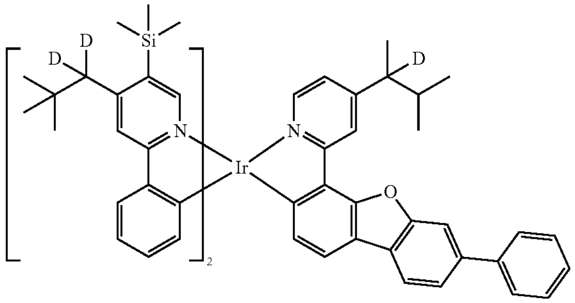
2408
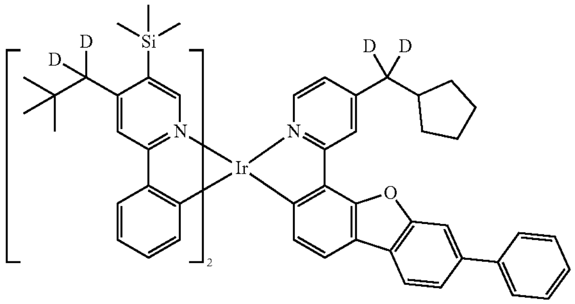
2409
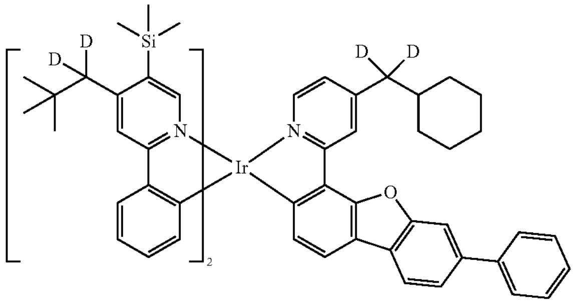

-continued
2410
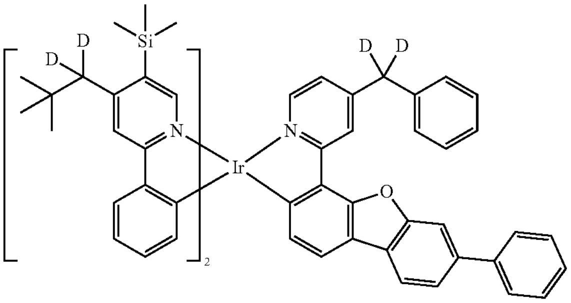
2411
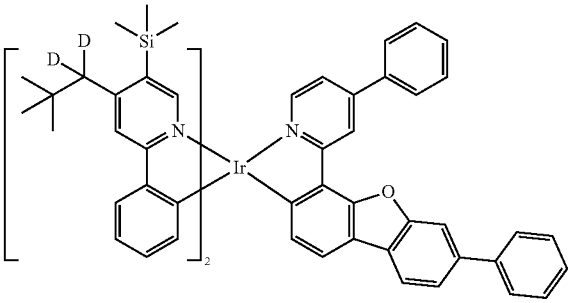
2412
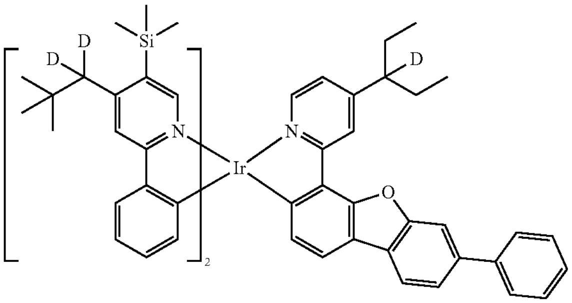
2413
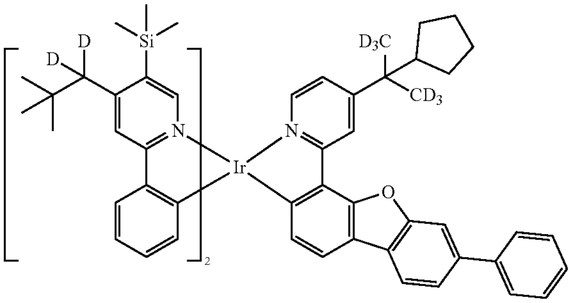
2414
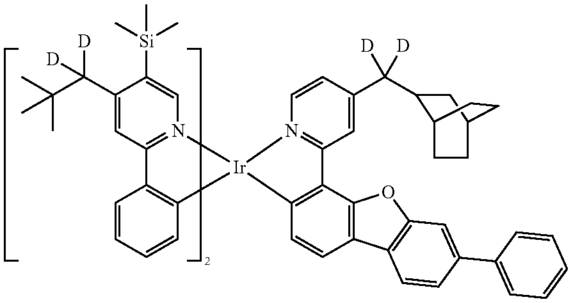
-continued
2415
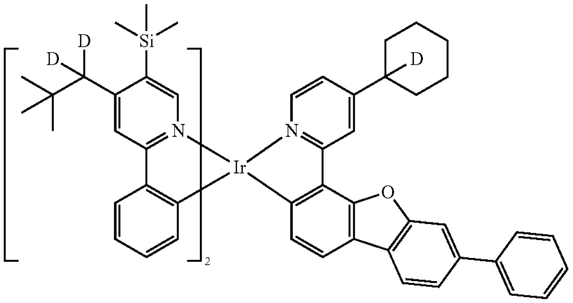
2416
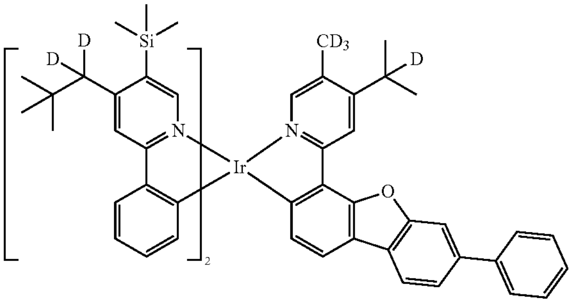
2417
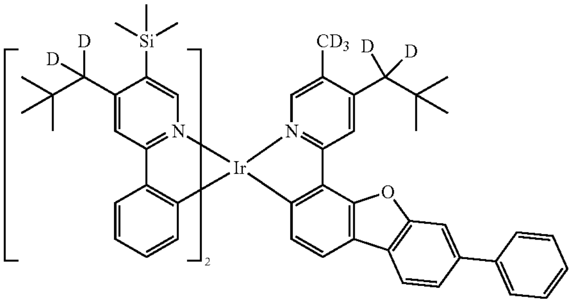
2418
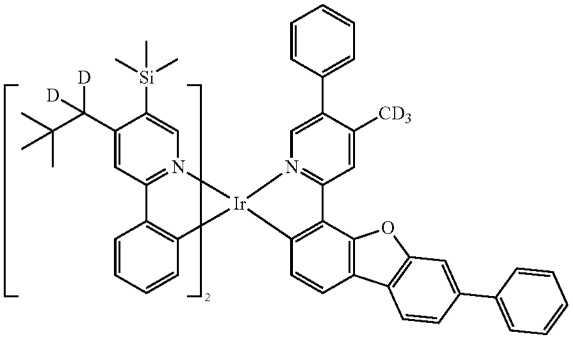

2419
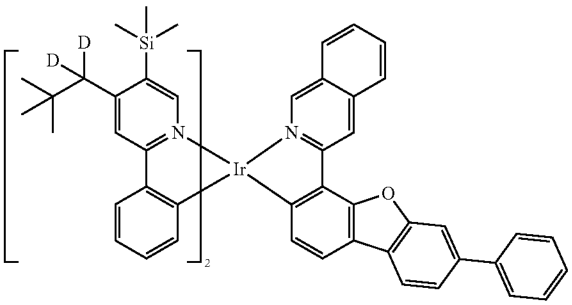
2420
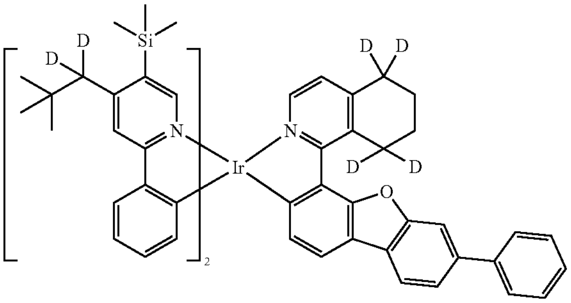
2821
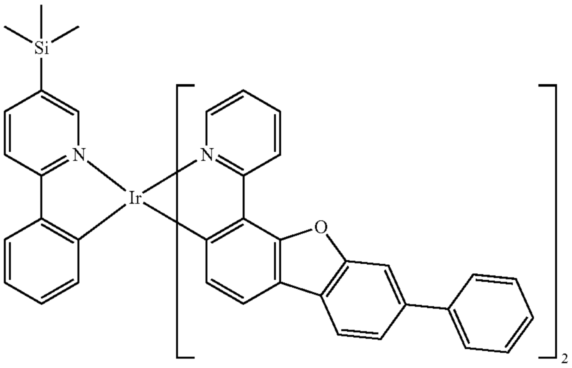
2822
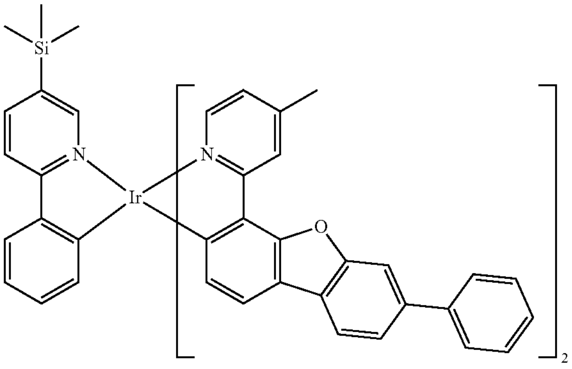
2823
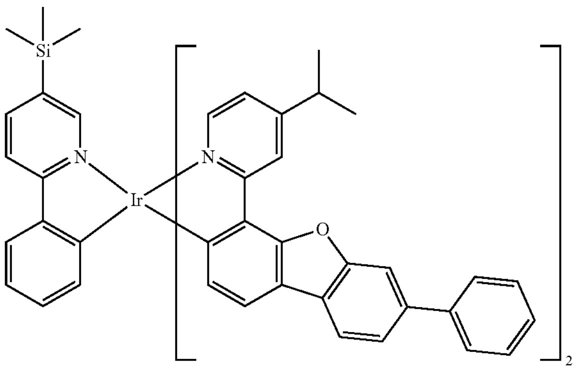
2824
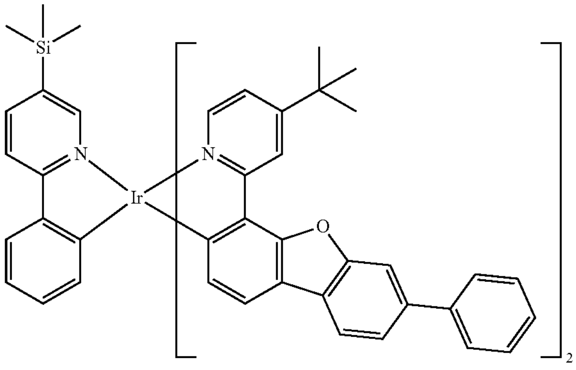
2825
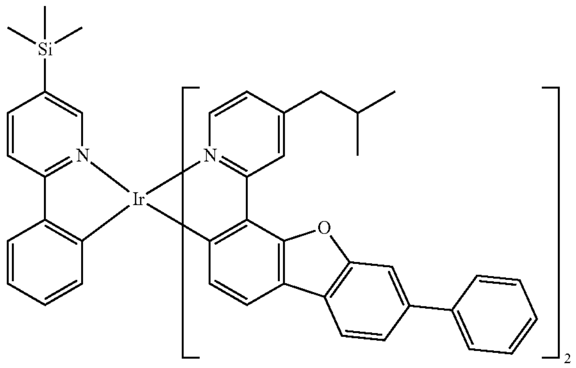
2826
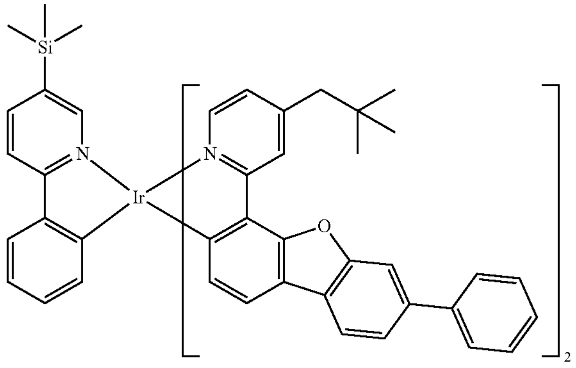

-continued
2827
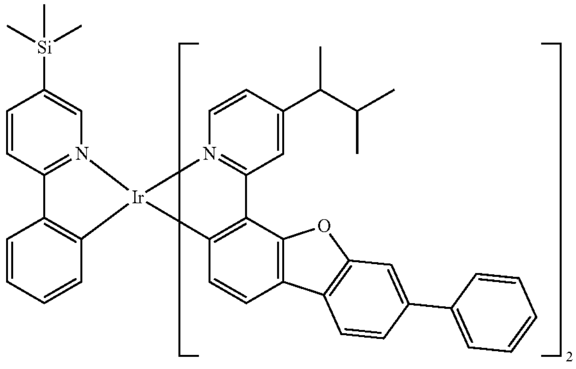
2828
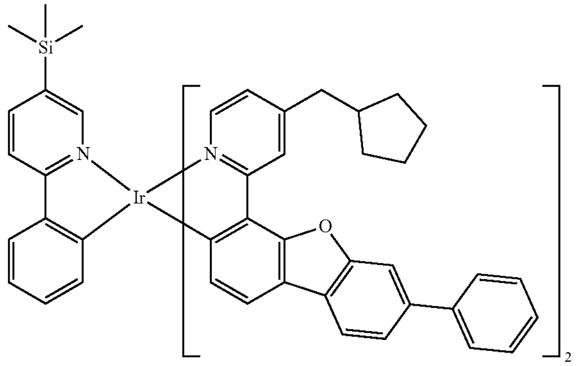
2829
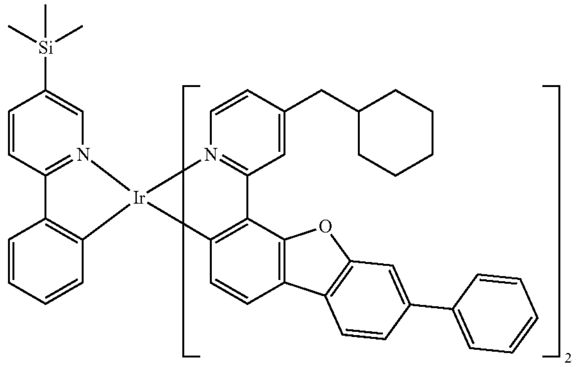
2830
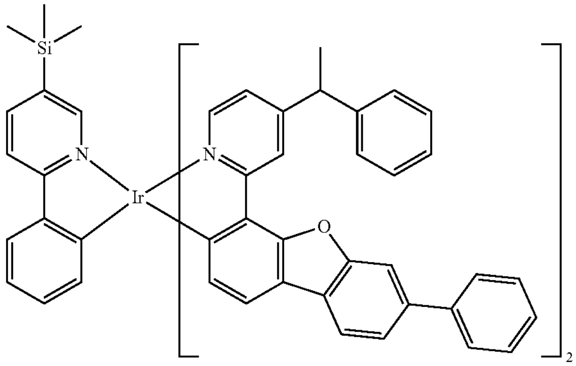
-continued
2831
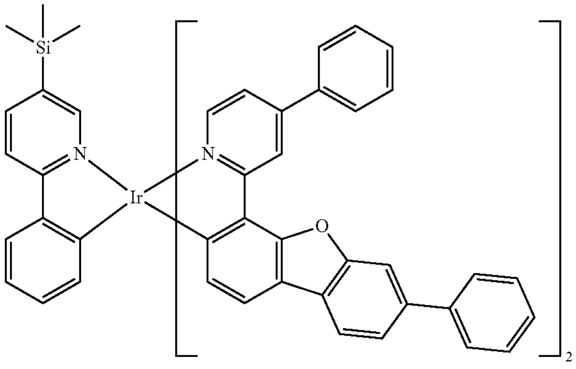
2832
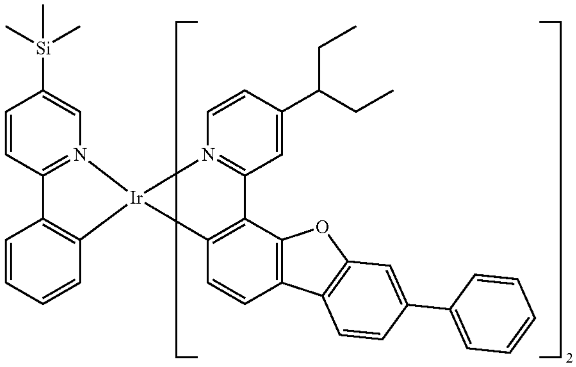
2833
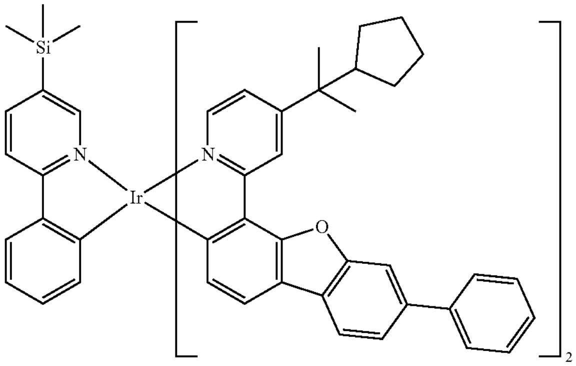
2834
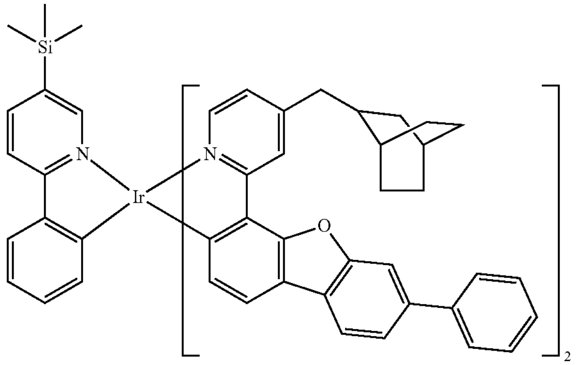

-continued
2835
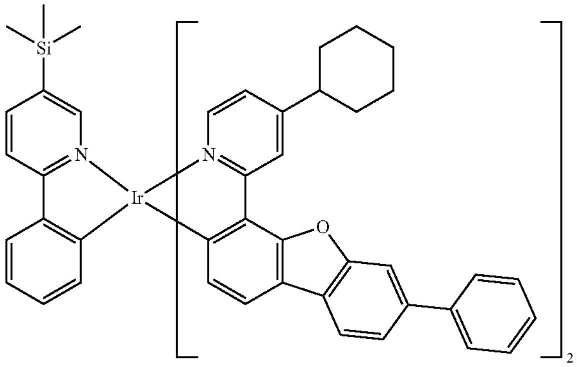
2836
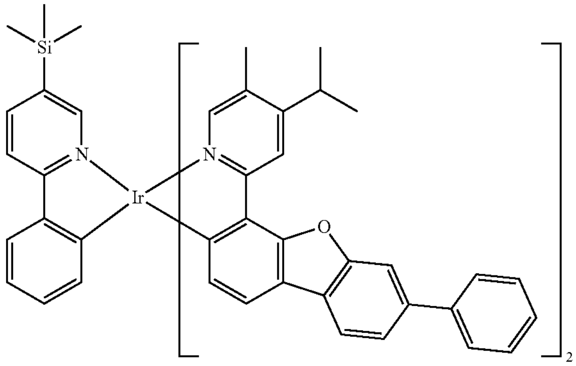
2837
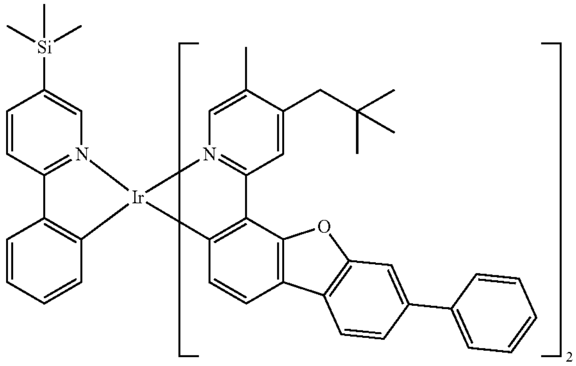
2838
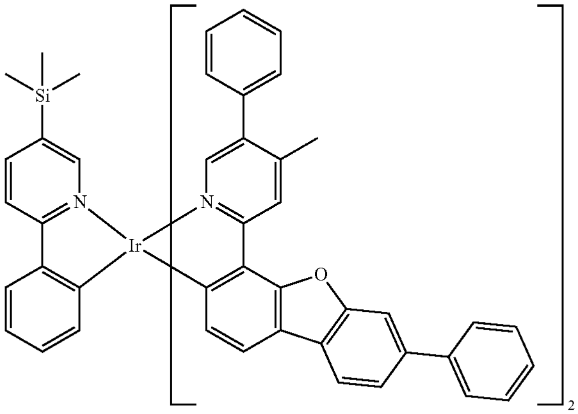
-continued
2839
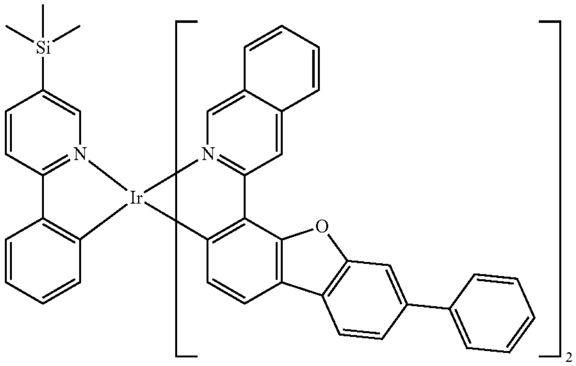
2840
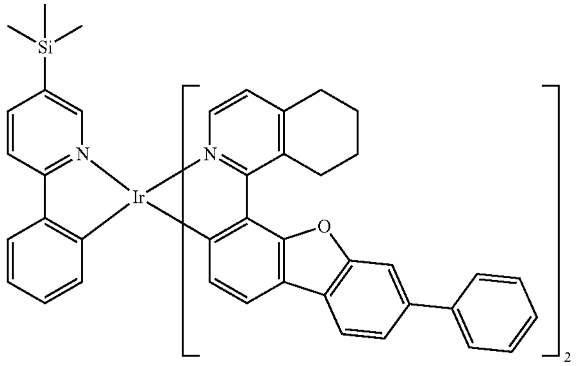
2861
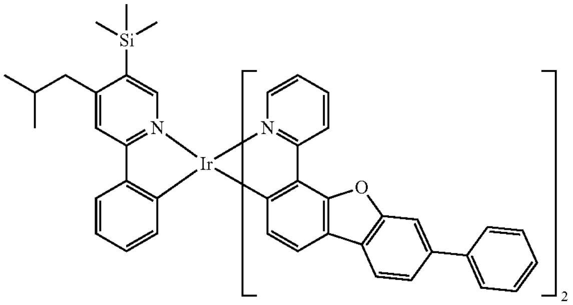
2862
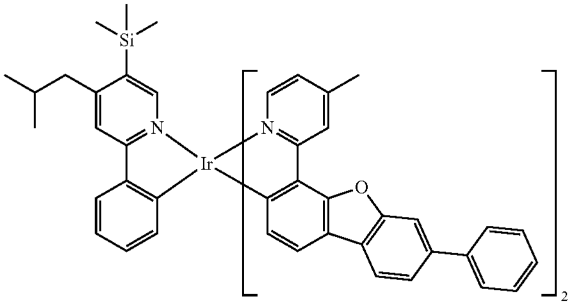

-continued
2863
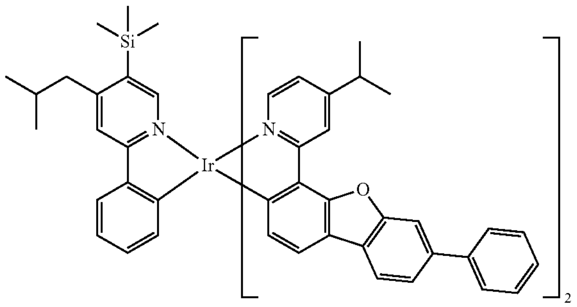
2864
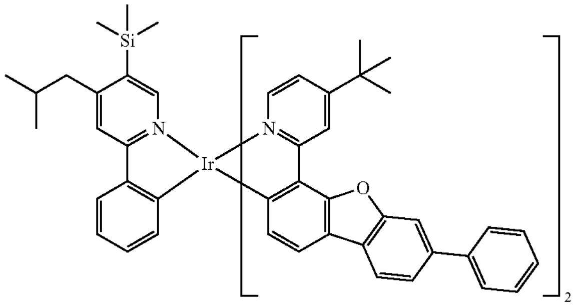
2865
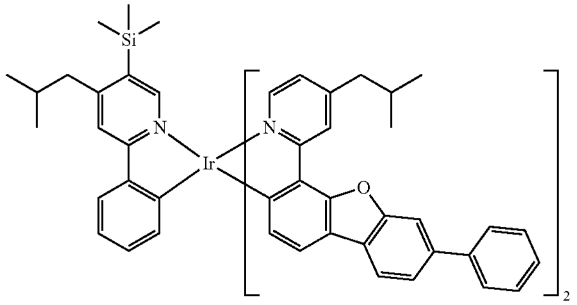
2866
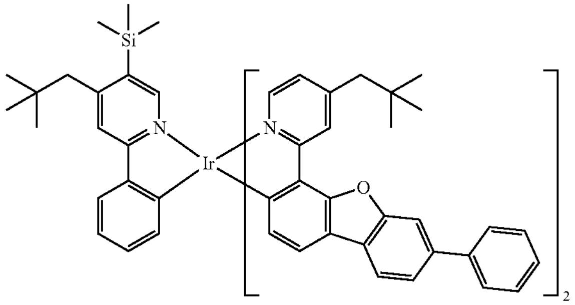
-continued
2867
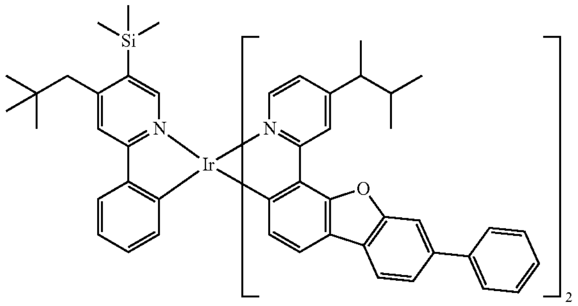
2868
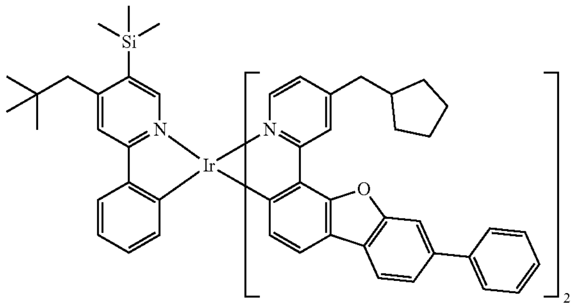
2869
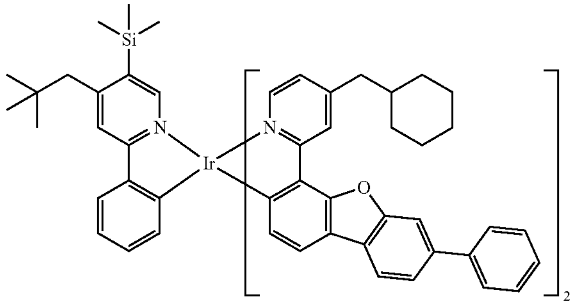
2870
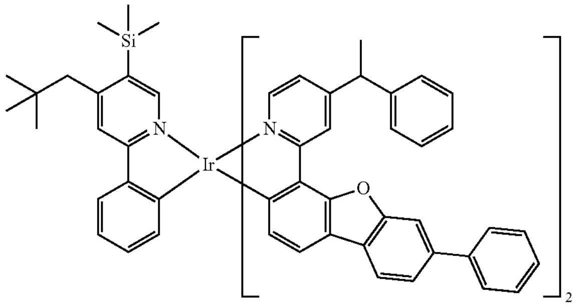
2871
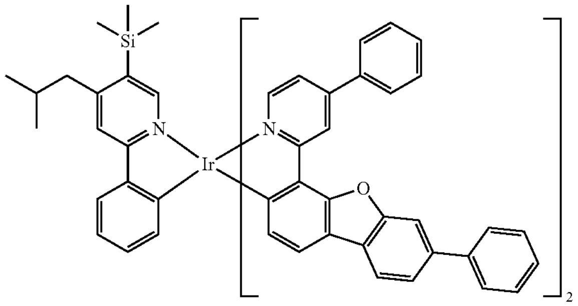

-continued
2872
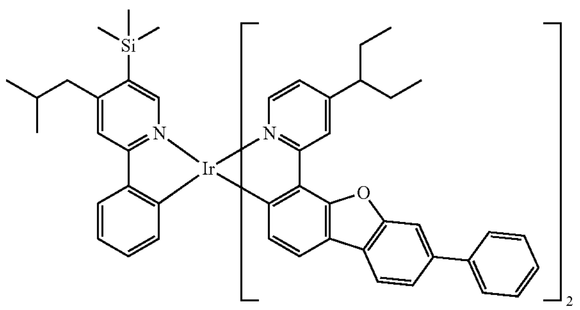
2873
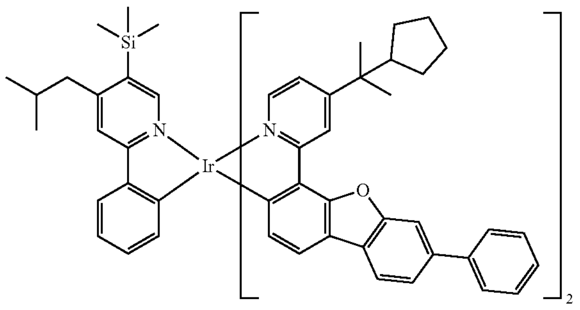
2874
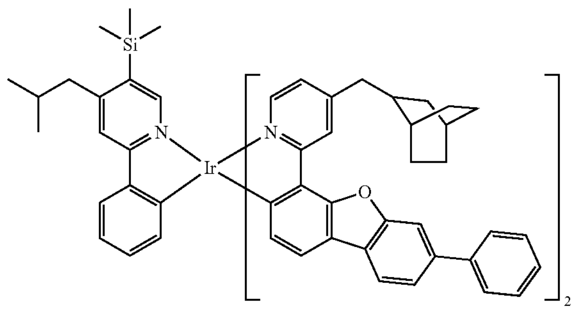
2875
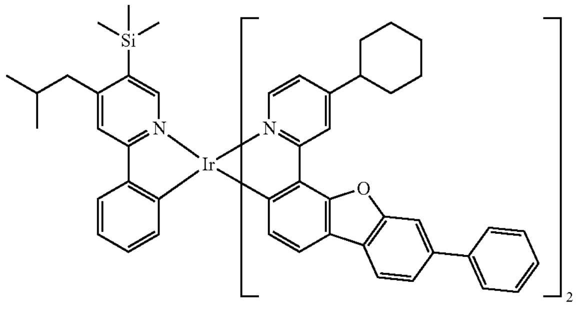
-continued
2876
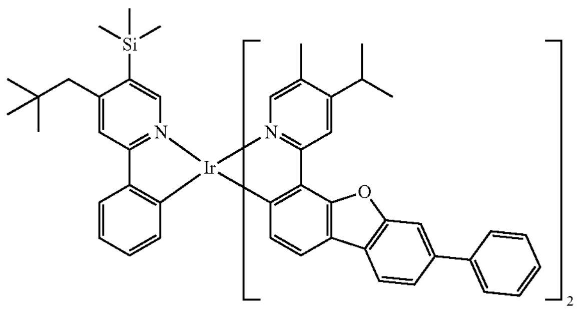
2877
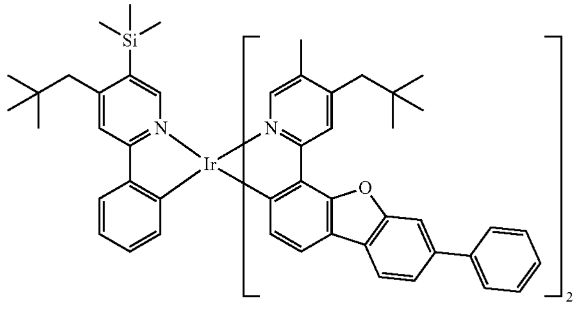
2878
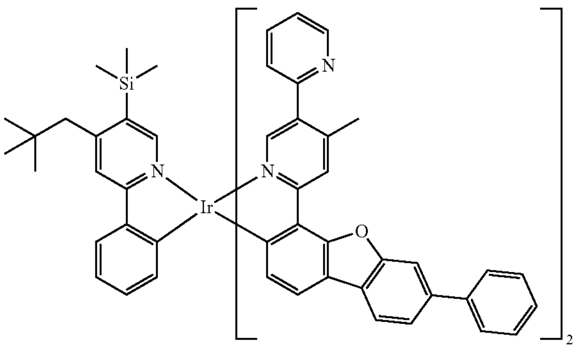
2879
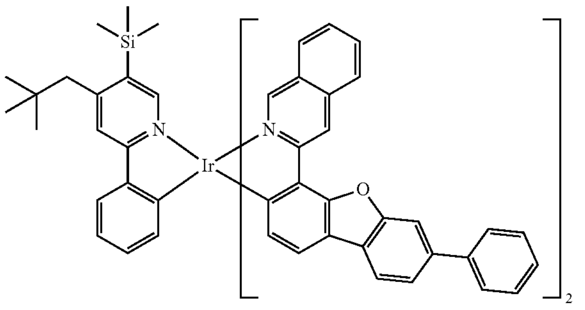

-continued
2880
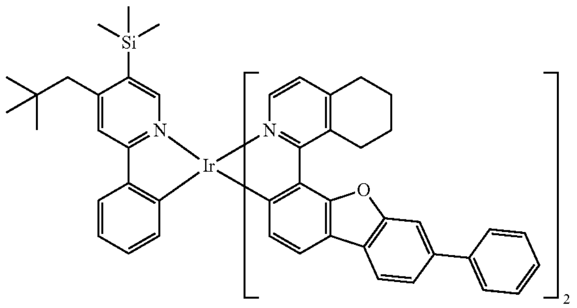
3121
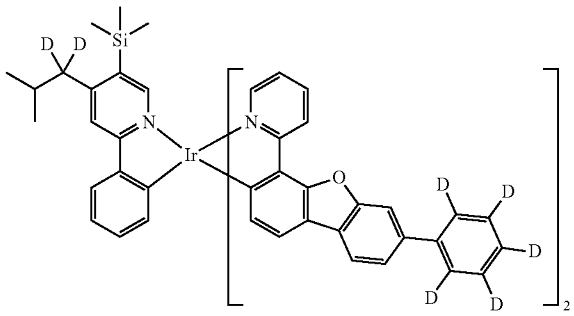
3122
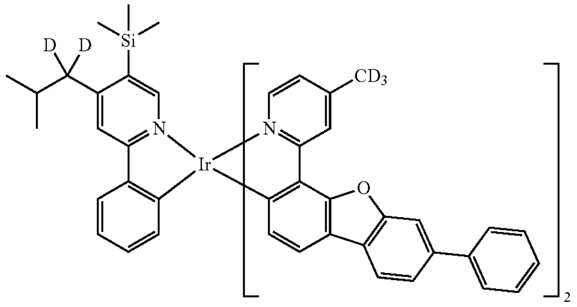
3123
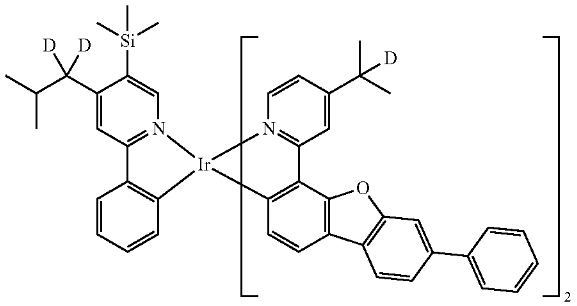
-continued
3124
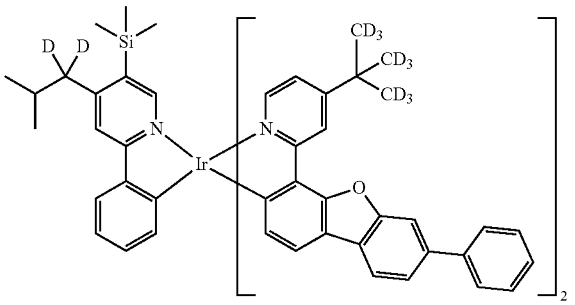
3125
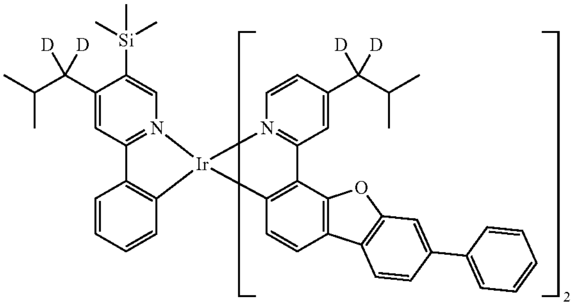
3126
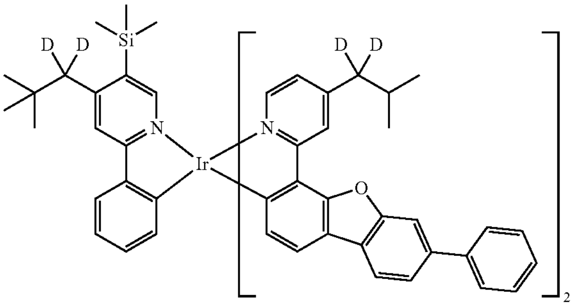
3127
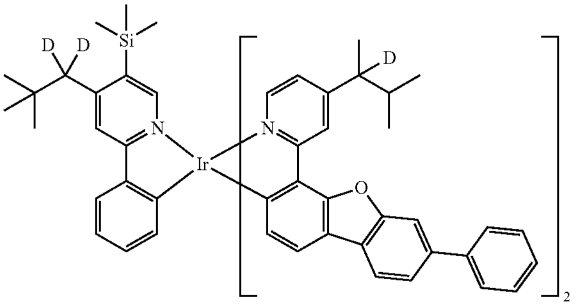
3128
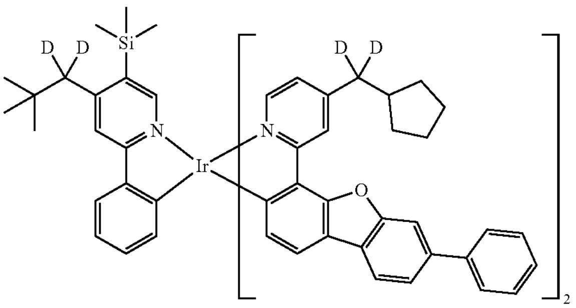

-continued
3129
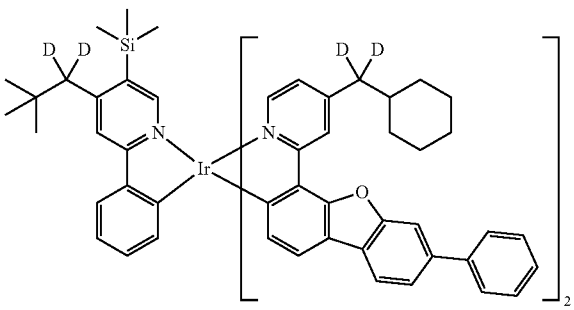
3130
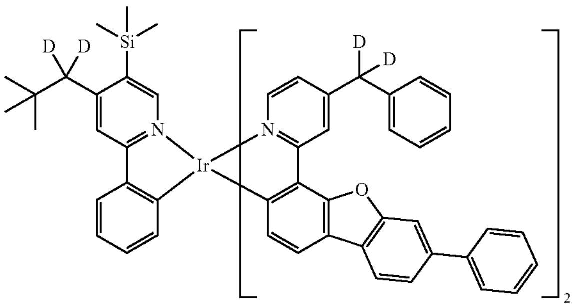
3131
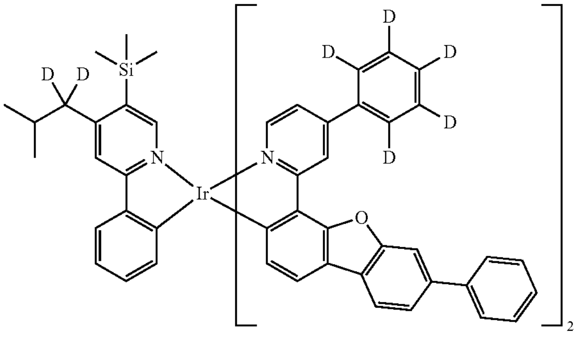
3132
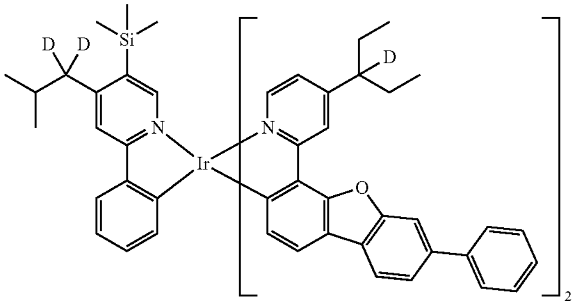
-continued
3133
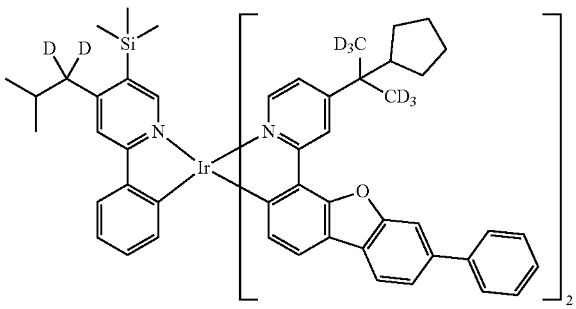
3134
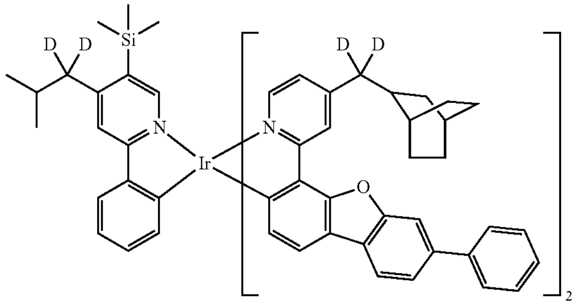
3135
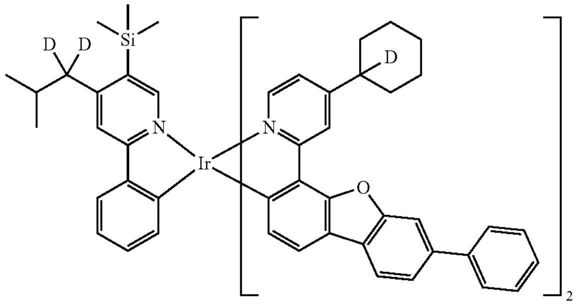
3136
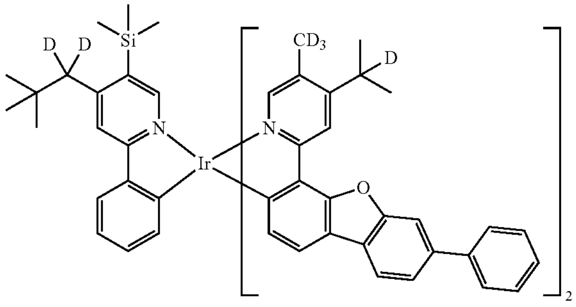

-continued
3137
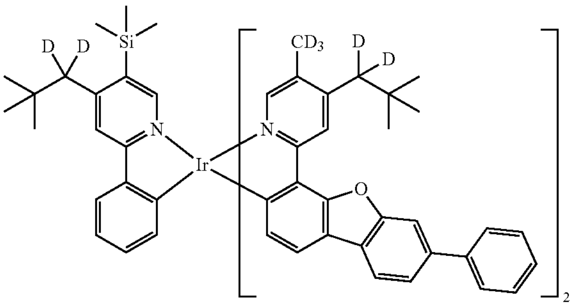
3138
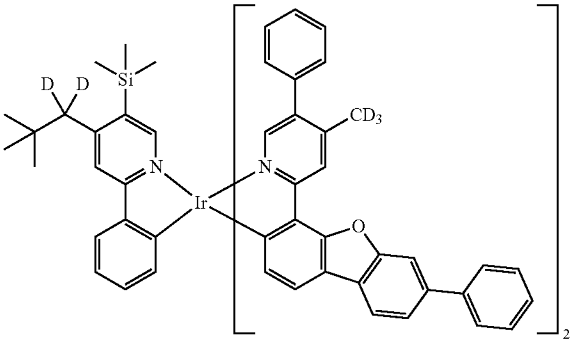
3139
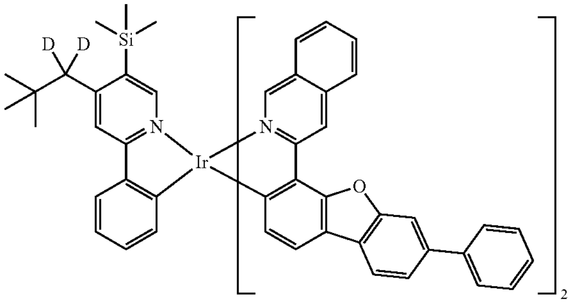
3140
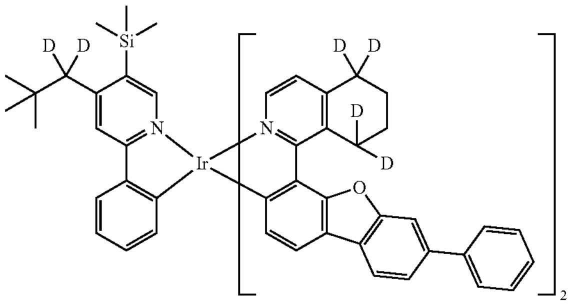
-continued
3481
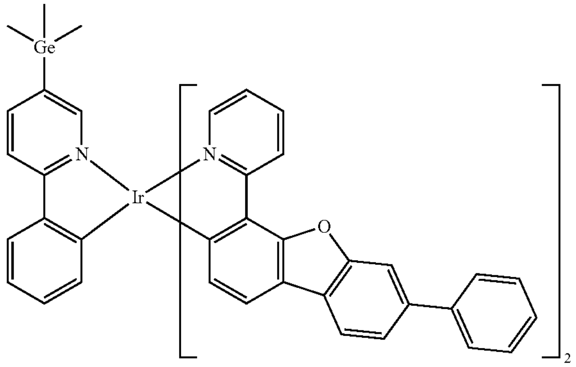
3482
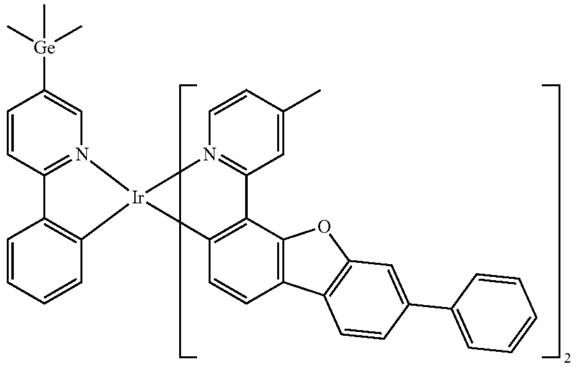
3483
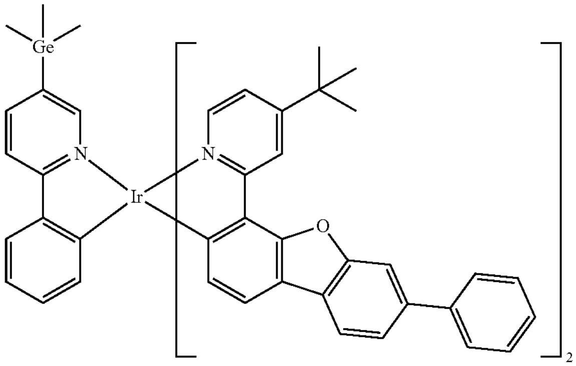
3484
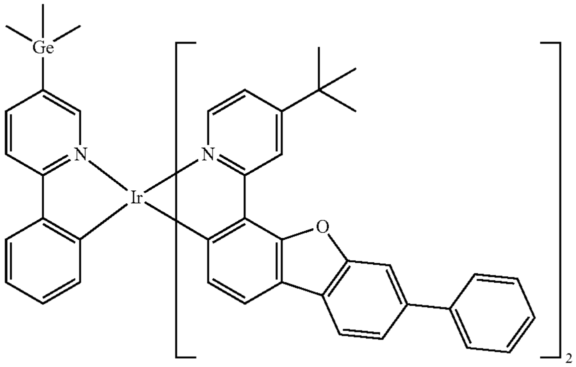

-continued
3485
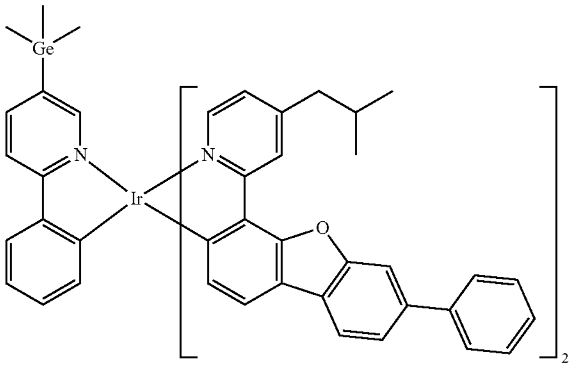
3486
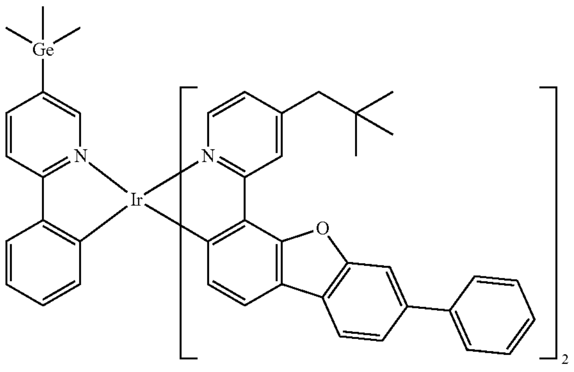
3487
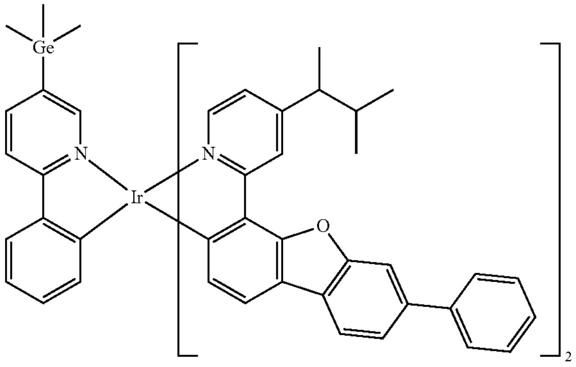
3488
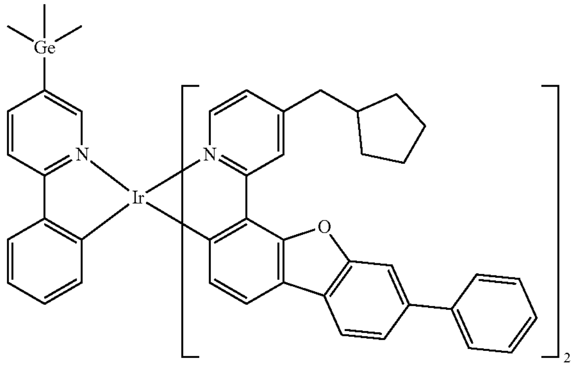
-continued
3489
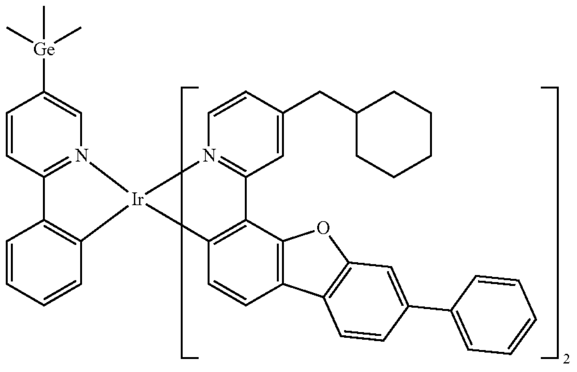
3490
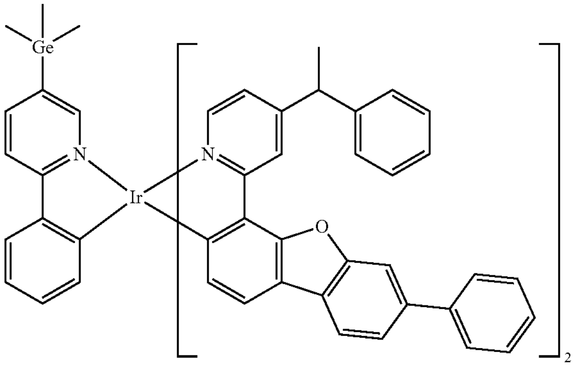
3491
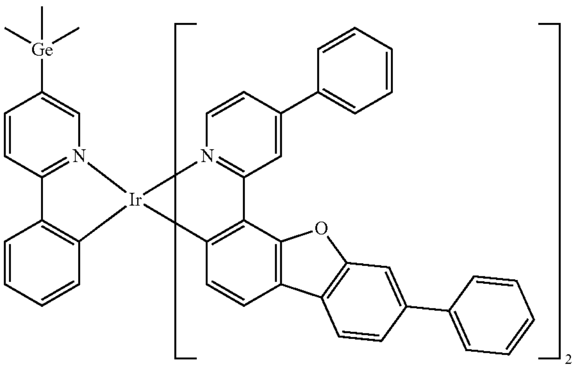
3492
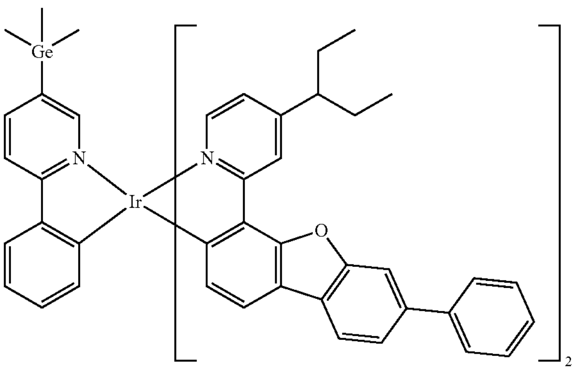

-continued
3493
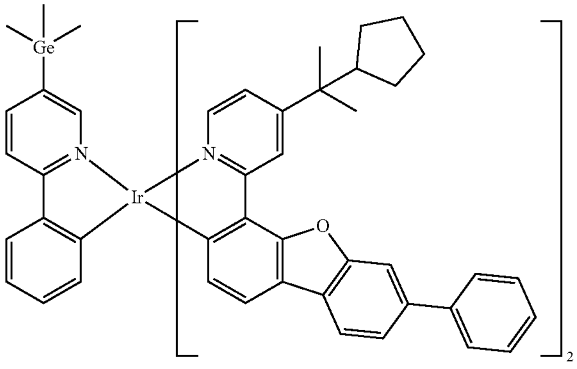
3494
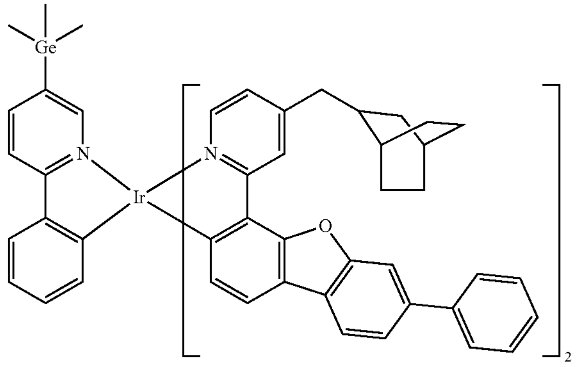
3495
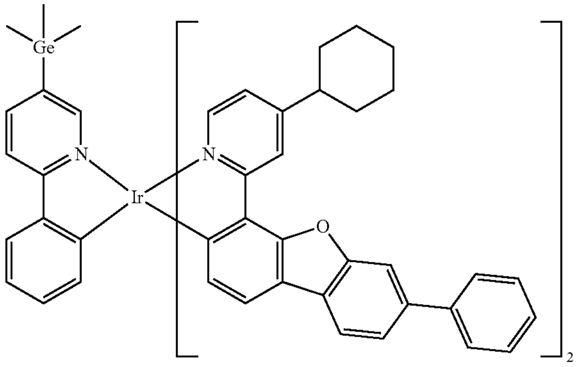
3496
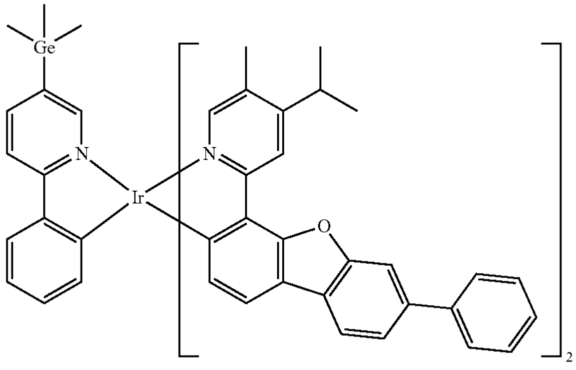
-continued
3497
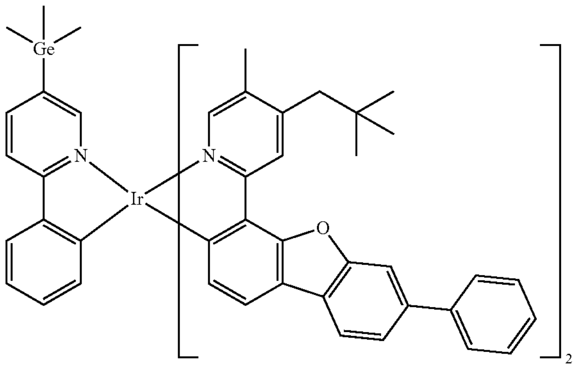
3498
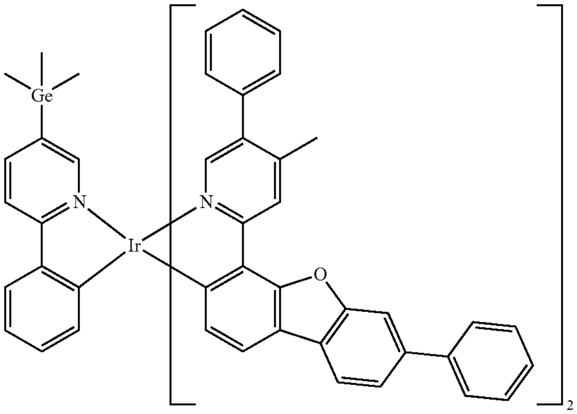
3499
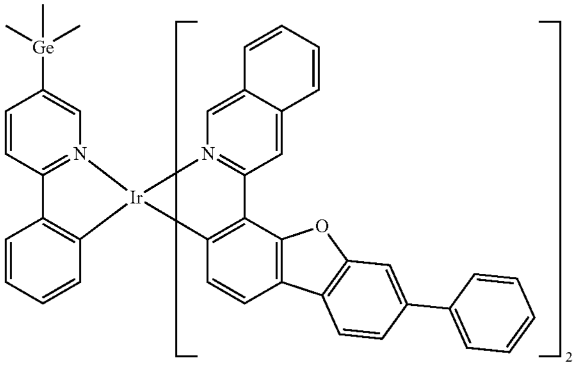
3500
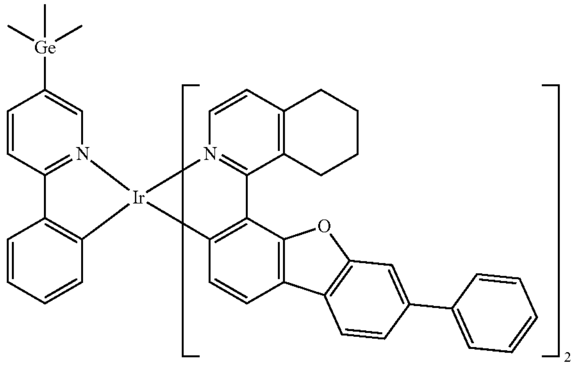

-continued
3781
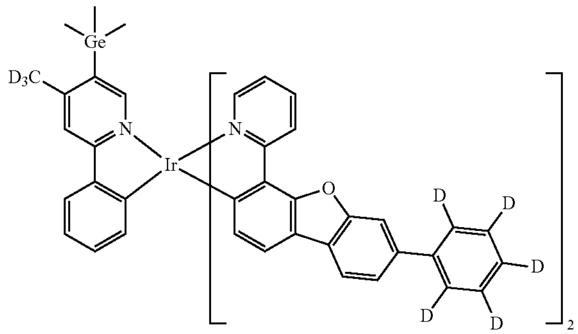
3782
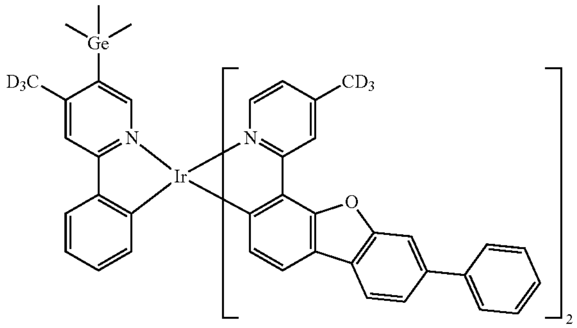
3783
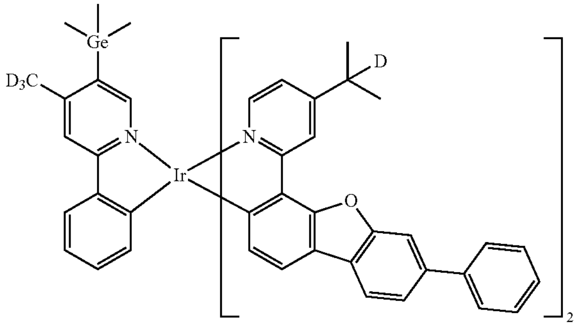
3784
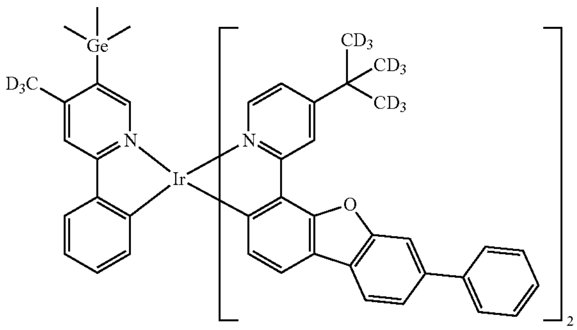
-continued
3785
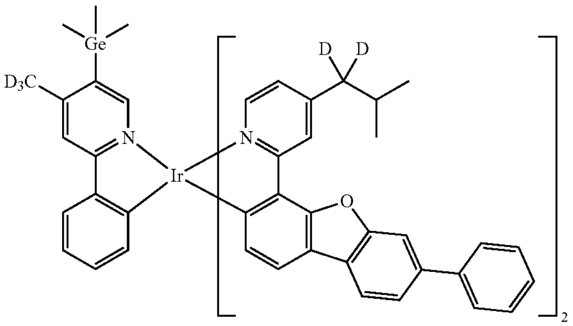
3786
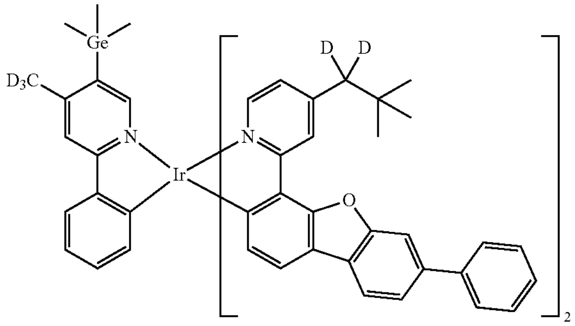
3787
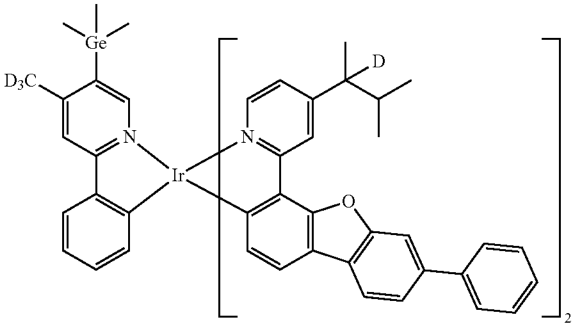
3788
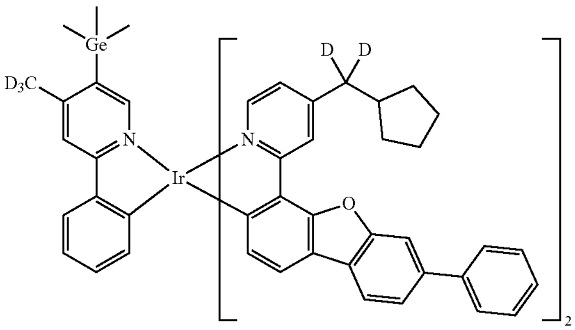

-continued
3789
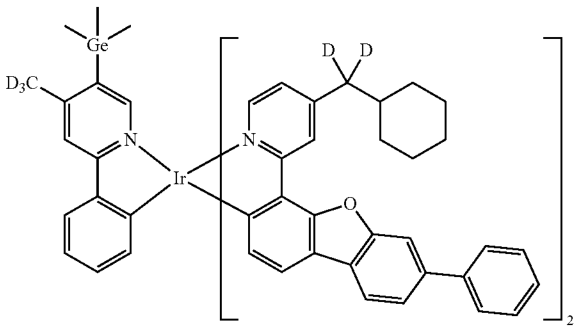
3790
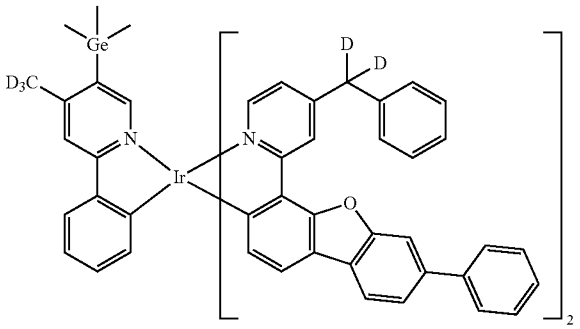
3791
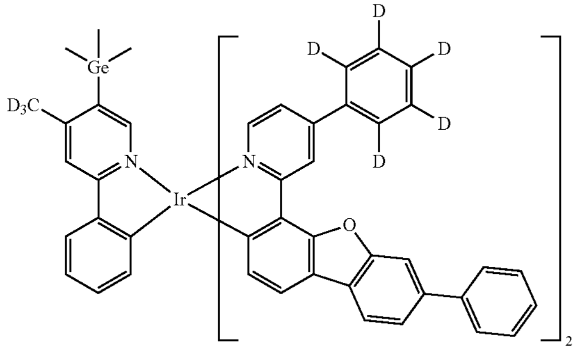
3792
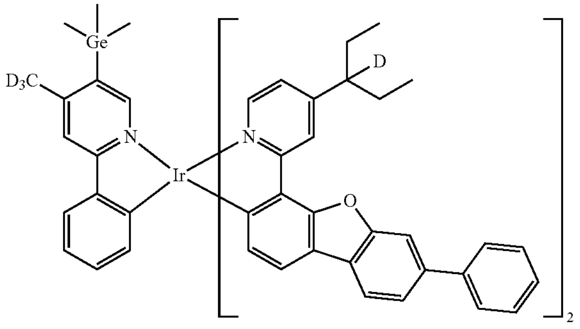
-continued
3793
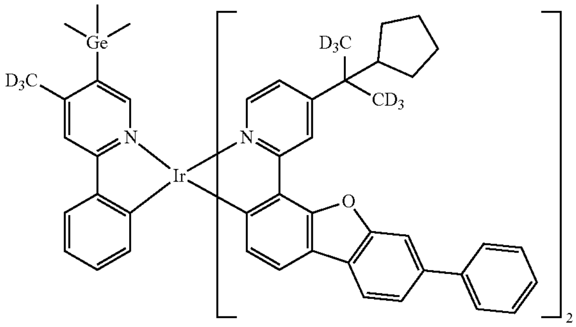
3794
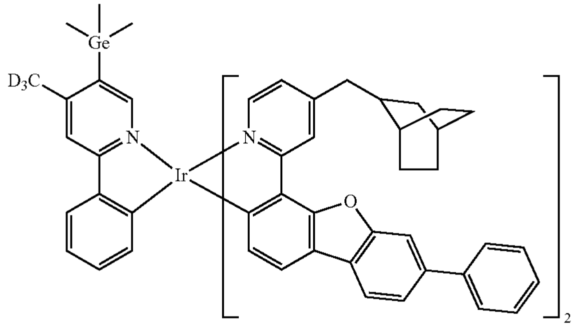
3795
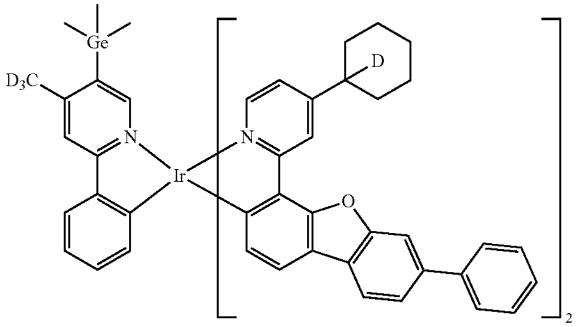
3796
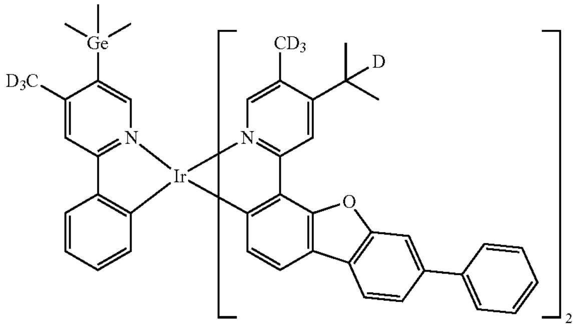

-continued
3797
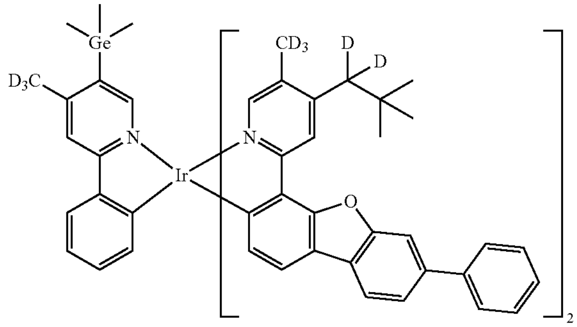
3798
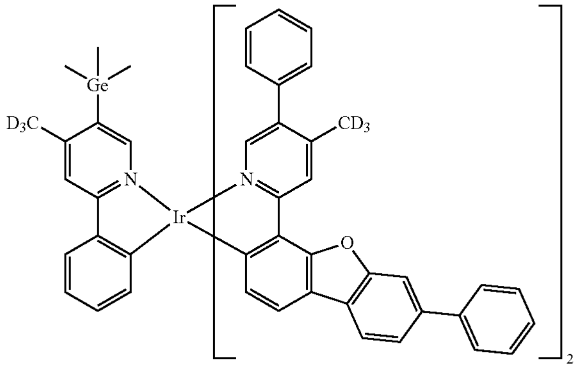
3799
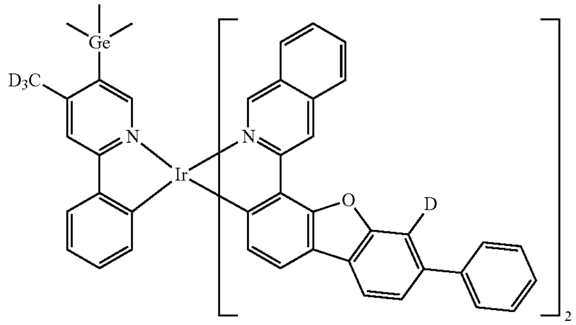
3800
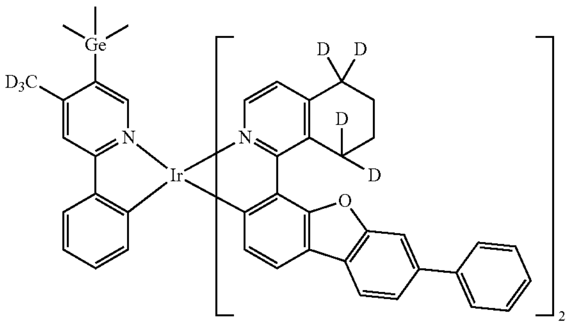
-continued
Group 2-7
D1
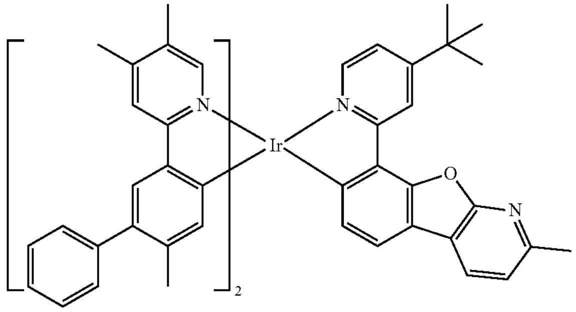
D2
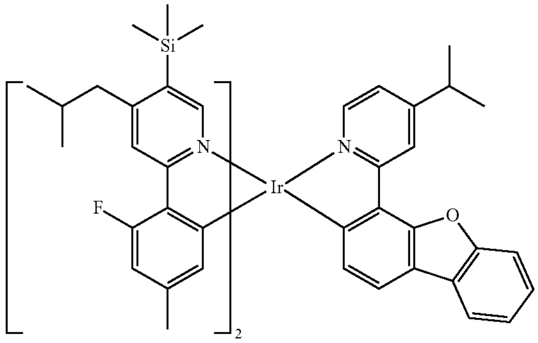
D3
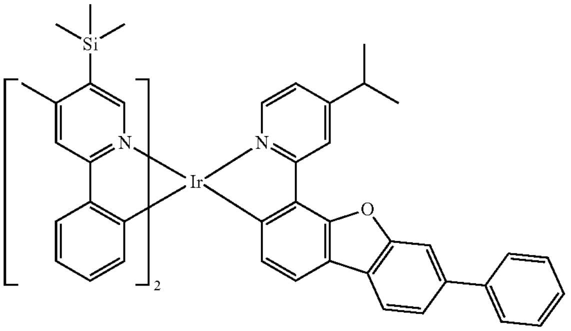
D4
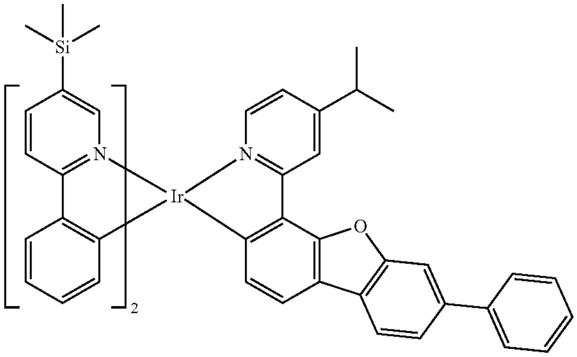

-continued

D5

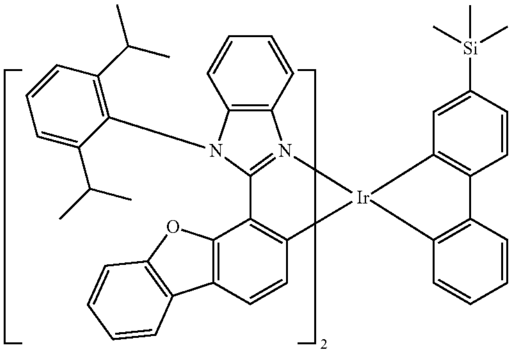

D6

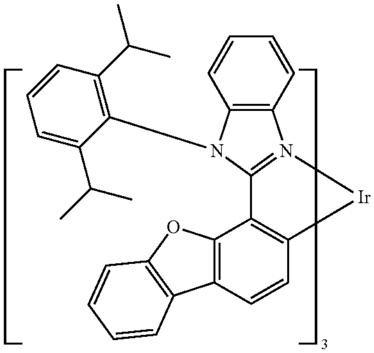

D7

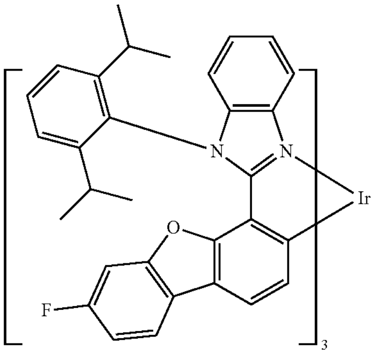

D8

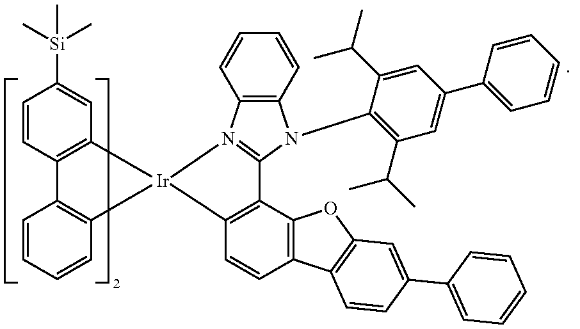

In the present specification, OMe is a methoxy group, TMS is a trimethylsilyl group, and TMG is a trimethylgermyl group.

The first host and the second host may each include a hole-transporting compound, an electron-transporting compound, a bipolar compound, or any combination thereof. Each of the first host and the second host may not include a transition metal.

In an embodiment, the first host and the second host may each include a hole-transporting compound and an electron-transporting compound, and the hole-transporting compound and the electron-transporting compound may be different from each other.

In an embodiment, the hole-transporting compound may include at least one π-electron rich $C_3$-$C_{60}$ cyclic group, and may not include an electron-transporting group. Examples of the electron-transporting group may include a cyano group, a fluoro group, a π-electron deficient nitrogen-containing cyclic group, a phosphine oxide group, and a sulfoxide group.

The "π-electron deficient nitrogen-containing cyclic group" as used herein may be a $C_1$-$C_{60}$ heterocyclic group which has at least one *—N=*' moiety as a ring-forming moiety. Examples of the π-electron deficient nitrogen-containing cyclic group may include a triazine group and an imidazole group.

The "π-electron rich $C_3$-$C_{60}$ cyclic group" may be a $C_3$-$C_{60}$ cyclic group that does not include a *—N=*' moiety as a ring-forming moiety. Examples of the π-electron rich $C_3$-$C_{60}$ cyclic group may include a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrenobenzofuran group, a phenanthrenobenzothiophene group, a naphthocarbazole group, a dinaphthofuran group, a dinaphthothiophene group, and a dibenzocarbazole group.

For example, the hole-transporting compound may include two or more carbazole groups.

In an embodiment, the electron-transporting compound may be a compound including at least one electron-transporting group. The electron-transporting group may be a cyano group, a fluoro group, a π-electron deficient nitrogen-containing $C_1$-$C_{60}$ cyclic group, a phosphine oxide group, a sulfoxide group, or a combination thereof. In an embodiment, the electron-transporting compound may include a triazine group.

For example, the electron-transporting compound may include at least one electron-transporting group (for example, a triazine group) and at least one π-electron rich $C_3$-$C_{60}$ cyclic group (for example, a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrenobenzofuran group, a phenanthrenobenzothiophene group, a naphthocarbazole group, a dinaphthofuran group, a dinaphthothiophene group, a dibenzocarbazole group, or any combination thereof).

In an embodiment, the hole-transporting compound may be a compound represented by Formula 6:

Formula 6

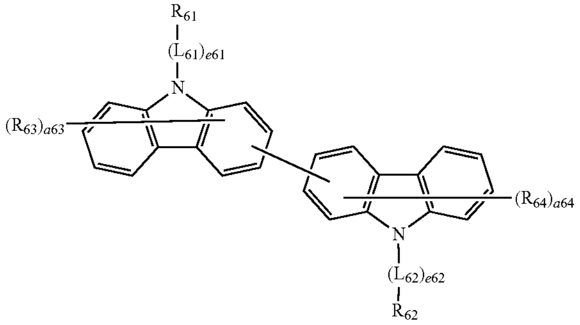

wherein, in Formula 6, $L_{61}$ and $L_{62}$ may each independently be a π-electron rich $C_3$-$C_{60}$ cyclic group that is unsubstituted or substituted with deuterium, a $C_1$-$C_{20}$ alkyl group, a deuterated $C_1$-$C_{20}$ alkyl group, a phenyl group, a deuterated phenyl group, a ($C_1$-$C_{20}$ alkyl)phenyl group, a biphenyl group, a deuterated biphenyl group, a ($C_1$-$C_{20}$ alkyl) biphenyl group, —$Si(Q_{33})(Q_{34})(Q_{35})$, or any combination thereof, e61 and e62 may each independently be an integer from 1 to 6, $R_{61}$ to $R_{64}$ may each independently be:

hydrogen, deuterium, a $C_1$-$C_{20}$ alkyl group, or a deuterated $C_1$-$C_{20}$ alkyl group;

a π-electron rich $C_3$-$C_{60}$ cyclic group that is unsubstituted or substituted with deuterium, a $C_1$-$C_{20}$ alkyl group, a deuterated $C_1$-$C_{20}$ alkyl group, a phenyl group, a deuterated a phenyl group, a ($C_1$-$C_{20}$ alkyl)phenyl group, a biphenyl group, a deuterated biphenyl group, a ($C_1$-$C_{20}$ alkyl)biphenyl group, —$Si(Q_{33})(Q_{34})(Q_{35})$, or any combination thereof; or —$Si(Q_3)(Q_4)(Q_5)$, and a63 and a64 may each independently be an integer from 0 to 7.

$Q_3$ to $Q_5$ and $Q_{33}$ to $Q_{35}$ may respectively be the same as those described in the present specification.

In an embodiment, the hole-transporting compound may be a compound represented by Formula 6-1, 6-2, or 6-3:

Formula 6-1

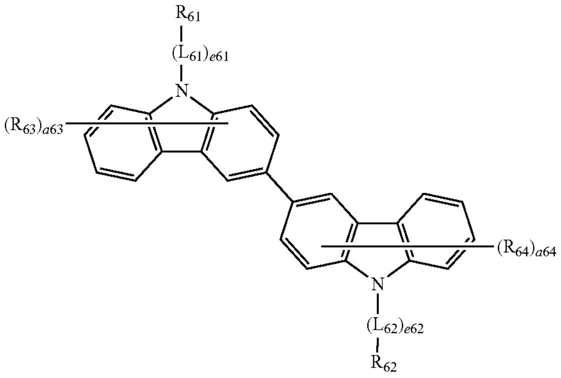

-continued

Formula 6-2

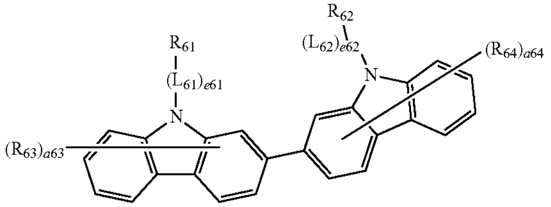

Formula 6-3

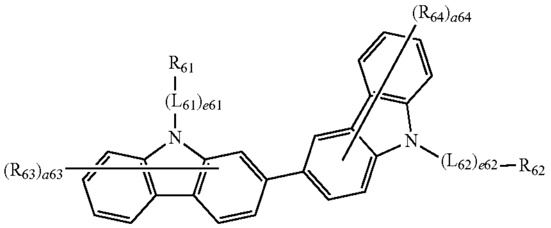

wherein, in Formulae 6-1 to 6-3, $L_{61}$, $L_{62}$, $R_{61}$ to $R_{64}$, e61, e62, a63, and a64 may respectively be the same as those described in the present specification.

In an embodiment, the hole-transporting compound may be one of Compounds H-HT1 to H-HT5:

H-HT1

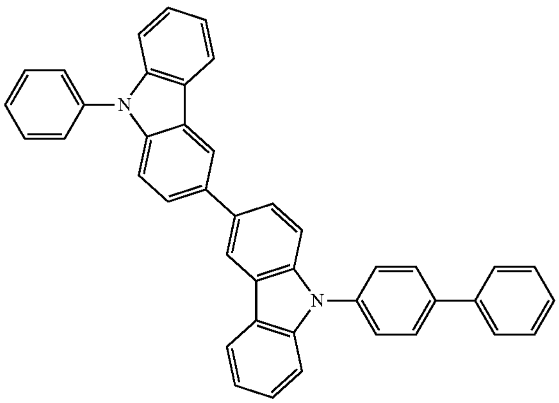

H-HT2

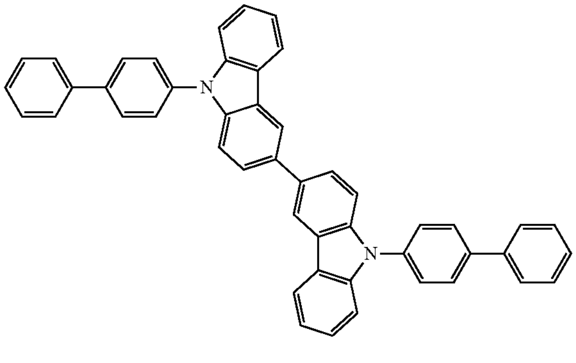

-continued

H-HT3

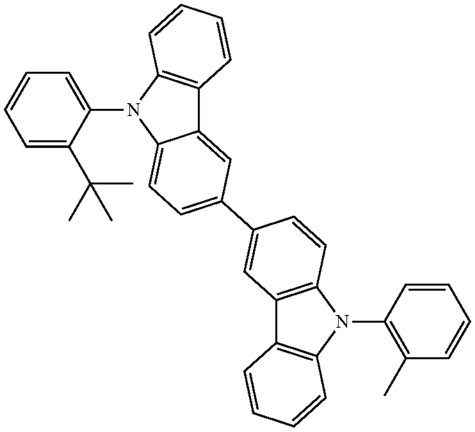

H-HT4

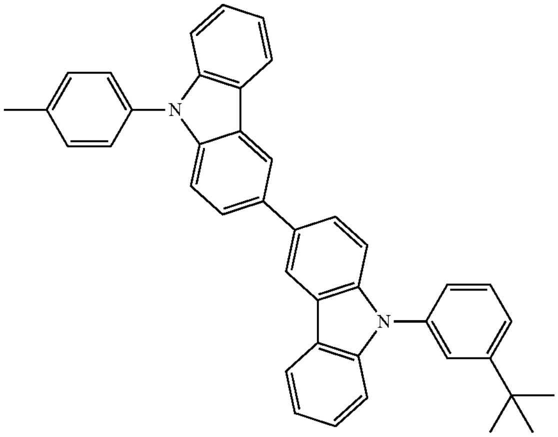

H-HT5

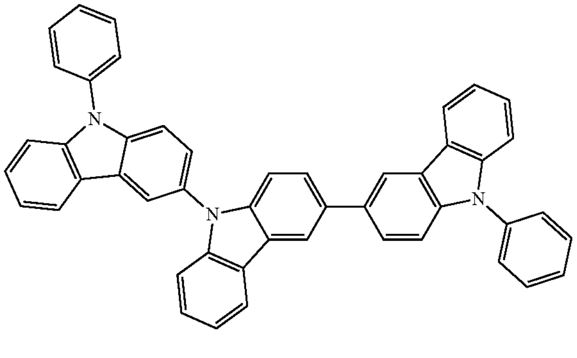

In an embodiment, the electron-transporting compound may be a compound represented by Formula 7:

Formula 7

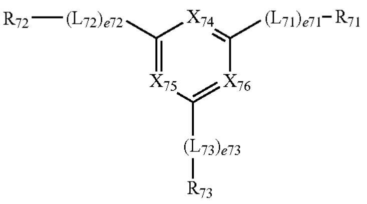

wherein, in Formula 7, $X_{74}$ may be $C(R_{74})$ or N, $X_{75}$ may be $C(R_{75})$ or N, $X_{76}$ may be $C(R_{76})$ or N, and at least one of $X_{74}$ to $X_{76}$ may be N, $L_{71}$ to $L_{73}$ may each independently be a $C_5$-$C_{30}$ carbocyclic group or a $C_1$-$C_{30}$ heterocyclic group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, —$Si(Q_{33})(Q_{34})(Q_{35})$, or any combination thereof, e71 to e73 may each independently be an integer from 1 to 10, and $R_{71}$ to $R_{76}$ may each independently be:

hydrogen, deuterium, —F, or a cyano group;

a $C_1$-$C_{20}$ alkyl group that is unsubstituted or substituted with deuterium, —F, a cyano group, or any combination thereof;

a $C_5$-$C_{30}$ carbocyclic group or a $C_1$-$C_{30}$ heterocyclic group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, —$Si(Q_{33})(Q_{34})(Q_{35})$, or any combination thereof; or —$Si(Q_3)(Q_4)(Q_5)$.

$Q_3$ to $Q_5$ and $Q_{33}$ to $Q_{35}$ may respectively be the same as those described in the present specification.

In an embodiment, $X_{74}$ to $X_{76}$ in Formula 7 may each be N.

In an embodiment, $L_{71}$ to $L_{73}$ in Formula 7 may each independently be a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrenobenzofuran group, a phenanthrenobenzothiophene group, a naphthocarbazole group, a dinaphthofuran group, a dinaphthothiophene group, or dibenzocarbazole group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, —$Si(Q_{33})(Q_{34})(Q_{35})$, or any combination thereof.

In an embodiment, in Formula 7, at least one of e71 $L_{71}$, at least one of e72 $L_{72}$, at least one of e73 $L_{73}$, or any combination thereof may each independently be a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrenobenzofuran group, a phenanthrenobenzothiophene group, a naphthocarbazole group, a dinaphthofuran group, a dinaphthothiophene group, or dibenzocarbazole group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$alkyl)phenyl group, a biphenyl group, a deuterated biphenyl group, a fluorinated biphenyl group, a ($C_1$-$C_{20}$ alkyl)biphenyl group, —Si($Q_{33}$)($Q_{34}$)($Q_{35}$), or any combination thereof.

In an embodiment, in Formula 7, at least one of e71 $L_{71}$, at least one of e72 $L_{72}$, at least one of e73 $L_{73}$, or any combination thereof may include a carbazole group, an indolocarbazole group, a benzocarbazole group, a naphthocarbazole group, or a dibenzocarbazole group, and a nitrogen atom of a pyrrole group in the carbazole group, the indolocarbazole group, the benzocarbazole group, the naphthocarbazole group, or the dibenzocarbazole group may be connected to a carbon atom of a 6-membered ring including $X_{74}$ to $X_{76}$ in Formula 7 with a single bond or neighboring $L_{71}$, $L_{72}$, and/or $L_{73}$ therebetween.

In an embodiment, e71 to e73 in Formula 7 indicate numbers of $L_{71}$ to $L_{73}$, respectively, and may each independently be, for example, 1, 2, 3, 4, or 5.

In an embodiment, $R_{71}$ to $R_{76}$ in Formula 7 may each independently be:

hydrogen, deuterium, —F, or a cyano group;

a $C_1$-$C_{20}$ alkyl group that is unsubstituted or substituted with deuterium, —F, a cyano group, or any combination thereof;

a benzene group, a naphthalene group, a triphenylene group, a dibenzofuran group, a dibenzothiophene group, a carbazole group, an indolodibenzofuran group, an indolodibenzothiophene group, an indolocarbazole group, a naphthobenzofuran group, a naphthobenzothiophene group, a benzocarbazole group, a phenanthrenobenzofuran group, a phenanthrenobenzothiophene group, a naphthocarbazole group, a dinaphthofuran group, a dinaphthothiophene group, or a dibenzocarbazole group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$alkyl)phenyl group, a biphenyl group, a deuterated biphenyl group, a fluorinated biphenyl group, a ($C_1$-$C_{20}$ alkyl)biphenyl group, —Si($Q_{33}$)($Q_{34}$)($Q_{35}$), or any combination thereof; or —Si($Q_3$)($Q_4$)($Q_5$).

In an embodiment, the electron-transporting compound may be one of Compounds H-ET1 to H-ET6:

H-ET1

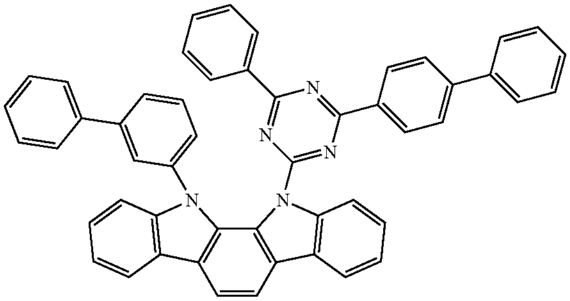

-continued

H-ET2

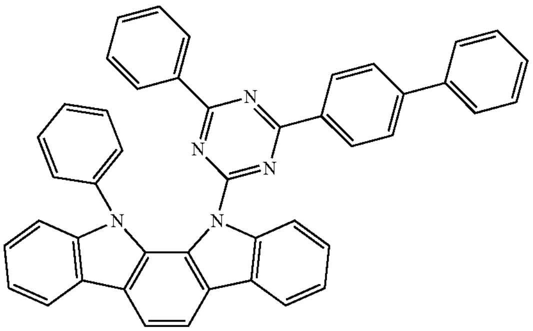

H-ET3

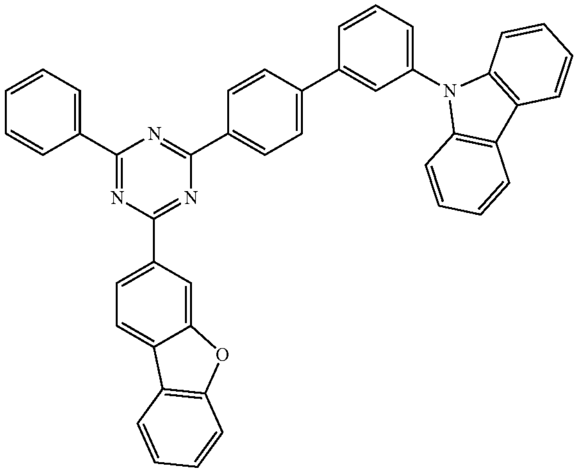

H-ET4

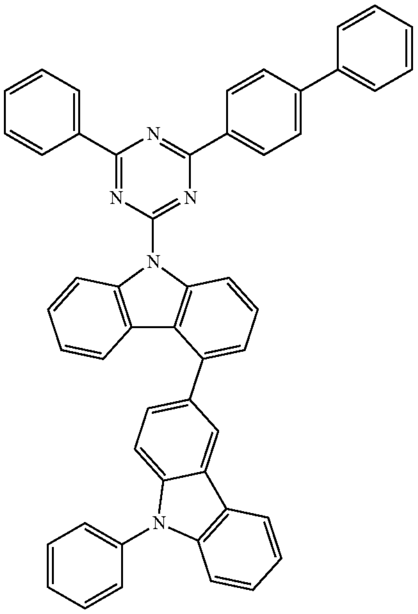

-continued
H-ET5
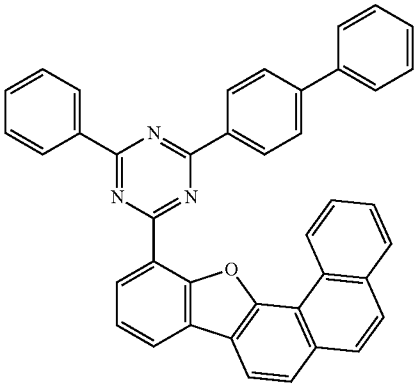
H-ET6
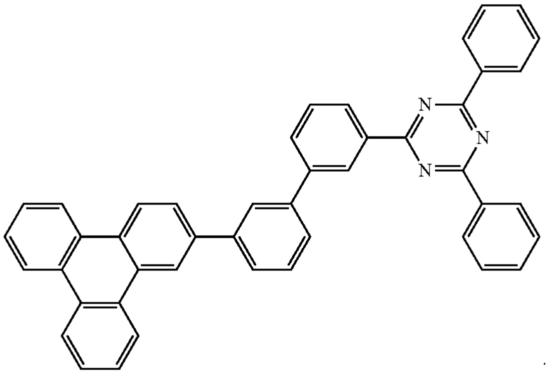
In an embodiment, each of the first emission layer and the second emission layer may not include compounds of Group A:
Group A
NPB
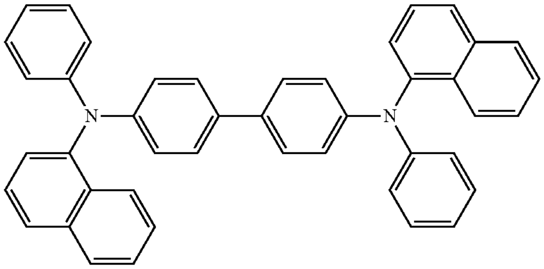
β-NPB
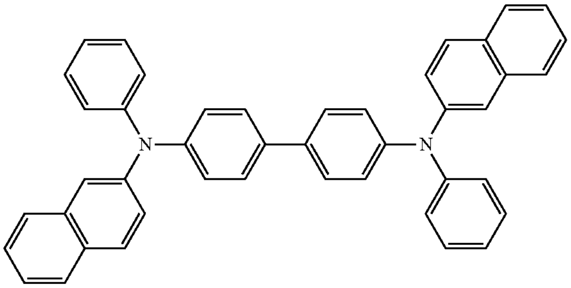
-continued
TPD
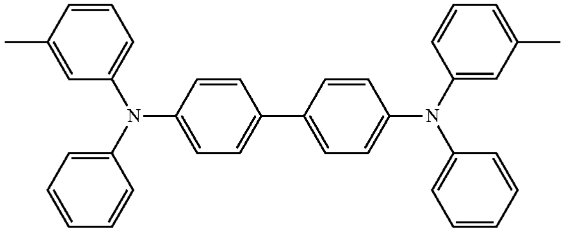
Spiro-TPD
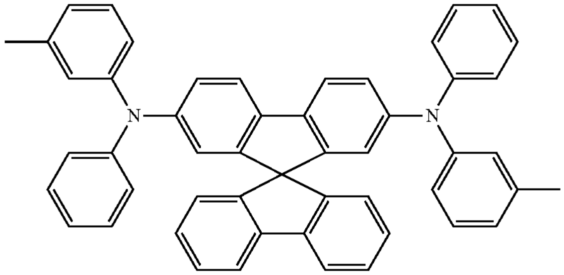
Sprio-NPB
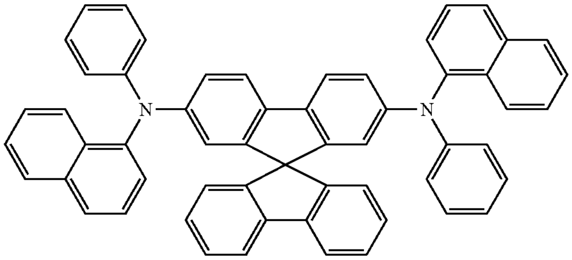
methylated NPB
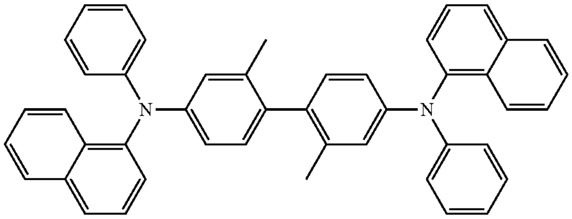
TAPC
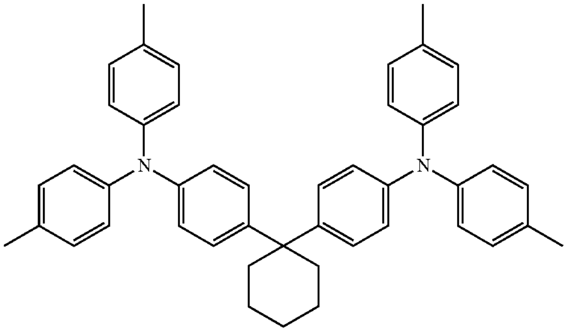

-continued
HMTPD
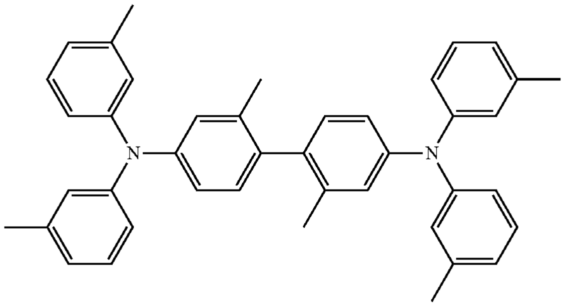
TPBi
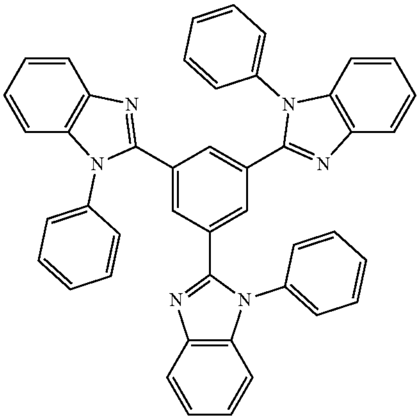
TBADN
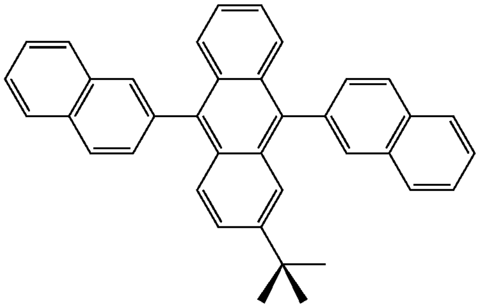
ADN
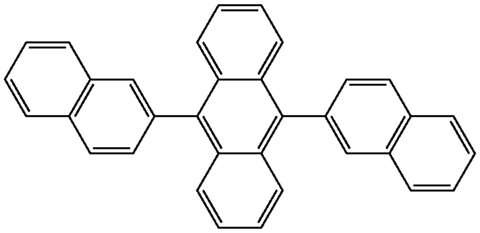
CBP
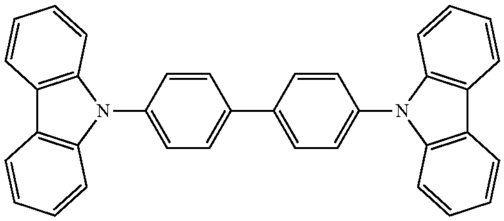
-continued
CDBP
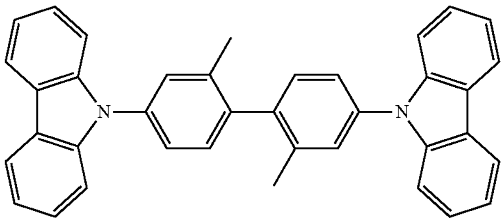
TCP
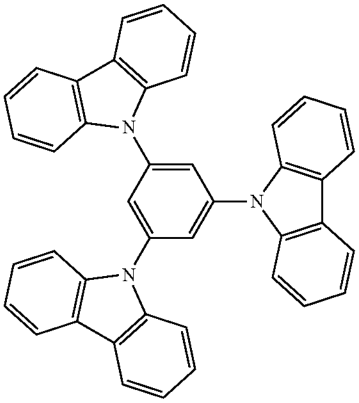
BCP
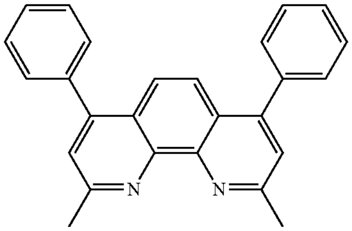
Bphen
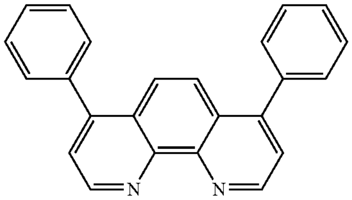
$Alq_3$
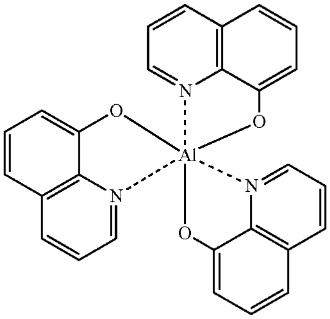

-continued
BAlq
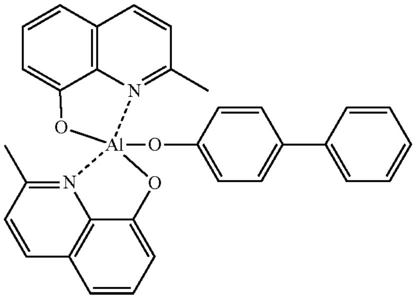
TAZ
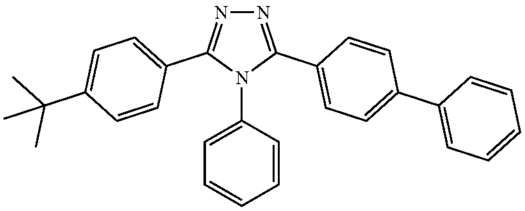
NTAZ
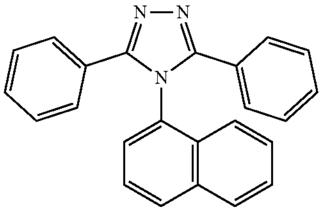
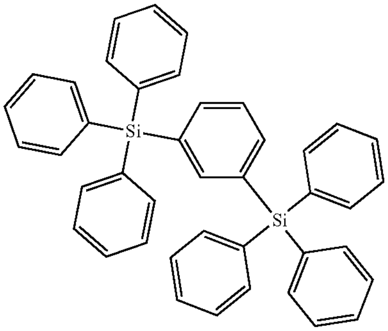
m-bis-(triphenylsilyl)benzene
-continued
TCTA
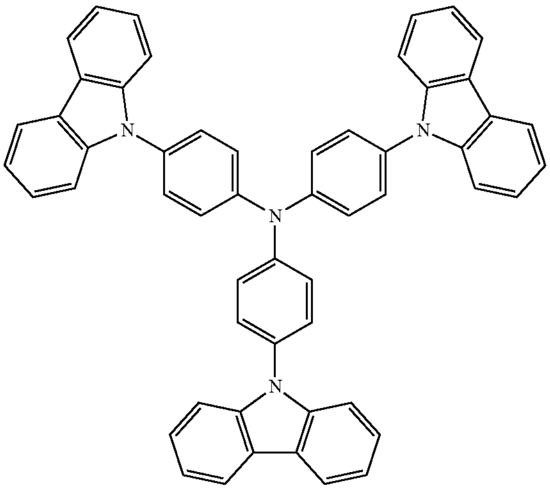
(4,4′,4″-tris(carbazol-9-yl)triphenylamine
B3PYMPM
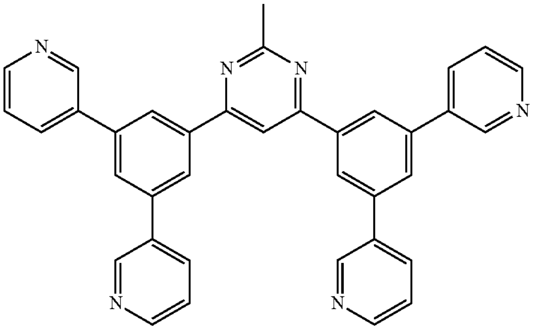
(4,6-bis(3,5-di(pyridine-3-yl)phenyl)-2-methylpyrimidine)
3TPYMB
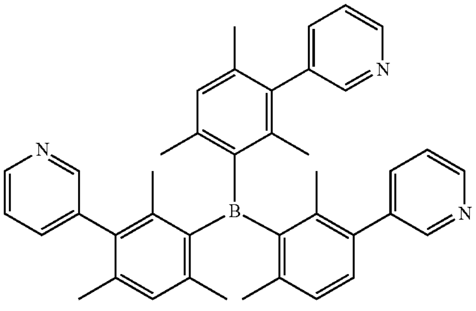
(tris(2,4,6-trimethyl-3-(pyridine-3-yl)phenyl)borane)

-continued

BmPyPhB

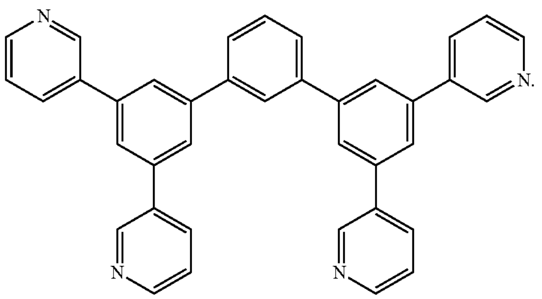

(1,3-bis[3,5-di(pyridine-3yl)phenyl]benzene)

In an embodiment, the interlayer of the light-emitting device may further include a hole transport region arranged between the first electrode and the emission layer and an electron transport region arranged between the emission layer and the second electrode.

The hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "interlayer" as used herein refers to a single layer and/or a plurality of layers arranged between the first electrode and the second electrode of the light-emitting device. The term "interlayer" may include an organometallic compound and an organometallic complex including a metal.

Meanwhile, the interlayer of the light-emitting device may include:

m light-emitting units including at least one emission layer; and m−1 charge generation layers arranged between two adjacent light-emitting units among the m light-emitting units.

m may be an integer of 2 or more.

In other words, the light-emitting device may be a tandem light-emitting device.

For example, m may be 2, 3, 4, 5, 6, 7, 8, 9, or 10. In an embodiment, m may be 2, 3, 4, 5, or 6.

In an embodiment, i) a first light-emitting unit among the m light-emitting units may include the first emission layer, and a second light-emitting unit among the m light-emitting units may include the second emission layer, or ii) one light-emitting unit among the m light-emitting units may include both the first emission layer and the second emission layer. The first emission layer and the second emission layer may respectively be the same as those described in the present specification.

In an embodiment, a first light-emitting unit among the m light-emitting units may include the first emission layer, a second light-emitting unit among the m light-emitting units may include the second emission layer, and each of the first light-emitting unit and the second light-emitting unit may emit green light.

In an embodiment, a first light-emitting unit among the m light-emitting units may include the first emission layer, a second light-emitting unit among the m light-emitting units may include the second emission layer, and the first light-emitting unit may be arranged between the second light-emitting unit and the second electrode.

In an embodiment, a first light-emitting unit among the m light-emitting units may include the first emission layer, a second light-emitting unit among the m light-emitting units may include the second emission layer, and the second light-emitting unit may be arranged between the first light-emitting unit and the second electrode.

In an embodiment, one light-emitting unit among the m light-emitting units may include both the first emission layer and the second emission layer, and the one light-emitting unit including both the first emission layer and the second emission layer may emit green light. In this regard, the first emission layer may be arranged between the second emission layer and the second electrode. In an embodiment, the second emission layer may be arranged between the first emission layer and the second electrode.

In an embodiment, at least one light-emitting unit among the m light-emitting units may emit blue light.

According to one or more embodiments, the light-emitting device may be included in an electronic apparatus. Thus, an electronic apparatus including the light-emitting device is provided. The electronic apparatus may include, for example, a display, an illumination, a sensor, and the like.

FIG. 1 schematically illustrates a cross-sectional view of an organic light-emitting device 101, which is a light-emitting device according to an embodiment. Hereinafter, a structure of an organic light-emitting device according to an embodiment and a method of manufacturing an organic light-emitting device according to an embodiment will be described in connection with FIG. 1.

The organic light-emitting device 101 of FIG. 1 includes a first electrode 110, a second electrode 190, and an interlayer (not shown) arranged between the first electrode 110 and the second electrode 190, wherein the interlayer includes a hole transport region 120, an emission layer 150, and an electron transport region 170.

A substrate may be additionally arranged under the first electrode 110 or above the second electrode 190. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

The first electrode 110 may be formed by providing, on the substrate, a material for forming the first electrode 110, by using a deposition or sputtering method. The first electrode 110 may be an anode. The material for forming the first electrode 110 may include materials with a high work function to facilitate hole injection. The first electrode 110 may be a reflective electrode. The material for forming the first electrode 110 may be indium tin oxide (ITO), indium zinc oxide (IZO), tin oxide ($SnO_2$), or zinc oxide (ZnO). In an embodiment, the material for forming the first electrode 110 may be metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 110 may have a single-layered structure or a multilayer structure including two or more layers. For example, the first electrode 110 may have a three-layered structure of ITO/Ag/ITO.

The hole transport region 120 may be arranged between the first electrode 110 and the emission layer 150.

The hole transport region 120 may include a hole injection layer, a hole transport layer, an electron blocking layer, a buffer layer, or any combination thereof.

The hole transport region 120 may include only a hole injection layer or only a hole transport layer. In an embodiment, the hole transport region 120 may have a hole injection layer/hole transport layer structure or a hole injection layer/hole transport layer/electron blocking layer structure, which are sequentially stacked in this stated order from the first electrode 110.

When the hole transport region 120 includes a hole injection layer, the hole injection layer (HIL) may be formed on the first electrode 110 by using various methods, such as, a vacuum deposition method, a spin coating method, a casting method, a Langmuir-Blodgett (LB) method, and/or an ink-jet printing method.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100 °C to about 500 °C, a vacuum pressure of about $10^{-8}$ torr to about $10^{-3}$ torr, and a deposition rate of about 0.01 Å/sec to about 100 Å/sec.

When the hole injection layer is formed by spin coating, the coating conditions may vary depending on a material for forming the hole injection layer, and the structure and thermal characteristics of the hole injection layer. For example, the coating conditions may include a coating speed of about 2,000 rpm to about 5,000 rpm and a heat treatment temperature of about 80 °C to about 200 °C for removing a solvent after coating.

Conditions for forming a hole transport layer and an electron blocking layer may be understood by referring to conditions for forming the hole injection layer.

The hole transport region 120 may include, for example, m-MTDATA, TDATA, 2-TNATA, NPB, R-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or any combination thereof:

m-MTDATA

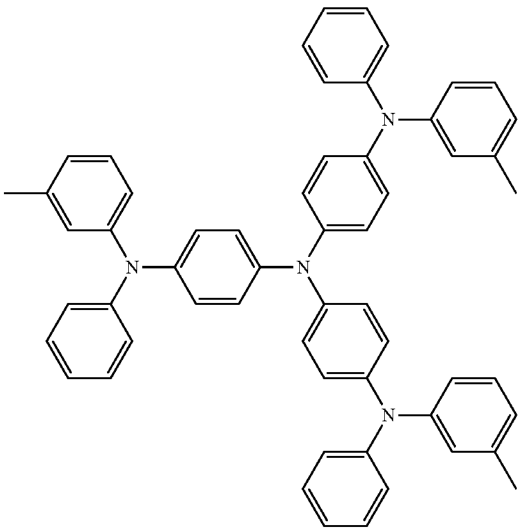

-continued

TDATA

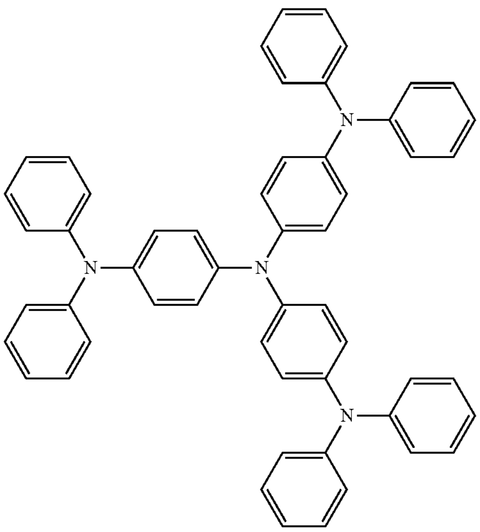

2-TNATA

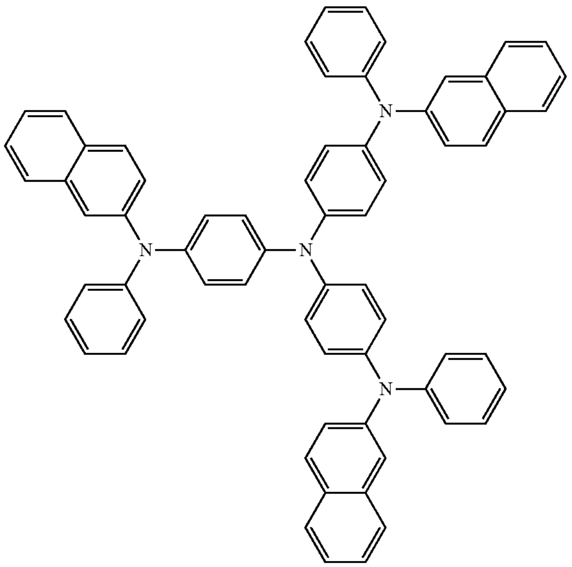

NPB

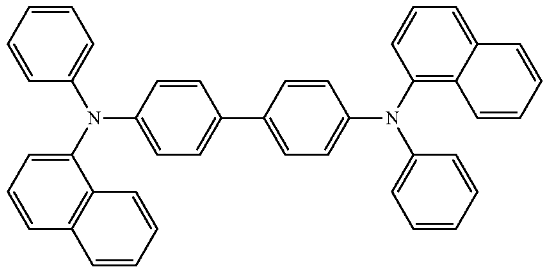

-continued

β-NPB

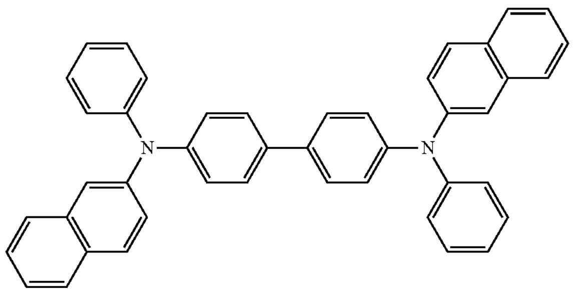

TPD

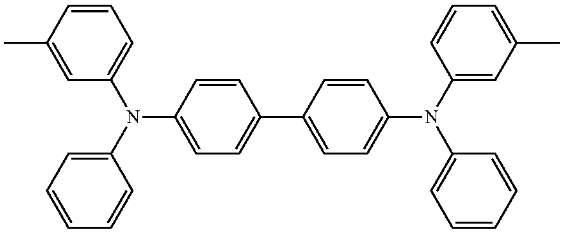

Spiro-TPD

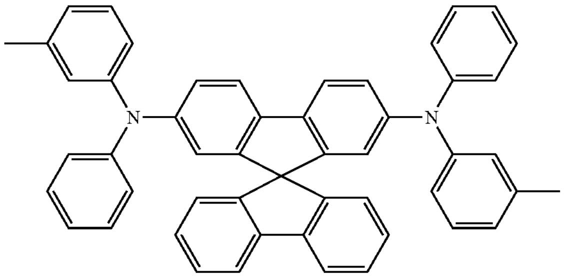

Sprio-NPB

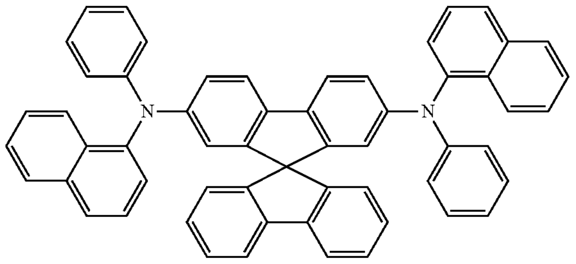

methylated NPB

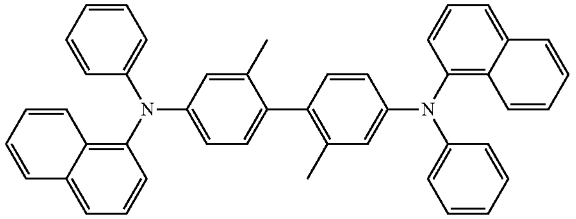

-continued

TAPC

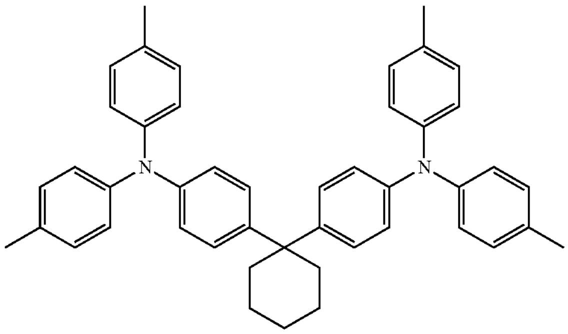

HMTPD

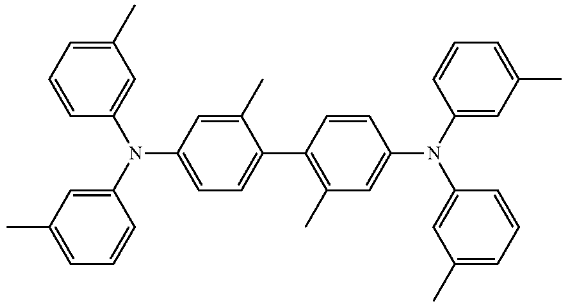

Formula 201

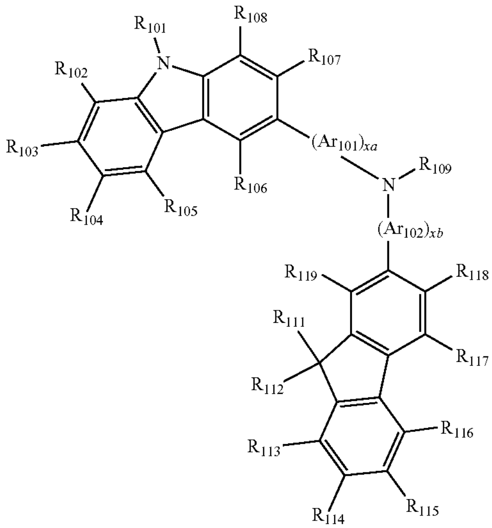

Formula 202

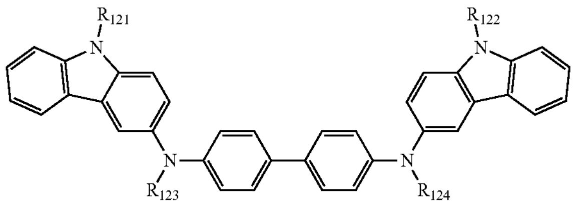

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, or any combination thereof.

xa and xb in Formula 201 may each independently be an integer from 0 to 5, or 0, 1, or 2. For example, xa may be 1, and xb may be 0.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, a hydroxyl group, a cyano group, a nitro group, an amino group, a $C_1$-$C_{10}$ alkyl group (for example, a methyl group, an ethyl group, a propyl group, a butyl group, a pentyl group, or a hexyl group), or a $C_1$-$C_{10}$ alkoxy group (for example, a methoxy group, an ethoxy group, a propoxy group, a butoxy group, or a pentoxy group);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, a $C_1$-$C_{20}$ alkyl group, a $C_1$-$C_{20}$ alkoxy group, a phenyl group, a naphthyl group, an anthracenyl group, a pyridinyl group, or any combination thereof.

In an embodiment, the compound represented by Formula 201 may be represented by Formula 201A:

Formula 201A

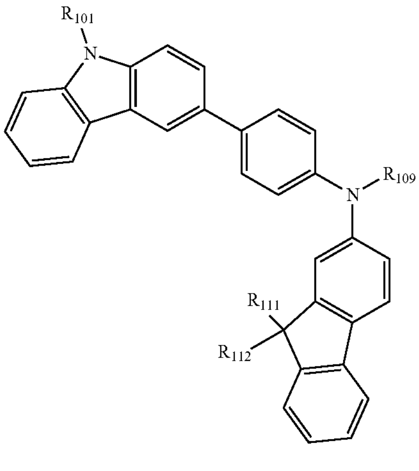

wherein, in Formula 201A, $R_{101}$, $R_{111}$, $R_{112}$, and $R_{109}$ may respectively be the same as those described above.

For example, the hole transport region 120 may include one of Compounds HT1 to HT20 or any combination thereof:

HT1

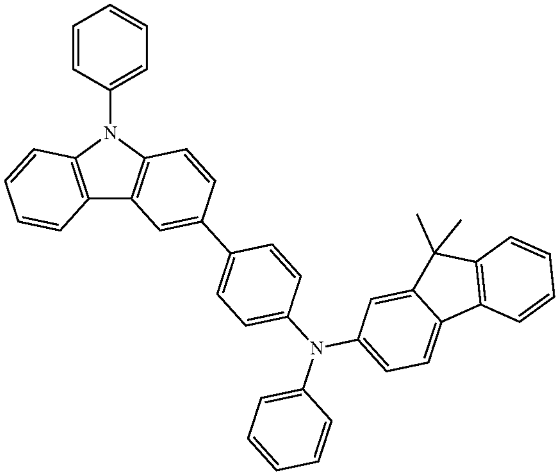

HT2

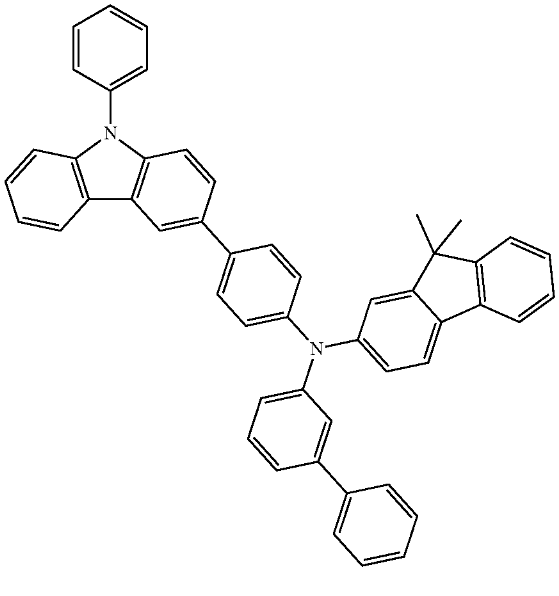

-continued
HT3
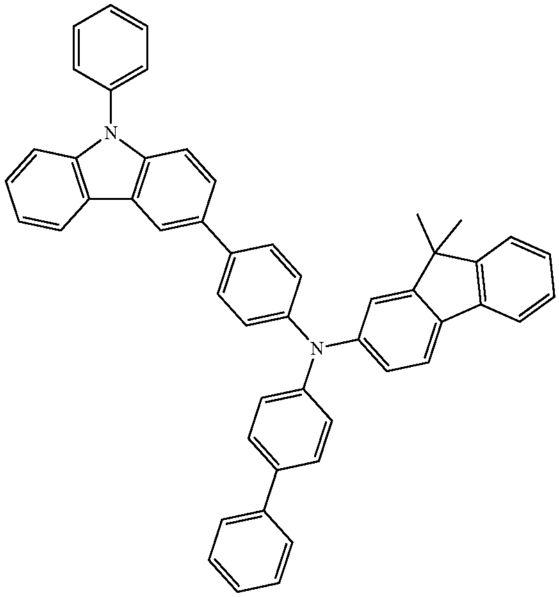
HT4
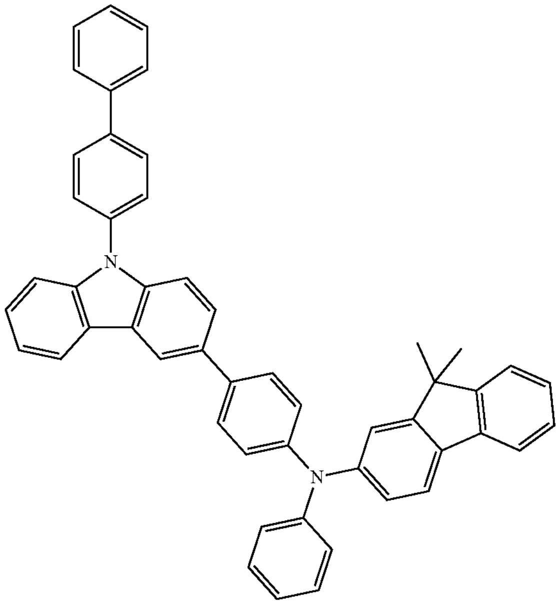
-continued
HT5
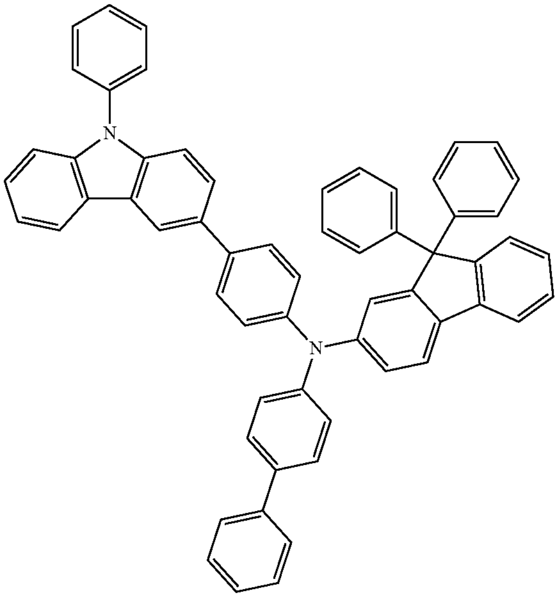
HT6
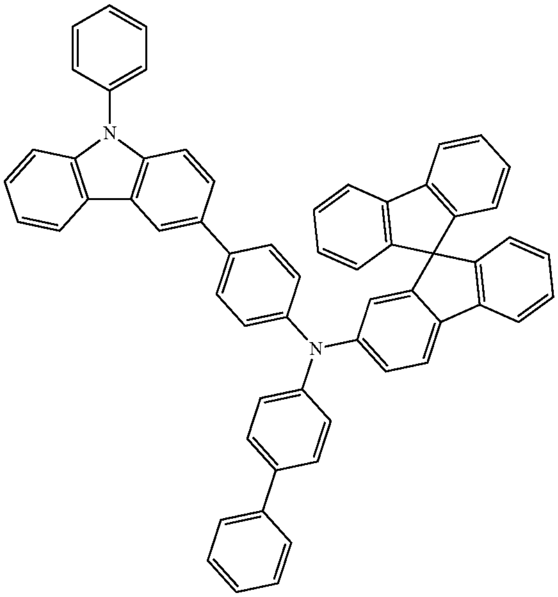

-continued
HT7
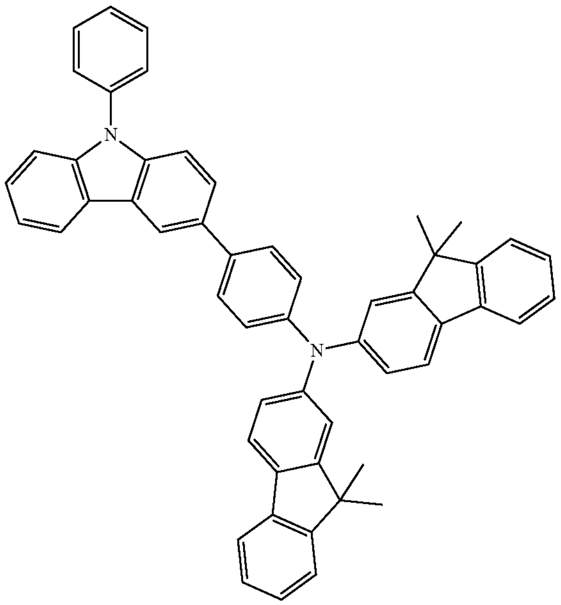
HT8
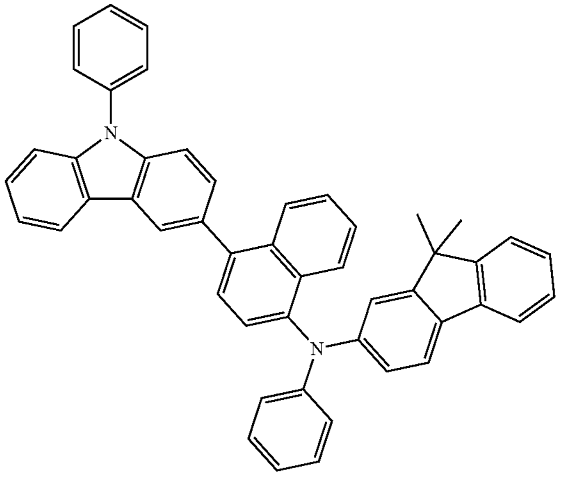
HT9
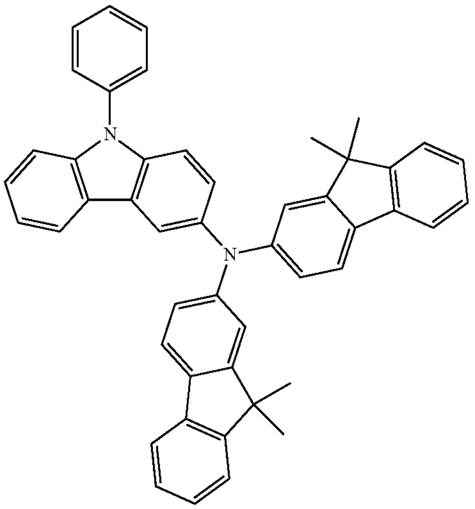
-continued
HT10
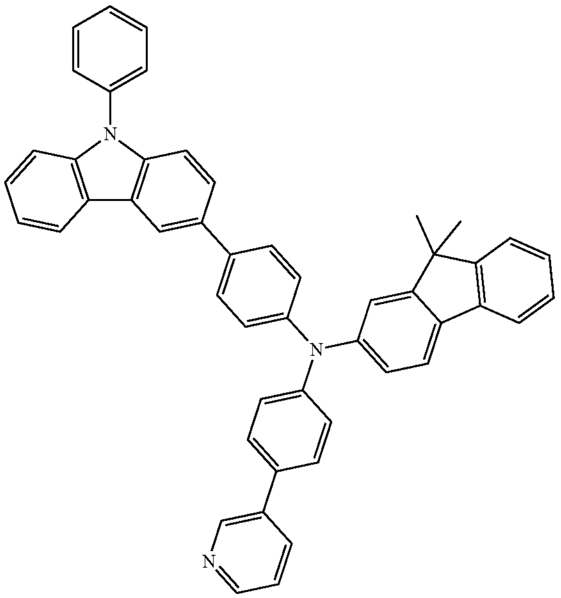
HT11
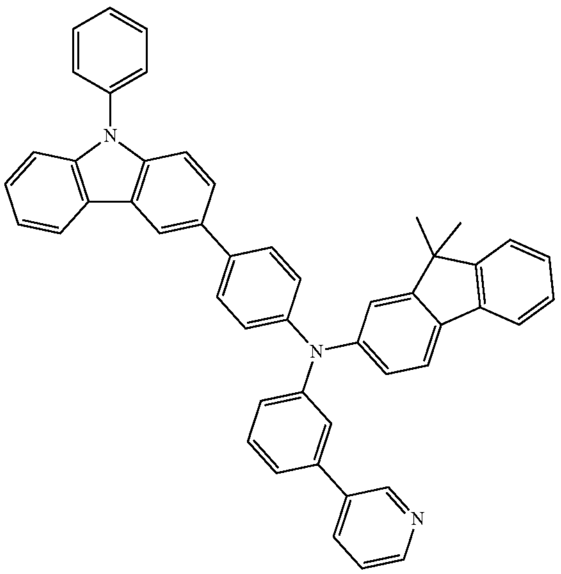

-continued
HT12
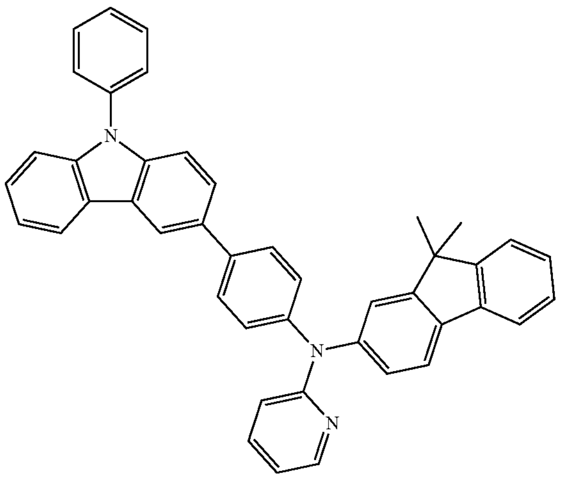
HT13
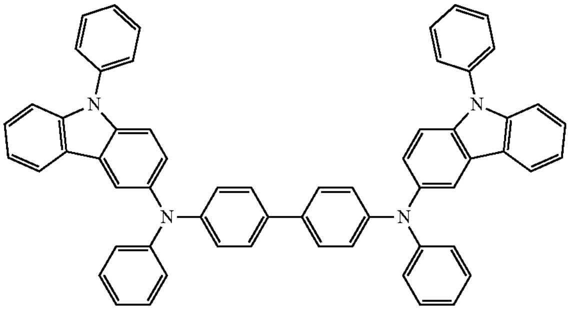
HT14
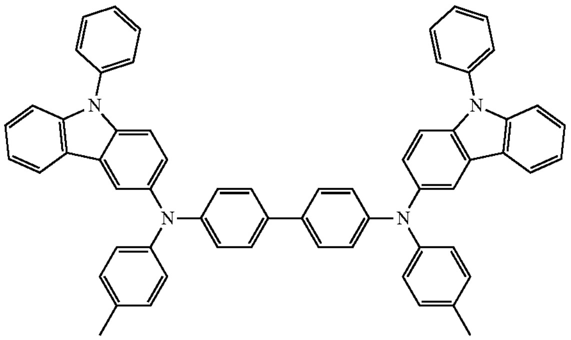
HT15
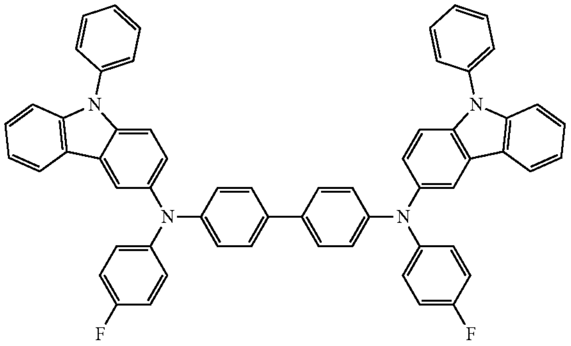
-continued
HT16
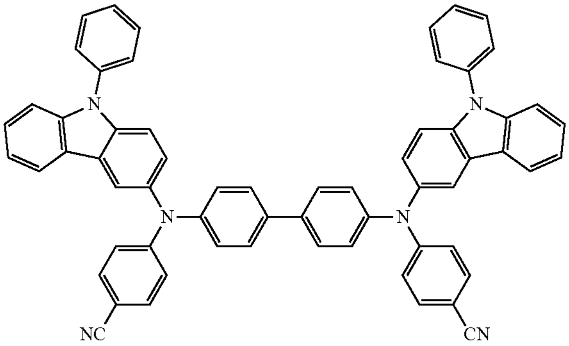
HT17
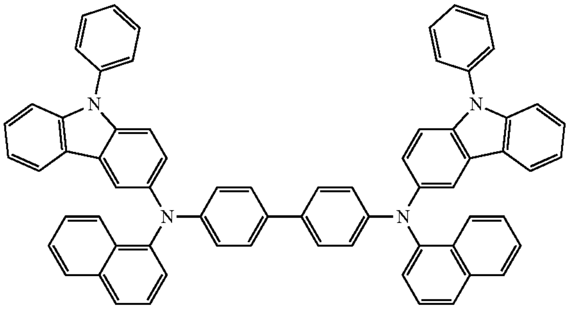
HT18
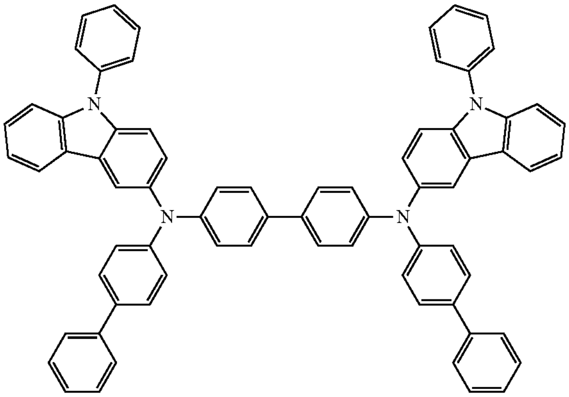
HT19
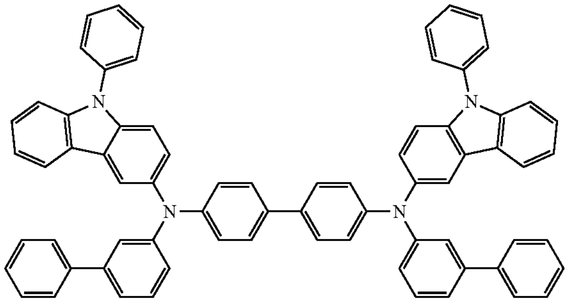

-continued

HT20

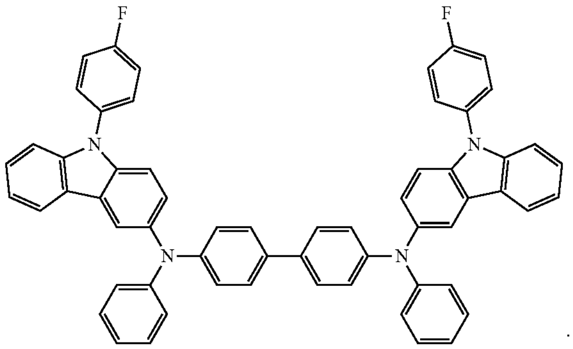

.

A thickness of the hole transport region 120 may be about 100 Å to about 10,000 Å, for example, about 100 Å to about 1,000 Å. When the hole transport region 120 includes a hole injection layer, a hole transport layer, an electron blocking layer, or a combination thereof, a thickness of the hole injection layer may be about 100 Å to about 10,000 Å, for example, about 100 Å to about 1,000 Å, and a thickness of the hole transport layer may be about 50 Å to about 2,000 Å, for example, about 100 Å to about 1,500 Å. When the thicknesses of the hole transport region 120, the hole injection layer, and the hole transport layer are within these ranges as described above, satisfactory hole transporting characteristics may be obtained without a substantial increase in driving voltage.

In addition to the above-described materials, the hole transport region 120 may further include a charge-generation material to improve conductivity. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof. For example, the p-dopant may be: a quinone derivative such as tetracyanoquinonedimethane (TCNQ), 2,3,5,6-tetrafluoro-tetracyano-1,4-benzoquinonedimethane (F4-TCNQ), or F6-TCNNQ; metal oxide, such as tungsten oxide and molybdenum oxide; a cyano group-containing compound, such as Compound HT-D1; or any combination thereof.

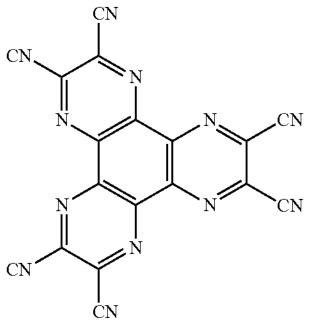

HT-D1

-continued

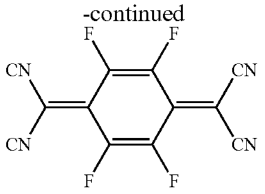

F4-TCNQ

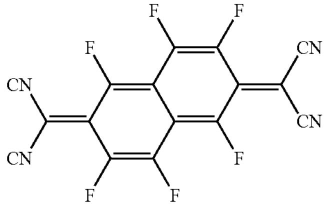

G6-TCNNQ

The hole transport region 120 may further include a buffer layer.

The buffer layer may compensate for an optical resonance distance according to a wavelength of light emitted from the emission layer, and thus, efficiency may be increased.

Meanwhile, when the hole transport region 120 includes an electron blocking layer, the material for the electron blocking layer may include a material that may be used in the hole transport region 120 as described above, a host material, or any combination thereof. For example, when a hole transport region includes an electron blocking layer, mCP or Compound HT(1) may be used as a material for the electron blocking layer.

HT(1)

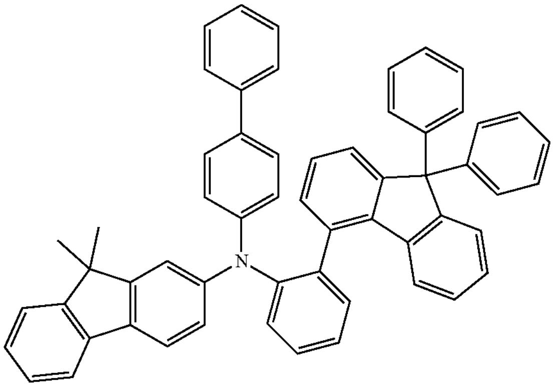

The emission layer 150 may be formed on the hole transport region 120 by using, for example, a vacuum deposition method, a spin coating method, a casting method, an LB method, and/or an ink-jet printing method. When the emission layer 150 is formed by vacuum deposition or spin coating, the deposition or coating conditions may be similar to those applied in forming the hole injection layer although the deposition or coating conditions may vary depending on a compound that is used to form the emission layer.

The emission layer 150 may include a first emission layer and a second emission layer as described in the present specification. The first emission layer and the second emission layer may respectively be the same as those described in the present specification.

A thickness of the emission layer 150 may be about 100 Å to about 1,000 Å, for example, about 200 Å to about 600 Å. When the thickness of the emission layer 150 is within the range as described above, excellent light-emission characteristics may be obtained without a substantial increase in driving voltage.

A thickness ratio of the first emission layer to the second emission layer may be 8:2 to 2:8, 7:3 to 3:7, or 6:4 to 4:6.

When the light-emitting device is a full-color light-emitting device, the emission layer 150 may be patterned into a red emission layer, a green emission layer, and/or a blue emission layer.

Next, the electron transport region 170 may be arranged on the emission layer 150.

The electron transport region 170 may include a hole blocking layer, an electron transport layer, an electron injection layer, or any combination thereof.

For example, the electron transport region 170 may have a hole blocking layer/electron transport layer/electron injection layer structure, a hole blocking layer/electron transport layer structure, or an electron transport layer/electron injection layer structure. The electron transport layer may have a single-layered structure or a multilayer structure including two or more different materials.

The conditions for the forming the hole blocking layer, the electron transport layer, and the electron injection layer in the electron transport region 170 are the same as the conditions for the forming the hole injection layer.

When the electron transport region 170 includes a hole blocking layer, the hole blocking layer may include, for example, BCP, Bphen, BAlq, or any combination thereof:

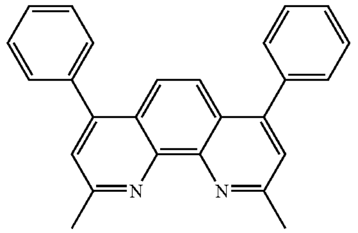

BCP

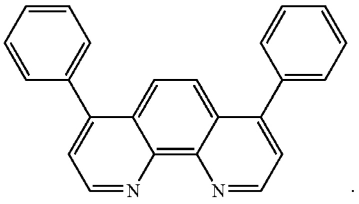

Bphen

In an embodiment, the hole blocking layer may include any host material, a material for an electron transport layer, a material for an electron injection layer, or a combination thereof, which will be described later.

A thickness of the hole blocking layer may be about 20 Å to about 1,000 Å, for example, about 30 Å to about 600 Å. When the thickness of the hole blocking layer is within the range as described above, excellent hole blocking characteristics may be obtained without a substantial increase in driving voltage.

The electron transport layer may include BCP, Bphen, TPBi, $Alq_3$, BAlq, TAZ, NTAZ, or any combination thereof:

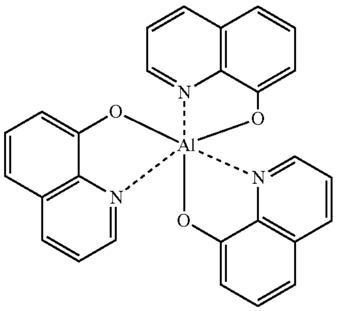

$Alq_3$

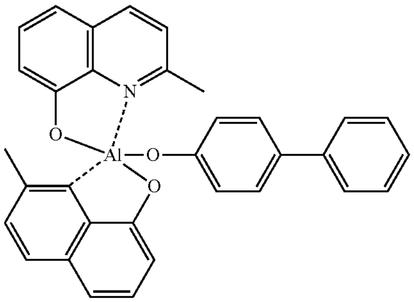

BAlq

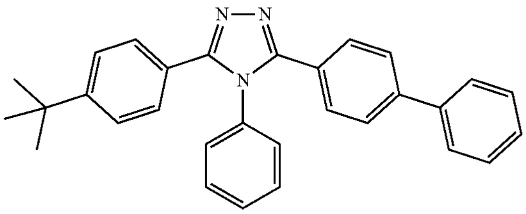

TAZ

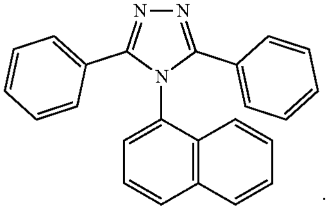

NTAZ

In an embodiment, the electron transport layer may include one of Compounds ET1 to ET25 or any combination thereof:

-continued
ET1
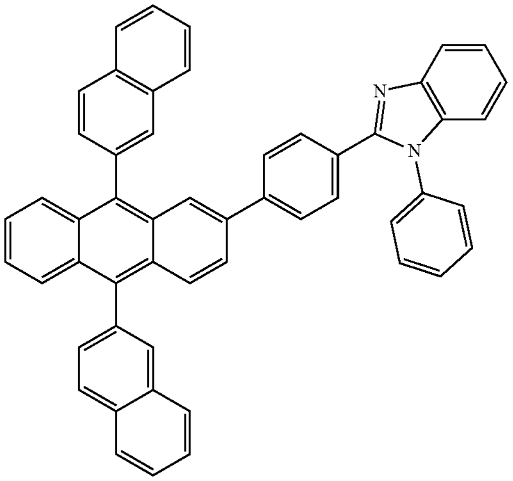
ET2
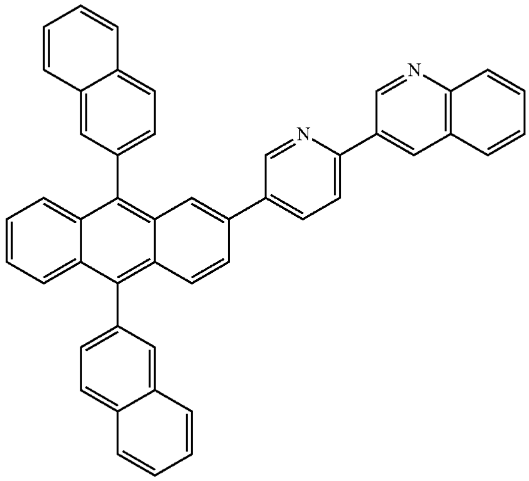
ET3
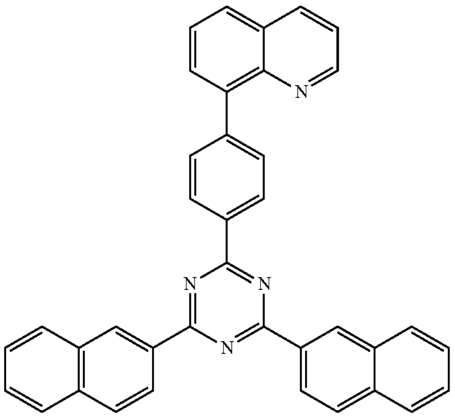
ET4
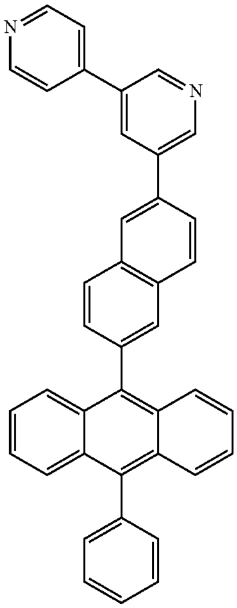
ET5
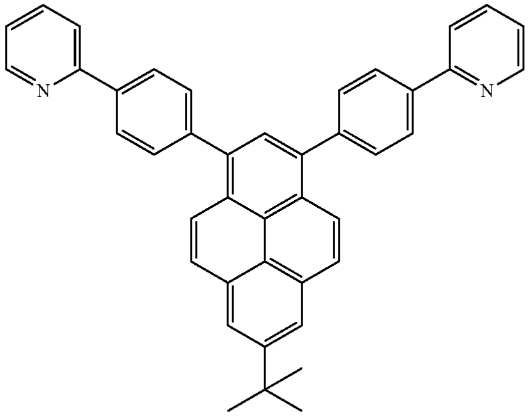
ET6
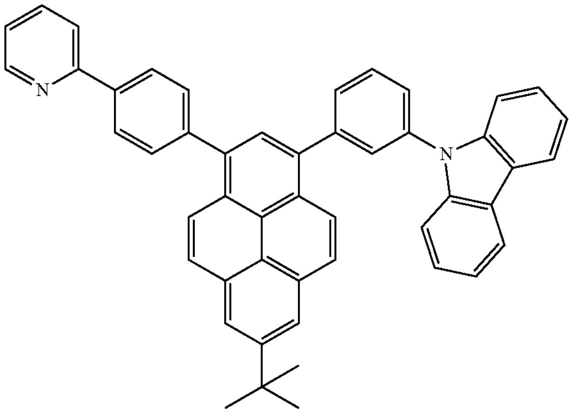

-continued
ET7
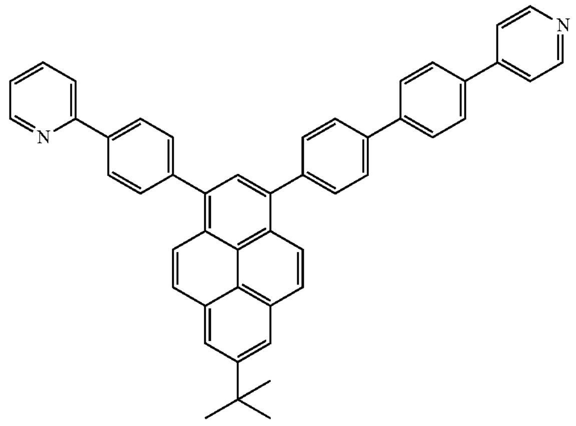
ET8
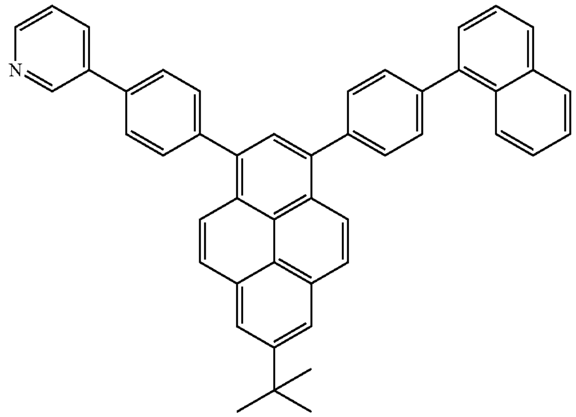
ET9
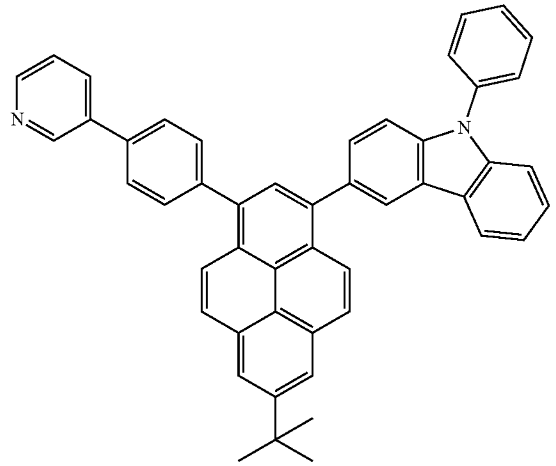
-continued
ET10
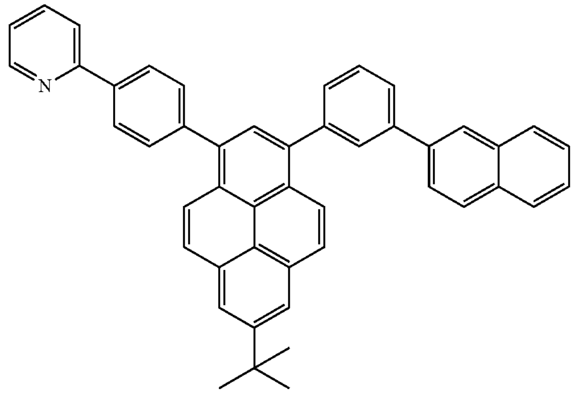
ET11
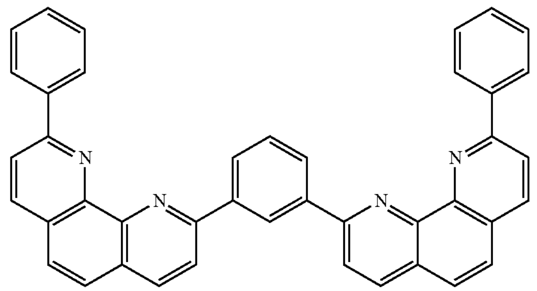
ET12
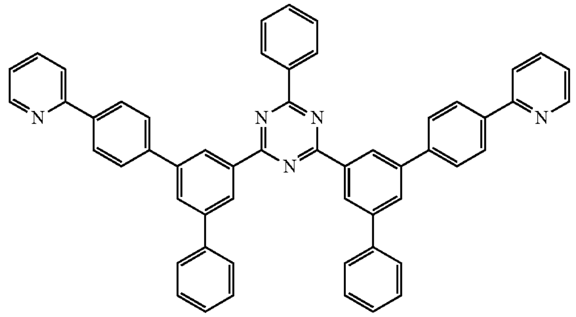
ET13
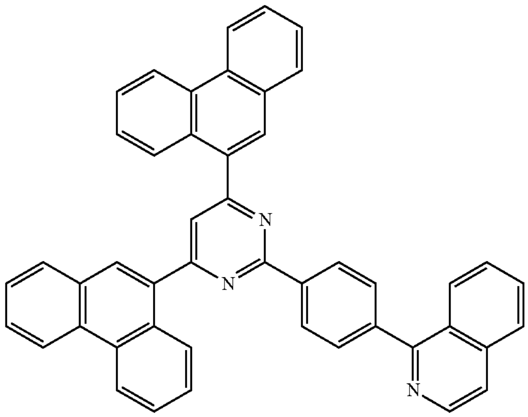

-continued
ET14
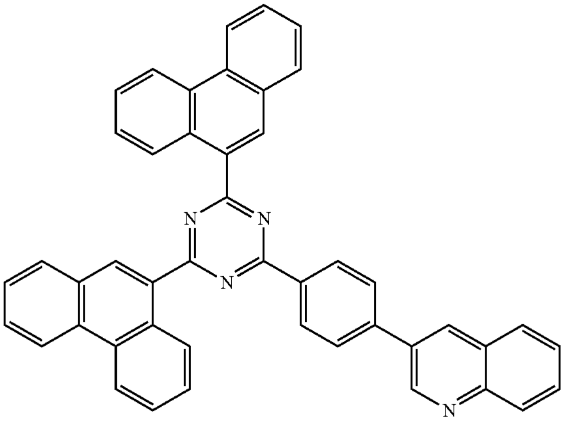
ET15
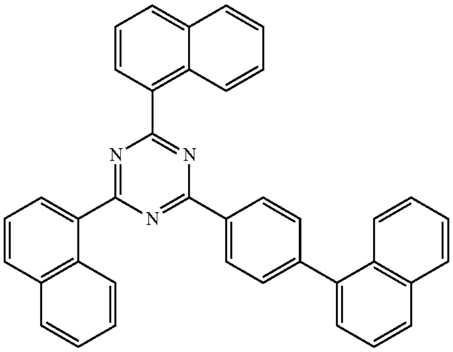
ET16
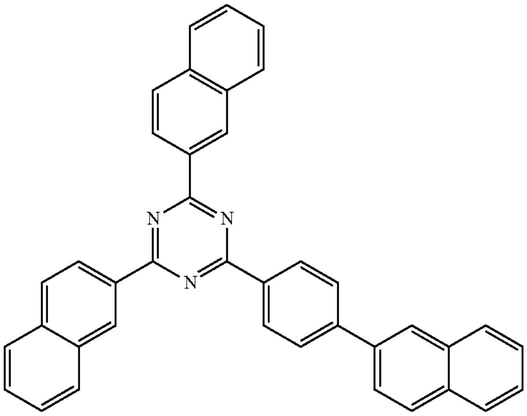
-continued
ET17
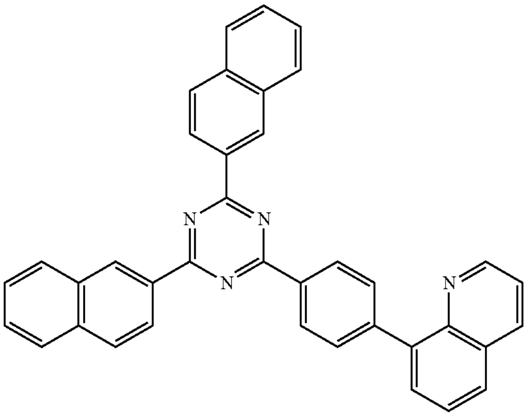
ET18
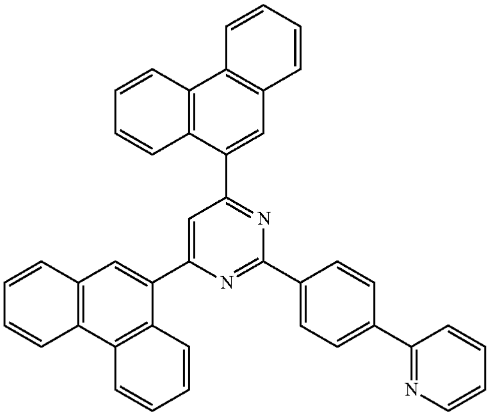
ET19
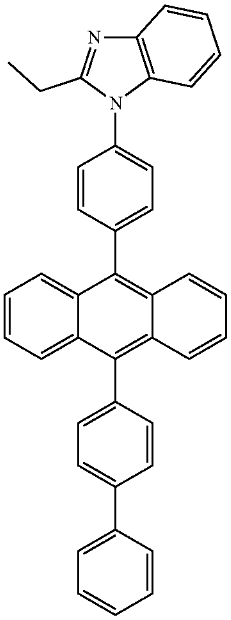

-continued
ET20
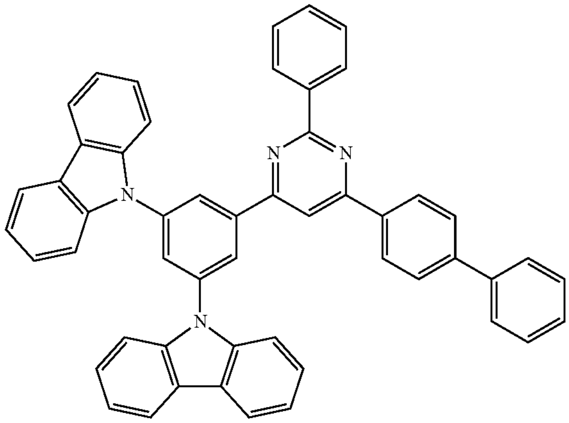
ET21
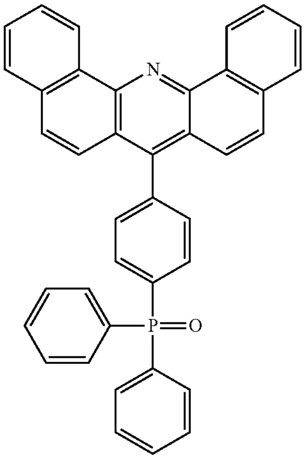
ET22
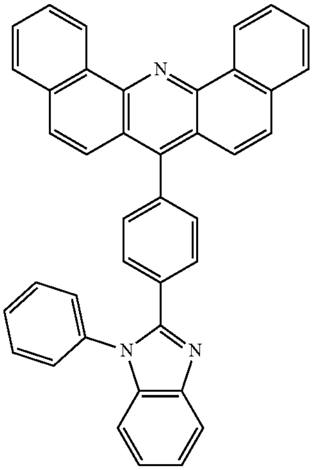
-continued
ET23
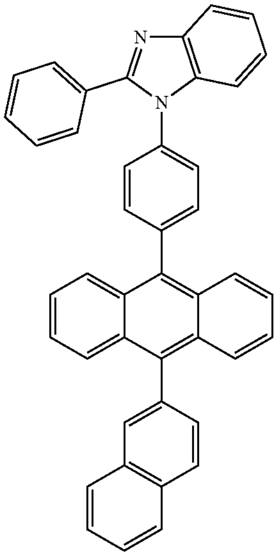
ET24
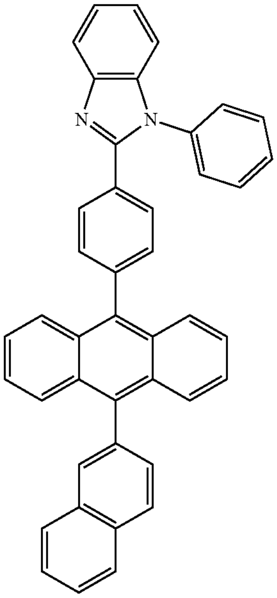
ET25
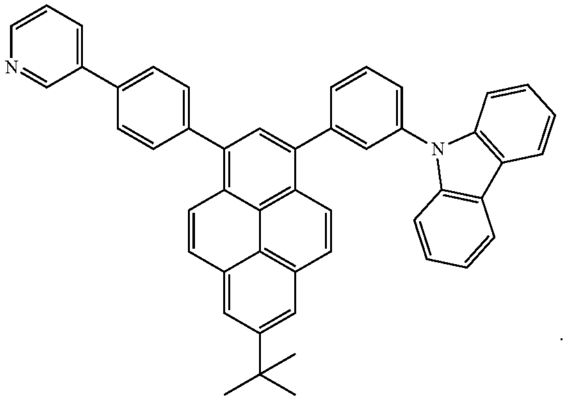
A thickness of the electron transport layer may be in a range of about 100 Å to about 1,000 Å, for example, about 150 Å to about 500 Å. When the thickness of the electron transport layer is within the range as described above, satisfactory electron transport characteristics may be obtained without a substantial increase in driving voltage.

Also, the electron transport layer may further include, in addition to the materials described above, a metal-containing material.

The metal-containing material may include a Li complex. The Li complex may include, for example, Compound ET-D1 or ET-D2.

ET-D1

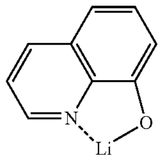

ET-D2

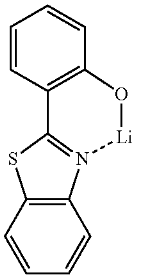

In addition, the electron transport region 170 may include an electron injection layer (EIL) that facilitates injection of electrons from the second electrode 190.

The electron injection layer may include LiF, NaCl, CsF, $Li_2O$, BaO, Yb, Compound ET-D1, Compound ET-D2, or any combination thereof.

A thickness of the electron injection layer may be about 1 Å to about 100 Å, for example, about 3 Å to about 90 Å. When the thickness of the electron injection layer is within the range described above, satisfactory electron injection characteristics may be obtained without a substantial increase in driving voltage.

The second electrode 190 may be arranged on the electron transport region 170. The second electrode 190 may be a cathode. A material for forming the second electrode 190 may be metal, an alloy, an electrically conductive compound, or any combination thereof, which has a relatively low work function. For example, lithium (Li), magnesium (Mg), aluminum (Al), silver (Ag), aluminum-lithium (Al—Li), calcium (Ca), magnesium-indium (Mg—In), magnesium-silver (Mg—Ag), or the like may be used as the material for forming the second electrode 190. In an embodiment, to manufacture a top-emission type light-emitting device, a transparent or semi-transparent electrode formed using ITO or IZO may be used as the second electrode 190, and various modifications may be made.

Figure 2:
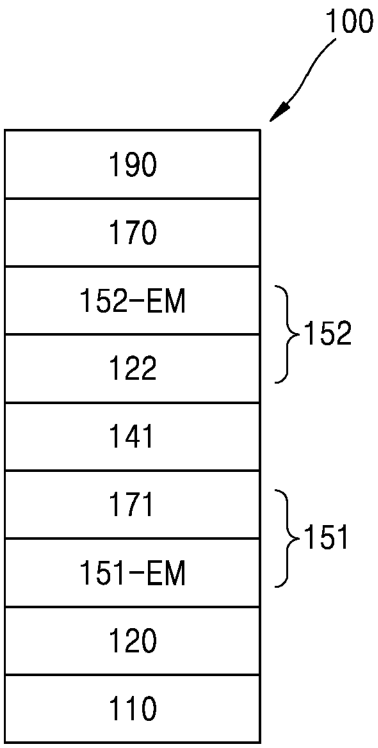
FIG. 2 is a schematic view of a light-emitting device according to another embodiment.

FIG. 2 is a schematic view of a light-emitting device 100 according to an embodiment.

The organic light-emitting device 100 of FIG. 2 may include a first electrode 110, a second electrode 190 facing the first electrode 110, and a first light-emitting unit 151 and a second light-emitting unit 152 which are stacked between the first electrode 110 and the second electrode 190. A charge generation layer 141 is arranged between the first light-emitting unit 151 and the second light-emitting unit 152. The charge generation layer 141 may include an n-type charge generation layer, a p-type charge generation layer, or a combination thereof. The charge generation layer 141 is a layer that generates charge and supplies the charge to neighboring light-emitting units, and any known material may be used therefor.

The first light-emitting unit 151 may include an emission layer 1 151-EM, and the second light-emitting unit 152 may include an emission layer 2 152-EM.

In an embodiment, the emission layer 1 151-EM may include the first emission layer and the second emission layer as described in the present specification.

In an embodiment, the emission layer 2 152-EM may include the first emission layer and the second emission layer as described in the present specification.

In an embodiment, the emission layer 1 151-EM may be the first emission layer as described in the present specification, and the emission layer 2 152-EM may be the second emission layer as described in the present specification.

In an embodiment, the emission layer 1 151-EM may be the second emission layer as described in the present specification, and the emission layer 2 152-EM may be the first emission layer as described in the present specification.

The first emission layer and the second emission layer may respectively be the same as those described in the present specification.

A hole transport region 120 is arranged between the first light-emitting unit 151 and the first electrode 110, and the second light-emitting unit 152 includes a second hole transport region 122 arranged on the side of the first electrode 110.

An electron transport region 170 may be arranged between the second light-emitting unit 152 and the second electrode 190, and the first light-emitting unit 151 may include a first electron transport region 171 arranged between the charge generation layer 141 and the emission layer 1 151-EM.

The first electrode 110 and the second electrode 190 illustrated in FIG. 2 may respectively be the same as the first electrode 110 and the second electrode 190 illustrated in FIG. 1, respectively.

The hole transport region 120 and the second hole transport region 122 illustrated in FIG. 2 may each be the same as described in connection with the hole transport region 120 illustrated in FIG. 1.

The electron transport region 170 and the first electron transport region 171 illustrated in FIG. 2 may each be the same as described in connection with the electron transport region 170 illustrated in FIG. 1.

Hereinbefore, an example of a tandem light-emitting device has been described with reference to FIG. 2. However, the tandem light-emitting device may include three or more light-emitting units. Various modifications may be made.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. For example, Formula 9-33 is a branched $C_6$ alkyl group, for example, a tert-butyl group that is substituted with two methyl groups.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof are a methoxy group, an ethoxy group, a propoxy group, a butoxy group, or a pentoxy group.

The term "$C_1$-$C_{60}$ alkylthio group" as used herein refers to a monovalent group represented by —$SA_{101}$ (wherein $A_{101}$ is the $C_1$-$C_{60}$ alkyl group).

The term "$C_2$-$C_{60}$ alkenyl group" as used herein has a structure including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein has a structure including at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the $C_3$-$C_{10}$ cycloalkylene group is a divalent group having the same structure as the $C_3$-$C_{10}$ cycloalkyl group.

Examples of the $C_3$-$C_{10}$ cycloalkyl group are a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group.

The term "$C_1$-$C_{10}$ heterocycloalkyl group" as used herein refers to a monovalent saturated cyclic group that includes at least one hetero atom selected from N, O, P, Si, S, Se, Ge, and B as a ring-forming atom and 1 to 10 carbon atoms, and the term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group may include a silolanyl group, a silinanyl group, a tetrahydrofuranyl group, a tetrahydro-2H-pyranyl group, and a tetrahydrothiophenyl group.

The term "$C_3$-$C_{10}$ cycloalkenyl group" as used herein refers to a monovalent monocyclic group that has 3 to 10 carbon atoms, at least one carbon-carbon double bond in the ring thereof, and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one hetero atom selected from N, O, P, Si, S, Se, Ge, and B as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The "$C_7$-$C_{60}$ alkylaryl group" as used herein refers to a $C_6$-$C_{60}$ aryl group that is substituted with at least one $C_1$-$C_{60}$ alkyl group.

The term "$C_1$-$C_{60}$ heteroaryl group" as used herein refers to a monovalent group having a cyclic aromatic system having at least one hetero atom selected from N, O, P, Si, S, Se, Ge, and B as a ring-forming atom and 1 to 60 carbon atoms, and the term "$C_1$-$C_{60}$ heteroarylene group" as used herein refers to a divalent group having a cyclic aromatic system having at least one hetero atom selected from N, O, P, Si, S, Se, Ge, and B as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the two or more rings may be fused to each other.

The "$C_2$-$C_{60}$ alkylheteroaryl group" as used herein refers to a $C_1$-$C_{60}$ heteroaryl group that is substituted with at least one $C_1$-$C_{60}$ alkyl group.

The term "$C_6$-$C_{60}$ aryloxy group" as used herein indicates —$OA_{102}$ (wherein $A_{102}$ indicates the $C_6$-$C_{60}$ aryl group), the $C_6$-$C_{60}$ arylthio group indicates —$SA_{103}$ (wherein $A_{103}$ indicates the $C_6$-$C_{60}$ aryl group), and the $C_1$-$C_{60}$ alkylthio group indicates —$SA_{104}$ (wherein $A_{104}$ indicates the $C_1$-$C_{60}$ alkyl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its molecular structure when considered as a whole. Examples of the monovalent non-aromatic condensed polycyclic group include a fluorenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, at least one hetero atom selected from N, O, P, Si, S, Se, Ge, and B, other than carbon atoms (for example, having 1 to 60 carbon atoms), as a ring-forming atom, and no aromaticity in its molecular structure when considered as a whole. The monovalent non-aromatic condensed heteropolycyclic group includes a carbazolyl group. The term "divalent non-aromatic condensed heteropolycyclic group" as used herein refers to a divalent group having the same structure as a monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. Examples of the "$C_5$-$C_{30}$ carbocyclic group (that is unsubstituted or substituted with at least one $R_{10a}$)" used herein are an adamantane group, a norbornene group, a bicyclo[1.1.1]pentane group, a bicyclo[2.1.1]hexane group, a bicyclo[2.2.1]heptane group (norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, and a fluorene group, (each unsubstituted or substituted with at least one $R_{10a}$).

The term "$C_1$-$C_{30}$ heterocyclic group" as used herein refers to a saturated or unsaturated cyclic group having, as a ring-forming atom, at least one heteroatom selected from N, O, P, Si, S, Se, Ge, and B other than 1 to 30 carbon atoms. The $C_1$-$C_{30}$ heterocyclic group may be a monocyclic group or a polycyclic group. The "$C_1$-$C_{30}$ heterocyclic group (unsubstituted or substituted with at least one $R_{10a}$)" may be, for example, a thiophene group, a furan group, a pyrrole group, a silole group, borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group (each unsubstituted or substituted with at least one $R_{10a}$).

Examples of the "$C_5$-$C_{30}$ carbocyclic group" and "$C_1$-$C_{30}$ heterocyclic group" as used herein are i) a first ring, ii) a second ring, iii) a condensed ring in which two or more first rings are condensed with each other, iv) a condensed ring in which two or more second rings are condensed with each other, or v) a condensed ring in which at least one first ring is condensed with at least one second ring, wherein the first ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The terms "fluorinated $C_1$-$C_{60}$ alkyl group (or a fluorinated $C_1$-$C_{20}$ alkyl group or the like)", "fluorinated $C_3$-$C_{10}$ cycloalkyl group", "fluorinated $C_1$-$C_{10}$ heterocycloalkyl group", and "fluorinated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the term "fluorinated $C_1$ alkyl group (that is, a fluorinated methyl group)" includes —$CF_3$, —$CF_2H$, and —$CFH_2$. The "fluorinated $C_1$-$C_{60}$ alkyl group (or, a fluorinated $C_1$-$C_{20}$ alkyl group, or the like)", "fluorinated $C_3$-$C_{10}$ cycloalkyl group", "fluorinated $C_1$-$C_{10}$ heterocycloalkyl group", or "fluorinated phenyl group" may be i) a fully fluorinated $C_1$-$C_{60}$ alkyl group (or, a fully fluorinated $C_1$-$C_{20}$ alkyl group, or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group, or the like), a partially fluorinated $C_3$-$C_{10}$ cycloalkyl group, a partially fluorinated $C_1$-$C_{10}$ heterocycloalkyl group, or partially fluorinated phenyl group, wherein, in each group, all hydrogen included therein is not substituted with a fluoro group.

The terms "deuterated $C_1$-$C_{60}$ alkyl group (or a deuterated $C_1$-$C_{20}$ alkyl group or the like)", "deuterated $C_3$-$C_{10}$ cycloalkyl group", "deuterated $C_1$-$C_{10}$ heterocycloalkyl group", and "deuterated phenyl group" respectively indicate a $C_1$-$C_{60}$ alkyl group (or a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, the deuterated methyl group)" may include —$CD_3$, —$CD_2H$, and —$CDH_2$, and examples of the "deuterated $C_3$-$C_{10}$ cycloalkyl group" are, for example, Formula 10-501 and the like. The "deuterated $C_1$-$C_{60}$ alkyl group (or, the deuterated $C_1$-$C_{20}$ alkyl group or the like)", "deuterated $C_3$-$C_{10}$ cycloalkyl group", "deuterated $C_1$-$C_{10}$ heterocycloalkyl group", or "deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein is substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, all hydrogen included therein is not substituted with deuterium.

The term "($C_1$-$C_{20}$ alkyl) 'X' group" as used herein refers to an 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group that is substituted with at least one $C_1$-$C_{20}$ alkyl group, and the term "($C_1$-$C_{20}$ alkyl)phenyl group" as used herein refers to a phenyl group that is substituted with at least one $C_1$-$C_{20}$ alkyl group. Examples of a ($C_1$ alkyl) phenyl group include a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, and a dibenzothiophene 5,5-dioxide group," in which, in each group, at least one carbon atom selected from ring-forming carbon atoms is substituted with nitrogen.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_6$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_6$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or any combination thereof.

$Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, each unsubstituted or substituted with deuterium, a $C_1$-$C_{60}$ alkyl group, a $C_6$-$C_{60}$ aryl group, or any combination thereof.

For example, $Q_1$ to $Q_9$, $Q_{11}$ to $Q_{19}$, $Q_{21}$ to $Q_{29}$, and $Q_{31}$ to $Q_{39}$ described herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

Hereinafter, a light-emitting device according to an embodiment is described in detail with reference to Examples. However, the disclosure is not limited to the following Examples.

Evaluation Example 1

DFT calculation using a Gaussian 16 program was performed by optimizing a molecular structure of each of Compounds Ir-1-(H) and Pt-1-(L) by using B3LYP/LanL2DZ function with respect to a metal included in each of Compounds Ir-1-(H) and Pt-1-(L) and using B3LYP/6-31G(D,P) function with respect to an organic ligand included in each of Compounds Ir-1-(H) and Pt-1-(L), to calculate a permanent dipole moment, singlet energy, and triplet energy of each of Compounds Ir-1-(H) and Pt-1-(L), and calculate $D_{st}$ of each of Compounds Ir-1-(H) and Pt-1-(L) therefrom. Results thereof are shown in Table 1. Next, DFT calculation using a Gaussian 16 program was performed by optimizing a molecular structure of each of Compounds HT-(H), ET-(H), HT-(L), and ET-(L) by using B3LYP/6-31G(D,P) function, to calculate each of a permanent dipole moment, singlet energy, and triplet energy of each of Compounds HT-(H), ET-(H), HT-(L), and ET-(L), and calculate $D_{st}$ of each of Compounds HT-(H), ET-(H), HT-(L), and ET-(L). Results thereof are shown in Table 1 along with the permanent dipole moment.

TABLE 1

| Compound | Permanent dipole moment (debye) | $D_{st}$ (eV) |
|---|---|---|
| Ir-1-(H) (Compound 99 of Group 2-4) | 5.8425 | 0.383 |
| Pt-1-(L) (Compound 24 of Group 1-2) | 1.76 | 0.132 |
| HT-(H) (Compound H-HT1) | 0.8147 | 0.539 |
| ET-(H) (Compound H-ET1) | 2.2049 | 0.0607 |
| HT-(L) (Compound H-HT5) | 2.523 | 0.42 |
| ET-(L) (Compound H-ET6) | 0.251 | 0.781 |

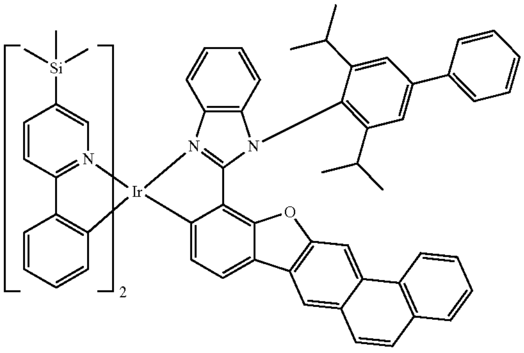

Ir-1-(H)

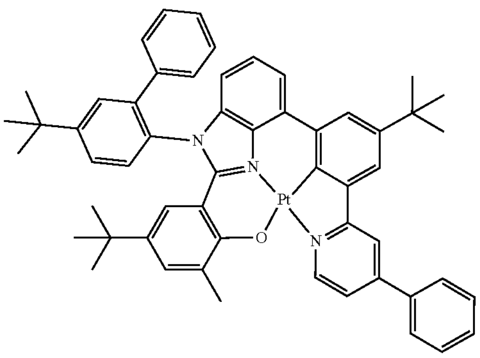

Pt-1-(L)

TABLE 1-continued

| Compound | Permanent dipole moment (debye) | $D_{st}$ (eV) |
|---|---|---|
| 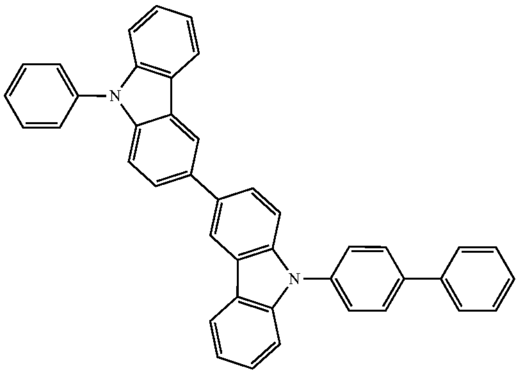 HT-(H) | | |
| 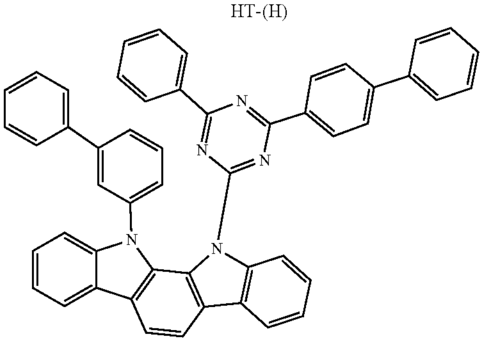 ET-(H) | | |
| 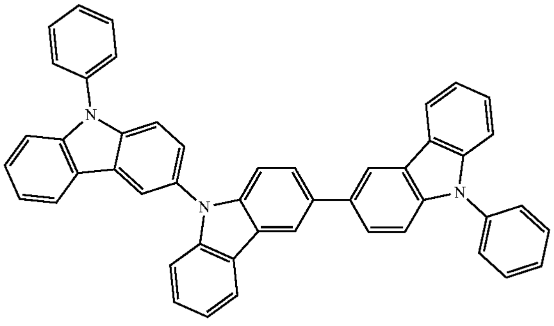 HT-(L) | | |
| 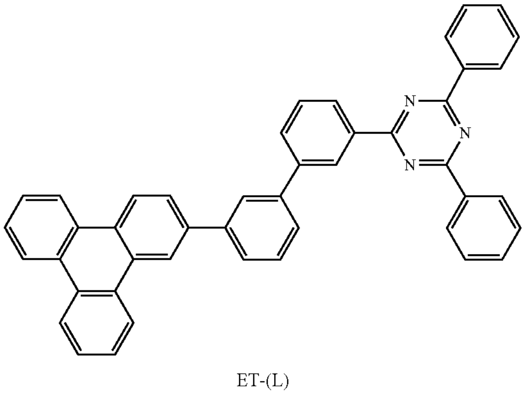 ET-(L) | | |

Evaluation Example 2

Compounds shown in Table 2 were vacuum-codeposited on a quartz substrate at a vacuum degree of $10^{-7}$ torr in a weight ratio shown in Table 2 to prepare Films Ir-1-(H) and Pt-1-(L), each having a thickness of 40 nm.

Next, a photoluminescence spectrum of each of Films Ir-1-(H) and Pt-1-(L) was measured by using a Quantaurus-QY Absolute PL quantum yield spectrometer of Hamamatsu Inc. (equipped with a xenon light source, a monochromator, a photonic multichannel analyzer, and an integrating sphere, and using PLQY measurement software (Hamamatsu Photonics, Ltd., Shizuoka, Japan)). During the measurement, an excitation wavelength was scanned from 320 nm to 380 nm at 10 nm intervals, and a spectrum measured at the excitation wavelength of 320 nm was taken. From the photoluminescence spectrum of each of Films Ir-1-(H) and Pt-1-(L) evaluated therefrom, a full width at half maximum and maximum emission peak wavelength of each of Compounds Ir-1-(H) and Pt-1-(L) were evaluated and results thereof are shown in Table 2.

TABLE 2

| Film No. | Film composition (weight ratio) | FWHM (nm) | Maximum emission peak wavelength (nm) |
|---|---|---|---|
| Ir-1-(H) | HT-(L):ET-(L):Ir-1-(H) (47.5:47.5:5) | 29 | 529 |
| Pt-1-(L) | HT-(H):ET-(H):Pt-1-(L) (45:45:10) | 64 | 527 |

Manufacture of OLED 1

As an anode, a glass substrate with ITO/Ag/ITO deposited thereon to a thickness of 70/1,000/70 Å was cut to a size of 50 mm×50 mm×0.5 mm, sonicated with isopropyl alcohol and pure water each for 5 minutes, and then cleaned by irradiation of ultraviolet rays and exposure of ozone thereto for 30 minutes. Then, the resultant glass substrate was loaded onto a vacuum deposition apparatus.

HT3 and F6-TCNNQ were co-deposited on the anode in a weight ratio of 98:2 to form a hole injection layer (HIL) having a thickness of 10 nm, HT3 was deposited on the hole injection layer to form a hole transport layer (HTL) having a thickness of 140 nm, and HT(1) was vacuum-deposited on the hole transport layer to form an electron blocking layer (EBL) having a thickness of 30 nm.

Next, dopant (Ir-1-(H)) and hosts (HT-(L) and ET-(L)) were co-deposited on the electron blocking layer to form an emission layer-A (EML-A) having a thickness of 11 nm. A weight of the dopant in EML-A was 7 wt % based on 100 wt % of EML-A, and a weight ratio of HT-(L) and ET-(L) in EML-A was 5:5. PDM(Host(L)) in Tables 3 and 4 was calculated as "PDM(Host(L))=(2.523 debye×0.5)+(0.251 debye×0.5)=1.387 debye".

Next, dopant (Pt-1-(L)) and hosts (HT-(H) and ET-(H)) were co-deposited on the EML-A to form an emission layer-B (EML-B) having a thickness of 27 nm. A weight of the dopant in EML-B was 15 wt % based on 100 wt % of EML-B, and a weight ratio of HT-(H) and ET-(H) in EML-2 was 5:5. PDM(Host(H)) in Tables 3 and 4 was calculated as "PDM(Host(H))=(0.8147 debye×0.5)+(2.2049 debye×0.5)=1.5098 debye".

Next, ET3 was vacuum-deposited on EML-B to form a hole blocking layer (HBL) having a thickness of 5 nm, ET3 and ET-D1 were co-deposited on the hole blocking layer in a volume ratio of 50:50 to form an electron transport layer (ETL) having a thickness of 31 nm, Mg and Ag were co-deposited on the electron transport layer in a weight ratio of 10:90 to form a cathode having a thickness of 12 nm, and HT3 was deposited thereon to form a capping layer (CPL)

having a thickness of 83 nm, thereby completing the manufacture of a top-emission type light-emitting device.

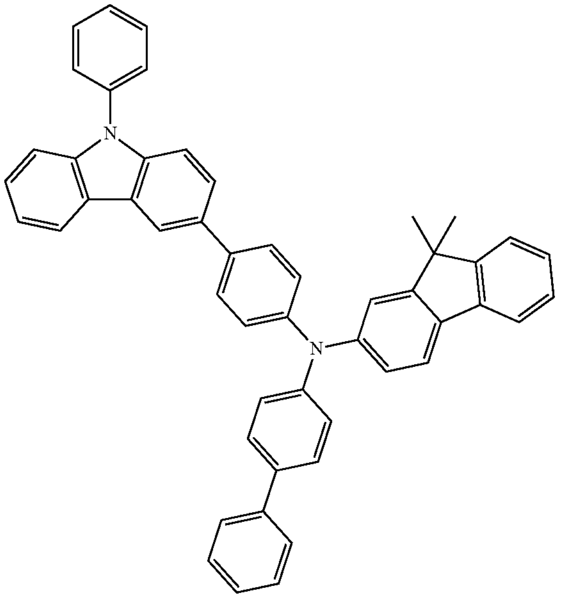

HT3

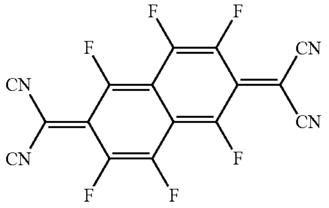

F6-TCNNQ

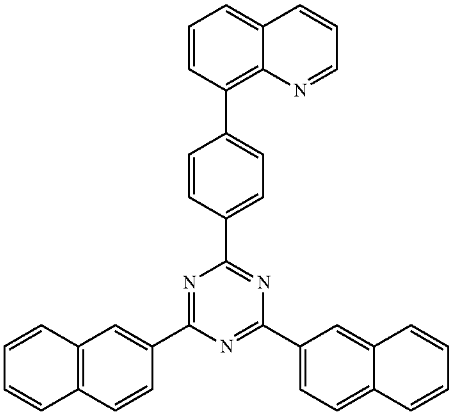

ET3

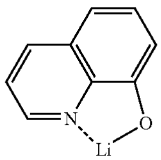

ET-D1

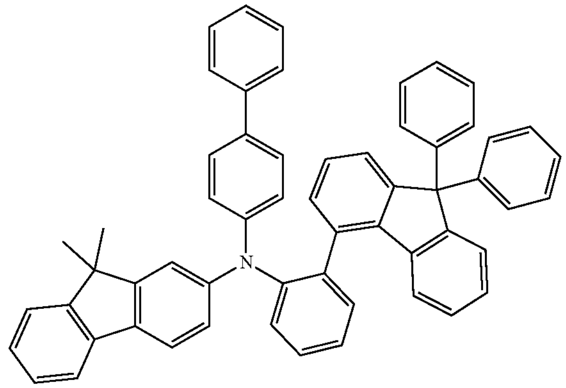

HT(1)

Manufacture of OLED 2

OLED 2 was manufactured in the same manner as used to manufacture OLED 1, except that i) when EML-A was formed, Pt-1-(L) was used instead of Ir-1-(H) as a dopant, and an amount of the dopant in EML-A was changed to 15 wt % based on 100 wt % of EML-A, and ii) when EML-B was formed, Ir-1-(H) was used instead of Pt-1-(L) as a dopant, and an amount of the dopant in EML-B was changed to 7 wt % based on 100 wt % of EML-B.

Manufacture of OLED 3

OLED 3 was manufactured in the same manner as used to manufacture OLED 1, except that i) when EML-A was formed, HT-(H) and ET-(H) (in a weight ratio of 5:5) were used instead of HT-(L) and ET-(L) as hosts, and ii) when EML-B was formed, HT-(L) and ET-(L) (in a weight ratio of 5:5) were used instead of HT-(H) and ET-(H) as hosts.

Manufacture of OLED 4

OLED 4 was manufactured in the same manner as used to manufacture OLED 3, except that i) when EML-A was formed, Pt-1-(L) was used instead of Ir-1-(H) as a dopant, and an amount of the dopant in EML-A was changed to 15 wt % based on 100 wt % of EML-A, and ii) when EML-B was formed, Ir-1-(H) was used instead of Pt-1-(L) as a dopant, and an amount of the dopant in EML-B was changed to 7 wt % based on 100 wt % of EML-B.

Compositions of layers of each of OLEDs 1 to 4 are as the same as described in Tables 3 and 4.

TABLE 3

| | | OLED 1 (Example) | OLED 2 (Comparative Example) |
|---|---|---|---|
| CPL (83 nm) | | HT3 | HT3 |
| Cathode (12 nm) | | Mg:Ag | Mg:Ag |
| ETL (31 nm) | | ET3:ET-D1 | ET3:ET-D1 |
| HBL (5 nm) | | ET3 | ET3 |
| EML-B | Dopant | Pt-1-(L) (15 wt %) | Ir-1-(H) (7 wt %) |
| (27 nm) | | PDM(Pt-1-(L)) = 1.76 debye | PDM(Ir-1-(H)) = 5.8425 debye |
| | Host | HT-(H):ET-(H) | HT-(H):ET-(H) |
| | | PDM(Host(H)) = 1.5098 debye | PDM(Host(H)) = 1.5098 debye |
| EML-A | Dopant | Ir-1-(H) (7 wt %) | Pt-1-(L) (15 wt %) |
| (11 nm) | | PDM(Ir-1-(H)) = 5.8425 debye | PDM(Pt-1-(L)) = 1.76 debye |
| | Host | HT-(L):ET-(L) | HT-(L):ET-(L) |
| | | PDM(Host(L)) = 1.38735 debye | PDM(Host(L)) = 1.387 debye |
| EBL (30 nm) | | HT(1) | HT(1) |
| HTL (140 nm) | | HT3 | HT3 |
| HIL (10 nm) | | HT3:F6-TCNNQ | HT3:F6-TCNNQ |
| Anode | | ITO/Ag/ITO | ITO/Ag/ITO |

TABLE 4

| | | OLED 3 (Comparative Example) | OLED 4 (Example) |
|---|---|---|---|
| CPL (83 nm) | | HT3 | HT3 |
| Cathode (12 nm) | | Mg:Ag | Mg:Ag |
| ETL (31 nm) | | ET3:ET-D1 | ET3:ET-D1 |
| HBL (5 nm) | | ET3 | ET3 |
| EML-B | Dopant | Pt-1-(L) (15 wt %) | Ir-1-(H) (7 wt %) |
| (27 nm) | | PDM(Pt-1-(L)) = 1.76 debye | PDM(Ir-1-(H)) = 5.8425 debye |
| | Host | HT-(L):ET-(L) | HT-(L):ET-(L) |
| | | PDM(Host(L)) = 1.387 debye | PDM(Host(L)) = 1.387 debye |
| EML-A | Dopant | Ir-1-(H) (7 wt %) | Pt-1-(L) (15 wt %) |
| (11 nm) | | PDM(Ir-1-(H)) = 5.8425 debye | PDM(Pt-1-(L)) = 1.76 debye |
| | Host | HT-(H):ET-(H) | HT-(H):ET-(H) |
| | | PDM(Host(H)) = 1.5098 debye | PDM(Host(H)) = 1.5098 debye |
| EBL (30 nm) | | HT(1) | HT(1) |
| HTL (140 nm) | | HT3 | HT3 |
| HIL (10 nm) | | HT3:F6-TCNNQ | HT3:F6-TCNNQ |
| Anode | | ITO/Ag/ITO | ITO/Ag/ITO |

Evaluation Example 3

Figure 3:
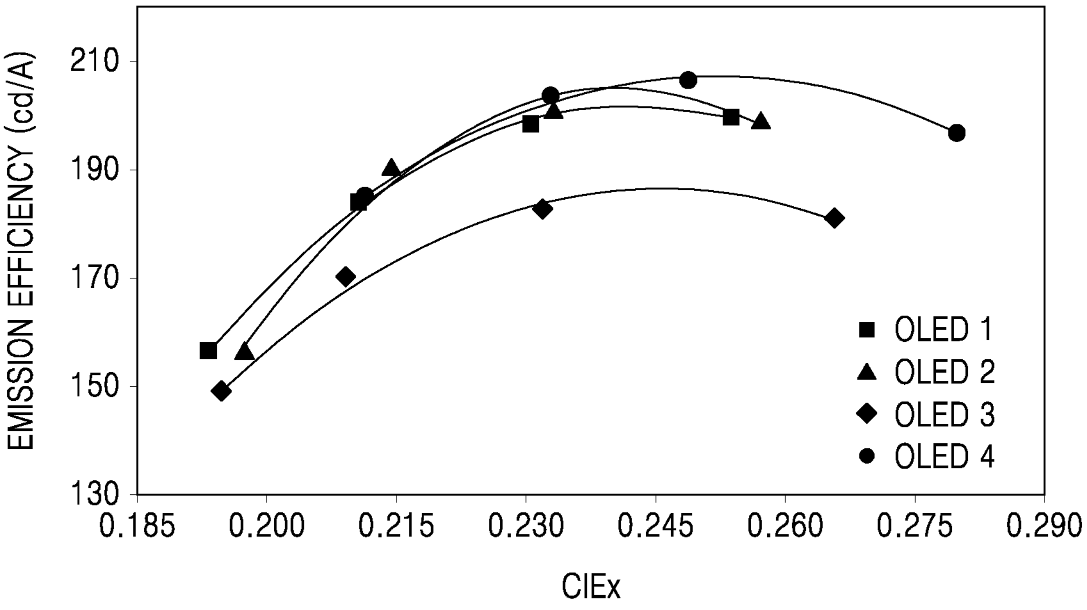
FIG. 3 shows a graph of x color coordinates versus luminescence efficiency of each of OLED 1 to OLED 4.
Figure 4:
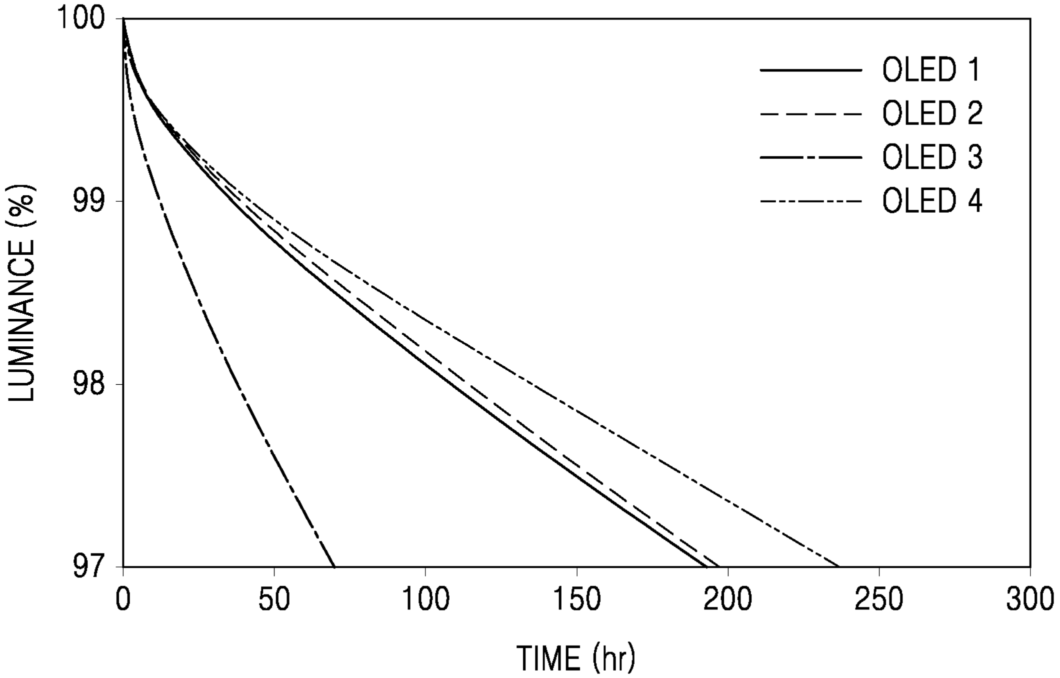
FIG. 4 shows a graph of time versus luminance of each of OLED 1 to OLED 4.

Driving voltage(V), luminescence efficiency (at CIEx=0.245) (cd/A,), power efficiency (at CIEx=0.245)(lm/W), lifespan ($T_{97}$ at 15,000 nit) (hr), roll-off ratio (%), turn-on time (μs), turn-off time (μs), and lateral luminance ratio (%) of each of OLED 1 (Example), OLED 2 (Comparative Example), OLED 3 (Comparative Example), and OLED 4 (Example) were evaluated, and results thereof are shown in Table 5. Numbers in parentheses in Table 5 represent relative values. The x color coordinate-luminescence efficiency graph and the time-luminance graph of each of OLEDs 1 to 4 are shown in FIGS. 3 and 4, respectively. A current voltmeter (Keithley 2400) and a luminance meter (Tocon SR3) were used as evaluation devices.

The lifespan ($T_{97}$) (at 15,000 nit) was obtained by evaluating the time taken for the luminance to reach 97% relative to the initial luminance of 100%.

The roll-off ratio was calculated by the following Equation 20:

Equation 20

$$\text{Roll off ratio} = \{1 - (\text{luminescence efficiency at } 15{,}000\,nit) / \text{maximum luminescence efficiency})\} \times 100\%$$

The turn-on time was obtained by evaluating the time taken for the luminance to reach 90% of the maximum luminance after the application of a current pulse of 50 Hz frequency at 1 mA/$cm^2$, and the turn-off time was obtained by evaluating the time taken for the luminance to reach 10% of the maximum luminance after the current pulse was blocked.

The lateral luminance ratio (at CIEx=0.25) was obtained by evaluating a ratio of the front luminance value to the 45° lateral luminance value.

TABLE 5

| | Driving voltage (V) | Luminescence efficiency (cd/A) | Power efficiency (lm/W) | Lifespan ($T_{97}$) (hr) | Roll-off ratio (%) | Turn-on time (μs) | Turn-off time (μs) | Lateral luminance ratio (%) |
|---|---|---|---|---|---|---|---|---|
| OLED 1 (Example) | 3.58 | 201.5 (100%) | 56.3 (100%) | 192 (100%) | 9 | 244 | 108 | 42 |
| OLED 2 (Comparative Example) | 3.47 | 204.3 (101%) | 58.8 (104%) | 197 (103%) | 6 | 288 | 108 | 40 |
| OLED 3 (Comparative Example) | 3.62 | 186.5 (93%) | 51.4 (91%) | 69 (36%) | 14 | 248 | 124 | 42 |
| OLED 4 (Example) | 3.38 | 206.6 (103%) | 61.2 (109%) | 237 (123%) | 5 | 248 | 96 | 42 |

Referring to Table 5,

1) OLED 1 (Example) had i) the same level of the luminescence efficiency, power efficiency, lifespan, and turn-off time characteristics as those of OLED 2 (Comparative Example), but had better turn-on time and lateral luminance ratio characteristics than those of OLED 2 (Comparative Example), and ii) had the same level of the turn-on time and lateral luminance ratio characteristics as those of OLED 3 (Comparative Example), but had better luminescence efficiency, power efficiency, lifespan, roll-off ratio, and turn-off time characteristics than those of OLED 3 (Comparative Example), 2) OLED 4 (Example) had i) the better driving voltage, luminescence efficiency, power efficiency, lifespan, roll-off ratio, turn-on time, turn-off time, and lateral luminance ratio characteristics than those of OLED 2 (Comparative Example) and ii) had the same level of the turn-on time and lateral luminance ratio characteristics as those of OLED 3 (Comparative Example), but had better driving voltage, luminescence efficiency, power efficiency, lifespan, roll-off ratio, and turn-off time characteristics than those of OLED 3 (Comparative Example).

Therefore, it could be confirmed that both OLED 1(Example) and OLED 4 (Example) were high-quality light-emitting devices having overall improved characteristics in terms of the driving voltage, luminescence efficiency, power efficiency, lifespan, roll-off ratio, turn-on time, turn-off time, and lateral luminance ratio.

The light-emitting device have excellent characteristics in terms of luminescence efficiency, power efficiency, lifespan, roll-off ratio, and/or lateral luminance ratio and have excellent low-gradation emission characteristics at the same time, and thus, a high-quality electronic apparatus may be manufactured by using the light-emitting device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting device comprising:

a first electrode;

a second electrode facing the first electrode; and an interlayer arranged between the first electrode and the second electrode, wherein the interlayer comprises a first emission layer and a second emission layer, the first emission layer comprises a first host and a first dopant capable of emitting a first light having a first photoluminescence spectrum, the first host comprises m1 hosts, where m1 is an integer of 1 or more, and when m1 is 2 or more, the two or more hosts present in the first emission layer are each different from the other, the second emission layer comprises a second host and a second dopant capable of emitting a second light having a second photoluminescence spectrum, the second host comprises m2 hosts, where m2 is an integer of 1 or more, and when m2 is 2 or more, the two or more hosts present in the second emission layer are each different from the other, the first dopant comprises a first transition metal, and the second dopant comprises a second transition metal, wherein the first dopant and the second dopant are different from each other, and Expression 1 and Expression 2 are satisfied:

$$PDM(D1) < PDM(D2) \quad \text{Expression 1}$$

$$PDM(H1) > PDM(H2) \quad \text{Expression 2}$$

wherein, in Expressions 1 and 2,

PDM(D1) is a permanent dipole moment of the first dopant and has a unit of debye, PDM(D2) is a permanent dipole moment of the second dopant and has a unit of debye, PDM(H1) is $$\sum_{x=1}^{m1} PDM(Hx) \cdot W(Hx)$$

which is a permanent dipole moment average value of the m1 hosts present in the first host, and has a unit of debye, wherein i) x is a variable of 1 to m1, ii) PDM(Hx) is a permanent dipole moment of an $x^{th}$ host in the first emission layer and has a unit of debye, and iii) W(Hx) is a weight fraction of the $x^{th}$ host relative to a total weight of the first host, and is calculated as (a weight of the $x^{th}$ host in the first emission layer/a total weight of the first host), PDM(H2) is $$\sum_{y=1}^{m2} PDM(Hy) \cdot W(Hy)$$

which is a permanent dipole moment average value of the m2 hosts present in the second host, and has a unit of debye, wherein i) y is a variable of 1 to m2, ii) PDM(Hy) is a permanent dipole moment of an $y^{th}$ host in the second emission layer and has a unit of debye, and iii) W(Hy) is a weight fraction of the $y^{th}$ host relative to a total weight of the second host, and is calculated as (a weight of the $y^{th}$ host in the second emission layer/a total weight of the second host), and each of PDM(D1), PDM(D2), PDM(Hx), and PDM(Hy) is calculated based on density functional theory (DFT).

2. The light-emitting device of claim 1, wherein |PDM (D1)−PDM(D2)| is about 1.0 debye to about 9.0 debye.

3. The light-emitting device of claim 1, wherein |PDM (H1)−PDM(H2)| is about 0.01 debye to about 3.99 debye.

4. The light-emitting device of claim 1, wherein Expression 3 is further satisfied:

$$FWHM(D1) > FWHM(D2) \quad \text{Expression 3}$$

wherein, in Expression 3,

FWHM(D1) is a full width at half maximum of the first photoluminescence spectrum of the first dopant and has a unit of nanometers, FWHM(D2) is a full width at half maximum of the second photoluminescence spectrum of the second dopant and has a unit of nanometers, the first photoluminescence spectrum is evaluated relative to a first film including the first dopant, and the second photoluminescence spectrum is evaluated relative to a second film including the second dopant.

5. The light-emitting device of claim 1, wherein Expression 4 is further satisfied:

$$D_{st}(D1) < D_{st}(D2) \quad \text{Expression 4}$$

wherein, in Expression 4, $D_{st}(D1)$ is $|S_1(D1)-T_1(D1)|$, $D_{st}(D2)$ is $|S_1(D2)-T_1(D2)|$, $S_1(D1)$ is singlet energy of the first dopant and has a unit of eV, $T_1(D1)$ is triplet energy of the first dopant and has a unit of eV, $S_1(D2)$ is singlet energy of the second dopant and has a unit of eV, $T_1(D2)$ is triplet energy of the second dopant and has a unit of eV, and each of $S_1(D1)$, $T_1(D1)$, $S_1(D2)$, and $T_1(D2)$ is calculated based on DFT.

6. The light-emitting device of claim 1, wherein |λmax (1)−λmax(2)| is 0 nm to about 30 nm, λmax(1) is a maximum emission peak wavelength of the first photoluminescence spectrum and has a unit of nanometers, and λmax(2) is a maximum emission peak wavelength of the second photoluminescence spectrum and has a unit of nanometers.

7. The light-emitting device of claim 1, wherein i) each of λmax(1) and λmax(2) is about 510 nm to about 540 nm; or ii) each of λmax(1) and λmax(2) is about 540 nm to about 570 nm, λmax(1) is a maximum emission peak wavelength of the first photoluminescence spectrum and has a unit of nm, and λmax(2) is a maximum emission peak wavelength of the second photoluminescence spectrum and has a unit of nm.

8. The light-emitting device of claim 1, wherein i) λmax(1) is about 510 nm to about 540 nm, and λmax(2) is about 540 nm to about 570 nm; or ii) λmax(1) is about 540 nm to about 570 nm, and λmax(2) is about 510 nm to about 540 nm, λmax(1) is a maximum emission peak wavelength of the first photoluminescence spectrum and has a unit of nm, and λmax(2) is a maximum emission peak wavelength of the second photoluminescence spectrum and has a unit of nm.

9. The light-emitting device of claim 1, wherein the first light and the second light is green light.

10. The light-emitting device of claim 1, wherein the first emission layer and the second emission layer emit green light.

11. The light-emitting device of claim 1, wherein a surface of the first emission layer and a surface of the second emission layer are in direct contact.

12. The light-emitting device of claim 1, wherein the first emission layer is arranged between the second emission layer and the second electrode.

13. The light-emitting device of claim 1, wherein the second emission layer is arranged between the first emission layer and the second electrode.

14. The light-emitting device of claim 1, wherein the first transition metal is platinum, and the second transition metal is iridium.

15. The light-emitting device of claim 1, wherein the interlayer comprises:

m light-emitting units, each comprising at least one emission layer; and m−1 charge generation layers arranged between two adjacent light-emitting units among the m light-emitting units, m is an integer of 2 or more, i) a first light-emitting unit among the m light-emitting units comprises the first emission layer, and a second light-emitting unit among the m light-emitting units comprises the second emission layer, or ii) one light-emitting unit among the m light-emitting units comprises both the first emission layer and the second emission layer.

16. The light-emitting device of claim 15, wherein one light-emitting unit among the m light-emitting units comprises both the first emission layer and the second emission layer, and the one light-emitting unit comprising both the first emission layer and the second emission layer emits green light.

17. The light-emitting device of claim 16, wherein the first emission layer is arranged between the second emission layer and the second electrode.

18. The light-emitting device of claim 16, wherein the second emission layer is arranged between the first emission layer and the second electrode.

19. The light-emitting device of claim 15, wherein at least one light-emitting unit among the m light-emitting units emits blue light.

20. An electronic apparatus comprising the light-emitting device of claim 1.

* * * * *